US012606581B2

(12) United States Patent
Bae et al.

(10) Patent No.: US 12,606,581 B2
(45) **Date of Patent: *Apr. 21, 2026**

(54) ORGANOMETALLIC COMPOUND, ORGANIC LIGHT-EMITTING DEVICE INCLUDING THE SAME, AND DIAGNOSTIC COMPOSITION INCLUDING THE ORGANOMETALLIC COMPOUND

(71) Applicant: Samsung Electronics Co., Ltd., Suwon-si (KR)

(72) Inventors: Hyejin Bae, Suwon-si (KR); Joonghyuk Kim, Seoul (KR); Minsik Min, Suwon-si (KR); Sangho Park, Anyang-si (KR); Satoko Ishibe, Suwon-si (KR); Sooghang Ihn, Hwaseong-si (KR); Soonok Jeon, Suwon-si (KR); Jun Chwae, Seoul (KR); Hyesung Choi, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 1054 days.

This patent is subject to a terminal disclaimer.

(21) Appl. No.: 17/476,662

(22) Filed: Sep. 16, 2021

(65) Prior Publication Data

US 2022/0106345 A1 Apr. 7, 2022

Related U.S. Application Data

(63) Continuation of application No. 17/201,078, filed on Mar. 15, 2021, now abandoned.

(30) Foreign Application Priority Data

Sep. 17, 2020 (KR) ........................ 10-2020-0120026
Sep. 10, 2021 (KR) ........................ 10-2021-0121169

(51) Int. Cl.
*C07F 15/00* (2006.01)
*H10K 85/30* (2023.01)
(Continued)

(52) U.S. Cl.
CPC ....... *C07F 15/0086* (2013.01); *H10K 85/346* (2023.02); *H10K 85/658* (2023.02);
(Continued)

(58) Field of Classification Search
CPC .............. C07F 15/0086; H10K 85/346; H10K 2101/10; C09K 2211/1044
See application file for complete search history.

(56) References Cited

U.S. PATENT DOCUMENTS

| | | | |
|---|---|---|---|
| 6,310,360 | B1 | 10/2001 | Forrest et al. |
| 6,515,298 | B2 | 2/2003 | Forrest et al. |

(Continued)

FOREIGN PATENT DOCUMENTS

| | | | |
|---|---|---|---|
| CN | 104232076 | A | 12/2014 |
| CN | 107406384 | A | 11/2017 |

(Continued)

OTHER PUBLICATIONS

English Abstract of CN 108276450.
(Continued)

*Primary Examiner* — Michael M Dollinger
(74) *Attorney, Agent, or Firm* — CANTOR COLBURN LLP

(57) ABSTRACT

Provided are an organometallic compound represented by Formula 1, an organic light-emitting device including the organometallic compound, and a diagnostic composition including the organometallic compound:

$$M_1(L_{11})_{n11}(L_{12})_{n12} \qquad \text{Formula 1}$$

(Continued)

wherein $L_{11}$ in Formula 1 is a ligand represented by Formula 1-1:

Formula 1-1

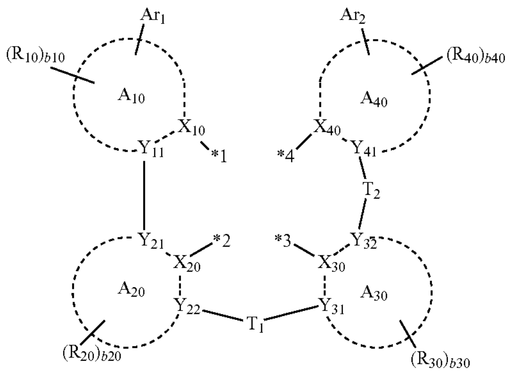

wherein, in Formula 1-1, $Ar_1$ is a phenyl group substituted with at least one of $E_1$ and $Ar_2$ is a phenyl group substituted with at least one $E_2$, and the other substituents are described in the detailed description of the present specification.

20 Claims, 1 Drawing Sheet

(51) Int. Cl.
*H10K 85/60* (2023.01)
*H10K 50/15* (2023.01)
*H10K 50/16* (2023.01)
*H10K 50/17* (2023.01)

(52) U.S. Cl.
CPC ............. *H10K 50/15* (2023.02); *H10K 50/16* (2023.02); *H10K 50/171* (2023.02)

(56) References Cited

U.S. PATENT DOCUMENTS 6,894,307 B2 5/2005 Forrest et al.
7,553,560 B2 6/2009 Lamansky et al.
8,476,823 B2 7/2013 Kuma et al.
8,643,268 B2 2/2014 Ogiwara et al.
9,153,790 B2 10/2015 Kuma et al.
9,385,329 B2 7/2016 Li et al.
9,493,698 B2 11/2016 Beers et al.
9,905,779 B2 2/2018 Ogiwara et al.
10,069,077 B2 9/2018 Park et al.
10,090,483 B2 10/2018 Kim et al.
10,199,583 B1 2/2019 Hang et al.
10,403,825 B2 9/2019 Zeng et al.
11,778,899 B2 * 10/2023 Bae ...................... H10K 85/346 428/690
11,858,949 B2 * 1/2024 Bae ...................... H10K 85/346
11,889,749 B2 * 1/2024 Min ...................... C09K 11/06
2013/0168656 A1 7/2013 Tsai et al.
2014/0364605 A1 12/2014 Li et al.
2016/0285015 A1 9/2016 Li et al.
2016/0343960 A1 11/2016 Yamada et al.
2016/0359125 A1 * 12/2016 Li ...................... C07F 15/0033
2017/0062718 A1 3/2017 Numata et al.
2017/0077418 A1 3/2017 Stoessel et al.
2017/0077421 A1 3/2017 Ihn et al.
2017/0163010 A1 6/2017 Nakanotan et al.
2017/0271611 A1 * 9/2017 Li ...................... H10K 50/121
2018/0010040 A1 1/2018 Pan et al.
2018/0053901 A1 2/2018 Yoshida et al.
2018/0130959 A1 5/2018 Ogiwara et al.
2018/0138425 A1 5/2018 Ma et al.
2018/0248127 A1 8/2018 Lee et al.
2018/0375036 A1 * 12/2018 Chen ...................... C09K 11/06
2019/0225636 A1 7/2019 Bae et al.
2019/0233455 A1 8/2019 Li
2019/0326523 A1 10/2019 Li et al.
2020/0083458 A1 3/2020 Jeon et al.
2020/0119289 A1 4/2020 Lin et al.
2020/0140471 A1 5/2020 Chen et al.
2020/0216481 A1 7/2020 Chen et al.
2020/0266366 A1 8/2020 Bold et al.
2020/0283450 A1 9/2020 Wolohan et al.
2020/0321537 A1 10/2020 Jeon et al.
2020/0392173 A1 12/2020 Bae et al.
2021/0020851 A1 1/2021 Hayashi et al.
2021/0119168 A1 4/2021 Choi et al.
2021/0167299 A1 6/2021 Chung et al.
2021/0210700 A1 7/2021 Fleetham et al.
2021/0249610 A1 8/2021 Kim et al.
2022/0029106 A1 1/2022 Um et al.
2022/0081457 A1 3/2022 Bae et al.
2022/0106345 A1 * 4/2022 Bae ...................... C09K 11/06
2023/0078199 A1 3/2023 Ihn et al.
2023/0084208 A1 3/2023 Kim et al.
2023/0090659 A1 3/2023 Kwon et al.
2023/0165136 A1 5/2023 Kim et al.
2023/0363256 A1 11/2023 Kim et al.
2023/0363269 A1 * 11/2023 Kim ...................... C07F 15/0033
2023/0363272 A1 11/2023 Kim et al.
2023/0363273 A1 * 11/2023 Kim ...................... H10K 50/12

FOREIGN PATENT DOCUMENTS

CN 108276449 A 7/2018
CN 108276450 A 7/2018
CN 108424425 A 8/2018
CN 109748938 A 5/2019
CN 109810106 A 5/2019
CN 112079874 A 12/2020
CN 113480526 A 10/2021
EP 2879196 A1 6/2015
EP 3514163 A1 7/2019
EP 3750899 A1 12/2020
EP 3750900 A1 12/2020
EP 3800683 A1 4/2021
EP 3940805 A1 1/2022
EP 4119633 A1 1/2023
JP 2002193952 A 7/2002
KR 20150039131 A 4/2015
KR 20170025990 A 3/2017
KR 20170032148 A 3/2017
KR 20180098809 A 9/2018
KR 20190089626 A 7/2019
KR 20200135971 A 12/2020
KR 102253443 B1 5/2021
WO 2002015645 A1 2/2002
WO 2005019373 A2 3/2005
WO 2015027060 A1 2/2015
WO 2016158540 A1 10/2016
WO 2019236541 A1 12/2019

OTHER PUBLICATIONS

Extended European Search report issued Jan. 26, 2022 in corresponding EP Patent Application No. 21196847.4, 8 pp.
Li G, "Preparation of 4-aryl-3,5-disubstituted pyrazole-containing tetradentate metal platinum complex and its use in deep blue phosphorescent material", US2019233455 A1, (Jan. 1, 2019), pp. 1-4, XP055880236.
English Abstract of CN 108276450, Year: 2018.
Ruben Seifert, et al., Chemical degradation mechanisms of highly efficient blue phosphorescent emitters used for organic light emitting diodes, Organic Electronics ,14 (2013) 115-123.
Office Action issued Sep. 27, 2024 of EP Patent Application No. 21196847.4.

(56) References Cited

OTHER PUBLICATIONS

English Translation of Office Action dated Mar. 15, 2025, issued on corresponding CN Patent Application No. 202111095987.6, 18 pp.
European Search Report for European Patent Application No. 23171291.0 dated Sep. 29, 2023.
Extended European Search Report issued Sep. 27, 2023 of EP Patent Application No. 23171288.6.
Office Action dated Mar. 15, 2025, issued on corresponding CN Patent Application No. 202111095987.6, 15 pp.

* cited by examiner

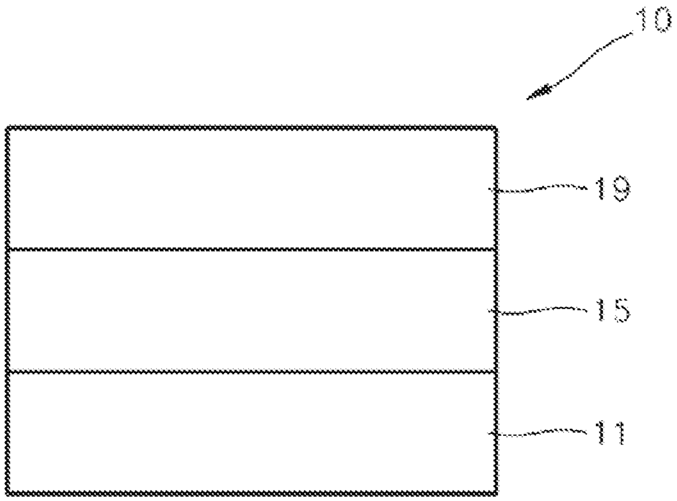
10
19
15
11

ORGANOMETALLIC COMPOUND, ORGANIC LIGHT-EMITTING DEVICE INCLUDING THE SAME, AND DIAGNOSTIC COMPOSITION INCLUDING THE ORGANOMETALLIC COMPOUND

CROSS-REFERENCE TO RELATED APPLICATION

This application is a continuation of U.S. application Ser. No. 17/201,078 filed Mar. 15, 2021, which claims priority under 35 U.S.C. § 119 to Korean Patent Application Nos. 10-2020-0120026, filed on Sep. 17, 2020, and 10-2021-0121169, filed on Sep. 10, 2021, in the Korean Intellectual Property Office, the content of which is incorporated by reference herein in its entirety.

BACKGROUND

1. Field

The present disclosure relates to organometallic compounds, organic light-emitting devices including the same, and diagnostic compositions including the same.

2. Description of Related Art

Organic light-emitting devices are self-emission devices, which have improved characteristics in terms of viewing angles, response time, brightness, driving voltage, and response speed, and produce full-color images.

In an example, an organic light-emitting device includes an anode, a cathode, and an organic layer between the anode and the cathode, wherein the organic layer includes an emission layer. A hole transport region may be located between the anode and the emission layer, and an electron transport region may be located between the emission layer and the cathode. Holes provided from the anode may move toward the emission layer through the hole transport region, and electrons provided from the cathode may move toward the emission layer through the electron transport region. The holes and the electrons recombine in the emission layer to produce excitons. These excitons transition from an excited state to a ground state to thereby generate light.

Meanwhile, luminescent compounds, for example, phosphorescent compounds, may be used for monitoring, sensing, and detecting biological materials such as various cells and proteins.

SUMMARY

Provided are organometallic compounds, organic light-emitting devices including the same, and diagnostic compositions including the same.

Additional aspects will be set forth in part in the description which follows and, in part, will be apparent from the description, or may be learned by practice of the presented embodiments of the disclosure.

According to an aspect of an embodiment, there is provided an organometallic compound represented by Formula 1:

$$M_1(L_{11})_{n11}(L_{12})_{n12}$$ Formula 1 wherein, in Formula 1, $M_1$ is a first-row transition metal of the Periodic Table of Elements, a second-row transition metal of the Periodic Table of Elements, or a third-row transition metal of the Periodic Table of Elements, $L_{11}$ is a ligand represented by Formula 1-1, $L_{12}$ is a monodentate ligand or a bidentate ligand, n11 is 1, n12 is 0, 1, or 2, Formula 1-1

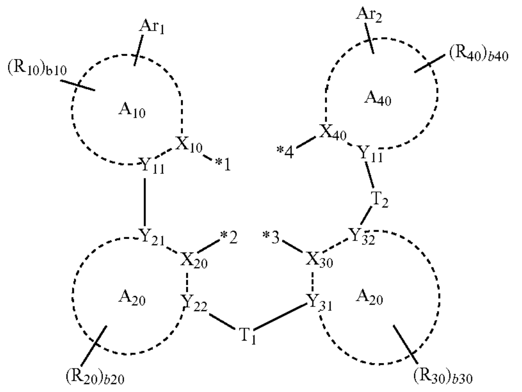

wherein, in Formula 1-1,

*1 to *4 each indicate a binding site to $M_1$, $A_{10}$ is (i) a 5-membered N-containing $C_1$-$C_{30}$ heterocyclic group or (ii) a bi- or multi-cyclic $C_1$-$C_{30}$ heterocyclic group including a 5-membered N-containing $C_1$-$C_{30}$ heterocyclic group, $A_{20}$ and $A_{30}$ are each independently a $C_5$-$C_{30}$ carbocyclic group or a $C_1$-$C_{30}$ heterocyclic group, $A_{40}$ is (i) a 6-membered carbocyclic group or a 6-membered heterocyclic group or (ii) a bi- or multi-cyclic $C_5$-$C_{30}$ carbocyclic group or a bi- or multi-cyclic $C_1$-$C_{30}$ heterocyclic group, wherein the bi- or multi-cyclic $C_5$-$C_{30}$ carbocyclic group and the bi- or multi-cyclic $C_1$-$C_{30}$ heterocyclic group each include at least one of a 6-membered carbocyclic group and a 6-membered heterocyclic group, $T_1$ is a single bond, *—N[$(L_1)_{a1}$-$(R_1)_{b1}$]—*', *—B($R_1$)—*', *—P($R_1$)—*', *—C($R_1$)($R_2$—*', *—Si($R_1$)($R_2$)—*', *—Ge($R_1$)($R_2$)—*', *—S—*', *—Se—*', *—O—*', *—C(═O)—*', *—S(═O)—*', *—S(═O)$_2$—*', *—C($R_1$)═C($R_2$)—*', *—C(═S)—*', or *—C≡C—*', $T_2$ is a single bond, *—N[$(L_2)_{a2}$-$(R_3)_{b3}$]—*', *—B($R_3$)—*', *—P($R_3$)—*', *—C($R_3$)($R_4$)—*', *—Si($R_3$)($R_4$)—*', *—Ge($R_3$)($R_4$)—*', *—S—*', *—Se—*', *—O—*', *—C(═O)—*', *—S(═O)—*', *—S(═O)$_2$—*', *—C($R_3$)═C($R_4$)—*', *—C(═S)—*', or *—C≡C—*', $L_1$ and $L_2$ are each independently a single bond, a substituted or unsubstituted $C_5$-$C_{30}$ carbocyclic group, or a substituted or unsubstituted $C_1$-$C_{30}$ heterocyclic group, a1 is 1, 2, or 3, wherein, when a1 is 2 or more, two or more of $L_1$(s) are identical to or different from each other, and when a2 is 2 or more, two or more $L_2$(s) are identical to or different from each other, $X_{10}$ is C or N, $X_{20}$ is C or N, $X_{30}$ is or N, and $X_{40}$ is C or N, $Y_{11}$ is C or N, $Y_{21}$ is C or N, $Y_{22}$ is C or N, $Y_{31}$ is C or N, $Y_{32}$ is C or N, and $Y_{41}$ is C or N, $Ar_1$ is a phenyl group substituted with at least one $E_1$, $Ar_2$ is a phenyl group substituted with at least one $E_2$, $E_1$ and $E_2$ are each independently hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, or —$P(=O)(Q_8)(Q_9)$, $R_1$ to $R_4$, $R_{10}$, $R_{20}$, $R_{30}$, and $R_{40}$ are each independently hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, or —$P(=O)(Q_8)(Q_9)$, at least two neighboring groups among $R_1$ to $R_4$, $R_{10}$, $R_{20}$, $R_{30}$, and $R_{40}$ are optionally linked together to form a substituted or unsubstituted $C_5$-$C_{30}$ carbocyclic group or a substituted or unsubstituted $C_1$-$C_{30}$ heterocyclic group, wherein $R_{10}$ and $R_{20}$ are not linked to each other to form a ring, b1 and b3 are each independently 1, 2, 3, 4, or 5, wherein, when b1 is 2 or more, two or more of $R_1$(s) are identical to or different from each other, and when b3 is 2 or more, two or more of $R_3$(s) are identical to or different from each other, b10, b20, b30, and b40 are each independently 1, 2, 3, 4, 5, 6, 7, 8, 9, or 10, wherein, when b10 is 2 or more, two or more of $R_{10}$(s) are identical to or different from each other, when b20 is 2 or more, two or more of $R_{20}$(s) are identical to or different from each other, when b30 is 2 or more, two or more of $R_{30}$(s) are identical to or different from each other, and when b40 is 2 or more, two or more of $R_{40}$(s) are identical to or different from each other, at least one substituent of the substituted $C_5$-$C_{60}$ carbocyclic group, the substituted $C_1$-$C_{60}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted $C_1$-$C_{60}$ hetero aryloxy group, the substituted $C_1$-$C_{60}$ hetero arylthio group, the substituted monovalent non-aromatic condensed polycyclic group, and the substituted monovalent non-aromatic condensed heteropolycyclic group is:

deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, —$N(Q_{11})(Q_{12})$, —$Si(Q_{13})(Q_{14})(Q_{15})$, —$B(Q_{16})(Q_{17})$, —$P(=O)(Q_{18})(Q_{19})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, each substituted with at least one of deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —$N(Q_{21})(Q_{22})$, —$Si(Q_{23})(Q_{24})(Q_{25})$, —$B(Q_{26})(Q_{27})$, —$P(=O)(Q_{28})(Q_{29})$, or any combination thereof; or —$N(Q_{31})(Q_{32})$, —$Si(Q_{33})(Q_{34})(Q_{35})$, —$B(Q_{36})(Q_{37})$, or —$P(=O)(Q_{38})(Q_{39})$, and $Q_1$ to $Q_9$, $Q_{11}$ to $Q_{19}$, $Q_{21}$ to $Q_{29}$, and $Q_{31}$ to $Q_{39}$ are each independently hydrogen, deuterium, —F, —Cl, —Br, —I, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted a $C_1$-$C_{60}$ alkyl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group.

According to an aspect of another embodiment, there is provided an organic light-emitting device including: a first electrode; a second electrode; and an organic layer arranged between the first electrode and the second electrode and including an emission layer, wherein the organic layer includes at least one organometallic compound.

According to an aspect of another embodiment, there is provided a diagnostic composition including at least one organometallic compound represented by Formula 1.

BRIEF DESCRIPTION OF THE DRAWINGS

The above and other aspects, features, and advantages of certain embodiments of the disclosure will be more apparent from the following description taken in conjunction with FIGURE which shows a schematic cross-sectional view of an organic light-emitting device according to an exemplary embodiment.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly on the other element or intervening elements may be present therebetween In contrast, when an element is referred to as being "directly on" another element, there are no intervening elements present It will be understood that, although the terms "first," "second," "third" etc. may be used herein to describe various elements, components, regions, layers and/or sections, these elements, components, regions, layers and/or sections should not be limited by these terms These terms are only used to distinguish one element, component, region, layer or section from another element, component, region, layer or section Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a," "an," "the," and "at least one" do not denote a limitation of quantity and are intended to cover both the singular and plural, unless the context clearly indicates otherwise. For example, "an element" has the same meaning as "at least one element," unless the context clearly indicates otherwise.

"Or" means "and/or." As used herein, the term "and/or" includes any and all combinations of one or more of the associated listed items It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures It will be understood that relative terms are intended to encompass different orientations of the device in addition to the orientation depicted in the Figures For example, if the device in one of the figures is turned over, elements described as being on the "lower" side of other elements would then be oriented on "upper" sides of the other elements The exemplary term "lower," can therefore, encompasses both an orientation of "lower" and "upper," depending on the particular orientation of the figure Similarly, if the device in one of the figures is turned over, elements described as "below" or "beneath" other elements would then be oriented "above" the other elements The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments As such, variations from the shapes of the illustrations as a result, for example, of manufacturing techniques and/or tolerances, are to be expected Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features Moreover, sharp angles that are illustrated may be rounded Thus, the regions illustrated in the figures are schematic in nature and their shapes are not intended to illustrate the precise shape of a region and are not intended to limit the scope of the present claims.

An aspect of the present disclosure provides an organometallic compound represented by Formula 1:

$$M_1(L_{11})_{n11}(L_{12})_{n12}$$ Formula 1 wherein, $M_1$ in Formula 1 is a first-row transition metal of the Periodic Table of Elements, a second-row transition metal of the Periodic Table of Elements, or a third-row transition metal of the Periodic Table of Elements.

In one or more embodiments, $M_1$ in Formula 1 may be beryllium (Be), magnesium (Mg), aluminum (Al), calcium (Ca), titanium ($T_1$), manganese (Mn), cobalt (Co), copper (Cu), zinc (Zn), gallium (Ga), germanium (Ge), zirconium (Zr), ruthenium (Ru), rhodium (Rh), palladium (Pd), silver (Ag), rhenium (Re), platinum (Pt), or gold (Au).

In one or more embodiments, $M_1$ may be Pd, Pt, or Au.

In one or more embodiments, $M_1$ in Formula 1 may be Pt or Pd.

In one or more embodiments, $M_1$ in Formula 1 may be Pt.

$L_{11}$ in Formula 1 may be a ligand represented by Formula 1-1:

Formula 1-1

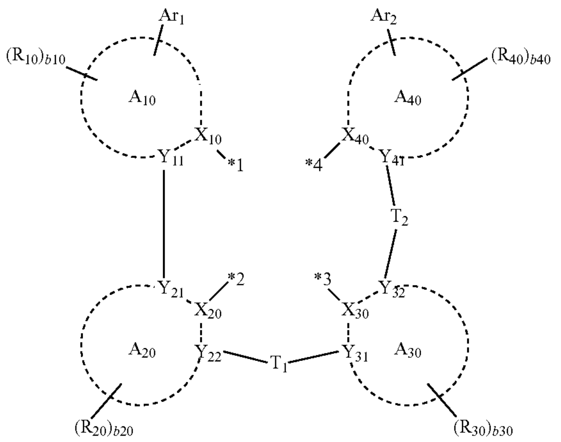

wherein *1 to *4 in Formula 1-1 each independently indicate a binding site to $M_1$.

In Formula 1-1, $A_{10}$ may be (i) a 5-membered N-containing $C_1$-$C_{30}$ heterocyclic group or (ii) a bi- or multi-cyclic $C_1$-$C_{30}$ heterocyclic group including a 5-membered N-containing $C_1$-$C_{30}$ heterocyclic group.

In an embodiment, $A_{10}$ may be a group represented by one of Formulae A10-1 to A10-48:

A10-1

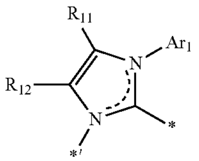

A10-2

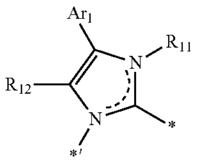

A10-3

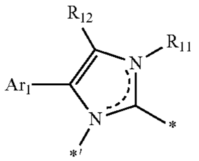

A10-4

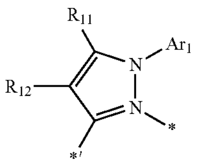

A10-5

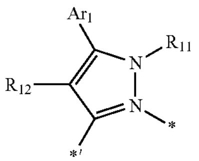

A10-6

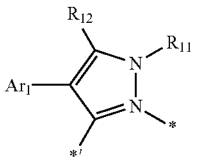

A10-7

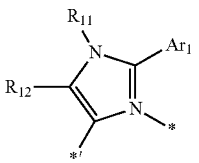

A10-8

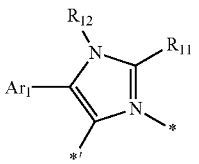

A10-9

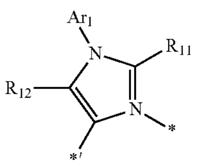

-continued
A10-10
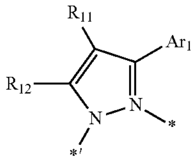
A10-11
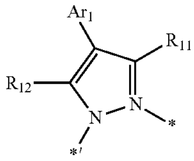
A10-12
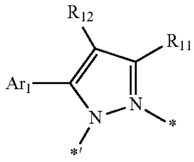
A10-13
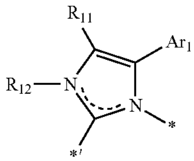
A10-14
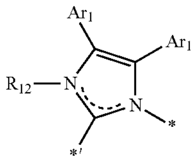
A10-15
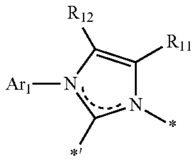
A10-16
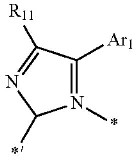
A10-17
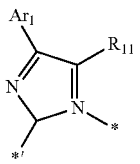
A10-18
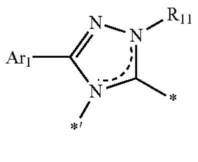
-continued
A10-19
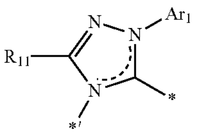
A10-20
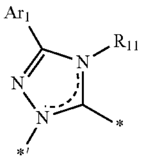
A10-21
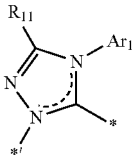
A10-22
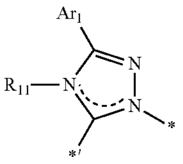
A10-23
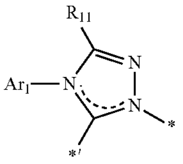
A10-24
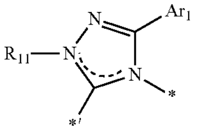
A10-25
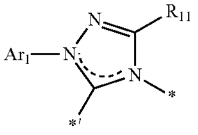
A10-26
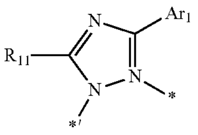
A10-27
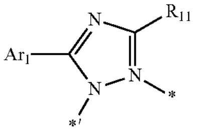
A10-28
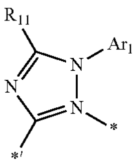

-continued
A10-29
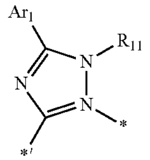
A10-30
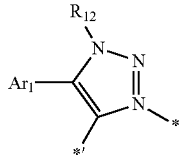
A10-31
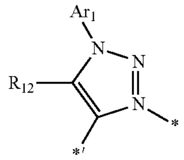
A10-32
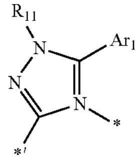
A10-33
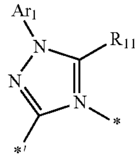
A10-34
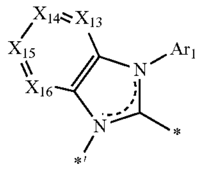
A10-35
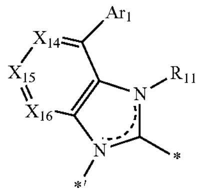
A10-36
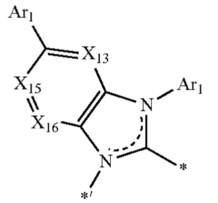
A10-37
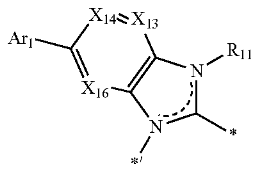
-continued
A10-38
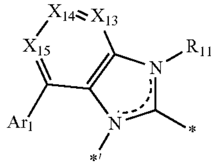
A10-39
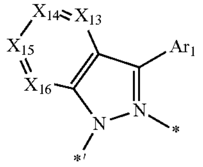
A10-40
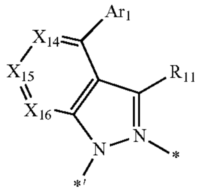
A10-41
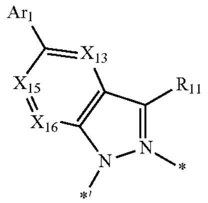
A10-42
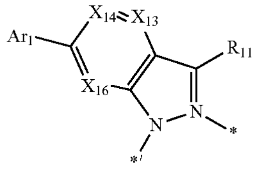
A10-43
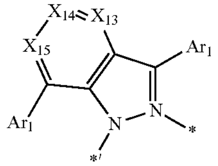
A10-44
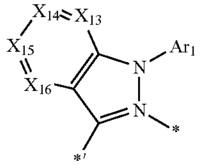
A10-45
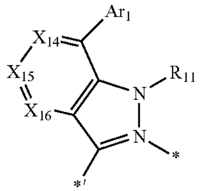

-continued

A10-46

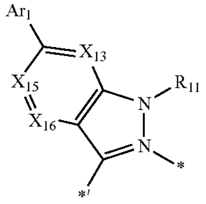

A10-47

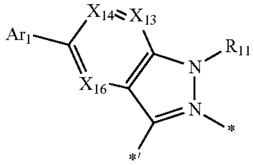

A10-48

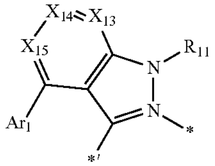

wherein, in Formulae A10-1 to A10-48, $Ar_1$ may be the same as described herein, $X_{13}$ may be $C(R_{13})$ or N, $X_{14}$ may be $C(R_{14})$ or N, $X_{15}$ may be $C(R_{15})$ or N, and $X_{16}$ may be $C(R_{16})$ or N, $R_{11}$ to $R_{16}$ may each independently be the same as described in connection with $R_{10}$,

* and *' each indicate a binding site to a neighboring atom.

In Formula 1-1, $A_{20}$ and $A_{30}$ may each independently be a $C_5$-$C_{30}$ carbocyclic group or a $C_1$-$C_{30}$ heterocyclic group.

In one or more embodiments, $A_{20}$ and $A_{30}$ may each independently be a benzene group, a naphthalene group, an anthracene group, a phenanthrene group, a triphenylene group, a pyrene group, a chrysene group, a cyclopentadiene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, a tetrazole group, an oxazole group, an isooxazole group, a thiazole group, an isothiazole group, an oxadiazole group, a thiadiazole group, a benzopyrazole group, a benzimidazole group, an indazole group, a benzoxazole group, a benzothiazole group, a benzoxadiazole group, a benzothiadiazole group, a benzotriazole group, a diazaindene group, a triazaindene group, a 5,6,7,8-tetrahydroisoquinoline group, or a 5,6,7,8-tetrahydroquinoline group.

In one or more embodiments, $A_{40}$ may be a benzene group, a naphthalene group, an anthracene group, a phenanthrene group, a triphenylene group, a pyrene group, a chrysene group, a cyclopentadiene group, a 1,2,3,4-tetrahydronaphthalene group, a fluorene group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a triazaindene group, a 5,6,7,8-tetrahydroisoquinoline group, or a 5,6,7,8-tetrahydroquinoline group.

In one or more embodiments, $A_{40}$ may be a group represented by one of Formulae A40-1 to A40-4:

A40-1

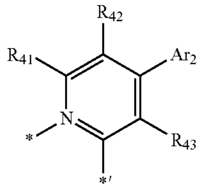

A40-2

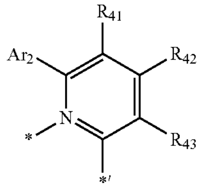

A40-3

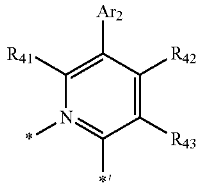

A40-4

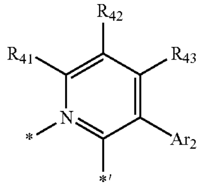

wherein, in Formulae A40-1 to A40-4, $Ar_2$ may be the same as described herein, $R_{41}$ to $R_{43}$ may each independently be the same as described in connection with $R_{40}$, and

* and *' each indicate a binding site to a neighboring atom.

In Formula 1-1, $Ar_1$ may be a phenyl group substituted with at least one $E_1$.

In Formula 1-1, $Ar_2$ may be a phenyl group substituted with at least one $E_2$.

In one or more embodiments, the ligand represented by Formula 1-1 may be represented by Formula 1-1A:

Formula 1-1A

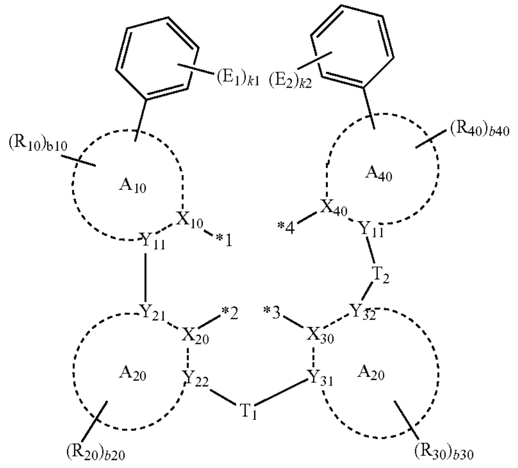

wherein, in Formula 1-1A,

*1 to *4 each indicate a binding site to $M_1$, $A_{10}$, $A_{20}$, $A_{30}$, $A_{40}$, $E_1$, $E_2$, $X_{10}$, $X_{20}$, $X_{30}$, $X_{40}$, $Y_{11}$, $Y_{21}$, $Y_{22}$, $Y_{31}$, $Y_{32}$, $Y_{41}$, $T_1$, $T_2$, $R_{10}$, $R_{20}$, $R_{30}$, $R_{40}$, b10, b20, b30, and b40 may each be the same as described herein, k1 may be 1, 2, 3, 4, or 5, and k2 may be 1, 2, 3, 4, or 5.

In Formula 1-1, $E_1$ and $E_2$ may each independently be hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted heterocycloalkyl group, a substituted or unsubstituted $C_3$-$C_{10}$ cycloalkenyl group, a substituted or unsubstituted heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, or —$P(=O)(Q_8)(Q_9)$.

In one or more embodiments, $E_1$ and $E_2$ may each independently be:

deuterium, —F, —Cl, —Br, or —I;

a $C_1$-$C_{30}$ alkyl group or a $C_1$-$C_{30}$ alkoxy group;

a $C_1$-$C_{30}$ alkyl group or a $C_1$-$C_{30}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, or a $C_1$-$C_{30}$ aryloxy group;

a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, or a $C_1$-$C_{30}$ aryloxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, a $C_1$-$C_{10}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, or any combination thereof; or —$N(Q_1)(Q_2)$ or —$Si(Q_3)(Q_4)(Q_5)$.

In one or more embodiments, $E_1$ and $E_2$ may each independently be:

deuterium, —F, —Cl, —Br, —I, a cyano group, a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a methoxy group, an ethoxy group, an n-propoxy group, an isopropoxy group, an n-butoxy group, an isobutoxy group, a sec-butoxy group, a tert-butoxy group, an n-pentoxy group, an isopentoxy group, a sec-pentoxy group, a tert-pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a furanyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, a phenoxy group, $—N(Q_1)(Q_2)$, or $—Si(Q_3)(Q_4)(Q_5)$; or a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a methoxy group, an ethoxy group, an n-propoxy group, an isopropoxy group, an n-butoxy group, an isobutoxy group, a sec-butoxy group, a tert-butoxy group, an n-pentoxy group, an isopentoxy group, a sec-pentoxy group, a tert-pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, a phenoxy group, $—N(Q_1)(Q_2)$, or $—Si(Q_3)(Q_4)(Q_5)$, each substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, a $C_1$-$C_{10}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group. a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, or any combination thereof.

In one or more embodiments, $E_1$and $E_2$ may each independently be deuterium, —F, a cyano group, a nitro group, $—SF_5$, $—CH_3$, $—CD_3$, $—CD_2H$, $—CDH_2$, $—CF_3$, $—CF_2H$, $—CFH_2$, $—OCH_3$, a group represented by one of Formulae 9-1 to 9-61, a group represented by one of Formulae 10-1 to 10-204, $—N(Q_1)(Q_2)$, or $—Si(Q_3)(Q_4)(Q_5)$.

In an embodiment, $Ar_1$ may be represented by one of Formulae Ar1-1 to Ar1-18:

Ar1-1

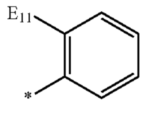

-continued
Ar1-2
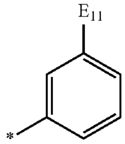
Ar1-3
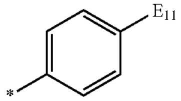
Ar1-4
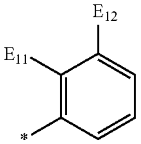
Ar1-5
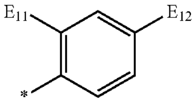
Ar1-6
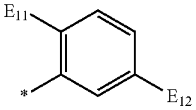
Ar1-7
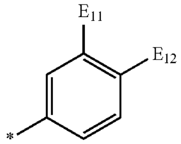
Ar1-8
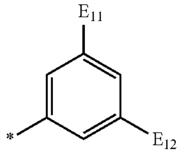
Ar1-9
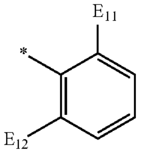
Ar1-10
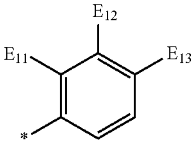
Ar1-11
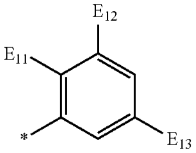
Ar1-12
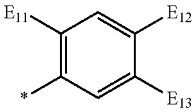
-continued
Ar1-13
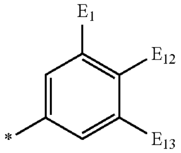
Ar1-14
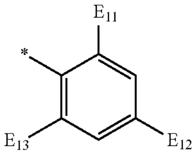
Ar1-15
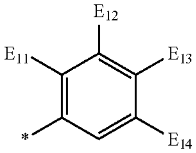
Ar1-16
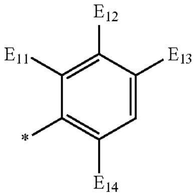
Ar1-17
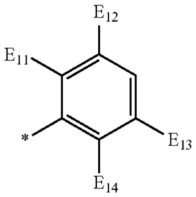
Ar1-18
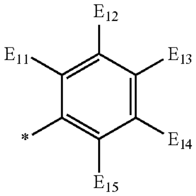
wherein, in Formulae Ar1-1 to Ar1-18,
$E_{11}$ to $E_{15}$ may each independently be the same as described in connection with $E_1$, and
* indicates a binding site to a neighboring atom.
In an embodiment, $Ar_2$ may be represented by one of Formulae Ar2-1 to Ar2-18:
Ar2-1
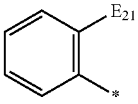
Ar2-2
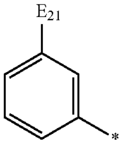

-continued

Ar2-3

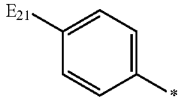

Ar2-4

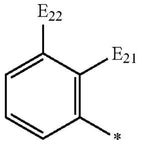

Ar2-5

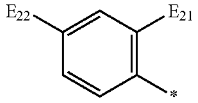

Ar2-6

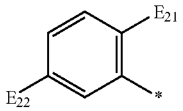

Ar2-7

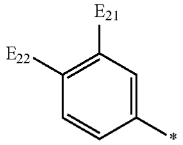

Ar2-8

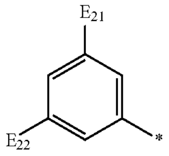

Ar2-9

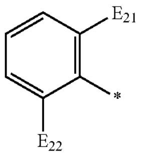

Ar2-10

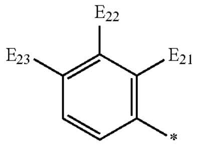

Ar2-11

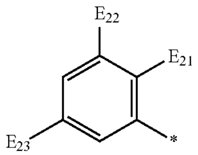

Ar2-12

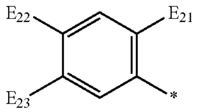

Ar2-13

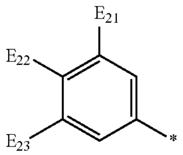

-continued

Ar2-14

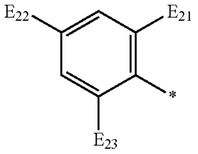

Ar2-15

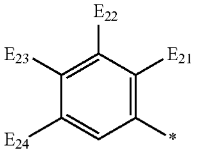

Ar2-16

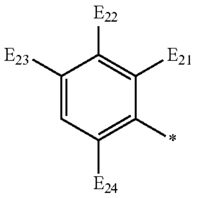

Ar2-17

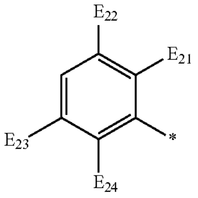

Ar2-18

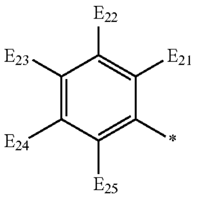

wherein, in Formulae Ar2-1 to Ar2-18, $E_{21}$ to $E_{25}$ may each independently be the same as described in connection with $E_2$, and

* indicates a binding site to a neighboring atom.

In Formula 1-1, $T_1$ may be a single bond, *—N[$(L_1)_{a1}$-$(R_1)_{b1}$]—*', *—B($R_1$)—*', *—P($R_1$)—*', *—C($R_1$)($R_2$)—*', *—Si($R_1$)($R_2$)—*', *—Ge($R_1$)($R_2$)—*', *—S—*', *—Se—*', *—O—*', *—C(═O)—*', *—S(═O)—*', *—S(═O)$_2$—*', *—C($R_1$)═C($R_2$)—*', *—C(═S)—*', or *—C≡C—*'.

In Formula 1-1, $T_2$ may be a single bond, *—N[$(L_2)_{a2}$-$(R_3)_{b3}$]—*', *—B($R_3$)—*', *—P($R_3$)—*', *—C($R_3$)($R_4$)—*', *—Si($R_3$)($R_4$)—*', *—Ge($R_3$)($R_4$)—*', *—S—*', *—Se—*', *—O—*', *—C(═O)—*', *—S(═O)—*', *—S(═O)$_2$—*', *—C($R_3$)═C($R_4$)—*', *—C(═S)—*', or *—C≡C—*'.

In one or more embodiments, $T_1$ may be a single bond, *—N[$(L_1)_{a1}$-$(R_6)_{b6}$]—*', *—B($R_6$)—*', *—C($R_6$)($R_7$)—*', *—Si($R_6$)($R_7$)—*', *—O—*', or *—S—*'.

In one or more embodiments, $T_1$ may be *—N[$(L_1)_{a1}$-$(R_1)_{b6}$]—*', *—B($R_6$)—*', *—C($R_6$)($R_7$)—*', *—Si($R_6$)($R_7$)—*', *—O—*', or *—S—*'.

In one or more embodiments, $T_2$ may be a single bond, *—N[$(L_2)_{a2}$-$(R_8)_{b8}$]—*', *—C($R_8$)($R_9$)—*', *—Si($R_8$)($R_9$)—*', *—O—*', or *—S—*'.

In Formula 1-1, $L_1$ and $L_2$ may each independently be a single bond, a substituted or unsubstituted $C_5$-$C_{30}$ carbocyclic group, or a substituted or unsubstituted $C_1$-$C_{30}$ heterocyclic group, and a1 may be 1, 2, or 3, wherein, when a1 is 2 or more, two or more of $L_1$(s) may be identical to or different from each other, and when a2 is 2 or more, two or more $L_2$(s) may be identical to or different from each other.

In one or more embodiments, $L_1$ and $L_2$ may each independently be: a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group; or a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof.

In Formula 1-1, $X_{10}$ may be C or N, $X_{20}$ may be C or N, $X_{30}$ may be or N, and $X_{40}$ may be C or N.

In one or more embodiments, $X_{10}$ may be C. In one or more embodiments, $X_{10}$ may be N.

In one or more embodiments, $X_{20}$ may be C. In one or more embodiments, $X_{20}$ may be N.

In one or more embodiments, $X_{30}$ may be C. In one or more embodiments, $X_{30}$ may be N.

In one or more embodiments, $X_{40}$ may be C. In one or more embodiments, $X_{40}$ may be N.

In Formula 1-1, may be C or N, $Y_{21}$ may be C or N, $Y_{22}$ may be C or N, $Y_{31}$ may be C or N, $Y_{32}$ may be C or N, and $Y_{41}$ may be C or N.

In one or more embodiments, may be C. In one or more embodiments, may be N.

In one or more embodiments, $Y_{21}$ may be C. In one or more embodiments, $Y_{21}$ may be N.

In one or more embodiments, $Y_{22}$ may be C. In one or more embodiments, $Y_{22}$ may be N.

In one or more embodiments, $Y_{31}$ may be C. In one or more embodiments, $Y_{31}$ may be N.

In one or more embodiments, $Y_{32}$ may be C. In one or more embodiments, $Y_{32}$ may be N.

In one or more embodiments, $Y_{41}$ may be C. In one or more embodiments, $Y_{41}$ may be N.

In Formula 1-1, a bond between $M_1$ and $A_{10}$, a bond between $M_1$ and $A_{20}$, a bond between $M_1$ and $A_{30}$, and a bond between $M_1$ and $A_{40}$ may each independently be a covalent bond or a dative bond.

In one or more embodiments, two of a bond between $M_1$ and $A_{10}$, a bond between $M_1$ and $A_{20}$, a bond between $M_1$ and $A_{30}$, and a bond between $M_1$ and $A_{40}$ may each independently be a covalent bond, and the other two may each independently be a dative bond.

In one or more embodiments, a bond between $M_1$ and $A_{10}$ may be a dative bond, a bond between $M_1$ and $A_{20}$ may be a covalent bond, a bond between $M_1$ and $A_{30}$ may be a covalent bond, and a bond between $M_1$ and $A_{40}$ may be a dative bond.

Thus, the organometallic compound represented by Formula 1 may be electrically neutral.

In Formula 1-1, $R_1$ to $R_4$, $R_{10}$, $R_{20}$, $R_{30}$, and $R_{40}$ may each independently be hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted heterocycloalkyl group, a substituted or unsubstituted $C_3$-$C_{10}$ cycloalkenyl group, a substituted or unsubstituted heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, or —$P(=O)(Q_8)(Q_9)$.

In Formula 1-1, at least two neighboring groups among $R_1$ to $R_9$, $R_{10}$, $R_{20}$, $R_{30}$, and $R_{40}$ may optionally be linked together form a substituted or unsubstituted $C_5$-$C_{30}$ carbocyclic group or a substituted or unsubstituted $C_1$-$C_{30}$ heterocyclic group, wherein $R_{10}$ and $R_{20}$ may not be linked to each other to form a ring.

In Formula 1-1, b1 and b3 may each independently be 1, 2, 3, 4, or 5, wherein, when b1 is 2 or more, two or more of $R_1$(s) may be identical to or different from each other, and when b3 is 2 or more, two or more of $R_3$(s) may be identical to or different from each other.

In Formula 1-1, b10, b20, b30, and b40 may each independently be 1, 2, 3, 4, 5, 6, 7, 8, 9, or 10, wherein, when b10 is 2 or more, two or more of $R_{10}$(s) may be identical to or different from each other, when b20 is 2 or more, two or more of $R_{20}$(s) may be identical to or different from each other, when b30 is 2 or more, two or more of $R_{30}$(s) may be identical to or different from each other, and when b40 is 2 or more, two or more of $R_{40}$(s) may be identical to or different from each other.

In one or more embodiments, $R_1$ to $R_4$, $R_{10}$, $R_{20}$, $R_{30}$, and $R_{40}$ may each independently be:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, or an adamantanyl group; or —$N(Q_1)(Q_2)$, —$Si(Q_3)(Q_4)(Q_5)$, —$B(Q_6)(Q_7)$, or —$P(=O)(Q_8)(Q_9)$, and $Q_1$ to $Q_9$ may each independently be:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, or a naphthyl group; or an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, or a naphthyl group, each substituted with deuterium, a $C_1$-$C_{10}$ alkyl group, a phenyl group, or any combination thereof.

In one or more embodiments, $R_1$ to $R_4$, $R_{10}$, $R_{20}$, $R_{30}$, and $R_{40}$ may each independently be hydrogen, deuterium, —F, a cyano group, a nitro group, —$SF_5$, —$CH_3$, —$CD_3$, —$CD_2H$, —$CDH_2$, —$CF_3$, —$CF_2H$, —$CFH_2$, a group represented by one of Formulae 9-1 to 9-61, or a group represented by one of Formulae 10-1 to 10-204:

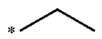

9-1

-continued
9-2
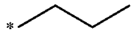
9-3
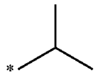
9-4
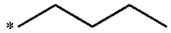
9-5
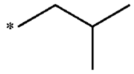
9-6
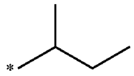
9-7
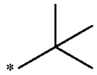
9-8
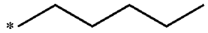
9-9
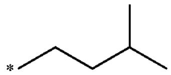
9-10
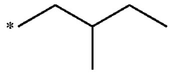
9-11
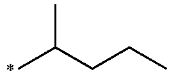
9-12
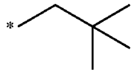
9-13
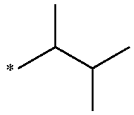
9-14
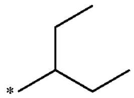
9-15
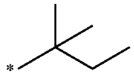
9-16
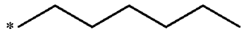
9-17
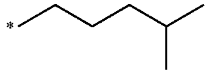
9-18
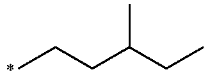
-continued
9-19
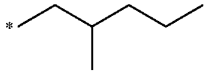
9-20
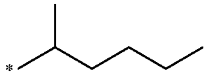
9-21
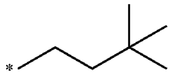
9-22
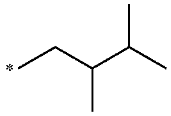
9-23
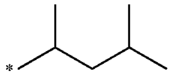
9-24
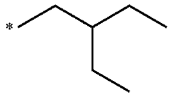
9-25
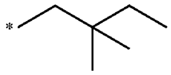
9-26
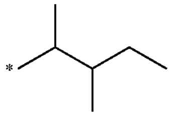
9-27
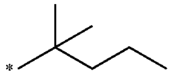
9-28
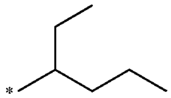
9-29
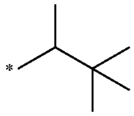
9-30
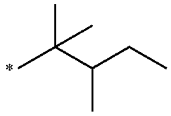
9-31
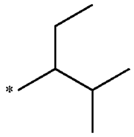
9-32
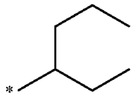

-continued
9-33
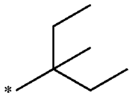
9-34
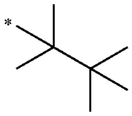
9-35
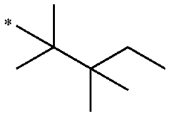
9-36
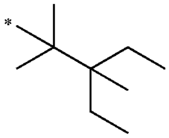
9-37
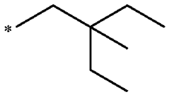
9-38
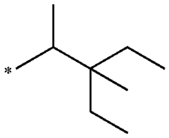
9-39
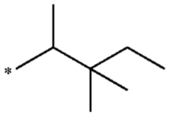
9-44
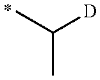
9-45
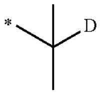
9-46
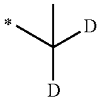
9-47
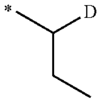
9-48
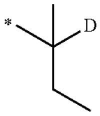
9-49
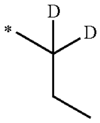
-continued
9-50
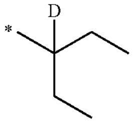
9-51
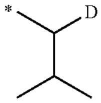
9-52
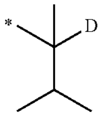
9-53
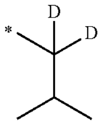
9-54
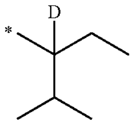
9-55
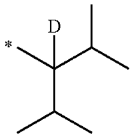
9-56
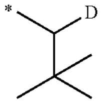
9-57
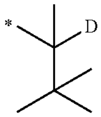
9-58
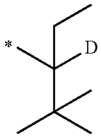
9-59
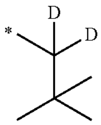
9-60
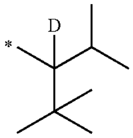

-continued
9-61
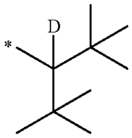
10-1
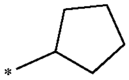
10-2
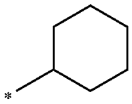
10-3
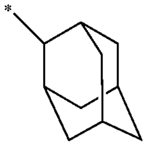
10-4
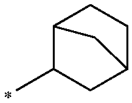
10-5
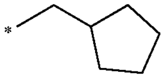
10-6
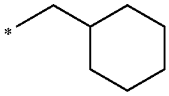
10-7
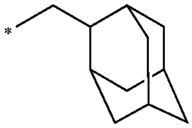
10-8
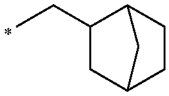
10-9
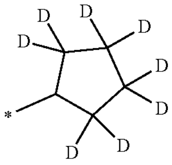
10-10
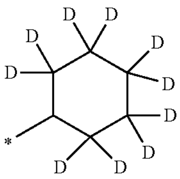
-continued
10-11
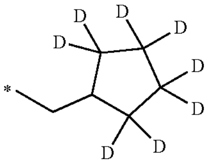
10-12
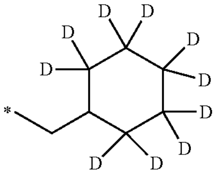
10-13
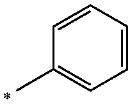
10-14
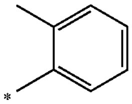
10-15
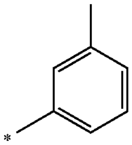
10-16
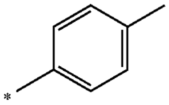
10-17
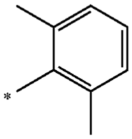
10-18
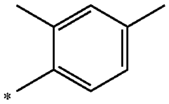
10-19
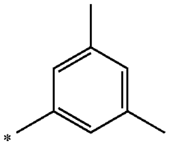
10-20
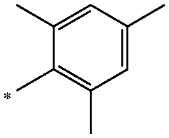

-continued
10-21
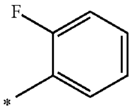
10-22
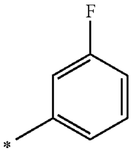
10-23
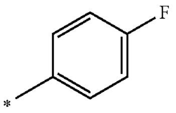
10-24
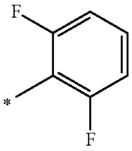
10-25
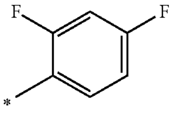
10-26
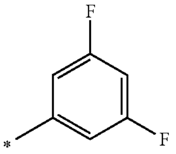
10-27
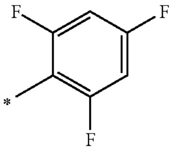
10-28
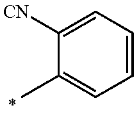
10-29
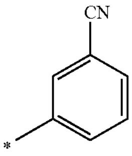
10-30
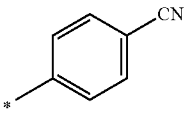
-continued
10-31
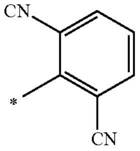
10-32
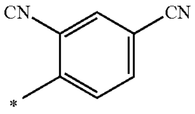
10-33
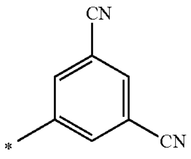
10-34
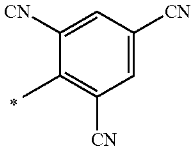
10-35
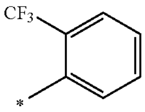
10-36
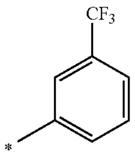
10-37
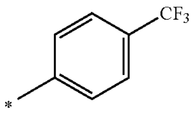
10-38
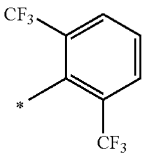
10-39
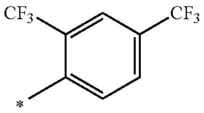
10-40
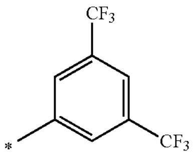

-continued
10-41
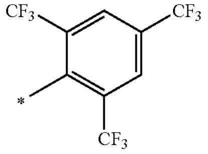
10-42
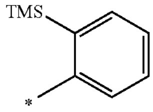
10-43
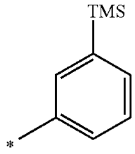
10-44
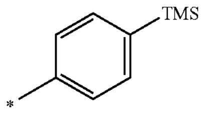
10-45
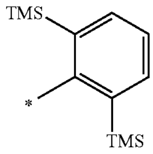
10-46
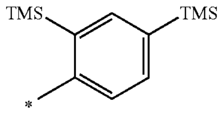
10-47
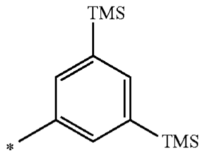
10-48
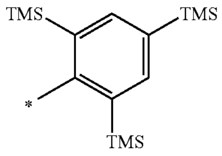
10-49
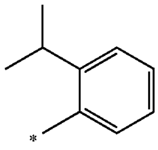
10-50
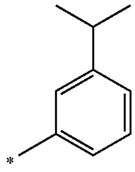
-continued
10-51
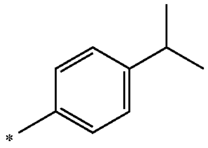
10-52
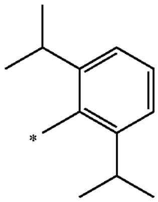
10-53
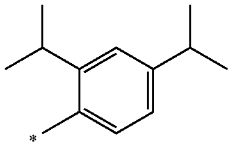
10-54
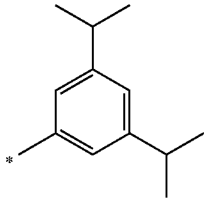
10-55
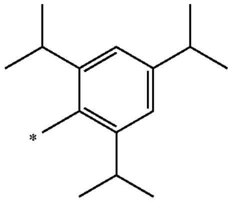
10-56
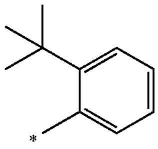
10-57
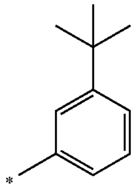
10-58
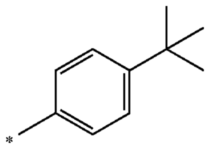

-continued
10-59
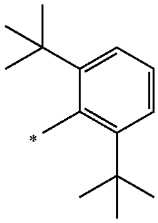
10-60
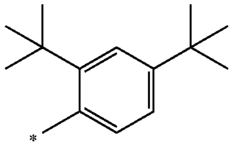
10-61
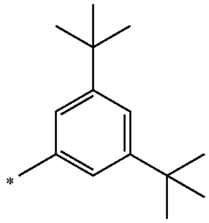
10-62
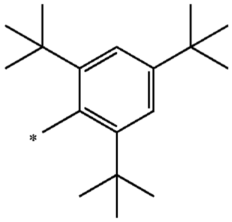
10-63
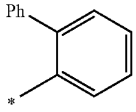
10-64
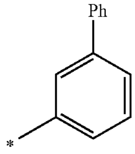
10-65
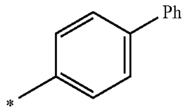
10-66
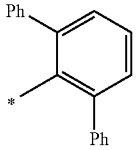
10-67
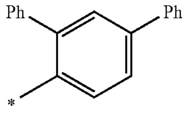
-continued
10-68
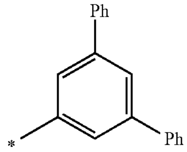
10-69
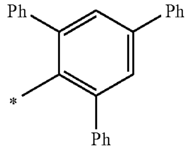
10-70
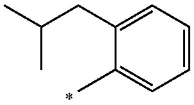
10-71
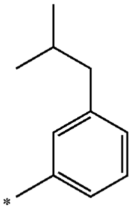
10-72
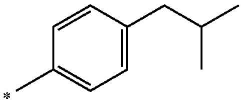
10-73
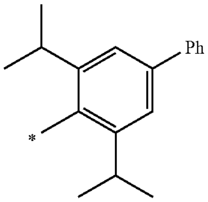
10-74
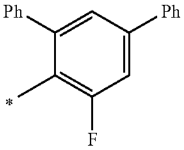
10-75
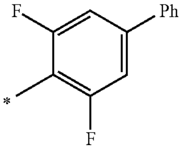

-continued
10-76
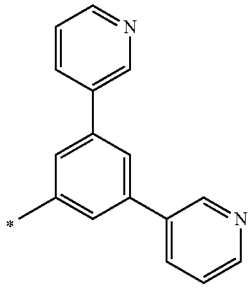
10-77
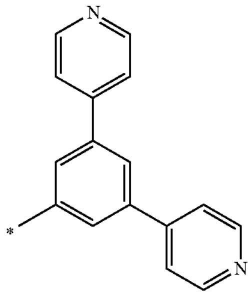
10-78
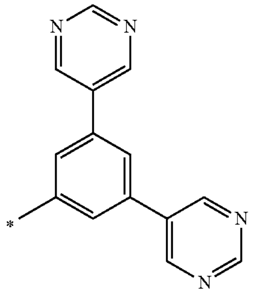
10-79
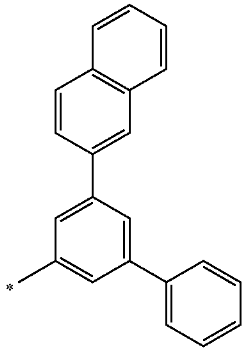
10-80
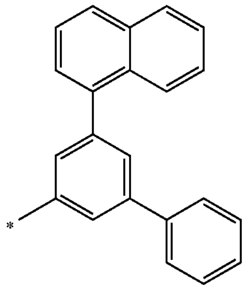
-continued
10-81
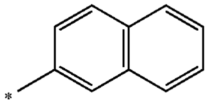
10-82
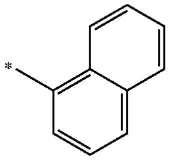
10-83
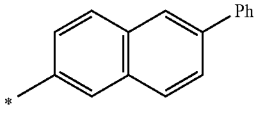
10-84
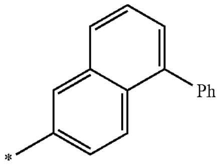
10-85
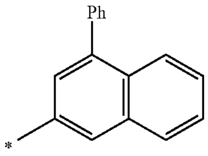
10-86
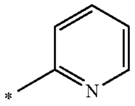
10-87
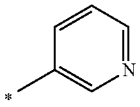
10-88
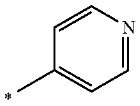
10-89
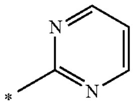
10-90
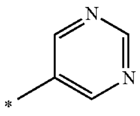
10-91
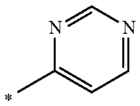

-continued
10-92
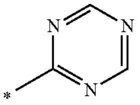
10-93
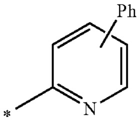
10-94
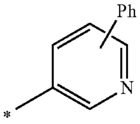
10-95
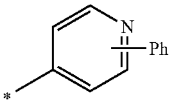
10-96
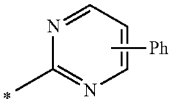
10-97
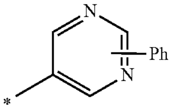
10-98
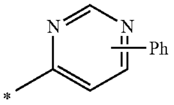
10-99
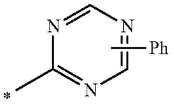
10-100
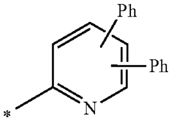
10-101
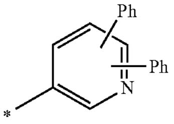
10-102
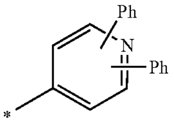
-continued
10-103
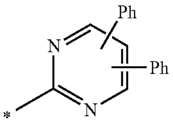
10-104
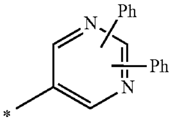
10-105
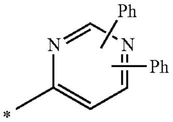
10-106
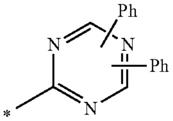
10-107
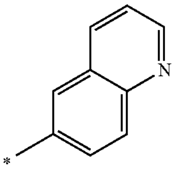
10-108
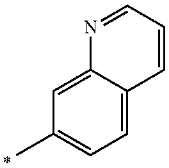
10-109
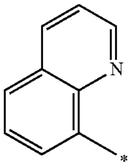
10-110
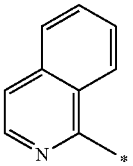
10-111
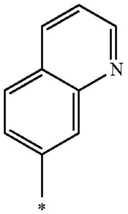

-continued
10-112
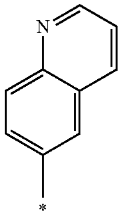
10-113
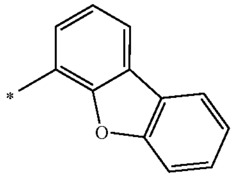
10-114
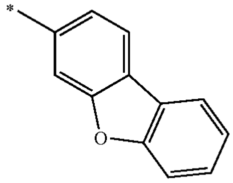
10-115
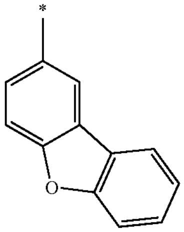
10-116
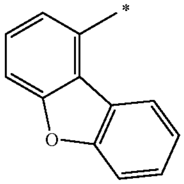
10-117
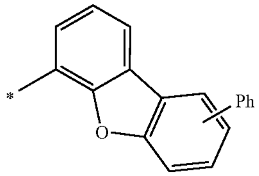
10-118
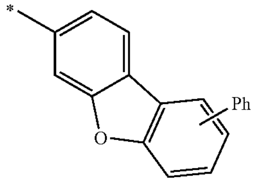
-continued
10-119
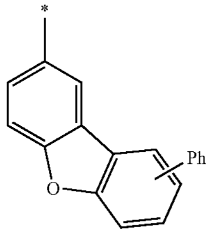
10-120
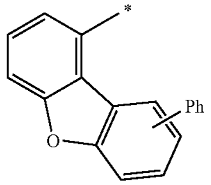
10-121
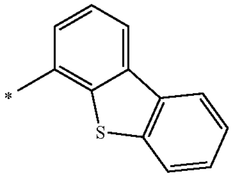
10-122
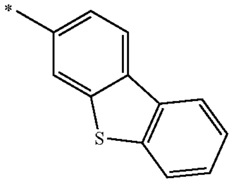
10-123
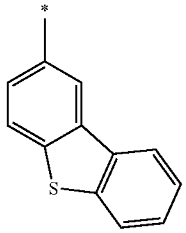
10-124
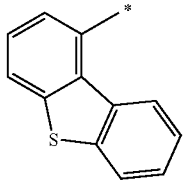
10-125
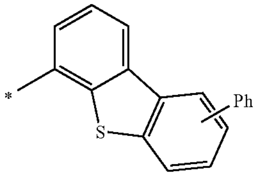

-continued
10-126
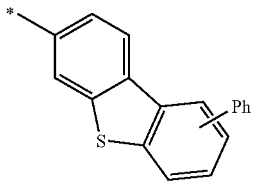
10-127
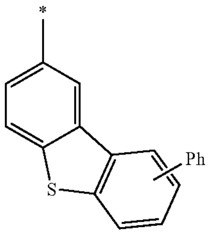
10-128
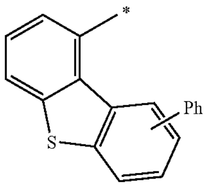
10-129
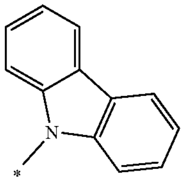
10-130
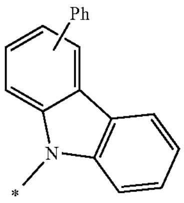
10-131
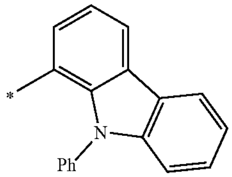
10-132
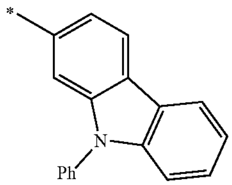
-continued
10-133
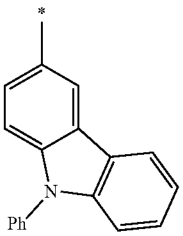
10-134
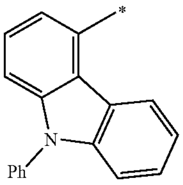
10-135
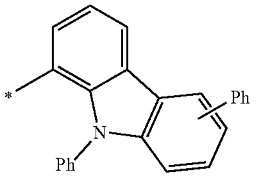
10-136
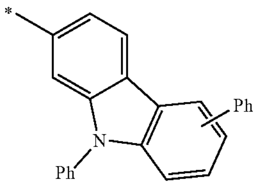
10-137
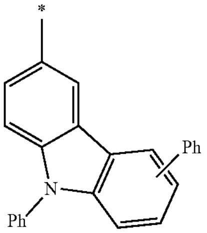
10-138
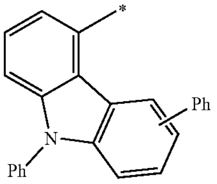
10-139
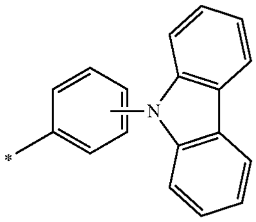

-continued
10-140
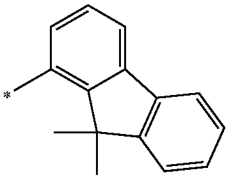
10-141
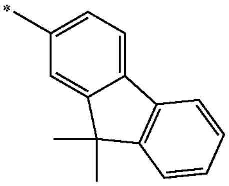
10-142
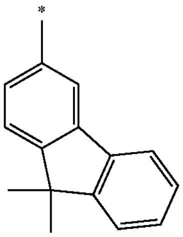
10-143
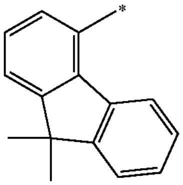
10-144
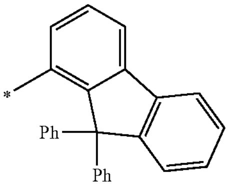
10-145
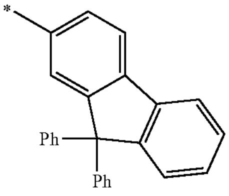
10-146
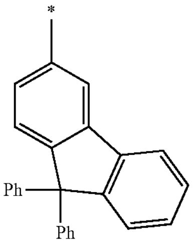
-continued
10-147
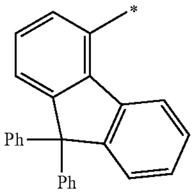
10-148
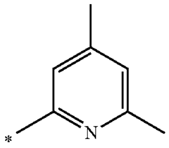
10-149
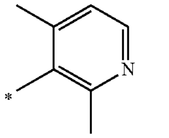
10-150
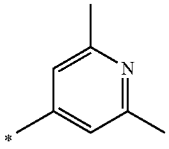
10-151
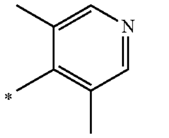
10-152
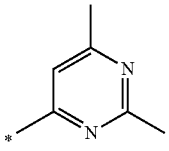
10-153
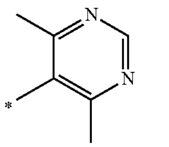
10-154
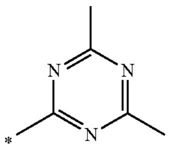
10-155
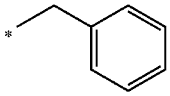

-continued
10-156
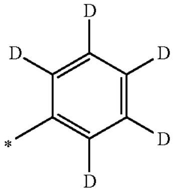
10-157
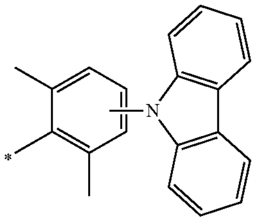
10-158
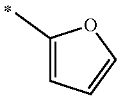
10-159
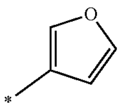
10-160
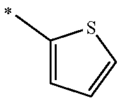
10-161
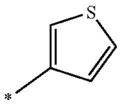
10-162
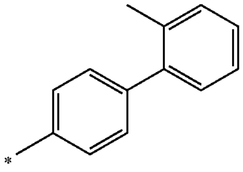
10-163
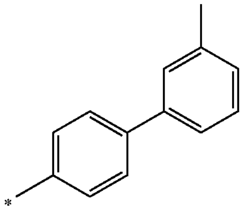
10-164
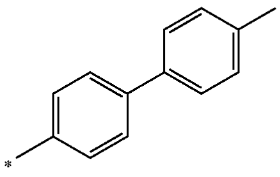
-continued
10-165
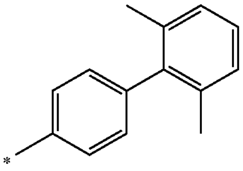
10-166
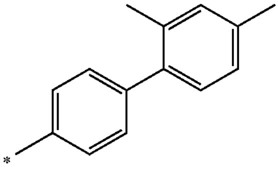
10-167
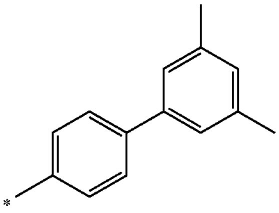
10-168
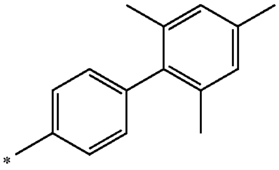
10-169
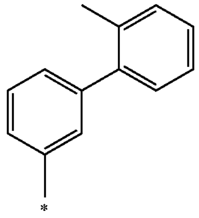
10-170
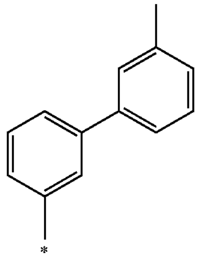
10-171
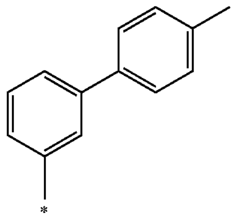

-continued
10-172
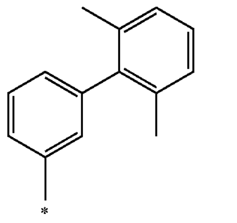
10-173
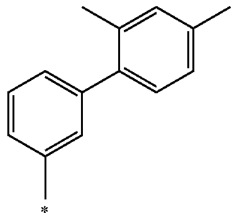
10-174
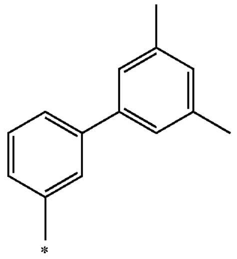
10-175
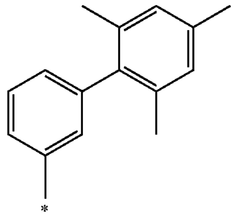
10-176
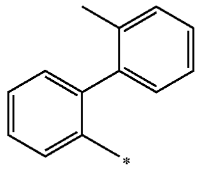
10-177
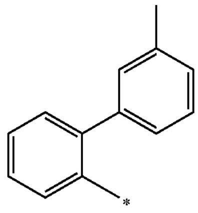
10-178
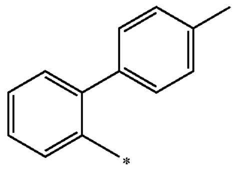
-continued
10-179
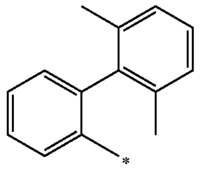
10-180
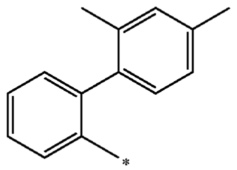
10-181
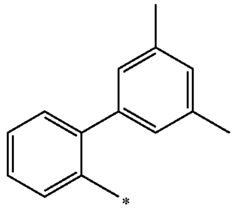
10-182
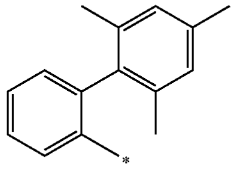
10-183
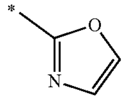
10-184
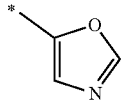
10-185
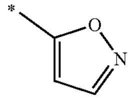
10-186
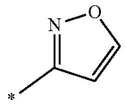
10-187
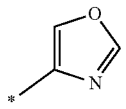
10-188
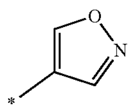

-continued
10-189
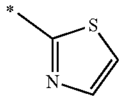
10-190
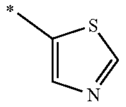
10-191
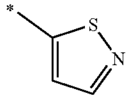
10-192
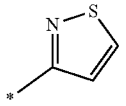
10-193
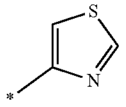
10-194
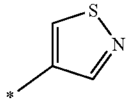
10-195
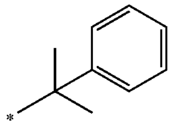
10-196
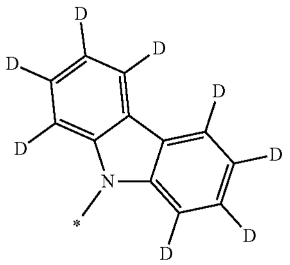
10-197
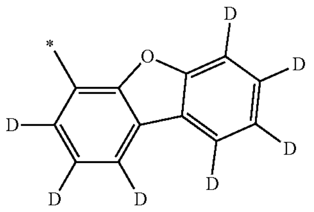
10-198
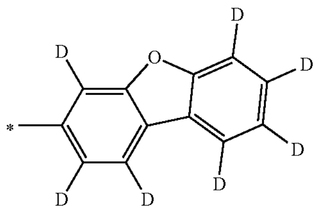
-continued
10-199
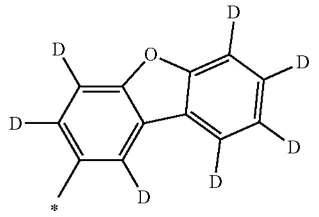
10-200
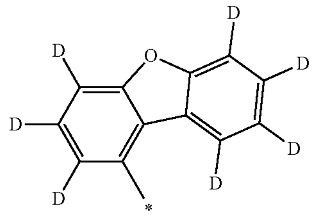
10-201
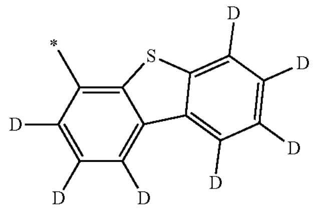
10-202
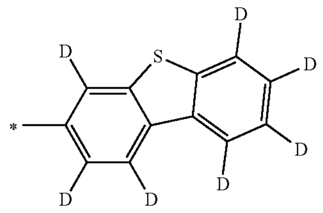
10-203
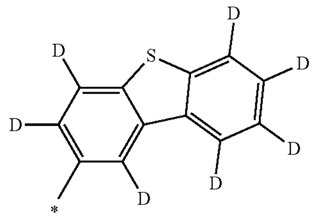
10-204
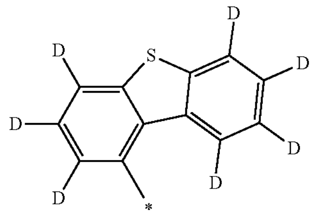
wherein, in Formulae 9-1 to 9-61 and 10-1 to 10-204, * indicates a binding site to a neighboring atom, Ph is a phenyl group, and TMS is a trimethylsilyl group.
In one or more embodiments, the organometallic compound represented by Formula 1 may be represented by one of Formulae 11-1 to 11-38:

11-1
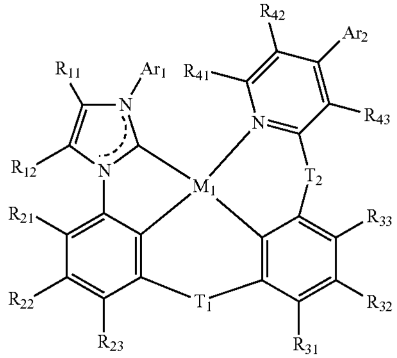
11-2
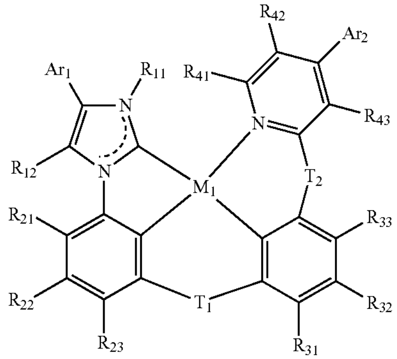
11-3
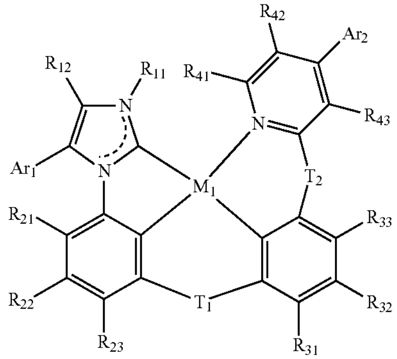
11-4
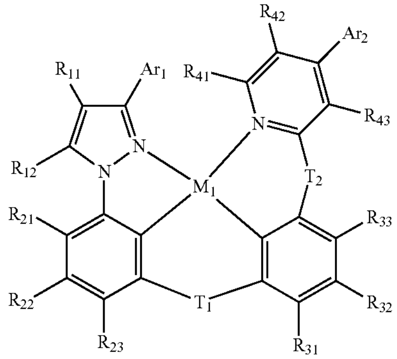
-continued
11-5
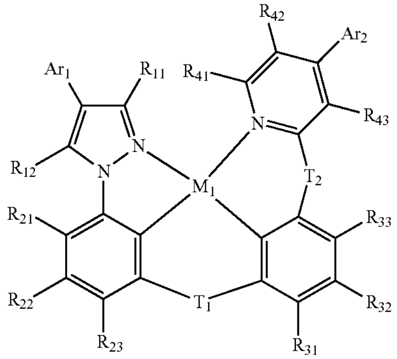
11-6
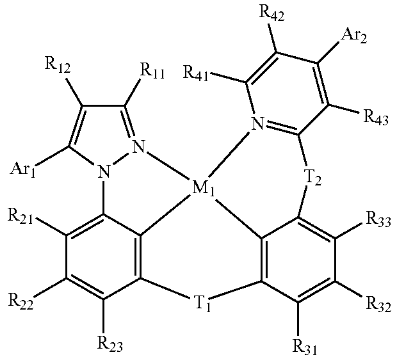
11-7
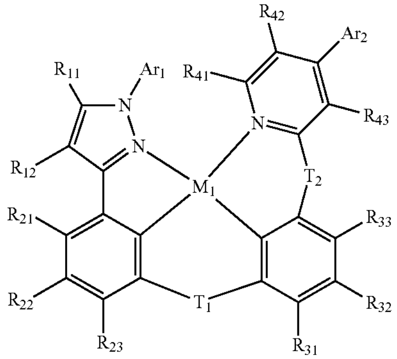
11-8
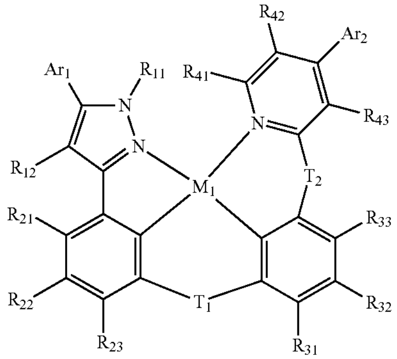

-continued
11-9
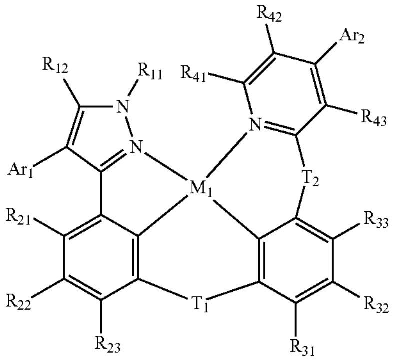
11-10
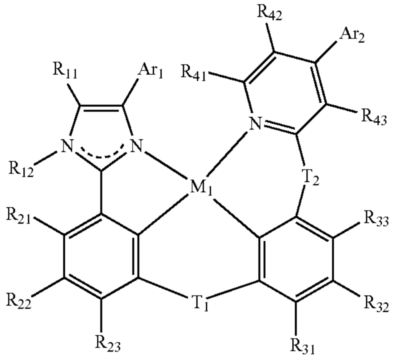
11-11
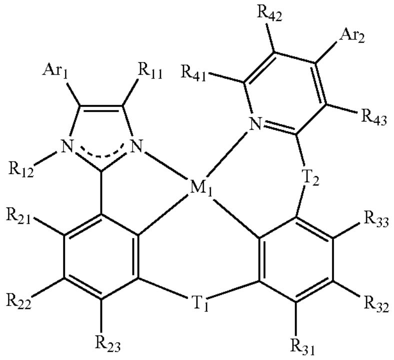
11-12
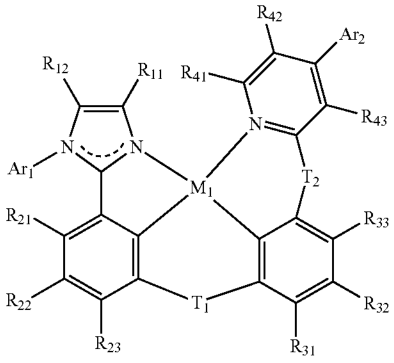
-continued
11-13
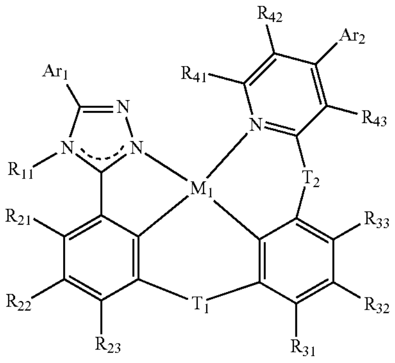
11-14
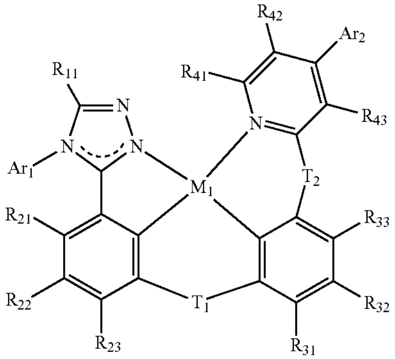
11-15
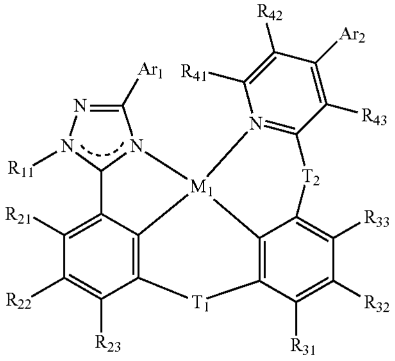
11-16
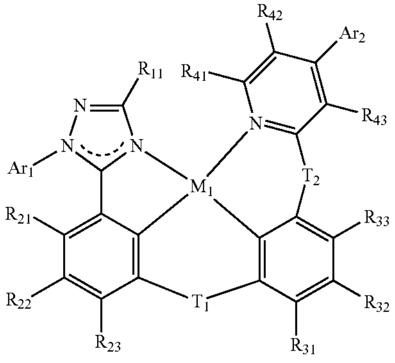

-continued
11-17
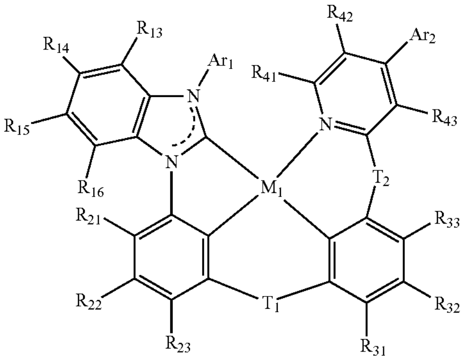
11-18
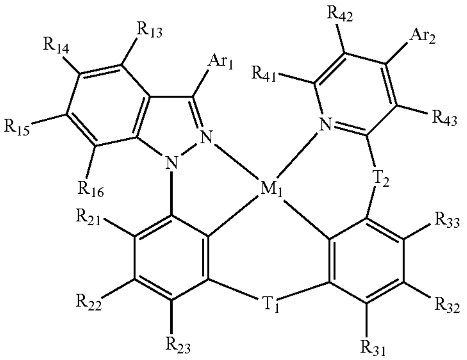
11-19
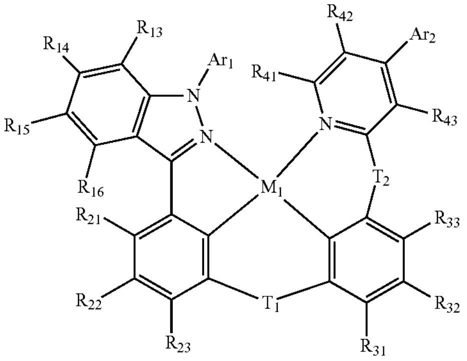
11-20
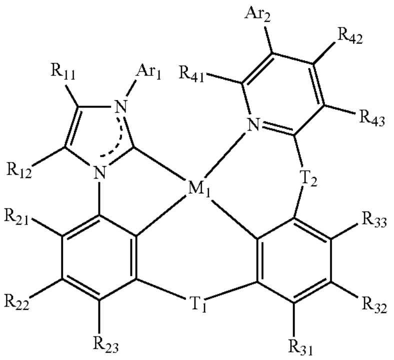
-continued
11-21
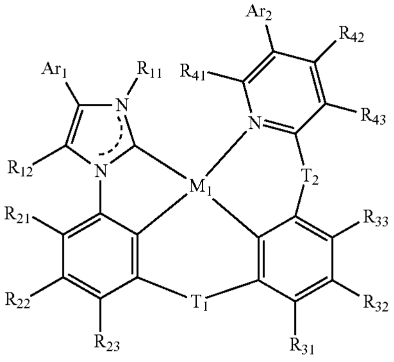
11-22
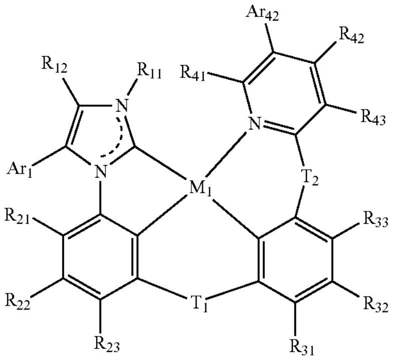
11-23
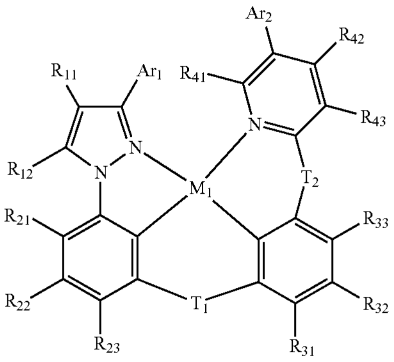
11-24
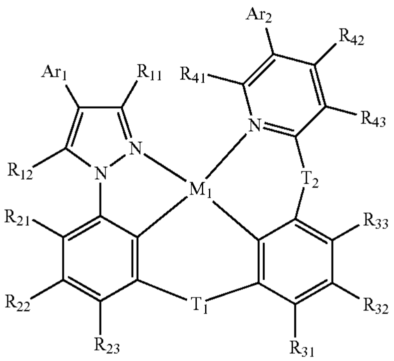

-continued
11-25
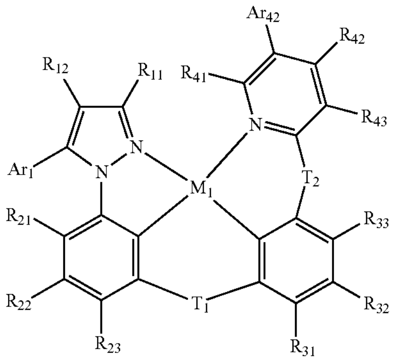
11-26
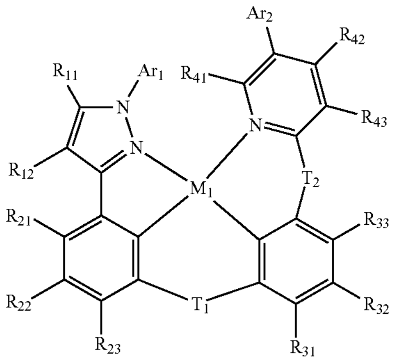
11-27
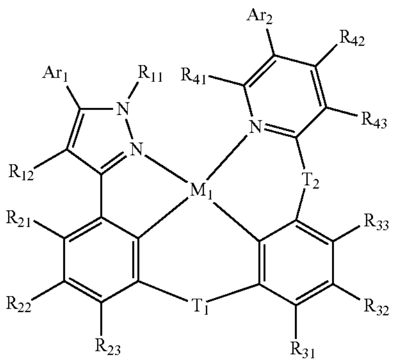
11-28
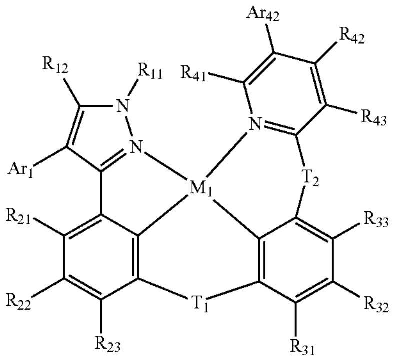
-continued
11-29
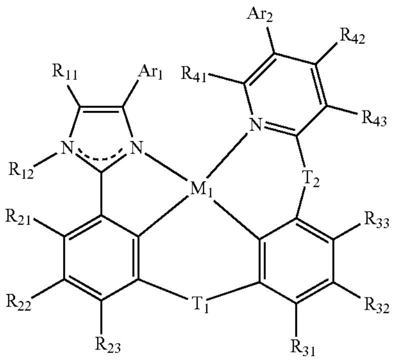
11-30
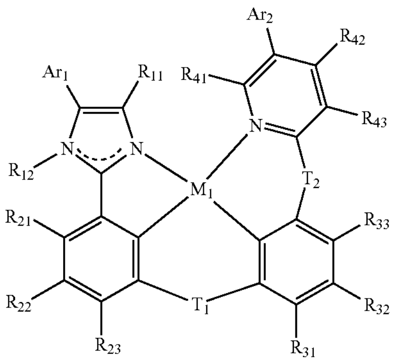
11-31
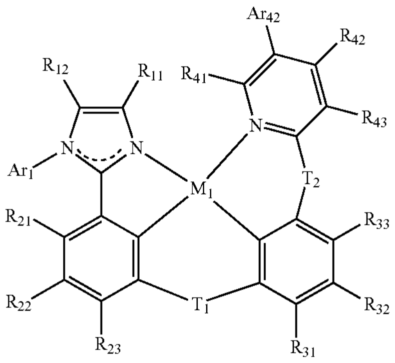
11-32
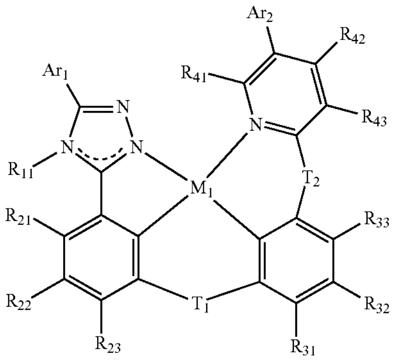

-continued 11-33

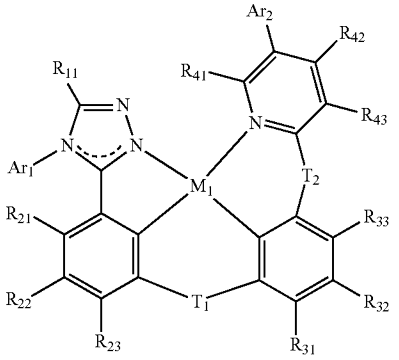

11-34

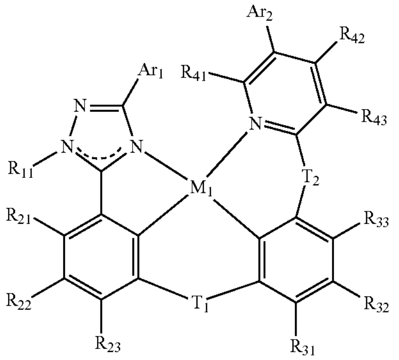

11-35

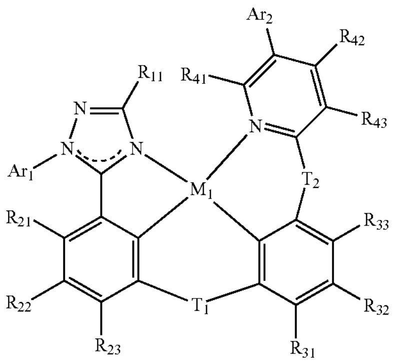

11-36

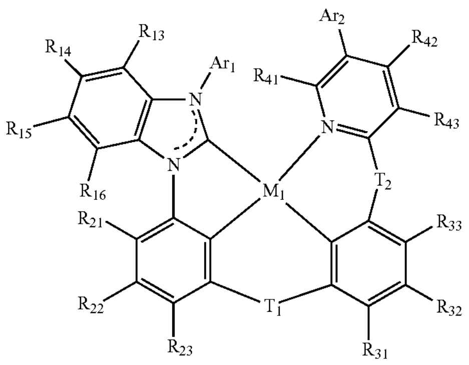

-continued 11-37

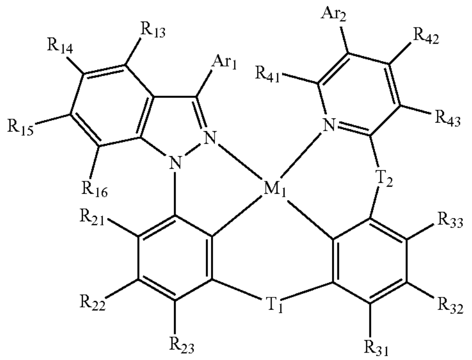

11-38

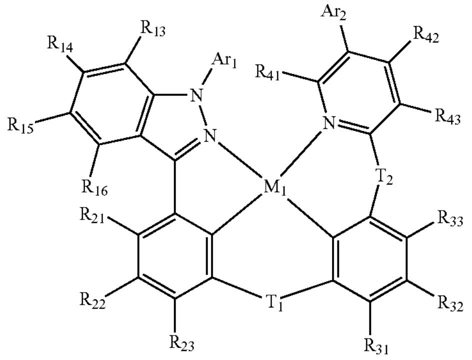

wherein, in Formulae 11-1 to 11-38, $M_1$, $Ar_1$, $Ar_2$, $T_1$, and $T_2$ may each be the same as described herein, $R_{11}$ to $R_{16}$ may each independently be the same as described in connection with $R_{10}$, $R_{21}$ to $R_{23}$ may each independently be the same as described in connection with $R_{20}$, $R_{31}$ to $R_{33}$ may each independently be the same as described in connection with $R_{30}$, and $R_{41}$ to $R_{43}$ may each independently be the same as described in connection with $R_{40}$.

In one or more embodiments, at least two neighboring groups among $R_1$ to $R_9$, $R_{10}$, $R_{20}$, $R_{30}$, and $R_{40}$ may optionally be linked together via a single bond, a double bond, or a first linking group, to form a $C_5$-$C_{30}$ carbocyclic group that is unsubstituted or substituted with at least one $R_{10a}$ or a $C_1$-$C_{30}$ heterocyclic group that is unsubstituted or substituted with at least one $R_{10a}$ (for example, a fluorene group, a xanthene group, an acridine group, or the like, each unsubstituted or substituted with at least one $R_{10a}$). $R_{10a}$ may be the same as described in connection with $R_1$.

The first linking group may be *—N($R_5$)—*', *—B($R_5$)—*', *—P($R_6$)—*', *—C($R_5$)($R_6$)—*', *—Si($R_5$)($R_6$)—*', *—Ge($R_5$)($R_6$)—*', *—Se—*', *—C(=O)—*', *—S(=O)—*', *—S(=O)$_2$—*', *—C($R_5$)=*', *=C($R_5$)—*', *—C($R_5$)=C($R_6$)—*', *—C(=S)—*', or *—C≡C—*', wherein $R_5$ and $R_6$ may each be the same as described in connection with $R_1$, and * and *' each indicate a binding site to a neighboring atom.

For example, in Formula 1, at least two neighboring groups among $R_1$ to $R_4$, $R_{10}$, $R_{20}$, $R_{30}$, and $R_{40}$ may optionally be linked together to form a cyclopentane group, a cyclopentadiene group, a furan group, a thiophene group, a pyrrole group, a silole group, an adamantane group, a norbornane group, a norbornene group, a cyclohexane group, a cyclohexene group, a benzene group, a naphthalene group, an indene group, an indole group, a benzofuran group, a benzothiophene group, a benzosilole group, a fluorene group, a carbazole group, a dibenzofuran group, a dibenzothiophene group, or a dibenzosilole group, each unsubstituted or substituted with at least one $R_{10a}$, wherein $R_{10}$ and $R_{20}$ may not be linked to each other to form a ring.

In Formula 1, $L_{12}$ may be a monodentate ligand or a bidentate ligand.

For example, $L_{12}$ in Formula 1 may be a ligand represented by one of Formulae 7-1 to 7-11, but embodiments of the present disclosure are not limited thereto:

7-1

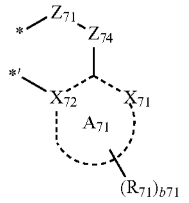

7-2

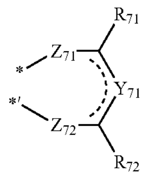

7-3

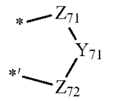

7-4

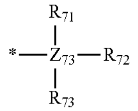

7-5

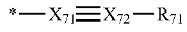

7-6

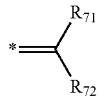

7-7

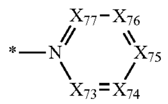

7-8

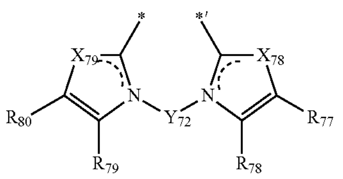

7-9

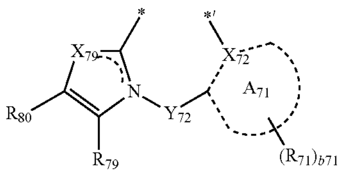

-continued 7-10

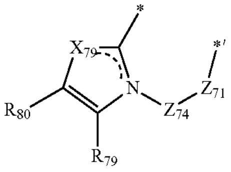

7-11

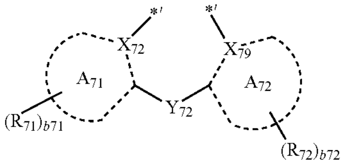

wherein, in Formulae 7-1 to 7-11, $A_{71}$ and $A_{72}$ may each independently be a $C_5$-$C_{20}$ carbocyclic group or a $C_1$-$C_{20}$ heterocyclic group;

$X_{71}$ and $X_{72}$ may each independently be C or N;

$X_{73}$ may be N or $C(Q_{73})$; $X_{74}$ may be N or $C(Q_{74})$; $X_{75}$ may be N or $C(Q_{75})$; $X_{76}$ may be N or $C(Q_{76})$, $X_{77}$ may be N or $C(Q_{77})$;

$X_{75}$ may be O, S or $N(Q_{78})$, $X_{79}$ may be O, S or $N(Q_{79})$;

$Y_{71}$ and $Y_{72}$ may each independently be a single bond, a double bond, a substituted or unsubstituted $C_1$-$C_5$ alkylene group, a substituted or unsubstituted $C_2$-$C_5$ alkenylene group, or a substituted or unsubstituted $C_6$-$C_{10}$ arylene group;

$Z_{71}$ and $Z_{72}$ may each independently be N, O, $N(R_{74})$, $P(R_{75})(R_{76})$, or $As(R_{75})(R_{76})$;

$Z_{73}$ may be P or As;

$Z_{74}$ may be CO or $CH_2$, $R_{71}$ to $R_{80}$ and $Q_{73}$ to $Q_{76}$ may each independently be hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted heterocycloalkyl group, a substituted or unsubstituted $C_3$-$C_{10}$ cycloalkenyl group, a substituted or unsubstituted heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, or a substituted or unsubstituted monovalent non-aromatic condensed heteropolycyclic group; $R_{71}$ and $R_{72}$ may optionally be linked to form a ring; $R_{77}$ and $R_{78}$ may optionally be linked to form a ring; $R_{78}$ and $R_{79}$ may optionally be linked to form a ring; and $R_{79}$ and $R_{80}$ may optionally be linked to form a ring;

b71 and b72 may each independently be 1, 2, or 3, and

* and *' each indicate a binding site to a neighboring atom.

For example, in Formula 7-1, $A_{71}$ and $A_{72}$ may each independently be a benzene group, a naphthalene group, an imidazole group, a benzimidazole group, a pyridine group, a pyrimidine group, a triazine group, a quinoline group, or an isoquinoline group, but embodiments of the present disclosure are not limited thereto.

For example, in Formula 7-1, $X_{72}$ and $X_{79}$ may each be N, but embodiments of the present disclosure are not limited thereto.

For example, in Formula 7-7, $X_{73}$ may be $C(Q_{73})$; $X_{74}$ may be $C(Q_{74})$; $X_{75}$ may be $C(Q_{75})$; $X_{76}$ may be $C(Q_{76})$, and $X_{77}$ may be $C(Q_{77})$, but embodiments of the present disclosure are not limited thereto.

For example, in Formula 7-8, $X_{78}$ may be $N(Q_{78})$; and $X_{79}$ may be $N(Q_{79})$, but embodiments of the present disclosure are not limited thereto.

For example, in Formulae 7-2, 7-3, and 7-8, $Y_{71}$ and $Y_{72}$ may each independently be a substituted or unsubstituted methylene group or a substituted or unsubstituted phenylene group, but embodiments of the present disclosure are not limited thereto.

For example, in Formulae 7-1 and 7-2, $Z_{71}$ and $Z_{72}$ may each be O, but embodiments of the present disclosure are not limited thereto.

For example, in Formula 7-4, $Z_{73}$ may be P, but embodiments of the present disclosure are not limited thereto.

For example, in Formulae 7-1 to 7-11, $R_{71}$ to $R_{80}$ and $Q_{73}$ to $Q_{79}$ may each independently be: hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, $—SF_5$, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, a bicyclo[2.2.1]heptanyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkylphenyl group, a naphthyl group, a pyridinyl group, a pyrimidinyl group, or any combination thereof;

a cyclopentyl group, a cyclohexyl group, a cycloheptyl group, a cyclooctyl group, a bicyclo[2.2.1]heptanyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, or an imidazopyrimidinyl group;

a cyclopentyl group, a cyclohexyl group, a cycloheptyl group, a cyclooctyl group, a bicyclo[2.2.1]heptanyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, or an imidazopyrimidinyl group, each substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, a bicyclo[2.2.1]heptanyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, —$Si(Q_{11})(Q_{12})(Q_{13})$, —$B(Q_{11})(Q_{12})$, —$N(Q_{11})(Q_{12})$, or any combination thereof; or —$Si(Q_1)(Q_2)(Q_3)$, —$B(Q_1)(Q_2)$, or —$N(Q_1)(Q_2)$, and $Q_1$ to $Q_3$ and $Q_{11}$ to $Q_{13}$ may each independently be:

a methyl group, an ethyl group, an n-propyl group, an isopropyl group, an n-butyl group, an isobutyl group, a sec-butyl group, a tert-butyl group, an n-pentyl group, an isopentyl group, a 2-methylbutyl group, a sec-pentyl group, a tert-pentyl group, a neo-pentyl group, a 3-pentyl group, a 3-methyl-2-butyl group, a phenyl group, a biphenyl group, a $C_1$-$C_{20}$ alkylphenyl group, or a naphthyl group; or a methyl group, an ethyl group, an n-propyl group, an isopropyl group, an n-butyl group, an isobutyl group, a sec-butyl group, a tert-butyl group, an n-pentyl group, an isopentyl group, a 2-methylbutyl group, a sec-pentyl group, a tert-pentyl group, a neo-pentyl group, a 3-pentyl group, a 3-methyl-2-butyl group, a phenyl group, or a naphthyl group, each substituted with deuterium, a phenyl group, or any combination thereof, but embodiments of the present disclosure are not limited thereto.

In Formula 1, $L_{12}$ may be a ligand represented by one of Formulae 5-1 to 5-116 and 8-1 to 8-23, but embodiments of the present disclosure are not limited thereto:

8-1

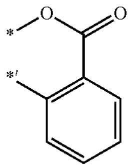

8-2

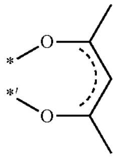

8-3

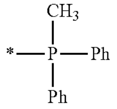

8-4

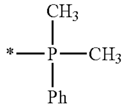

8-5

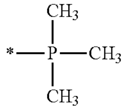

8-6

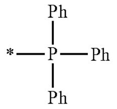

8-7

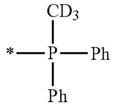

-continued 8-8

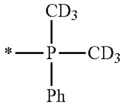

8-9

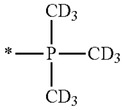

8-10

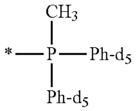

8-11

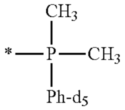

8-12

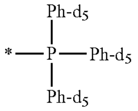

8-13

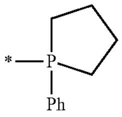

8-14

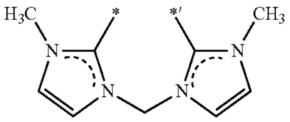

8-15

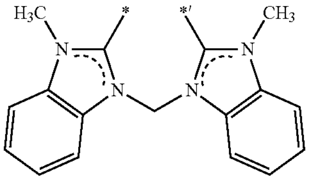

8-16

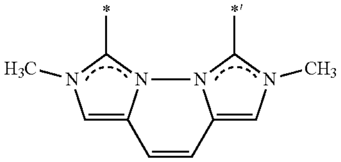

8-17

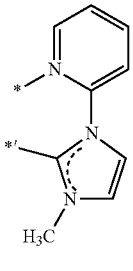

-continued
8-18
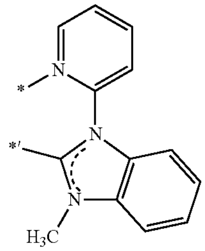
8-19
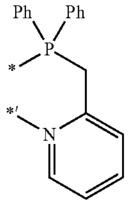
8-20
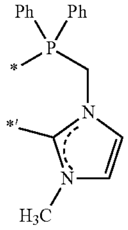
8-21
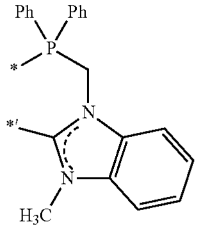
8-22
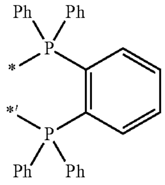
8-23
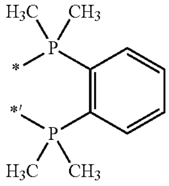
5-1
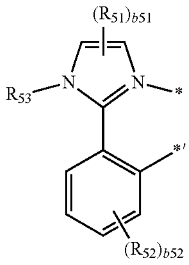
-continued
5-2
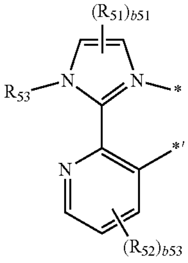
5-3
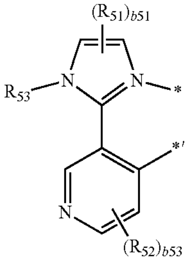
5-4
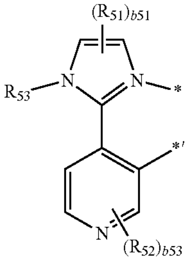
5-5
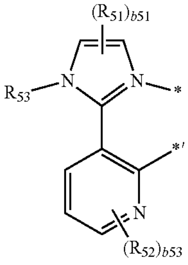
5-6
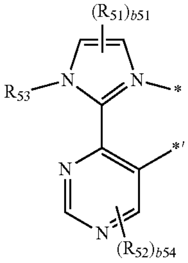
5-7
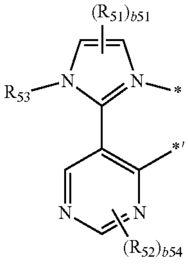

-continued
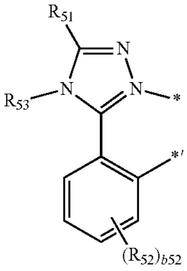
5-8
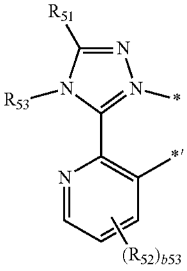
5-9
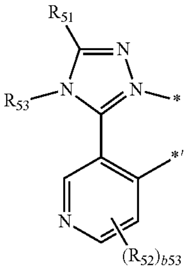
5-10
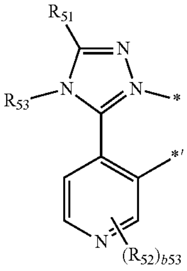
5-11
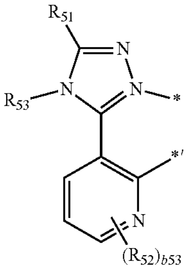
5-12
-continued
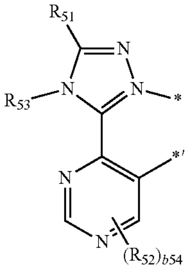
5-13
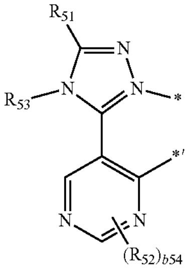
5-14
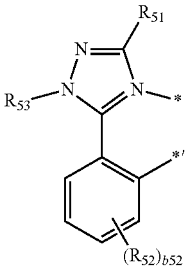
5-15
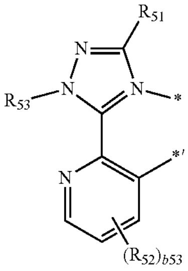
5-16
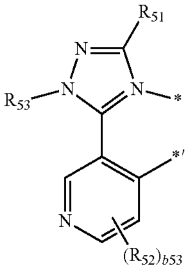
5-17

-continued
5-18
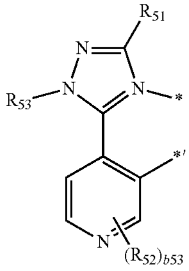
5-19
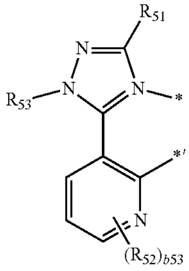
5-20
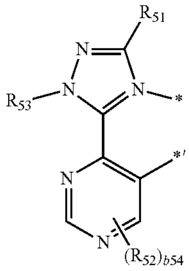
5-21
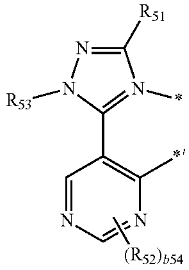
5-22
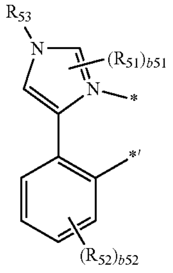
-continued
5-23
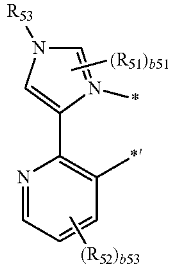
5-24
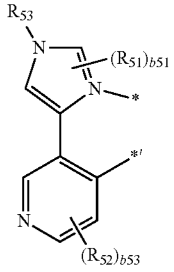
5-25
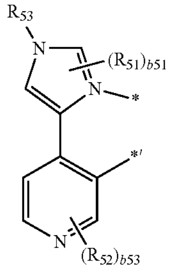
5-26
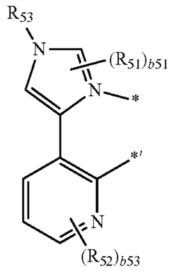
5-27
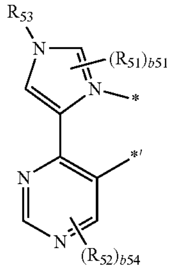

-continued
5-28
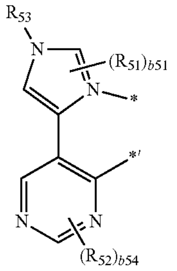
5-29
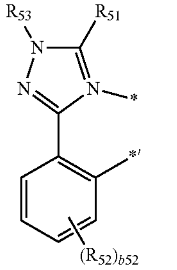
5-30
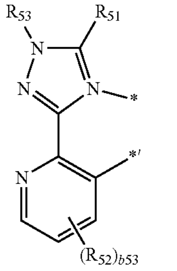
5-31
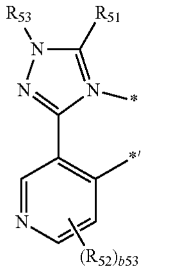
5-32
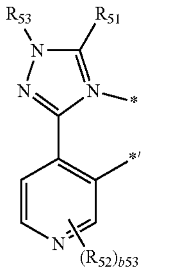
-continued
5-33
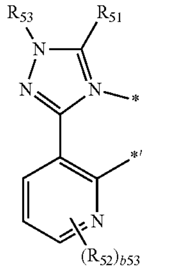
5-34
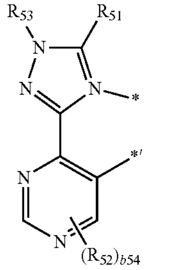
5-35
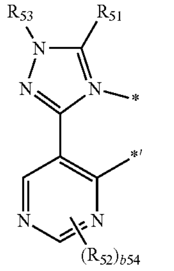
5-36
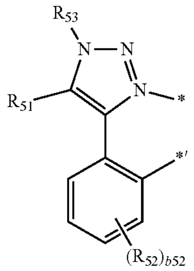
5-37
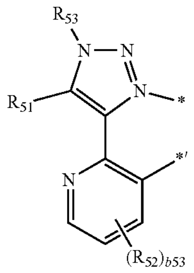

-continued
5-38
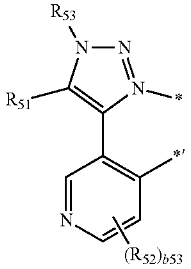
5-39
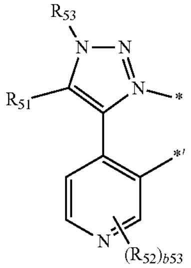
5-40
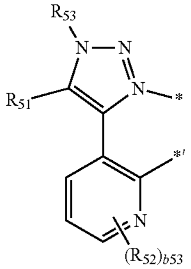
5-41
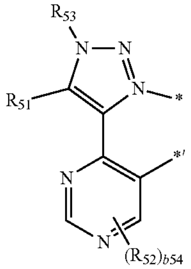
5-42
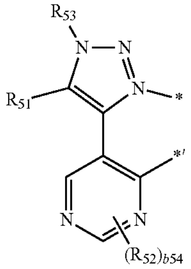
5-43
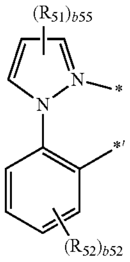
-continued
5-44
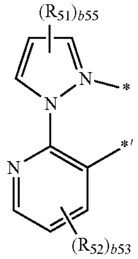
5-45
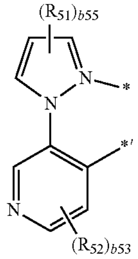
5-46
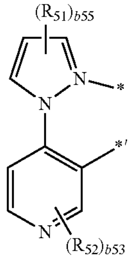
5-47
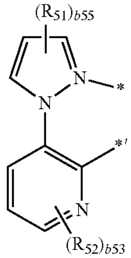
5-48
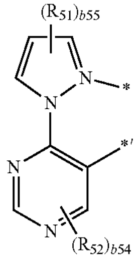
5-49
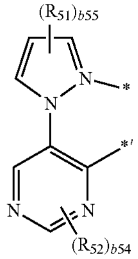

-continued
5-50
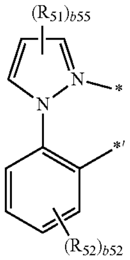
5-51
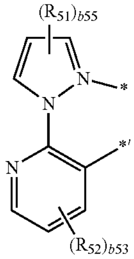
5-52
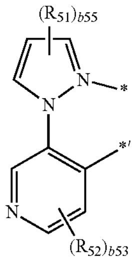
5-53
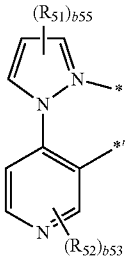
5-54
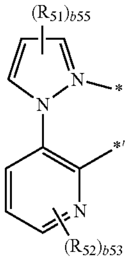
5-55
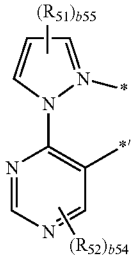
-continued
5-56
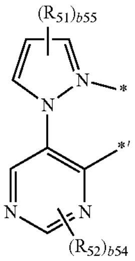
5-57
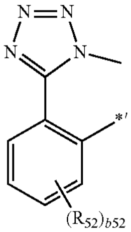
5-58
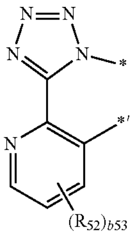
5-59
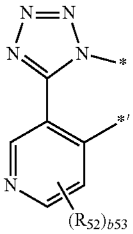
5-60
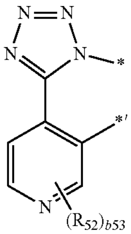
5-61
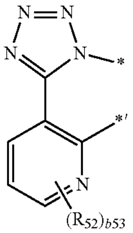

-continued
5-62
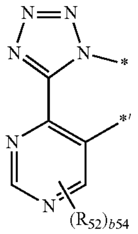
5-63
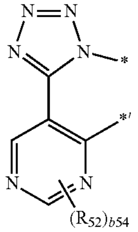
5-64
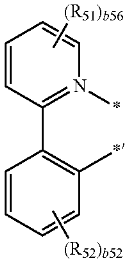
5-65
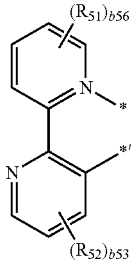
5-66
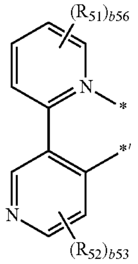
5-67
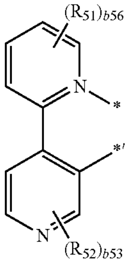
-continued
5-68
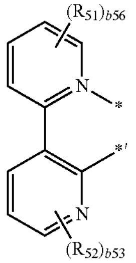
5-69
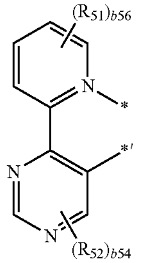
5-70
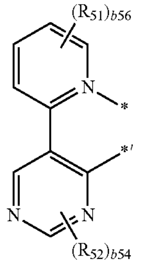
5-71
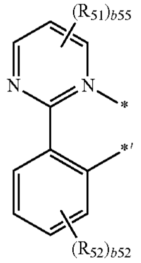
5-72
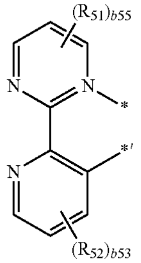
5-73
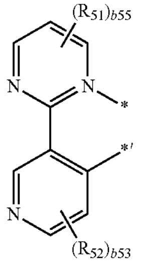

-continued
5-74
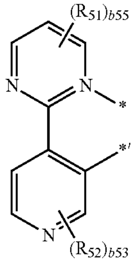
5-75
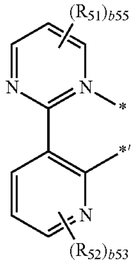
5-76
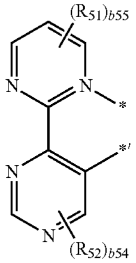
5-77
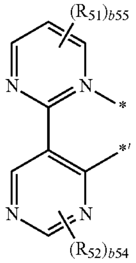
5-78
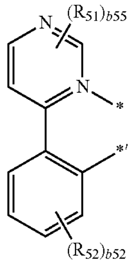
5-79
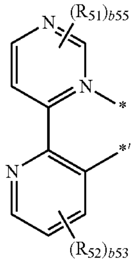
-continued
5-80
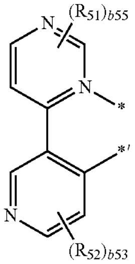
5-81
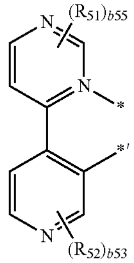
5-82
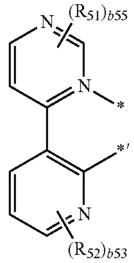
5-83
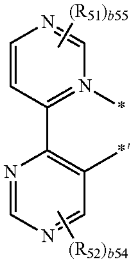
5-84
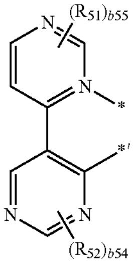
5-85
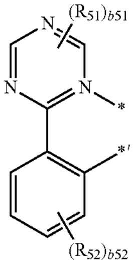

-continued
5-86
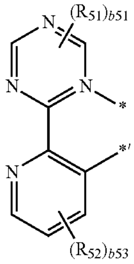
5-87
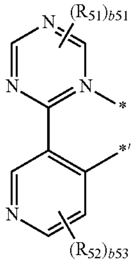
5-88
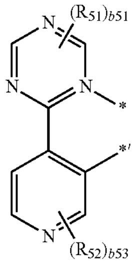
5-89
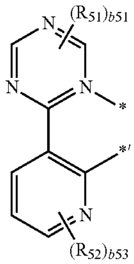
5-90
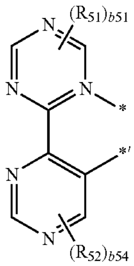
5-91
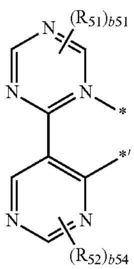
-continued
5-92
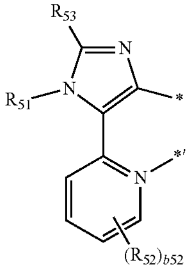
5-93
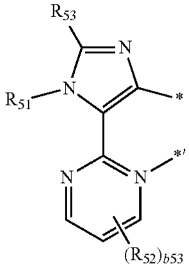
5-94
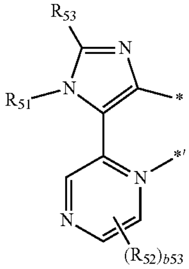
5-95
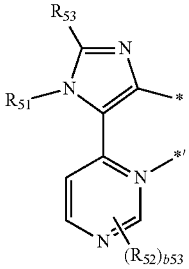
5-96
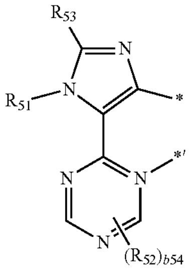

-continued
5-97
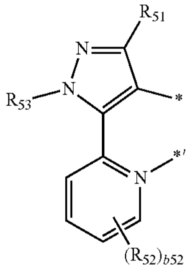
5-98
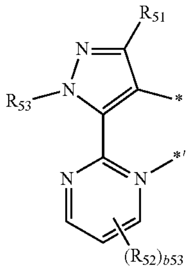
5-99
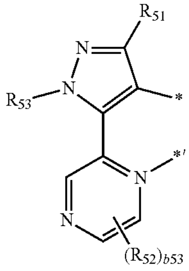
5-100
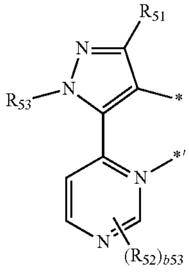
5-101
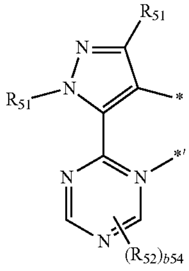
-continued
5-102
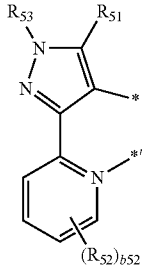
5-103
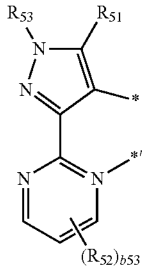
5-104
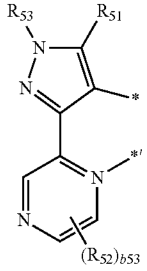
5-105
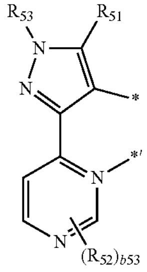
5-106
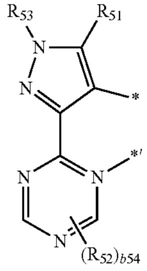

5-107

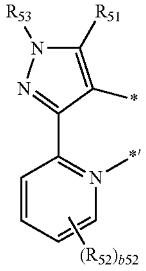

5-108

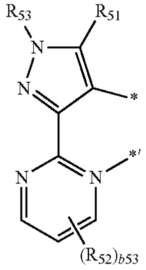

5-109

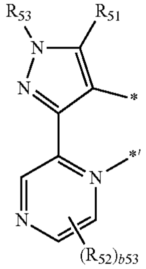

5-110

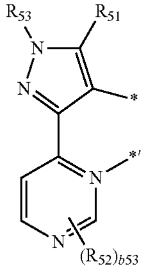

5-111

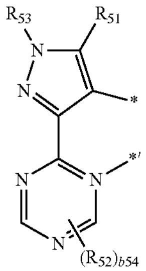

5-112

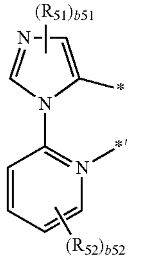

5-113

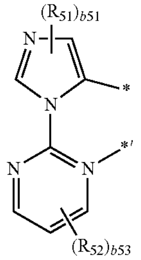

5-114

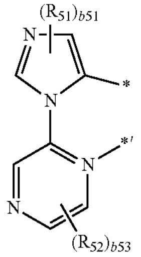

5-115

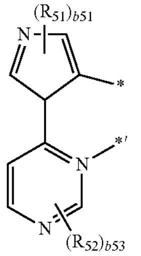

5-116

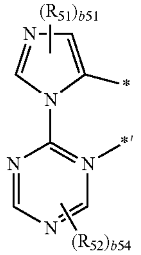

wherein, in Formulae 5-1 to 5-116 and 8-1 to 8-23, $R_{51}$ to $R_{53}$ may each independently be: hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, a bicyclo[2.2.1]heptanyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$alkylphenyl group, a naphthyl group, a pyridinyl group, a pyrimidinyl group, or any combination thereof;

a cyclopentyl group, a cyclohexyl group, a cycloheptyl group, a cyclooctyl group, a bicyclo[2.2.1]heptanyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, or an imidazopyrimidinyl group;

a cyclopentyl group, a cyclohexyl group, a cycloheptyl group, a cyclooctyl group, a bicyclo[2.2.1]heptanyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$alkylphenyl group, a naphthyl group. a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, or an imidazopyrimidinyl group, each substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, a bicyclo[2.2.1]heptanyl group, an adamantanyl group, a norbornanyl group, a norbornenyl group, a cyclopentenyl group, a cyclohexenyl group, a cycloheptenyl group, a phenyl group, a biphenyl group, a $C_1$-$C_{20}$ alkylphenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, $—Si(Q_{11})(Q_{12})(Q_{13})$, $—B(Q_{11})(Q_{12})$, $—N(Q_{11})(Q_{12})$, or any combination thereof; or $—Si(Q_1)(Q_2)(Q_3)$, $—B(Q_1)(Q_2)$, or $—N(Q_1)(Q_2)$, and $Q_1$ to $Q_3$ and $Q_{11}$ to $Q_{13}$ may each independently be:

a methyl group, an ethyl group, an n-propyl group, an isopropyl group, an n-butyl group, an isobutyl group, a sec-butyl group, a tert-butyl group, an n-pentyl group, an isopentyl group, a 2-methylbutyl group, a sec-pentyl group, a tert-pentyl group, a neo-pentyl group, a 3-pentyl group, a 3-methyl-2-butyl group, a phenyl group, a biphenyl group, a $C_1$-$C_{20}$ alkylphenyl group, or a naphthyl group; or a methyl group, an ethyl group, an n-propyl group, an isopropyl group, an n-butyl group, an isobutyl group, a sec-butyl group, a tert-butyl group, an n-pentyl group, an isopentyl group, a 2-methylbutyl group, a sec-pentyl group, a tert-pentyl group, a neo-pentyl group, a 3-pentyl group, a 3-methyl-2-butyl group, a phenyl group, or a naphthyl group, each substituted with deuterium, a phenyl group, or any combination thereof;

b51 and b54 may each independently be 1 or 2;

b53 and b55 may each independently be 1, 2, or 3;

b52 may be 1, 2, 3, or 4;

Ph is a phenyl group;

Ph-d5 is a phenyl group in which each hydrogen is substituted with deuterium; and

* and *' each indicate a binding site to a neighboring atom.

In Formula 1, n11 may bet and n12 may be 0, 1, or 2.

In detail, in Formula 1, $M_1$ may be Pt, n11 may be 1, and n12 may be 0, but embodiments of the present disclosure are not limited thereto.

In one or more embodiments, the organometallic compound may be one of Compounds 1 to 608:

-continued
1
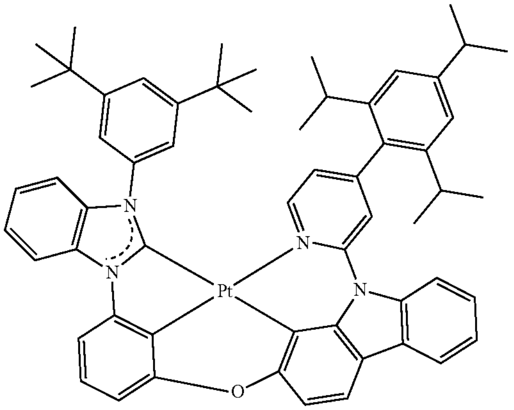
4
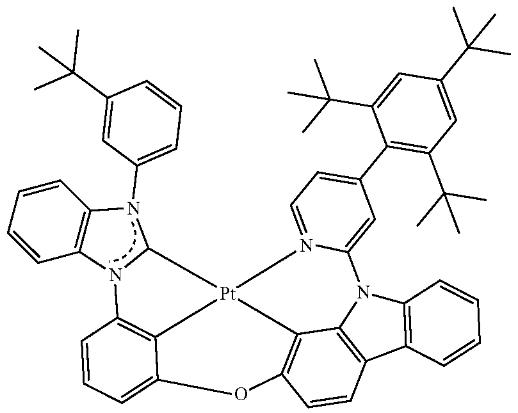
2
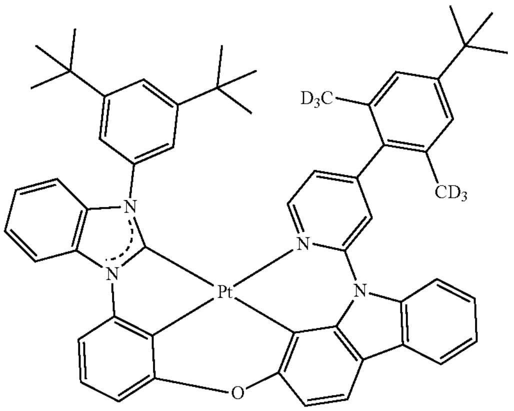
5
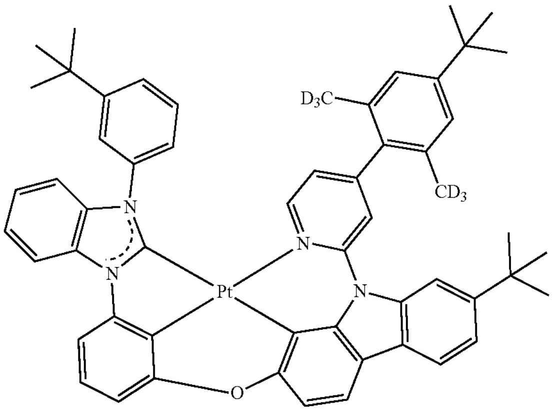
3
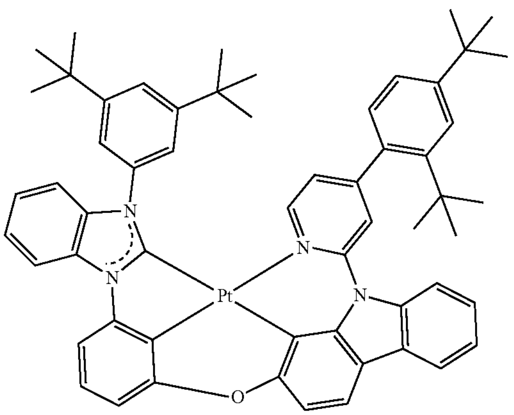
6
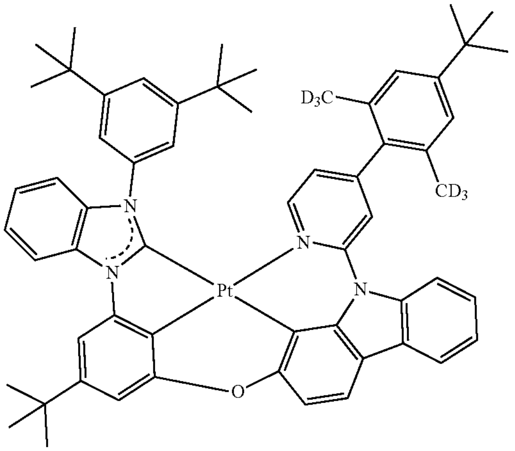

-continued
7
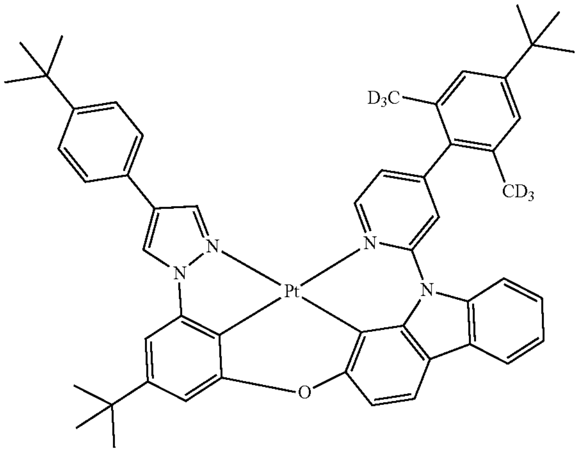
8
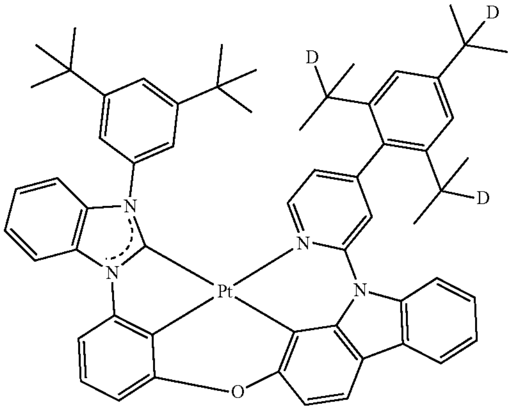
9
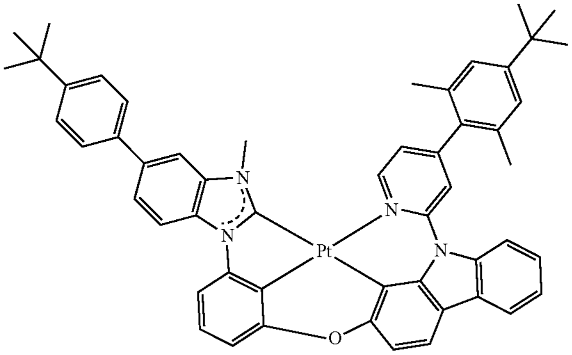
-continued
10
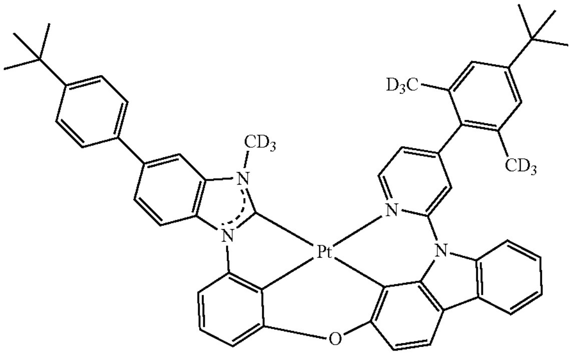
11
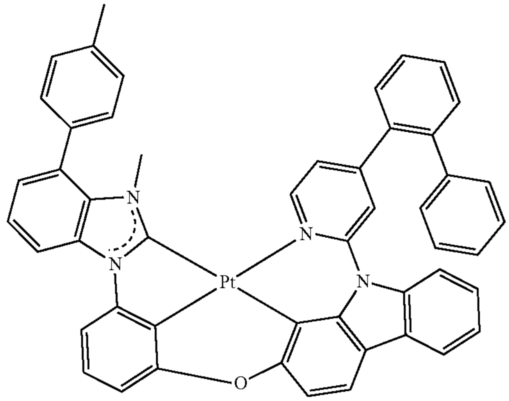
12
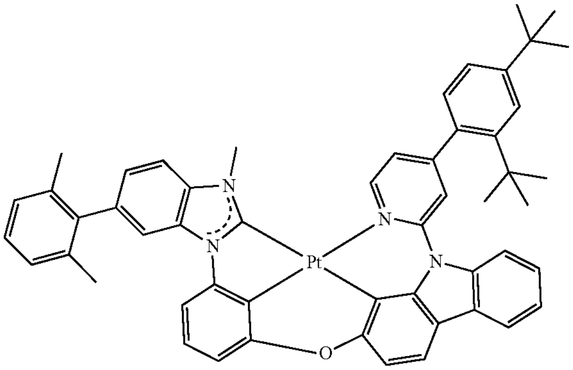
13
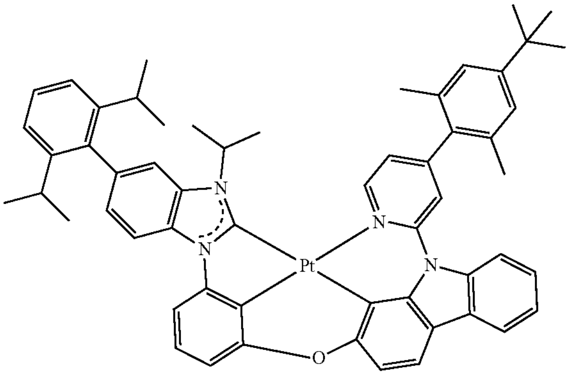

-continued
14
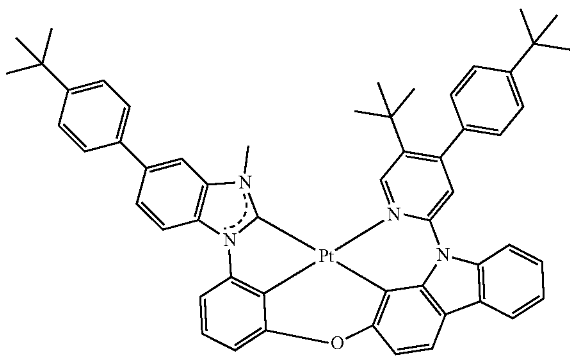
15
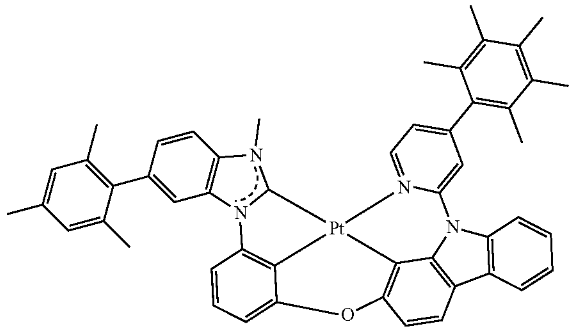
16
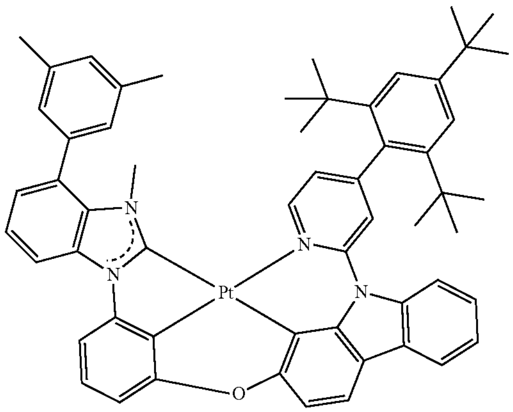
17
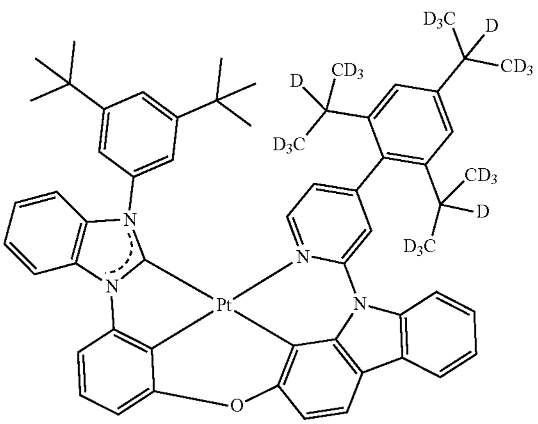
-continued
18
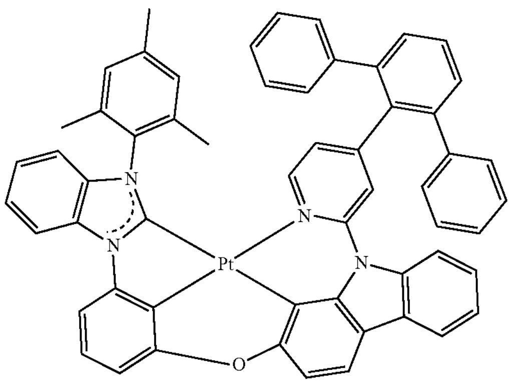
19
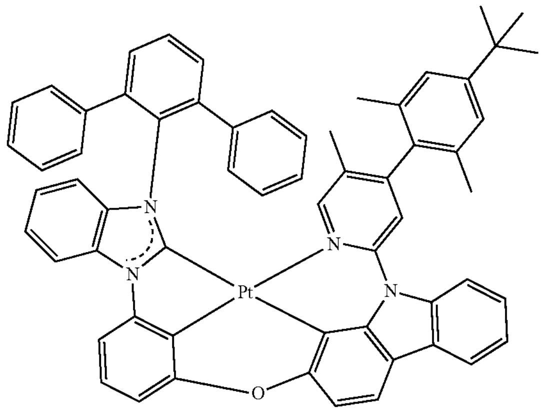
20
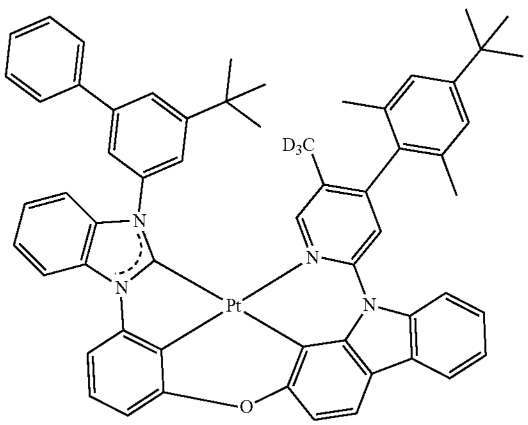

-continued
21
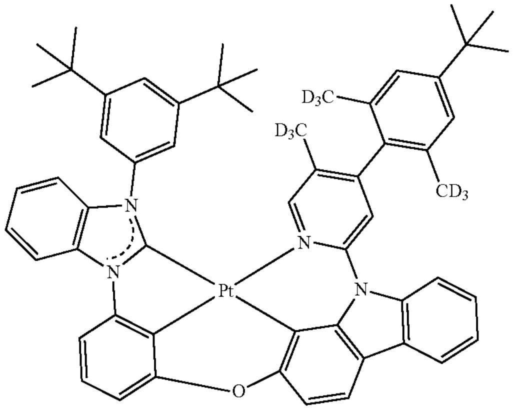
22
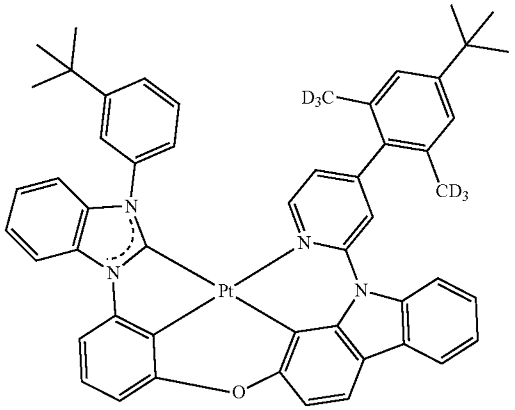
23
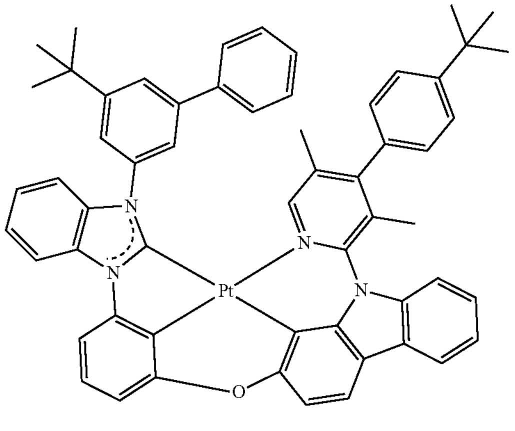
-continued
24
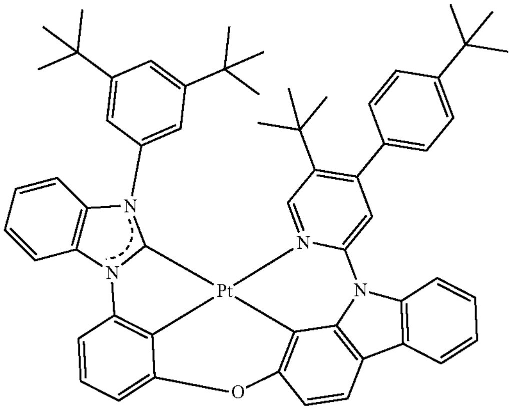
25
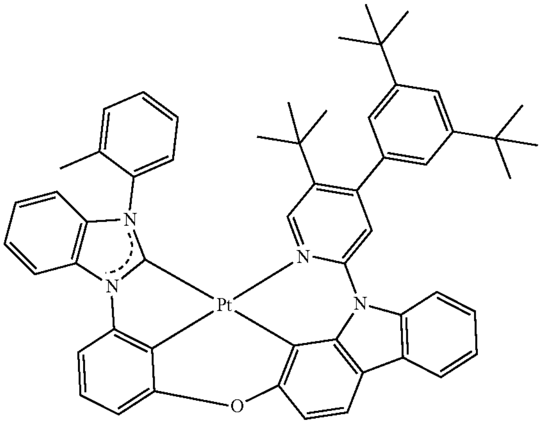
26
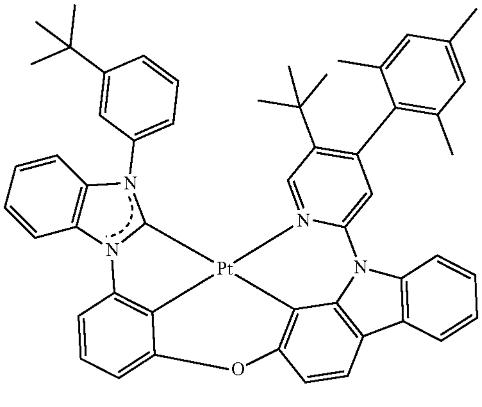

27
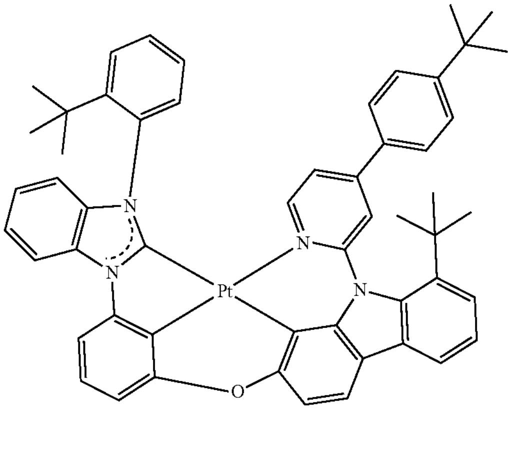
28
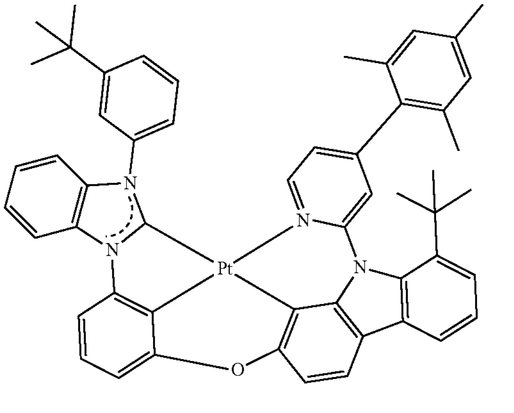
29
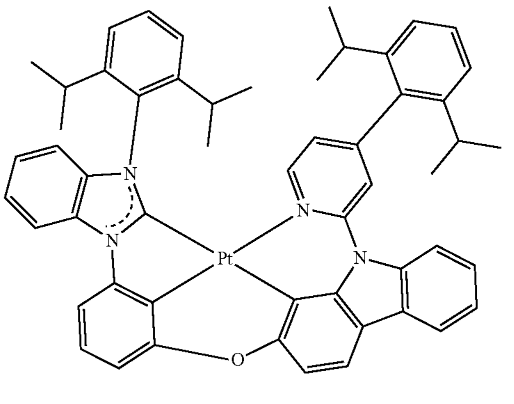
30
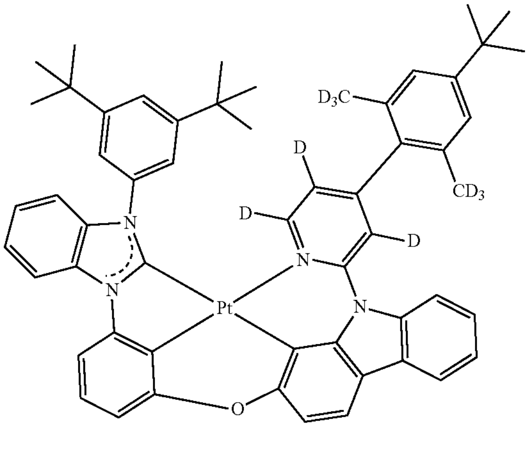
31
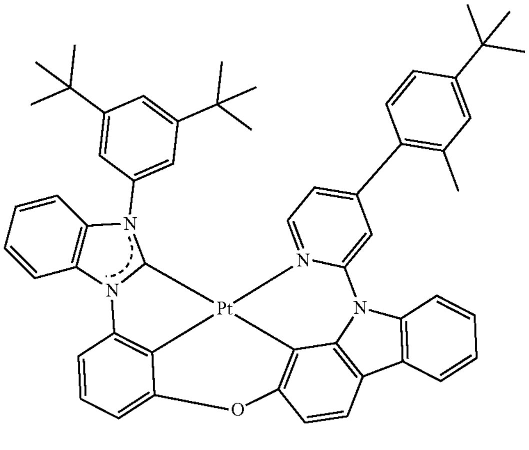
32
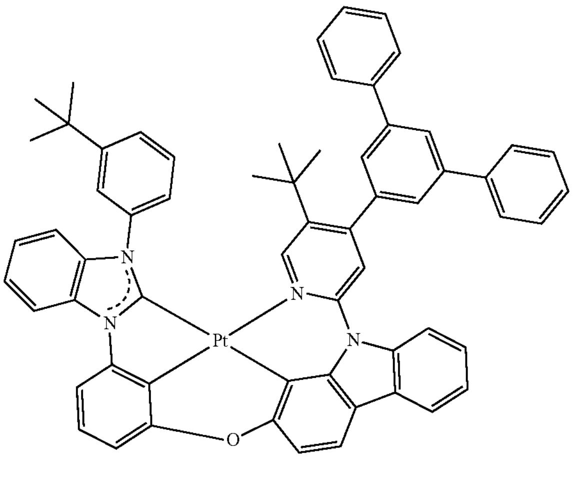

-continued
33
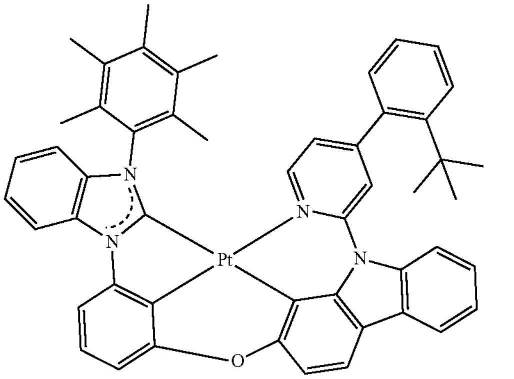
34
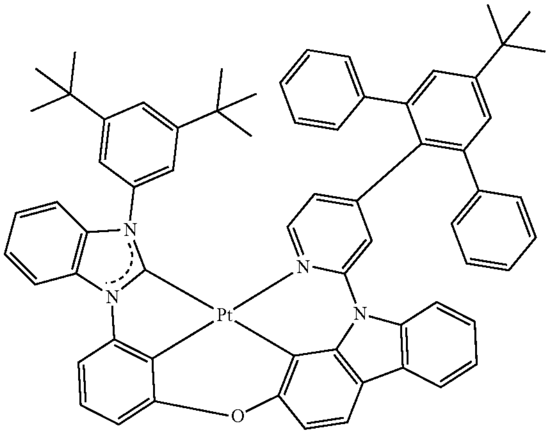
35
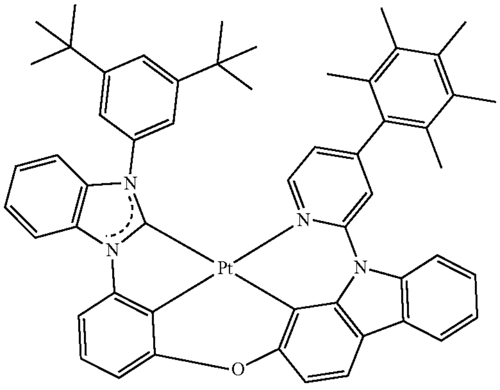
-continued
36
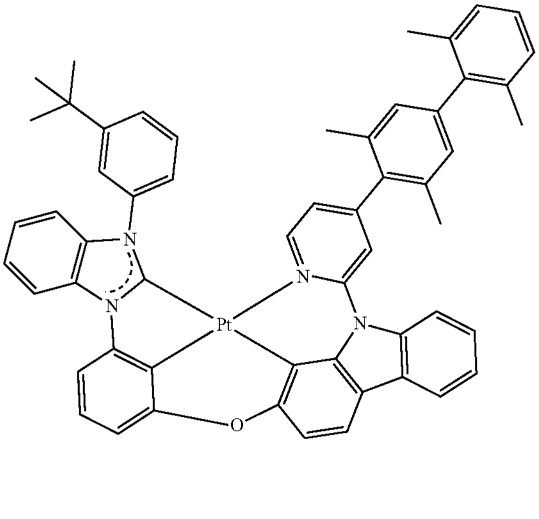
37
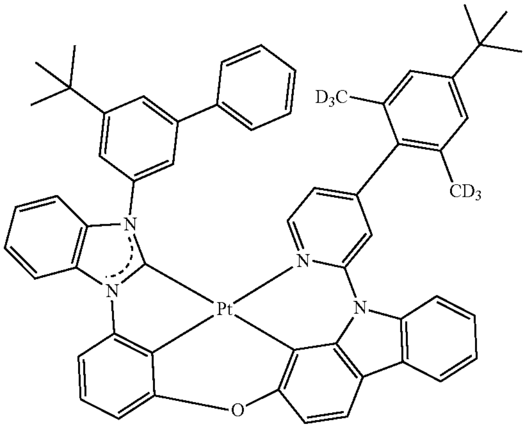
38
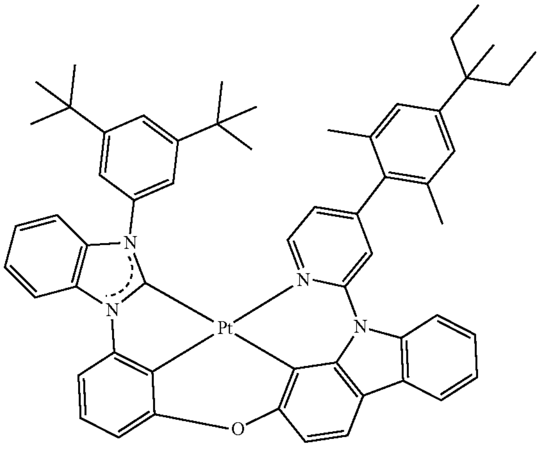

-continued
39
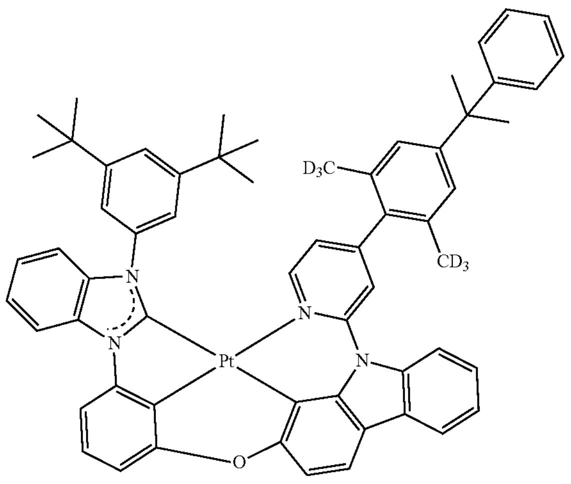
40
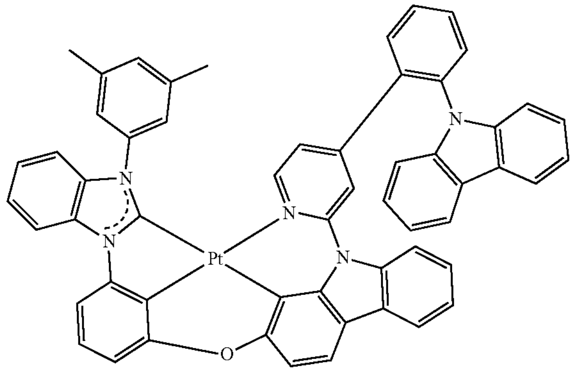
41
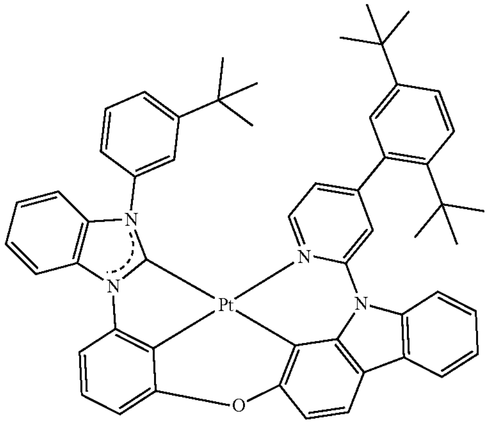
-continued
42
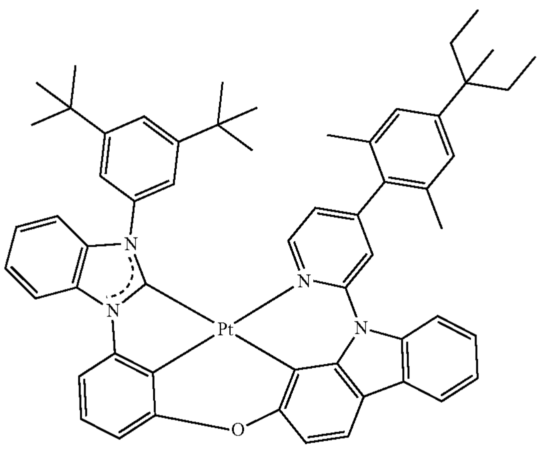
43
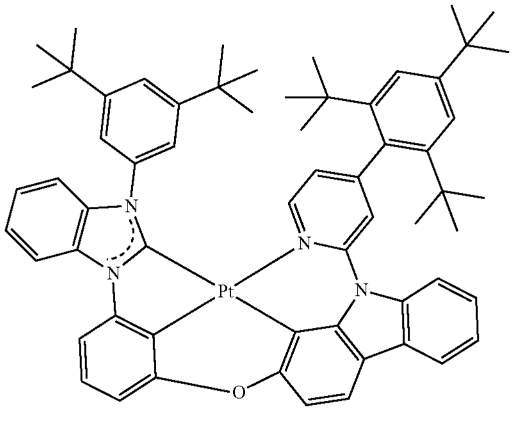
44
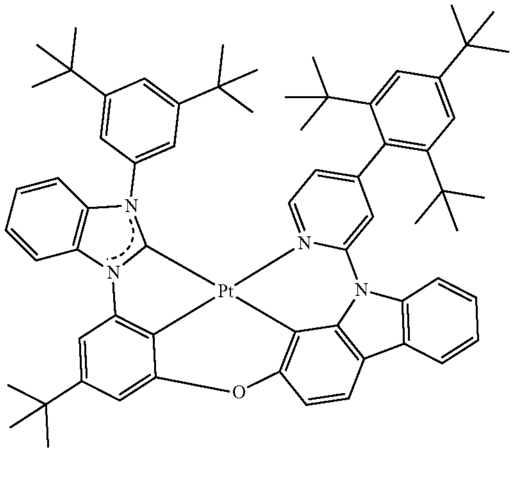

-continued
45
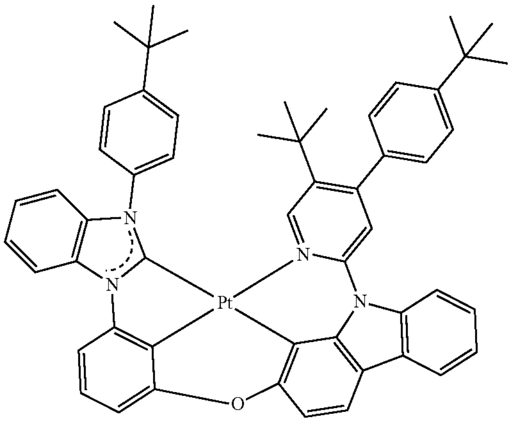
46
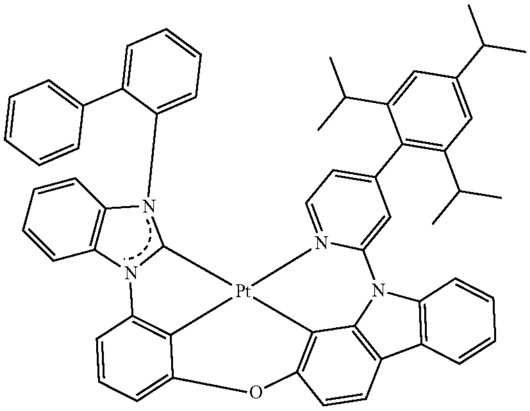
47
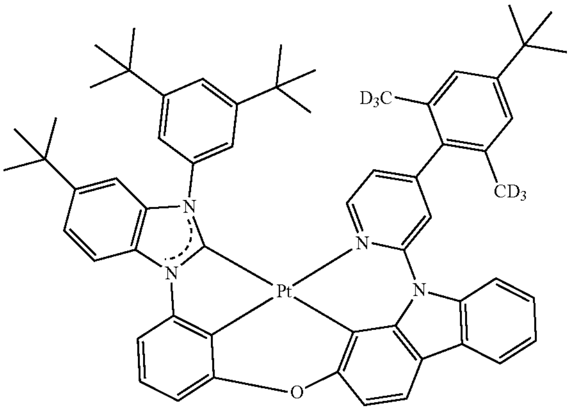
-continued
48
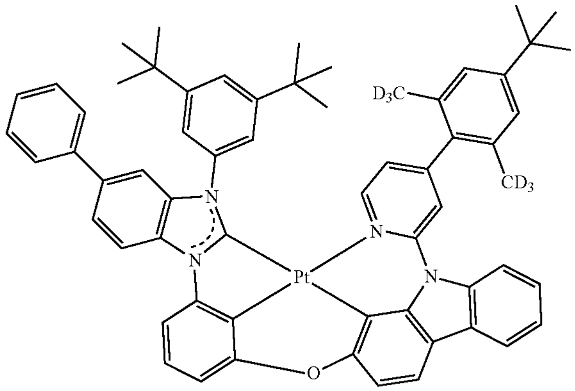
49
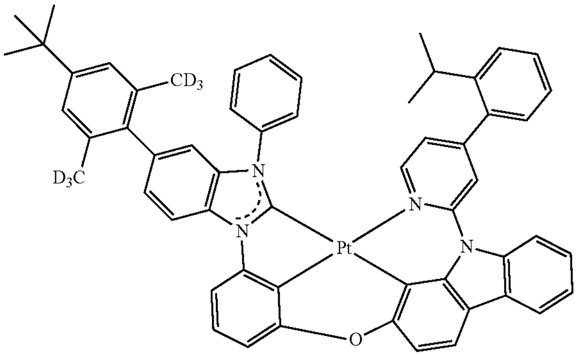
50
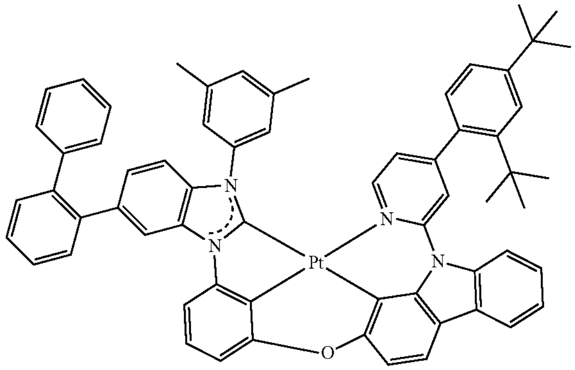
51
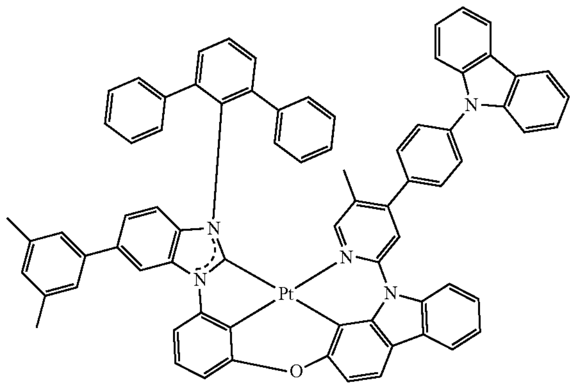

-continued
52
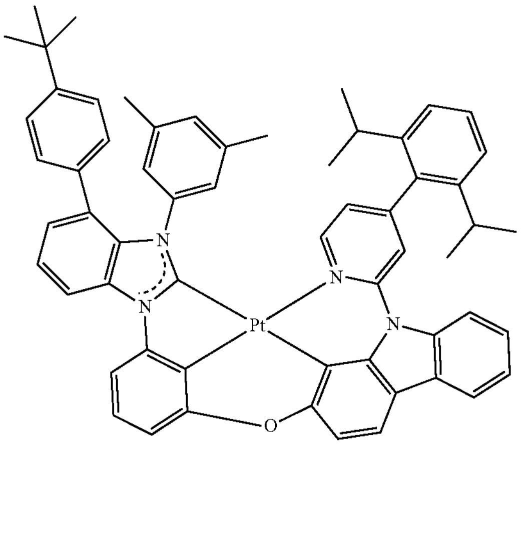
53
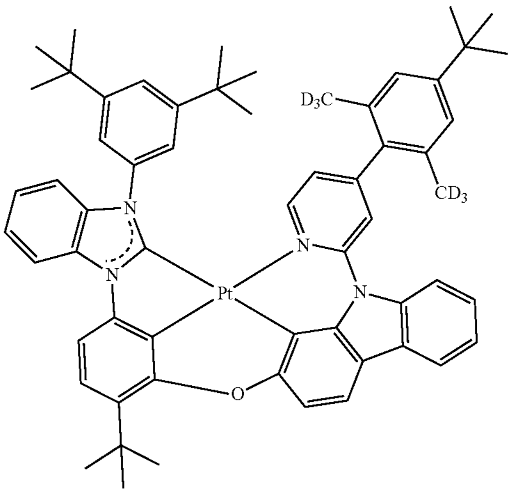
54
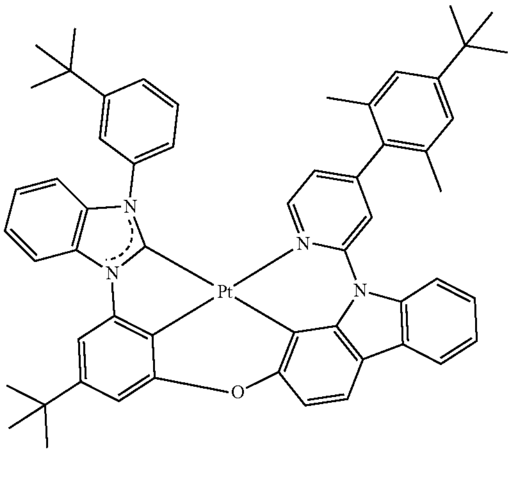
-continued
55
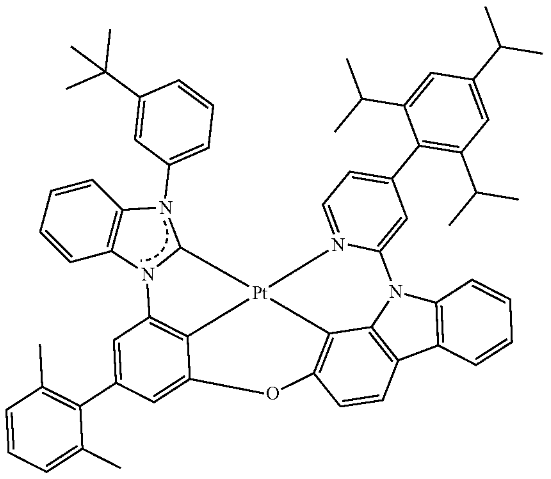
56
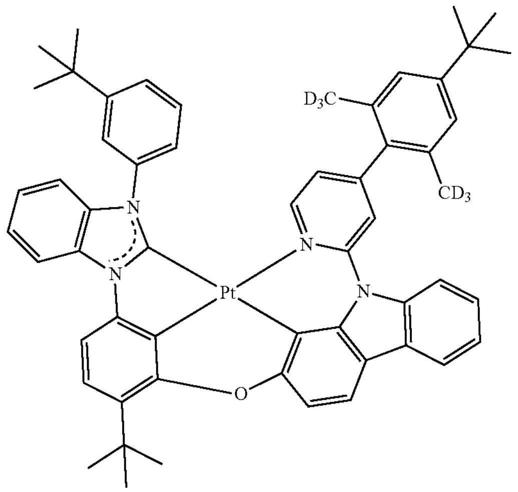
57
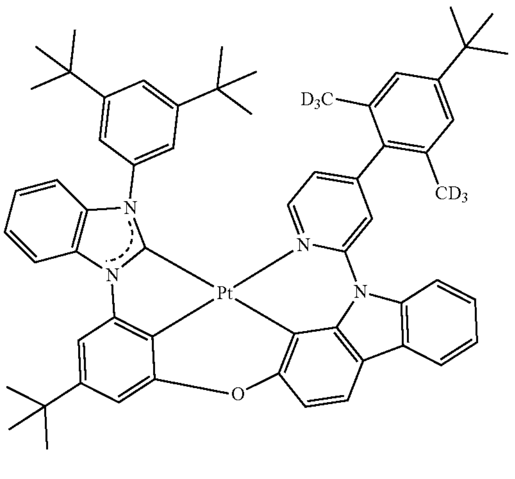

-continued
58
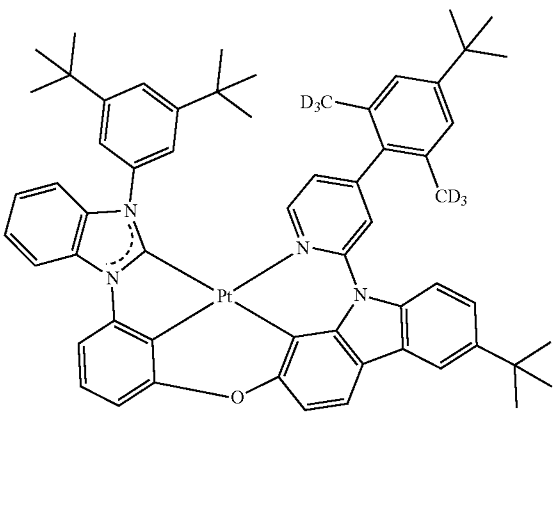
59
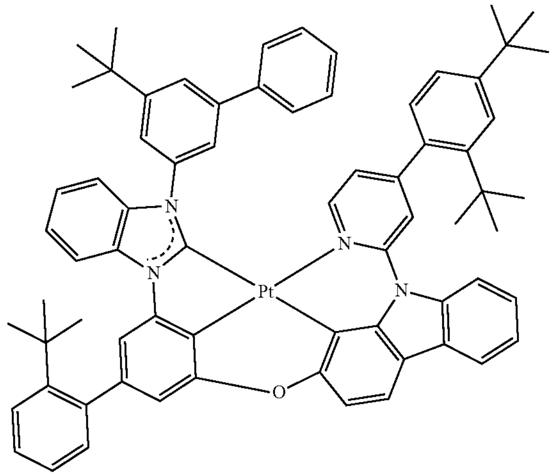
60
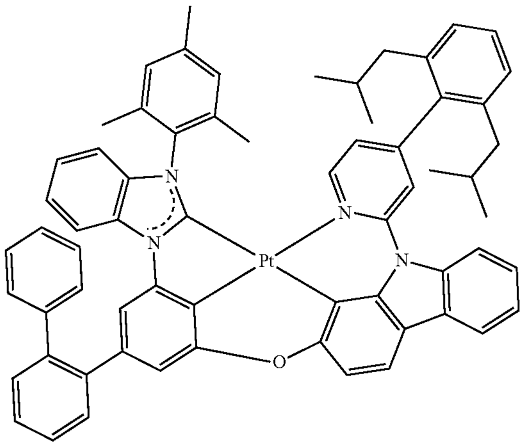
-continued
61
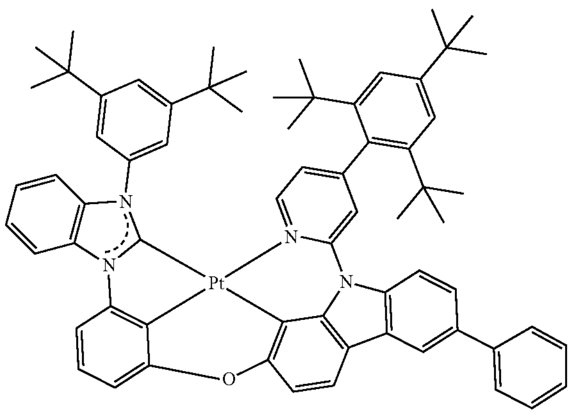
62
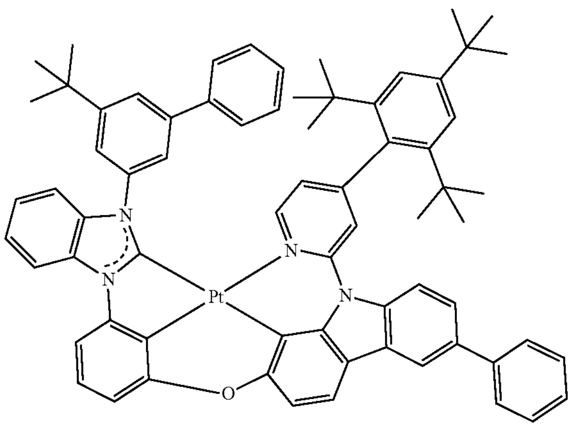
63
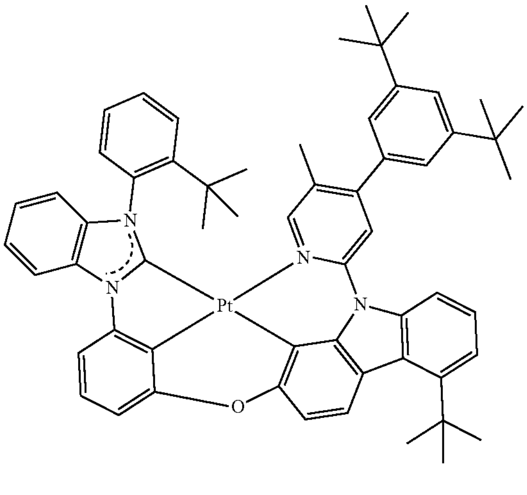

-continued
64
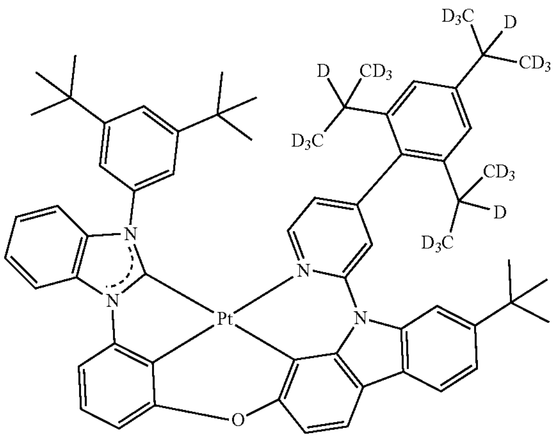
65
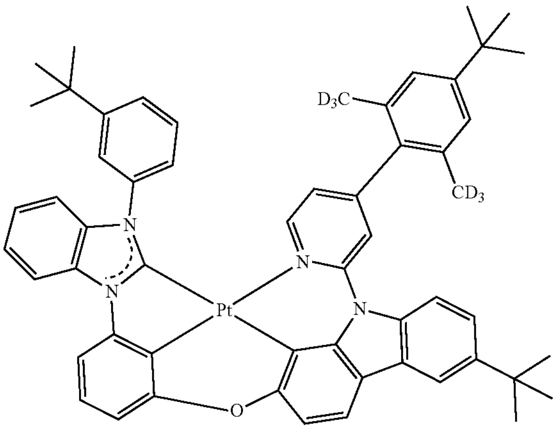
66
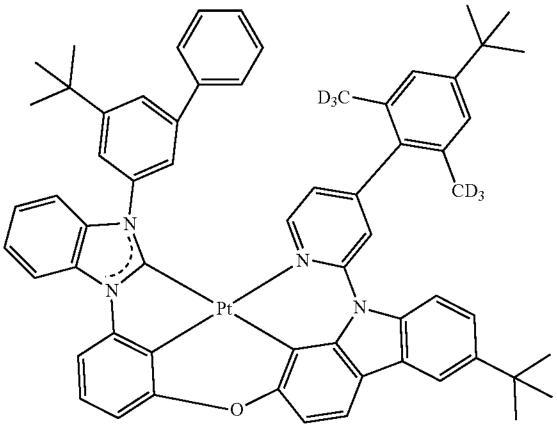
-continued
67
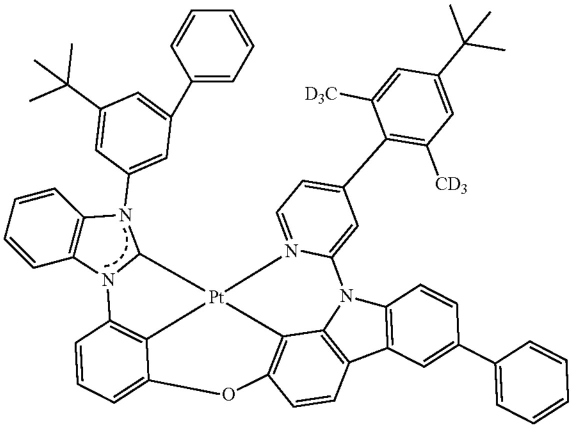
68
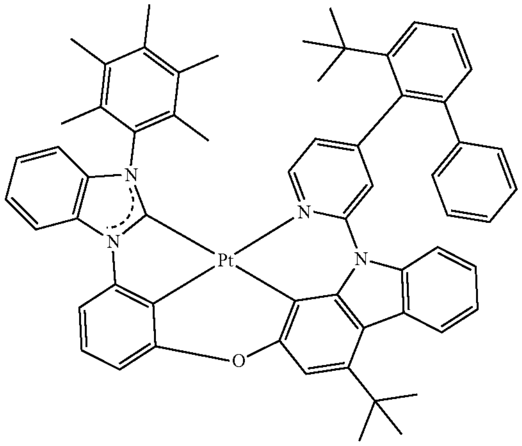
69
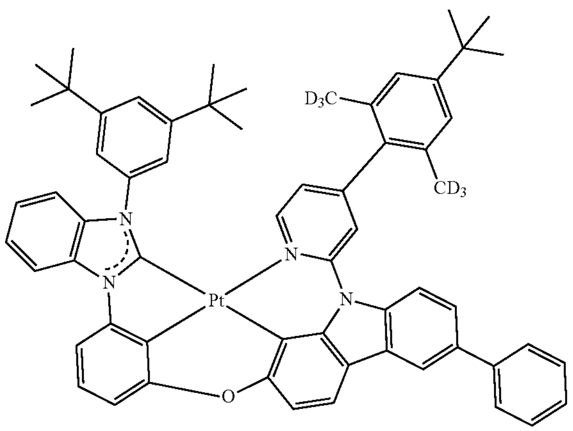

-continued
70
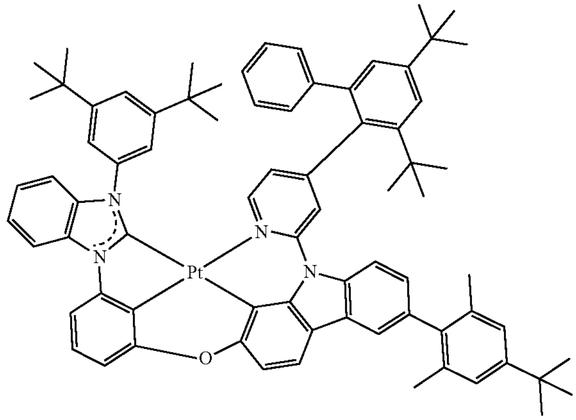
71
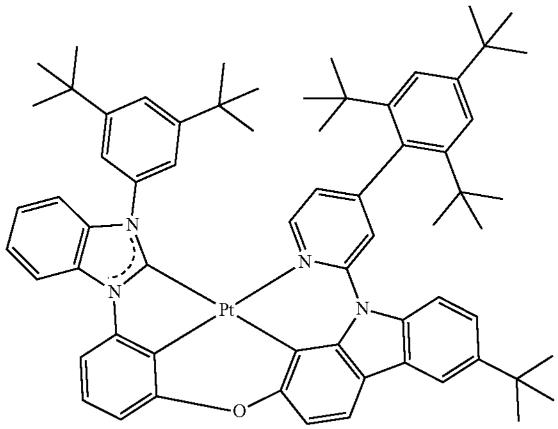
72
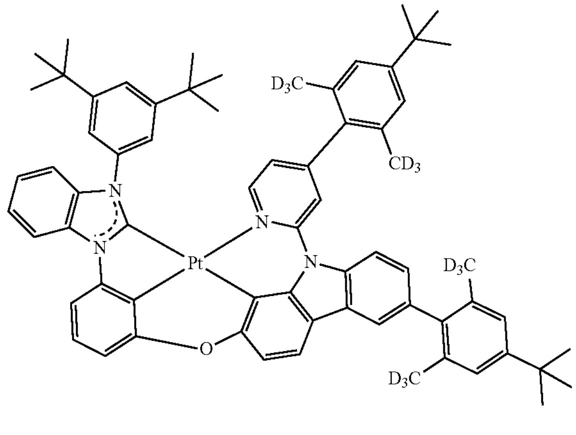
-continued
73
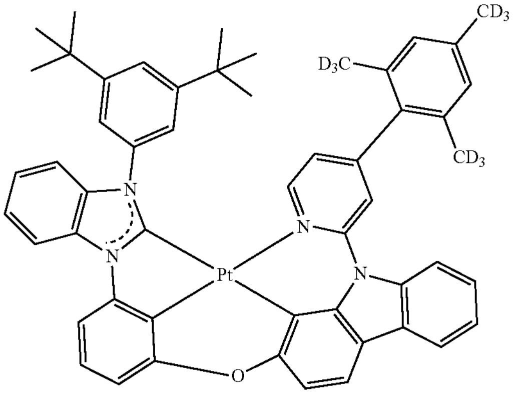
74
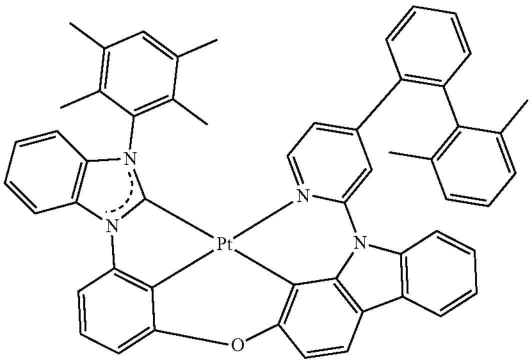
75
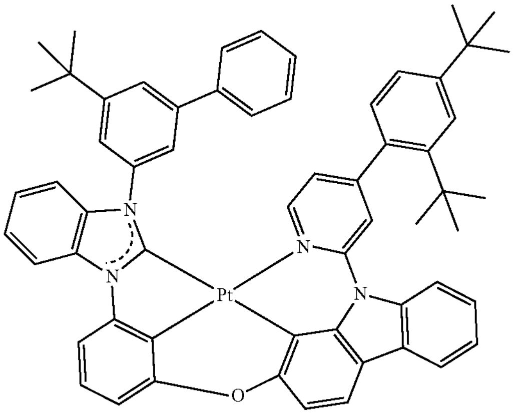

-continued
76
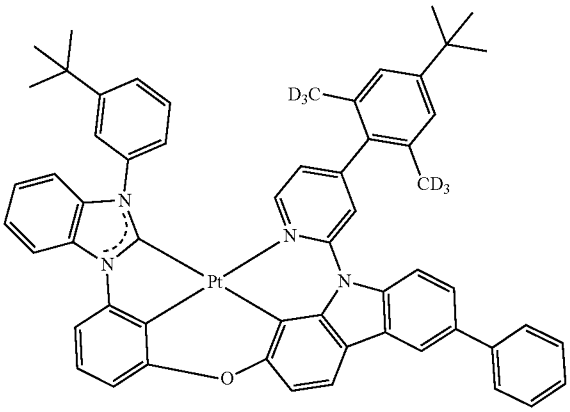
77
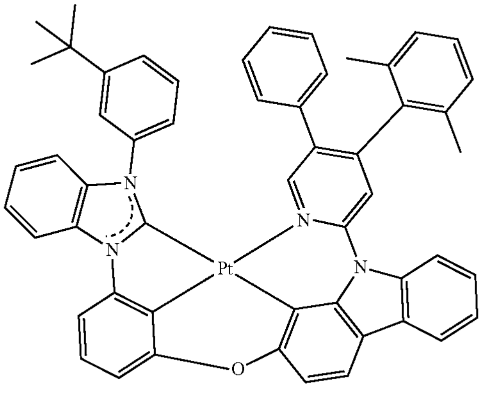
78
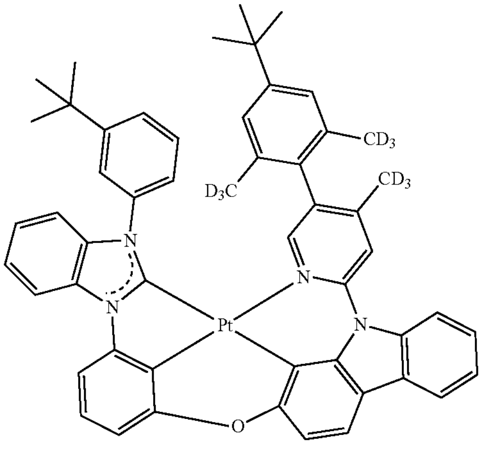
-continued
79
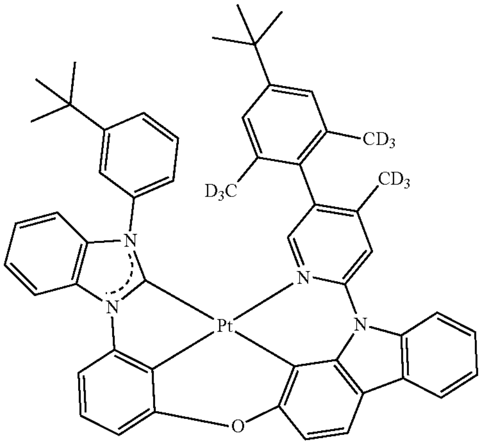
80
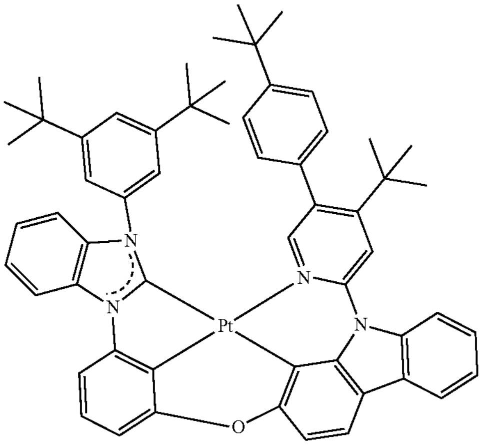
81
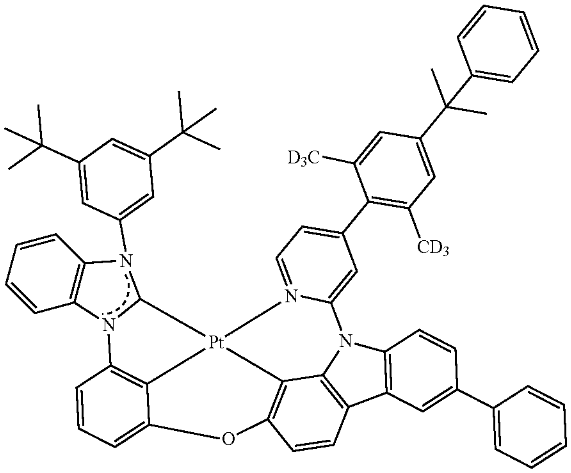

-continued
82
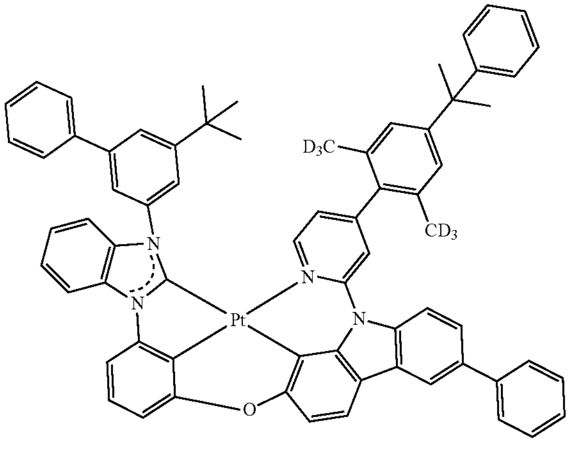
83
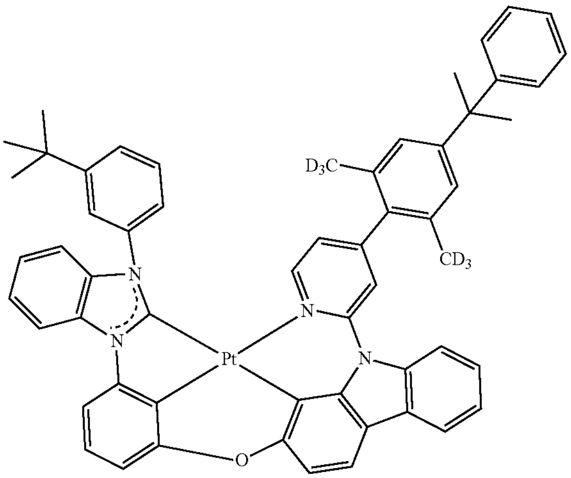
84
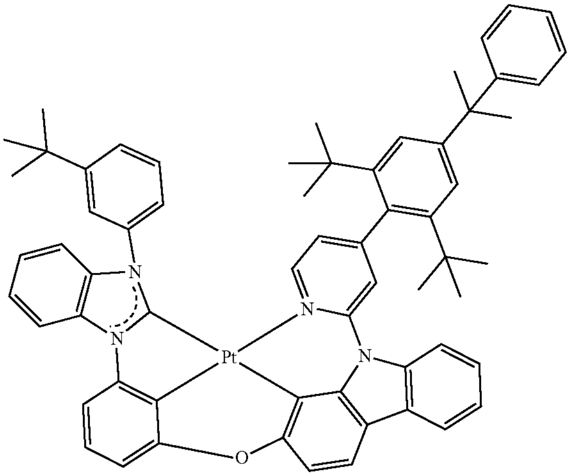
-continued
85
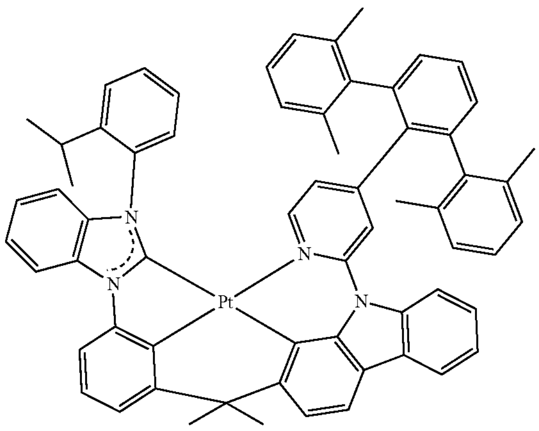
86
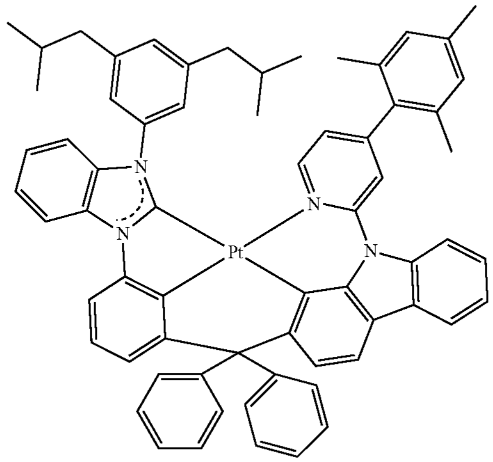
87
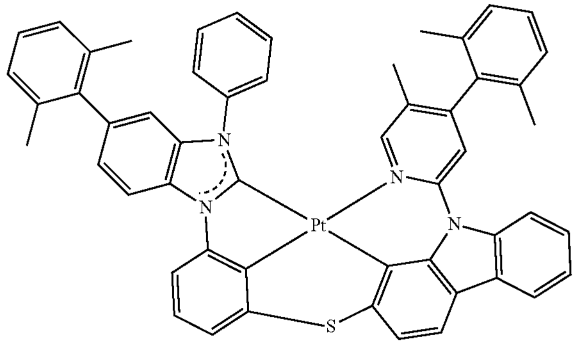

-continued
88
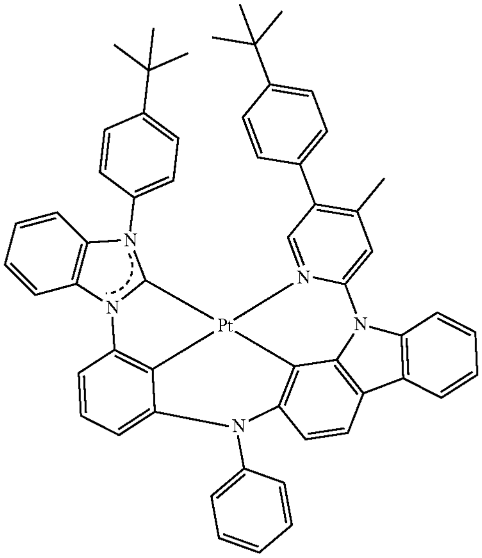
89
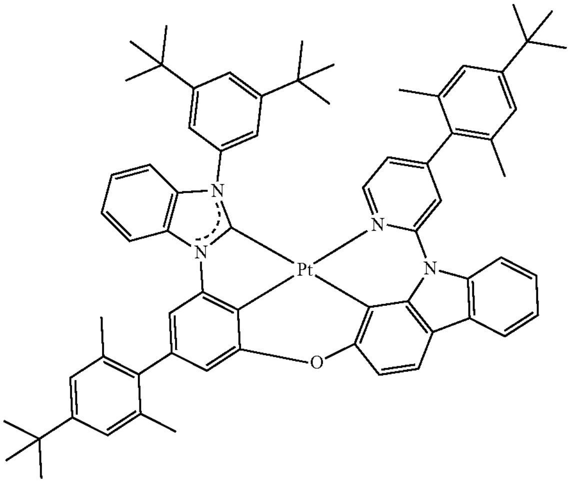
90
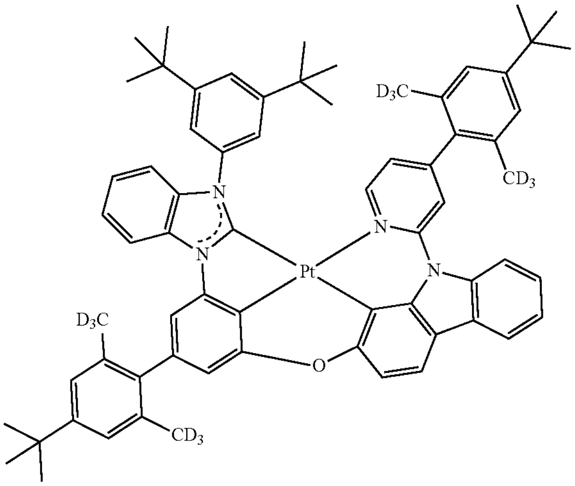
-continued
91
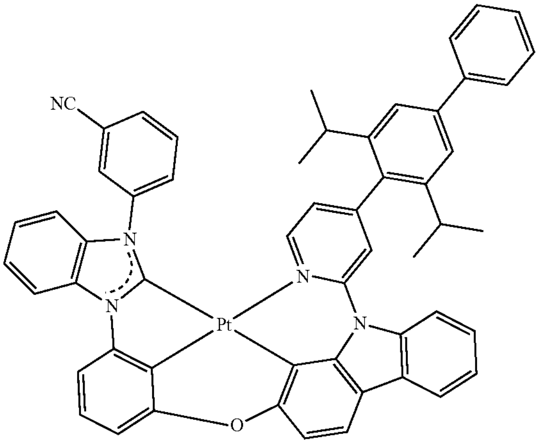
92
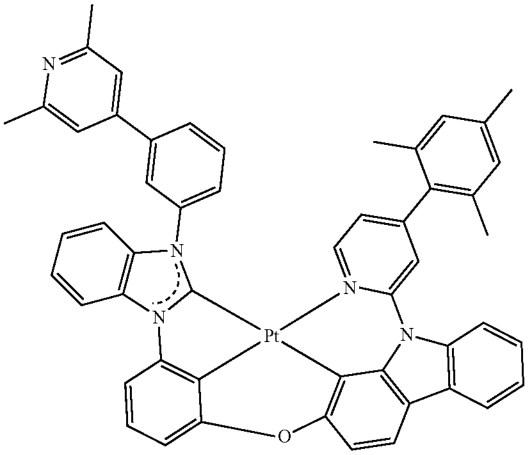
93
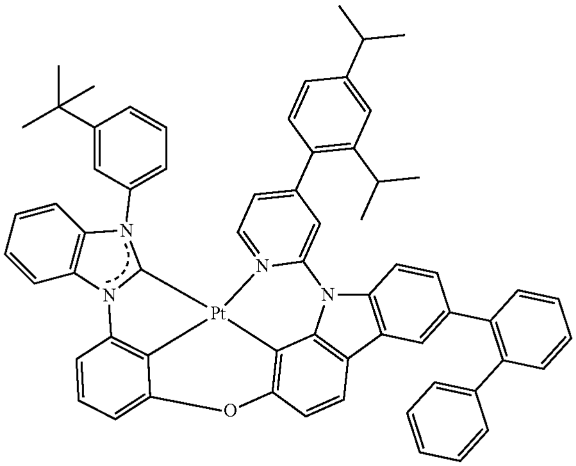

-continued
94
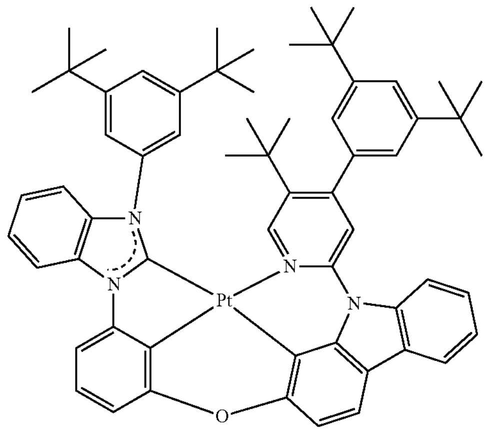
95
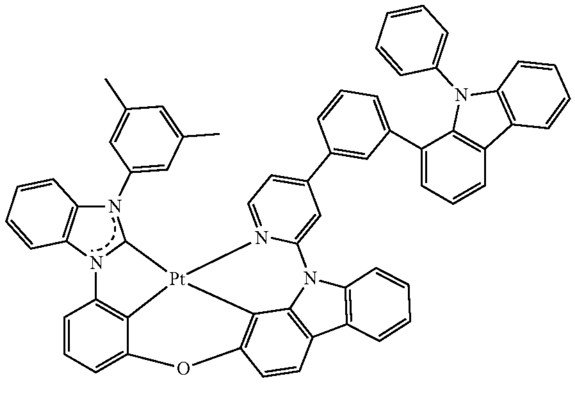
96
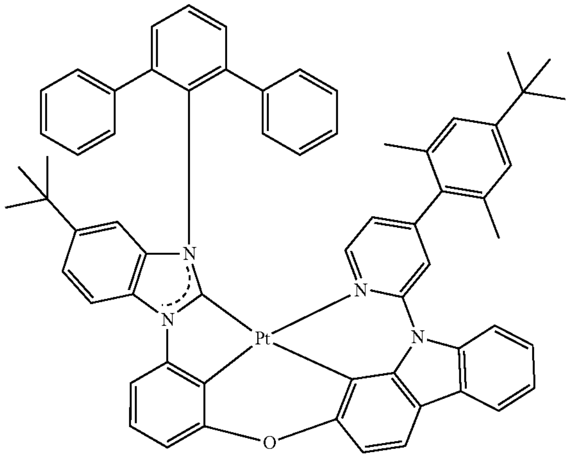
-continued
97
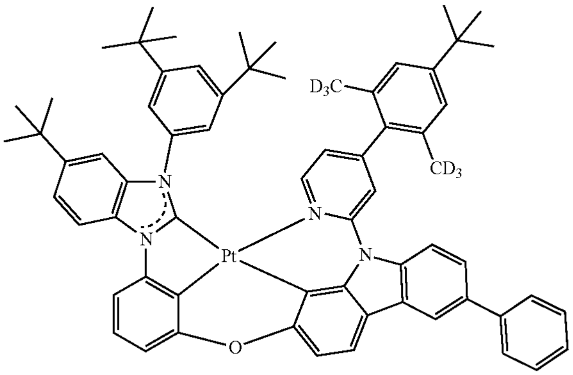
98
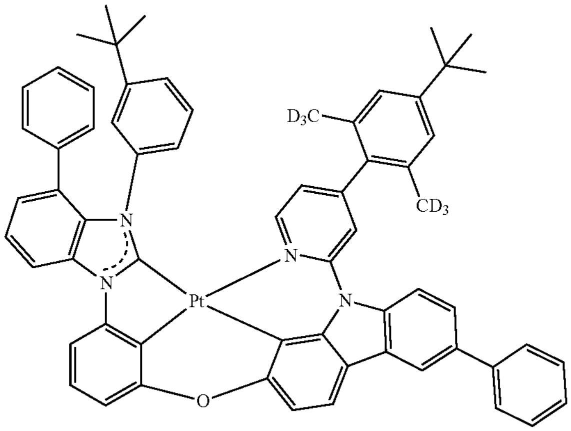
99
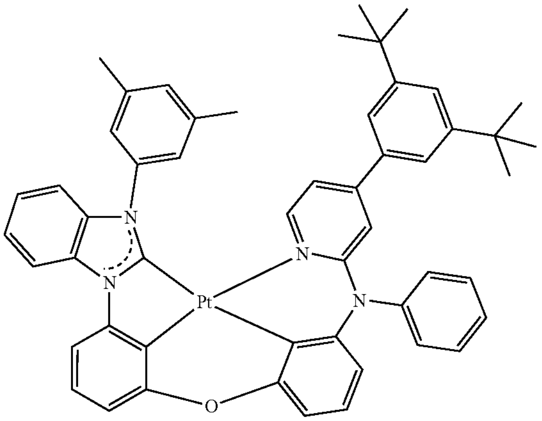

-continued
100
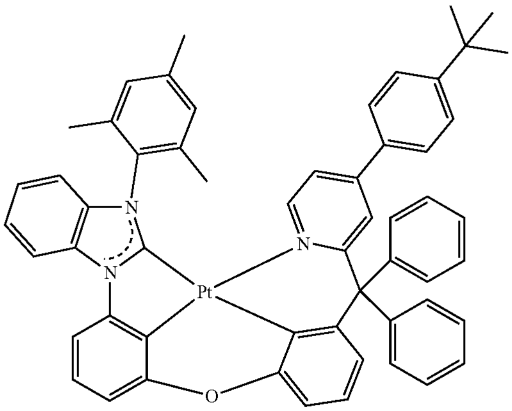
101
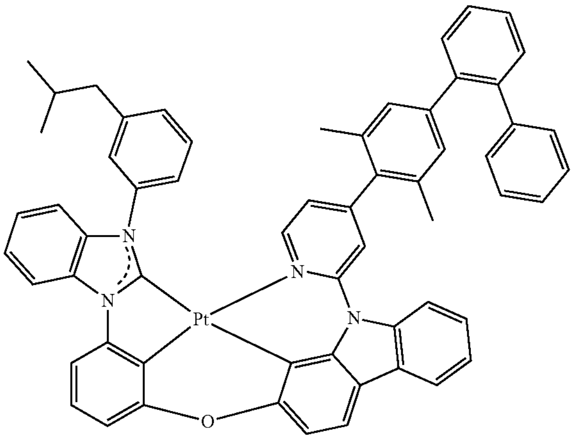
102
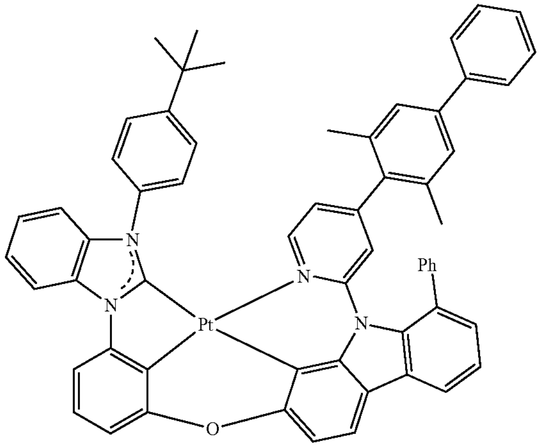
-continued
103
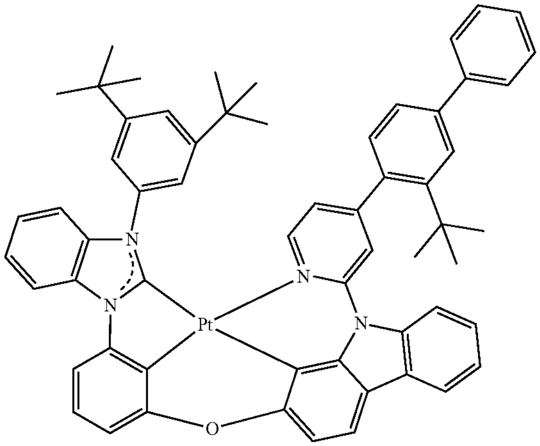
104
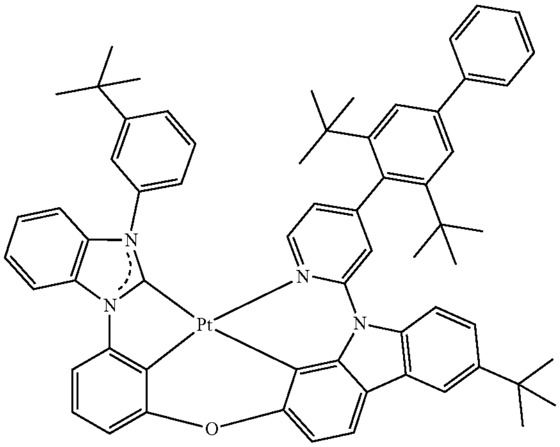
105
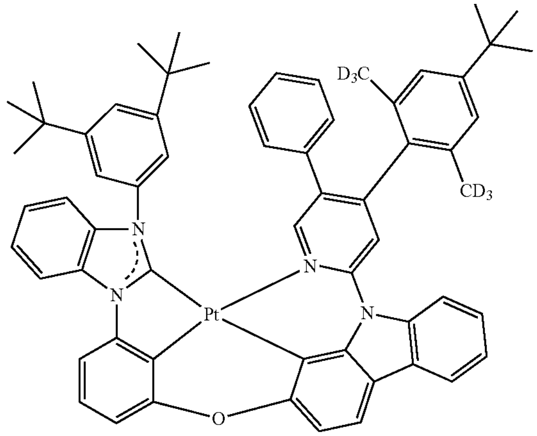

-continued
106
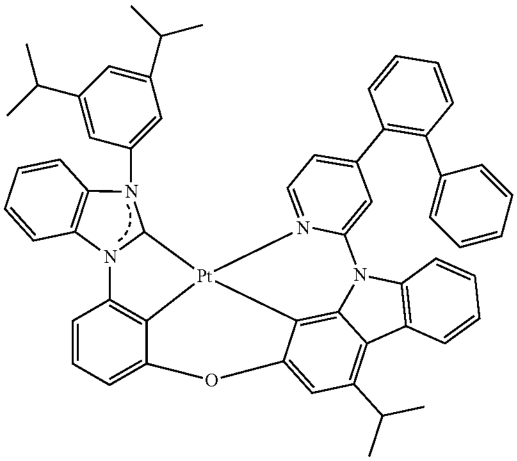
107
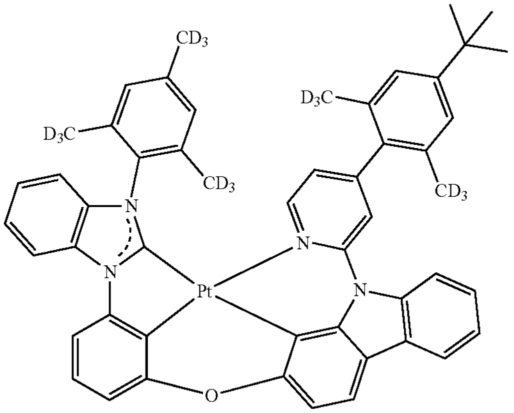
108
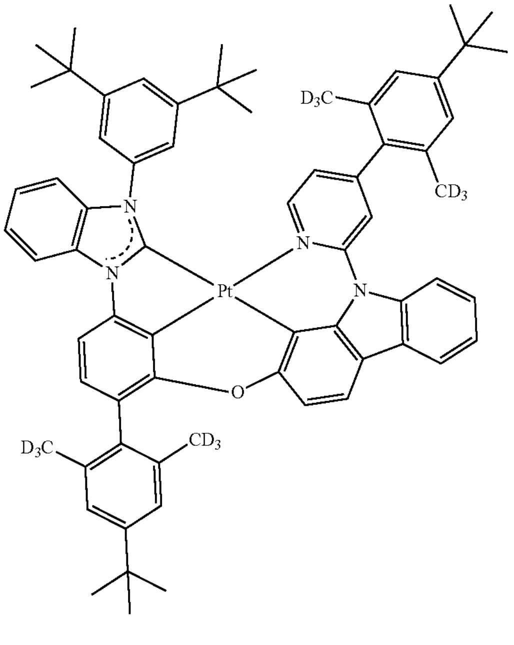
-continued
109
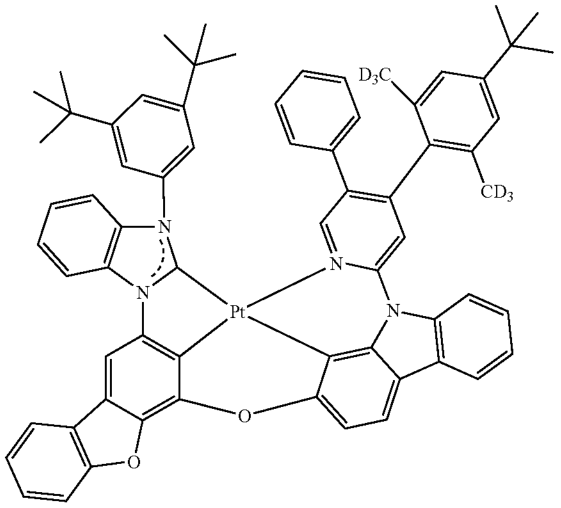
110
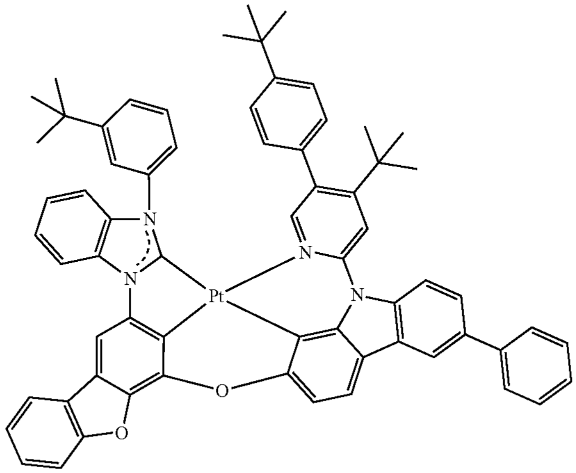
111
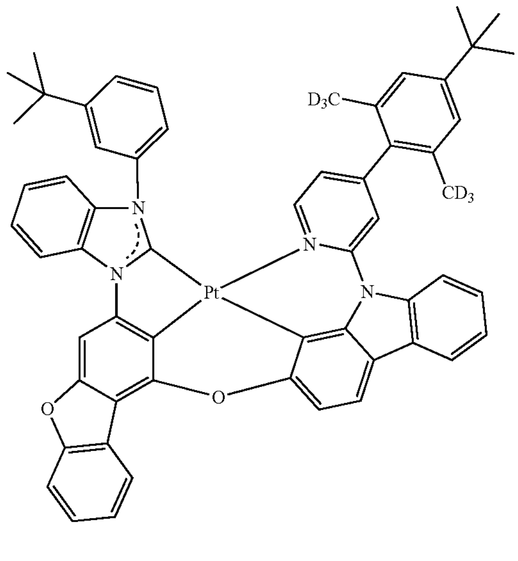

-continued
112
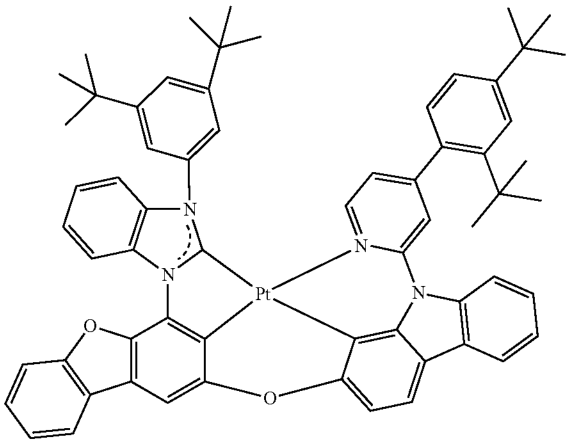
113
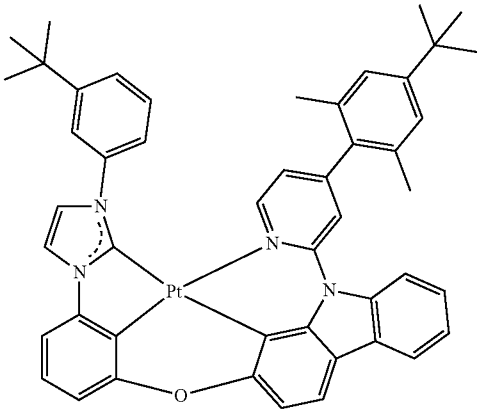
114
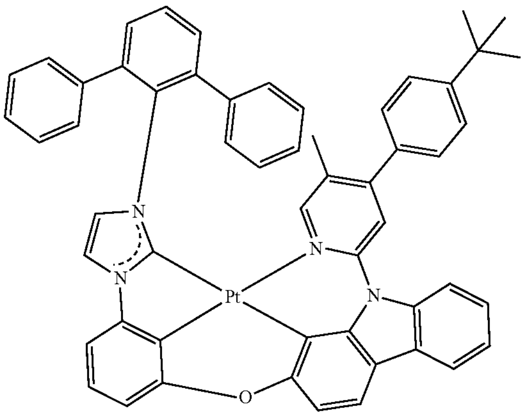
-continued
115
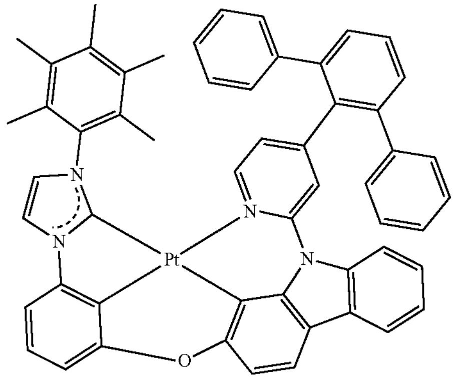
116
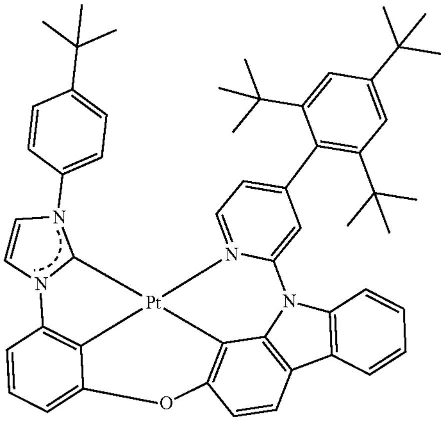
117
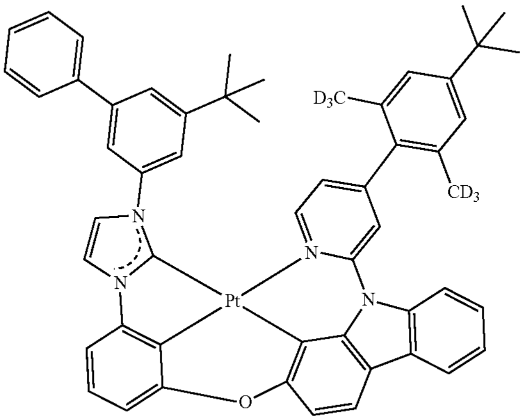

-continued
118
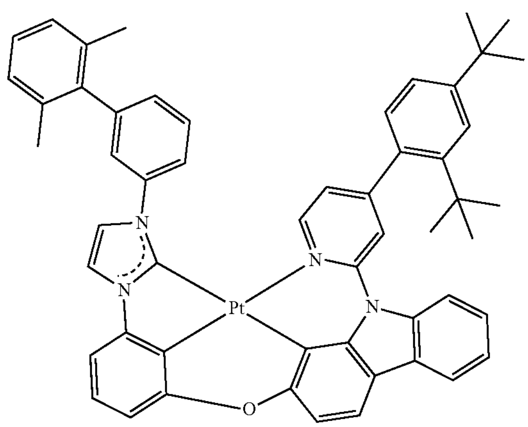
119
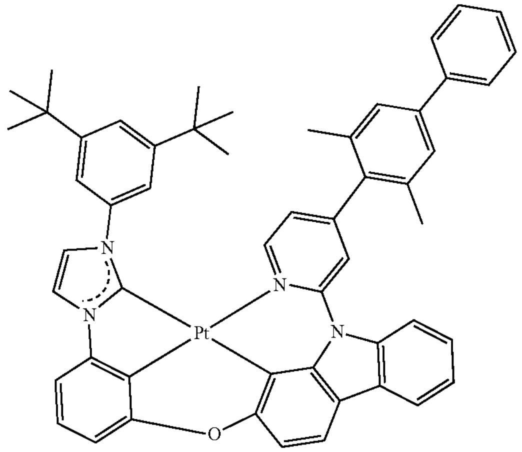
120
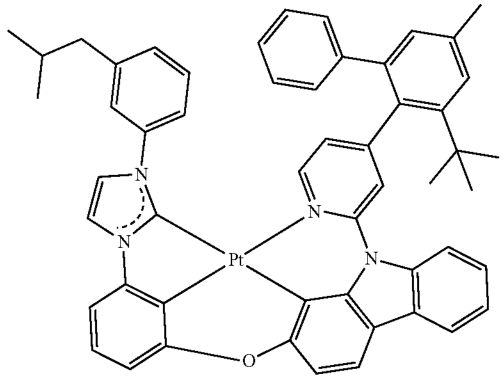
-continued
121
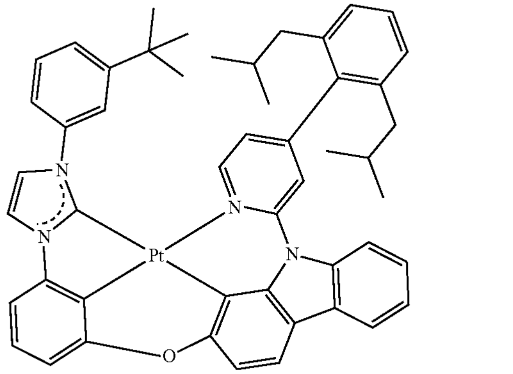
122
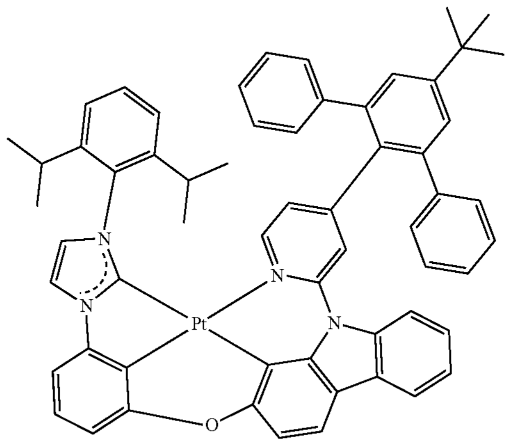
123
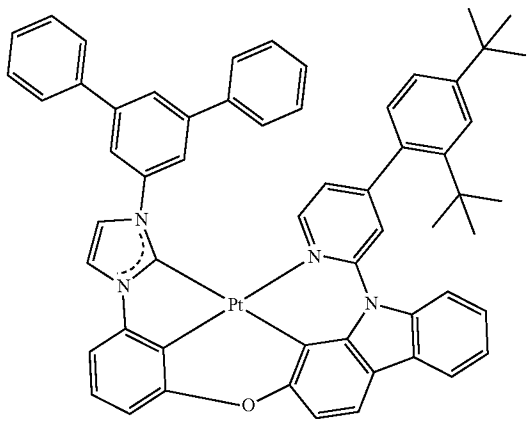

-continued
124
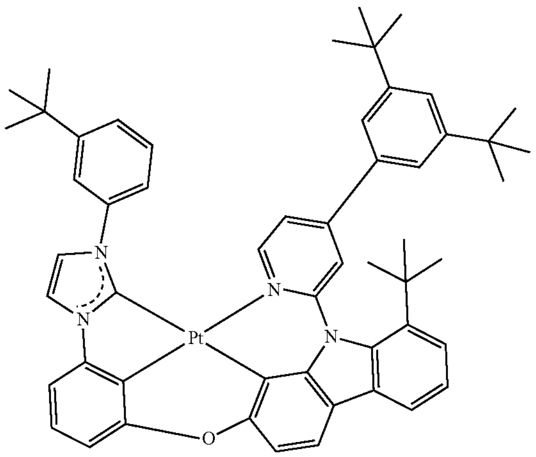
125
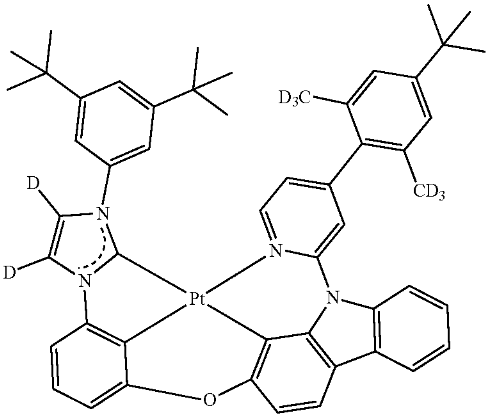
126
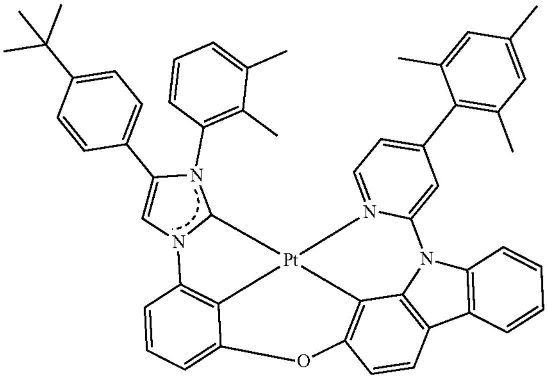
-continued
127
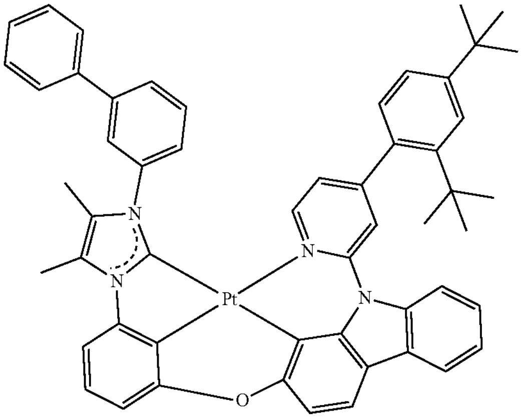
128
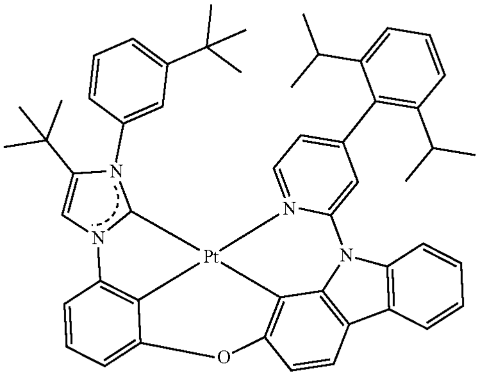
129
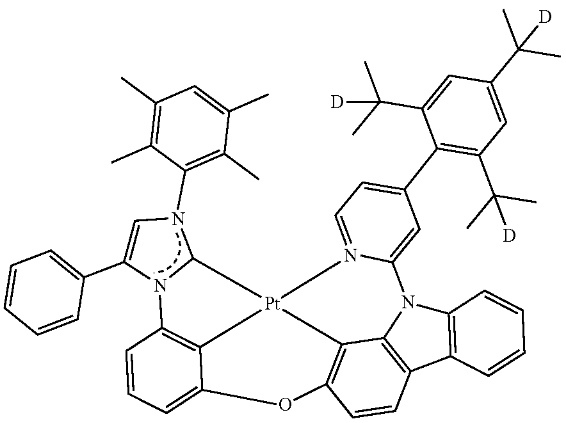

-continued
130
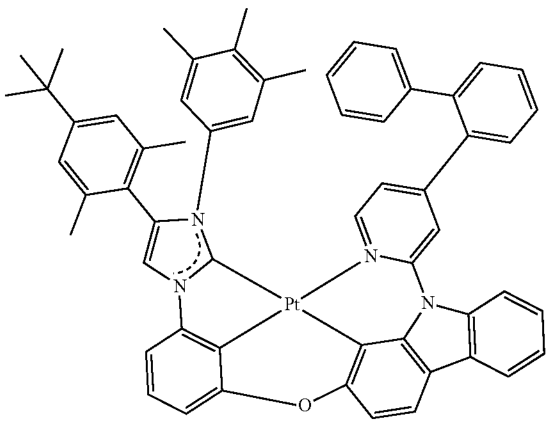
131
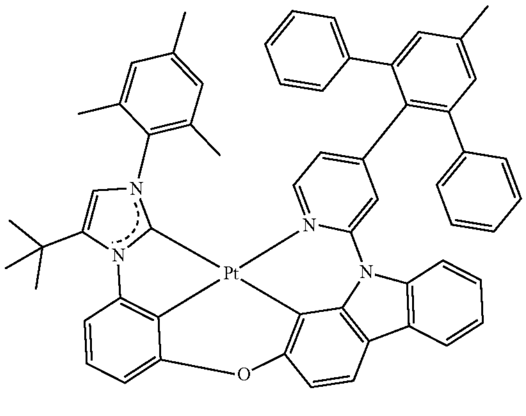
132
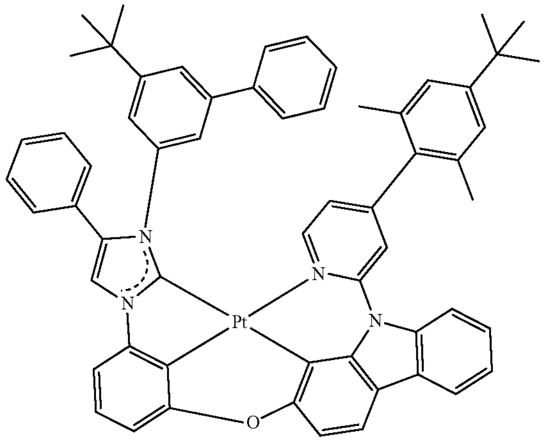
-continued
133
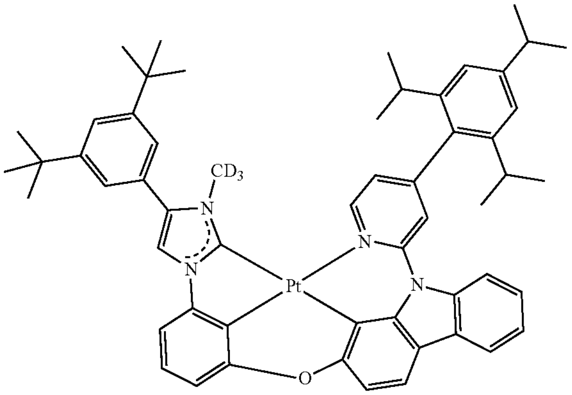
134
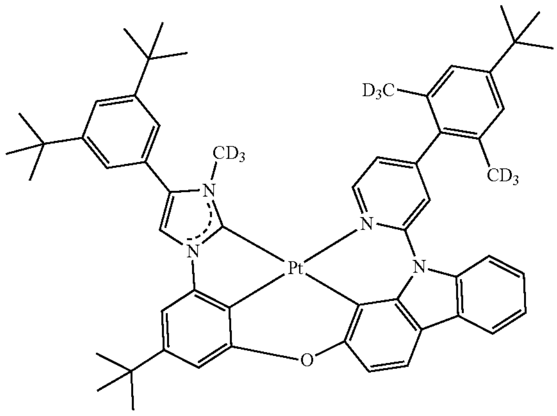
135
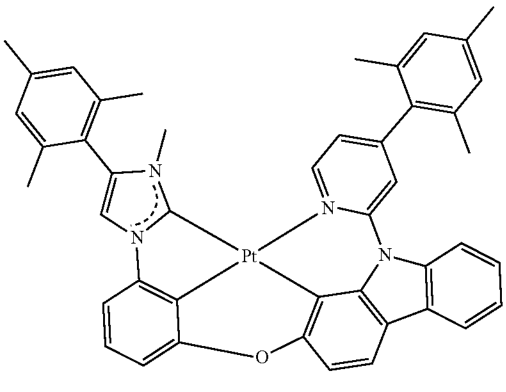

-continued
136
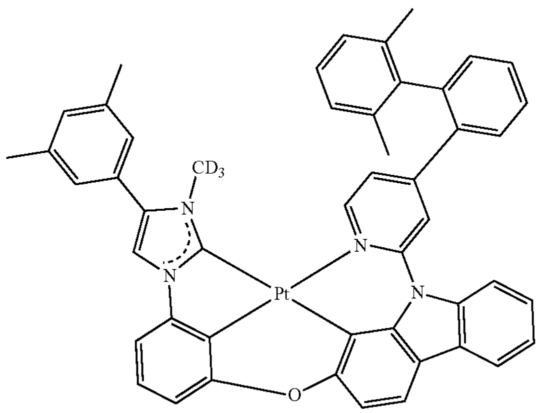
137
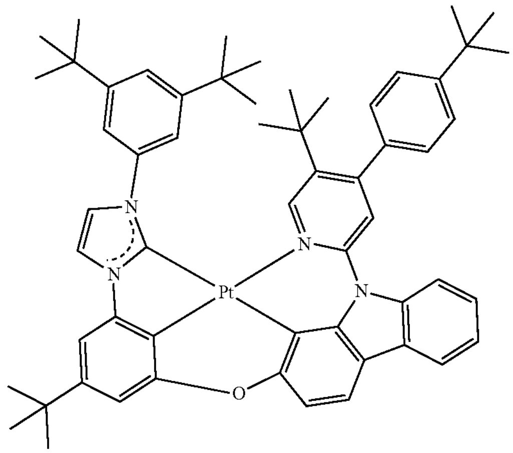
138
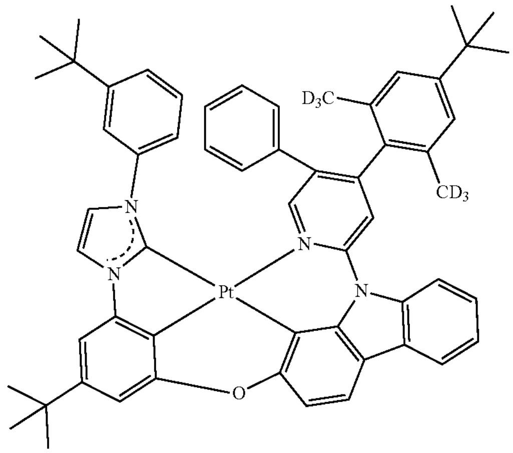
-continued
139
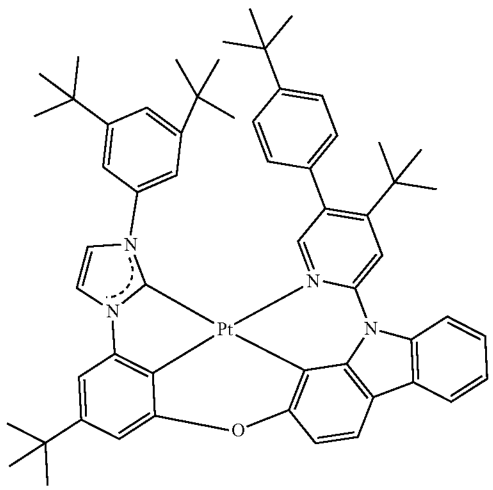
140
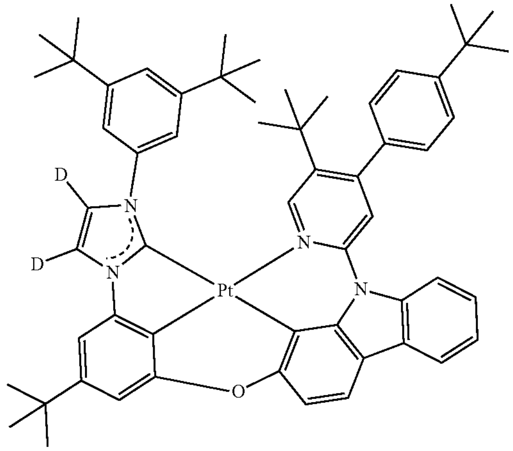
141
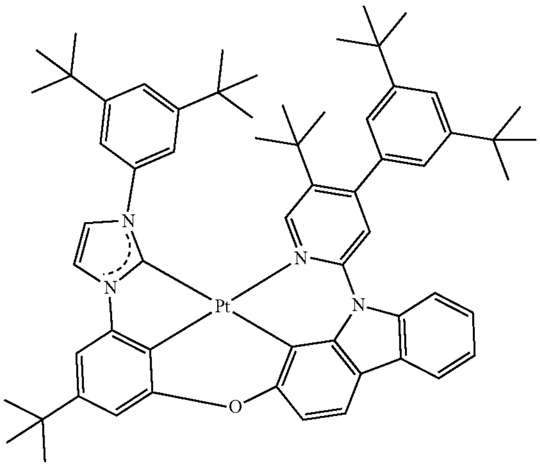

142
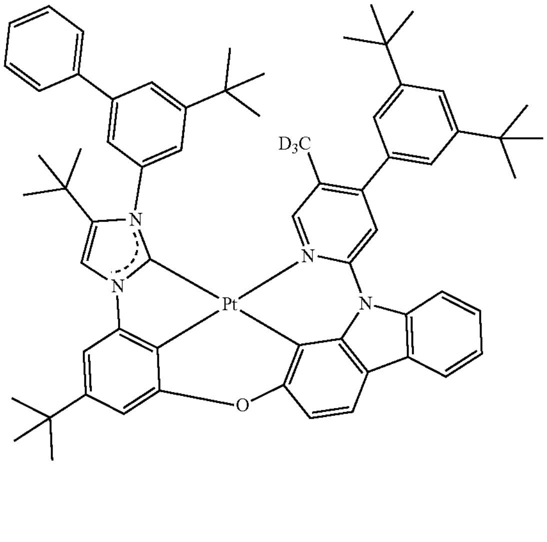
143
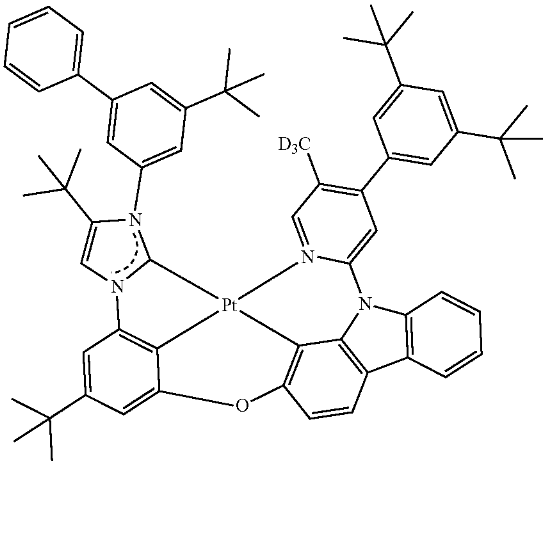
144
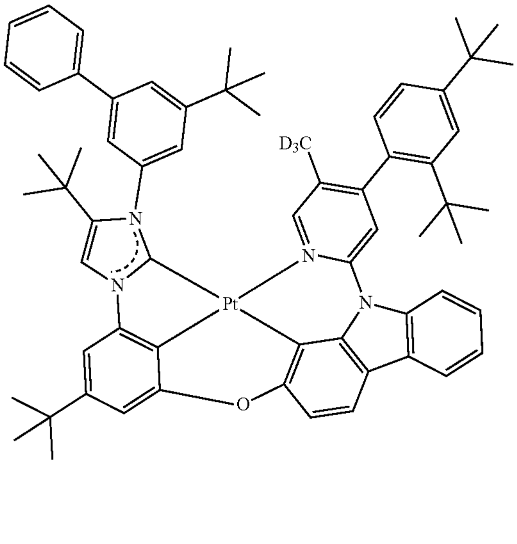
145
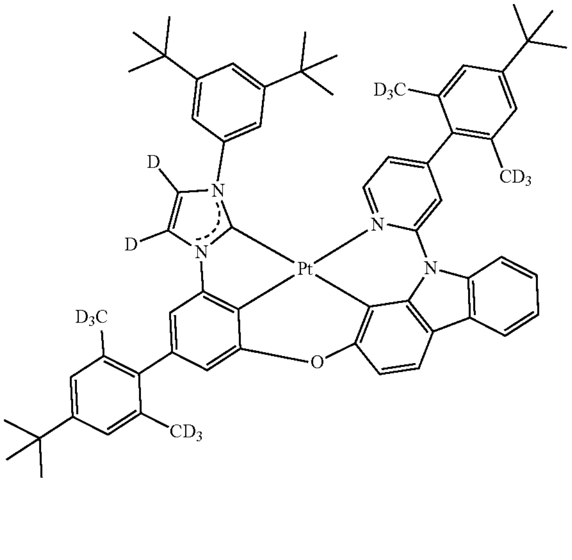
146
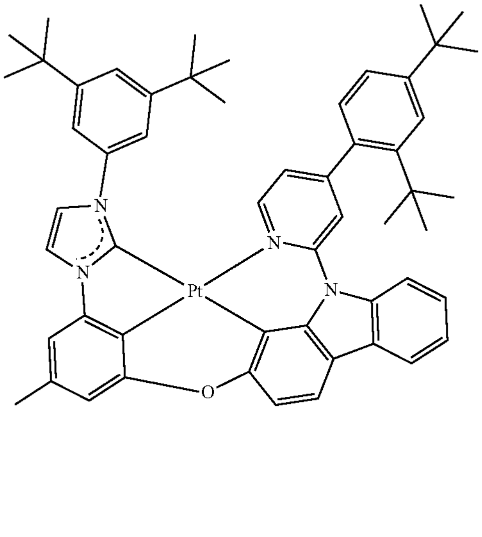
147
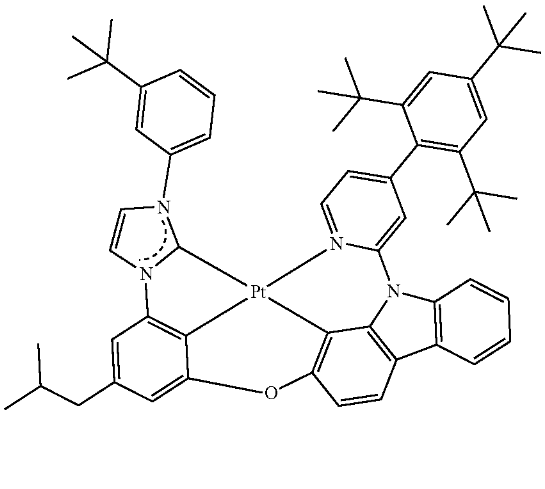

148
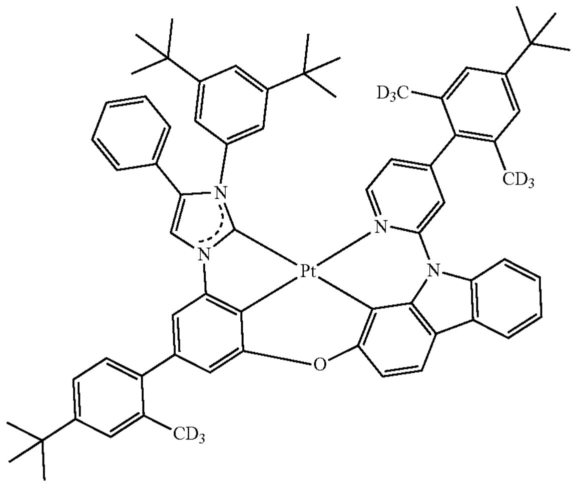
149
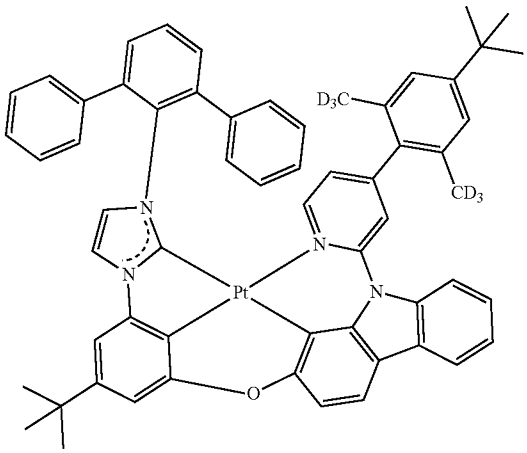
150
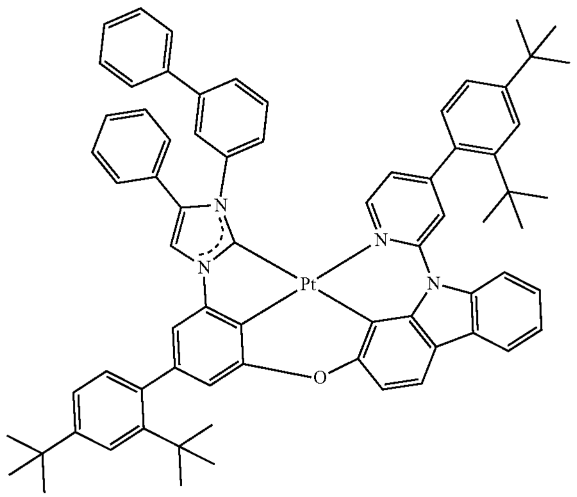
151
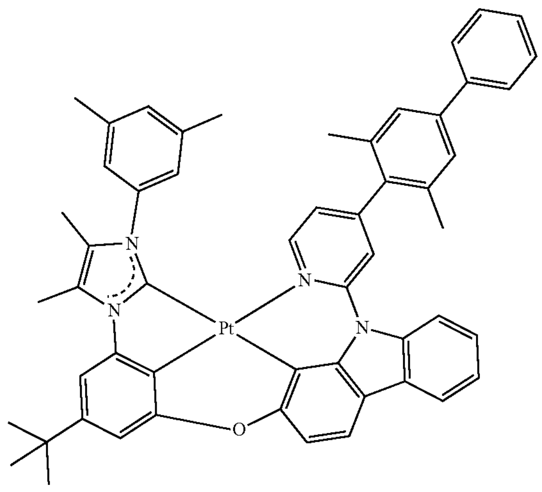
152
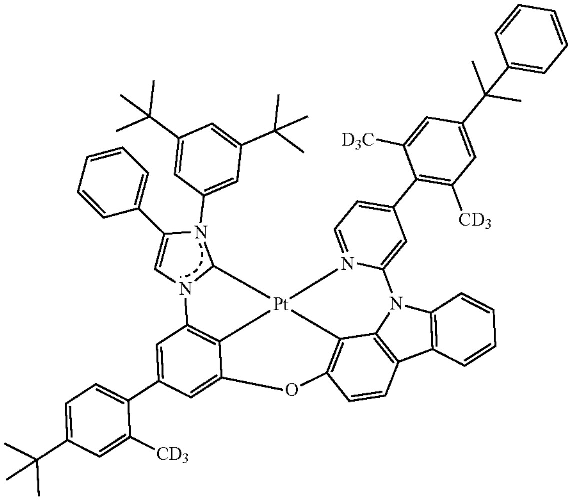
153
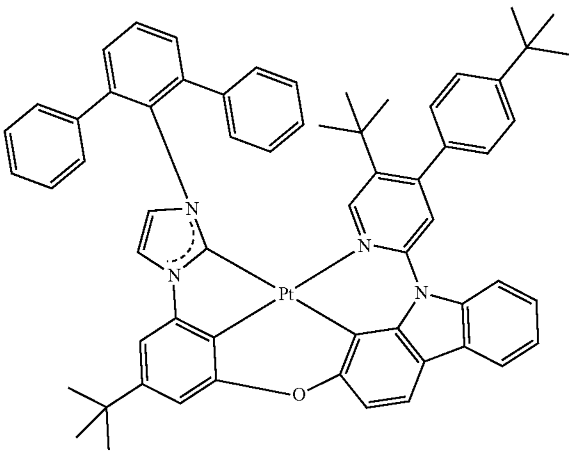

-continued
154
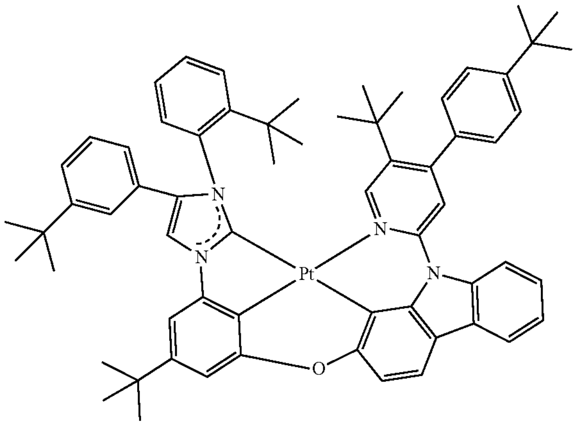
155
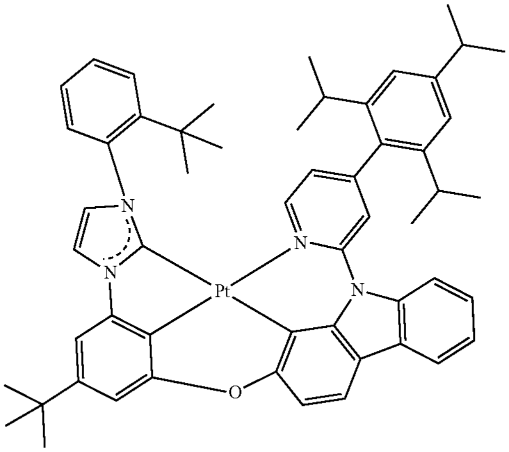
156
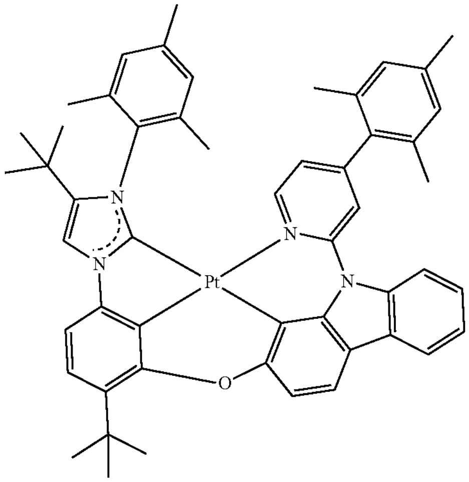
-continued
157
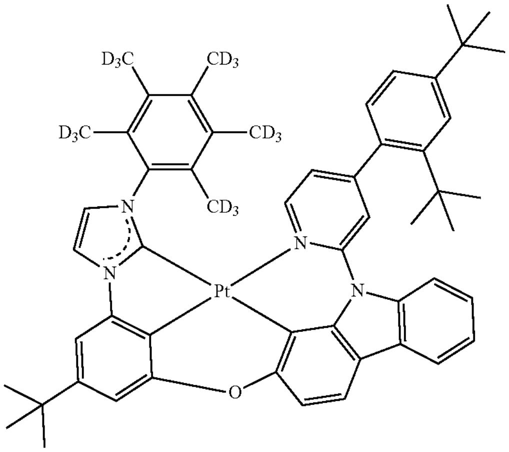
158
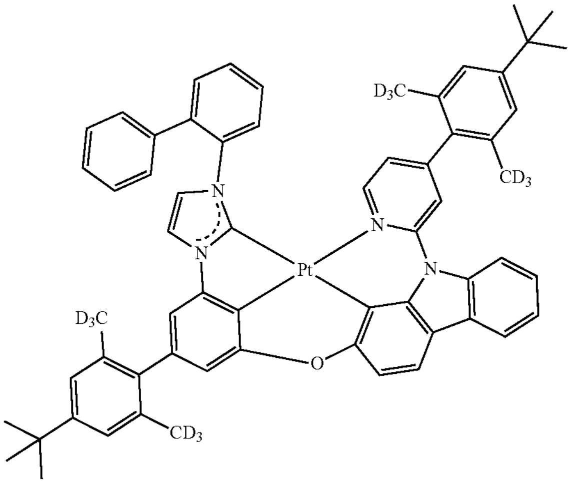
159
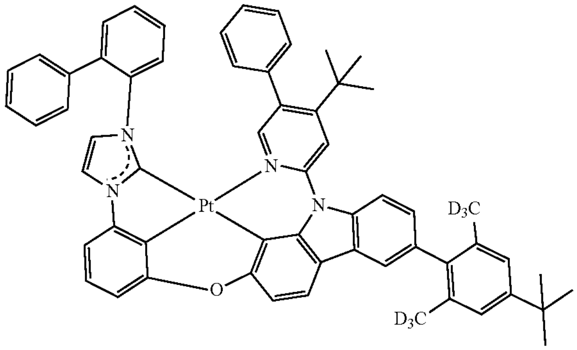

-continued
160
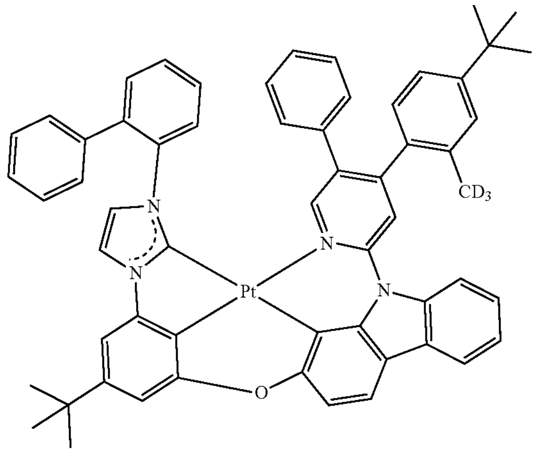
161
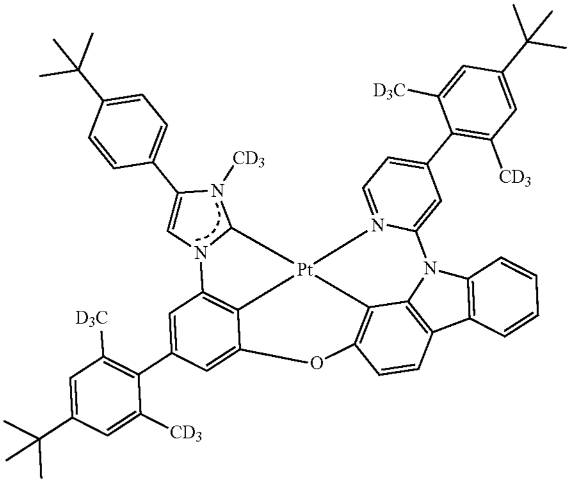
162
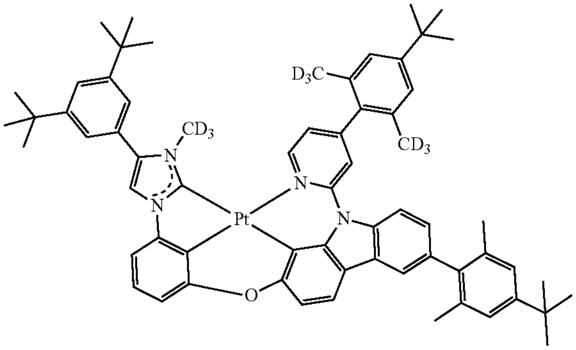
-continued
163
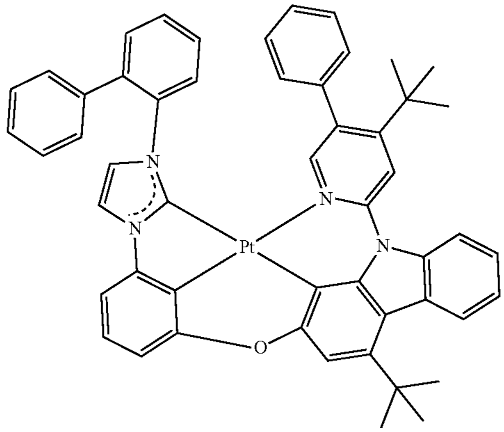
164
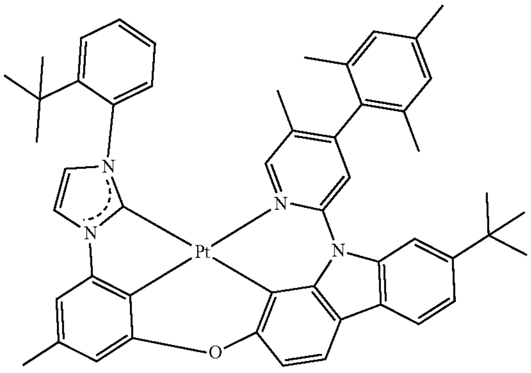
165
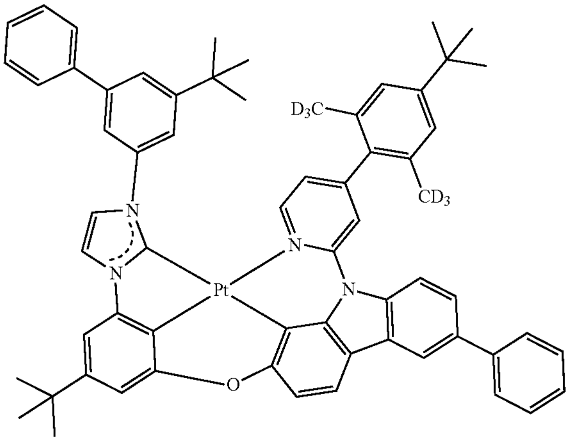

-continued
166
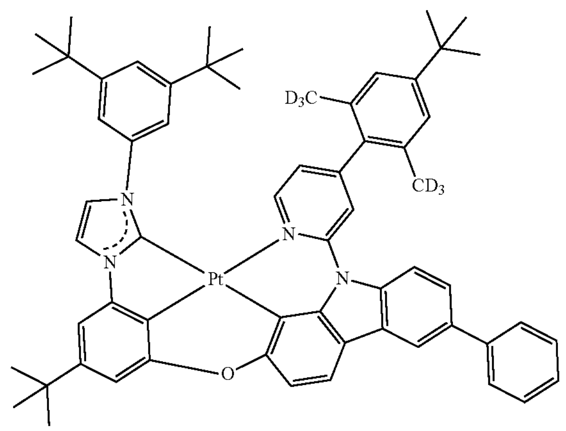
167
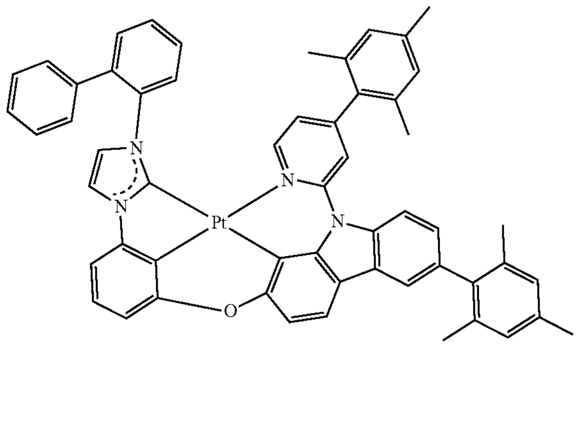
168
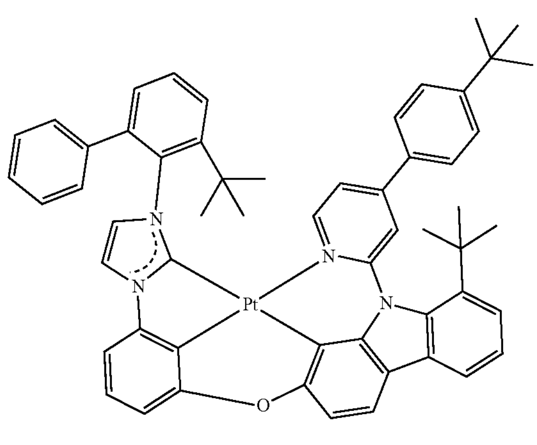
-continued
169
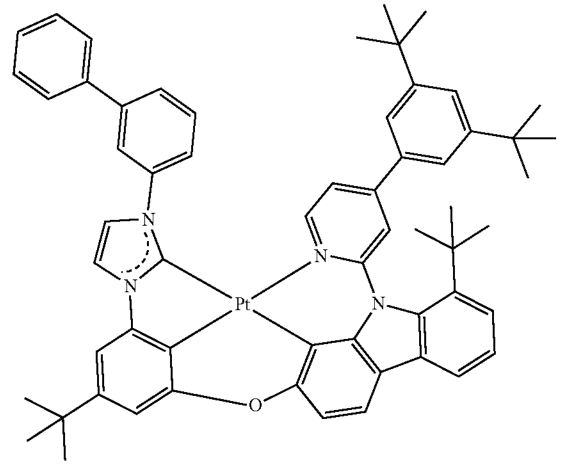
170
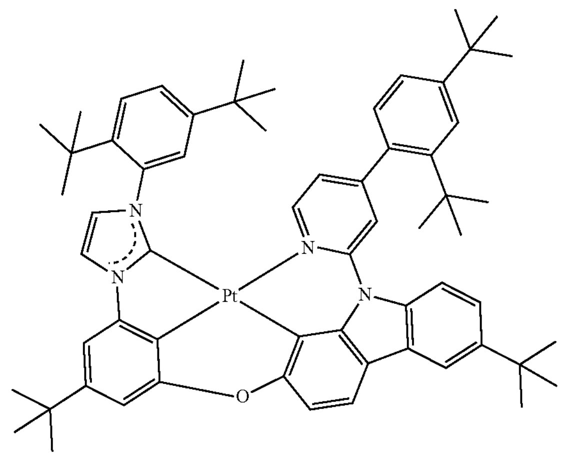
171
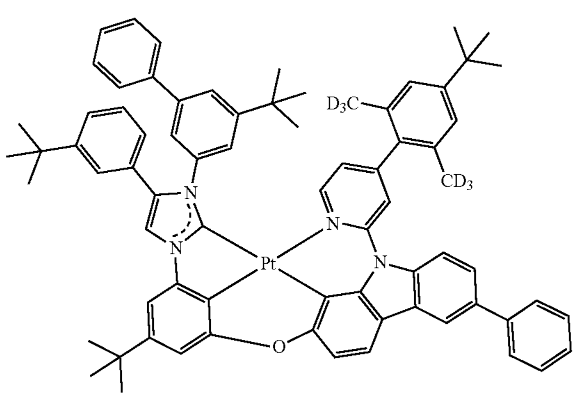

-continued
172
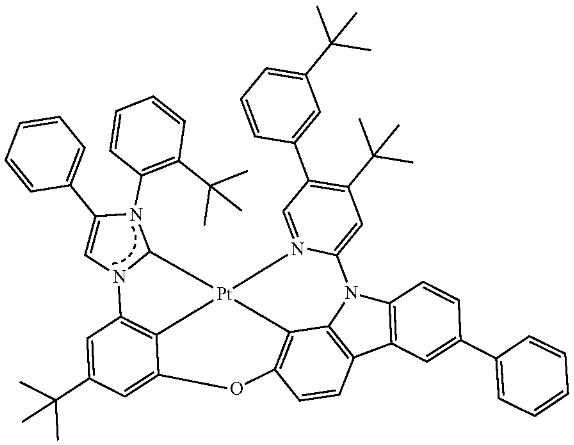
173
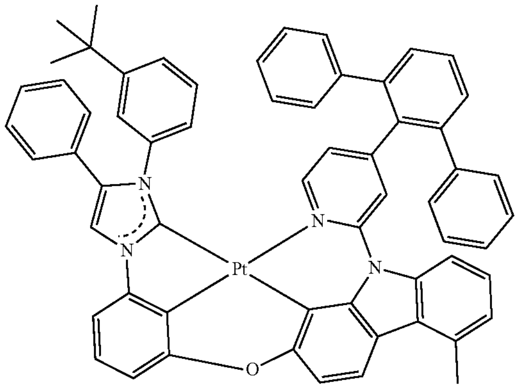
174
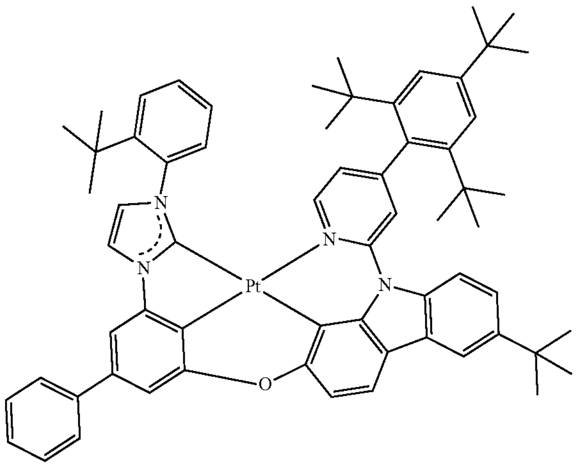
-continued
175
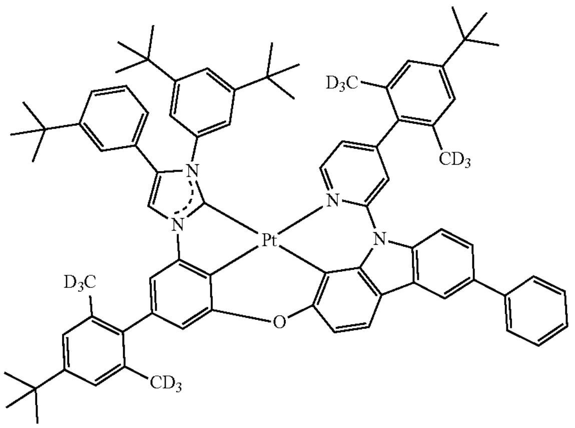
176
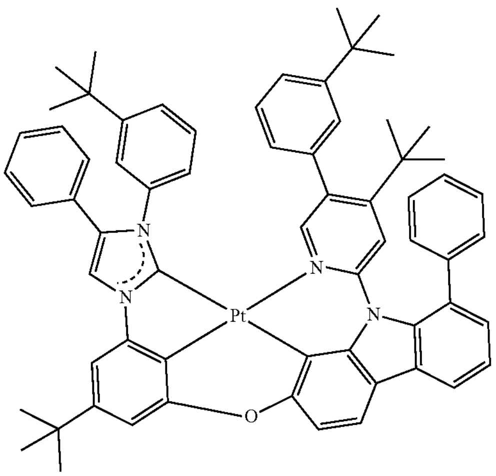
177
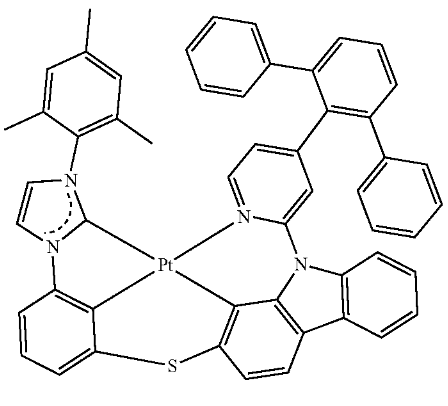

-continued
178
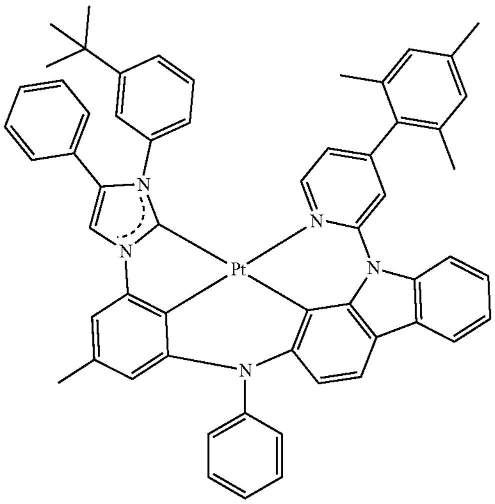
179
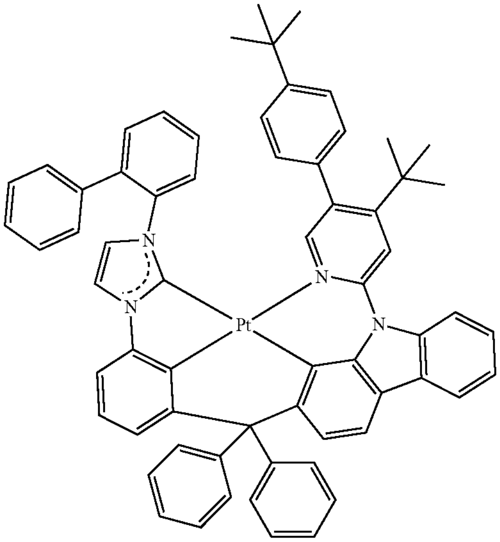
180
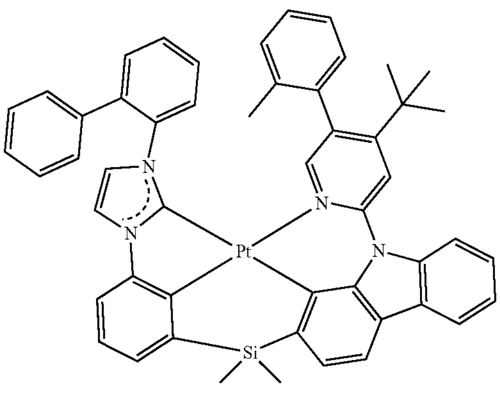
-continued
181
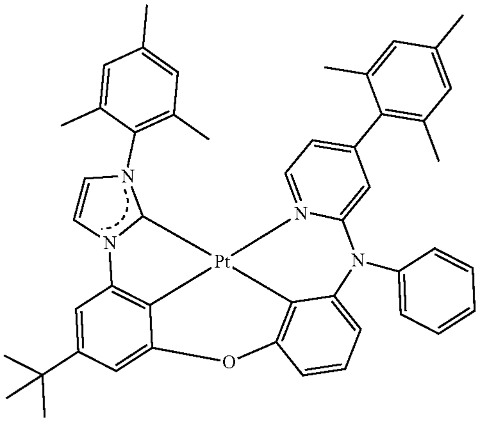
182
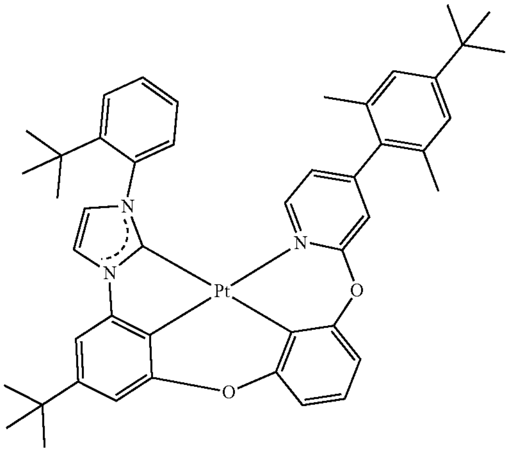
183
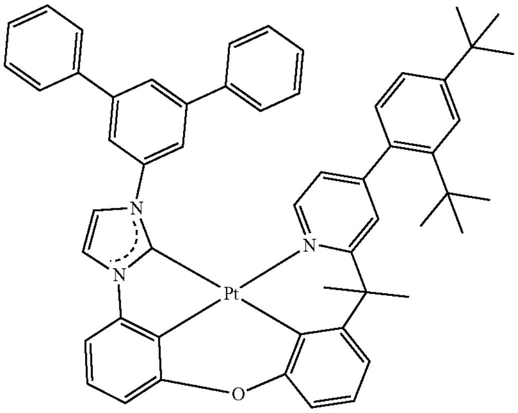

-continued
184
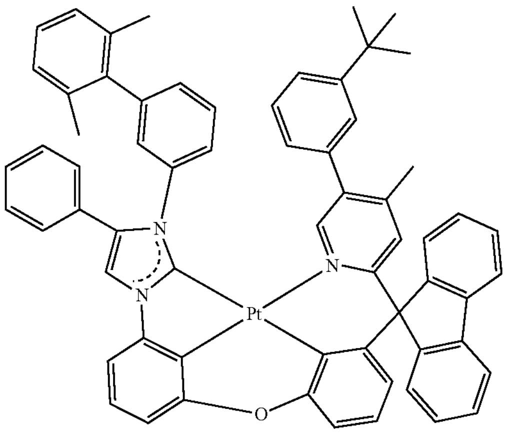
185
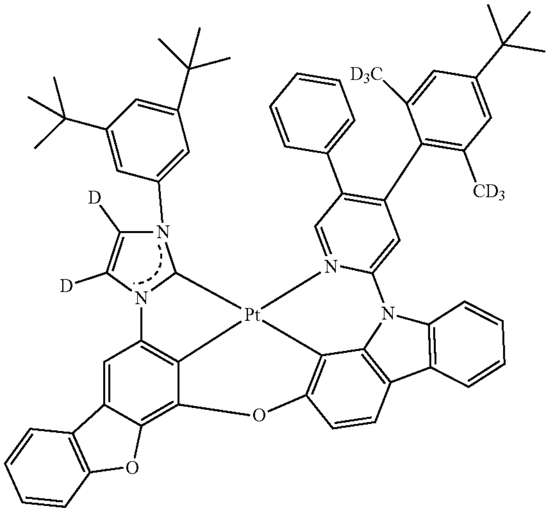
186
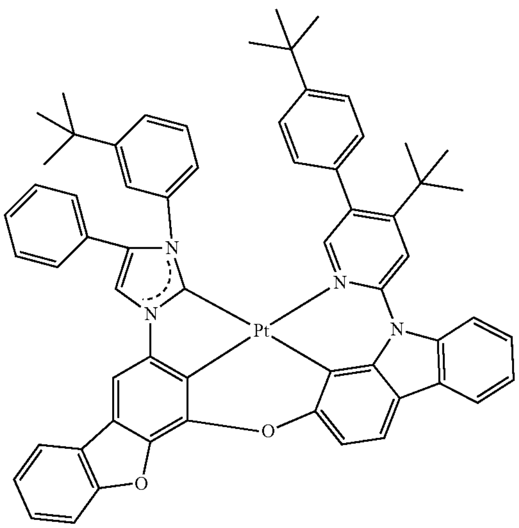
-continued
187
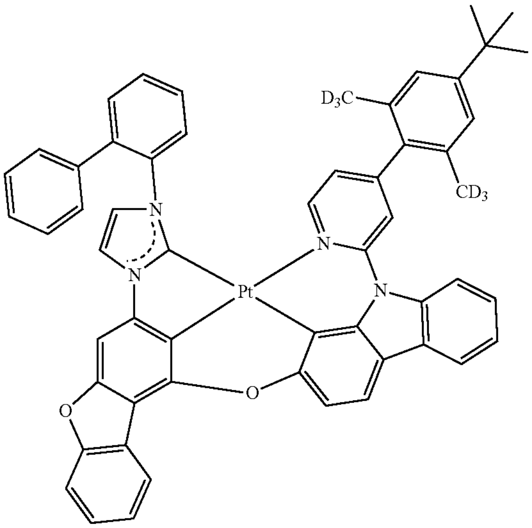
188
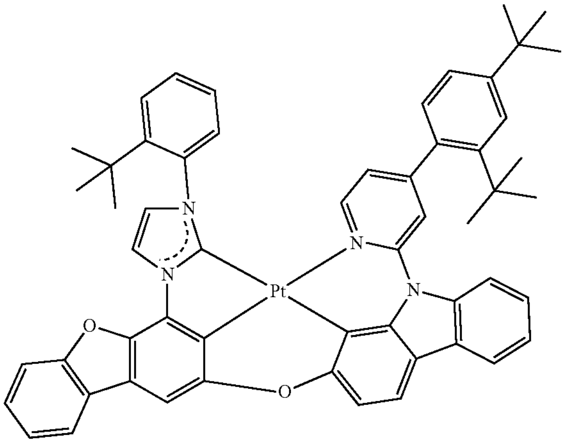
189
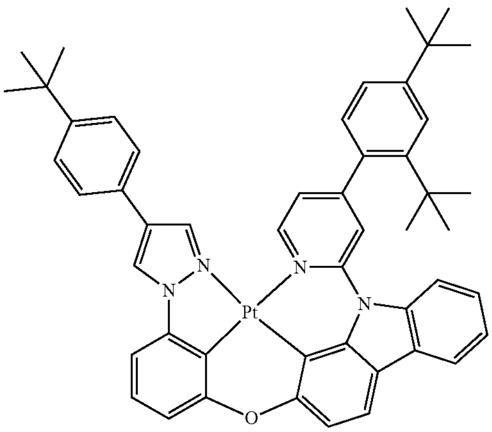

-continued
190
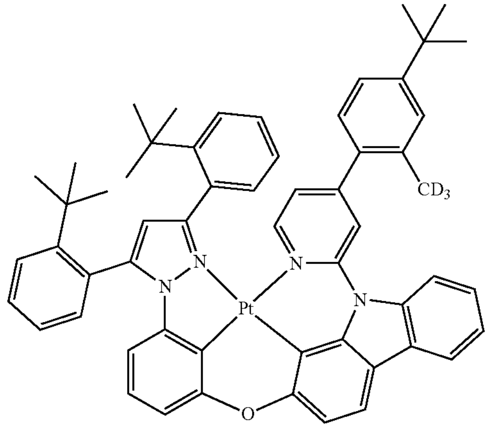
191
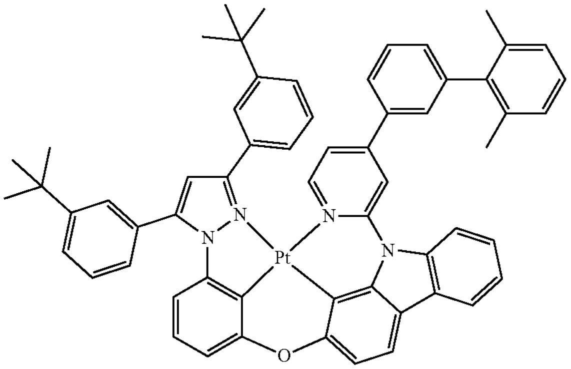
192
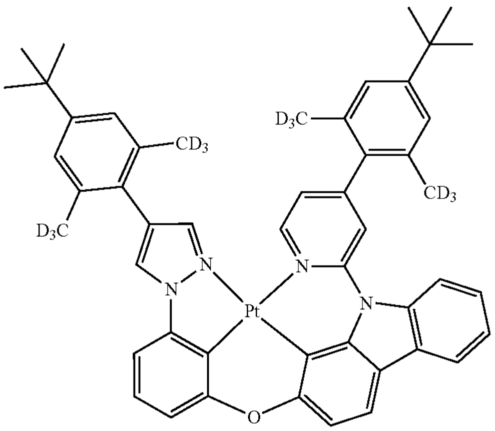
-continued
193
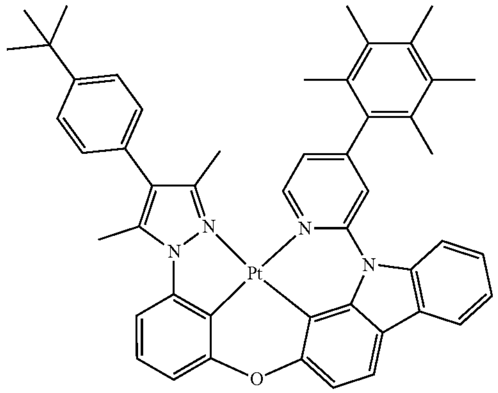
194
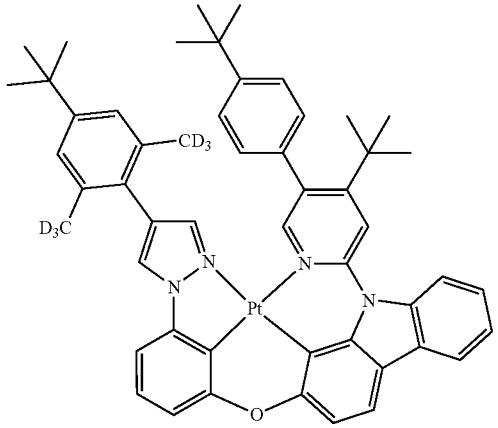
195
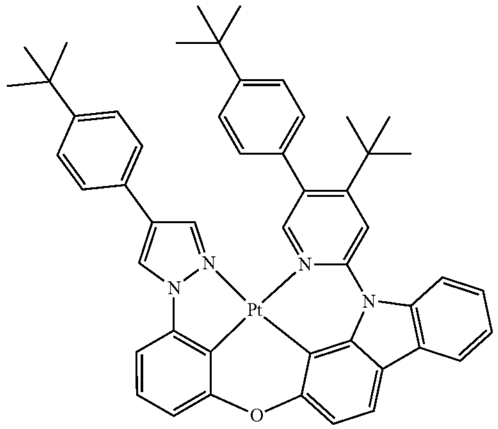

-continued
196
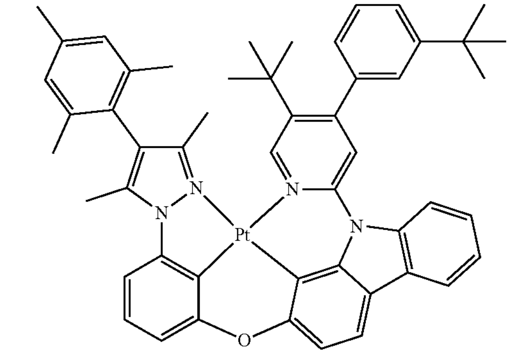
197
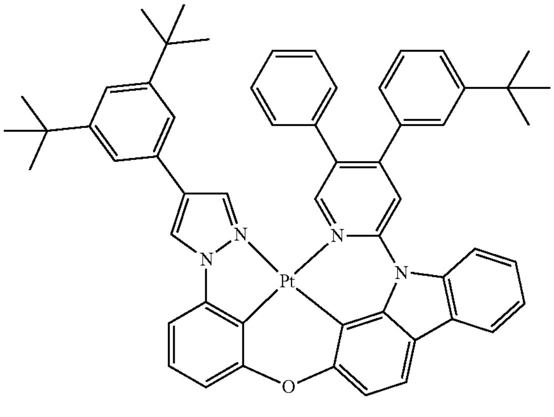
198
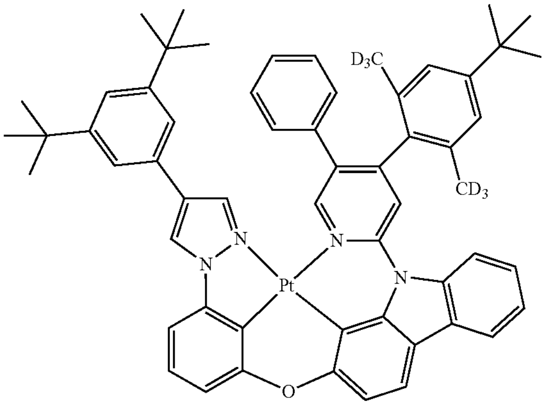
-continued
199
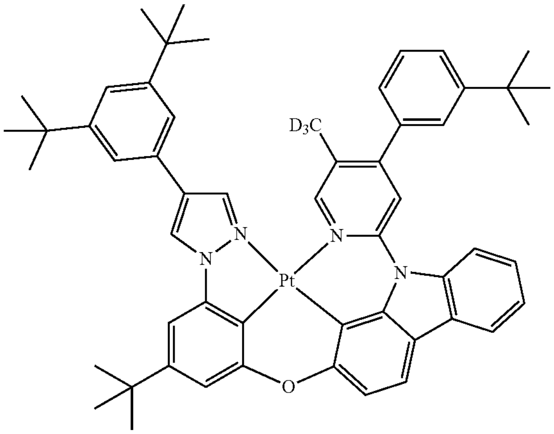
200
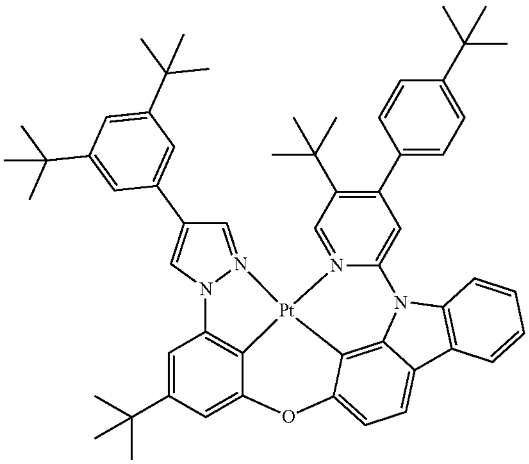
201
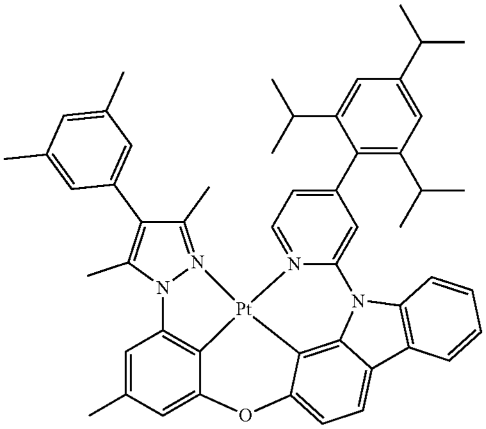

-continued
202
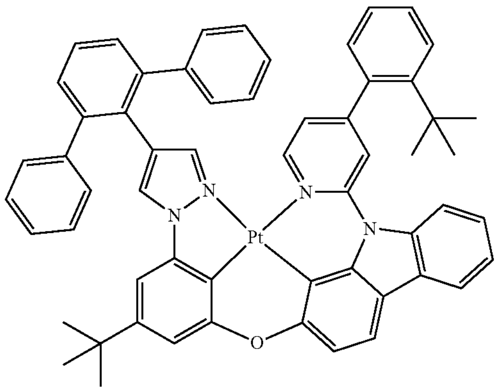
203
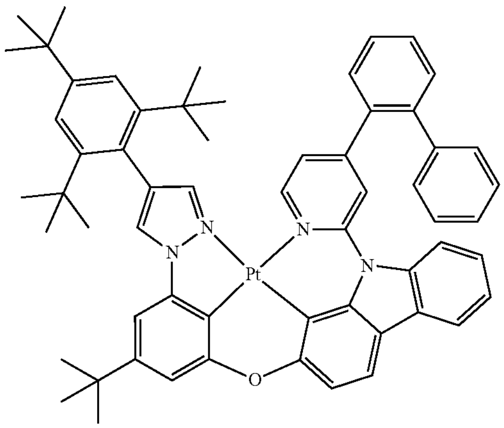
204
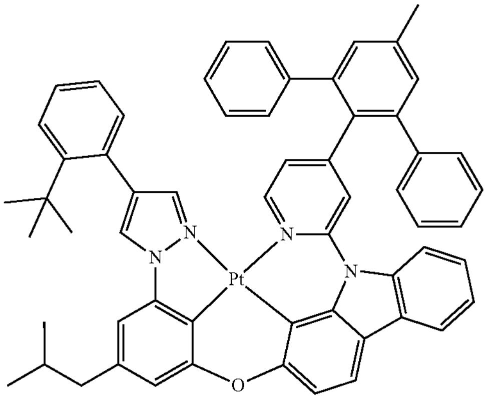
-continued
205
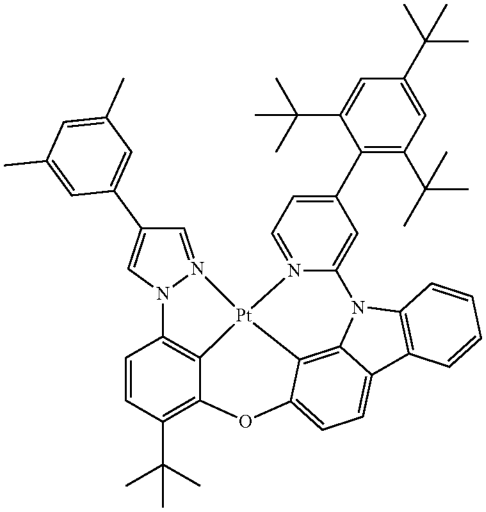
206
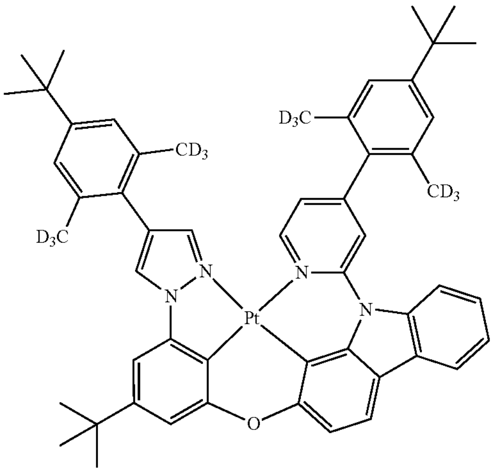
207
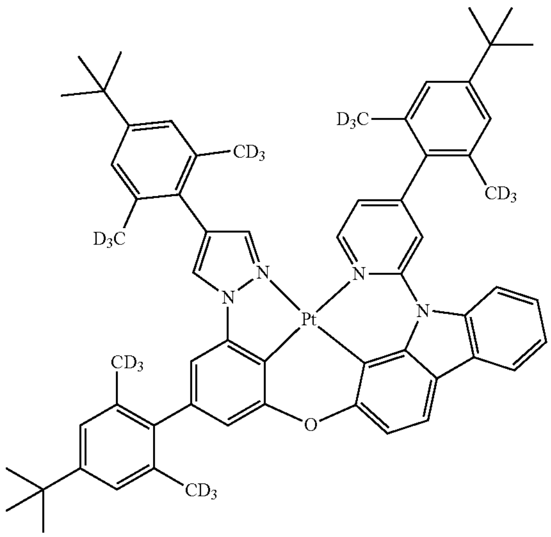

-continued
208
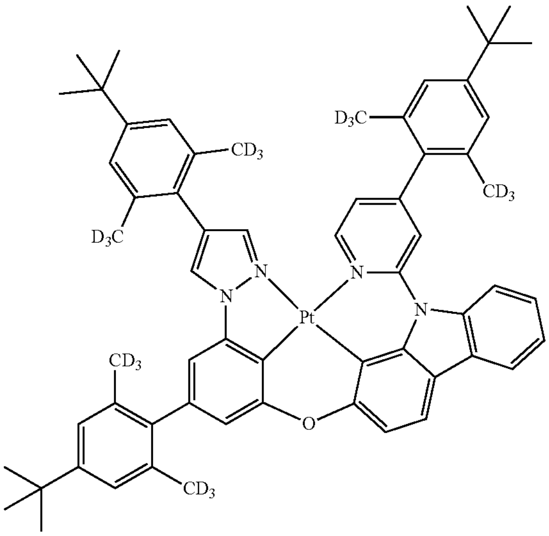
209
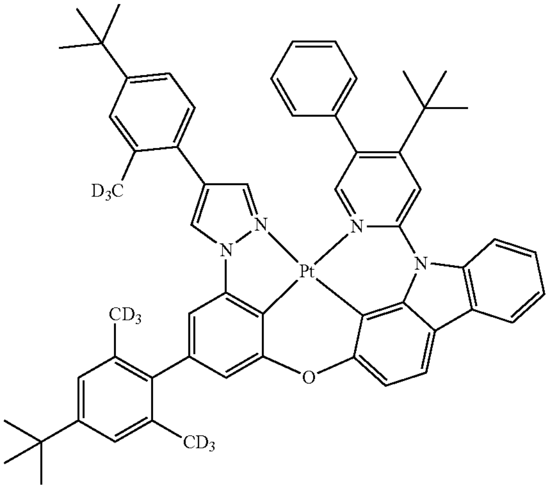
210
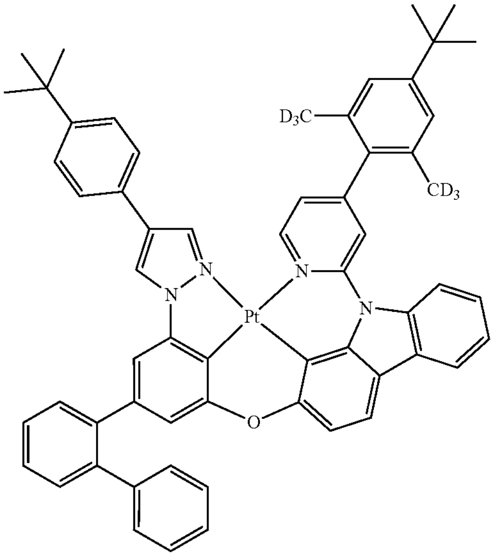
211
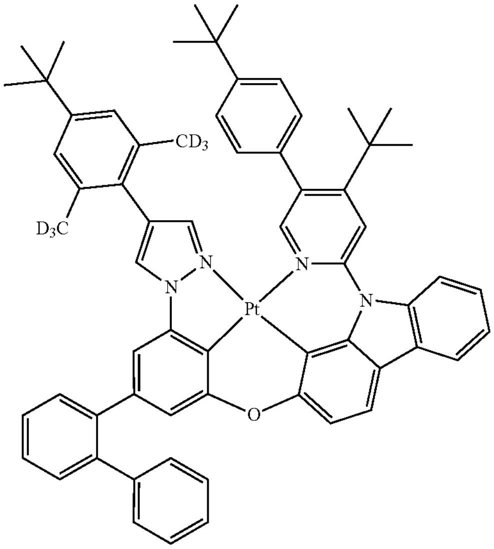
212
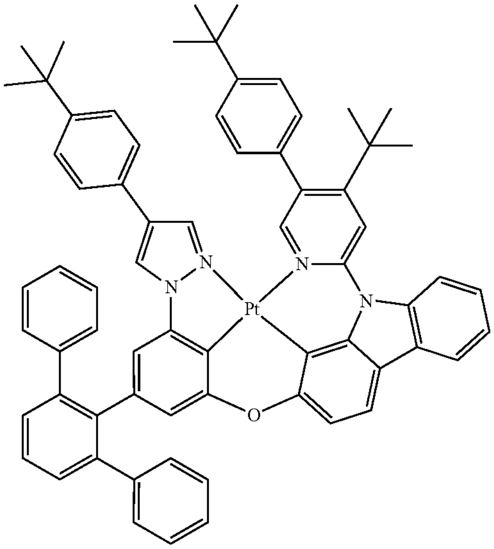
213
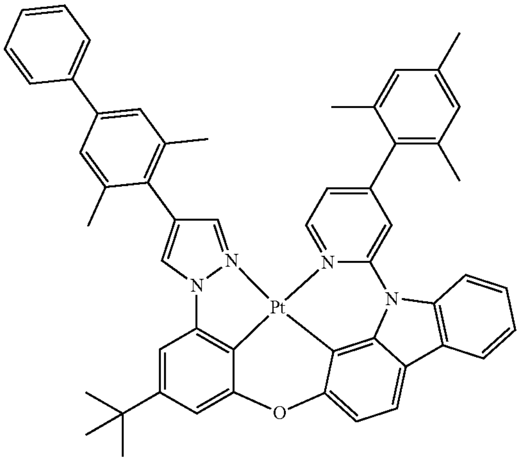

-continued
214
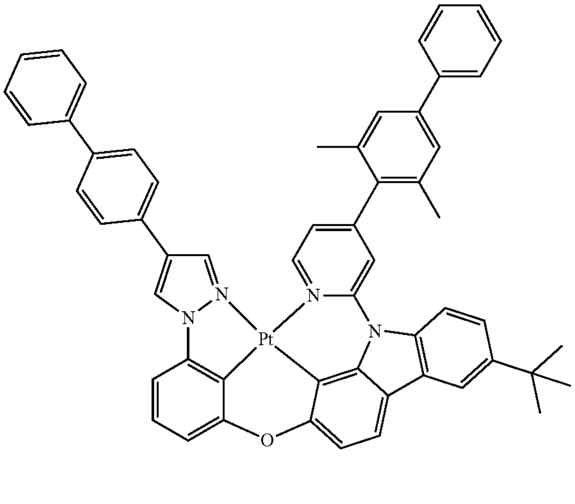
215
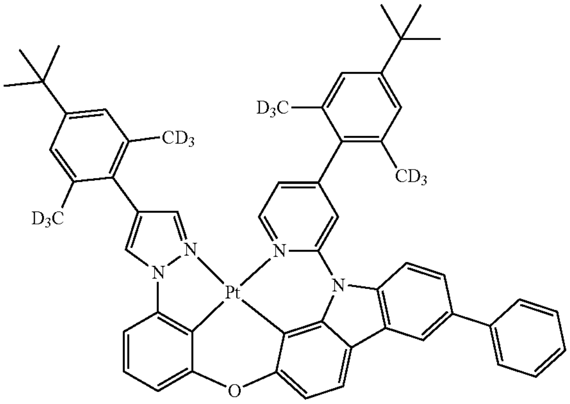
216
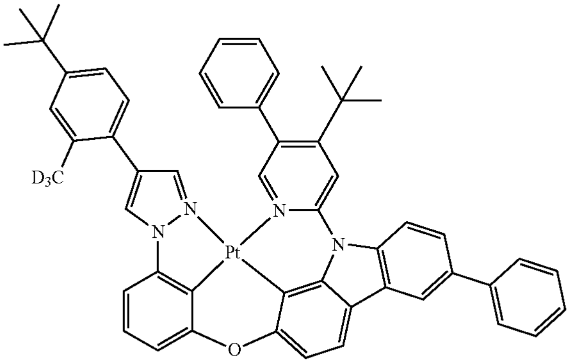
-continued
217
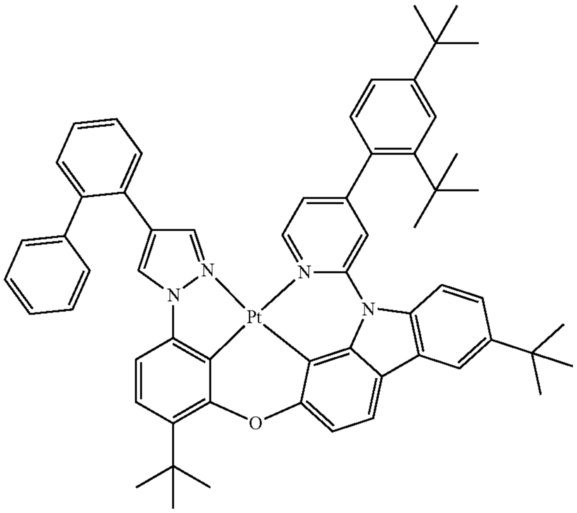
218
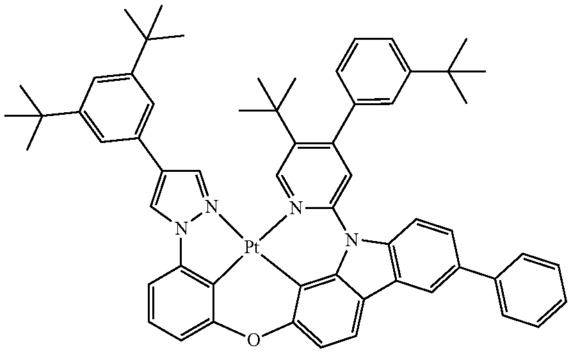
219
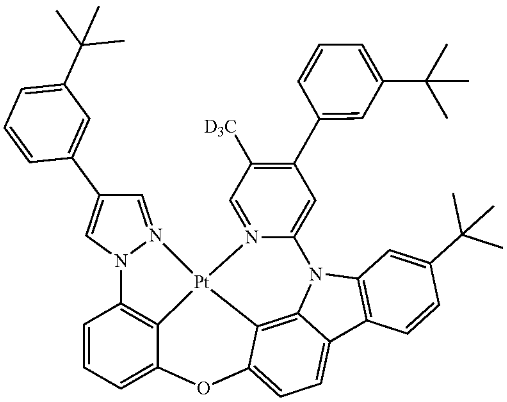

-continued
220
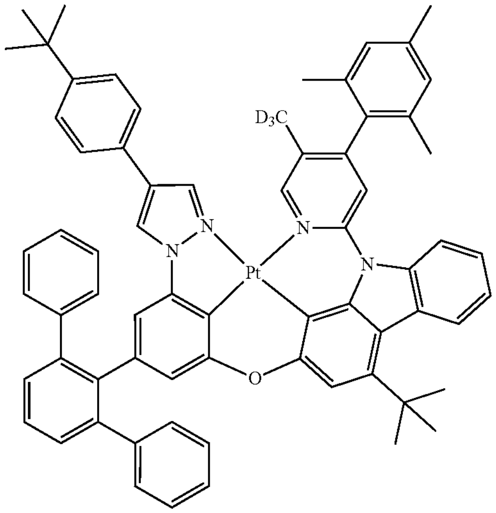
221
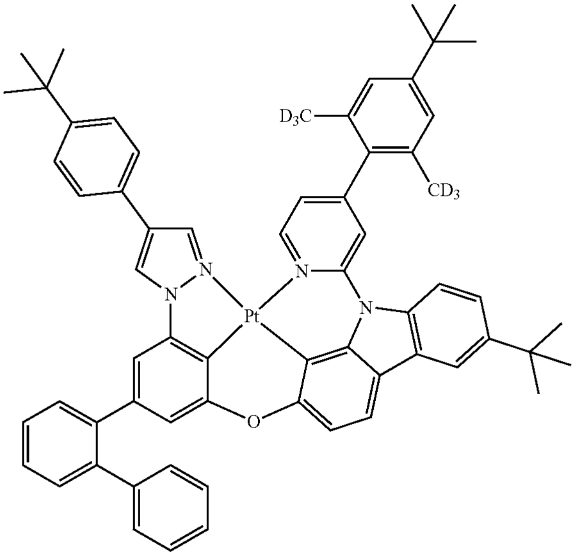
-continued
222
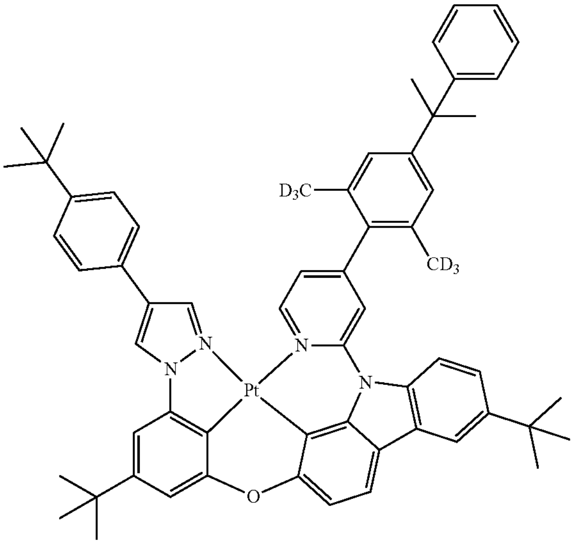
223
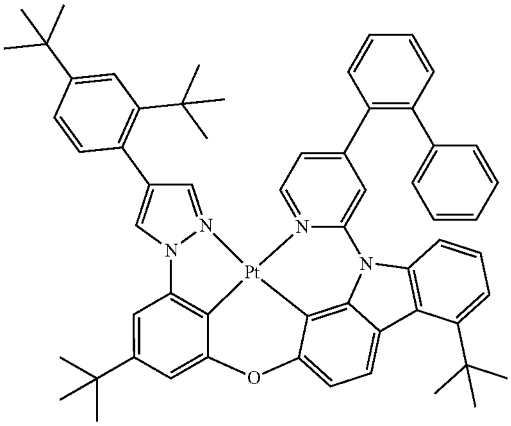
224
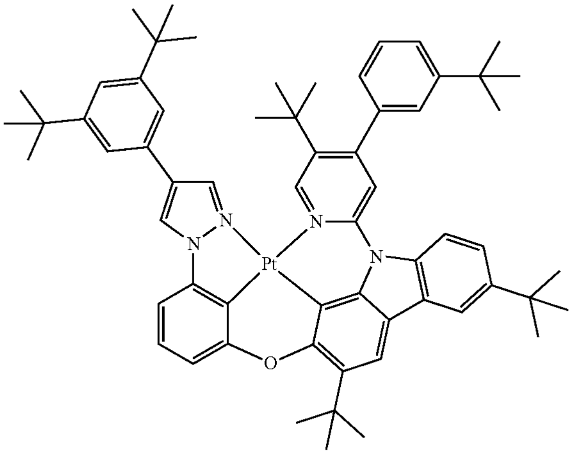

-continued
225
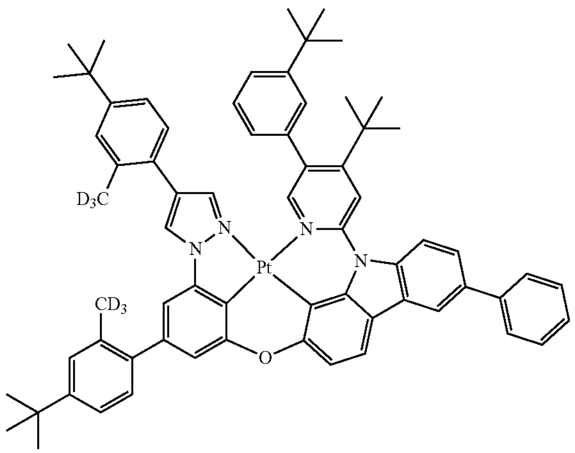
226
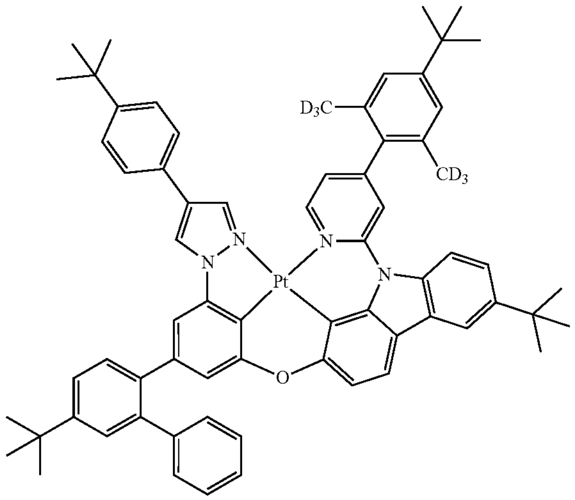
227
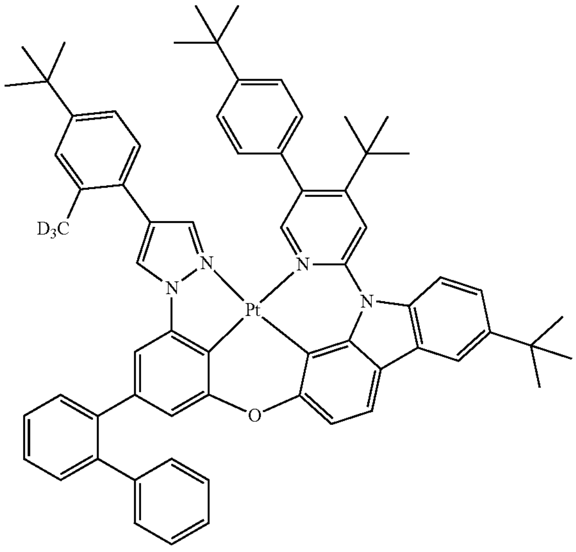
-continued
228
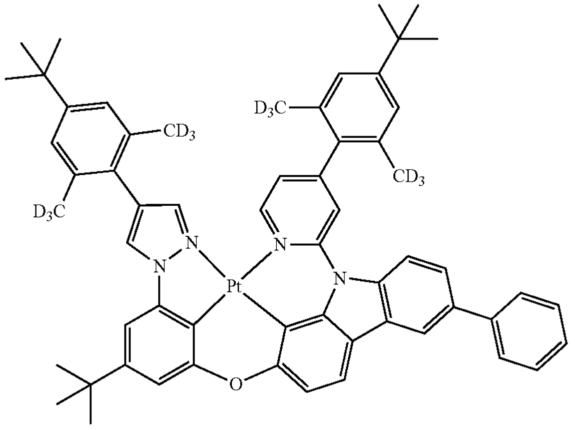
229
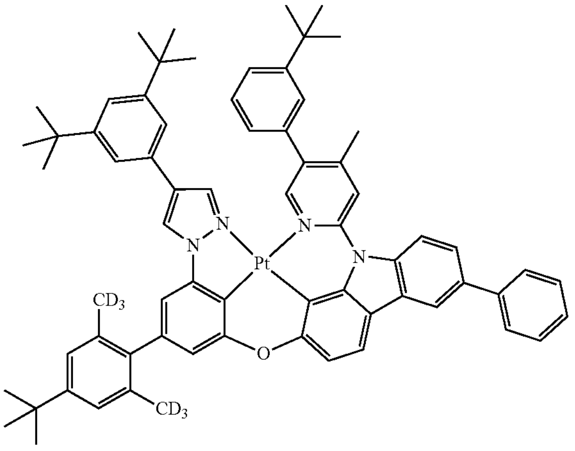
230
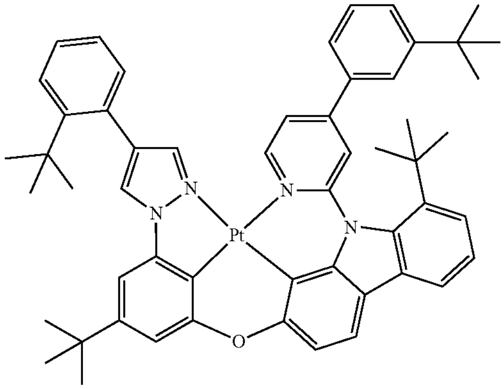

-continued
231
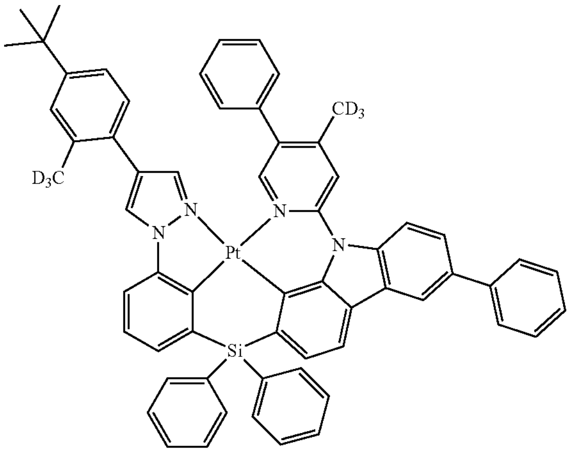
232
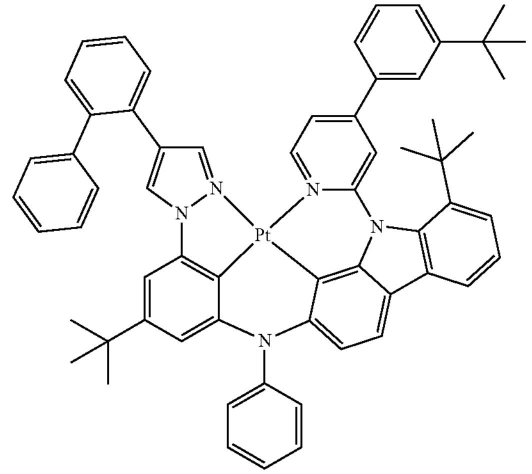
233
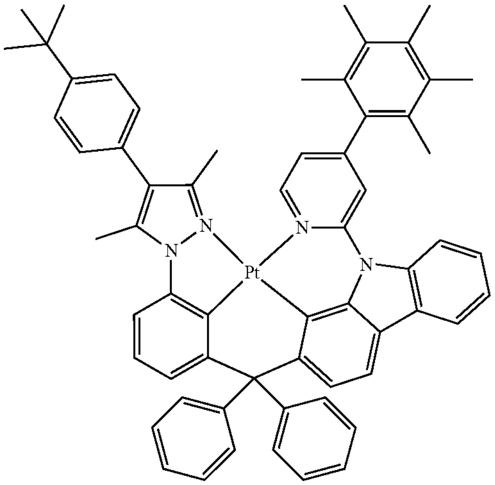
-continued
234
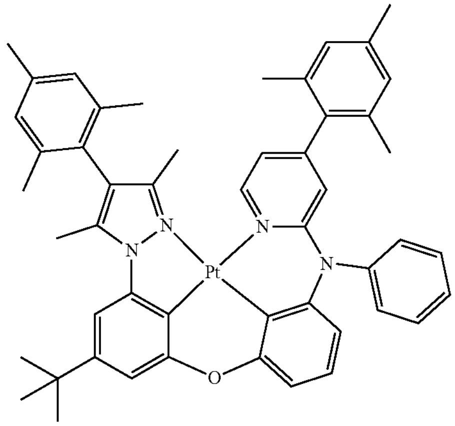
235
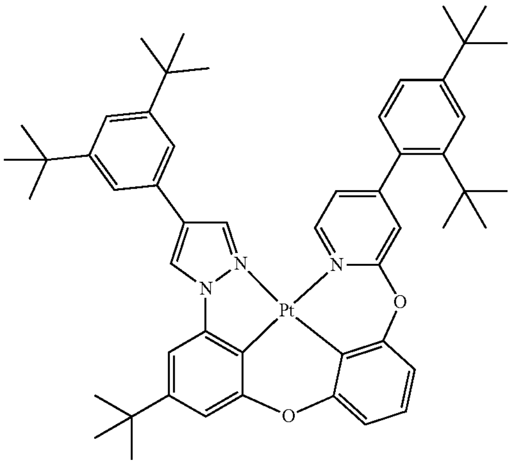
236
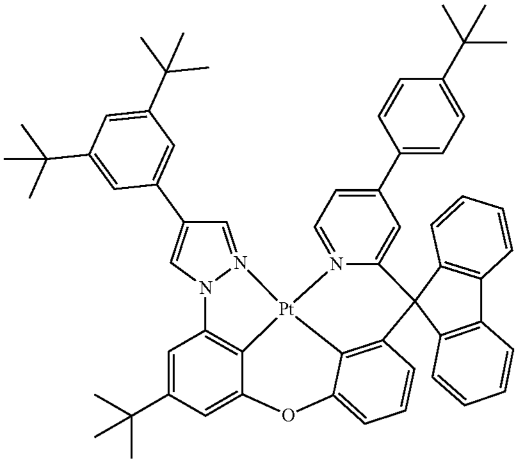

-continued
237
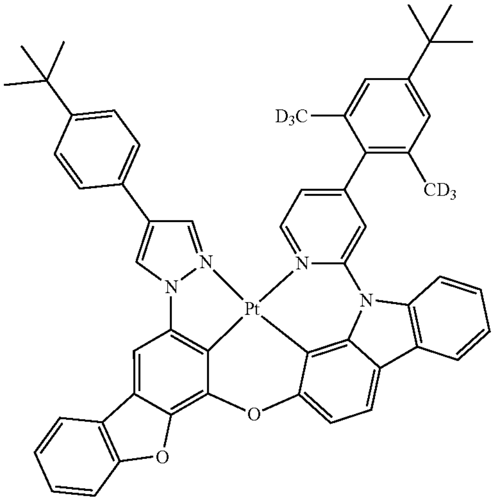
239
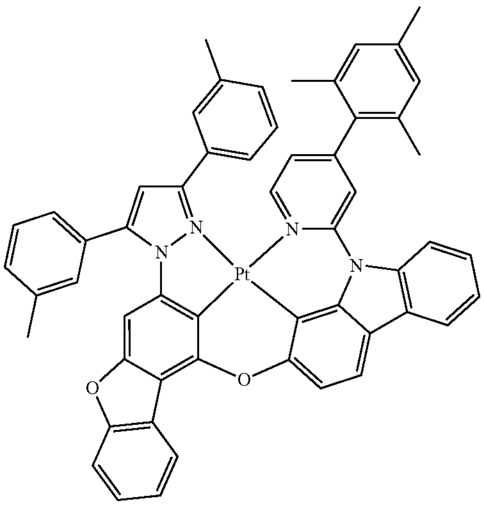
238
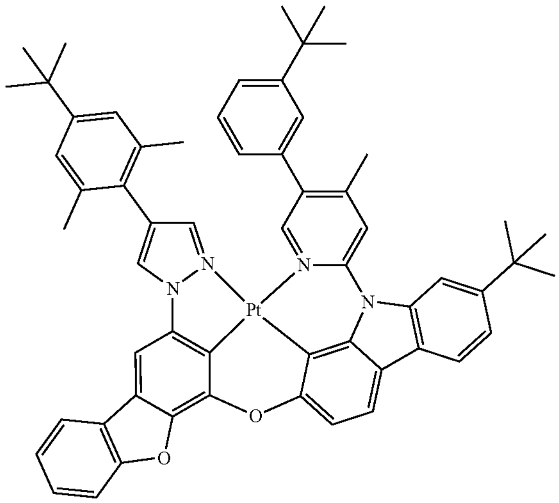
240
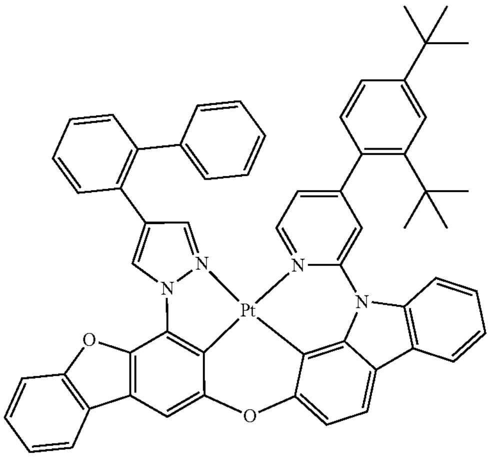
241
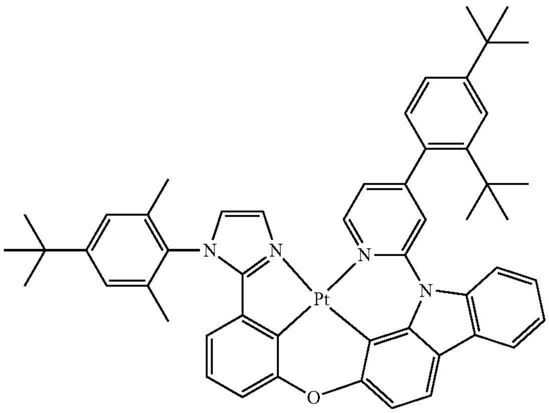
242
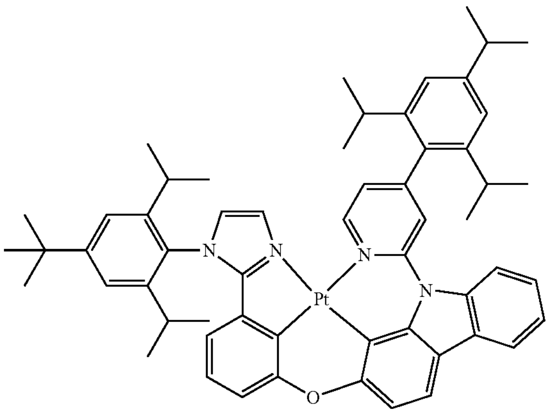

-continued
243
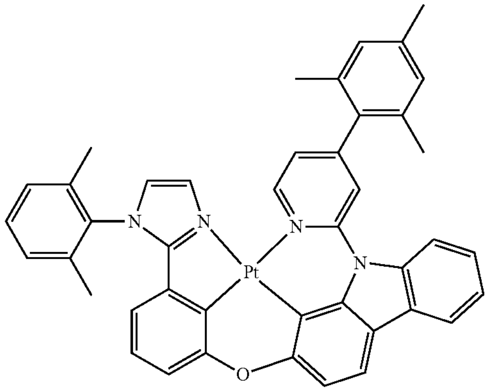
244
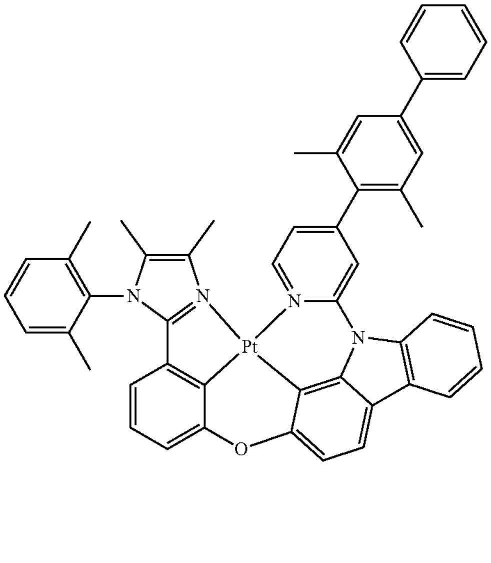
245
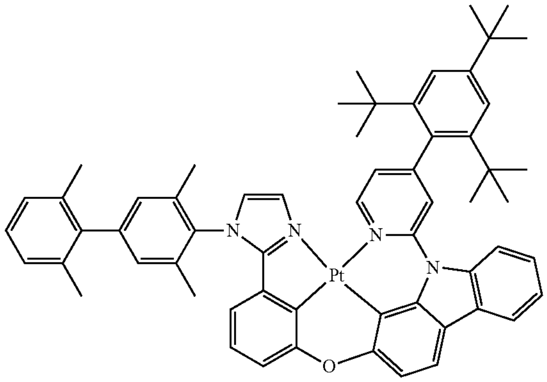
246
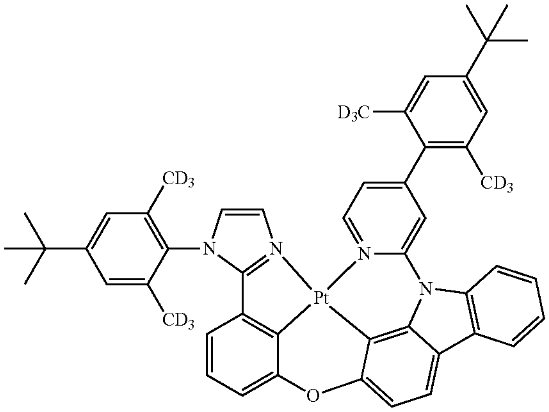
247
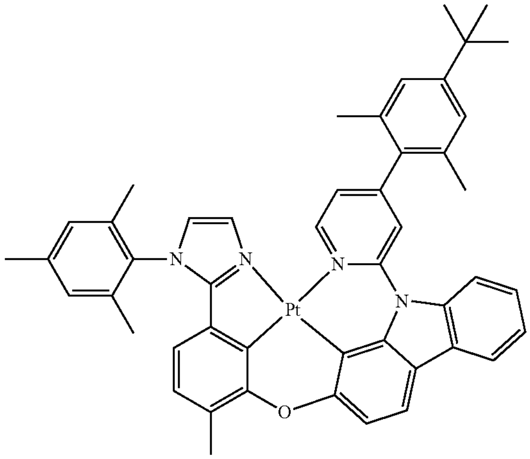
248
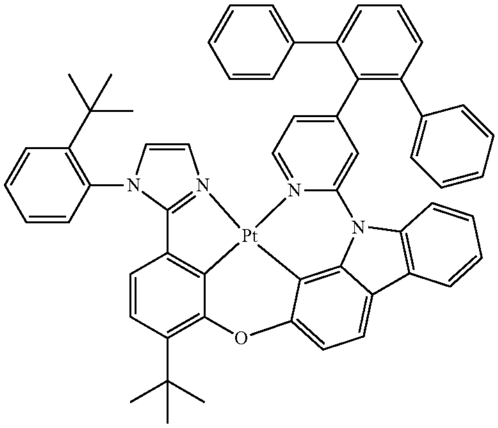

-continued
249
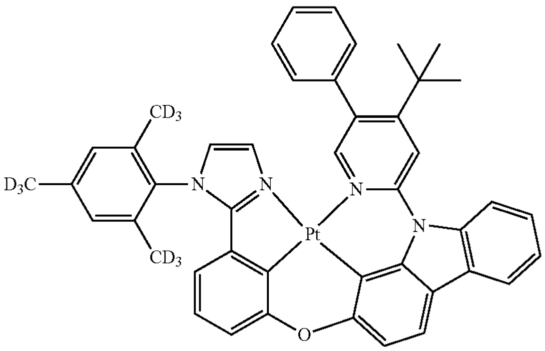
250
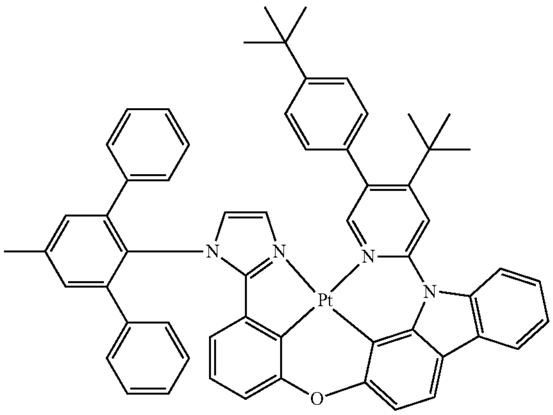
251
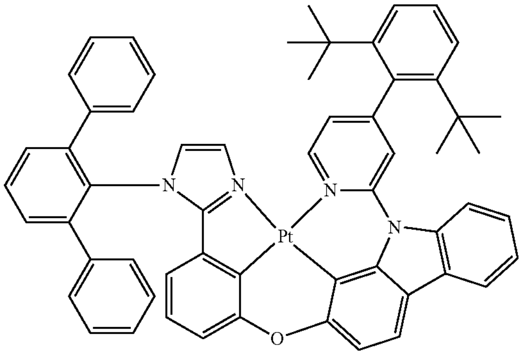
252
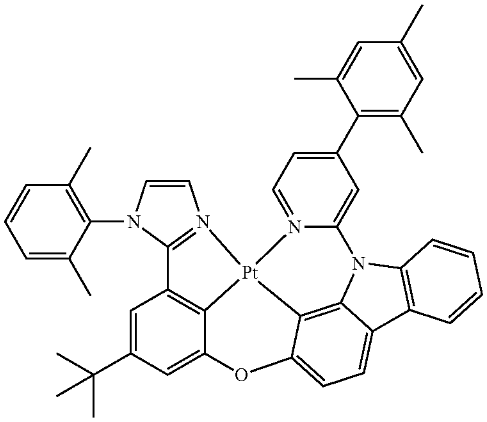
253
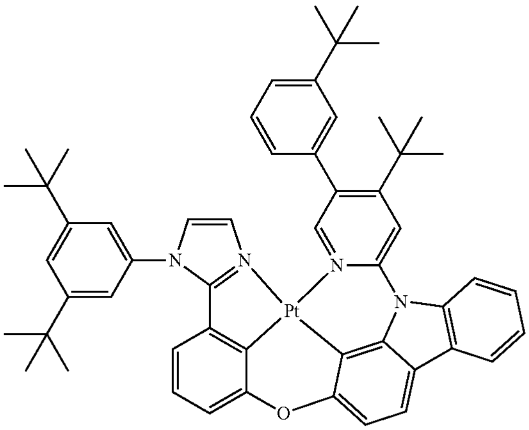
254
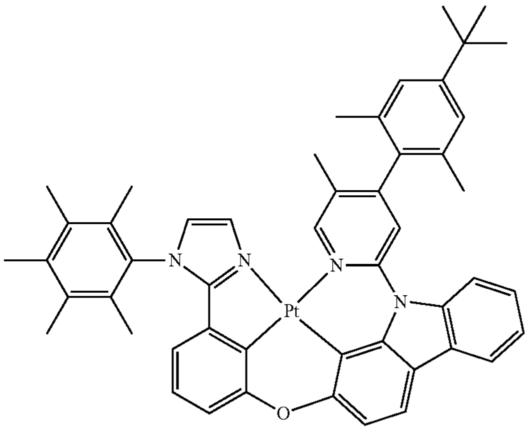

-continued
255
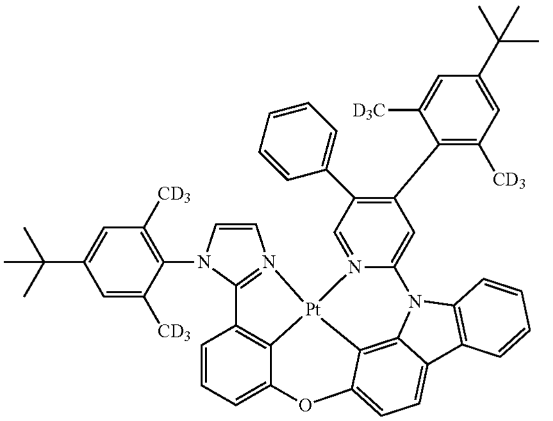
256
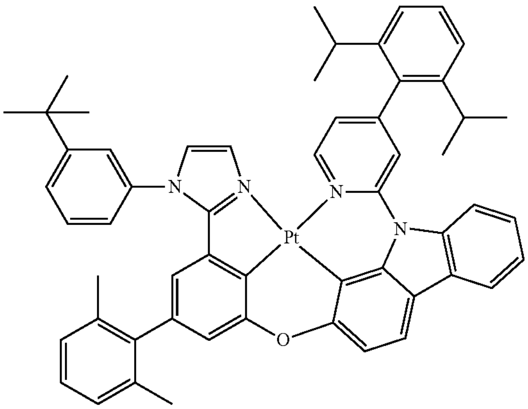
257
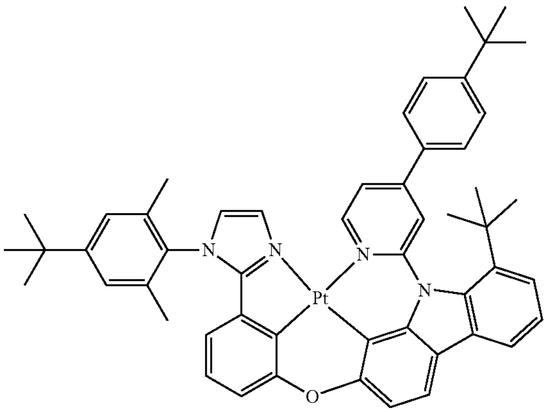
258
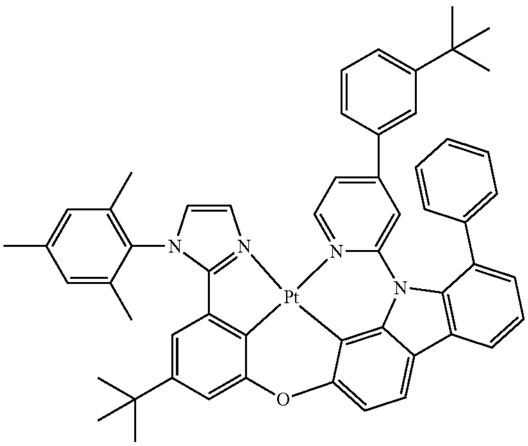
259
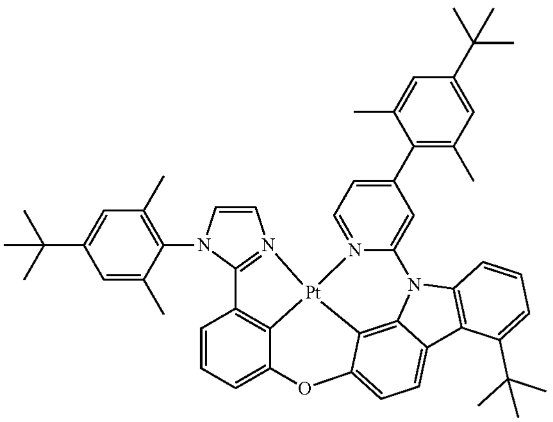
260
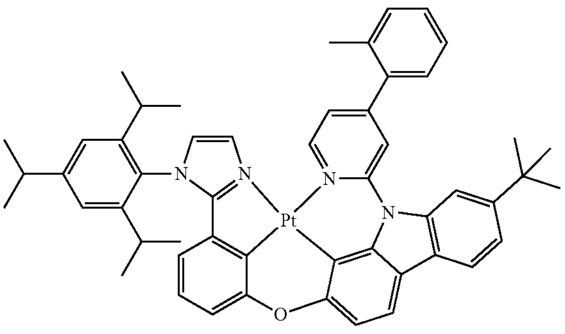

-continued
261
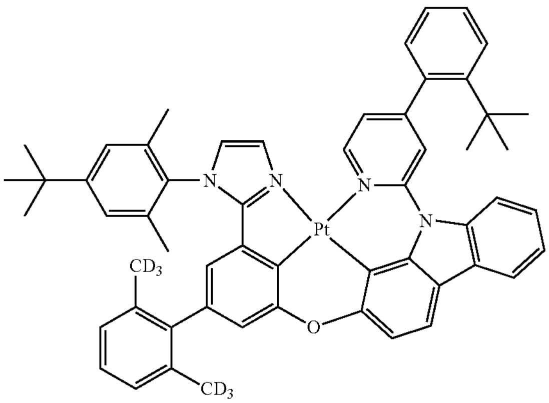
262
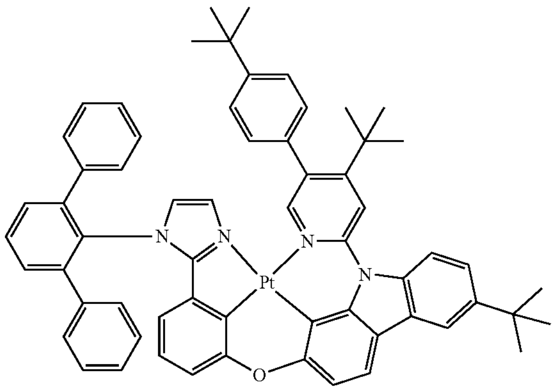
263
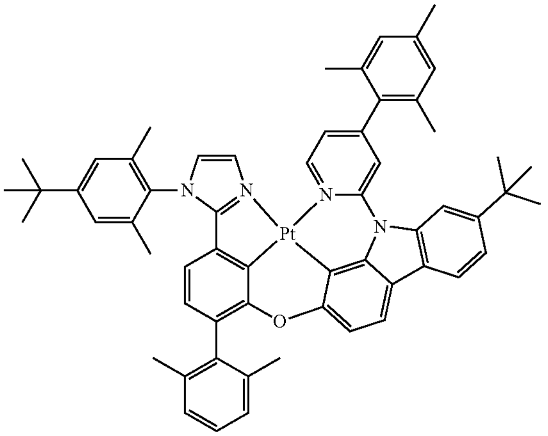
264
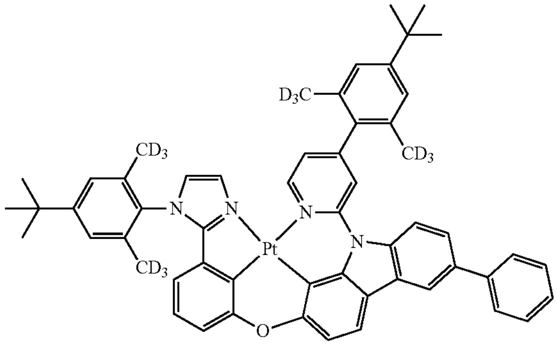
265
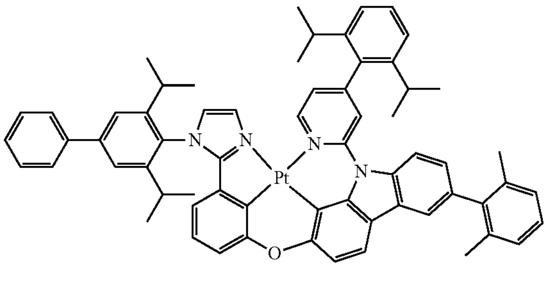
266
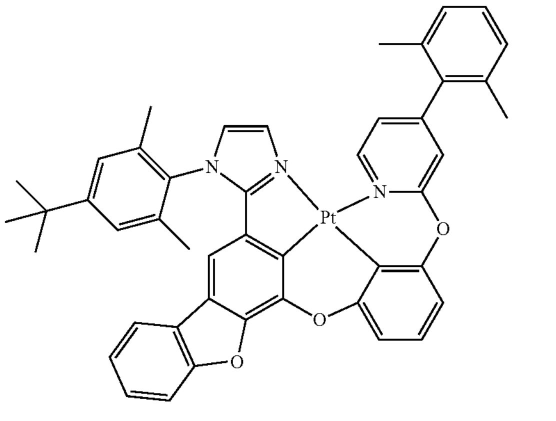

-continued
267
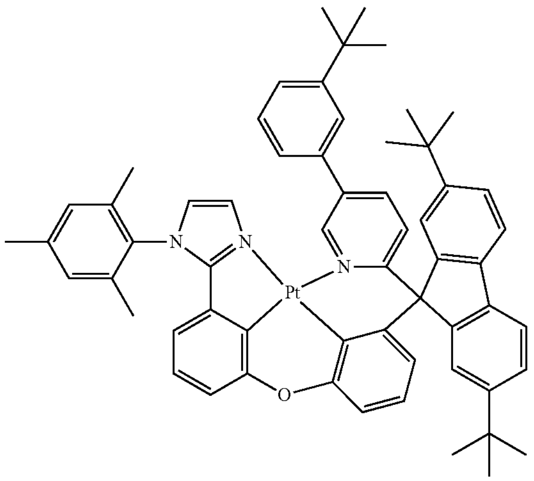
268
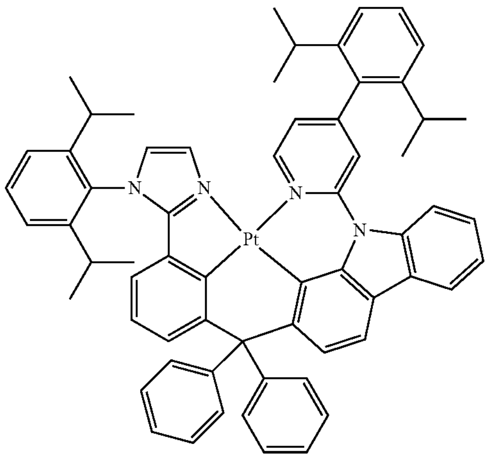
269
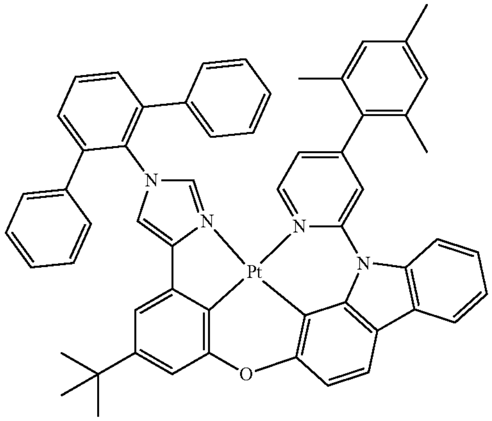
270
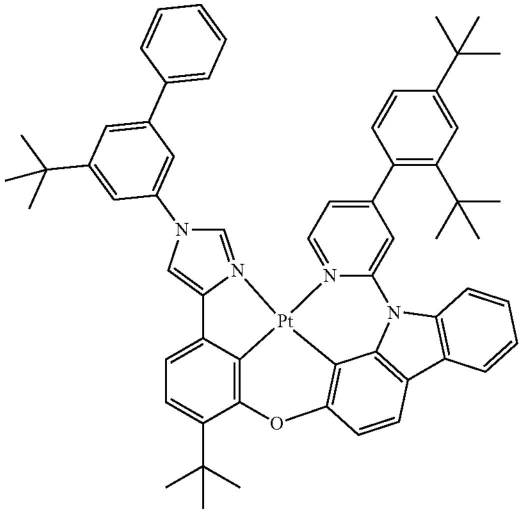
271
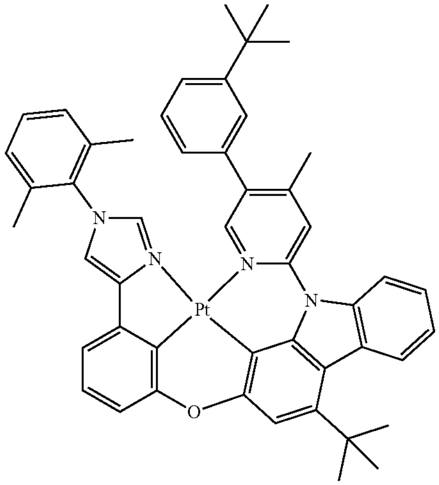
272
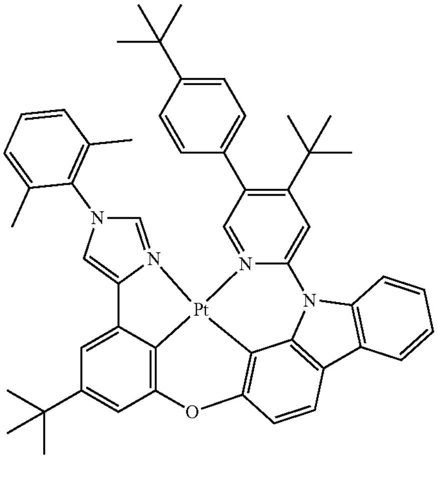

-continued
273
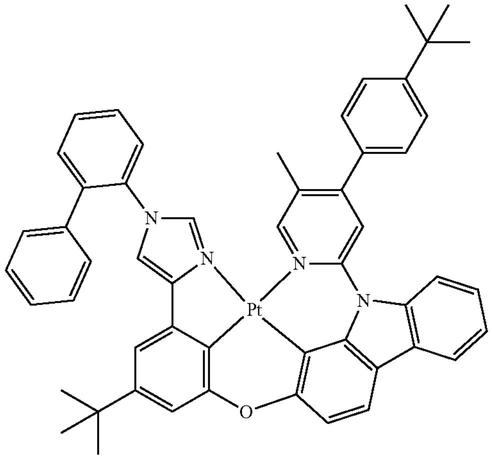
274
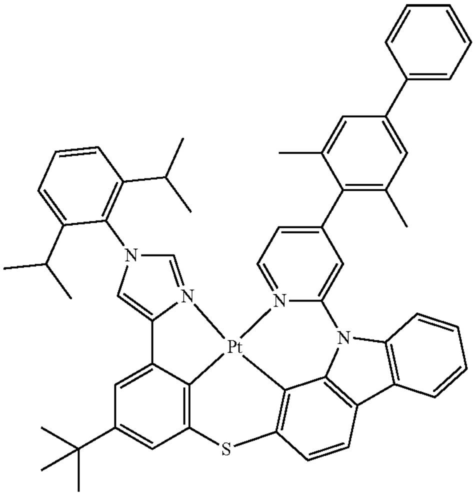
275
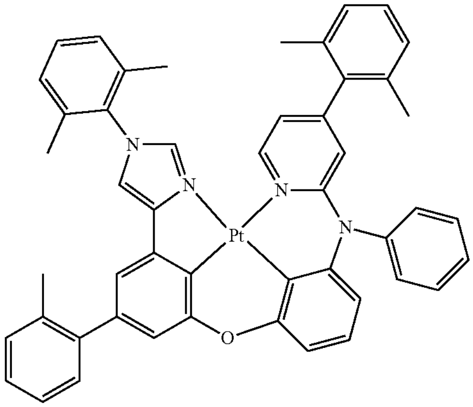
276
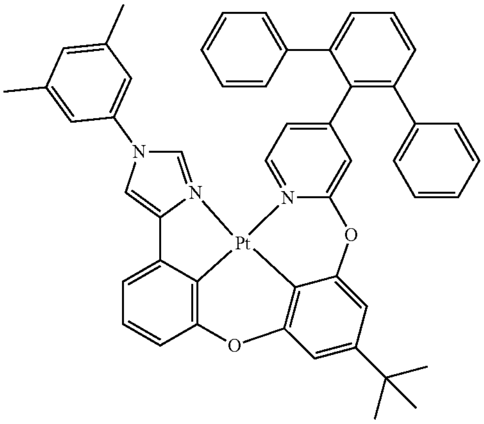
277
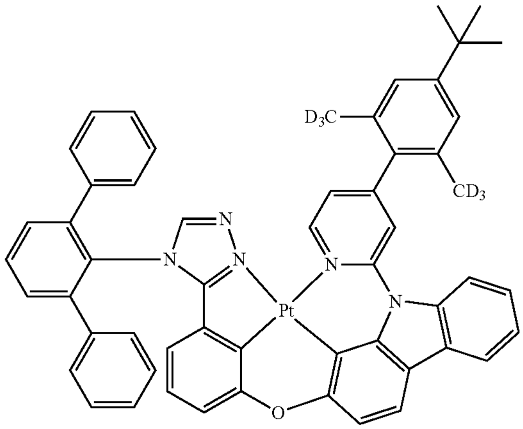
278
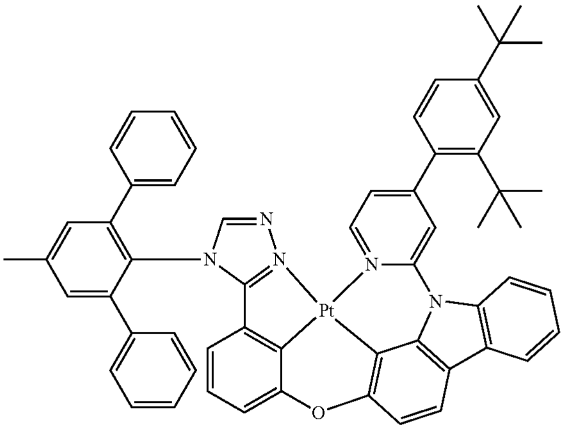

-continued
279
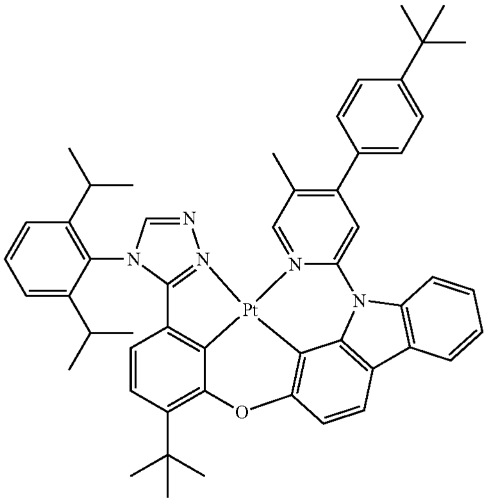
280
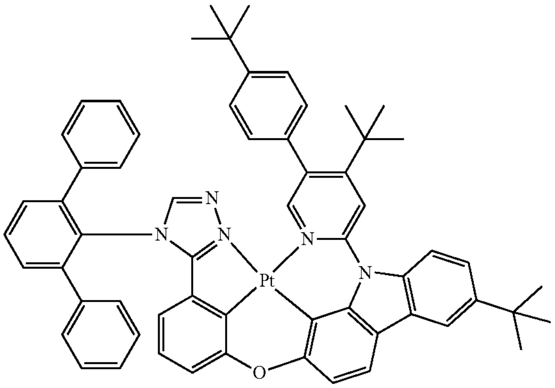
281
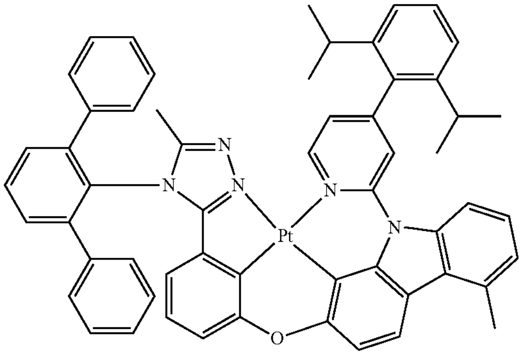
282
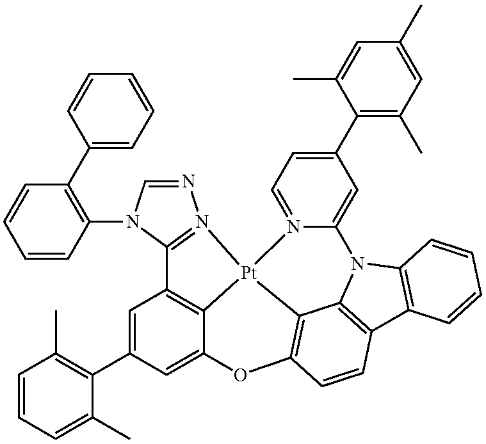
283
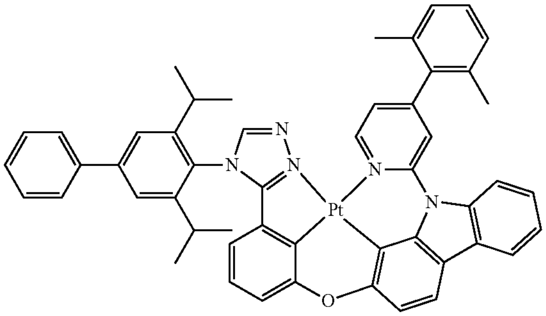
284
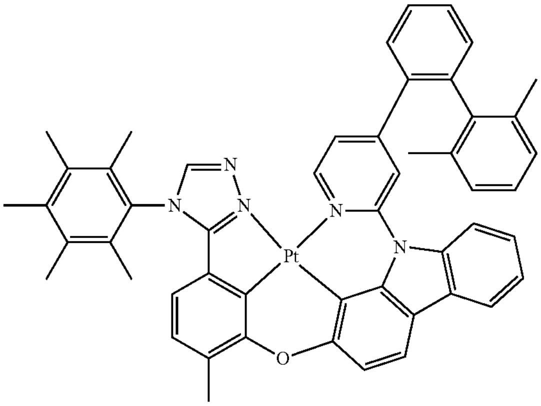

-continued
285
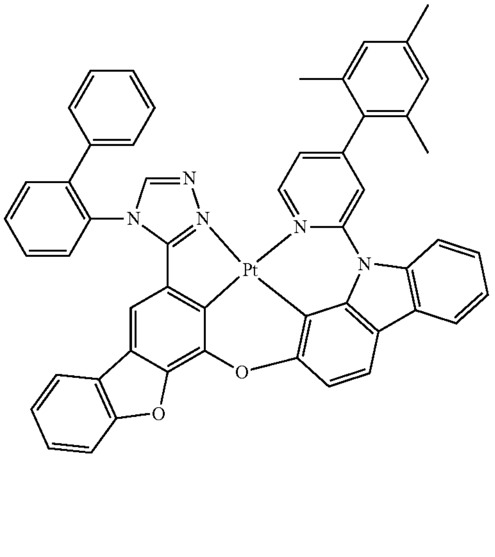
286
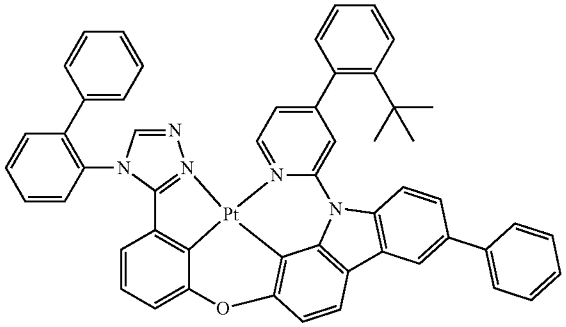
287
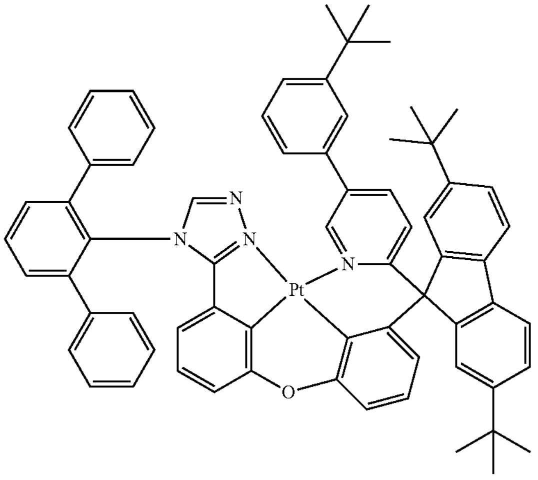
288
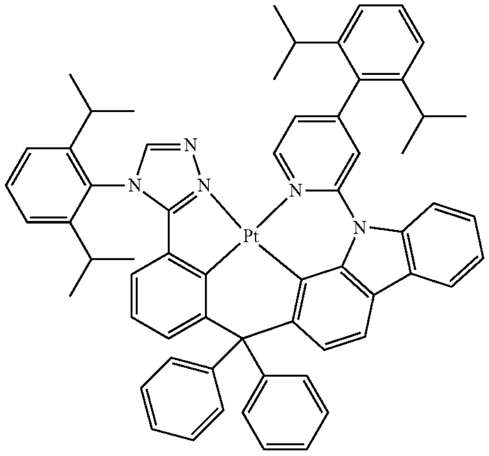
289
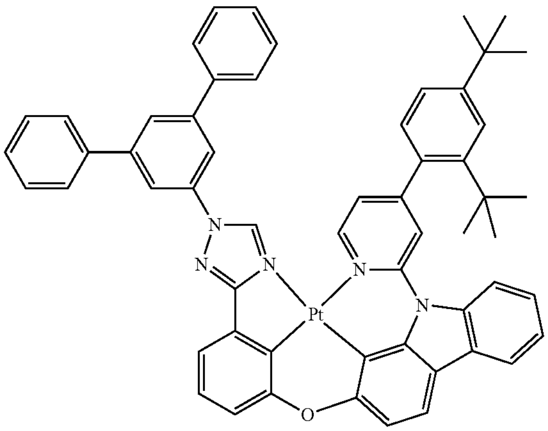
290
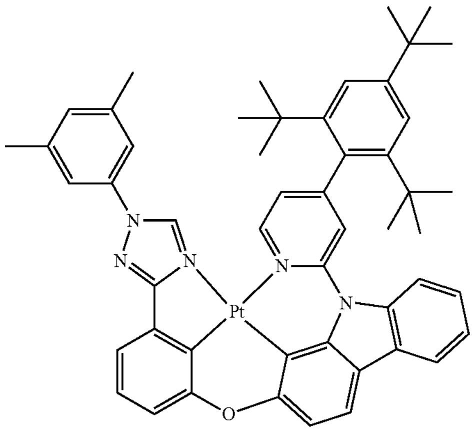

-continued
291
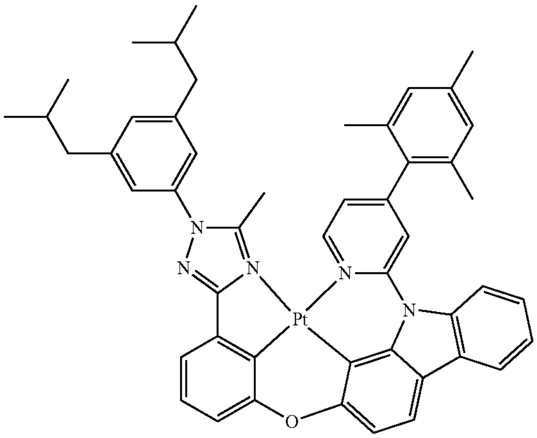
292
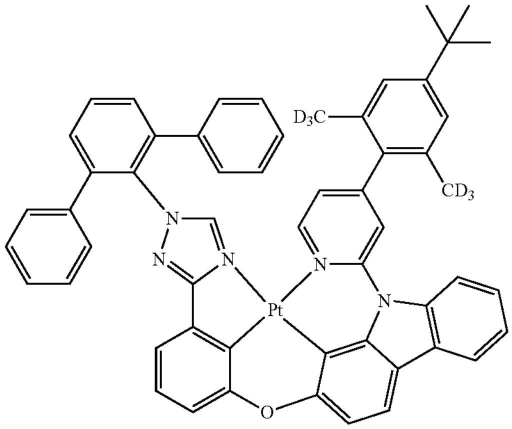
293
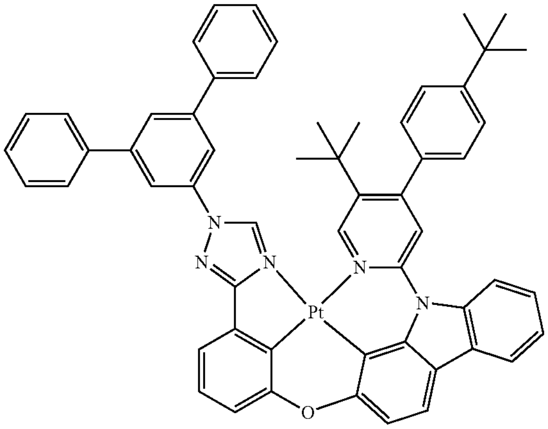
294
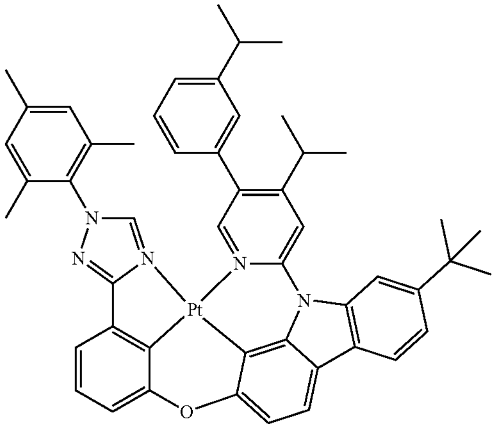
295
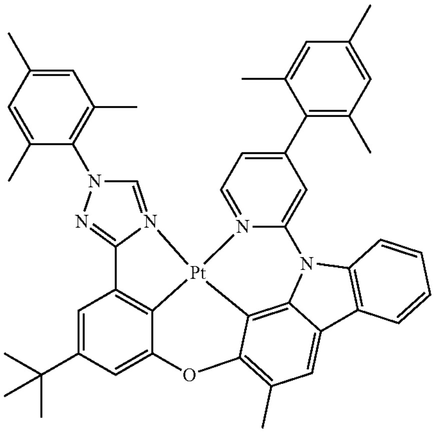
296
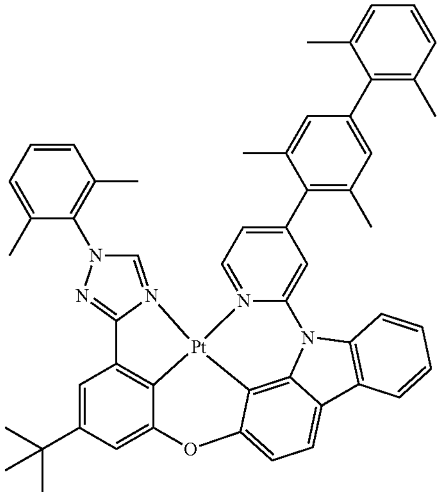

-continued
297
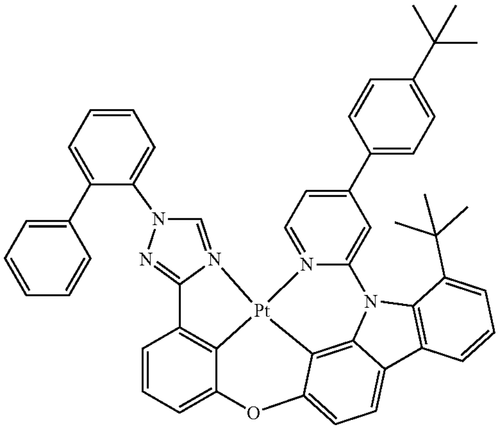
298
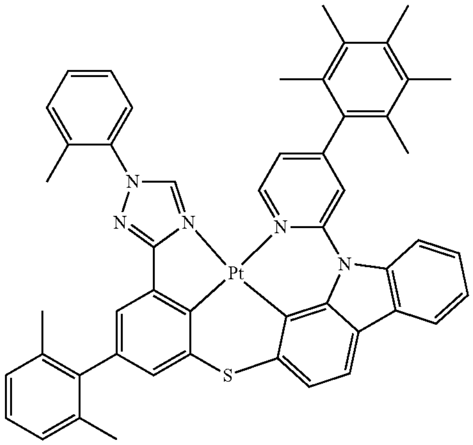
299
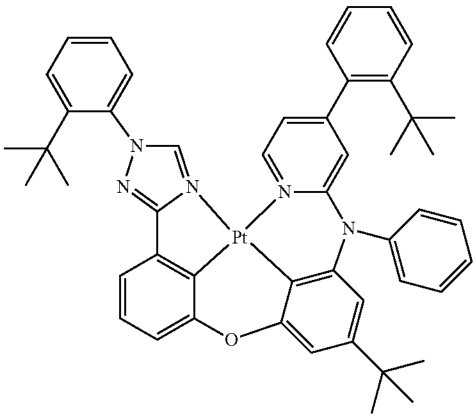
300
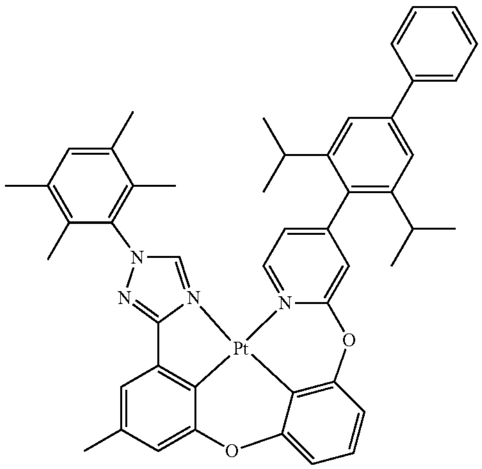
301
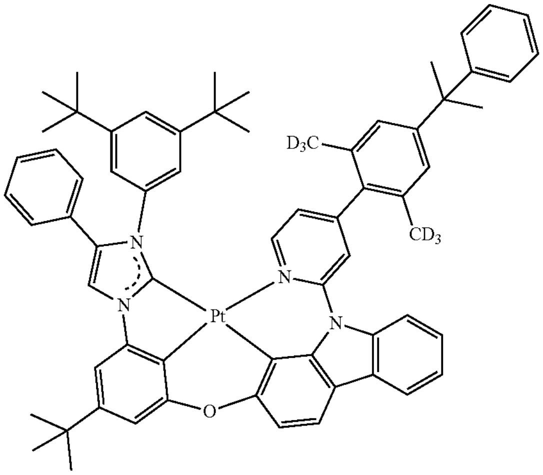
302
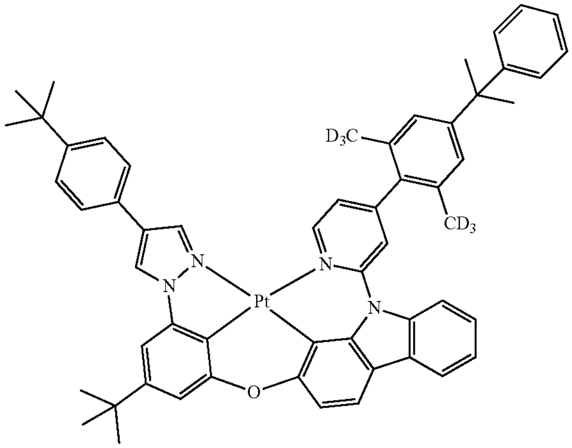

-continued
303
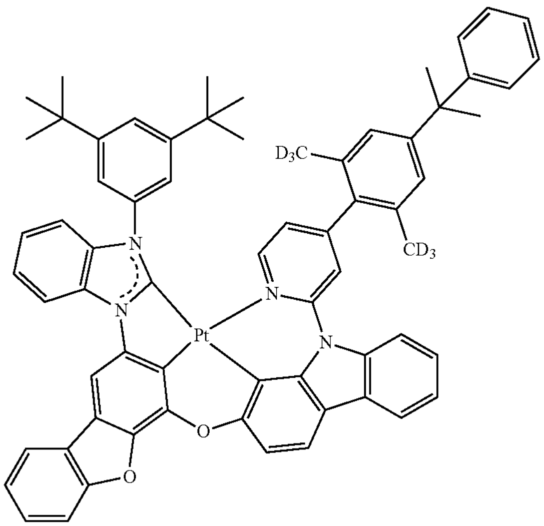
304
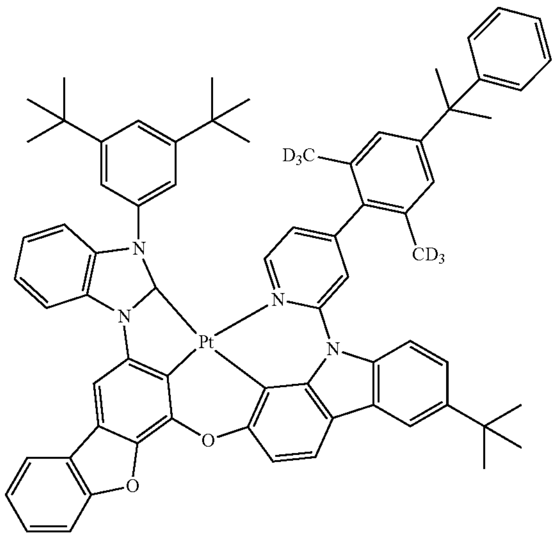
305
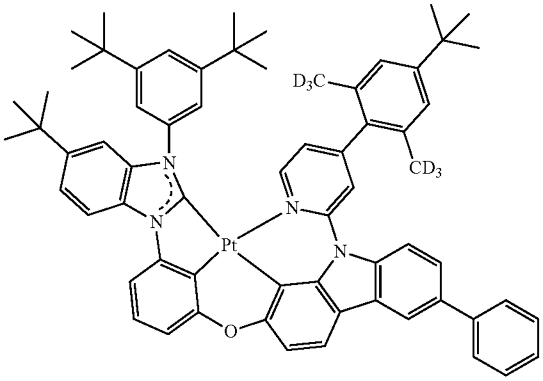
306
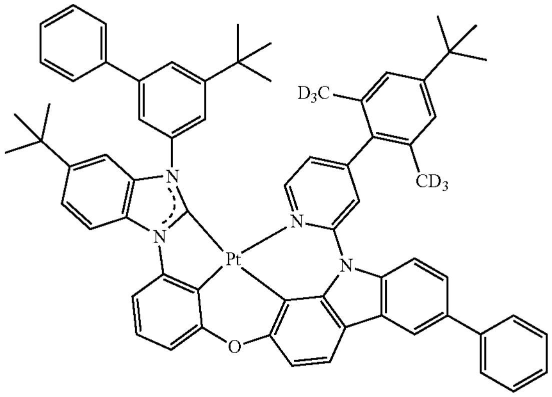
307
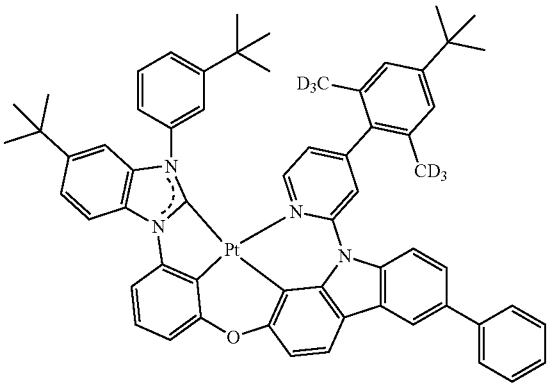
308
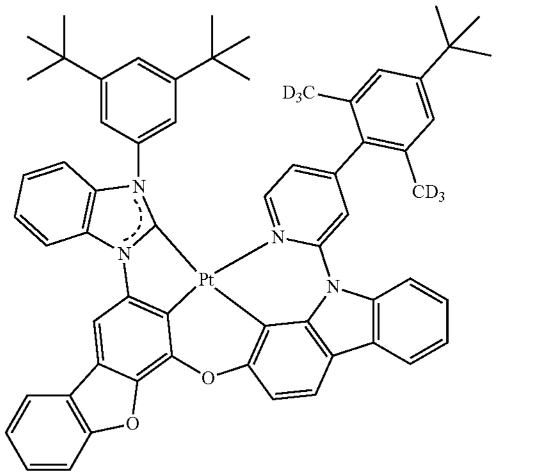

-continued
309
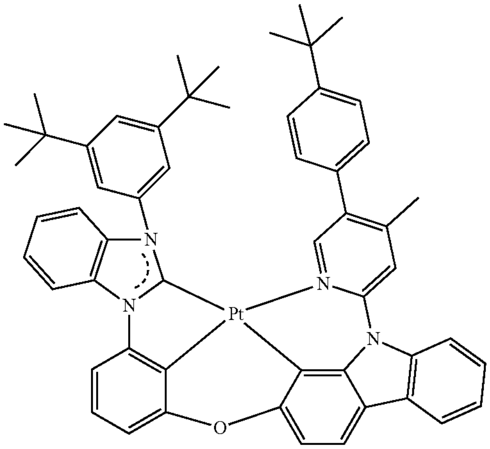
310
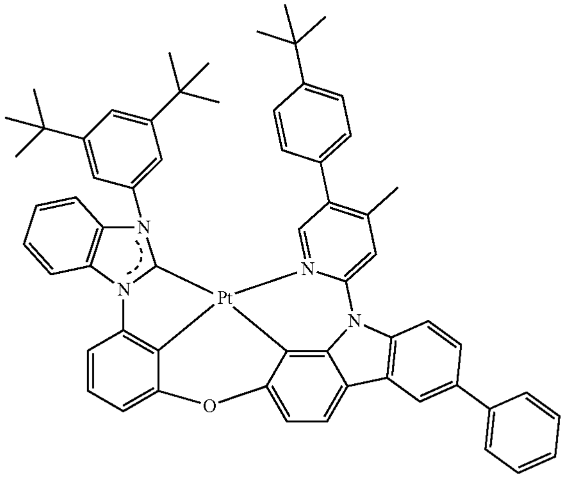
311
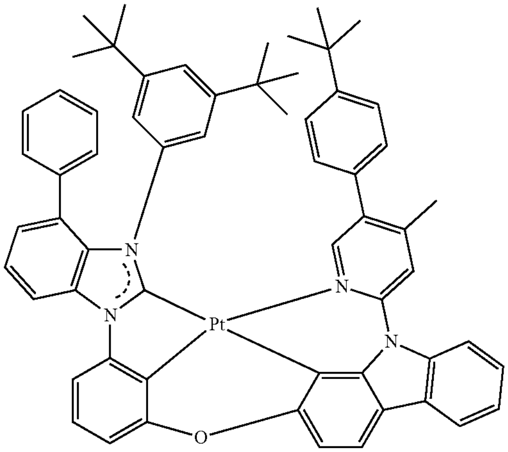
312
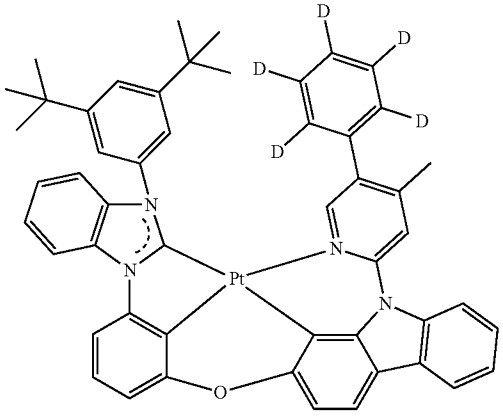
313
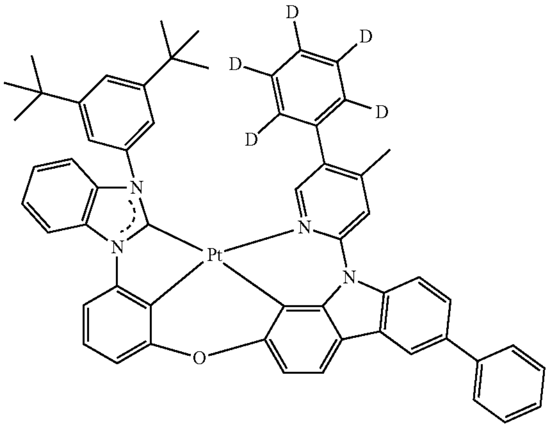
314
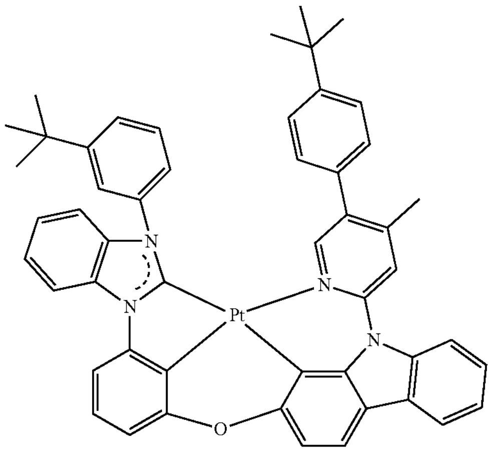

-continued
315
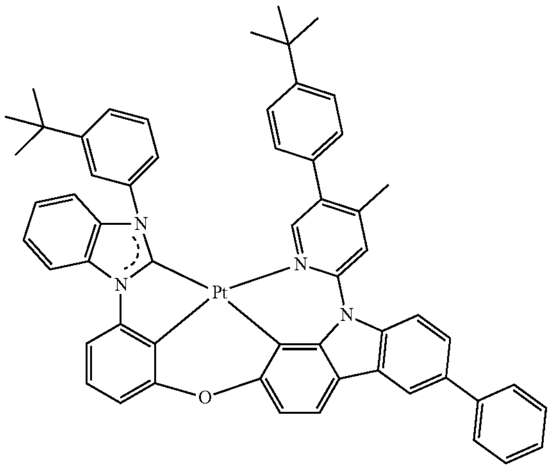
316
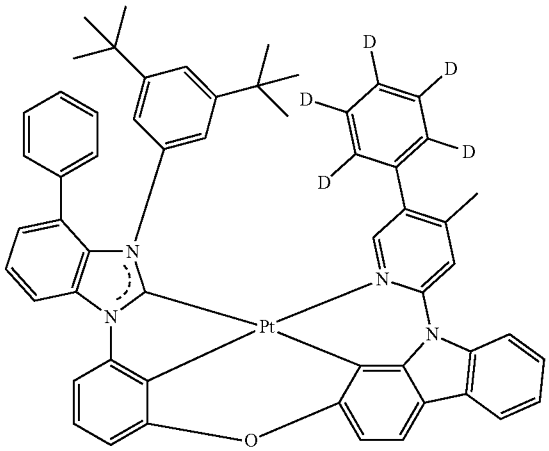
317
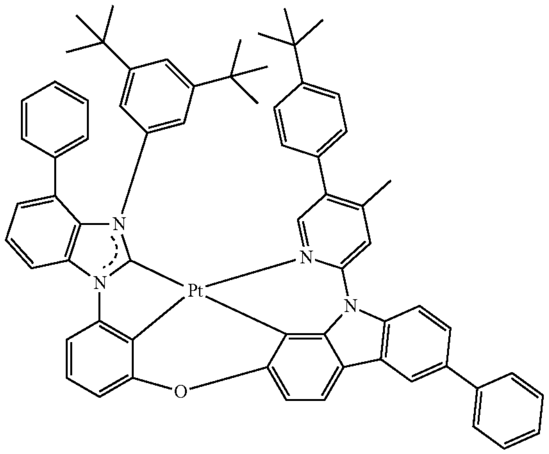
318
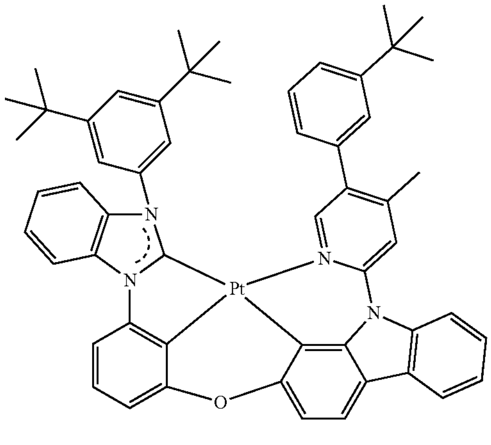
319
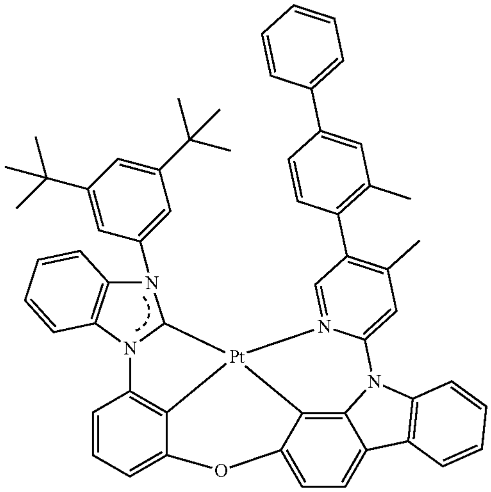
320
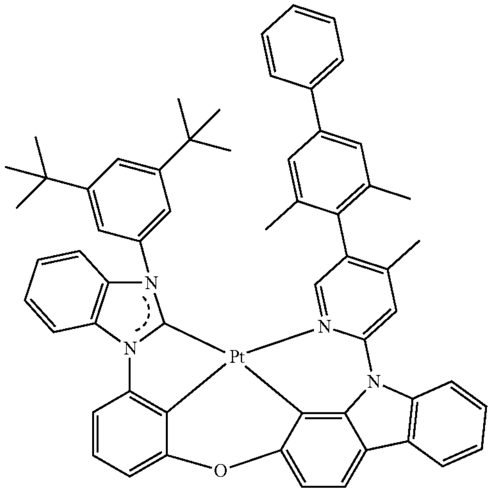

-continued
321
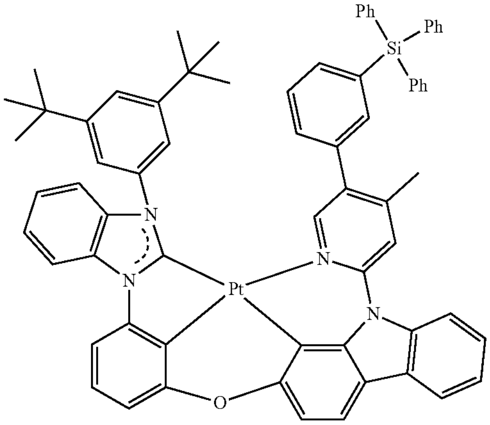
322
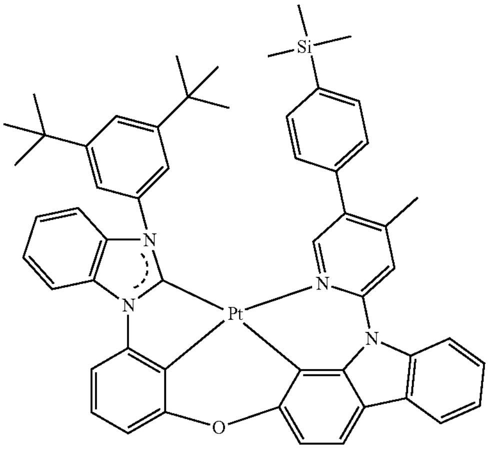
323
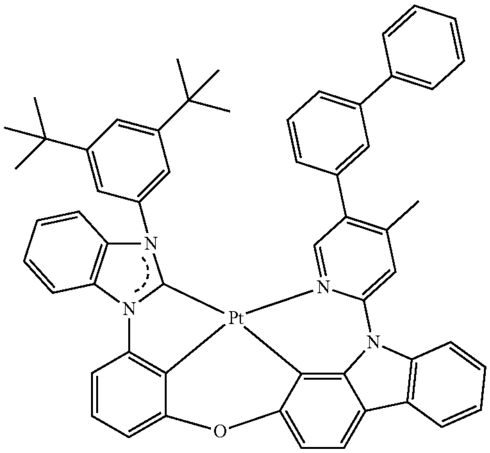
324
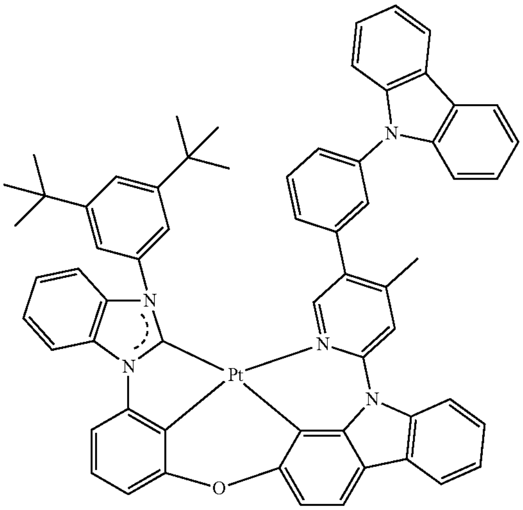
325
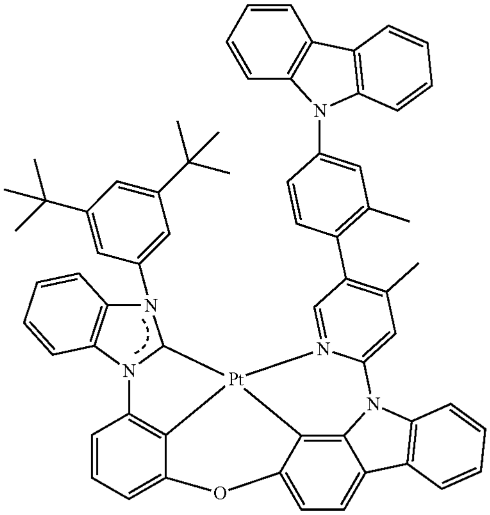
326
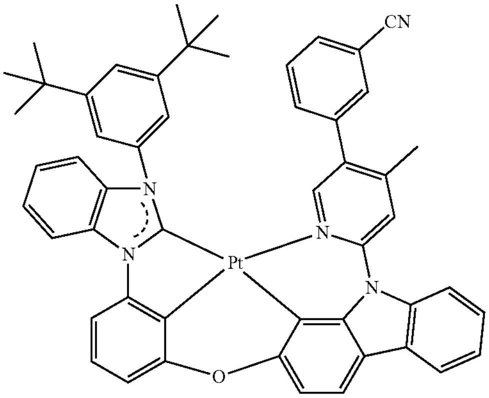

-continued
327
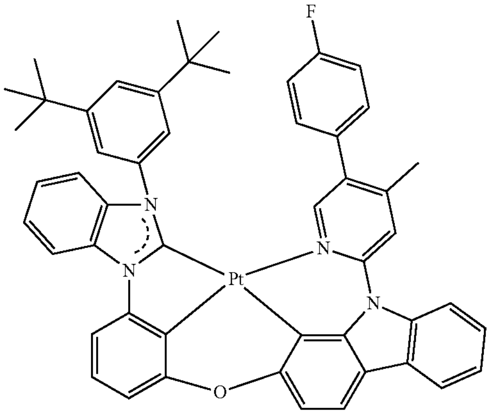
328
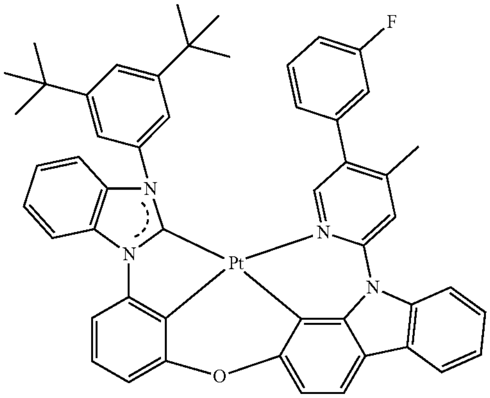
329
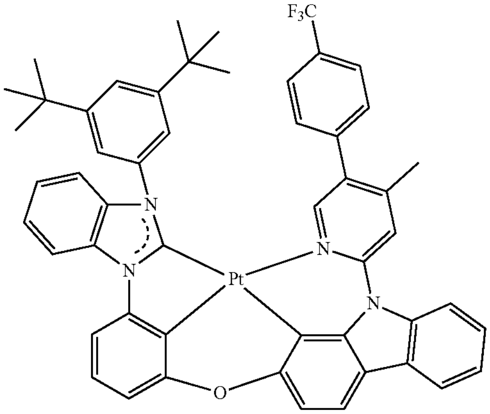
330
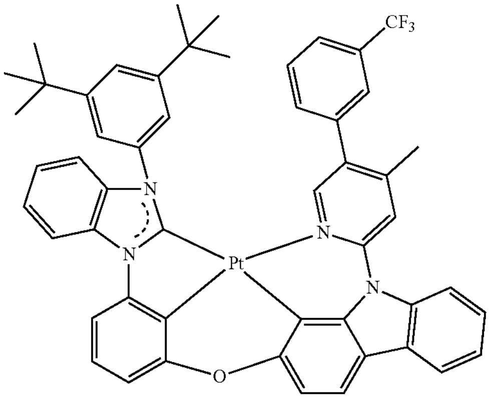
331
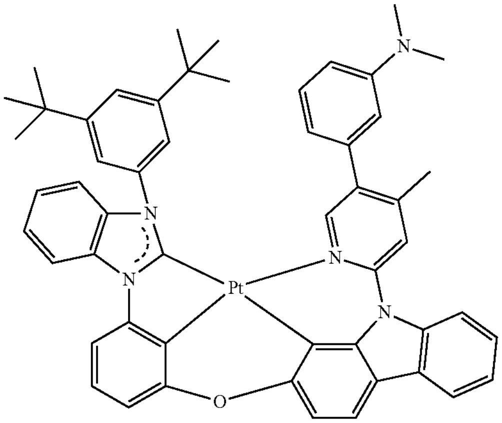
332
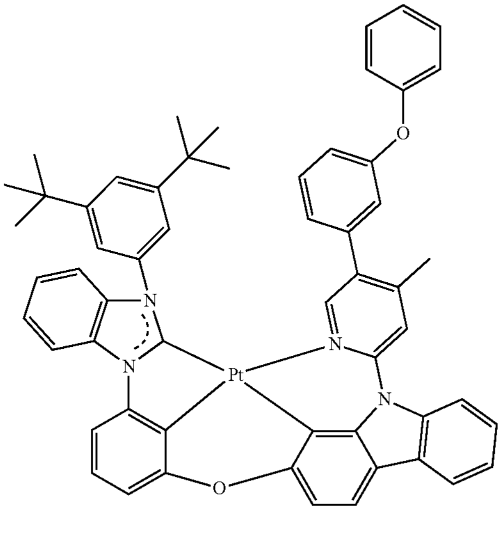

-continued
333
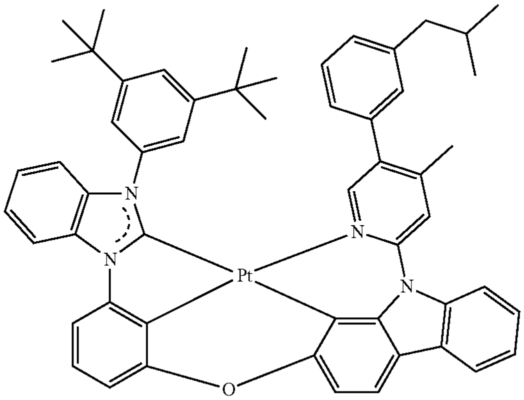
334
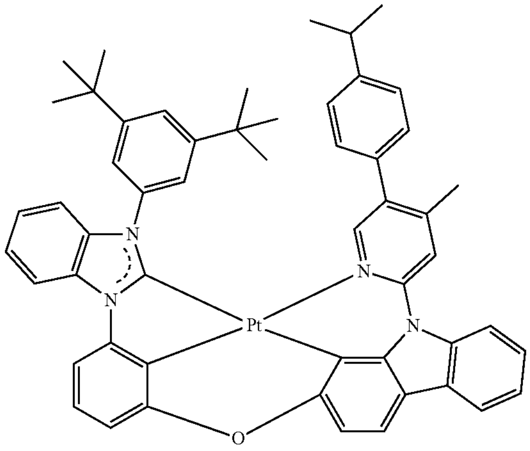
335
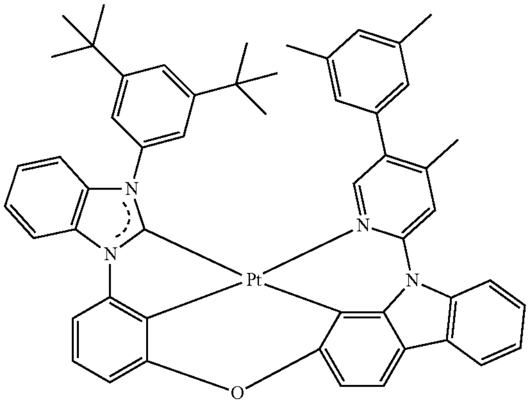
336
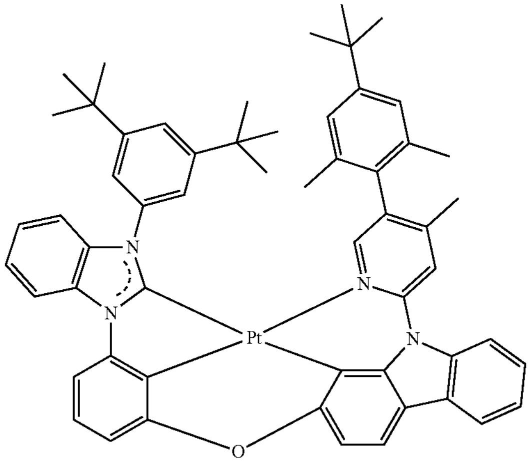
337
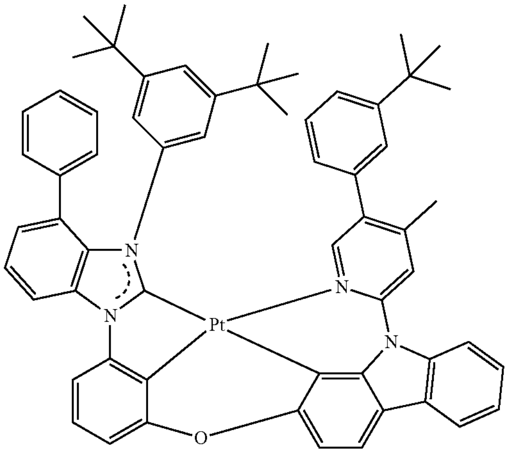
338
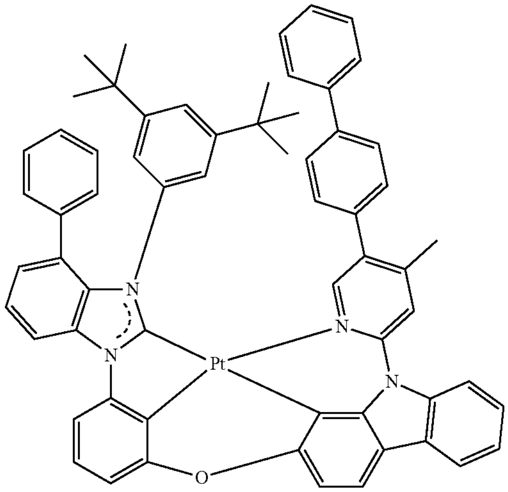

-continued
339
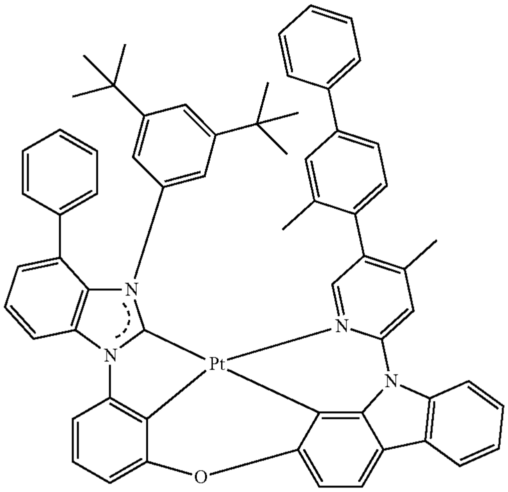
340
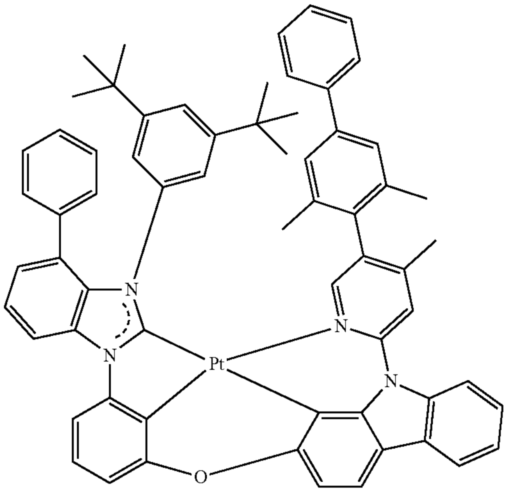
341
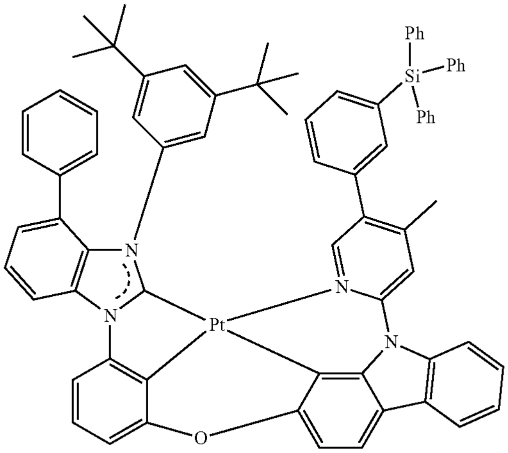
342
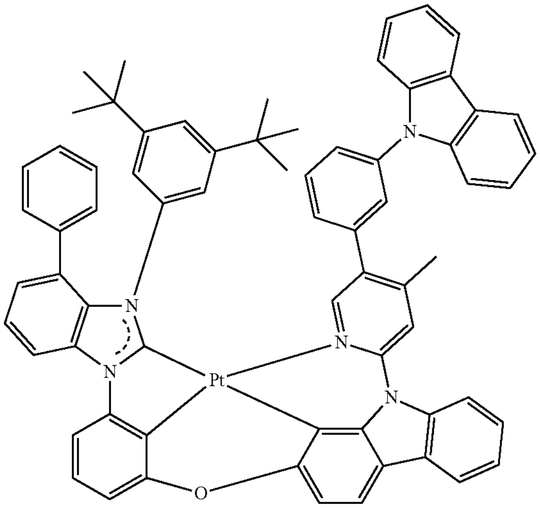
343
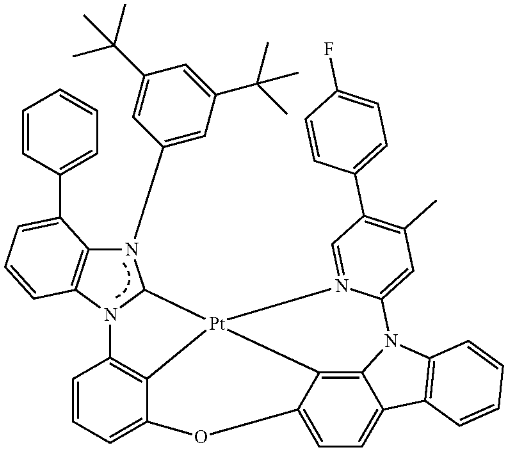
344
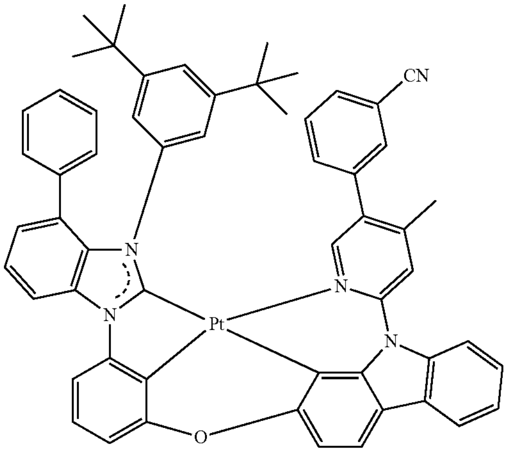

-continued
345
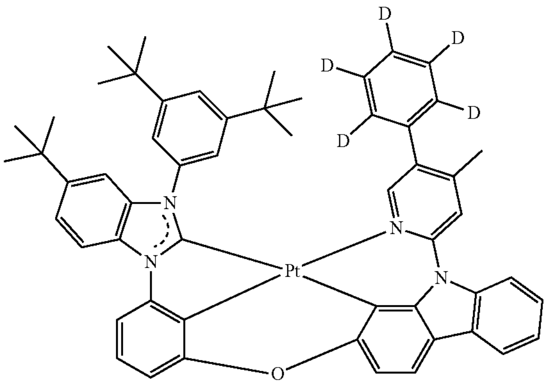
346
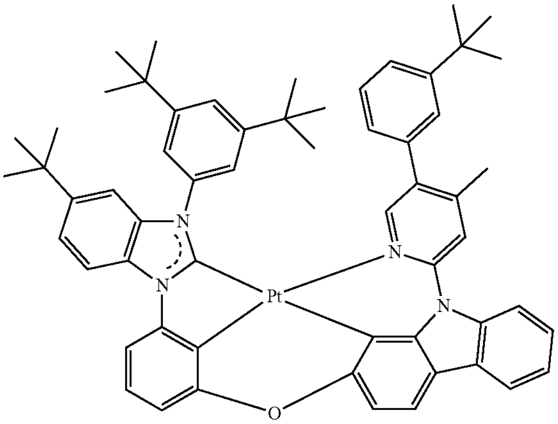
347
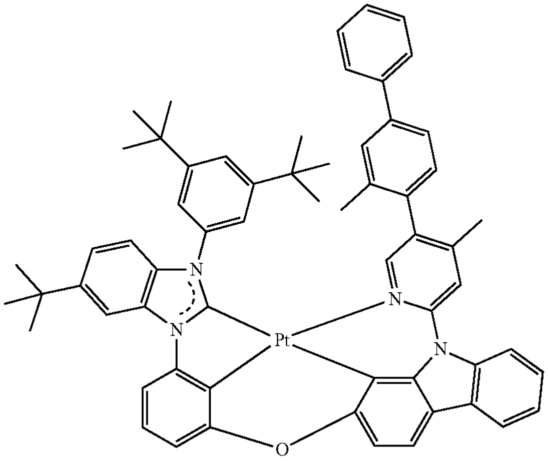
348
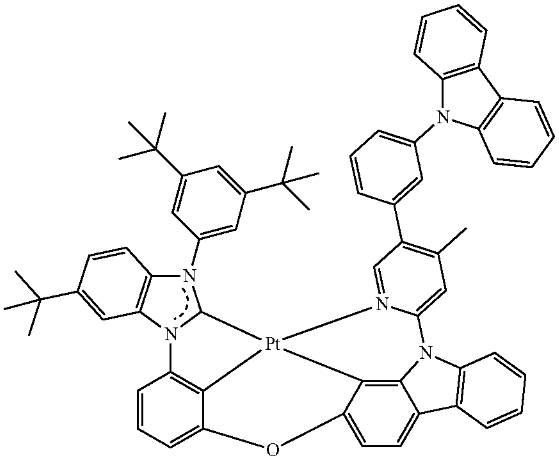
349
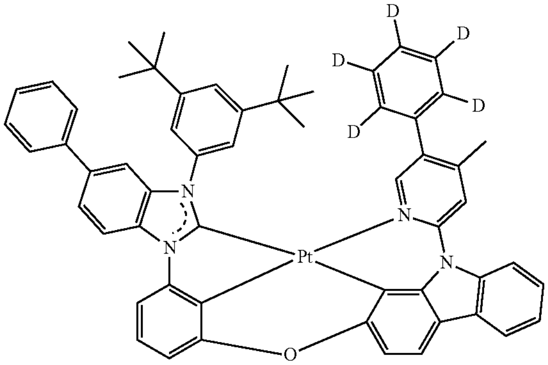
350
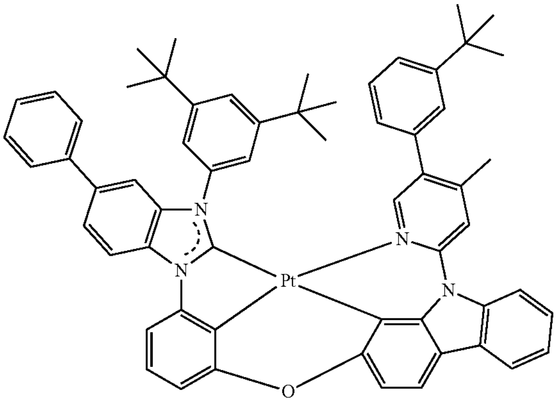

-continued
351
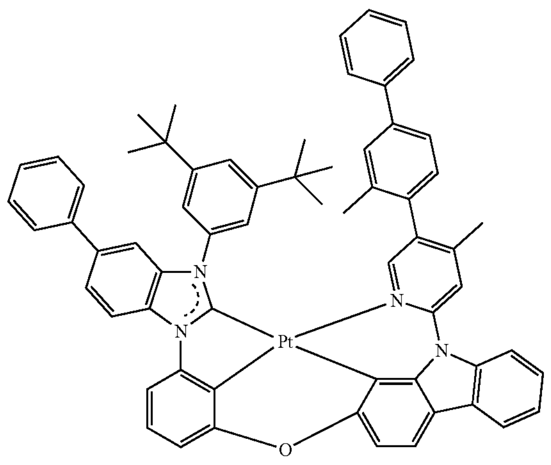
352
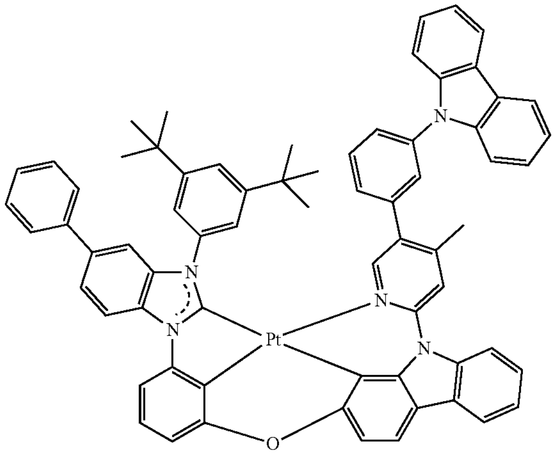
353
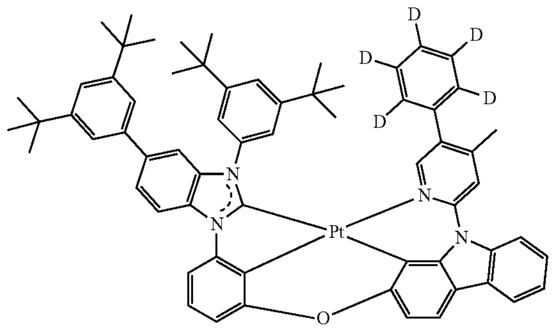
354
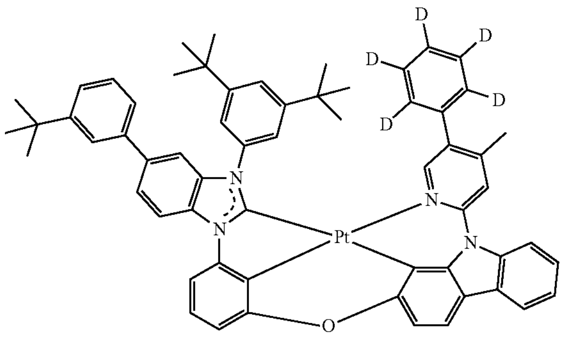
355
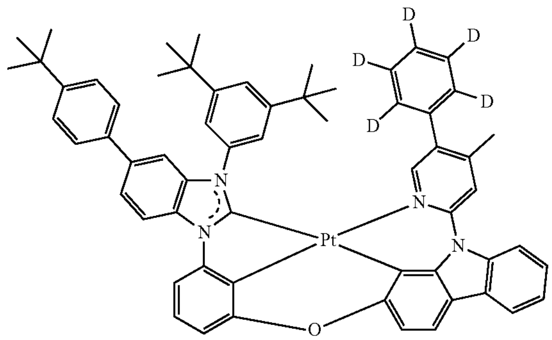
356
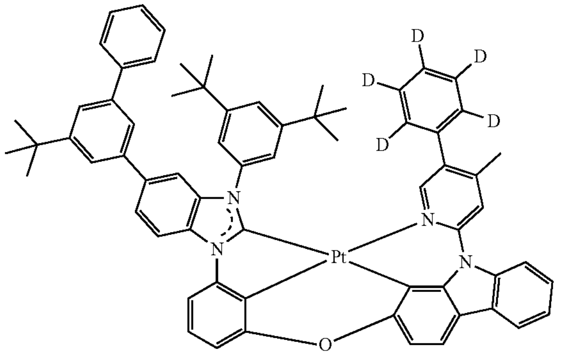
357
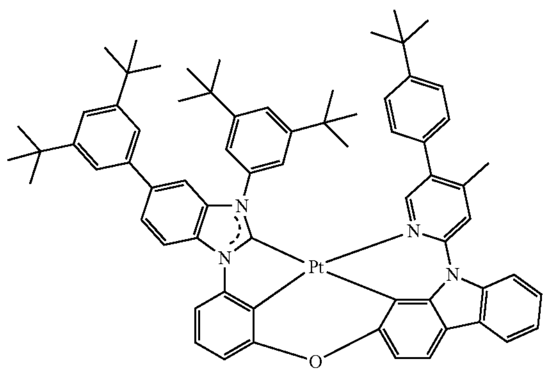
358
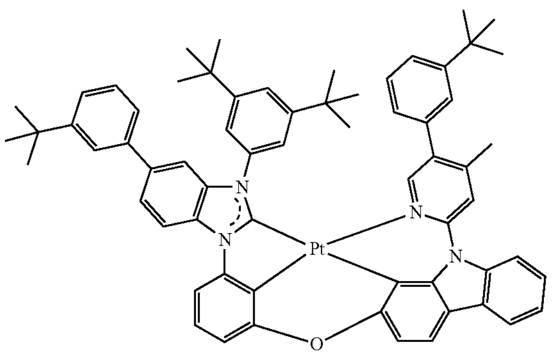

-continued
359
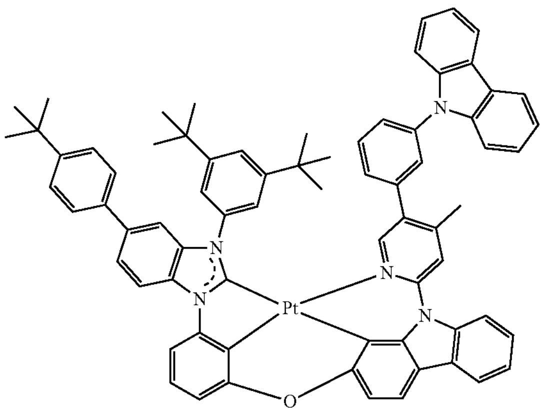
360
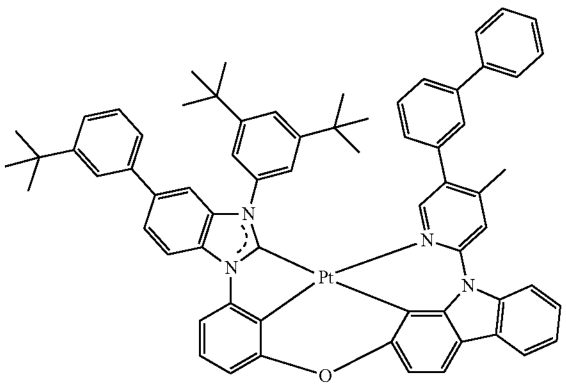
361
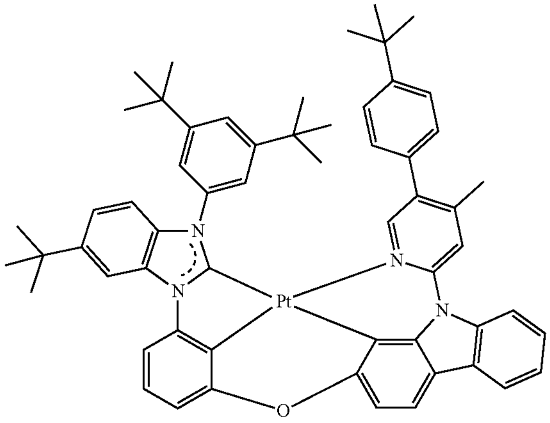
362
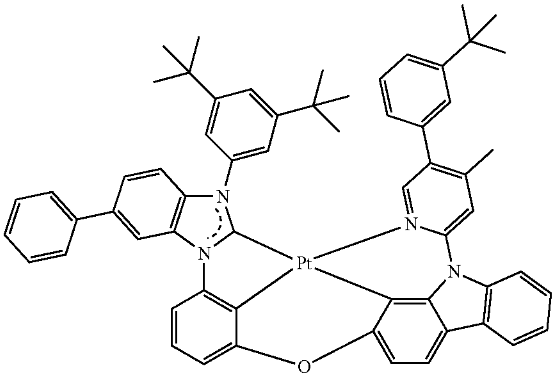
363
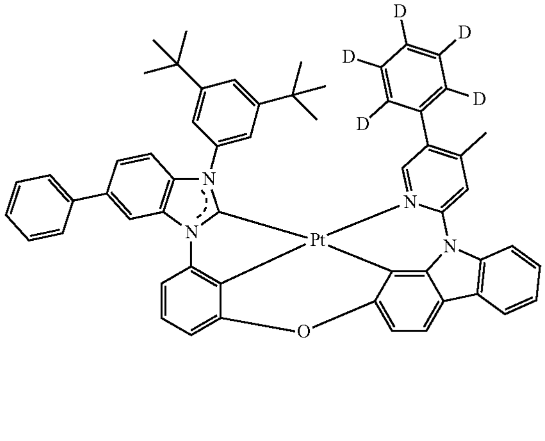
364
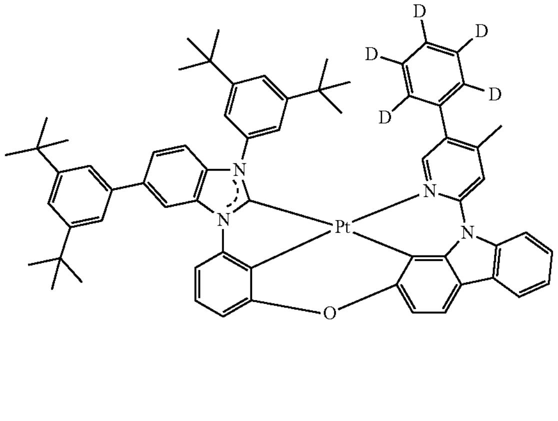

-continued
365
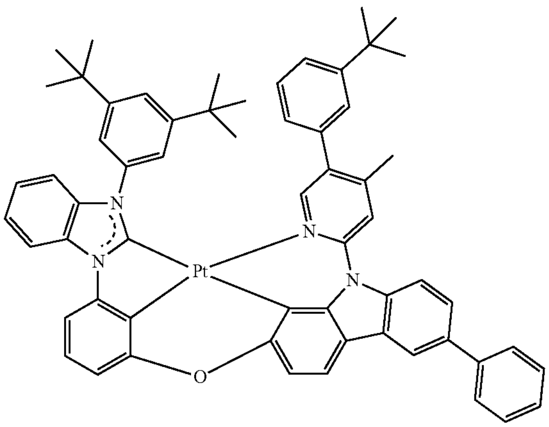
366
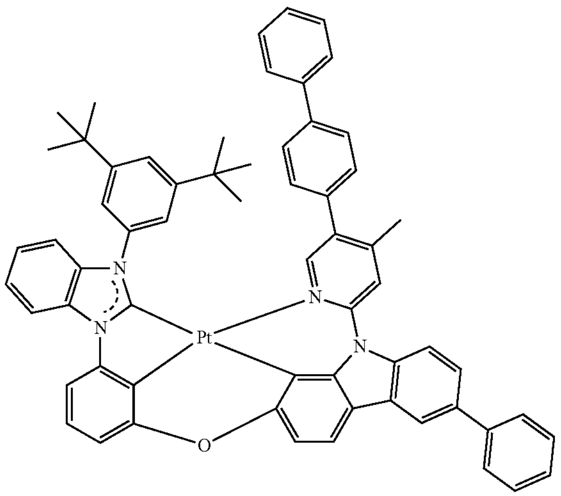
367
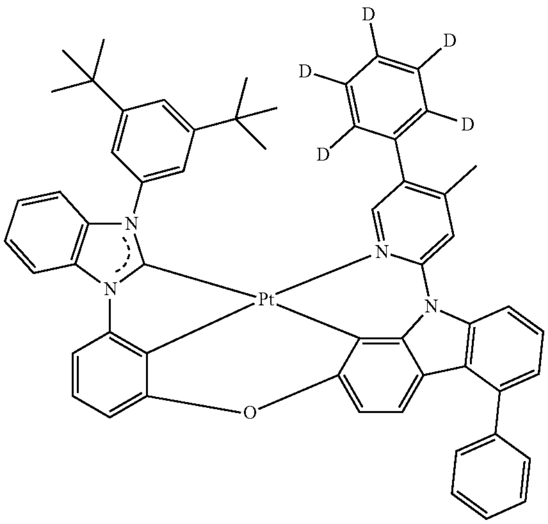
368
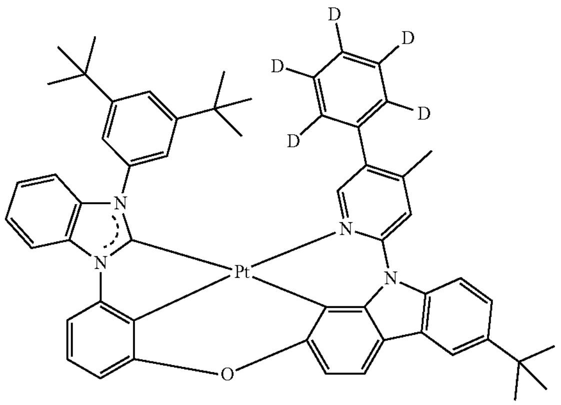
369
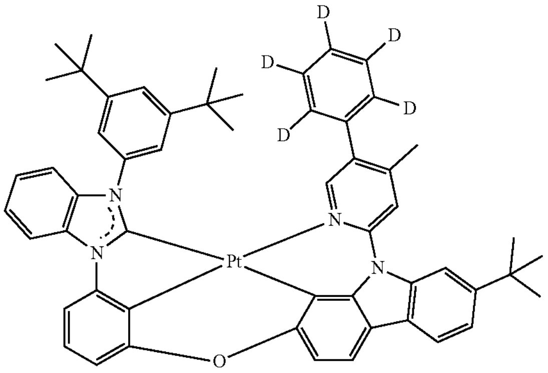
370
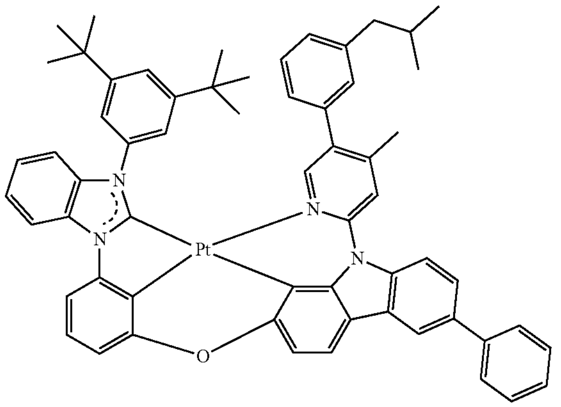

-continued
371
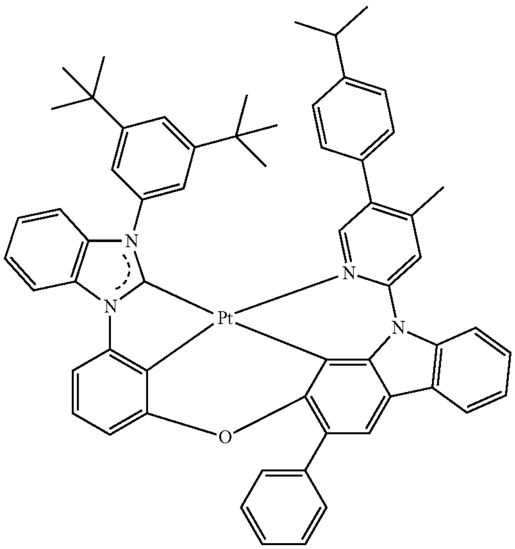
372
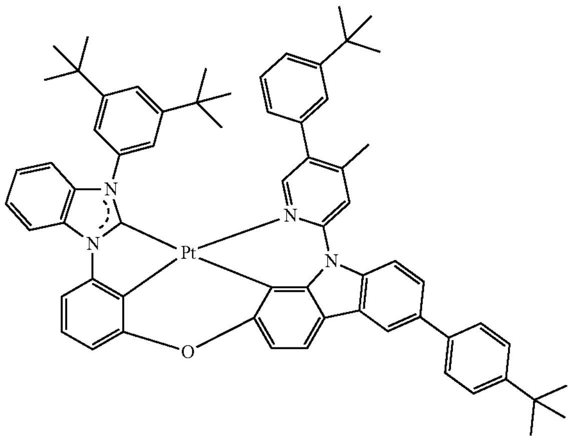
373
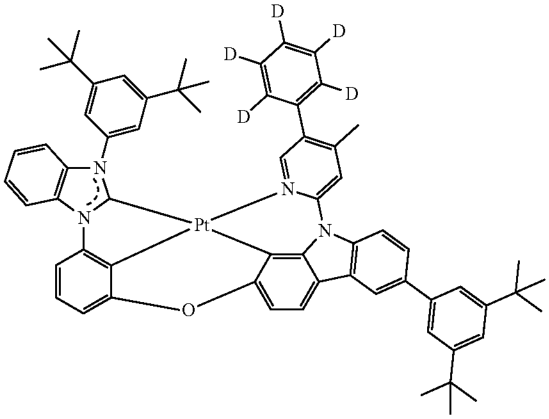
374
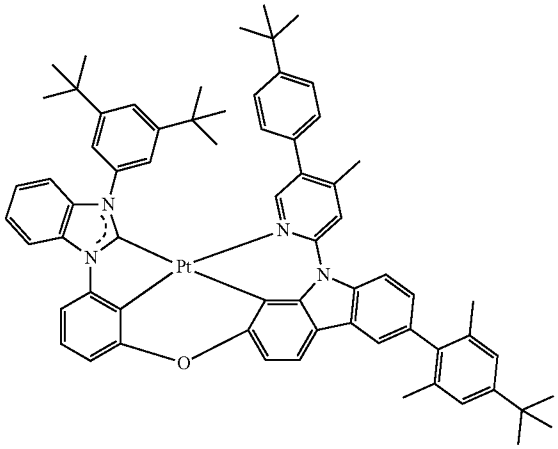
375
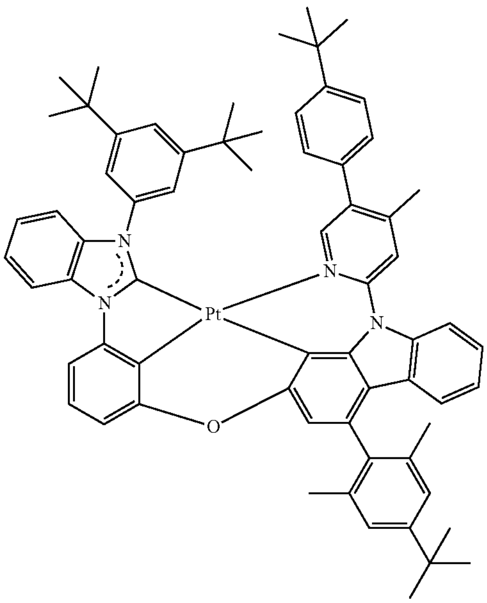
376
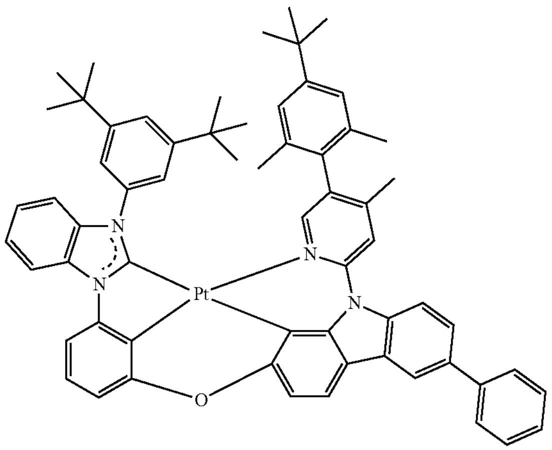

-continued
377
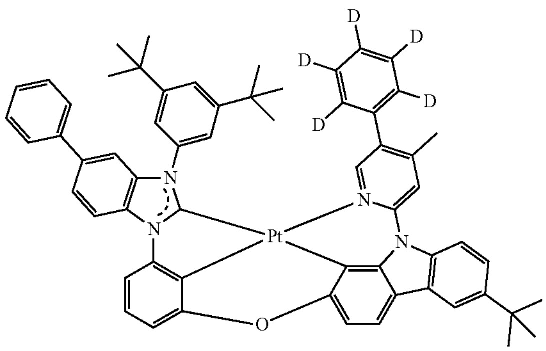
378
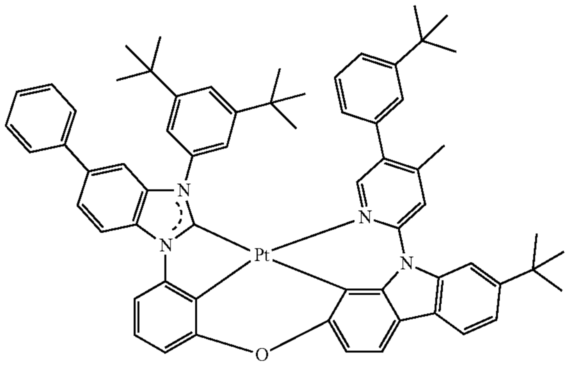
379
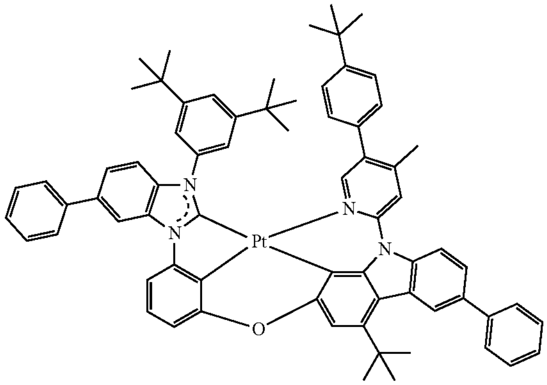
380
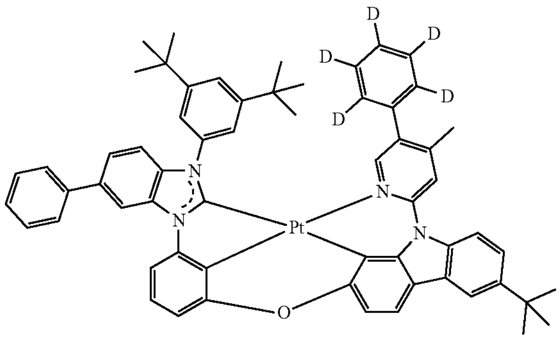
381
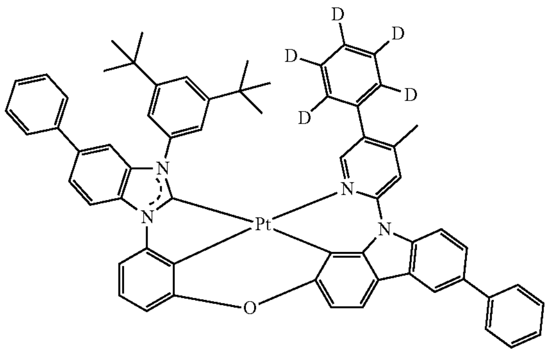
382
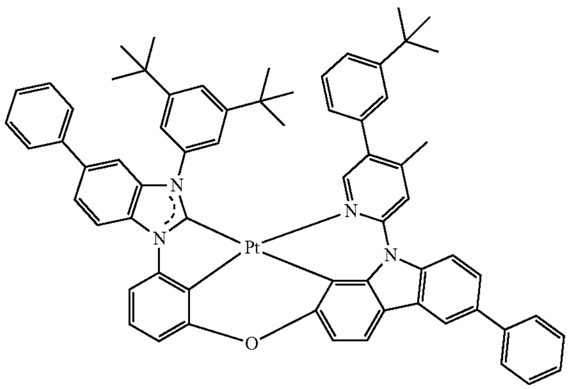

-continued
383
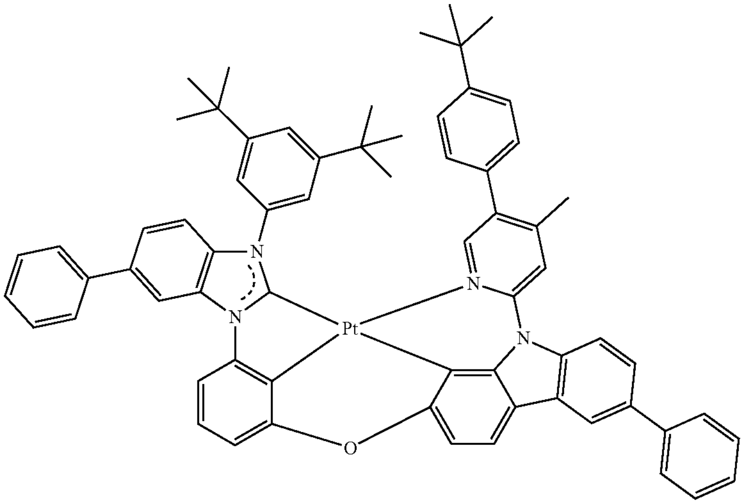
384
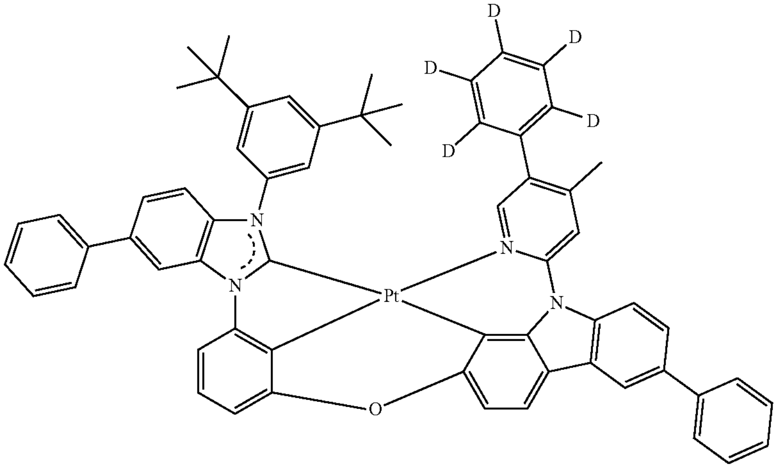
385
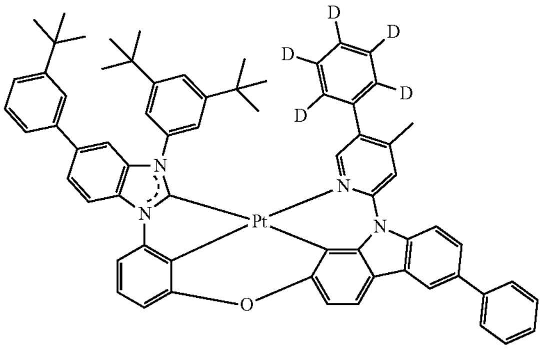
386
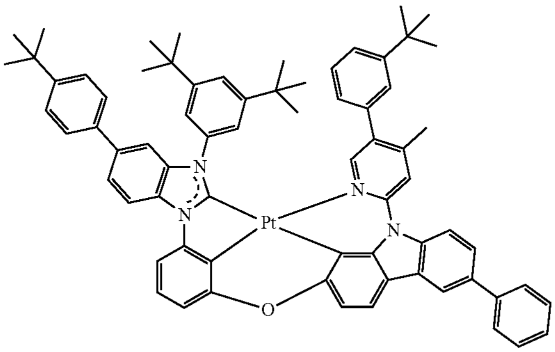

-continued
387
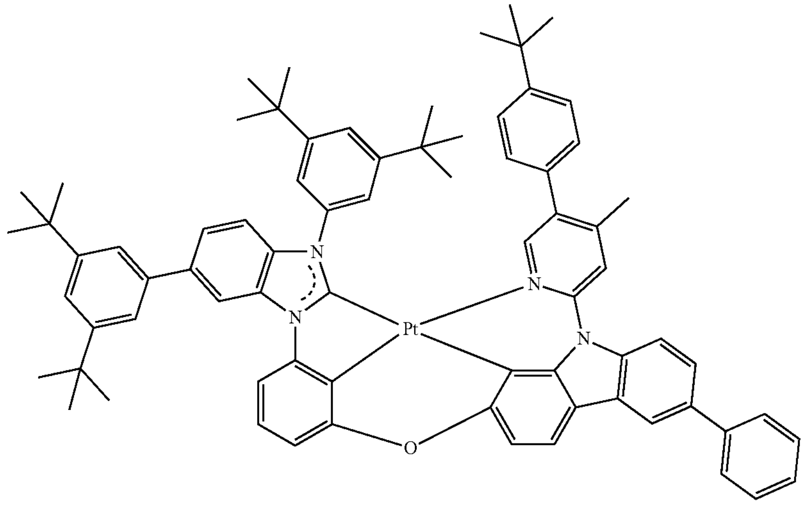
388
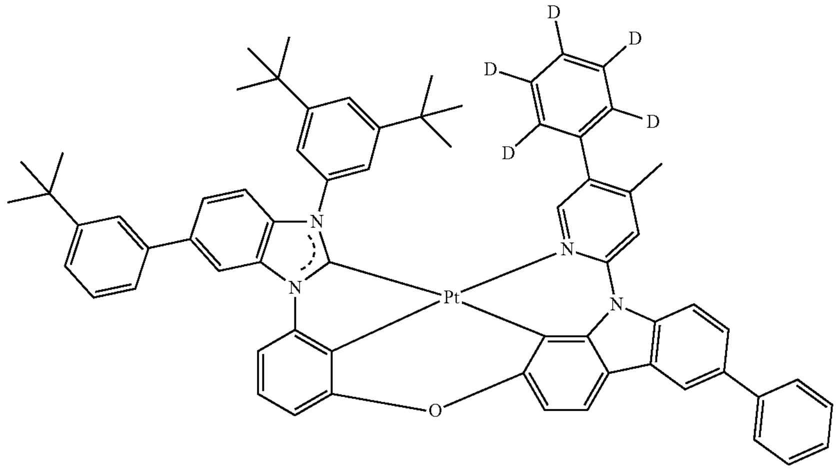
389
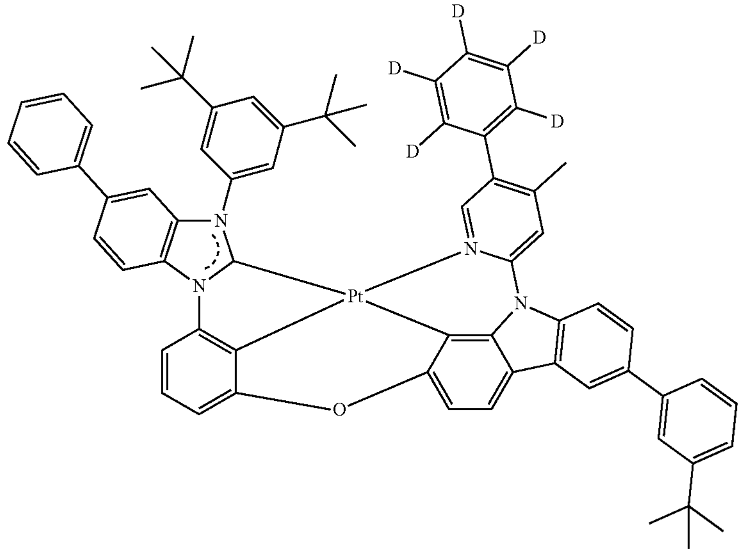

-continued
390
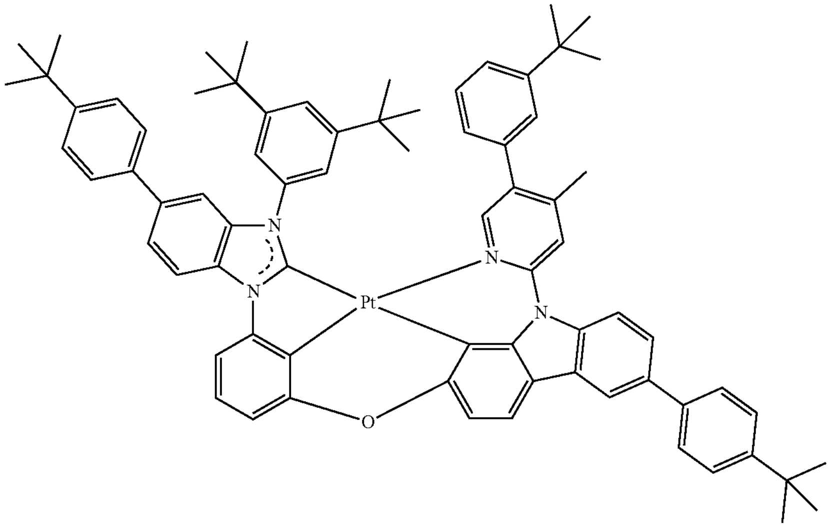
391
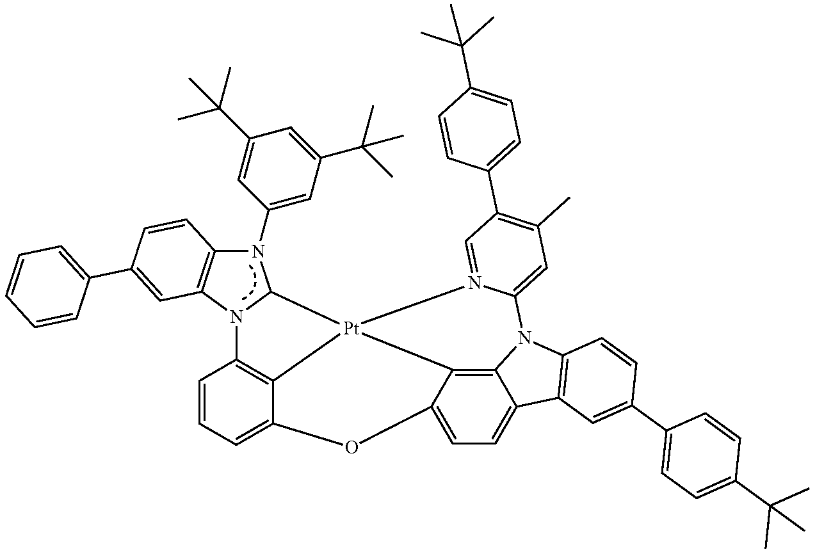
392
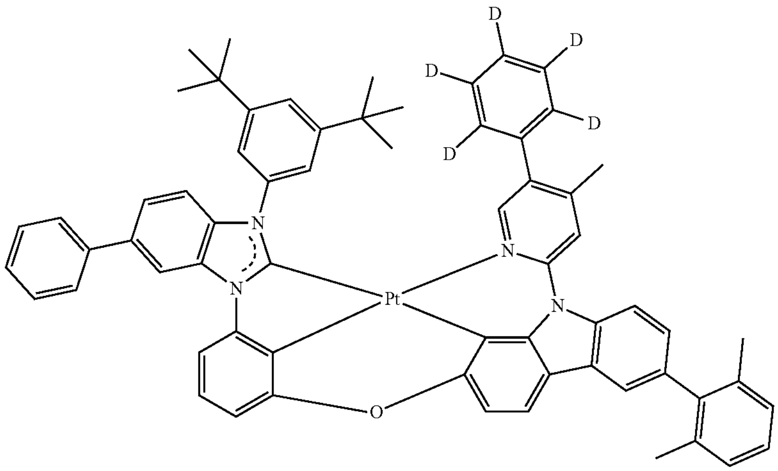

-continued
393
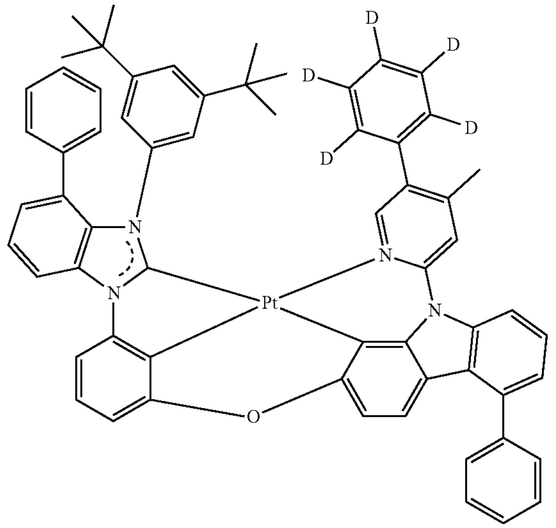
394
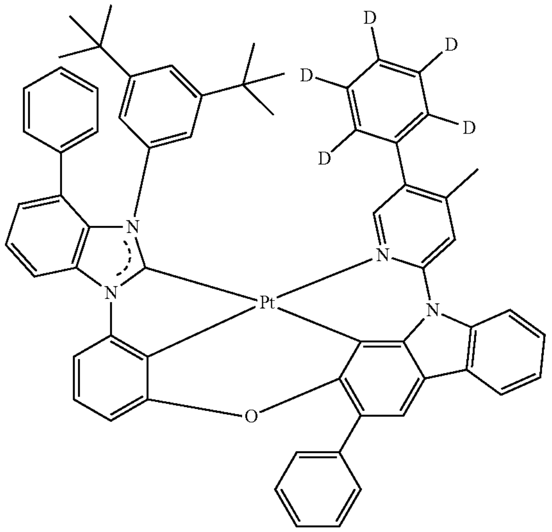
395
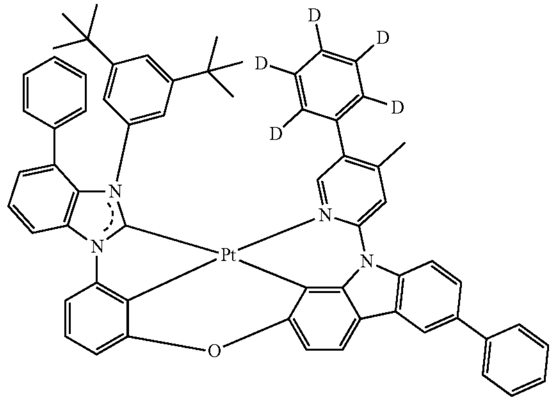
396
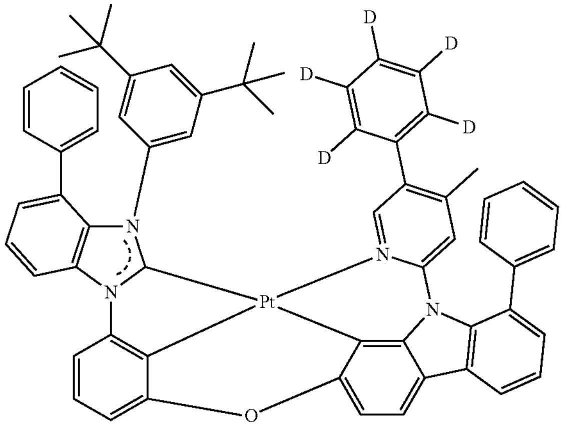
397
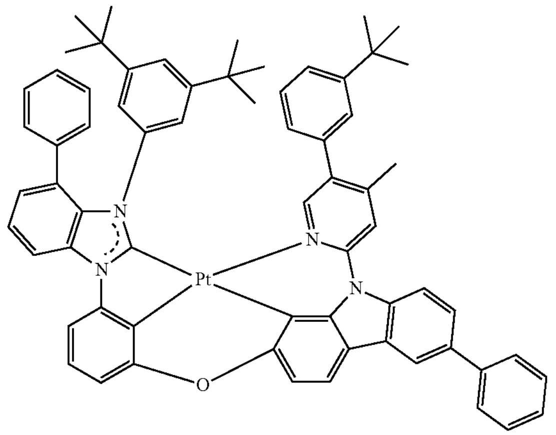
398
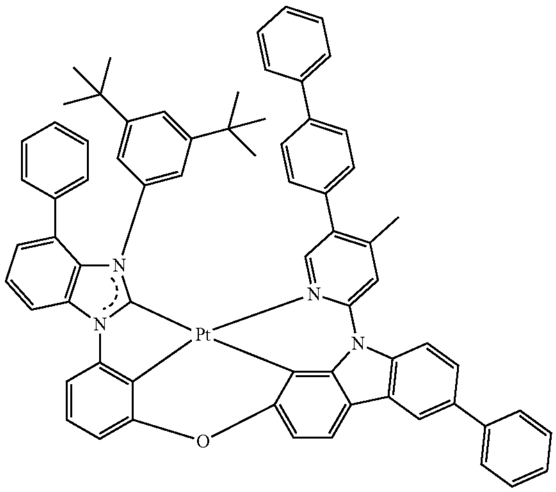

-continued
399
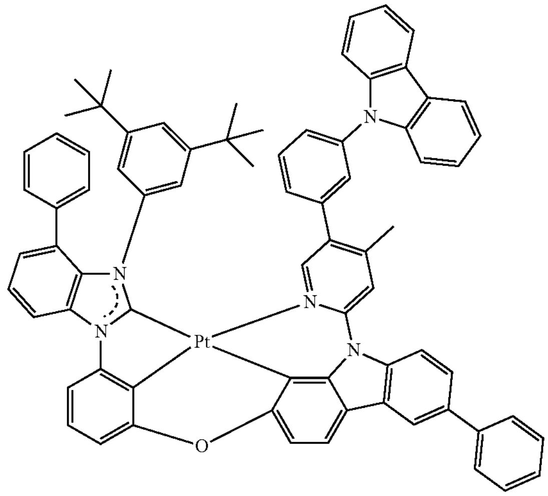
400
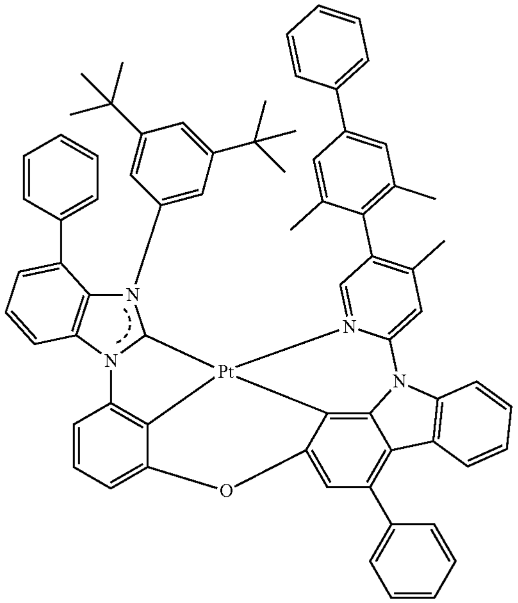
401
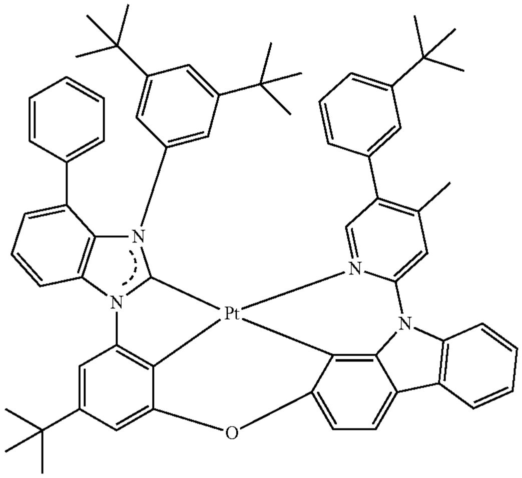
402
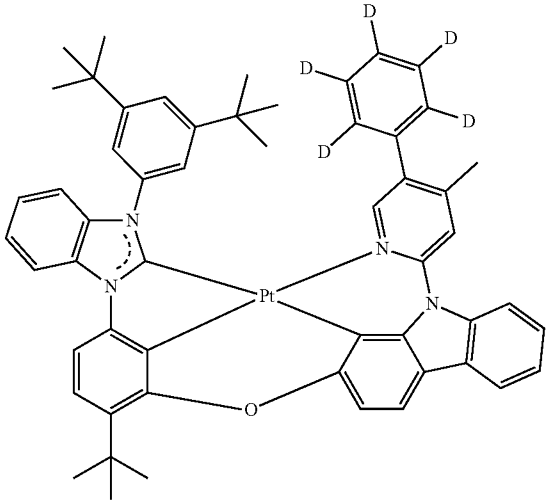

-continued
403
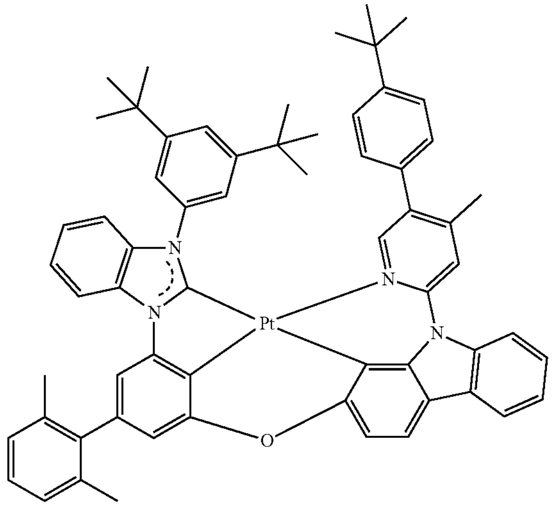
404
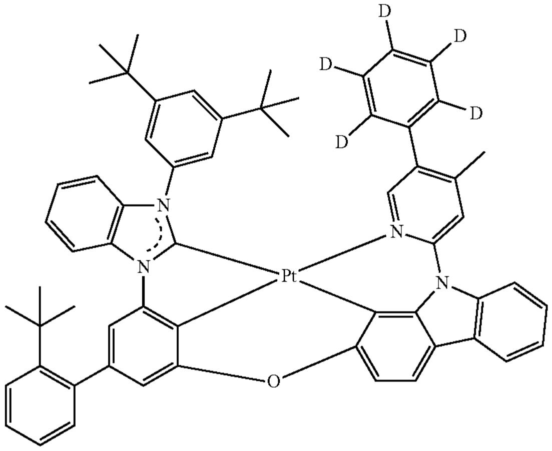
405
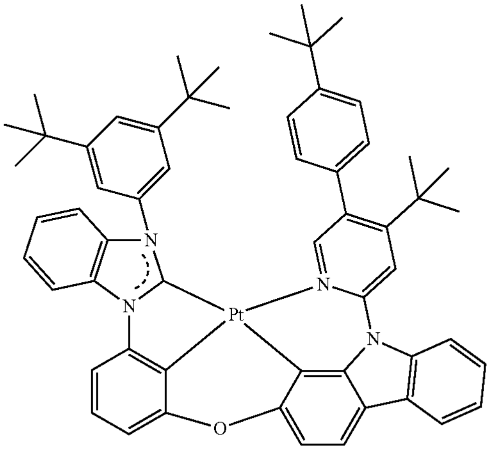
406
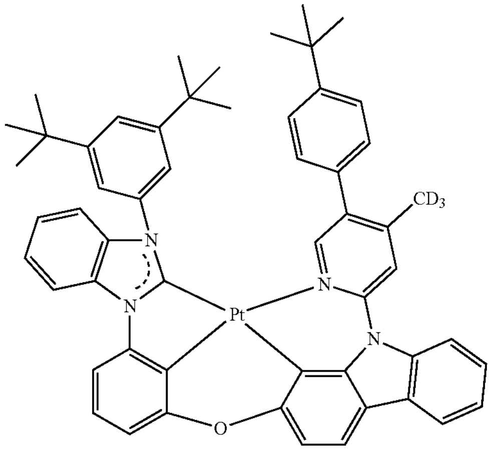
407
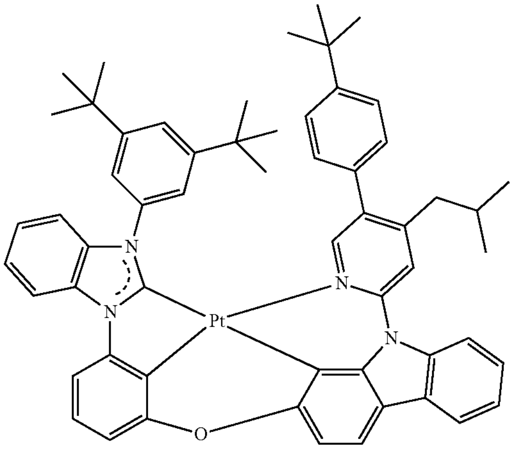
408
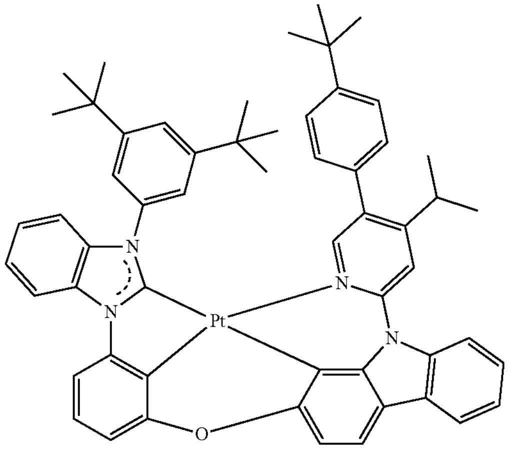

-continued
409
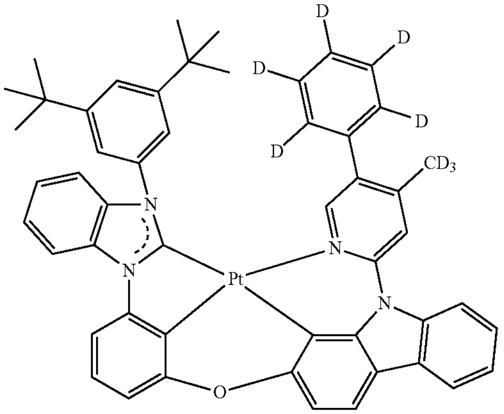
410
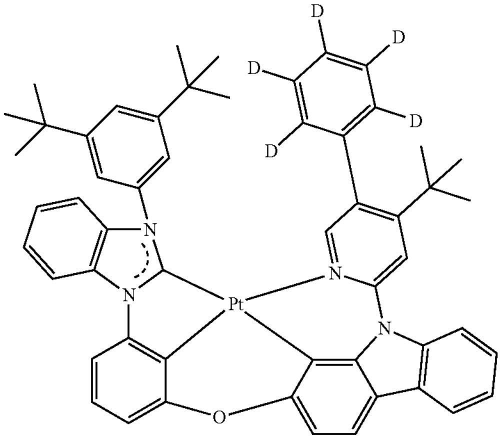
411
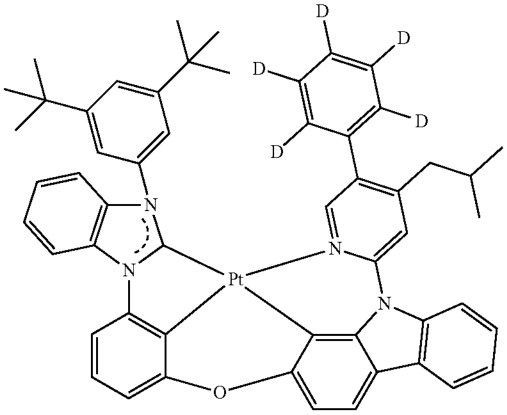
412
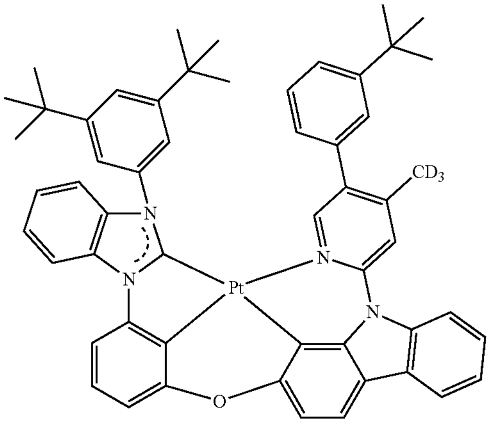
413
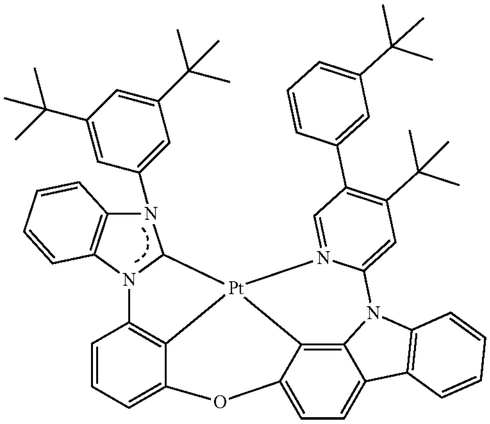
414
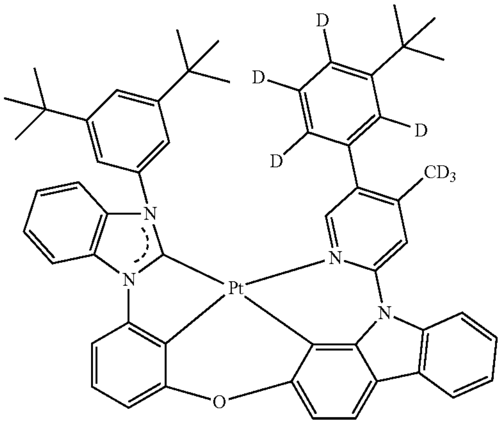

-continued
415
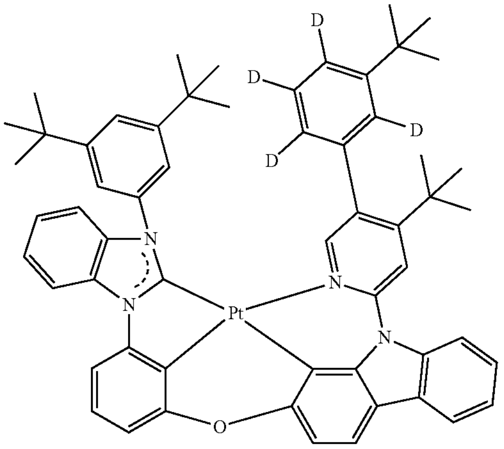
416
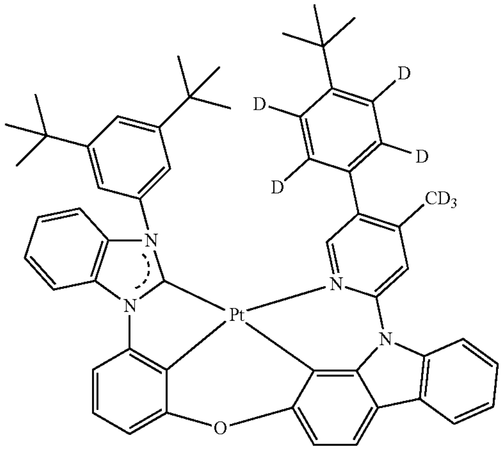
417
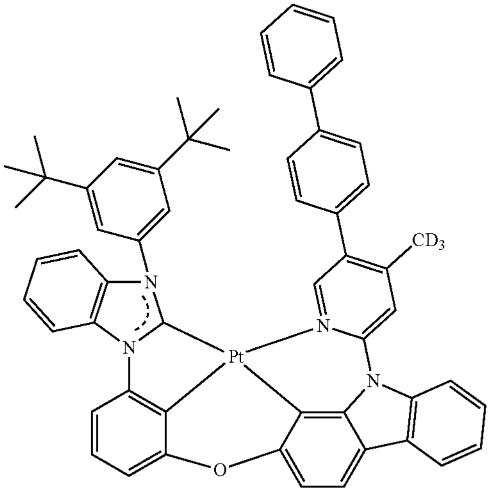
418
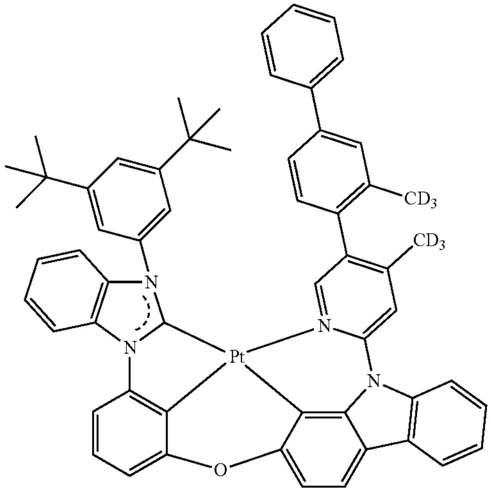
419
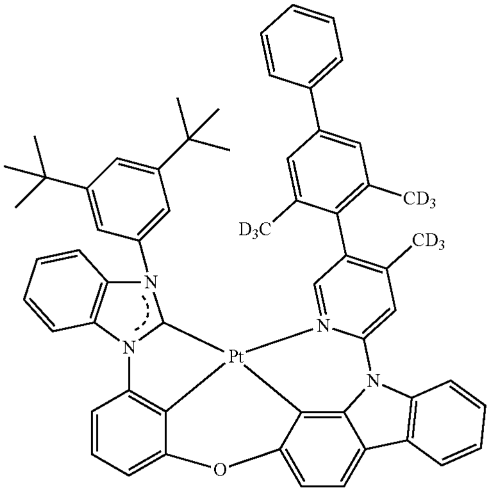
420
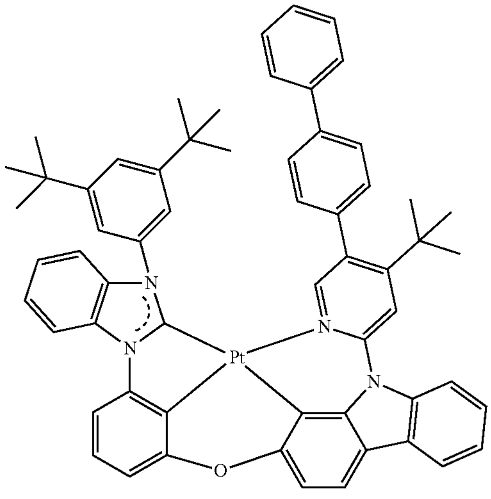

-continued
421
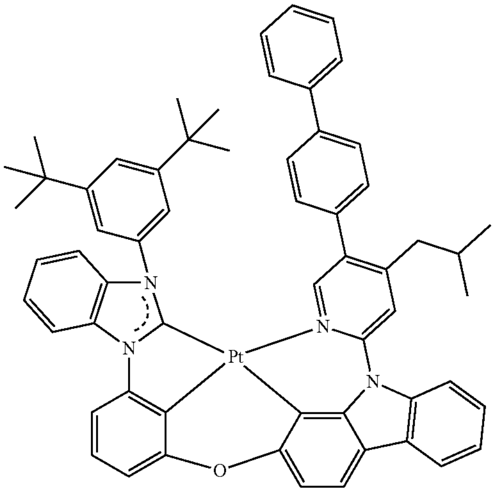
422
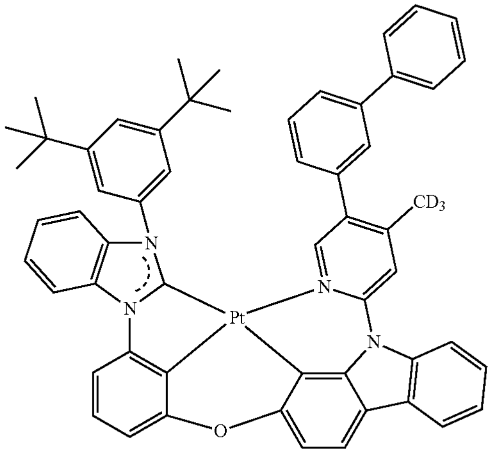
423
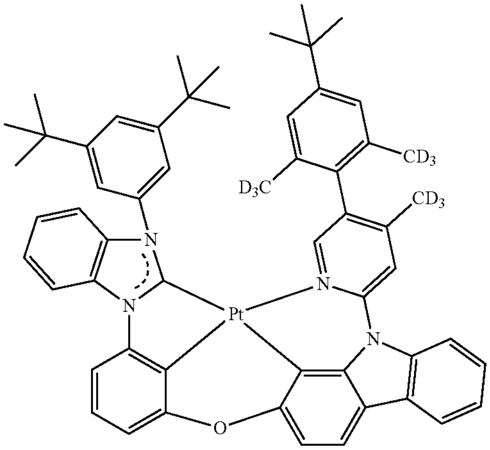
424
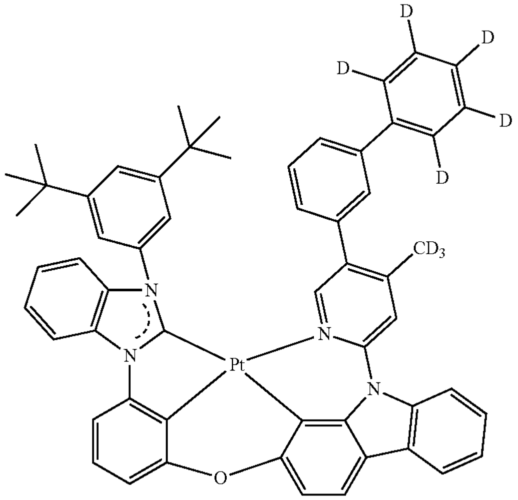
-continued
425
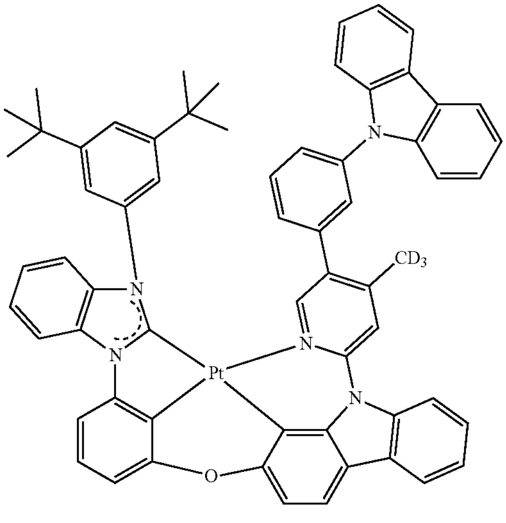
426
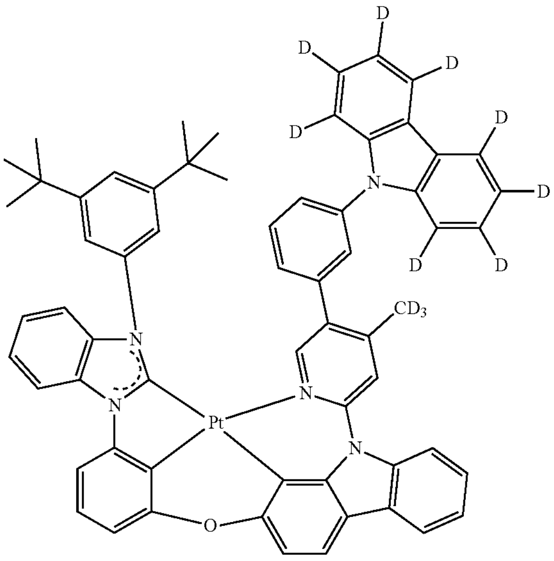

-continued
427
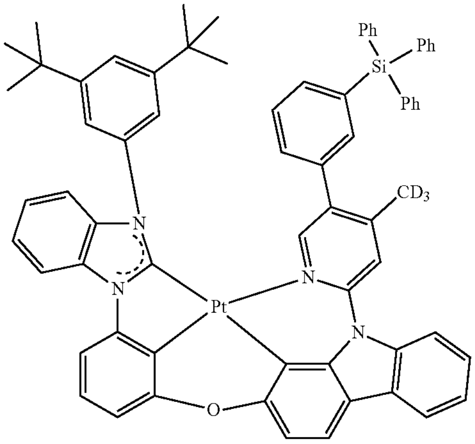
428
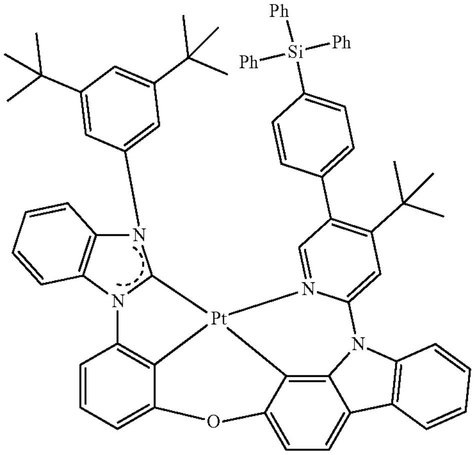
429
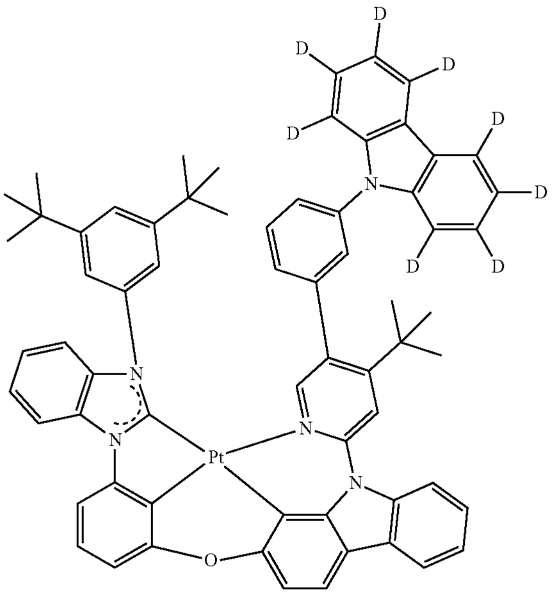
-continued
430
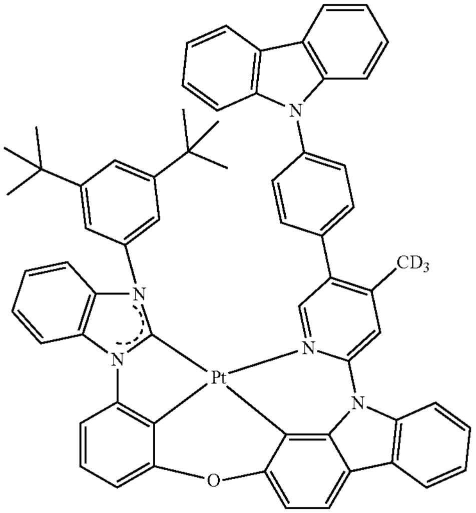
431
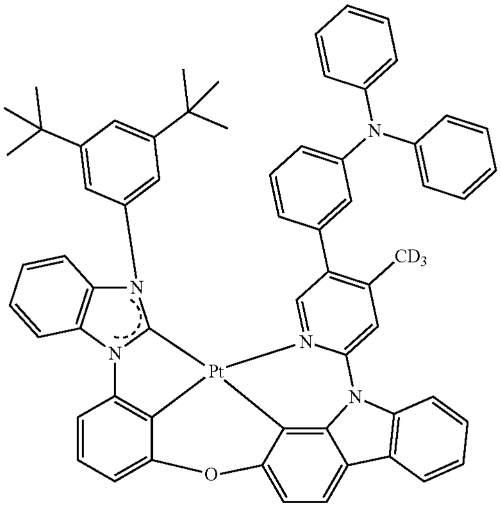
432
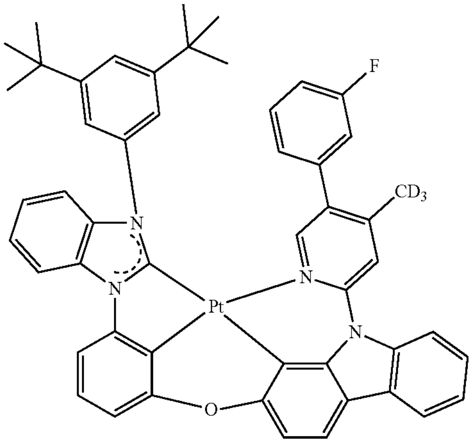

-continued
433
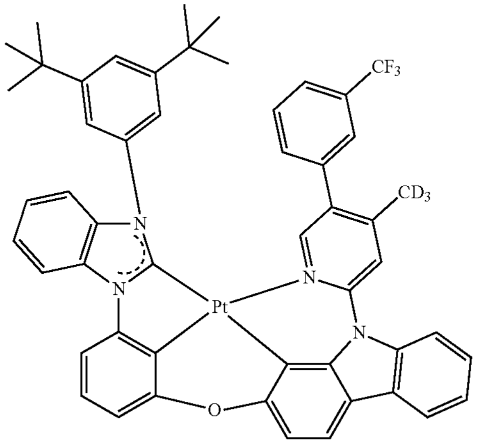
434
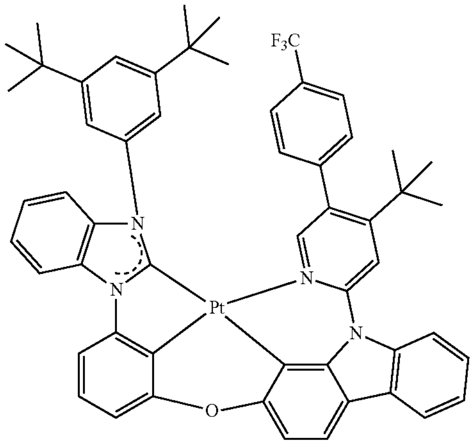
435
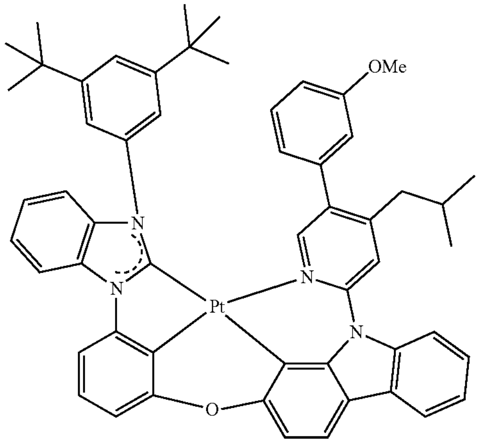
-continued
436
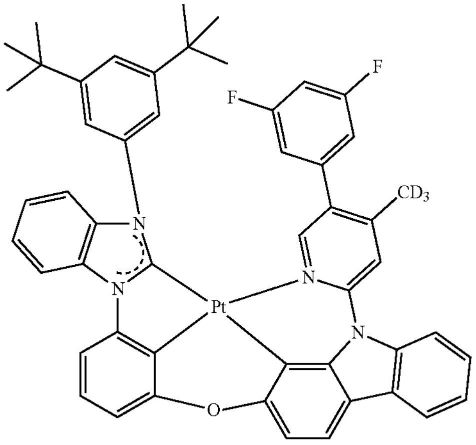
437
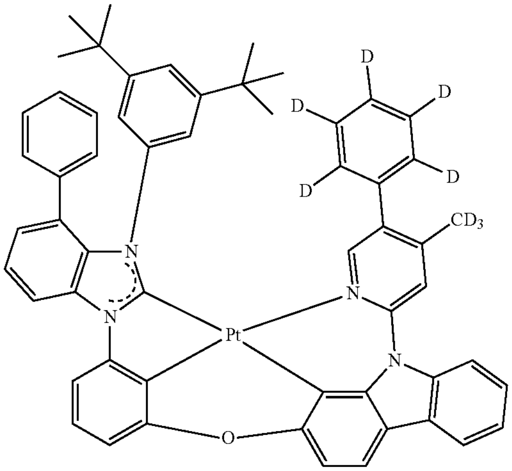
438
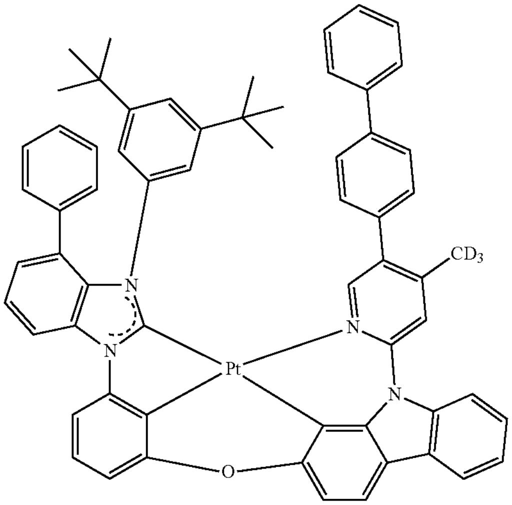

-continued
439
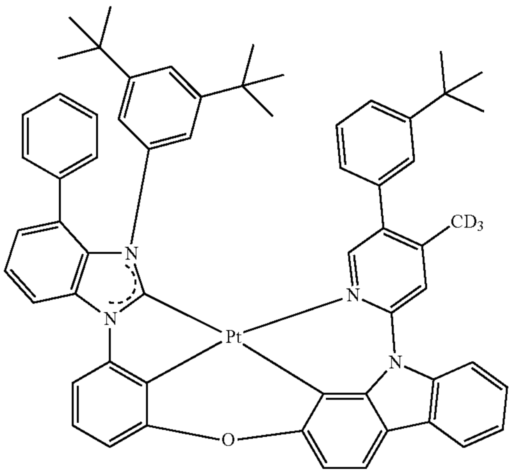
440
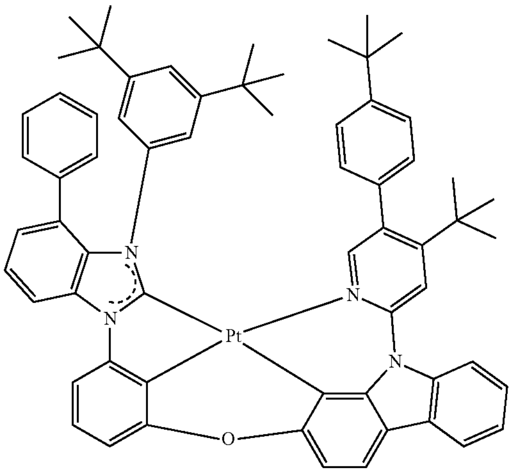
441
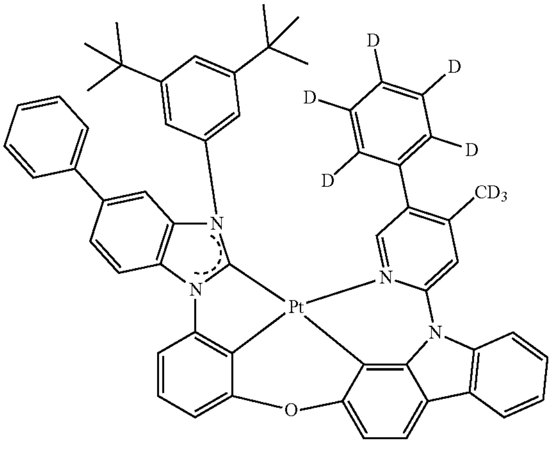
-continued
442
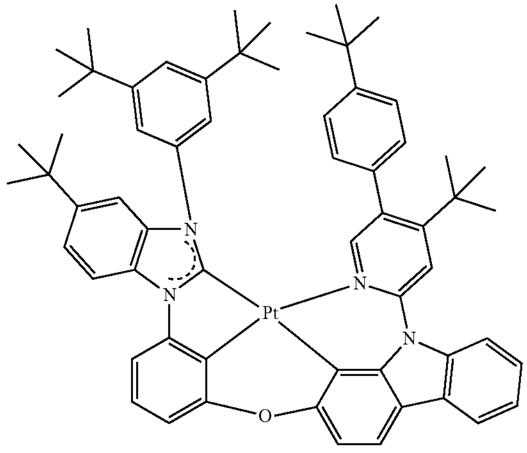
443
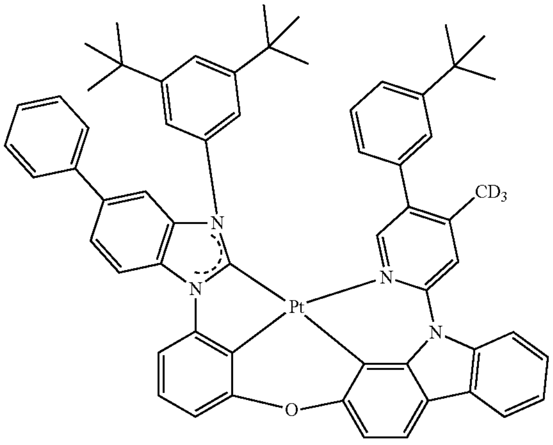
444
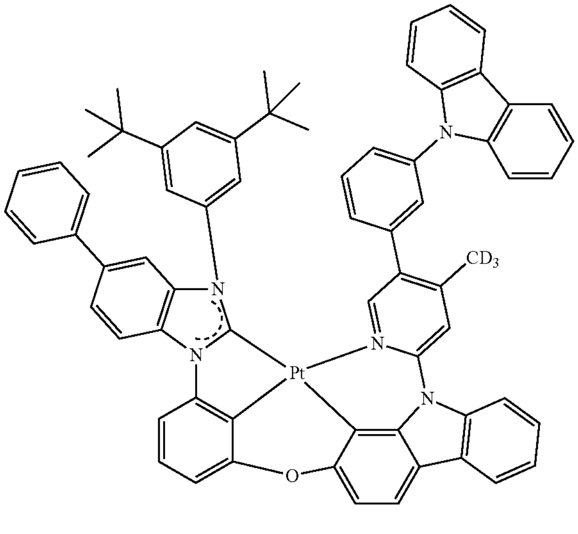

-continued
445
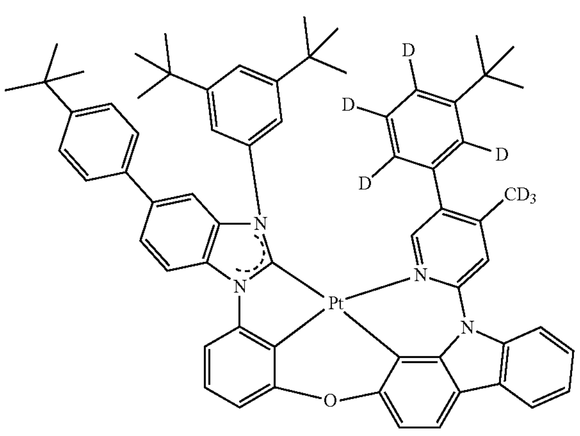
446
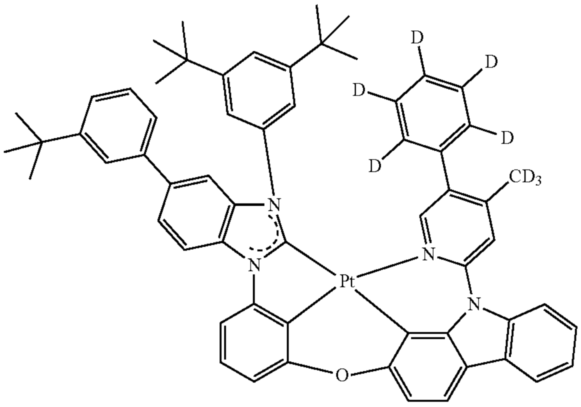
447
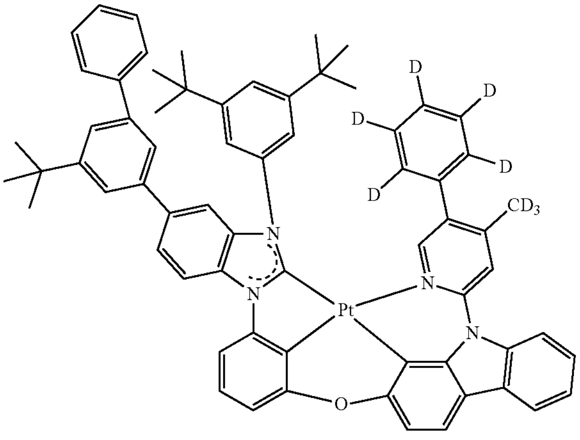
-continued
448
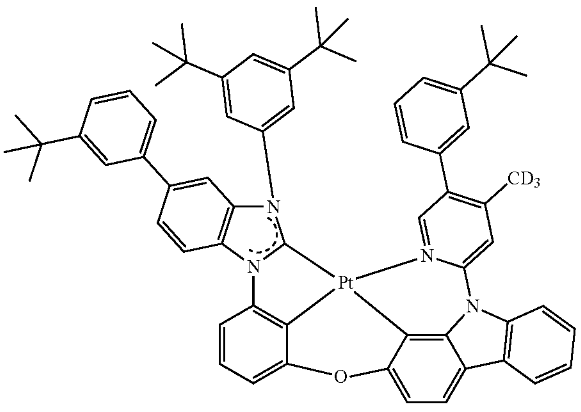
449
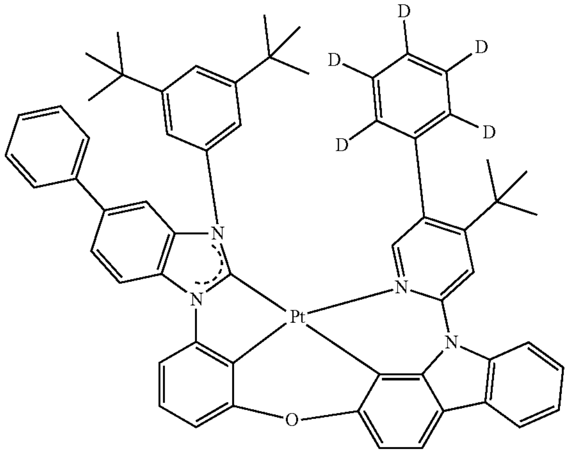
450
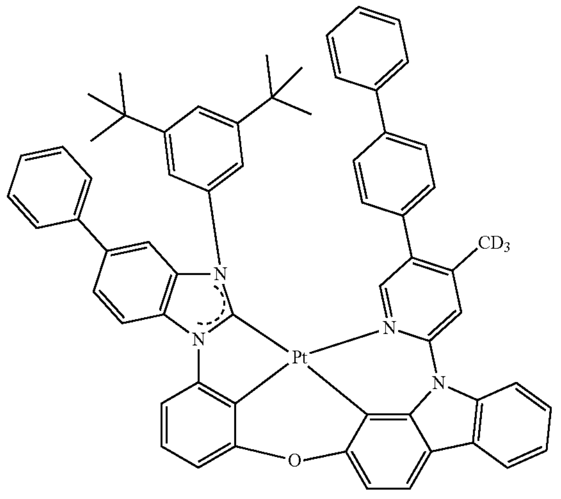

-continued
451
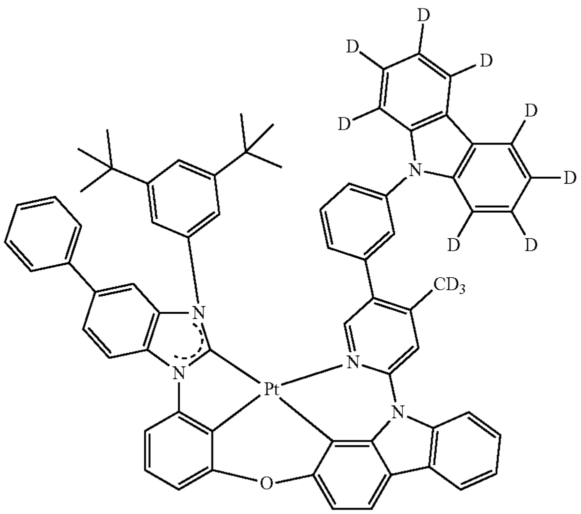
452
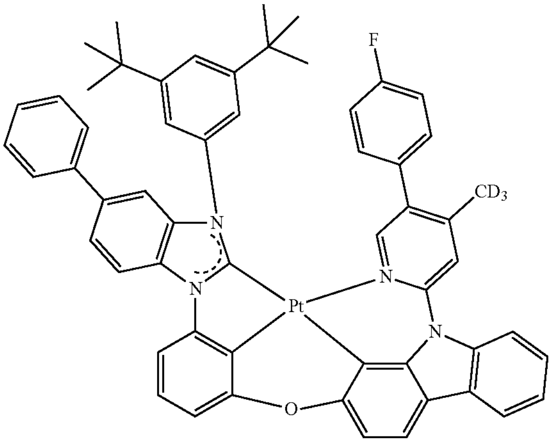
453
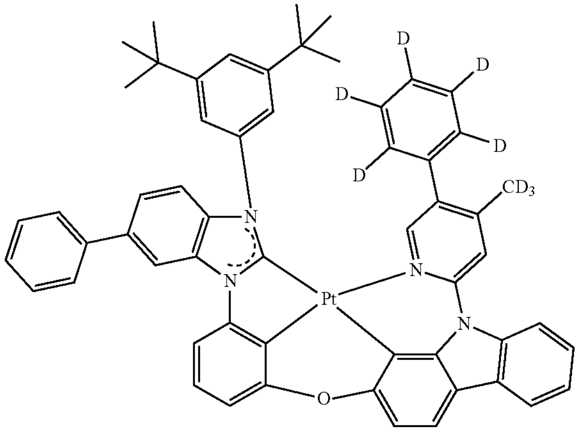
-continued
454
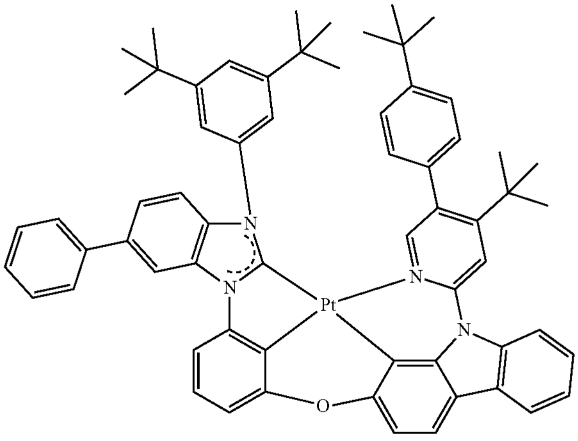
455
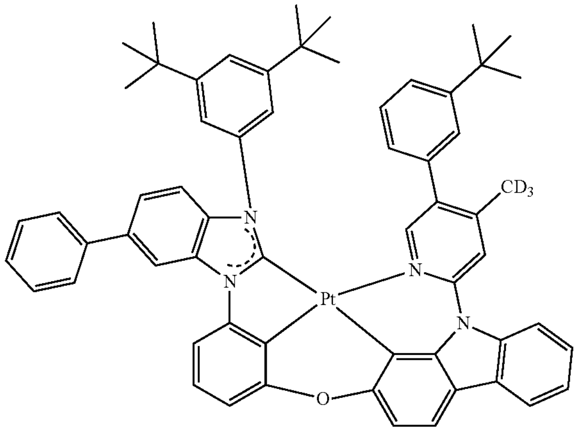
456
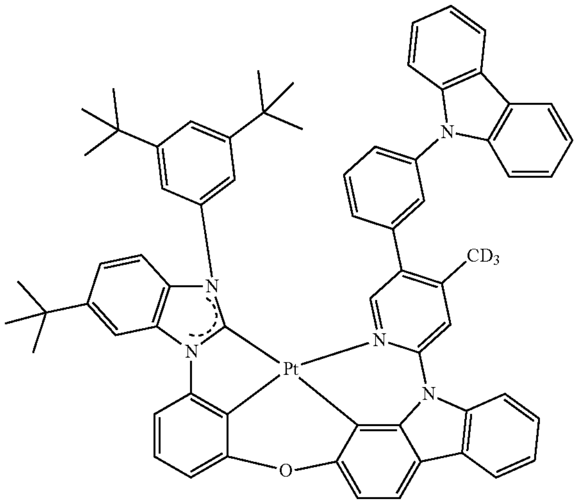

-continued
457
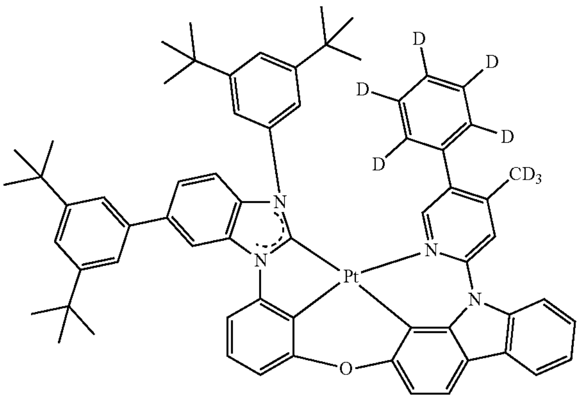
458
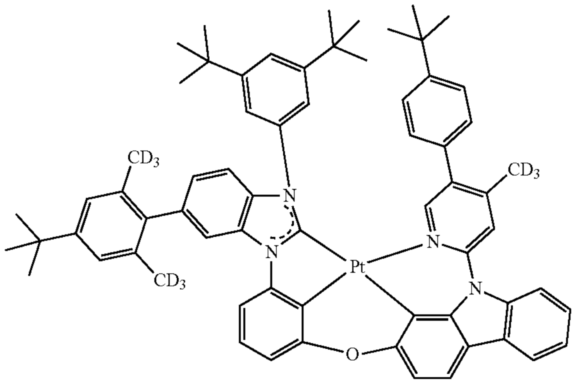
459
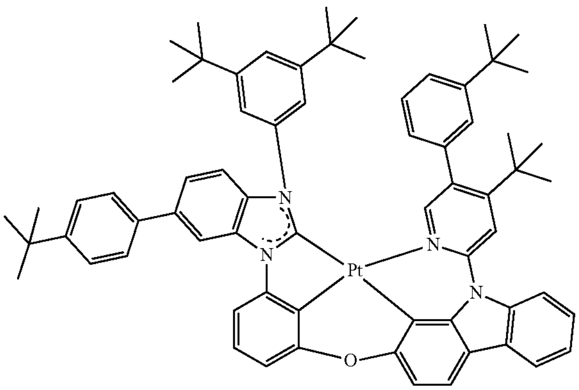
-continued
460
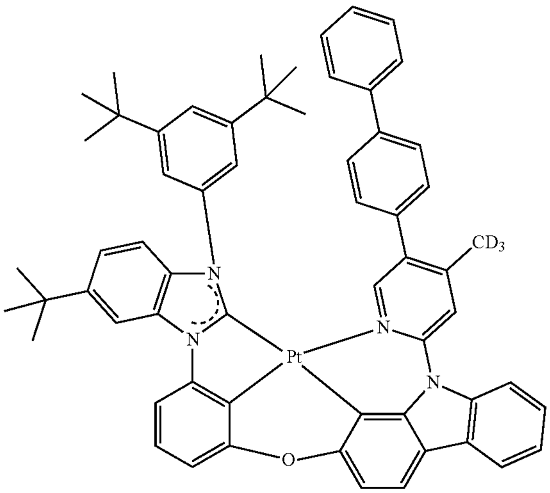
461
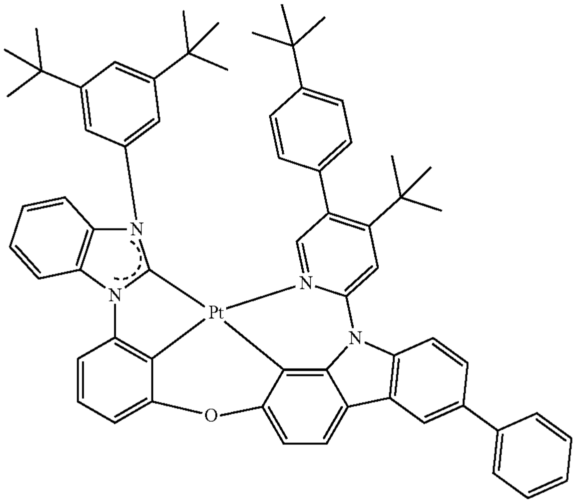
462
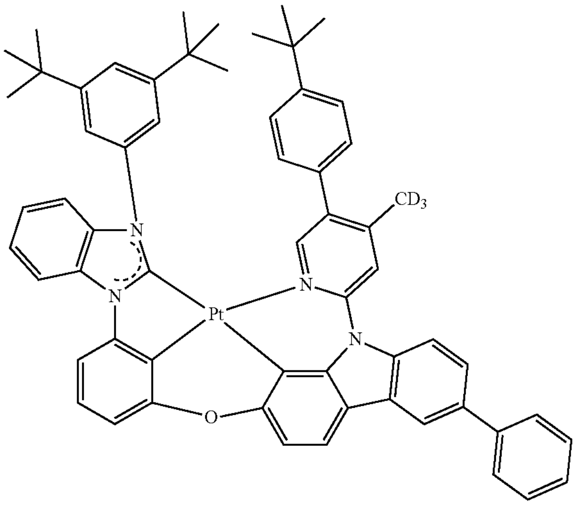

-continued
463
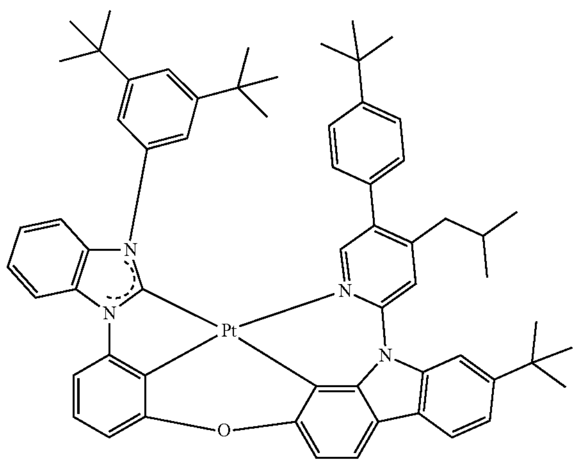
464
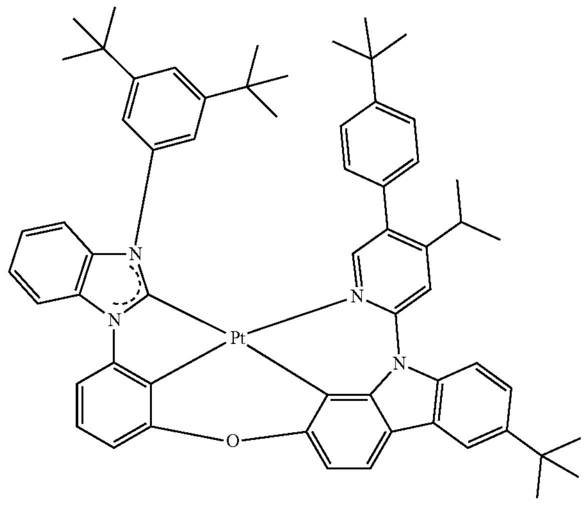
465
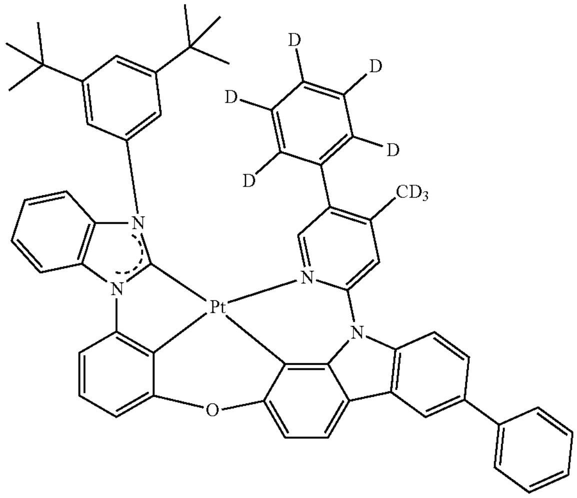
-continued
466
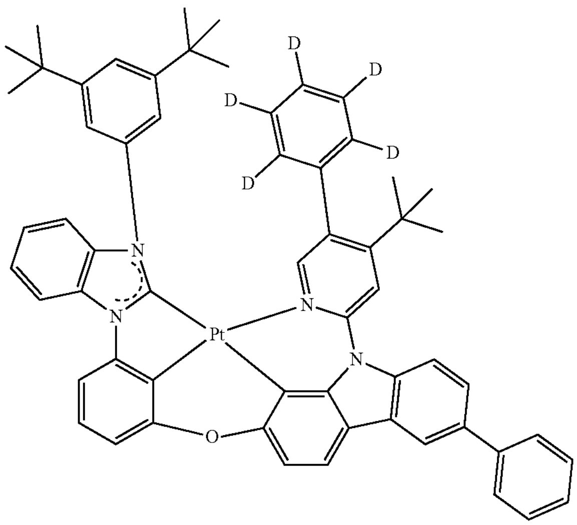
467
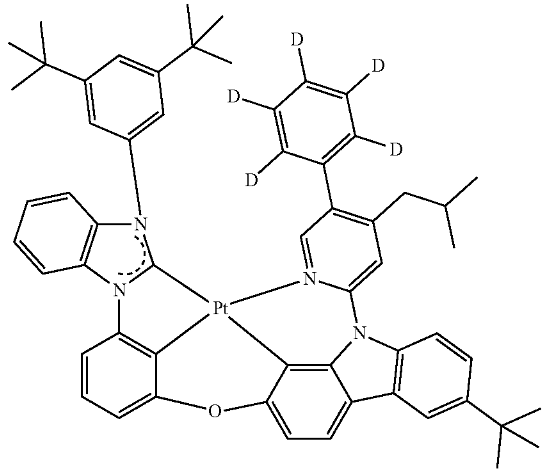
468
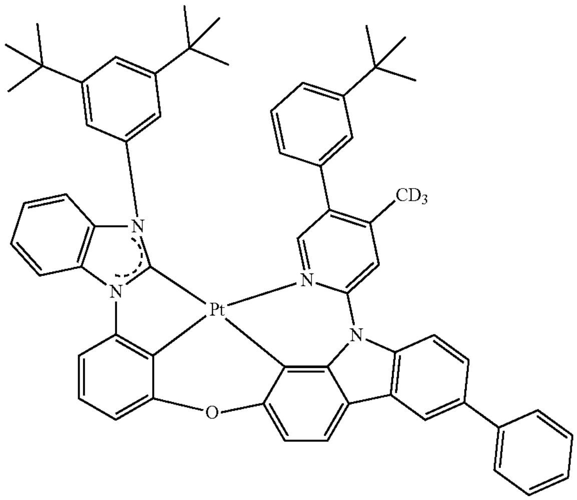

-continued
469
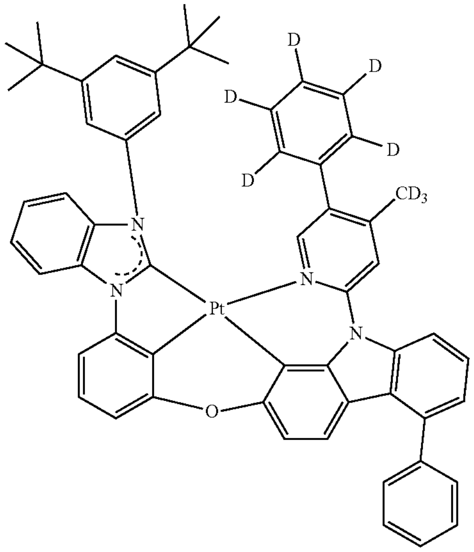
470
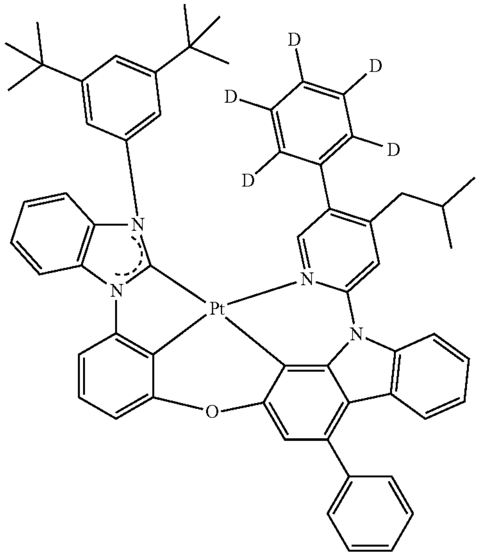
471
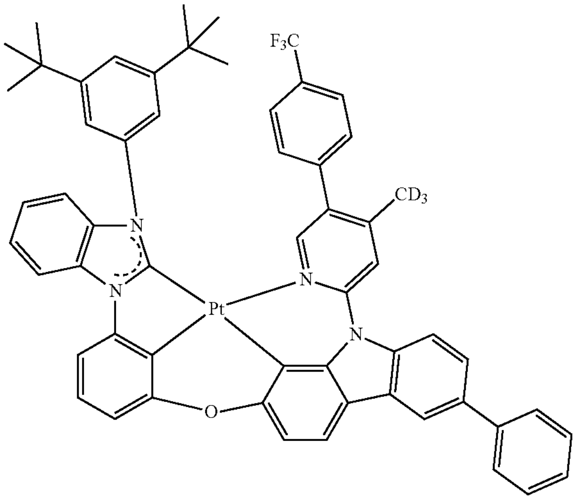
-continued
472
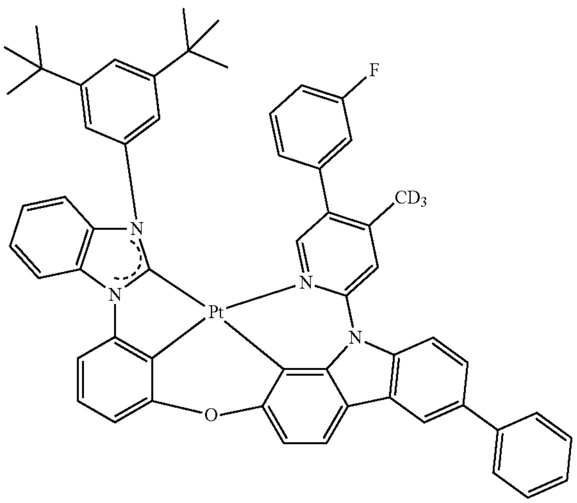
473
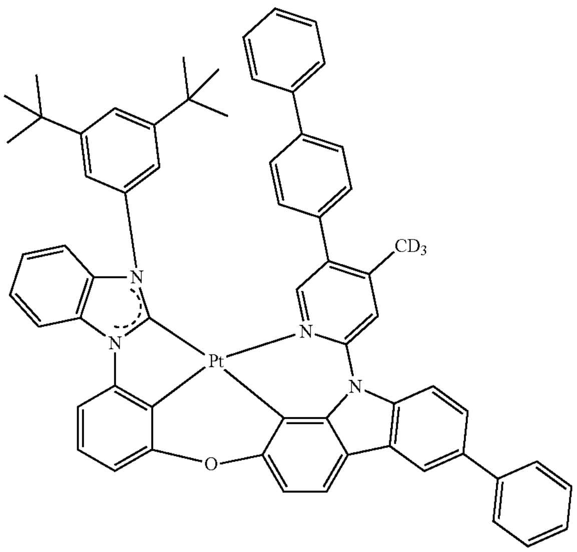
474
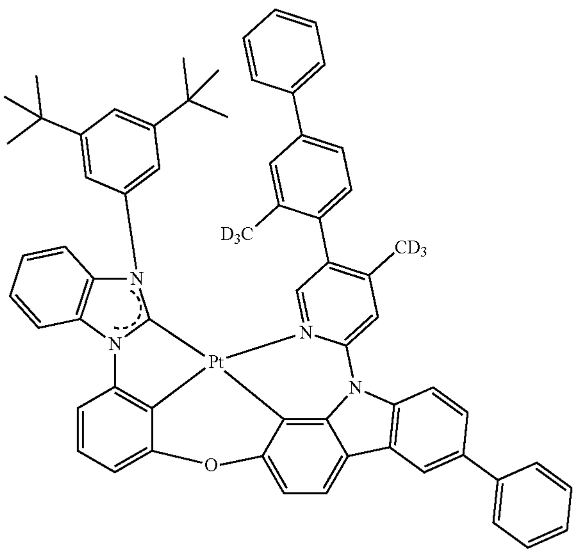

-continued
475
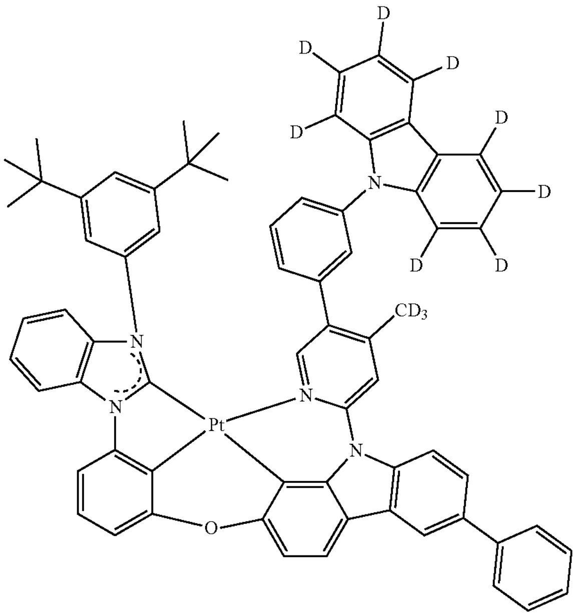
476
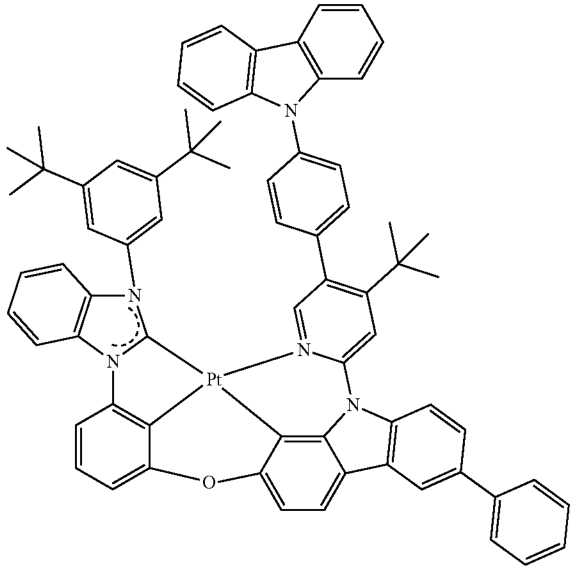
-continued
477
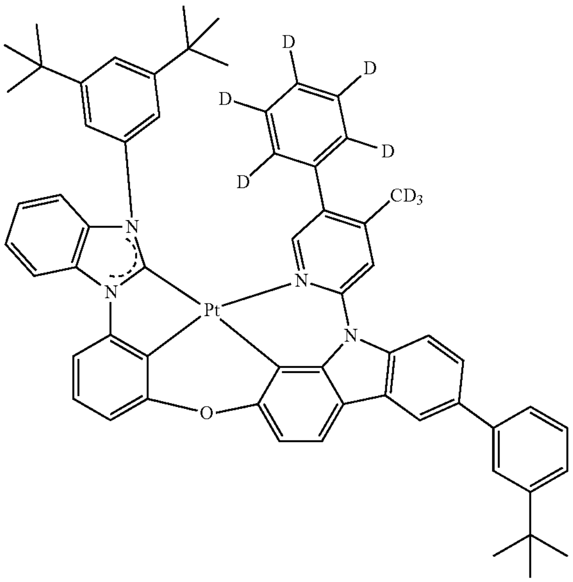
478
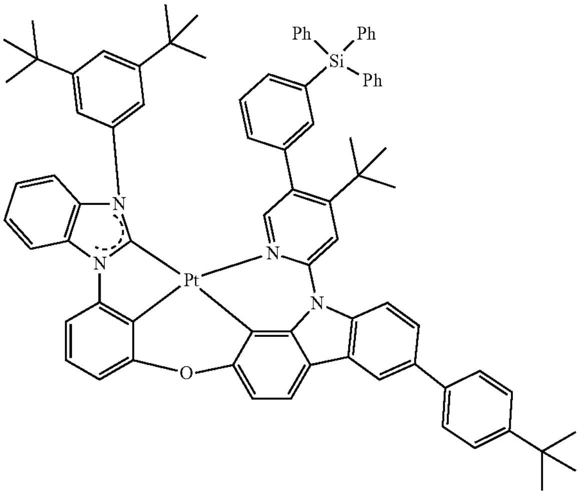
479
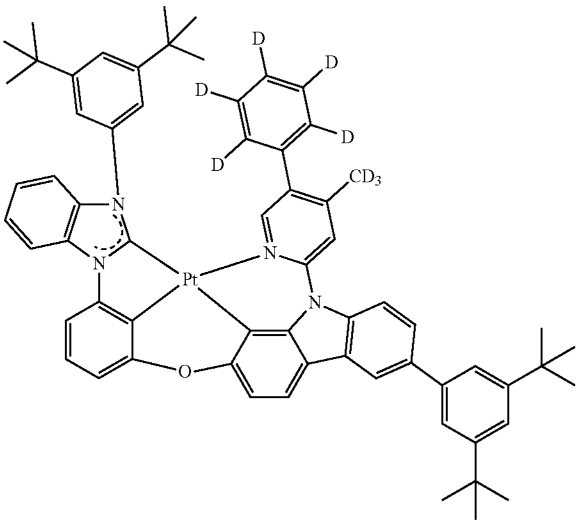

-continued
480
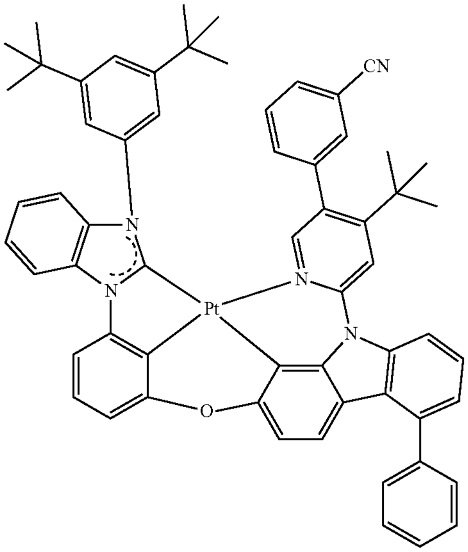
481
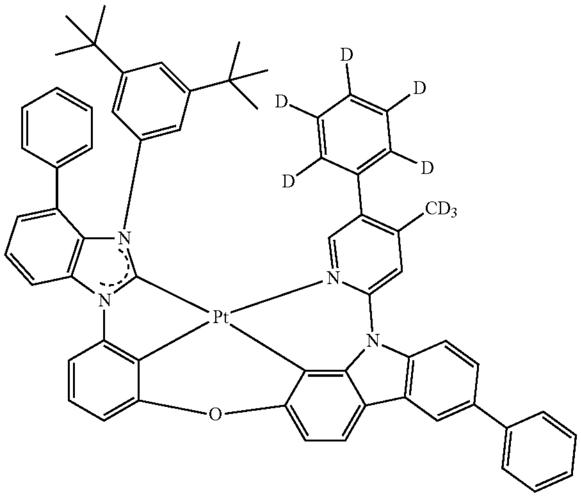
482
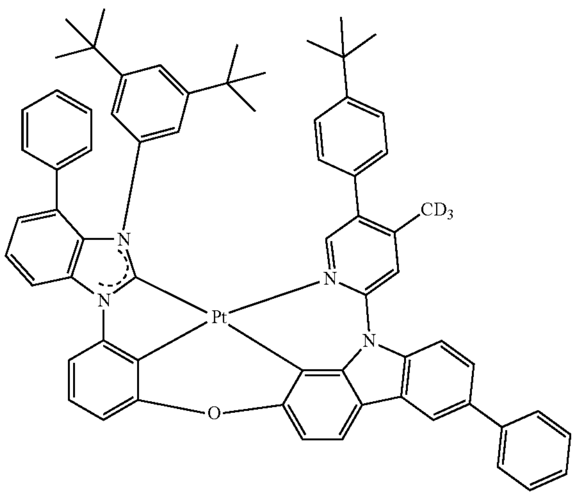
-continued
483
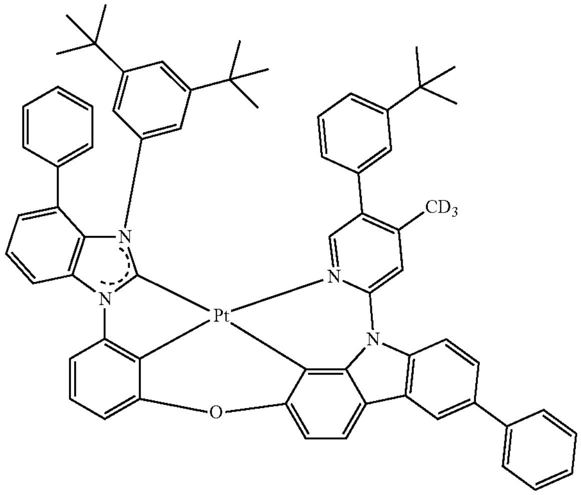
484
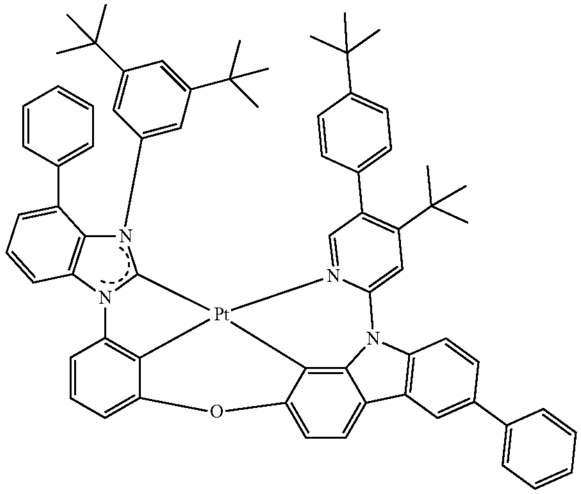
485
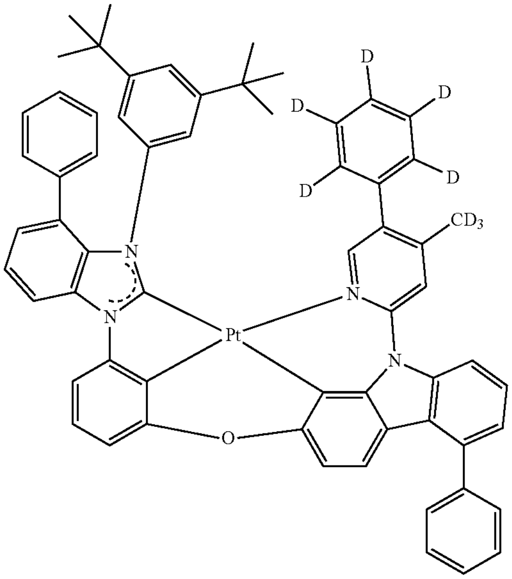

-continued
486
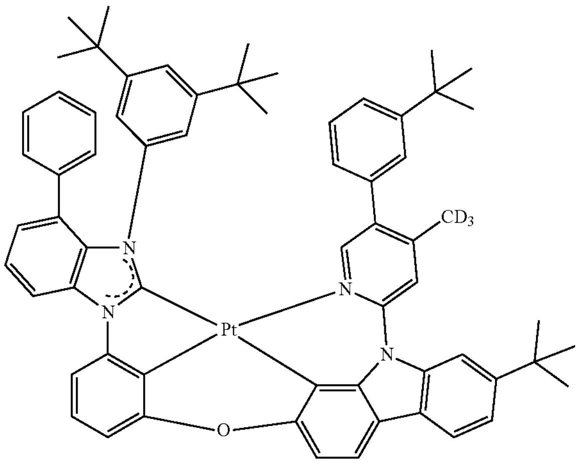
487
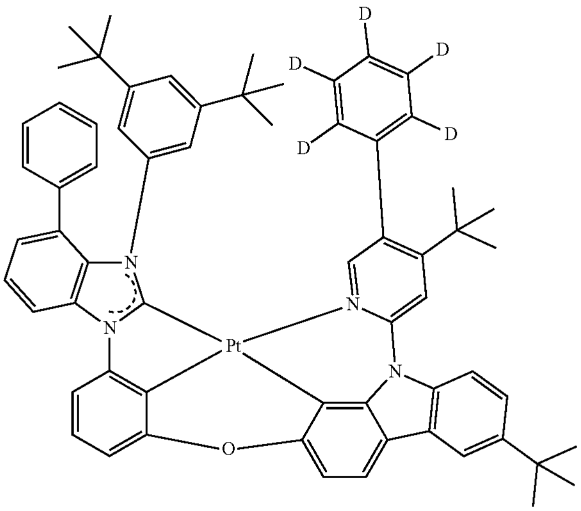
488
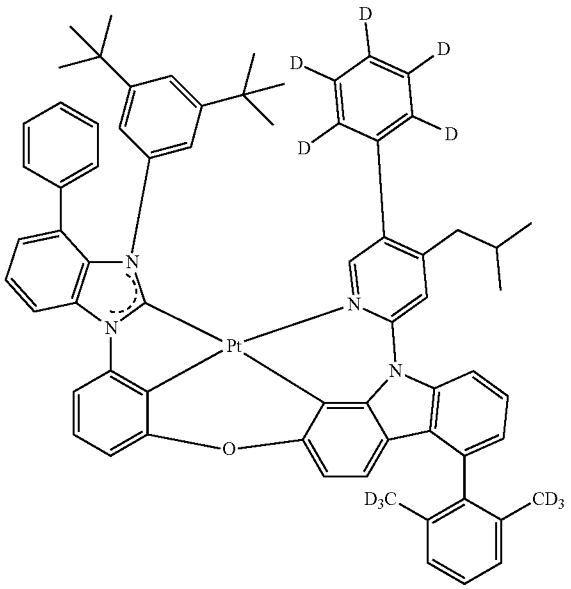
-continued
489
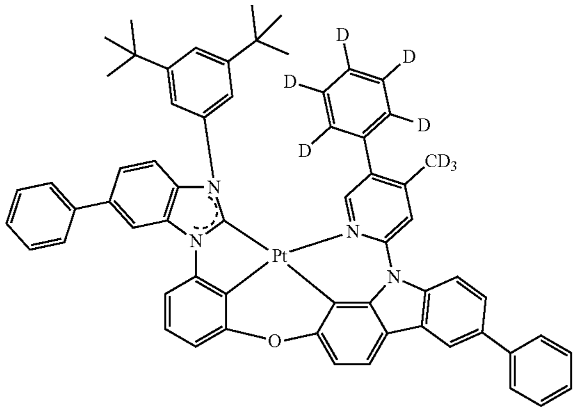
490
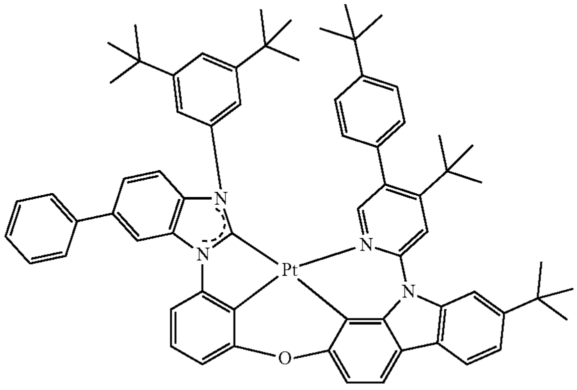
491
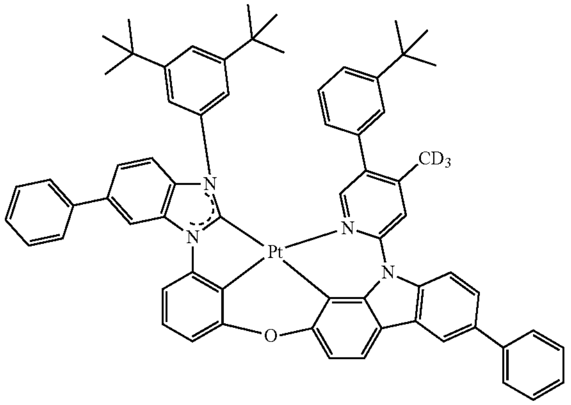

-continued
492
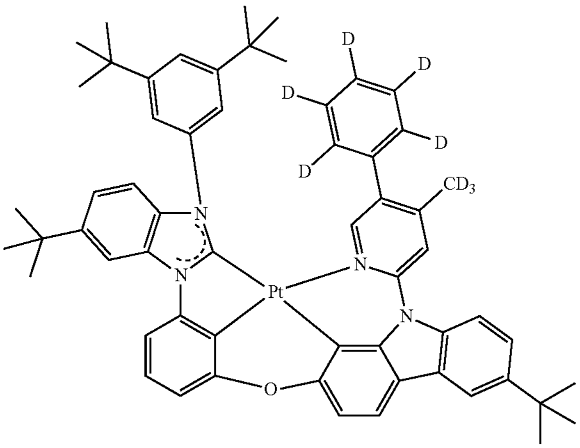
493
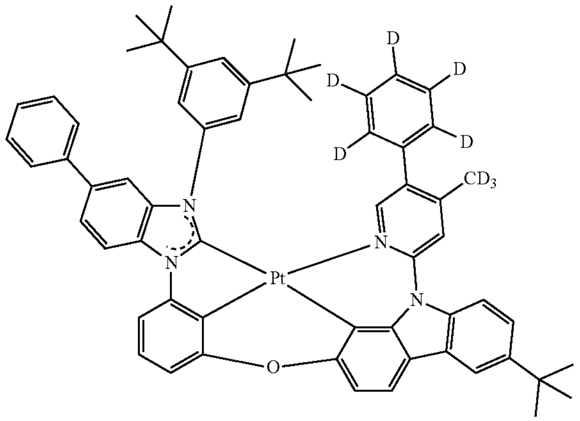
494
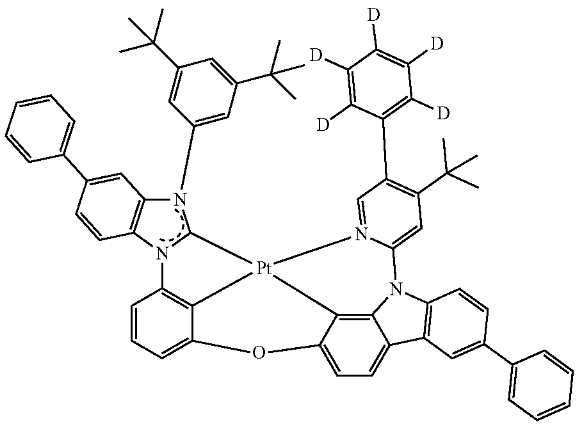
-continued
495
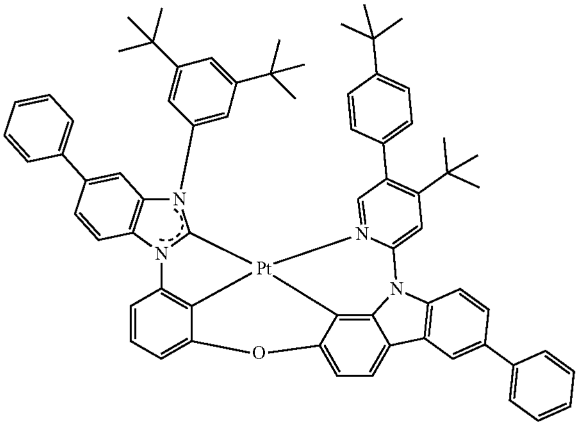
496
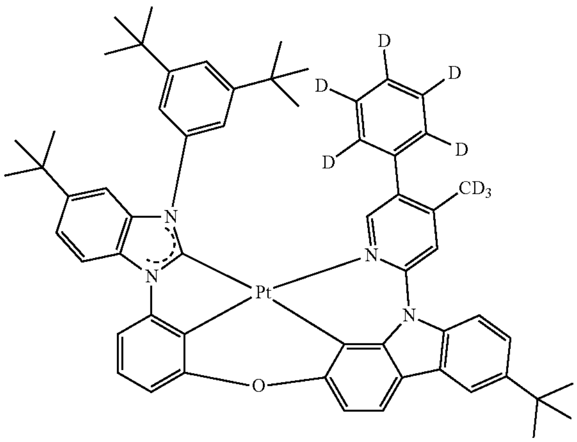
497
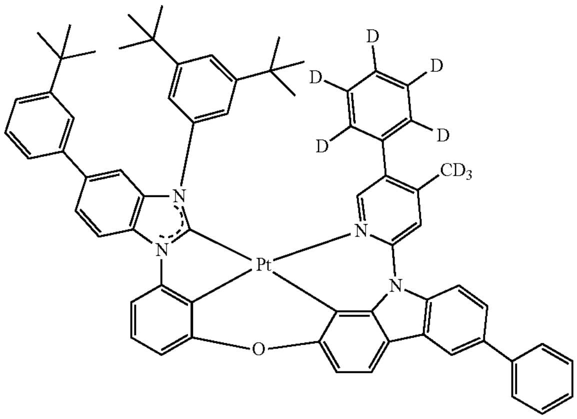

-continued
498
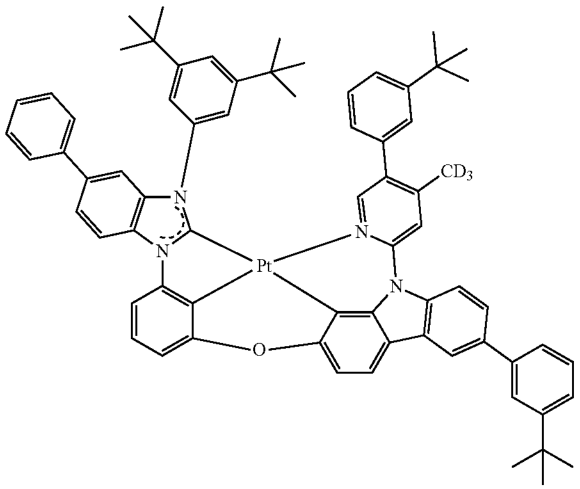
499
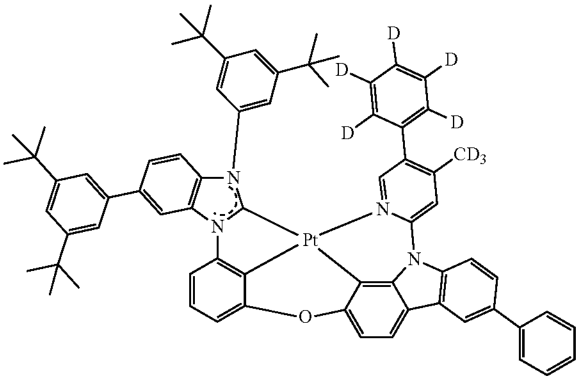
500
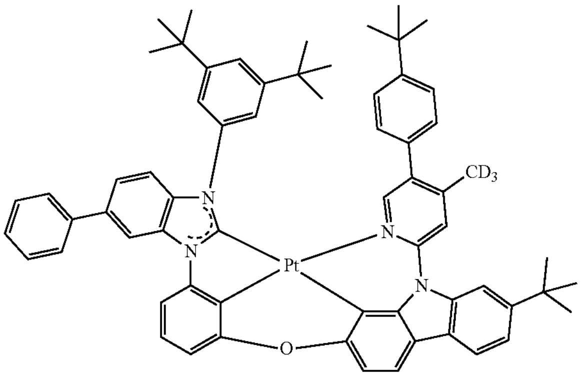
-continued
501
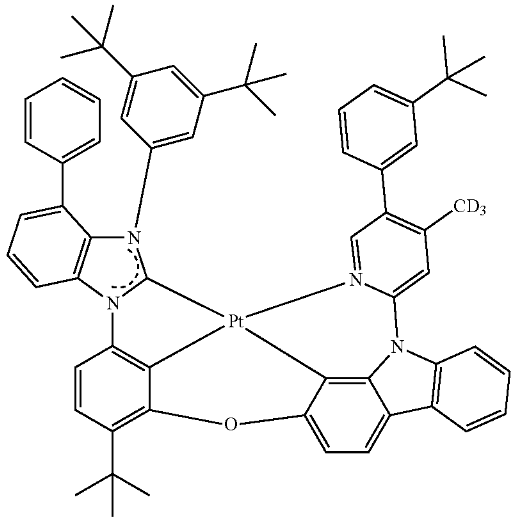
502
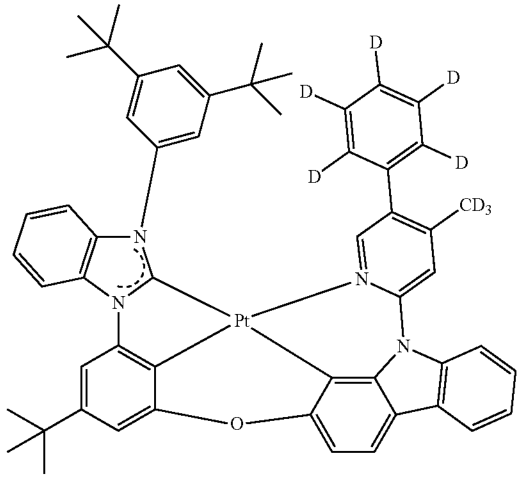
503
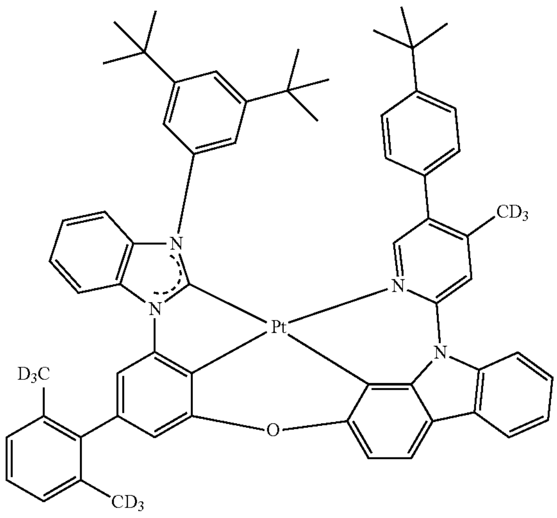

-continued
504
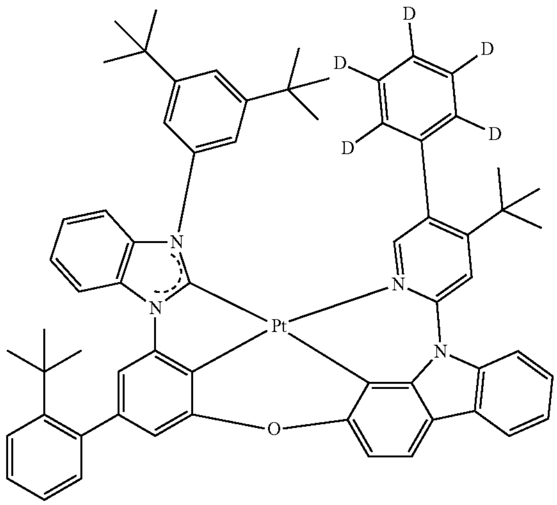
505
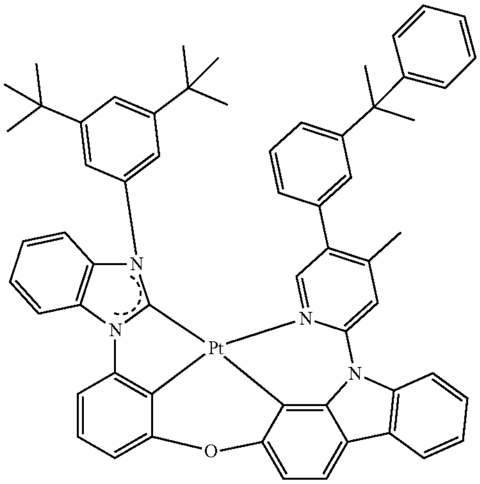
506
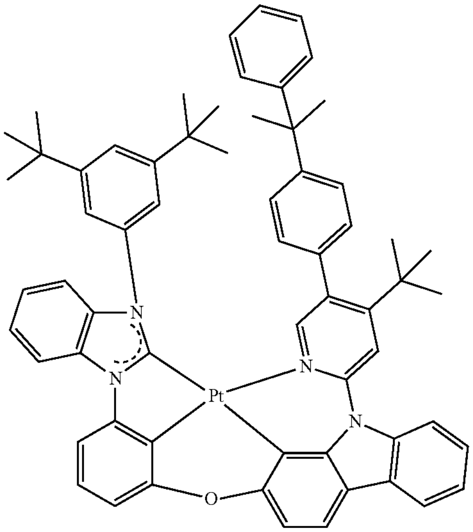
-continued
507
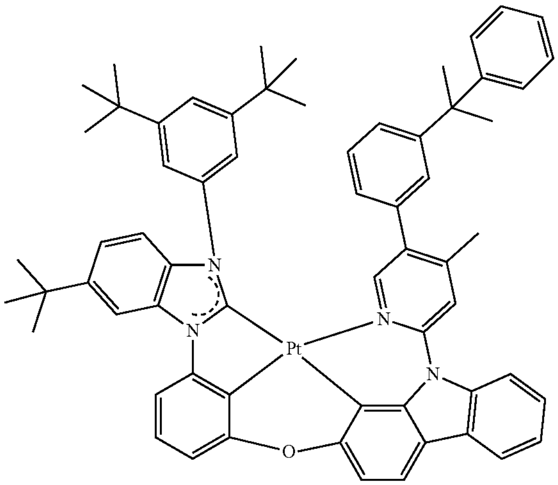
508
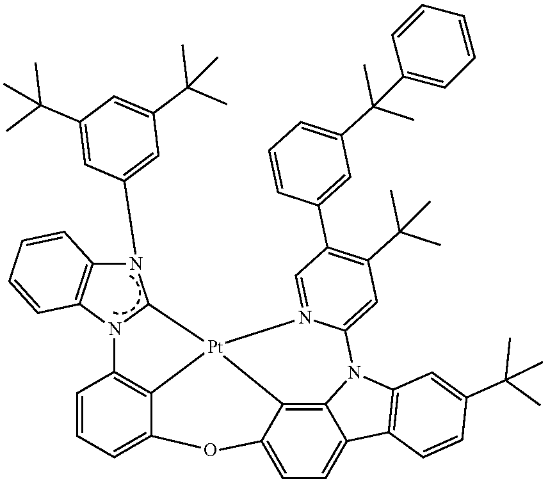
509
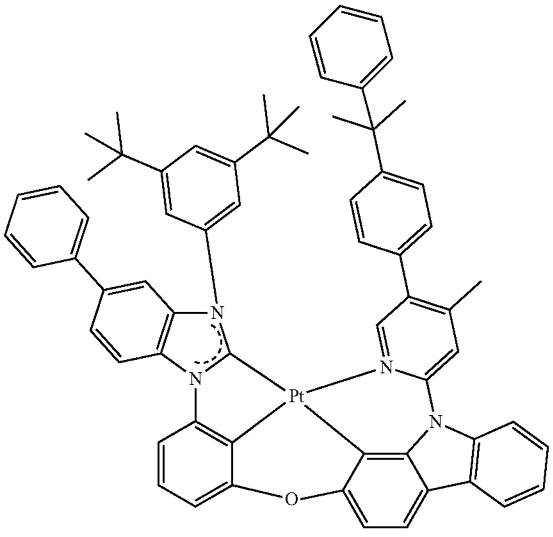

-continued
510
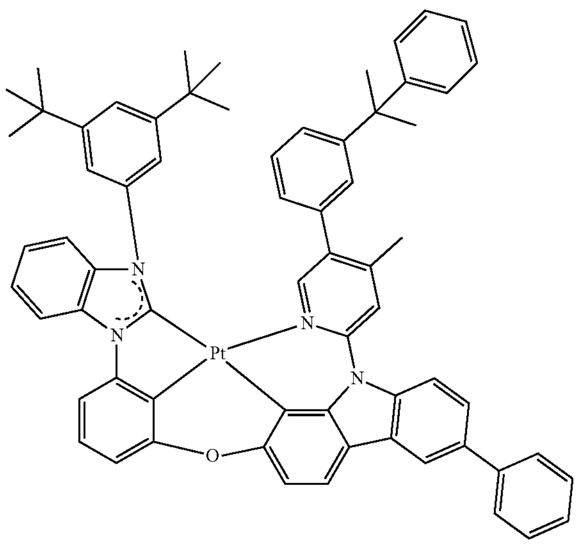
511
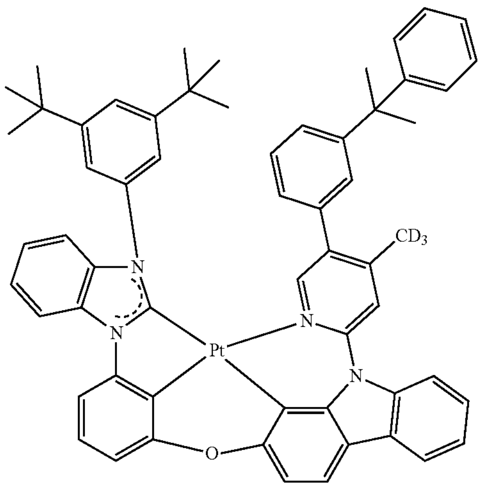
512
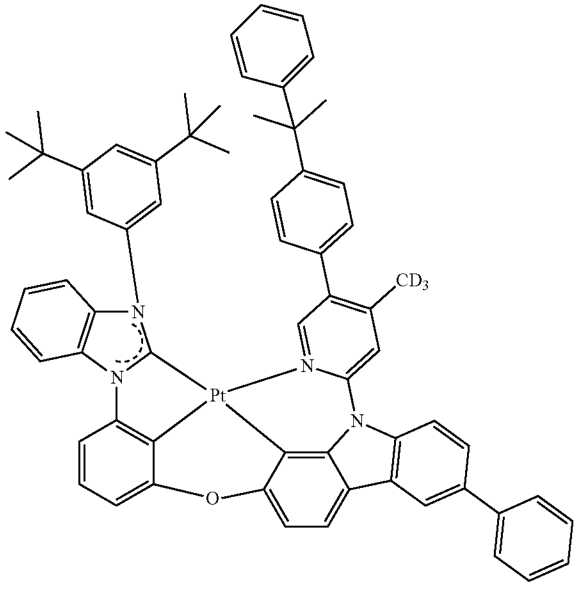
-continued
513
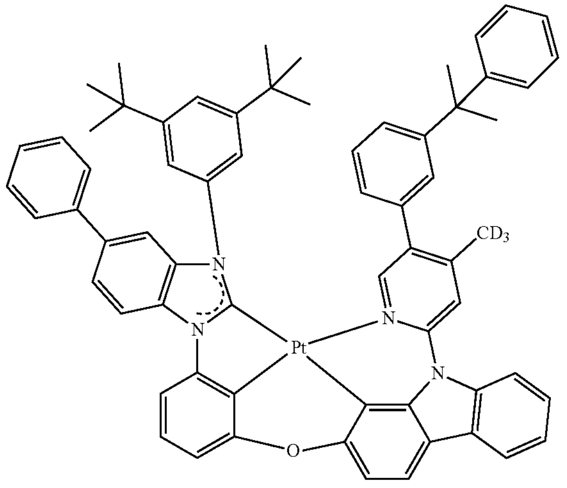
514
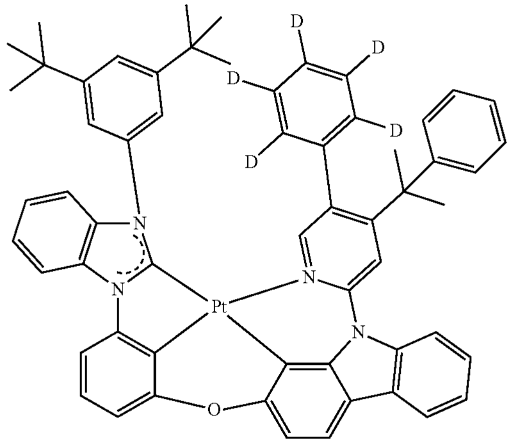
515
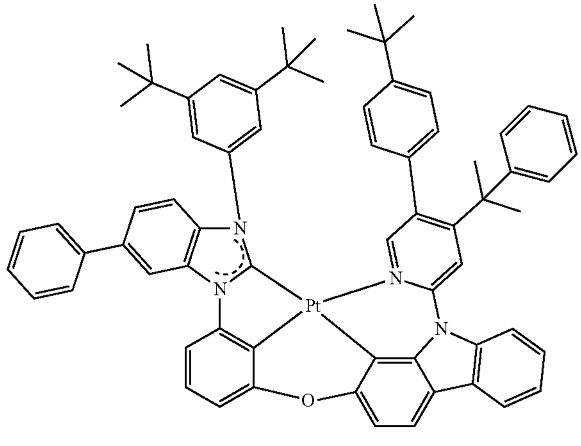

-continued
516
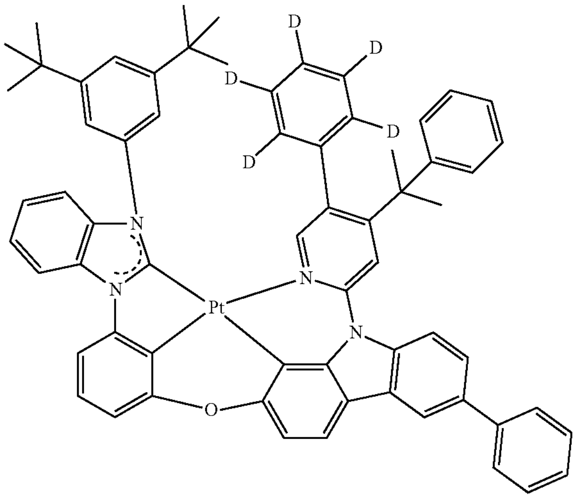
517
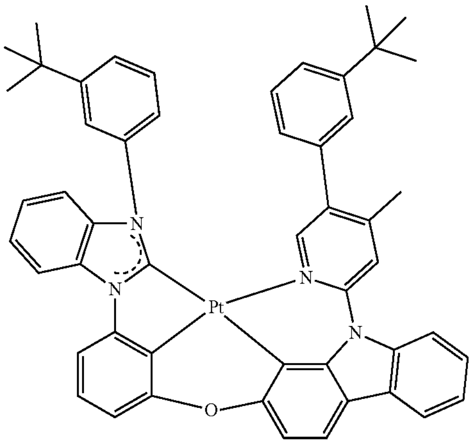
518
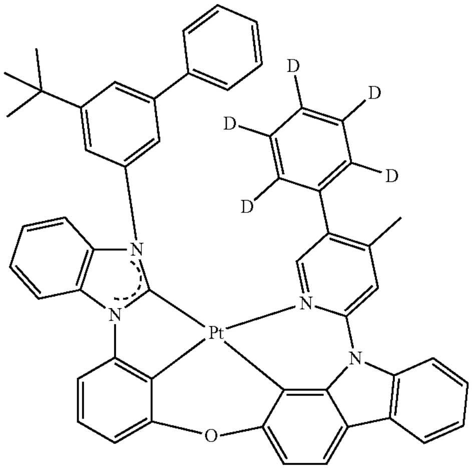
-continued
519
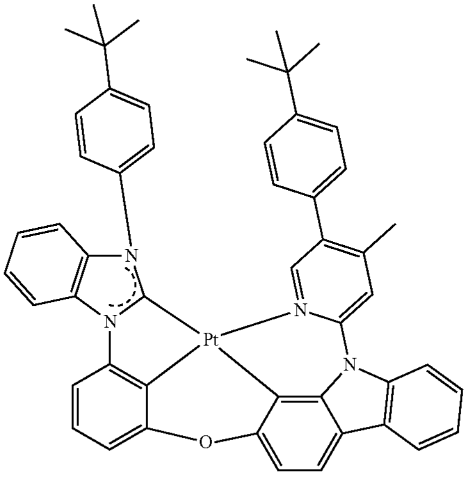
520
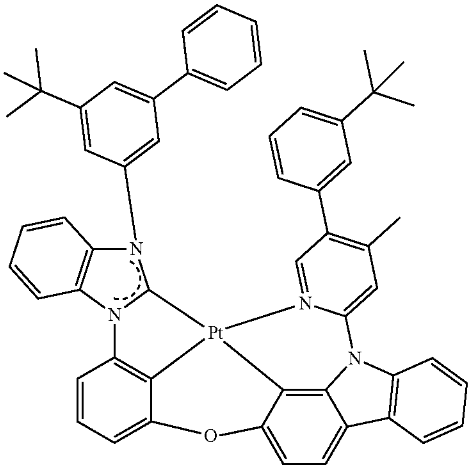
521
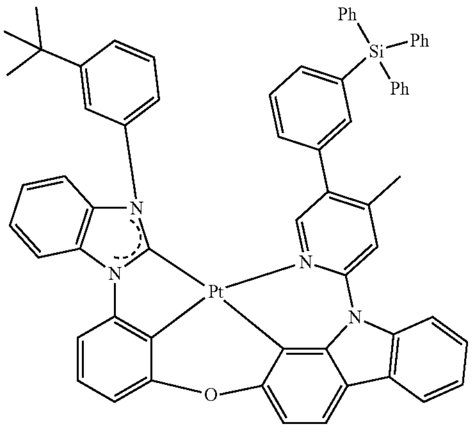

522
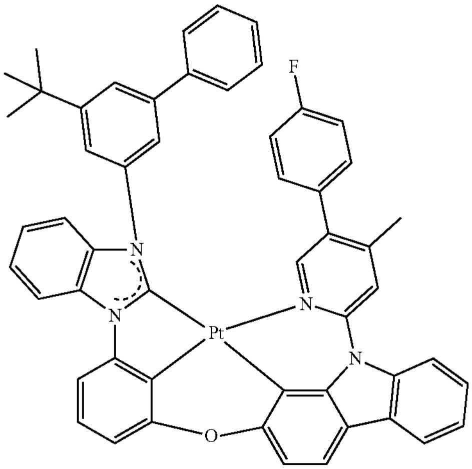
523
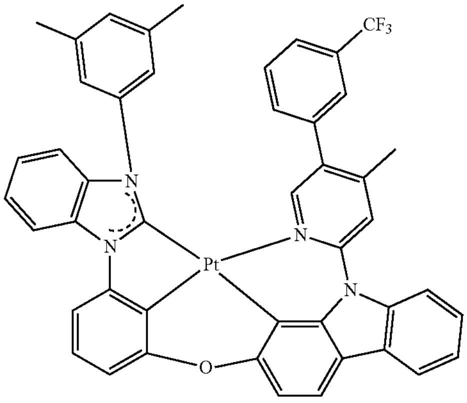
524
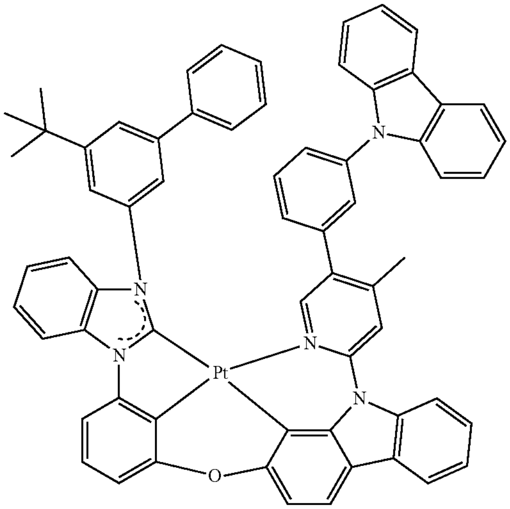
525
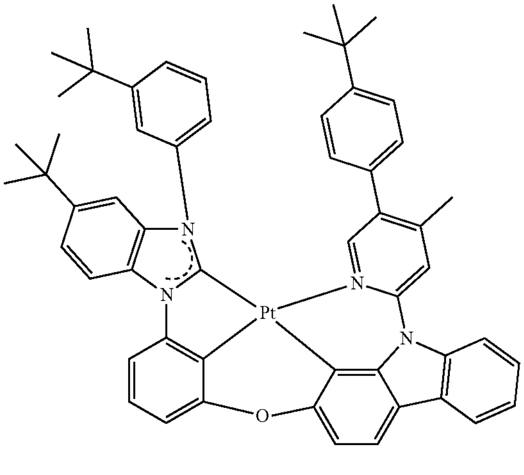
526
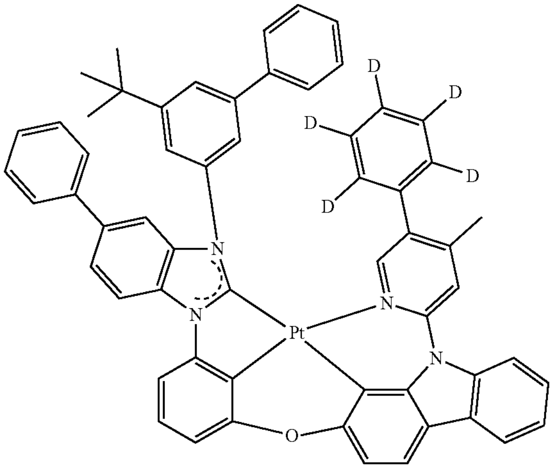
527
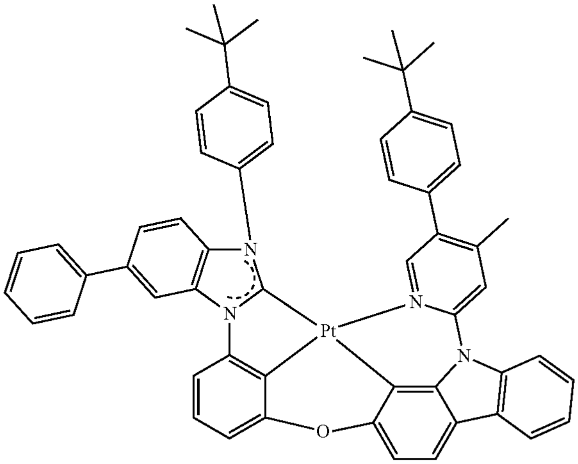

-continued
528
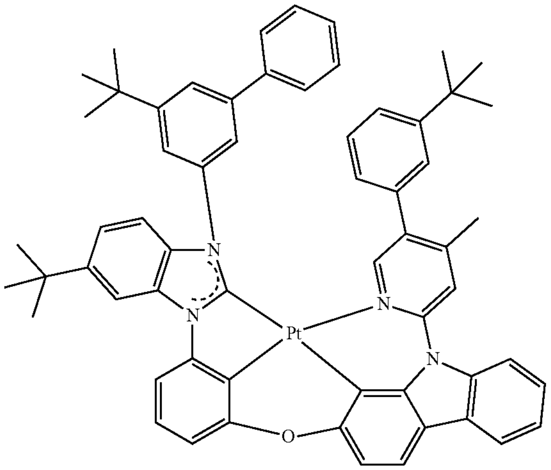
529
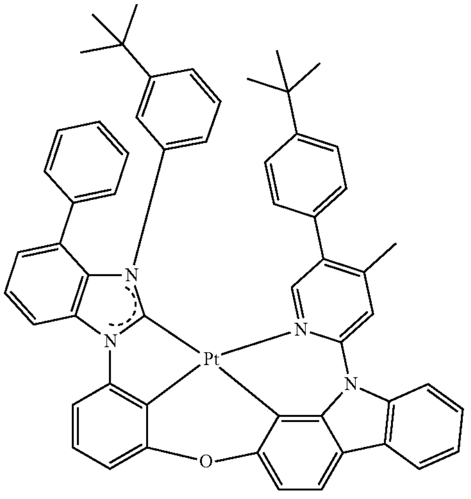
530
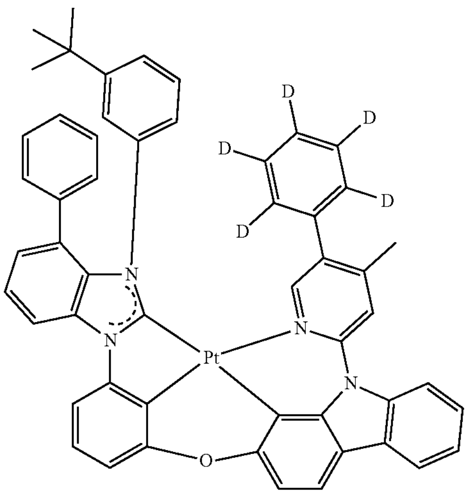
-continued
531
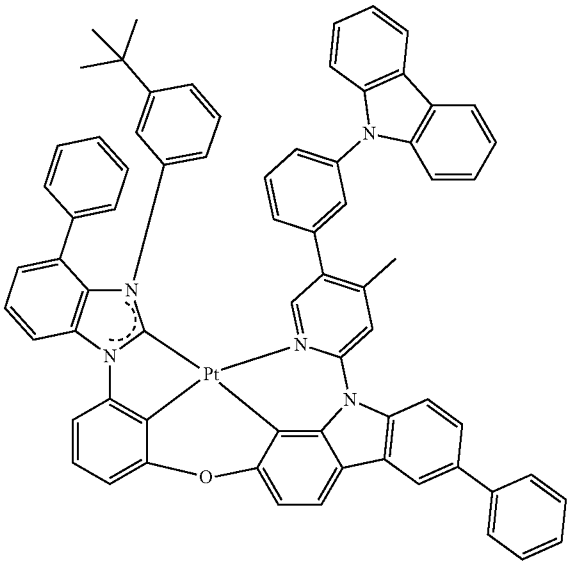
532
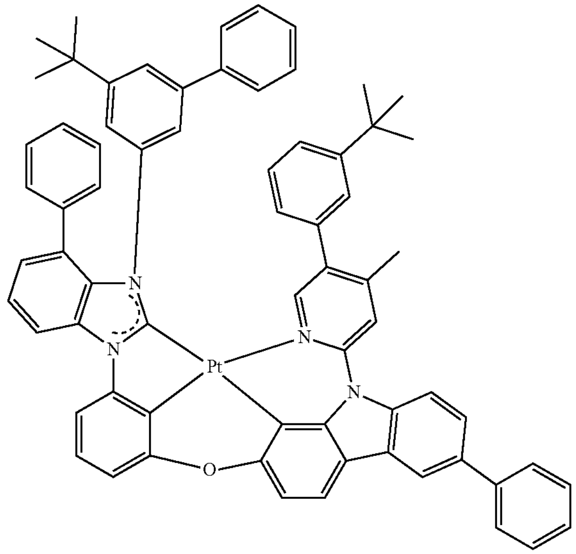
533
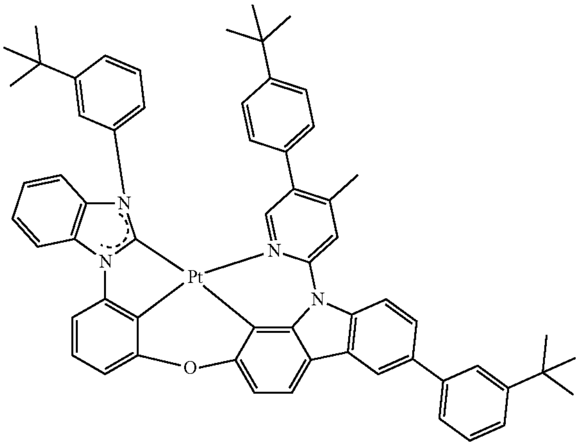

-continued
534
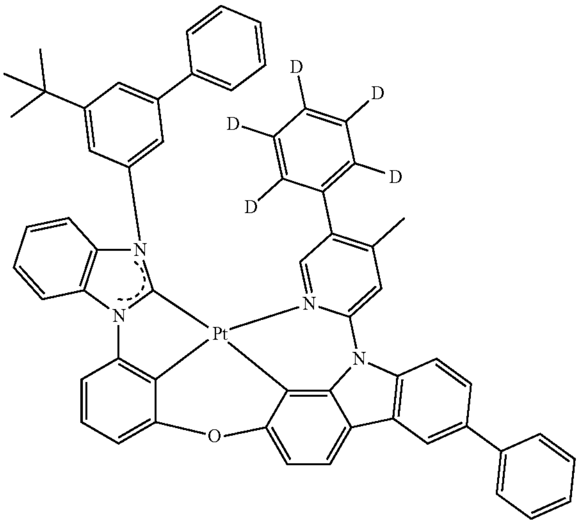
535
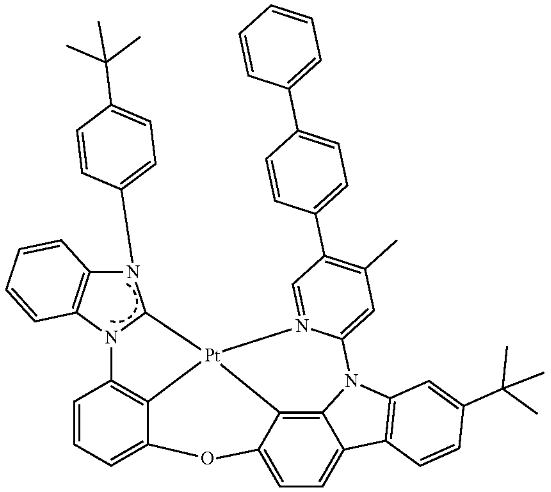
536
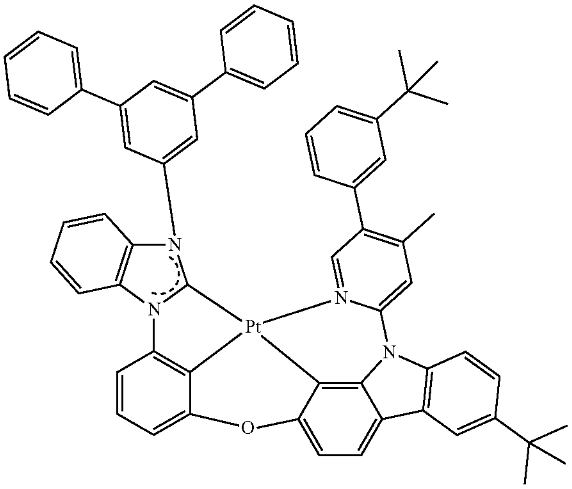
-continued
537
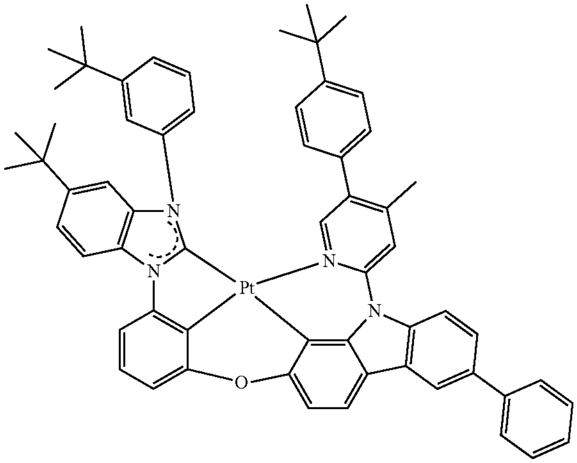
538
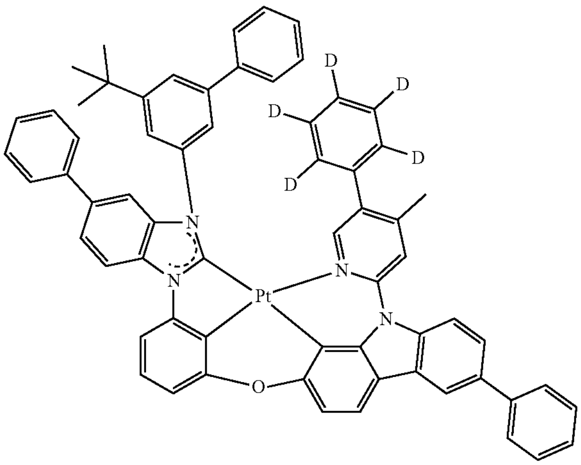
539
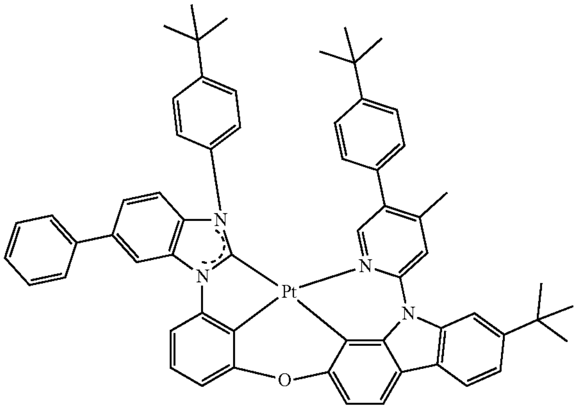

-continued
540
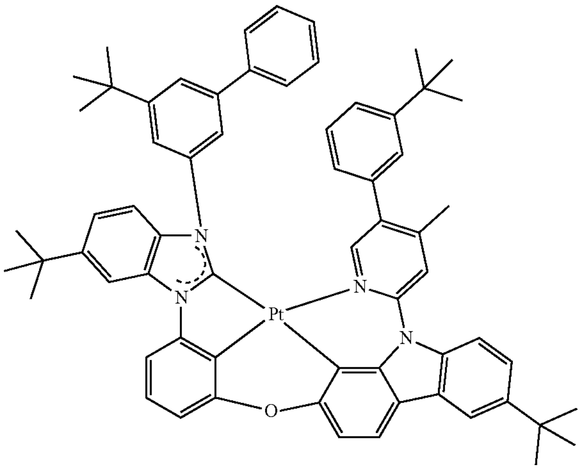
541
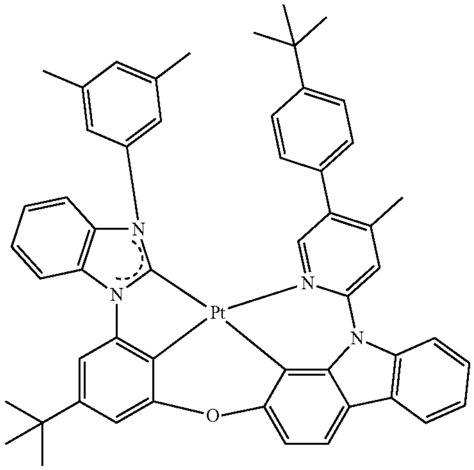
542
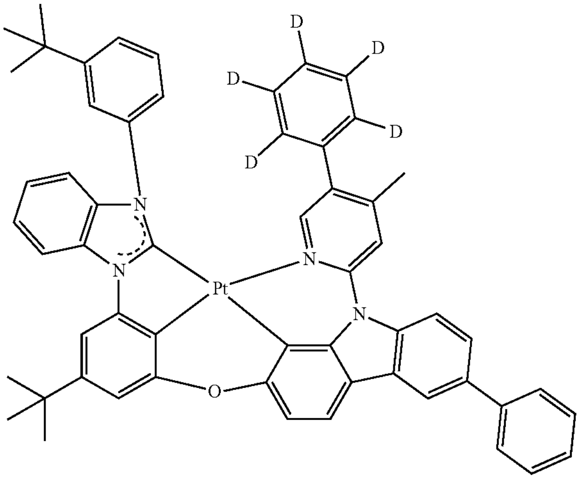
-continued
543
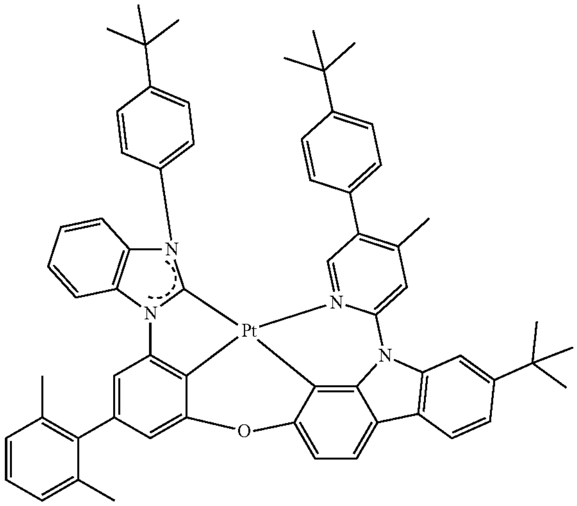
544
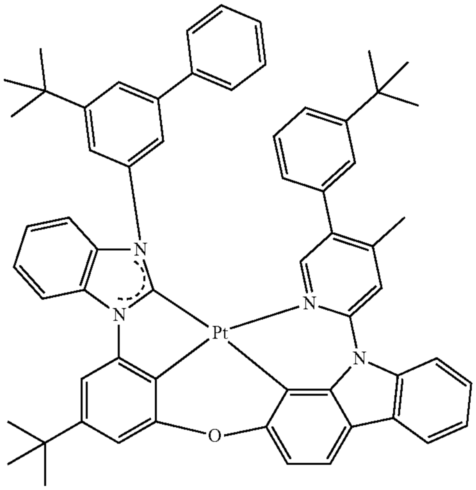
545
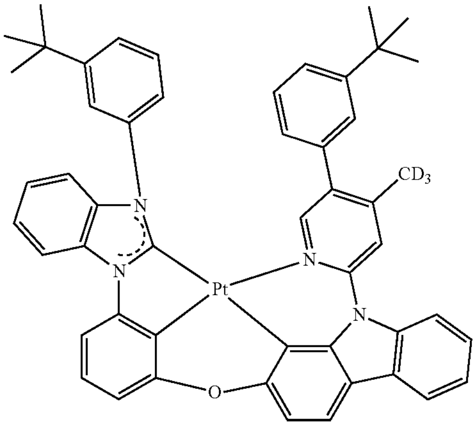

-continued
546
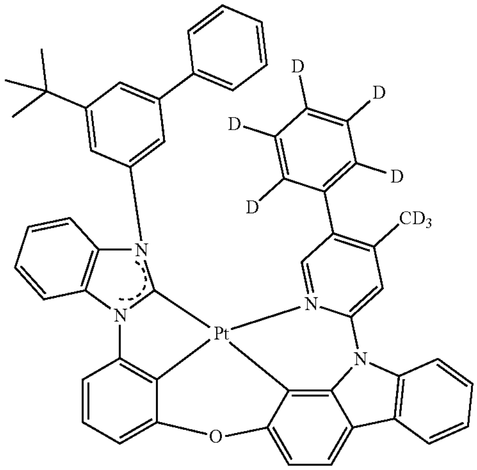
547
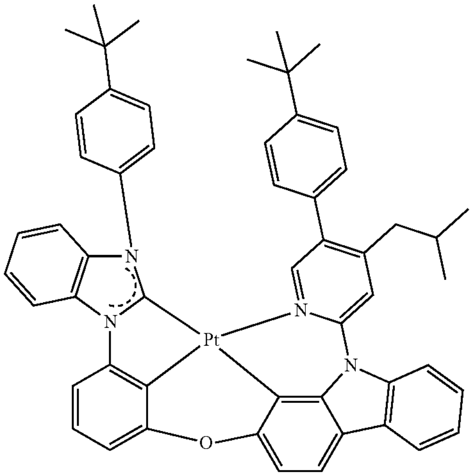
548
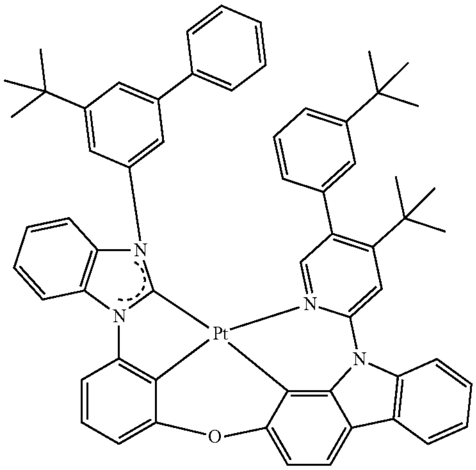
-continued
549
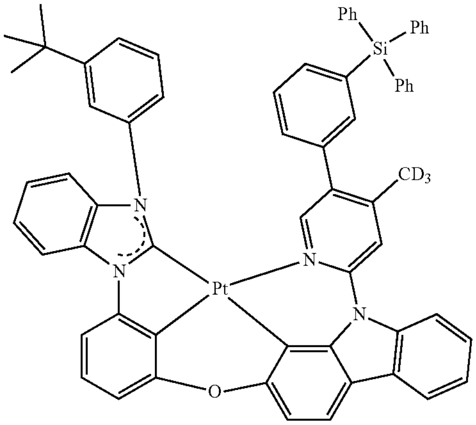
550
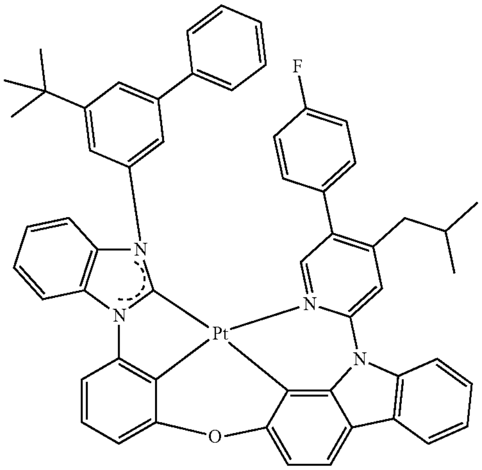
551
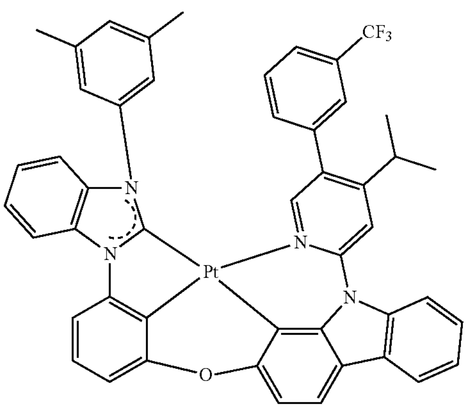

-continued
552
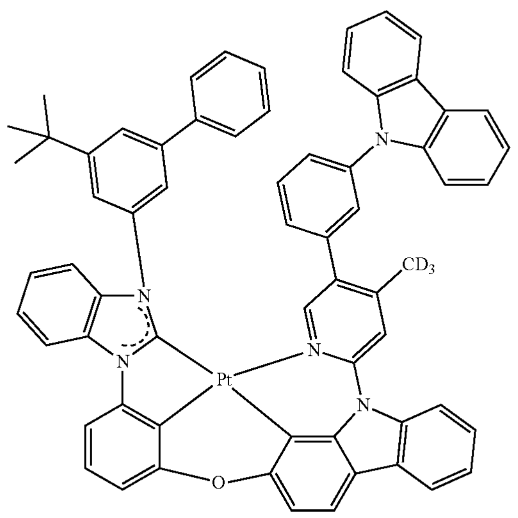
553
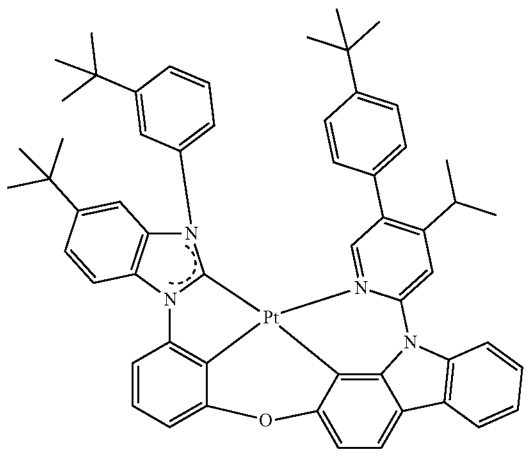
554
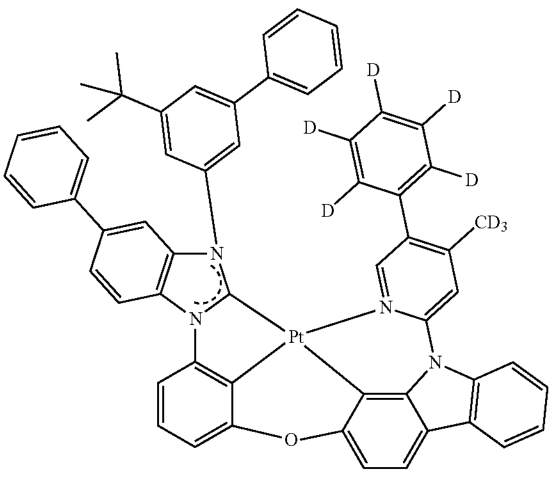
-continued
555
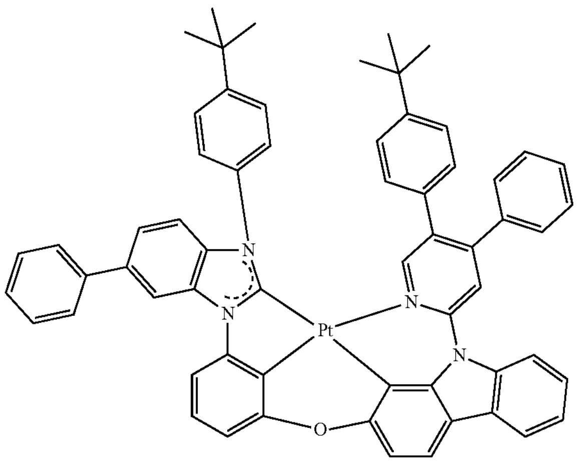
556
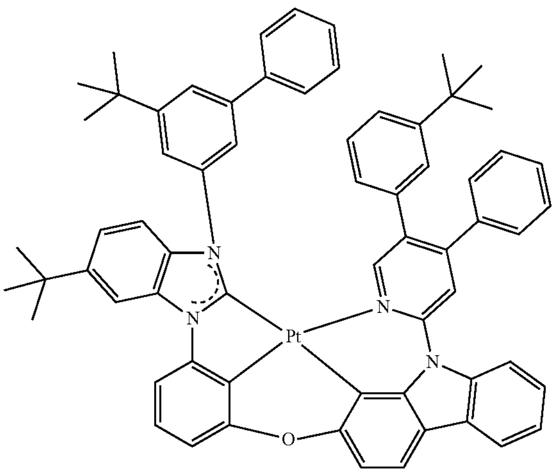
557
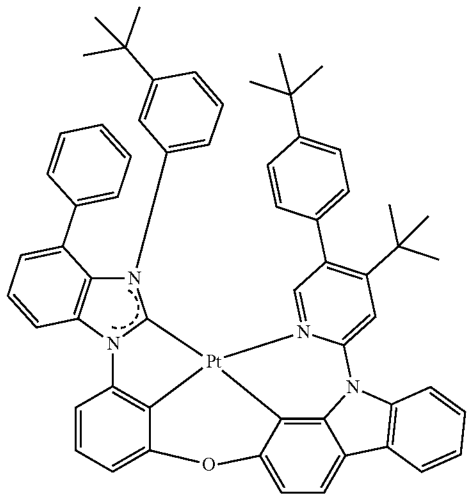

-continued
558
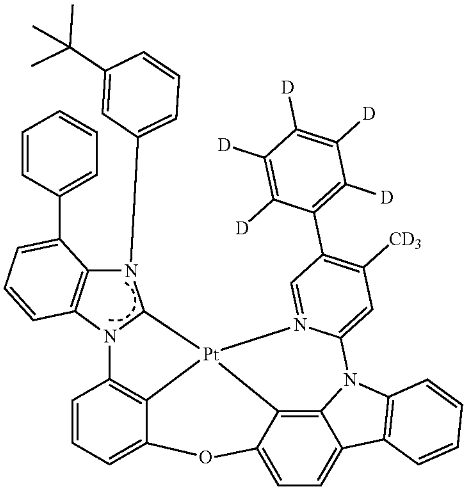
559
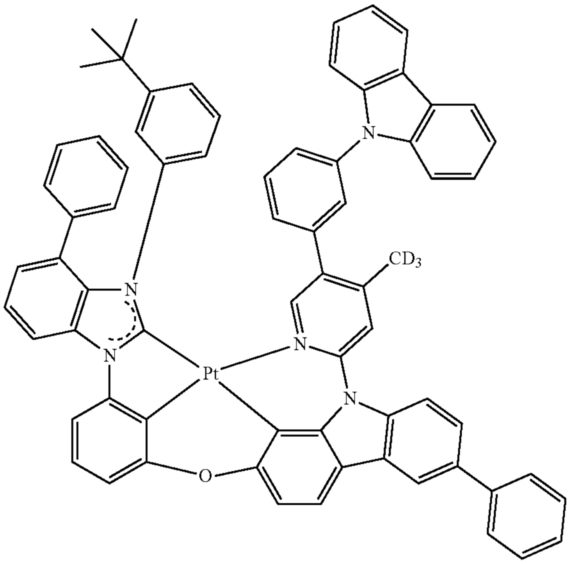
560
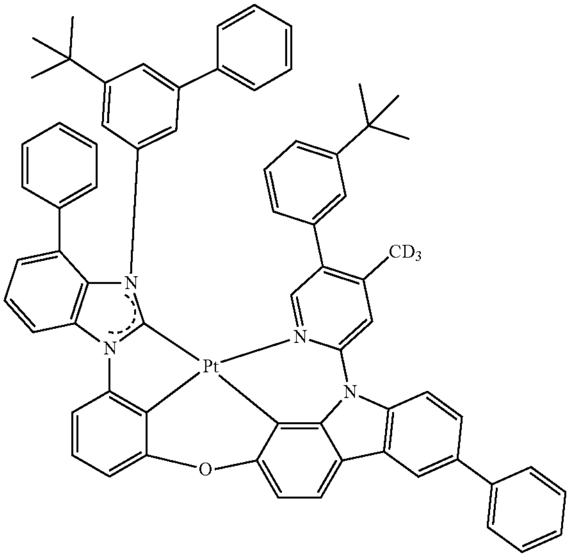
-continued
561
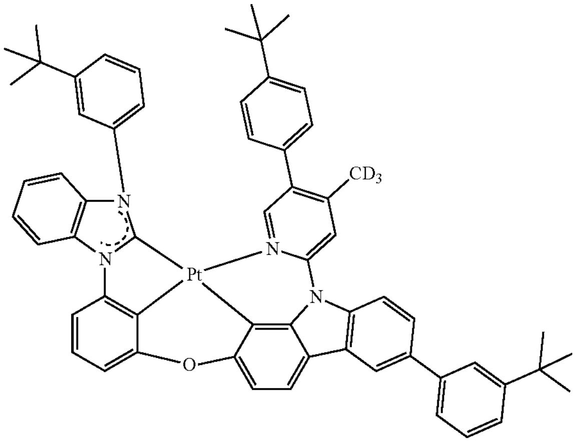
562
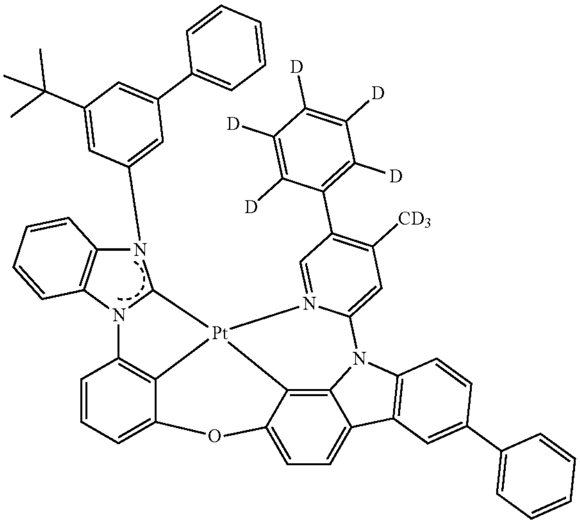
563
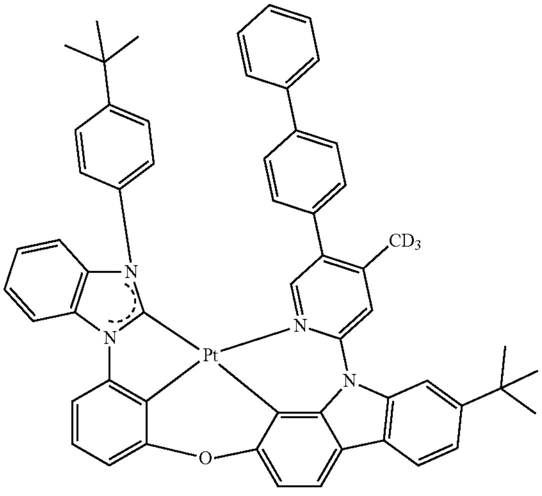

-continued
564
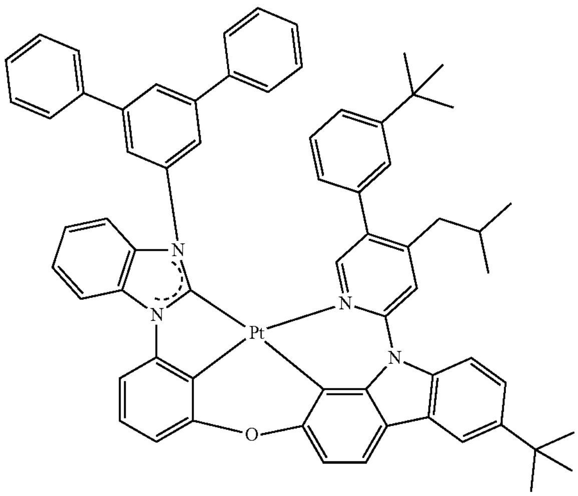
565
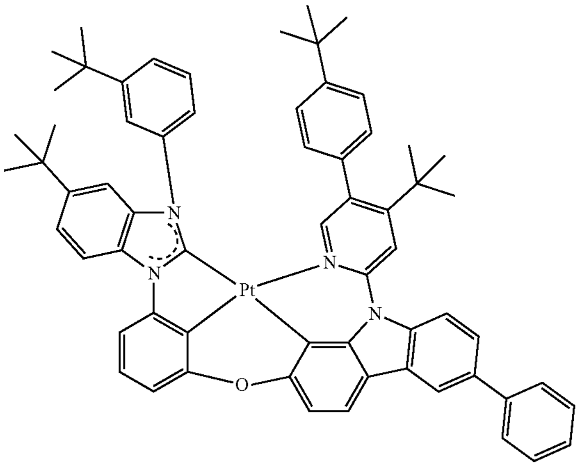
566
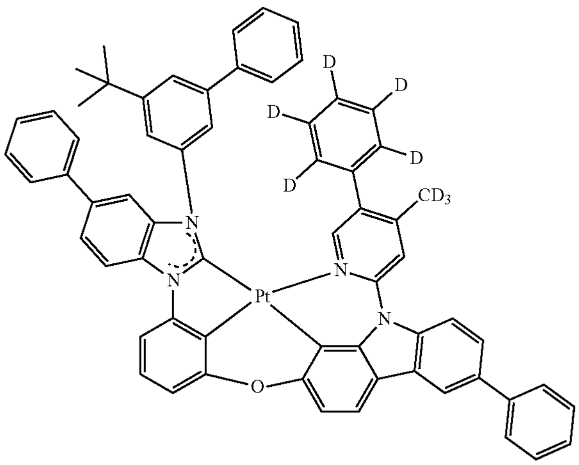
-continued
567
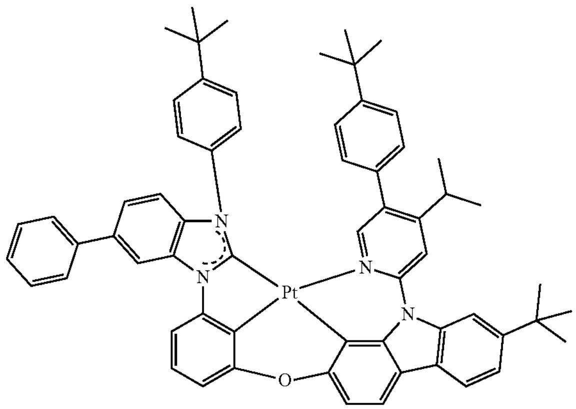
568
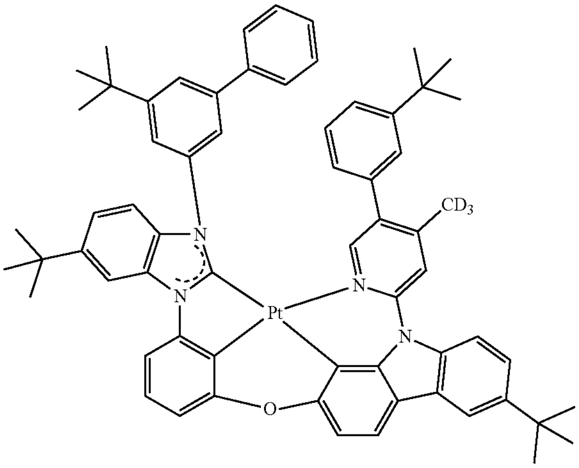
569
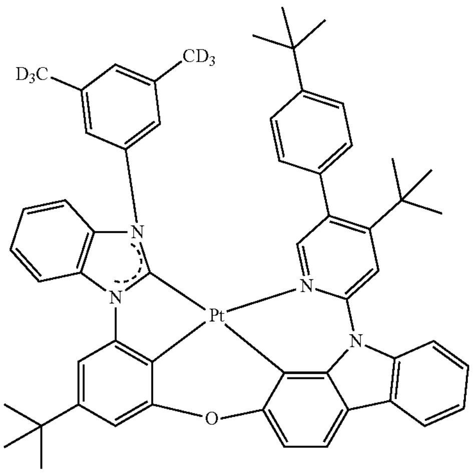

-continued
570
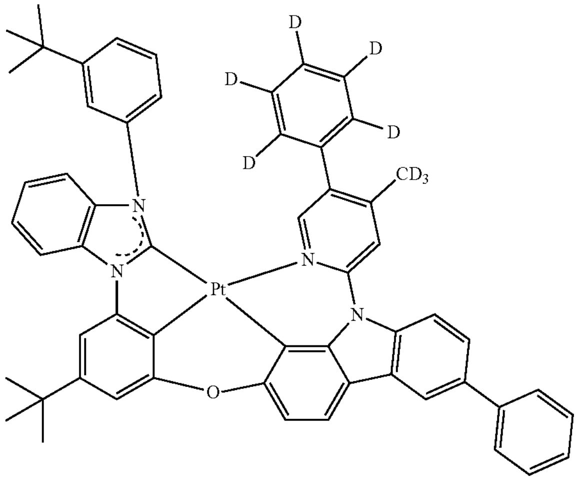
571
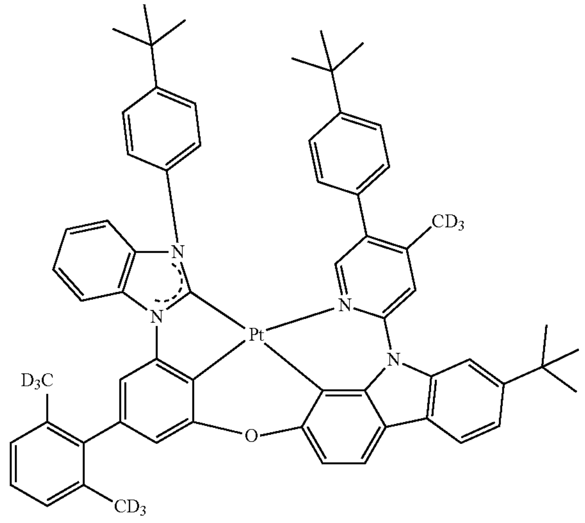
572
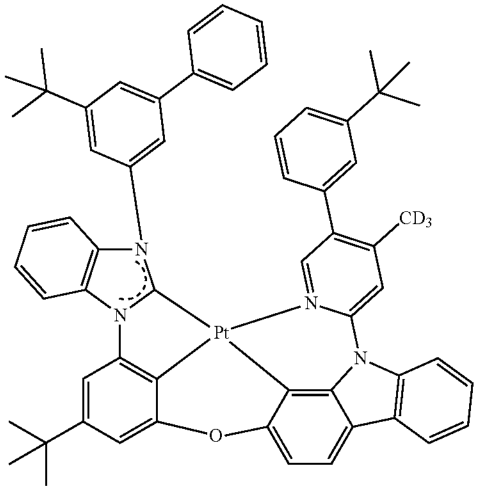
-continued
573
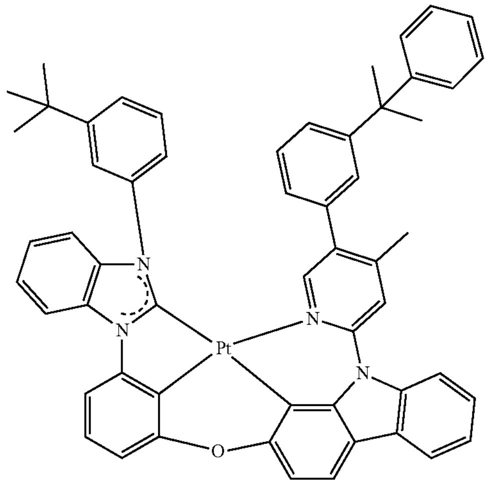
574
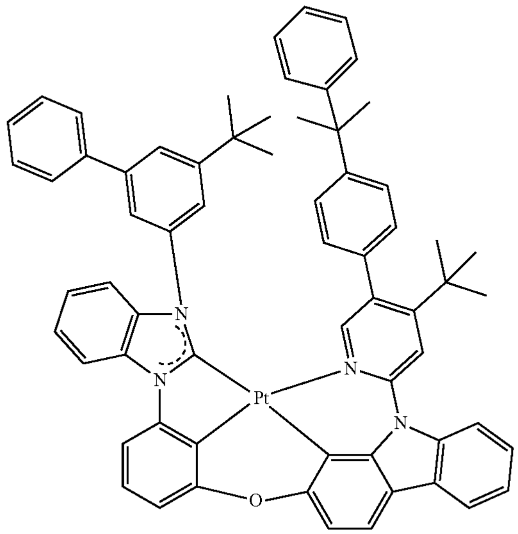
575
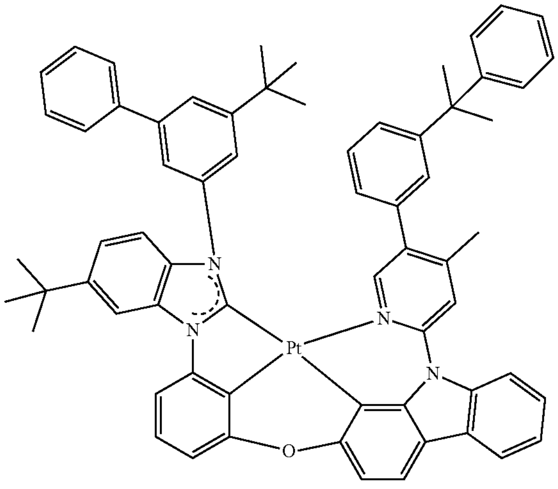

-continued
576
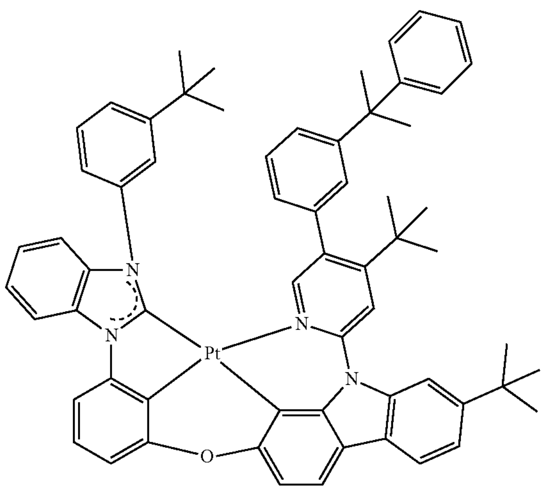
577
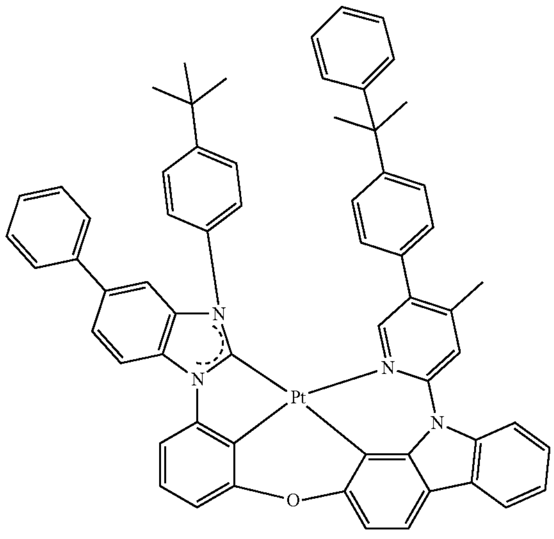
578
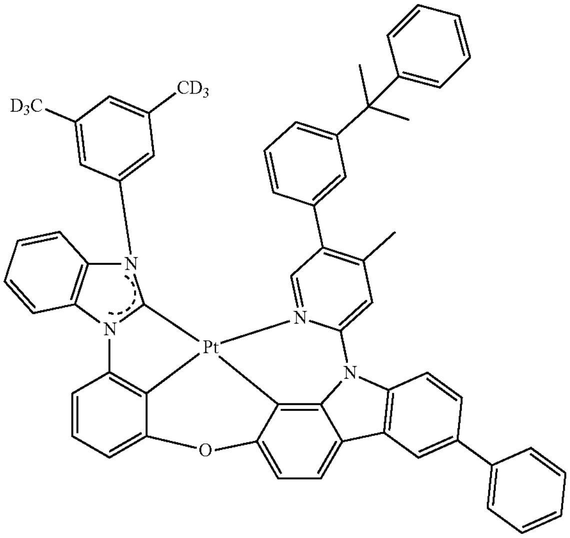
-continued
579
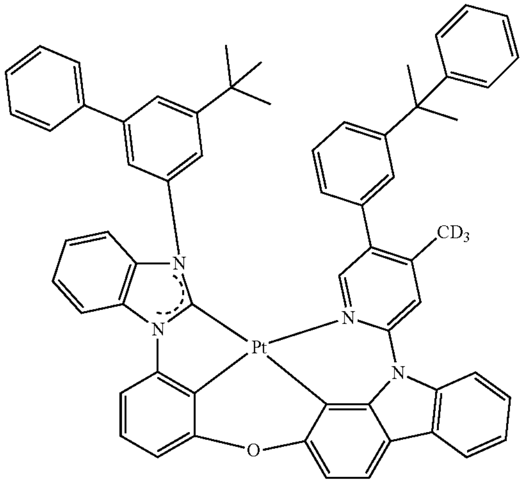
580
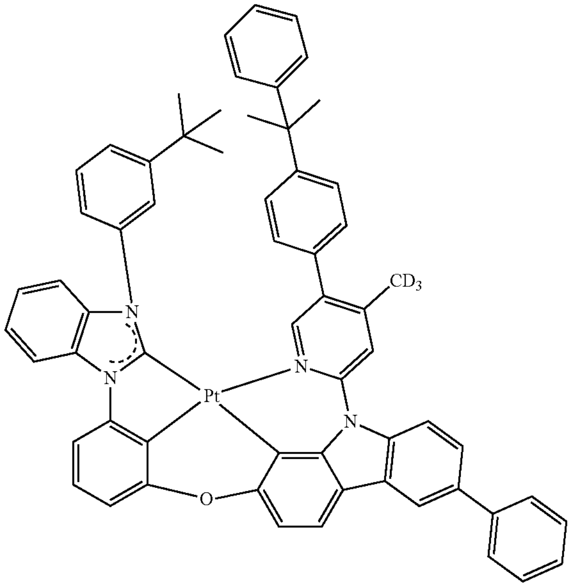
581
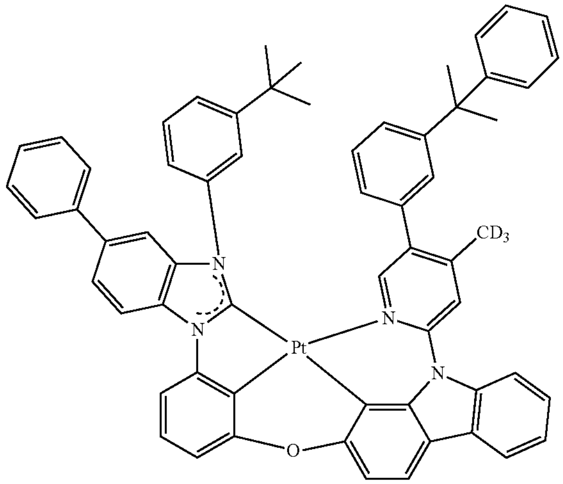

582
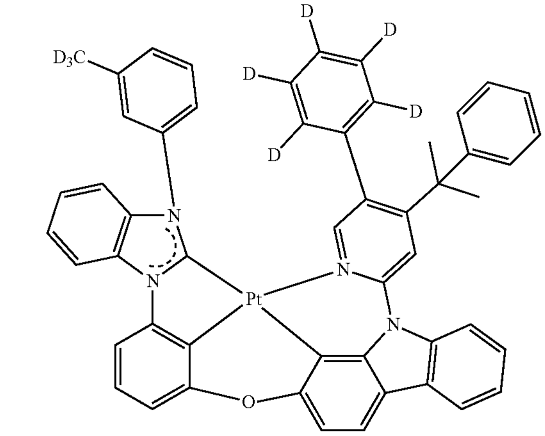
583
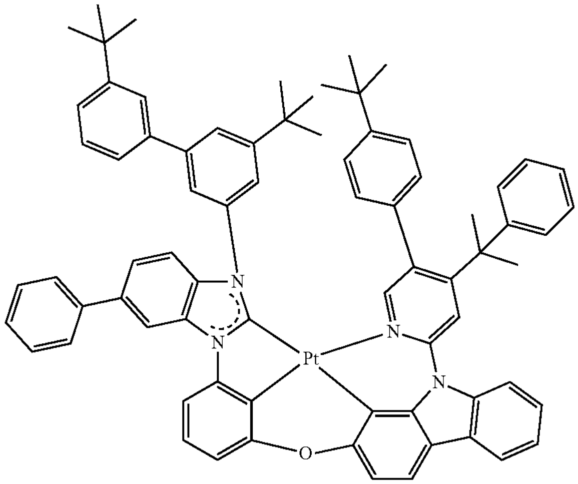
584
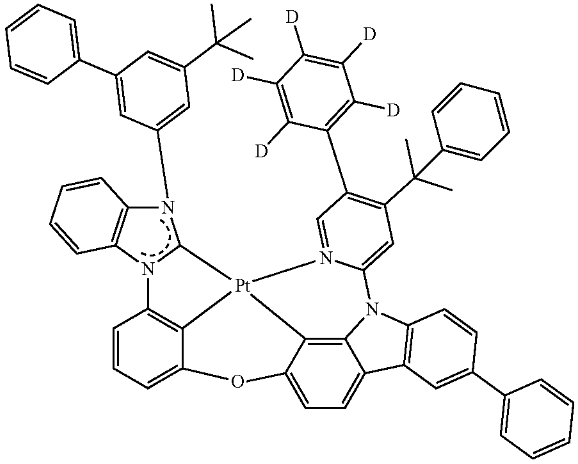
585
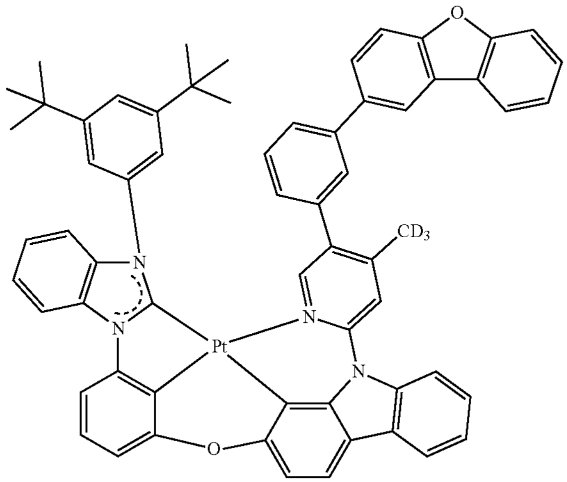
586
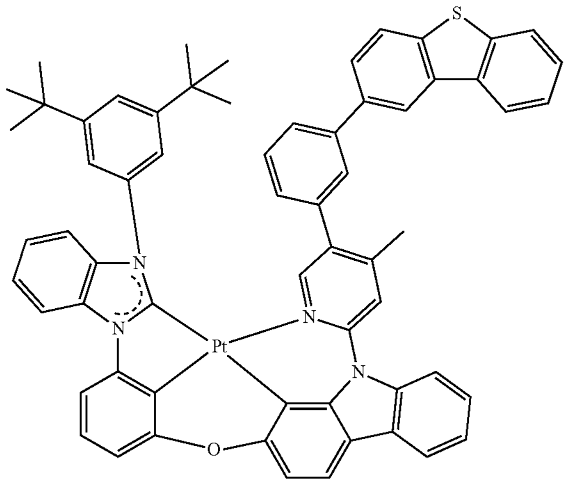
587
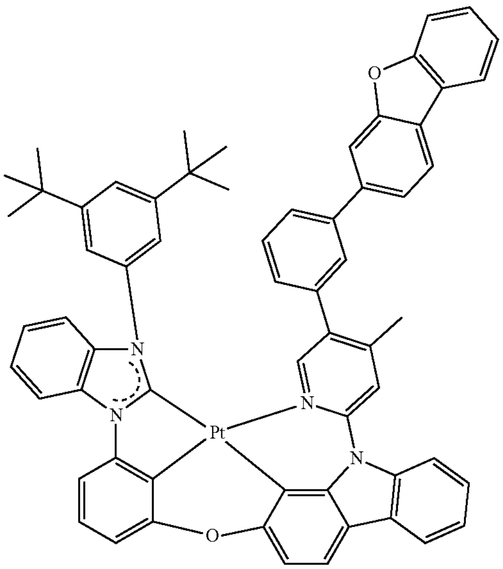

-continued
588
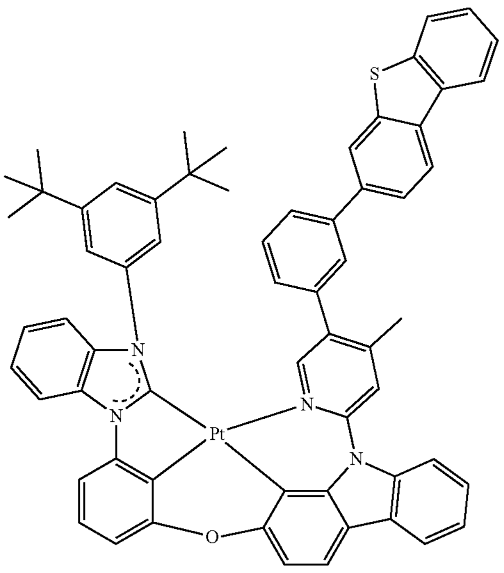
589
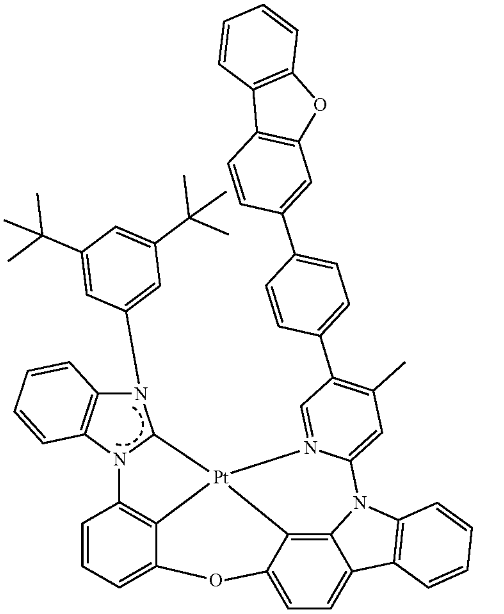
-continued
590
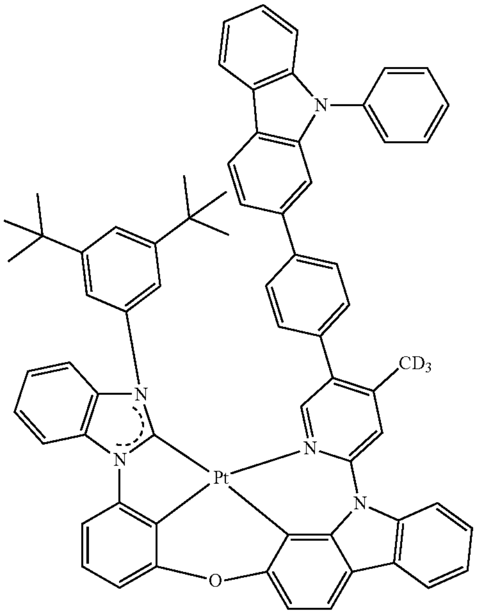
591
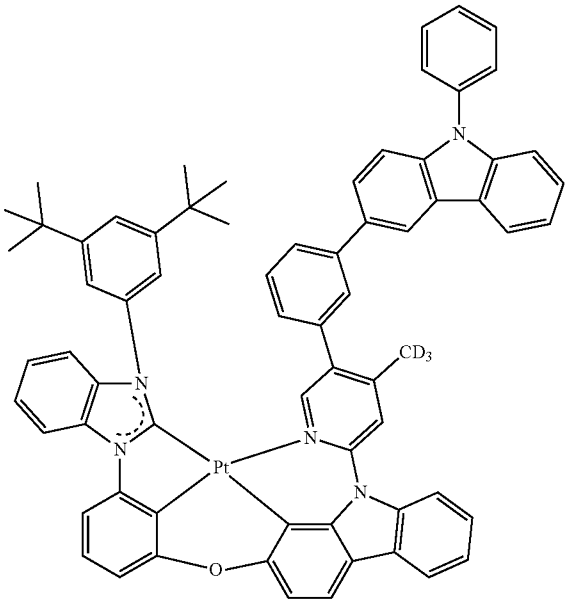

-continued
592
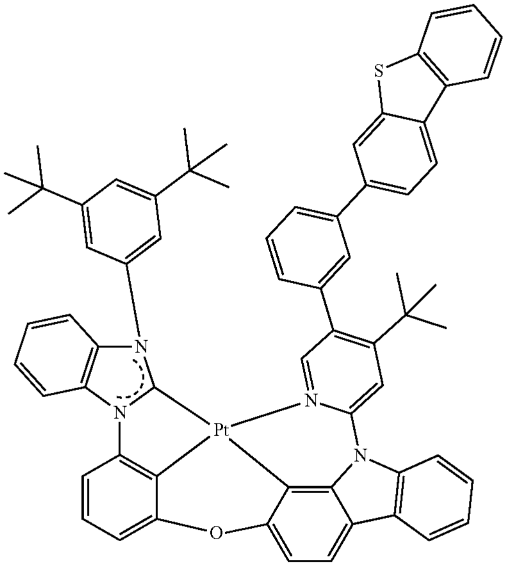
593
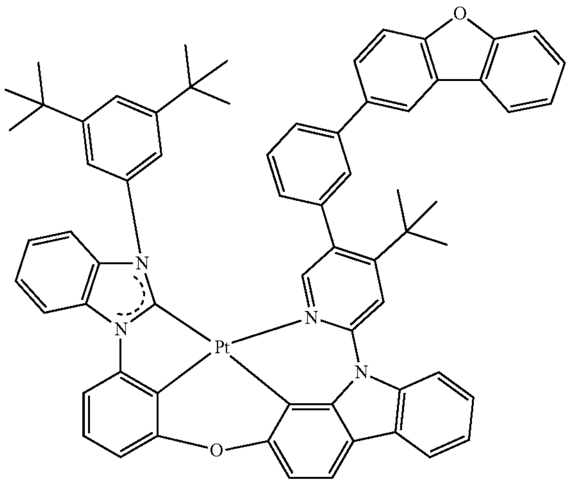
594
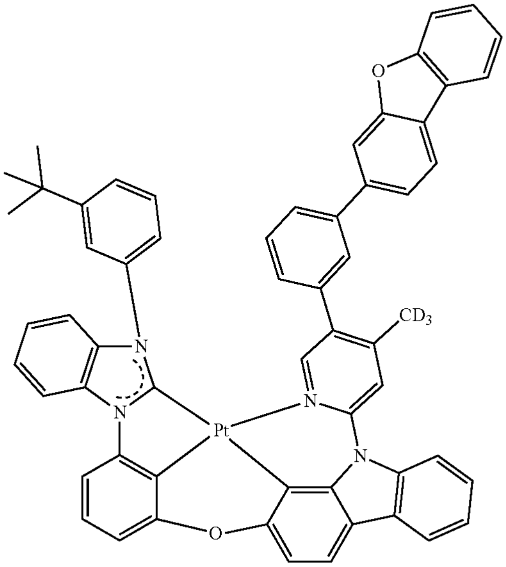
595
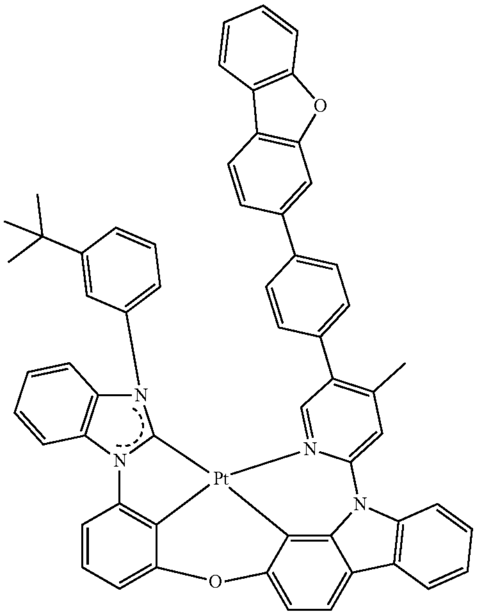
596
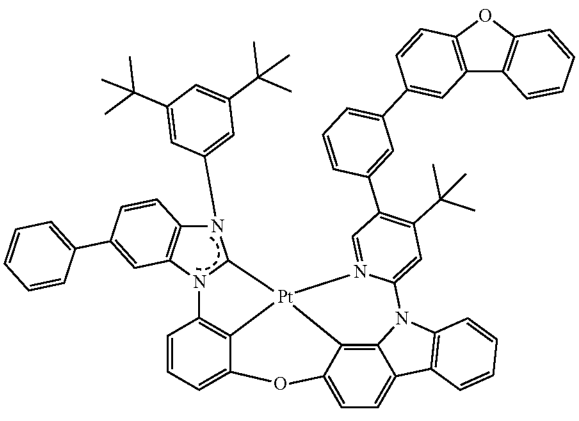

-continued
597
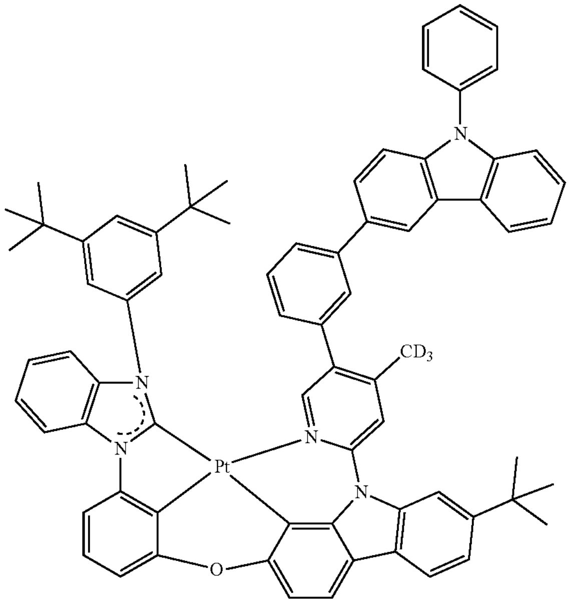
598
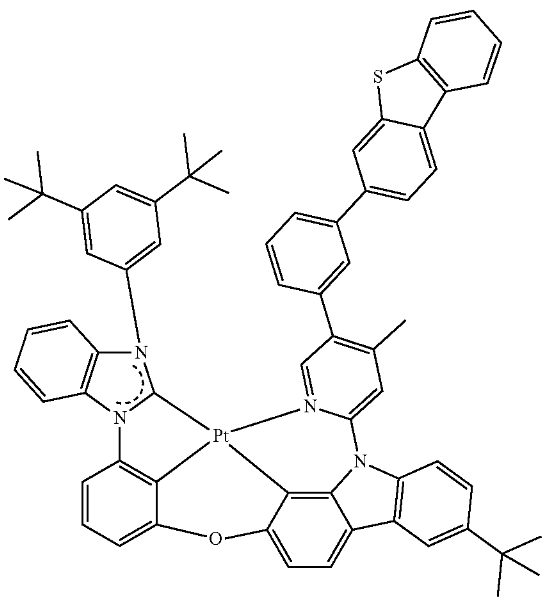
-continued
599
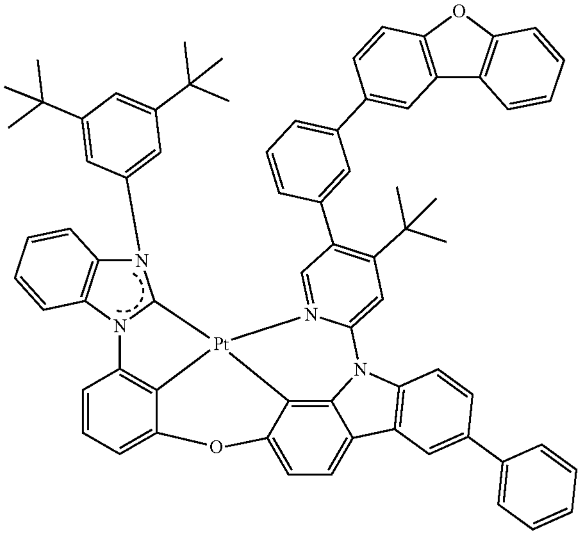
600
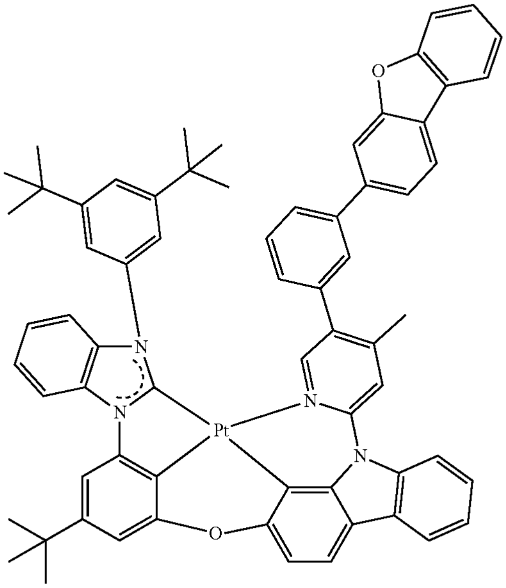
601
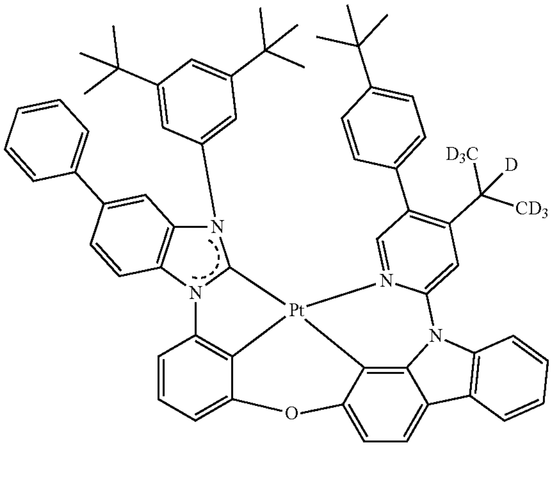

-continued
602
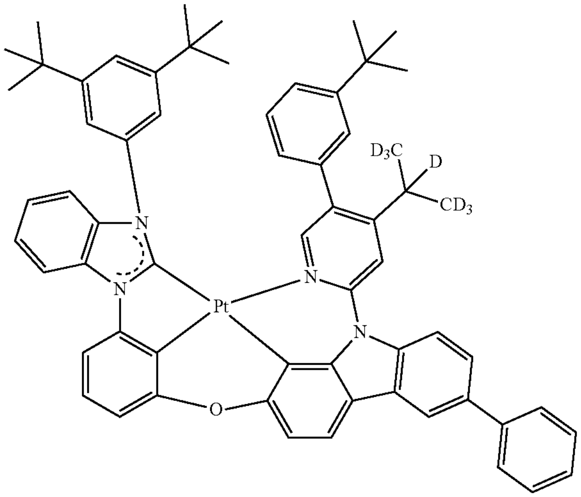
603
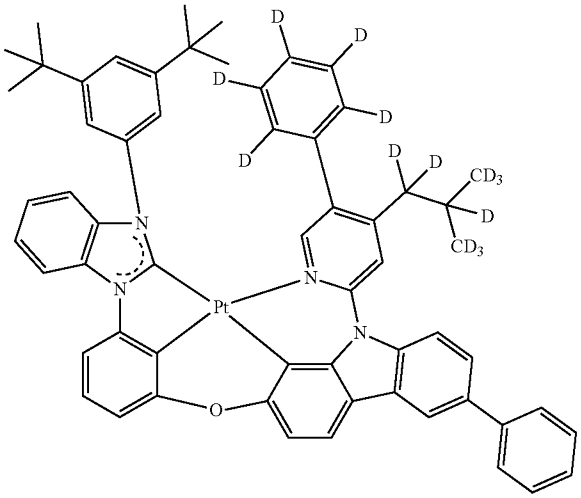
604
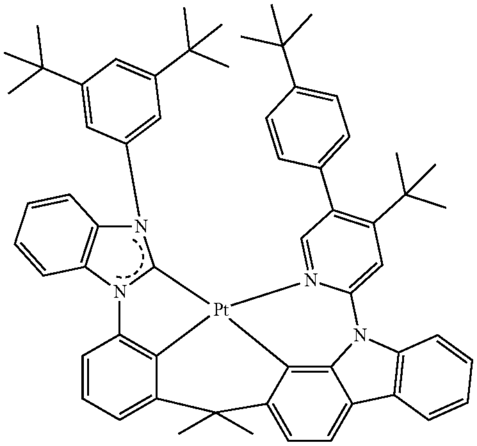
-continued
605
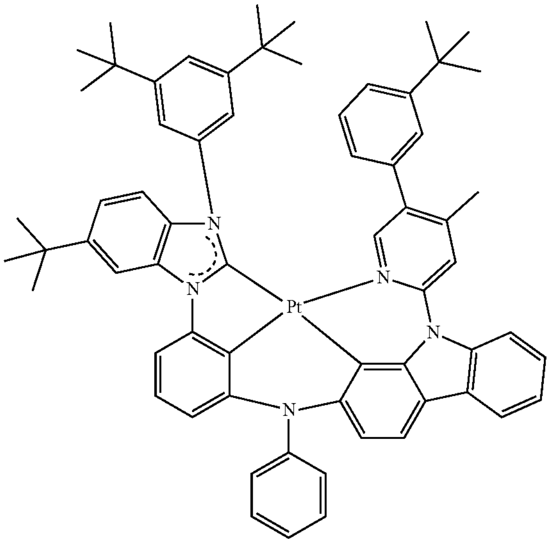
606
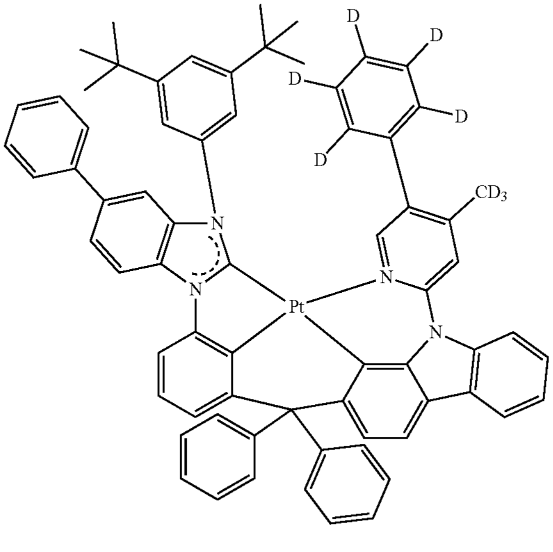
607
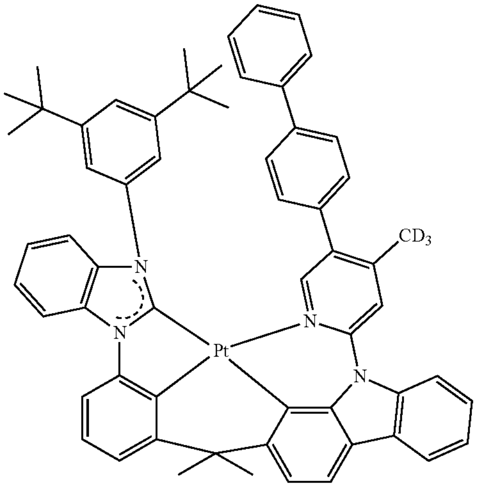

-continued

608

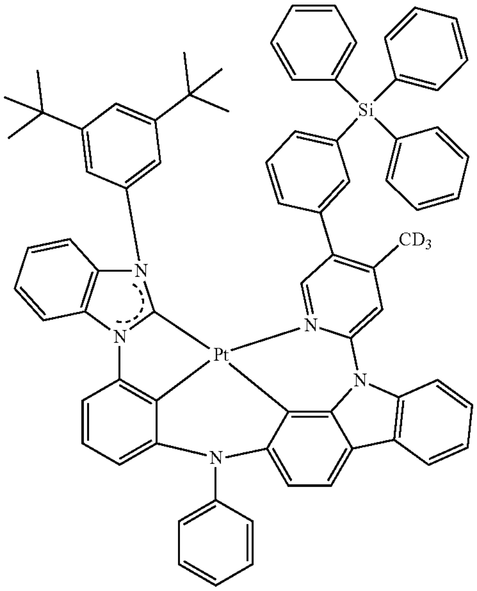

The organometallic compound satisfies the structure of Formula 1, and due to the structure of $L_{11}$ which is the ligand represented by Formula 1-1 in which ring $A_{10}$ is substituted with An which is a substituted phenyl group and ring $A_{40}$ is substituted with $Ar_2$ which is a substituted phenyl group, the photochemically stability of the organometallic compound represented by Formula 1 may be improved. Accordingly, the organometallic compound represented by Formula 1 may be suitable for luminescence of deep blue light, and in this regard, an electronic device, such as an organic light-emitting device, including the organometallic compound represented by Formula 1 may have excellent luminescence efficiency, lifespan, and color purity.

In addition, $Ar_2$ in $L_{11}$ which is the ligand represented by Formula 1-1 may be substituted with an alkyl group and/or an aryl group at an appropriate position, and accordingly, the organometallic compound including the ligand may be suitable for emission of deep blue light. In an embodiment, when $Ar_2$ is substituted with an alkyl group, the electron donation properties may be enhanced while the color coordinate range is properly maintained. In one or more embodiments, when $Ar_2$ is substituted with an aryl group, the electronic stability of the compound may be improved. Thus, an organic light-emitting device including the organometallic compound may have improved efficiency and a long lifespan.

Although not limited by a specific theory, the electron donating properties of $L_{11}$ which is the ligand may be enhanced by substituents, such as $Ar_1$ and $Ar_2$. Accordingly, the charge transfer may be improved to improve the structural stability of the organometallic compound. In this regard, by including the organometallic compound, an organic light-emitting device may have improved efficiency and lifespan.

For example, highest occupied molecular orbital (HOMO), lowest unoccupied molecular orbital (LUMO), and triplet ($T_1$) energy levels of Compounds 1 to 7 are structure-optimized at the (B3LYP, 6-31G(d,p)) level by using the DFT method of the Gaussian program and evaluated, and results thereof are shown in Table 1.

TABLE 1

| Compound No. | HOMO (eV) | LUMO (eV) | $T_1$ energy level (eV) |
|---|---|---|---|
| Compound 1 | −4.66 | −1.27 | 2.64 |
| Compound 2 | −4.66 | −1.26 | 2.63 |
| Compound 3 | −4.66 | −1.26 | 2.63 |
| Compound 4 | −4.62 | −1.21 | 2.64 |
| Compound 5 | −4.66 | −1.26 | 2.64 |
| Compound 6 | −4.56 | −1.14 | 2.64 |
| Compound 7 | −4.72 | −1.19 | 2.65 |
| Compound 309 | −4.64 | −1.25 | 2.66 |
| Compound 310 | −4.67 | −1.29 | 2.66 |
| Compound 311 | −4.63 | −1.25 | 2.64 |
| Compound 312 | −4.66 | −1.29 | 2.66 |
| Compound 313 | −4.69 | −1.33 | 2.66 |

1

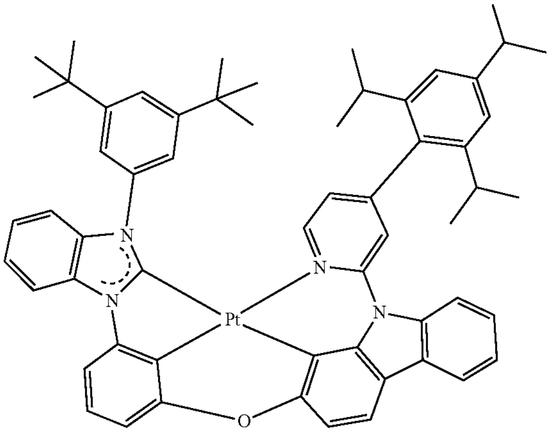

2

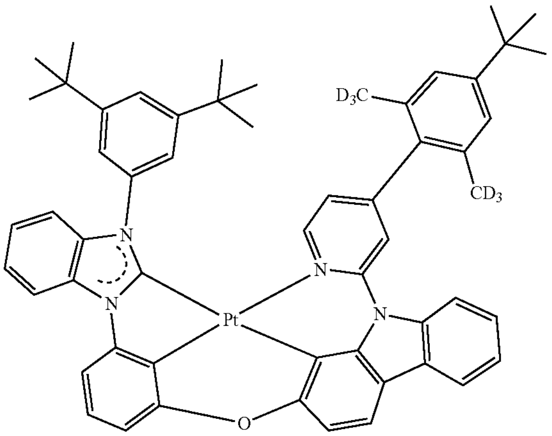

-continued
3
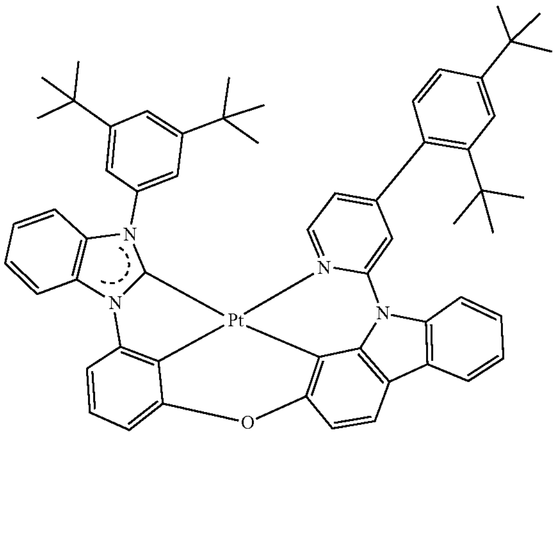
4
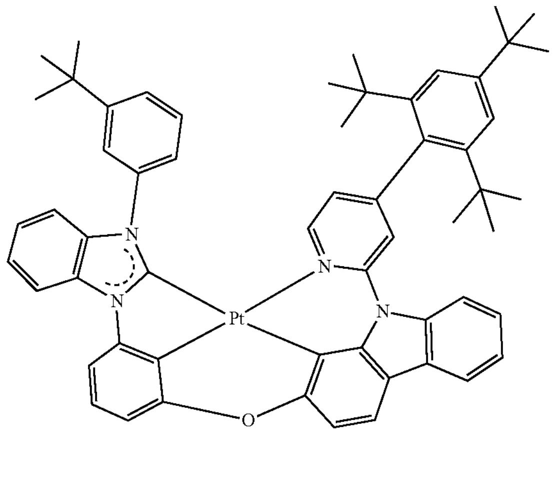
5
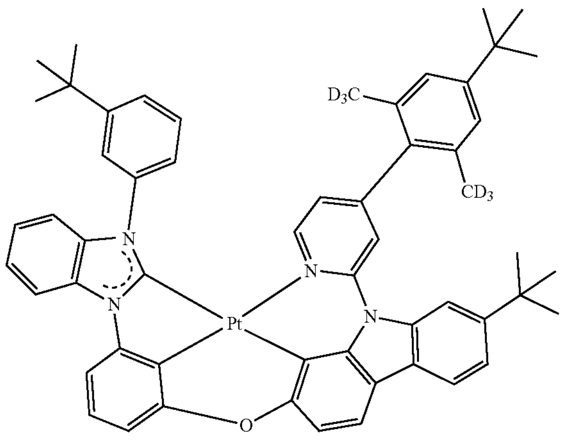
-continued
6
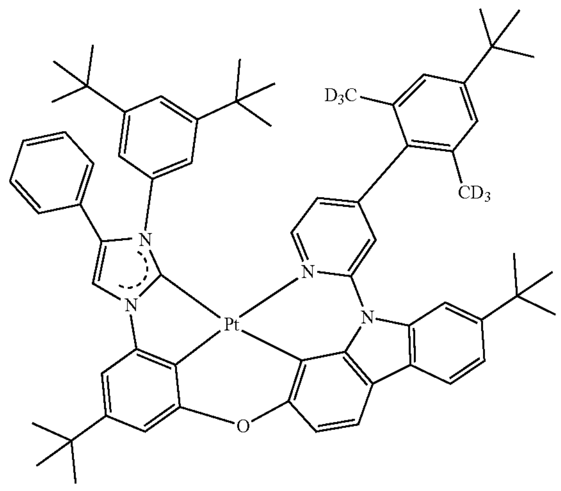
7
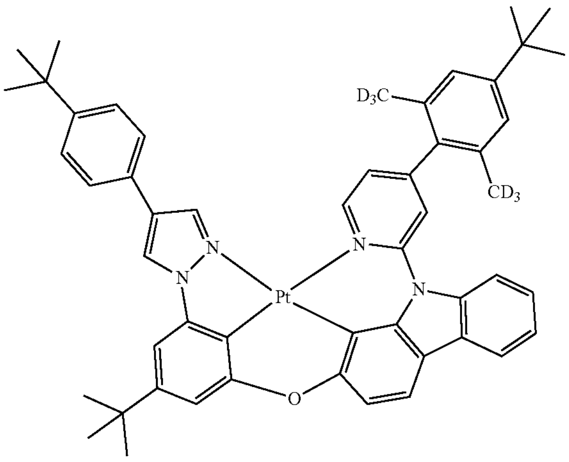
309
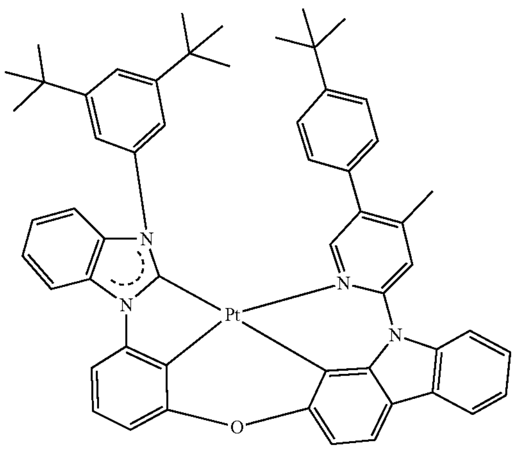

-continued

310

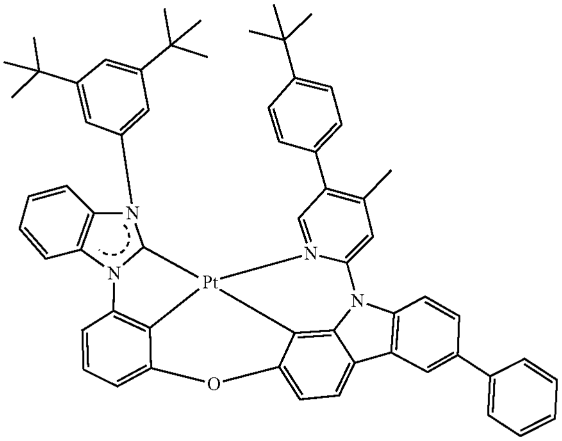

311

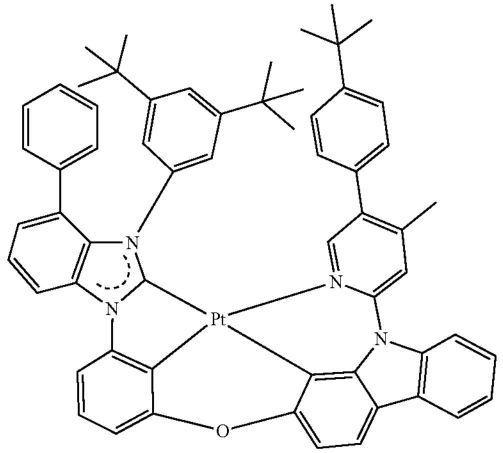

312

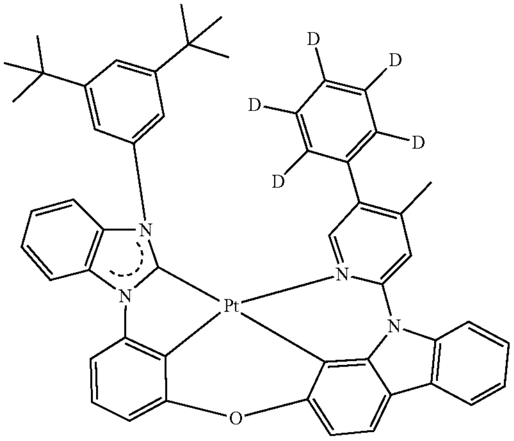

-continued

313

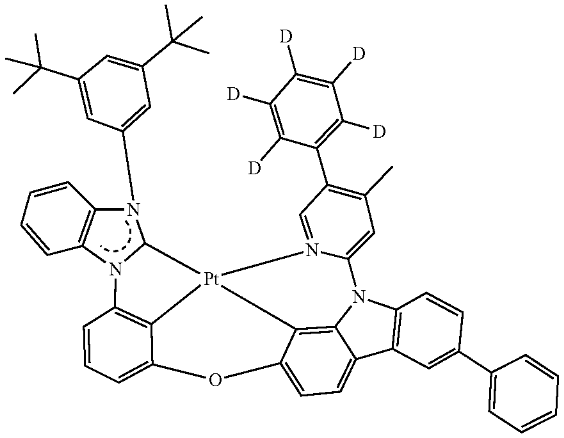

From Table 1, it is confirmed that the organometallic compound represented by Formula 1 has such electric characteristics that are suitable for use as a material for an emission layer of an electric device, such as an organic light-emitting device.

In one or more embodiments, the organometallic compound may not be one of the following compounds:

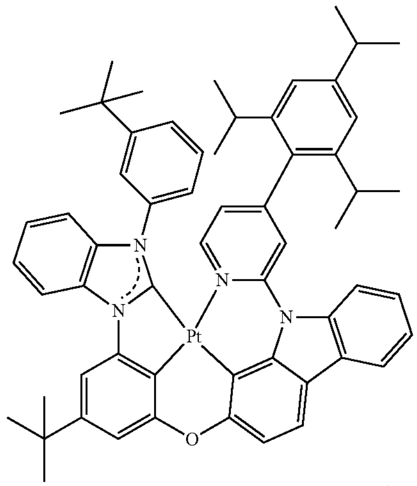

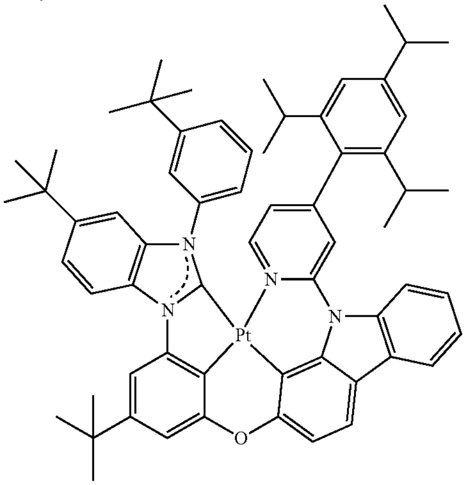

-continued
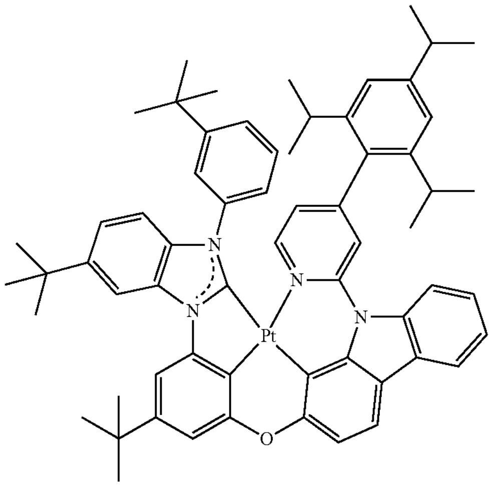
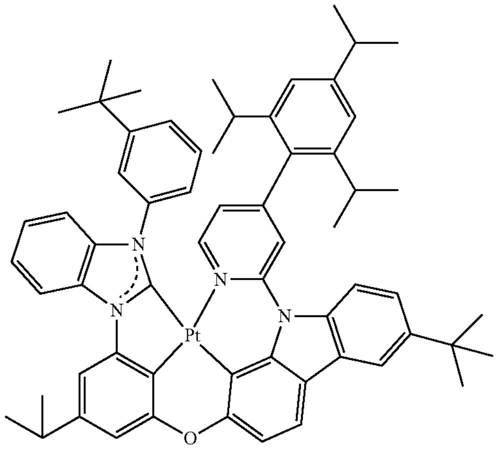
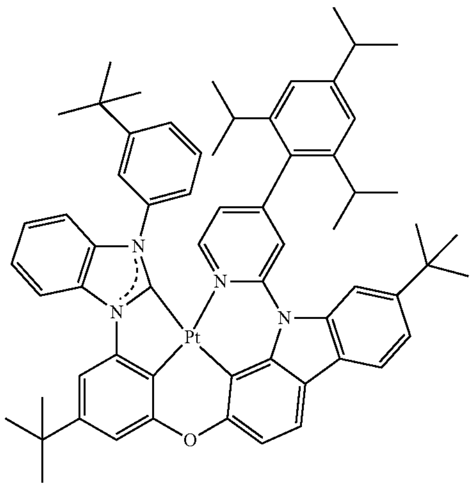
-continued
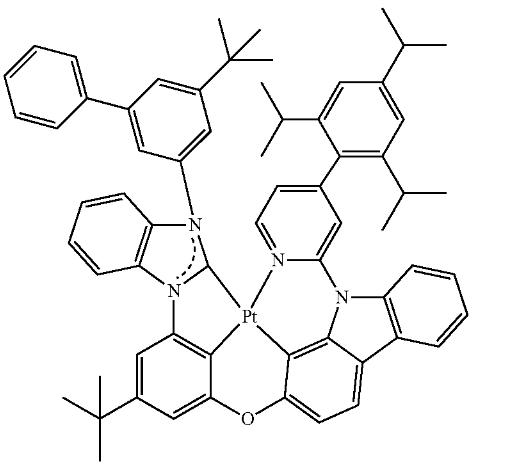
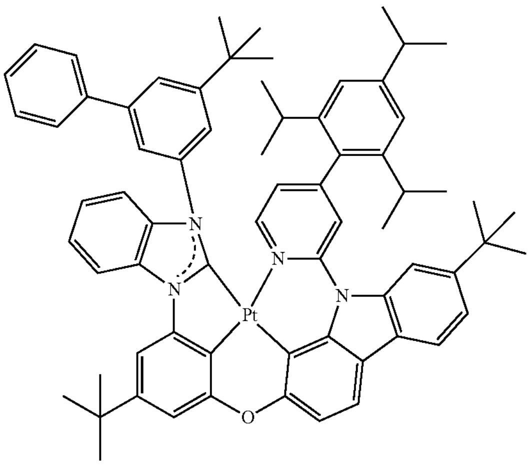
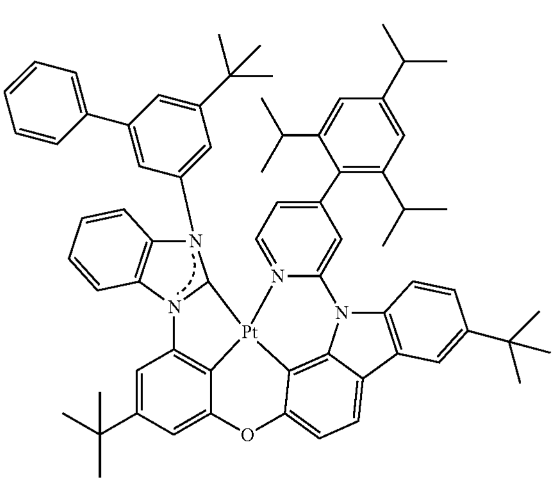

-continued
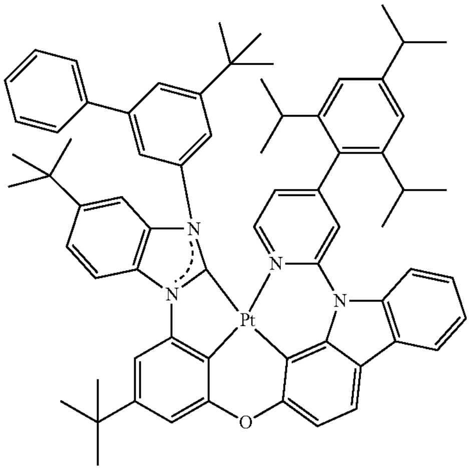
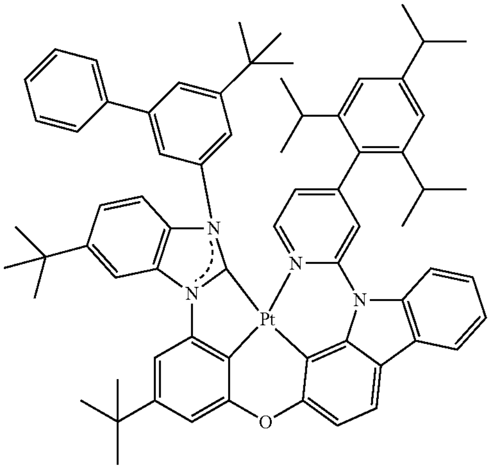
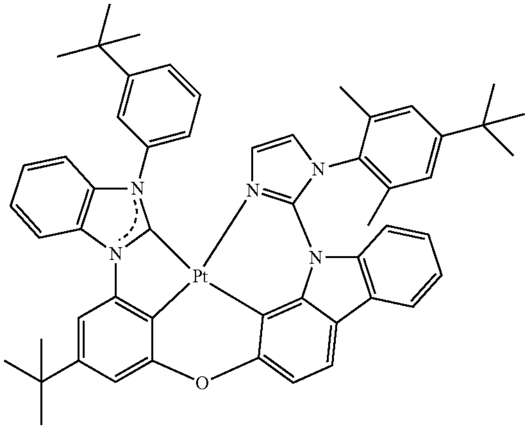
-continued
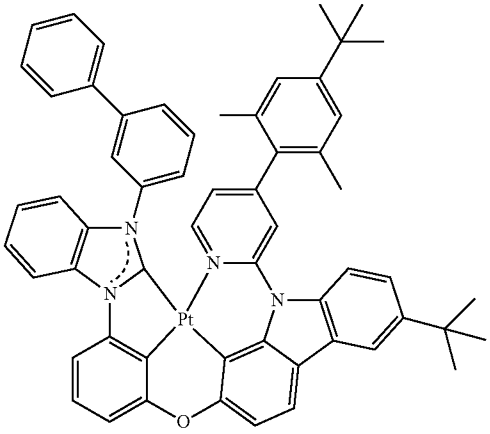
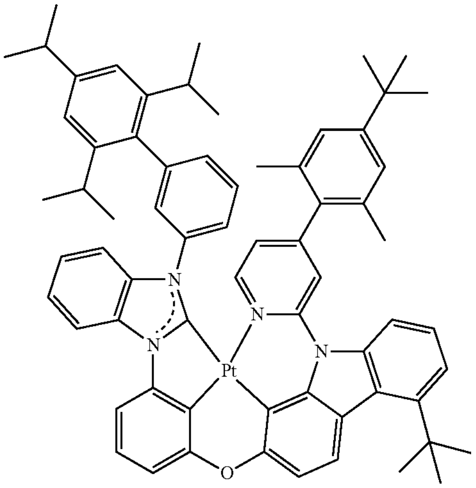
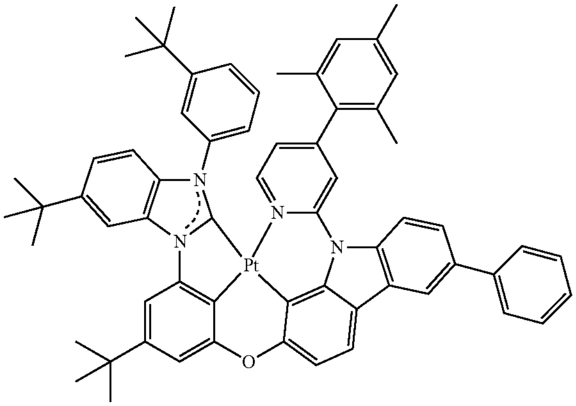

-continued
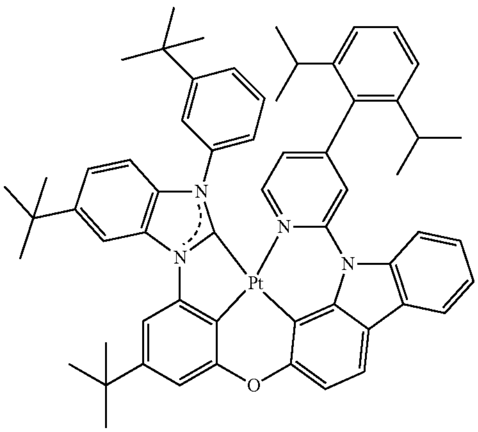
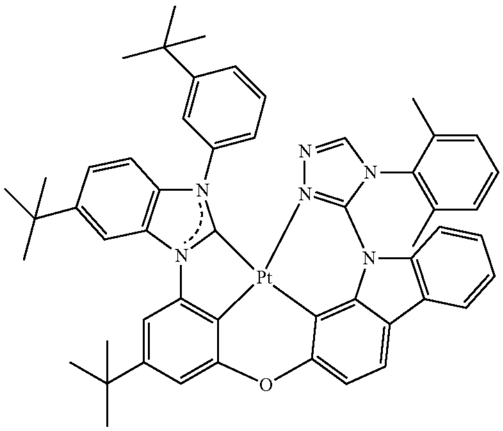
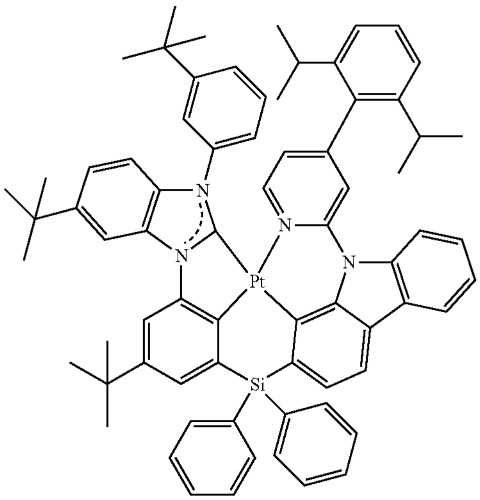
-continued
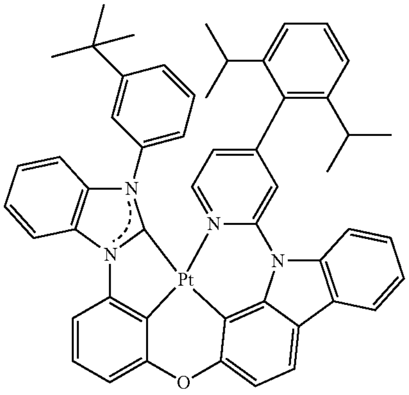
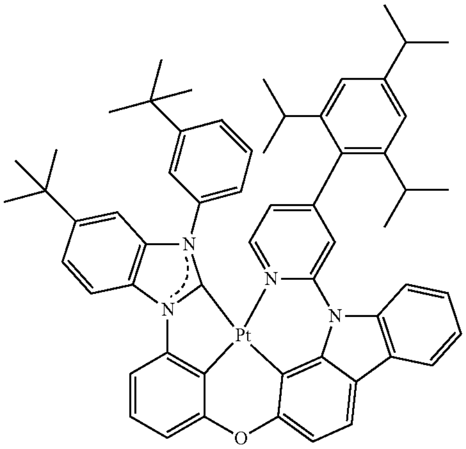
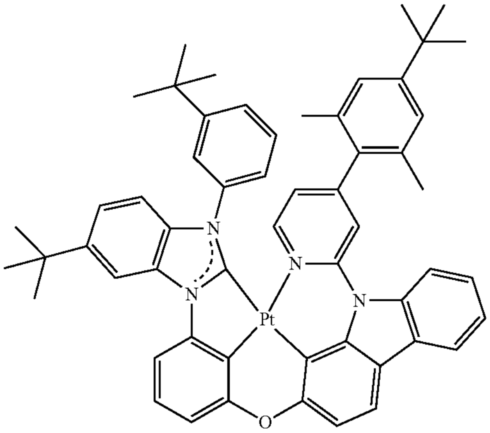
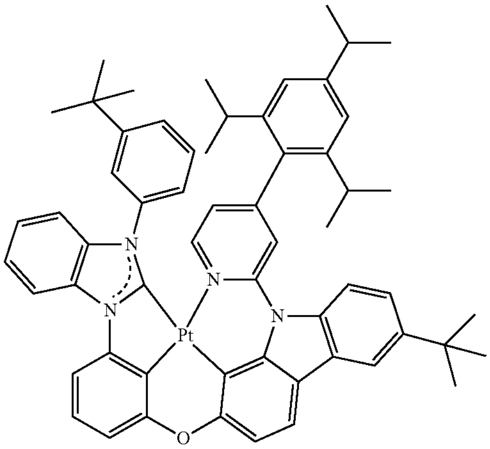

-continued
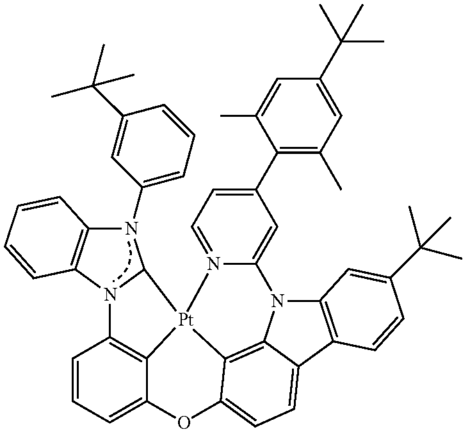
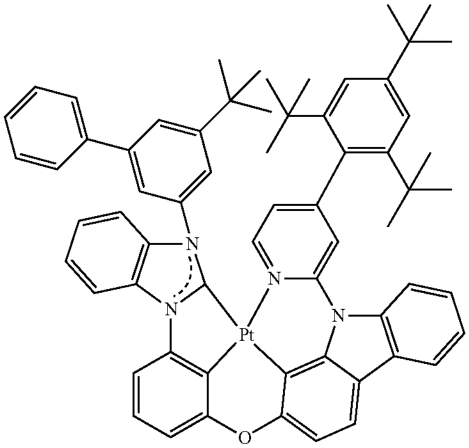
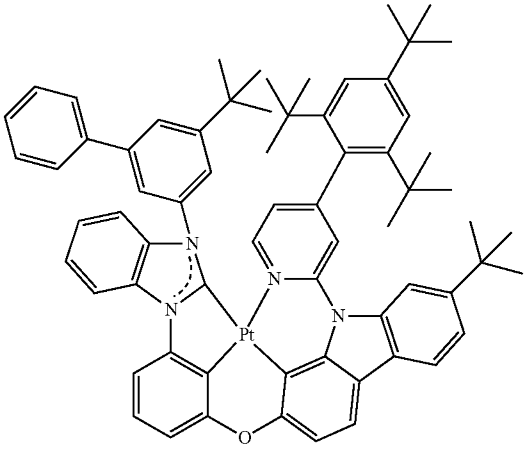
-continued
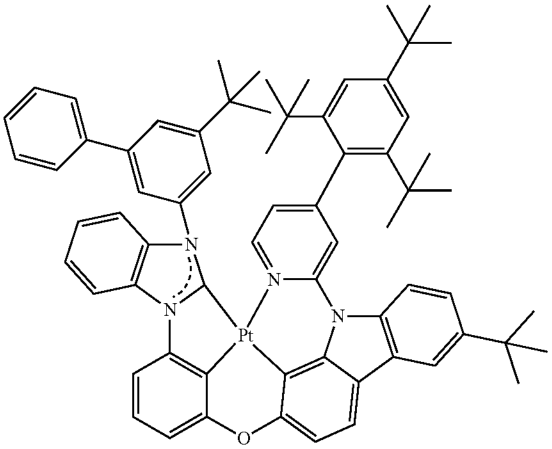
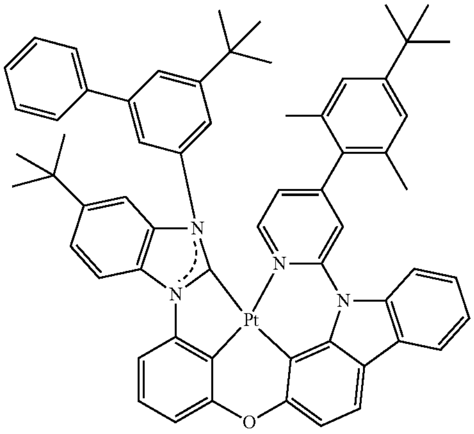
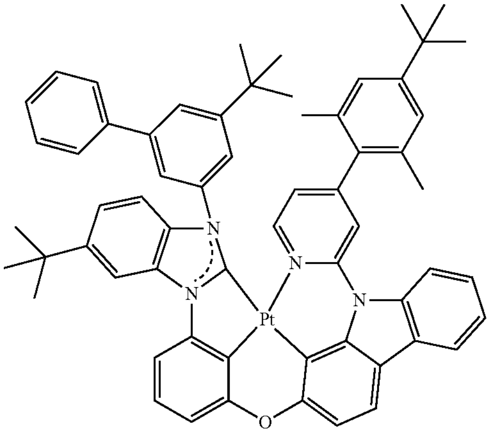
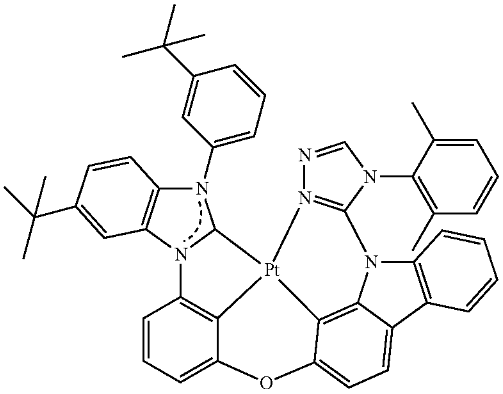

-continued
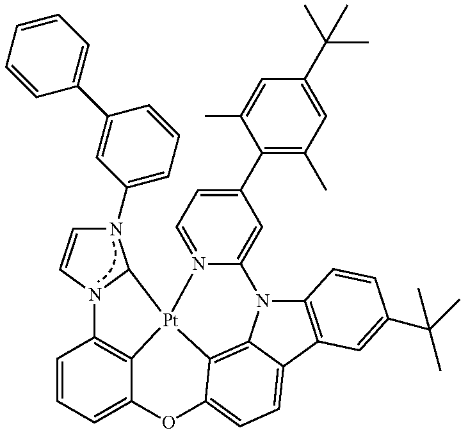
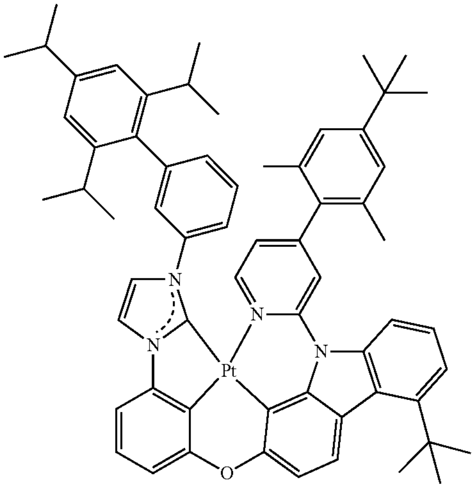
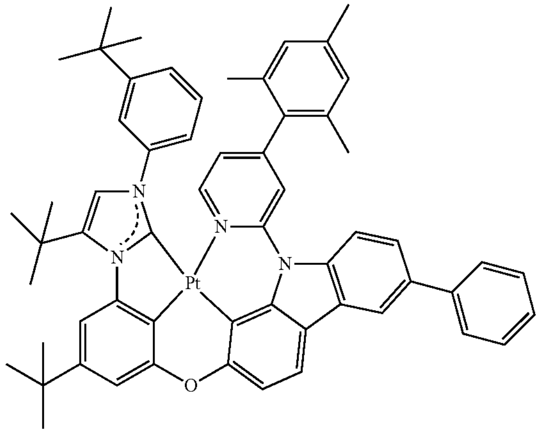
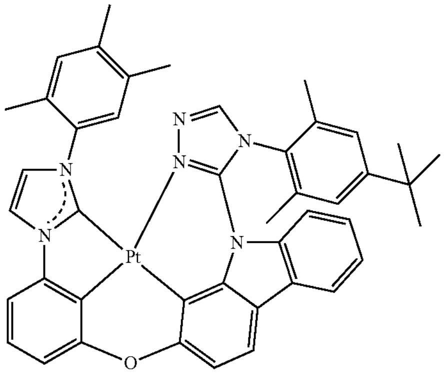
-continued
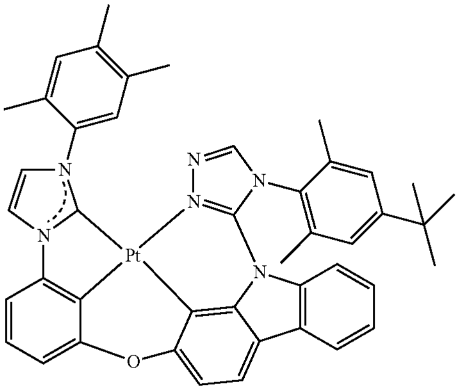
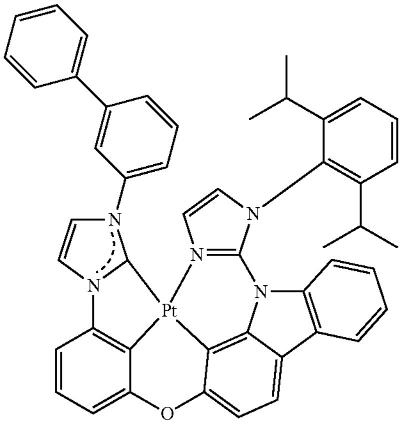
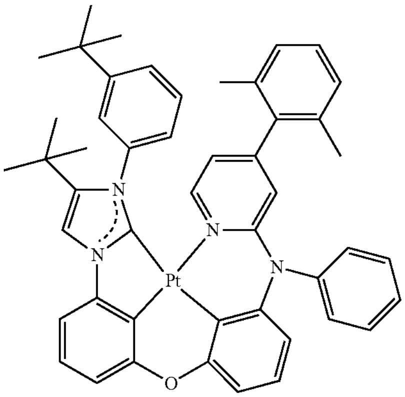
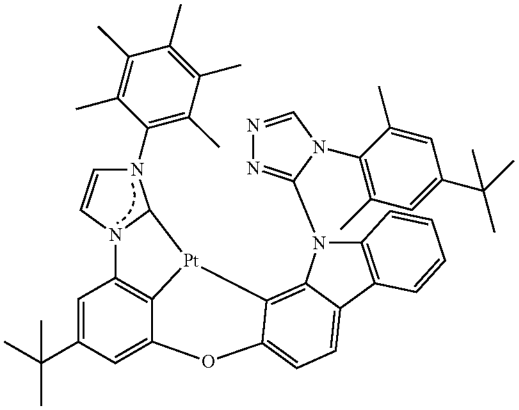

-continued
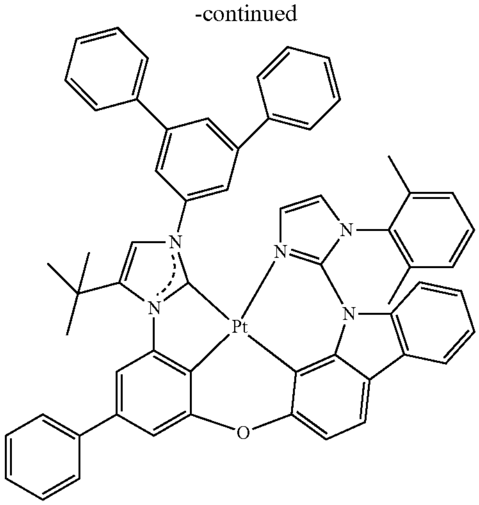
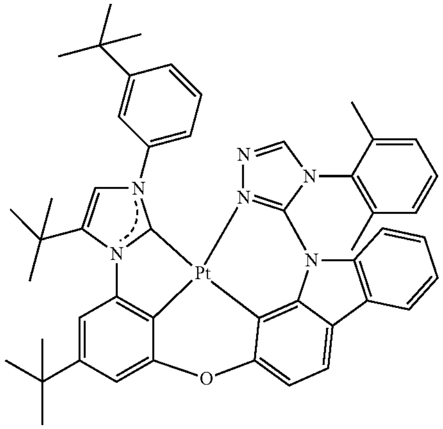
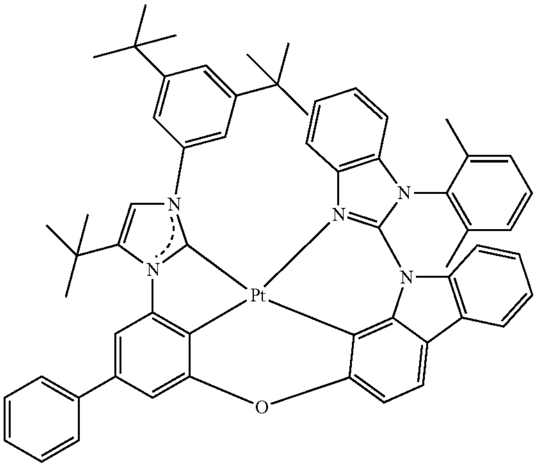
-continued
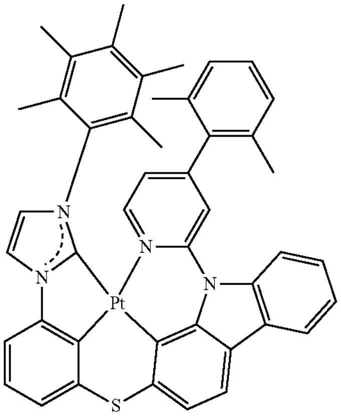
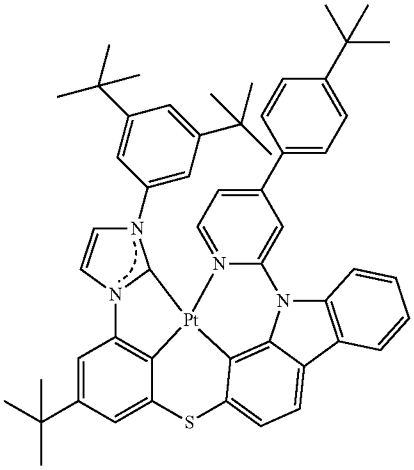
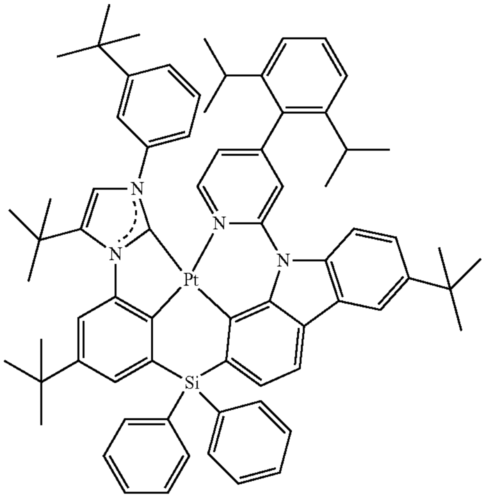

-continued

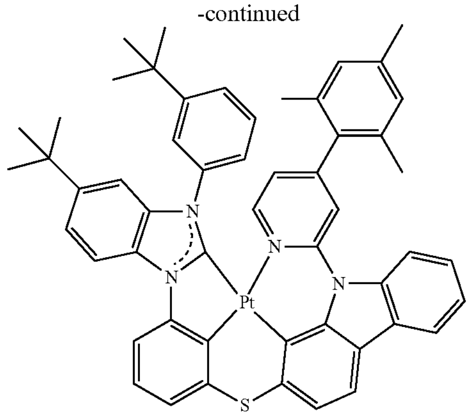

Synthesis methods of the organometallic compound represented by Formula 1 may be recognizable by one of ordinary skill in the art by referring to Synthesis Examples provided below.

Accordingly, the organometallic compound represented by Formula 1 may be suitable for use as a material for an organic layer, such as an emission layers, of an organic light-emitting device. Thus, another aspect of the present disclosure provides an organic light-emitting device including: a first electrode; a second electrode; and an organic layer arranged between the first electrode and the second electrode and including an emission layer, wherein the organic layer includes at least one organometallic compound represented by Formula 1.

By including the organic layer that includes the organometallic compound represented by Formula 1, the organic light-emitting device may have a low driving voltage, high efficiency, high power, high quantum efficiency, a long lifespan, a low roll-off ratio, and excellent color purity.

In one or more embodiments, in the organic light-emitting device, the first electrode may be an anode, and the second electrode may be a cathode, and the organic layer may further include a hole transport region between the first electrode and the emission layer and an electron transport region between the emission layer and the second electrode, wherein the hole transport region may include a hole injection layer, a hole transport layer, an electron blocking layer, or any combination thereof, and the electron transport region may include a hole blocking layer, an electron transport layer, an electron injection layer, or any combination thereof.

In one or more embodiments, the organometallic compound represented by Formula 1 may be included in the emission layer.

The organometallic compound included in the emission layer may act as an emitter. In one or more embodiments, the emission layer including the organometallic compound represented by Formula 1 may emit phosphorescence generated by the transfer of triplet excitons of the organometallic compound into the ground state.

In one or more embodiments, the emission layer including the organometallic compound represented by Formula 1 may further include a host. The host may be any host, and details thereof may be the same as described herein. In the emission layer, an amount of the host may be greater than that of the organometallic compound represented by Formula 1.

In one or more embodiments, the emission layer may include a host and a dopant, wherein the host may be any host, and the dopant may include the organometallic compound represented by Formula 1. The emission layer may emit phosphorescence generated by the transfer of triplet excitons of the organometallic compound acting as a dopant into the ground state.

In one or more embodiments, when the emission layer further includes a host, an amount of the host may be greater than that of the organometallic compound.

In one or more embodiments, the emission layer may include a host and a dopant, wherein the host may be any host, and the dopant may include the organometallic compound represented by Formula 1, and the emission layer may further include a fluorescent dopant. The emission layer may emit fluorescent light that is generated by the transfer of the triplet excitons of the organometallic compound to the fluorescent dopant and then transition thereof.

In one or more embodiments, the emission layer may emit blue light having a maximum emission wavelength in a range of about 410 nm to about 490 nm.

The expression "(an organic layer) includes at least one organometallic compounds" as used herein may include a case in which "(an organic layer) includes identical organometallic compounds represented by Formula 1" and a case in which "(an organic layer) includes two or more different organometallic compounds represented by Formula 1".

In one or more embodiments, the organic layer may include, as the organometallic compound, only Compound 1. In this embodiment, Compound 1 may be included in the emission layer of the organic light-emitting device. In one or more embodiments, the organic layer may include, as the organometallic compound, Compound 1 and Compound 2. In this embodiment, Compound 1 and Compound 2 may exist in an identical layer (for example, Compound 1 and Compound 2 all may exist in an emission layer).

The term "organic layer" as used herein refers to a single layer and/or a plurality of layers between the first electrode and the second electrode of the organic light-emitting device. The "organic layer" may include, in addition to an organic compound, an organometallic complex including metal.

FIGURE is a schematic cross-sectional view of an organic light-emitting device 10 according to an embodiment. Hereinafter, the structure of an organic light-emitting device according to an embodiment of the present disclosure and a method of manufacturing an organic light-emitting device according to an embodiment of the present disclosure will be described in connection with the FIGURE. The organic light-emitting device 10 includes a first electrode 11, an organic layer 15, and a second electrode 19, which are sequentially stacked.

A substrate may be additionally arranged under the first electrode 11 or above the second electrode 19. For use as the substrate, any substrate that is used in organic light-emitting devices available in the art may be used, and the substrate may be a glass substrate or a transparent plastic substrate, each having excellent mechanical strength, thermal stability, transparency, surface smoothness, ease of handling, and water resistance.

The first electrode 11 may be formed by, for example, depositing or sputtering a material for forming the first electrode 11 on the substrate. The first electrode 11 may be an anode. The material for forming the first electrode 11 may be selected from materials with a high work function to facilitate hole injection. The first electrode 11 may be a reflective electrode, a semi-transmissive electrode, or a transmissive electrode. In one or more embodiments, the material for forming the first electrode 11 may be indium tin oxide (ITO), indium zinc oxide (IZO), tin oxide ($SnO_2$), or zinc oxide (ZnO). In one or more embodiments, the material for forming the first electrode 11 may be metal, such as magnesium (Mg), aluminum (Al), aluminum-lithium (Al—Li), calcium (Ca), magnesium-indium (Mg—In), or magnesium-silver (Mg—Ag).

The first electrode 11 may have a single-layered structure or a multi-layered structure including two or more layers. For example, the first electrode 11 may have a three-layered structure of ITO/Ag/ITO, but the structure of the first electrode 11 is not limited thereto.

The organic layer 15 is arranged on the first electrode 11.

The organic layer 15 may include a hole transport region, an emission layer, and an electron transport region.

The hole transport region may be arranged between the first electrode 11 and the emission layer.

The hole transport region may include a hole injection layer, a hole transport layer, an electron blocking layer, a buffer layer, or any combination thereof.

In one or more embodiments, the hole transport region may include only either a hole injection layer or a hole transport layer. In one or more embodiments, the hole transport region may have a hole injection layer/hole transport layer structure or a hole injection layer/hole transport layer/electron blocking layer structure, wherein, in each structure, layers are sequentially stacked in this stated order on the first electrode 11.

When the hole transport region includes a hole injection layer, the hole injection layer may be formed on the first electrode 11 by using one or more suitable methods, for example, vacuum deposition, spin coating, casting, and/or Langmuir-Blodgett (LB) deposition.

When the hole injection layer is formed by vacuum deposition, the deposition conditions may vary according to a compound that is used as a material for forming the hole injection layer, and the structure and thermal characteristics of the hole injection layer. For example, the deposition conditions may include a deposition temperature in a range of about 100° C. to about 500° C., a vacuum pressure in a range of about $10^{-8}$ torr to about $10^{-3}$ torr, and a deposition rate in a range of about 0.01 Å/sec to about 100 Å/sec. However, the deposition conditions are not limited thereto.

When the hole injection layer is formed by spin coating, the coating conditions may vary according to a compound that is used as a material for forming the hole injection layer, and the structure and thermal properties of the hole injection layer. For example, a coating speed may be in a range of about 2,000 rpm to about 5,000 rpm, and a temperature at which a heat treatment is performed to remove a solvent after coating may be in a range of about 80° C. to about 200° C. However, the coating conditions are not limited thereto.

Conditions for forming a hole transport layer and an electron blocking layer may be understood by referring to the conditions for forming the hole injection layer.

The hole transport region may include, for example, m-MTDATA, TDATA, 2-TNATA, NPB, β-NPB, TPD, Spiro-TPD, Spiro-NPB, methylated NPB, TAPC, HMTPD, 4,4',4"-tris(N-carbazolyl)triphenylamine (TCTA), polyaniline/dodecylbenzenesulfonic acid (PANI/DBSA), poly(3,4-ethylenedioxythiophene)/poly(4-styrenesulfonate) (PEDOT/PSS), polyaniline/camphor sulfonic acid (PANI/CSA), polyaniline/poly(4-styrenesulfonate) (PANI/PSS), a compound represented by Formula 201, a compound represented by Formula 202, or any combination thereof:

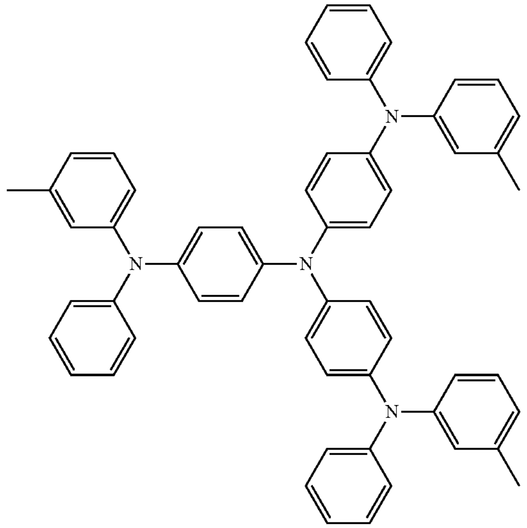

m-MTDATA

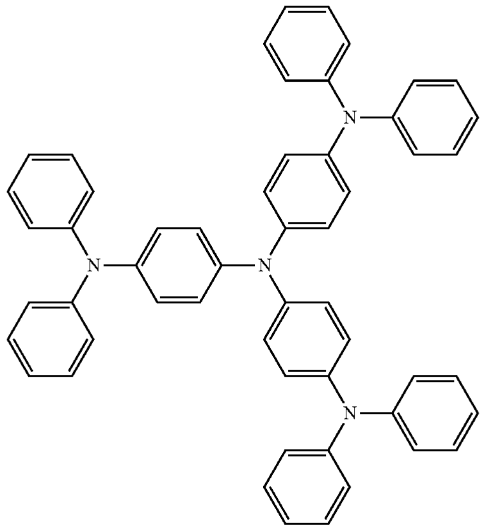

TDATA

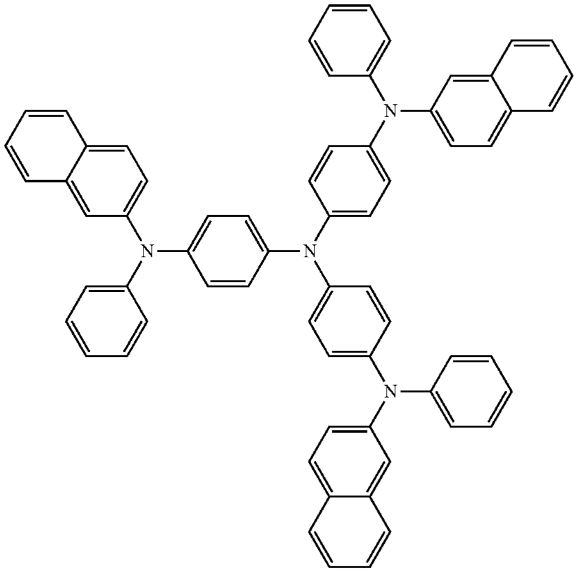

2-TNATA

-continued
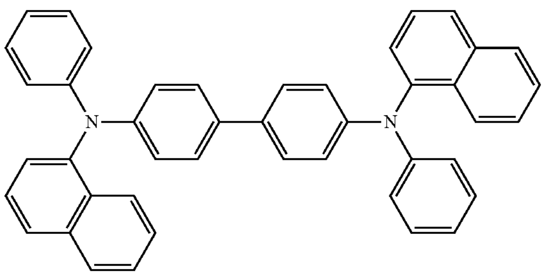
NPB
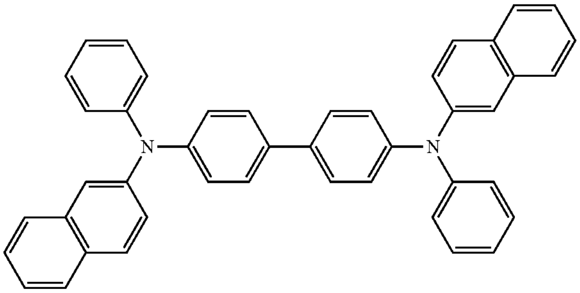
β-NPB
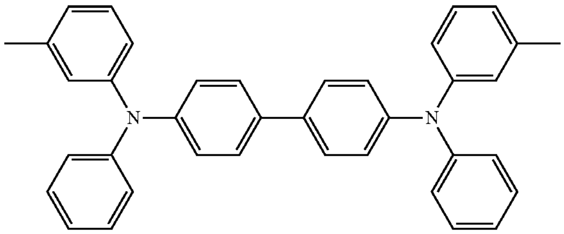
TPD
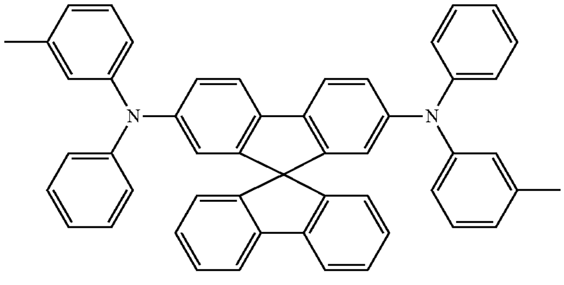
Spiro-TPD
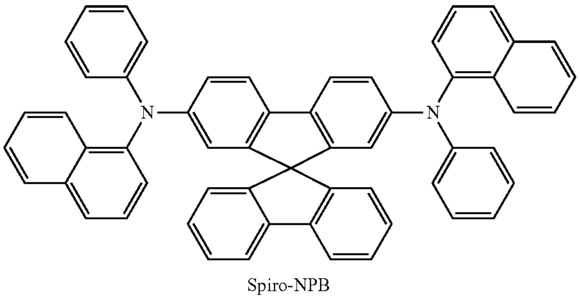
Spiro-NPB
-continued
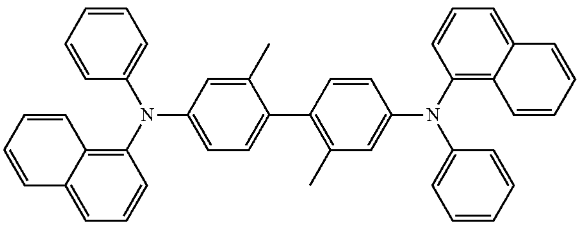
methylated NPB
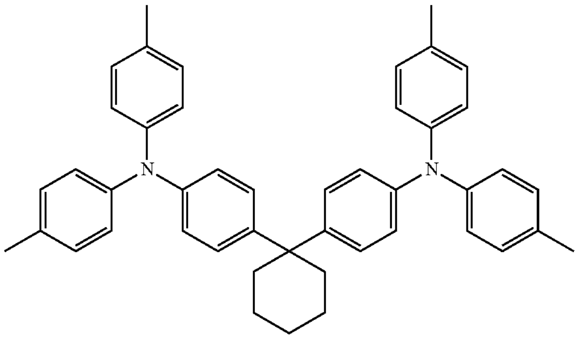
TAPC
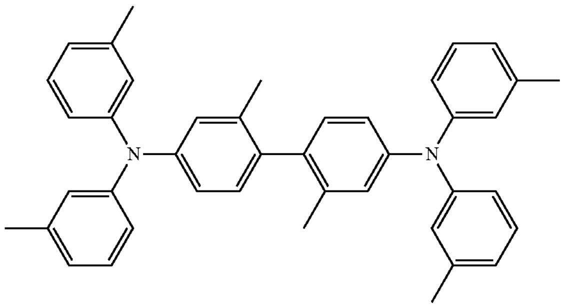
HMTPD
Formula 201
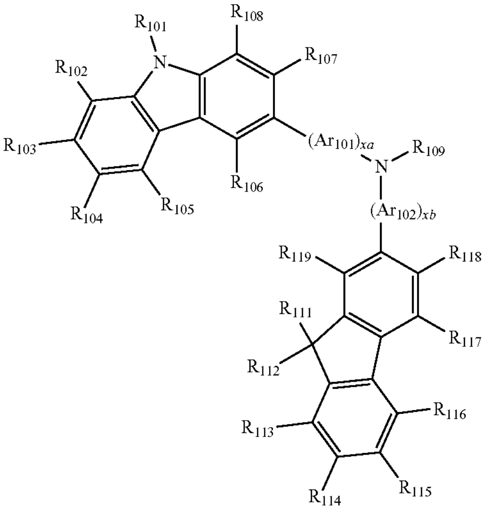

-continued

Formula 202

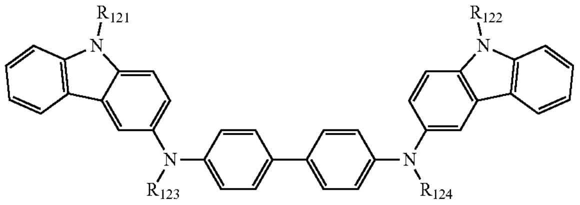

wherein, in Formula 201, $Ar_{101}$ and $Ar_{102}$ may each independently be:

a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group; or a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each substituted with deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof.

In Formula 201, xa and xb may each independently be an integer from 0 to 5, or 0, 1 or 2. For example, xa may be 1 and xb may be 0, but embodiments of the present disclosure are not limited thereto.

In Formulae 201 and 202, $R_{101}$ to $R_{108}$, $R_{111}$ to $R_{119}$, and $R_{121}$ to $R_{124}$ may each independently be:

hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group (for example, a methyl group, an ethyl group, a propyl group, a butyl group, a pentyl group, a hexyl group, or the like), or a $C_1$-$C_{10}$ alkoxy group (for example, a methoxy group, an ethoxy group, a propoxy group, a butoxy group, a pentoxy group, or the like);

a $C_1$-$C_{10}$ alkyl group or a $C_1$-$C_{10}$ alkoxy group, each unsubstituted or substituted with deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, or any combination thereof;

a phenyl group, a naphthyl group, an anthracenyl group, a fluorenyl group, or a pyrenyl group; or a phenyl group, a naphthyl group, an anthracenyl group, a fluorenyl group, or a pyrenyl group, each substituted with deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, a $C_1$-$C_{10}$ alkoxy group, or any combination thereof.

In Formula 201, $R_{109}$ may be:

a phenyl group, a naphthyl group, an anthracenyl group, or a pyridinyl group; or a phenyl group, a naphthyl group, an anthracenyl group, or a pyridinyl group, each substituted with deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an anthracenyl group, a pyridinyl group, or any combination thereof.

In one or more embodiments, the compound represented by Formula 201 may be represented by Formula 201A, but embodiments of the present disclosure are not limited thereto:

Formula 201A

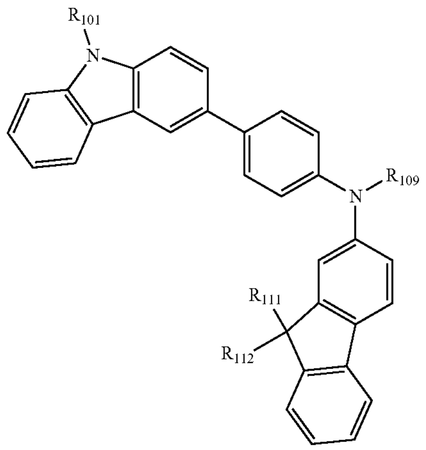

wherein, in Formula 201A, $R_{101}$, $R_{111}$, $R_{112}$, and $R_{109}$ may each be the same as described herein.

For example, the compound represented by Formula 201 and the compound represented by Formula 202 may include Compounds HT1 to HT20, but embodiments are not limited thereto:

HT1
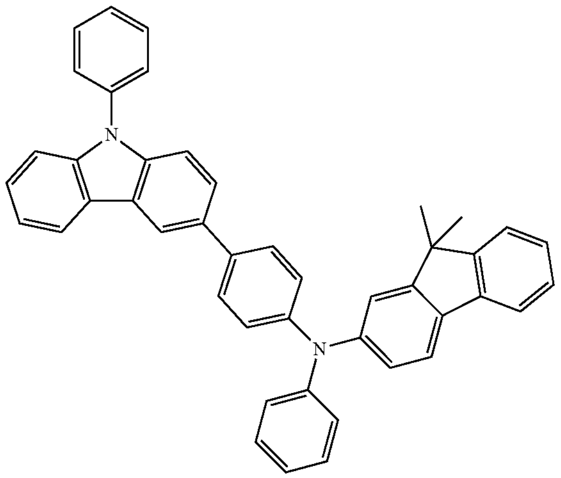
HT2
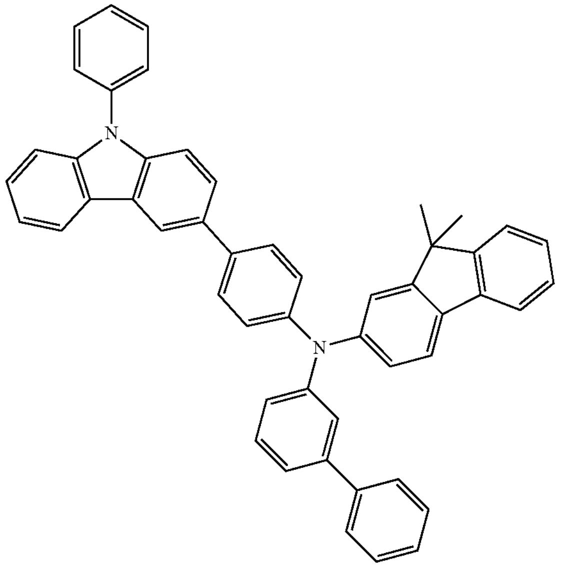
-continued
HT3
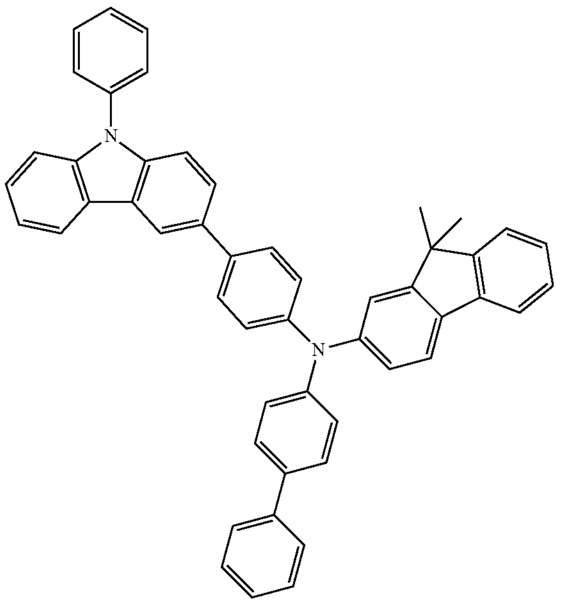
HT4
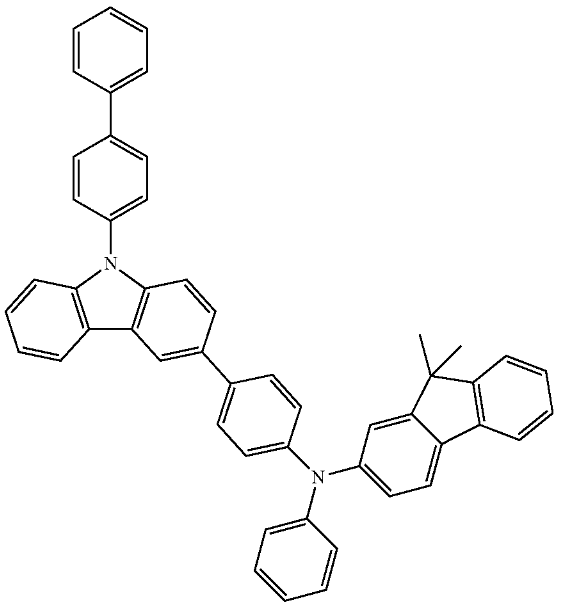

-continued
HT5
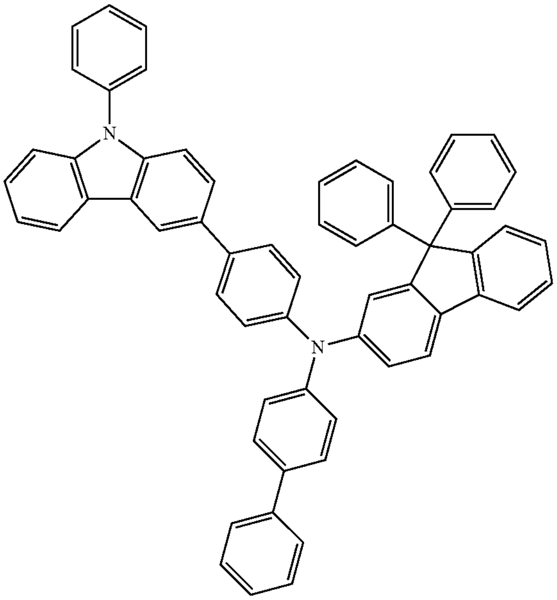
HT6
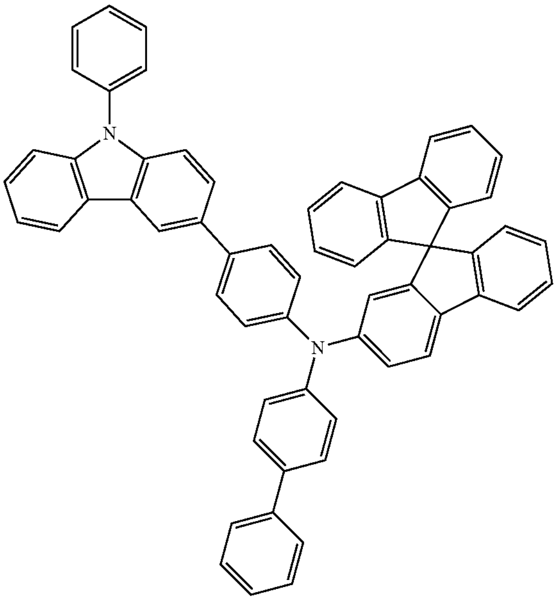
-continued
HT7
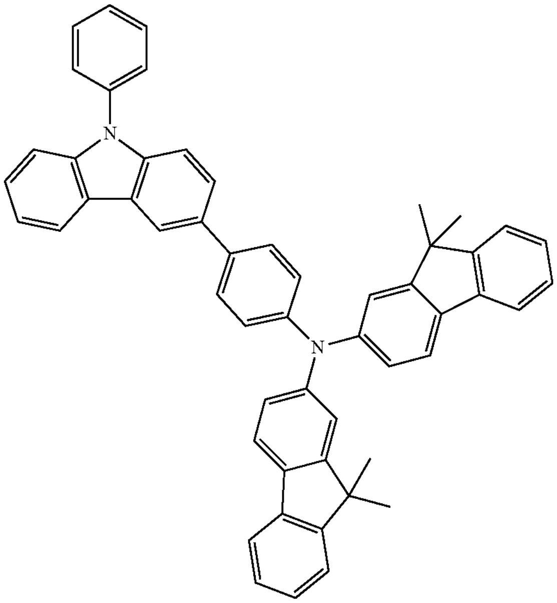
H8
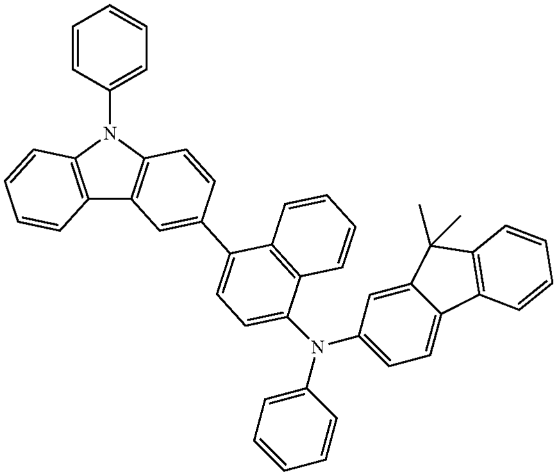
HT9
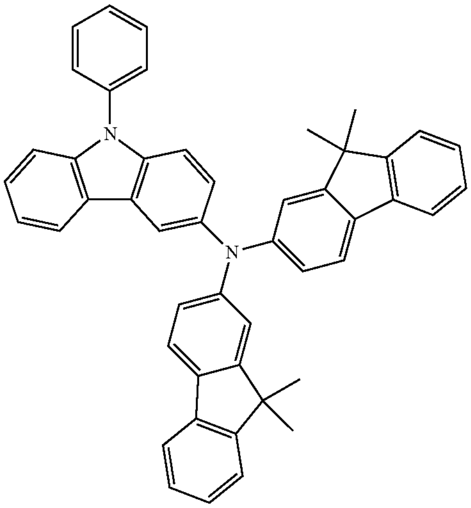

-continued
HT10
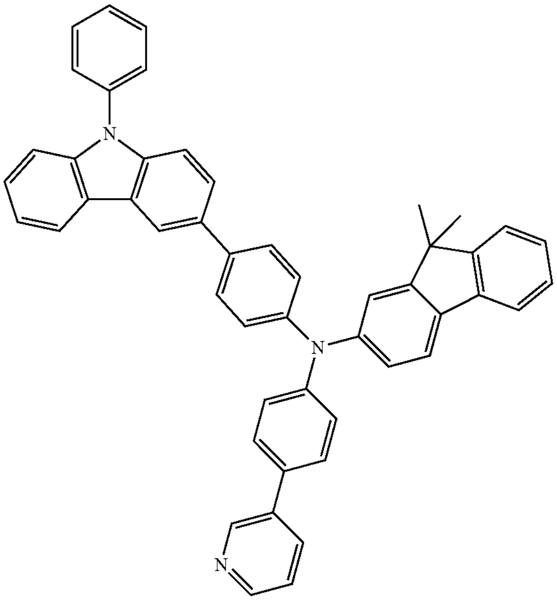
HT11
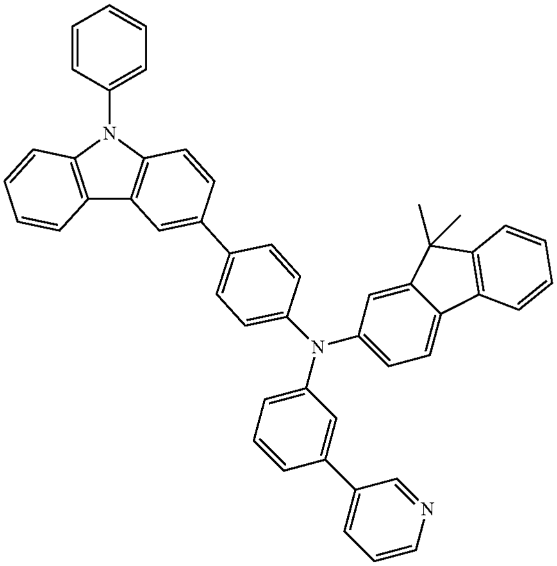
-continued
HT12
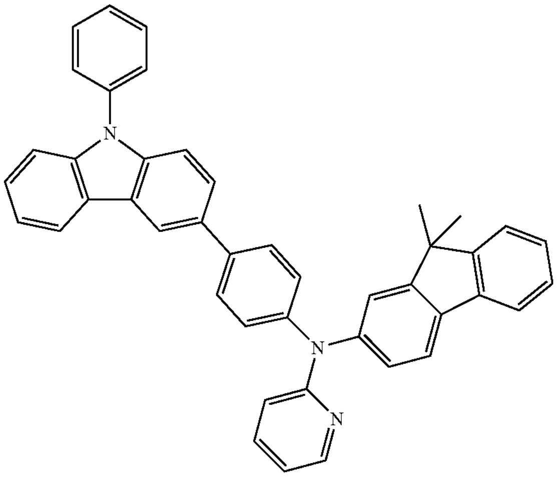
HT13
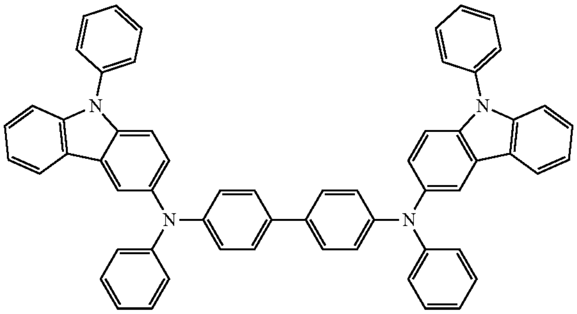
HT14
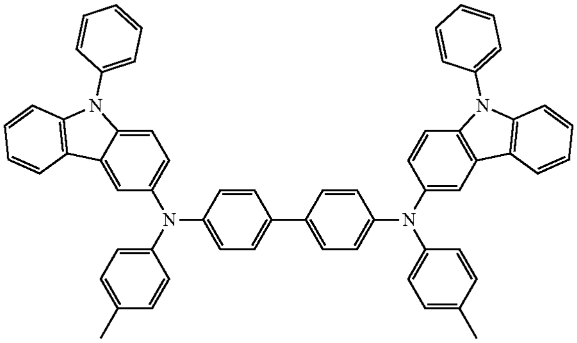
HT15
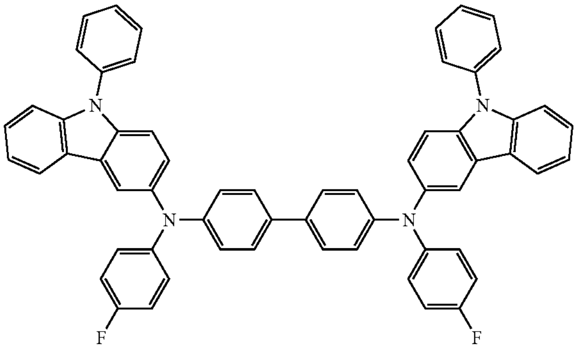

-continued

HT16

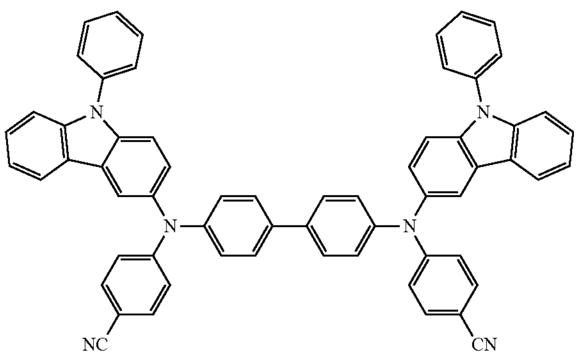

HT17

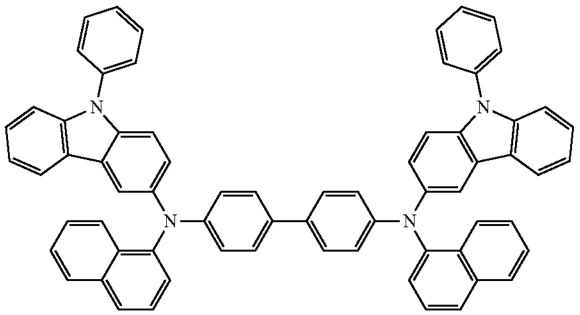

HT18

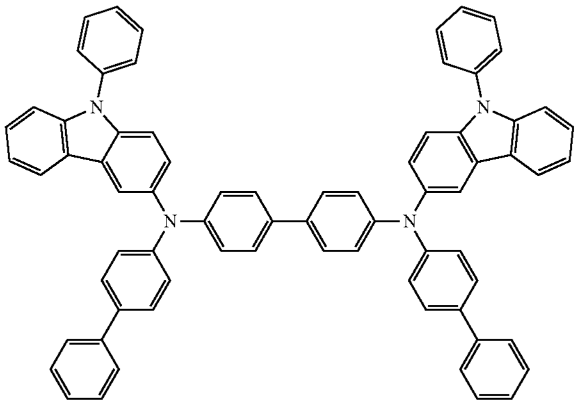

HT19

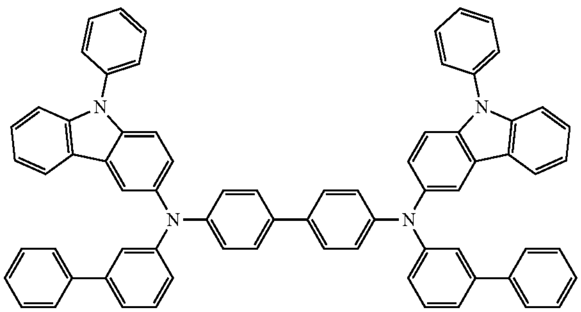

-continued

HT20

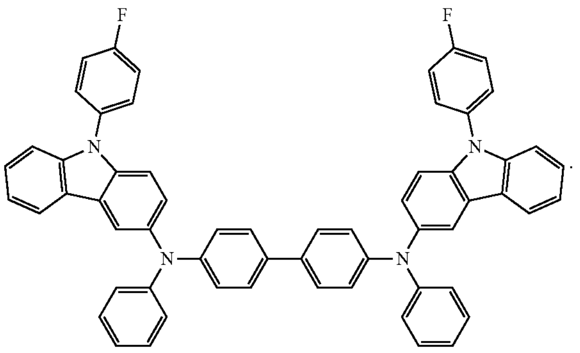

A thickness of the hole transport region may be in a range of about 100 Å to about 10,000 Å, for example, about 100 Å to about 1,000 Å. When the hole transport region includes at least one of a hole injection layer and a hole transport layer, a thickness of the hole injection layer may be in a range of about 100 Å to about 10,000 Å, for example, about 100 Å to about 1,000 Å, and a thickness of the hole transport layer may be in a range of about 50 Å to about 2,000 Å, for example, about 100 Å to about 1,500 Å. When the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or non-homogeneously dispersed in the hole transport region.

The charge-generation material may be, for example, a p-dopant. The p-dopant may be one selected of a quinone derivative, a metal oxide, a cyano group-containing compound, or any combination thereof, but embodiments of the present disclosure are not limited thereto. Examples of the p-dopant are: a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenum oxide; and a cyano group-containing compound, such as Compound HT-D1, but are not limited thereto:

HT-D1

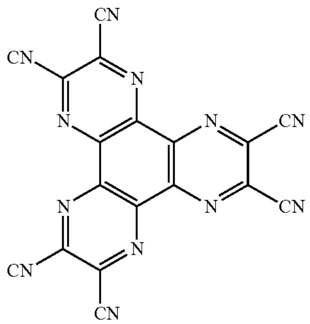

-continued

F4-TCNQ

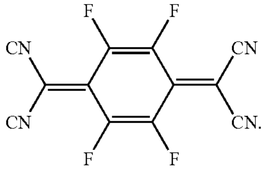

The hole transport region may further include a buffer layer.

The buffer layer may compensate for an optical resonance distance according to a wavelength of light emitted from the emission layer, and thus, efficiency of a formed organic light-emitting device may be improved.

Then, the emission layer may be formed on the hole transport region by vacuum deposition, spin coating, casting, LB deposition, or the like. When the emission layer is formed by vacuum deposition or spin coating, the deposition or coating conditions may be similar to those applied in forming the hole injection layer although the deposition or coating conditions may vary according to a compound that is used to form the hole transport layer.

Meanwhile, when the hole transport region includes an electron blocking layer, a material for forming the electron blocking layer may be selected from the above-described materials for forming the hole transport region and materials for a host to be explained later. However, embodiments of the present disclosure are not limited thereto. For example, when the hole transport region includes an electron blocking layer, a material for forming the electron blocking layer may be mCP which will be explained later.

The emission layer may include a host and a dopant, and the dopant may include the organometallic compound represented by Formula 1.

In one or more embodiments, the host may include TPBi, TBADN, ADN (also referred to as "DNA"), CBP, CDBP, TCP, mCP, Compound H50, Compound H51, or any combination thereof:

TPBi

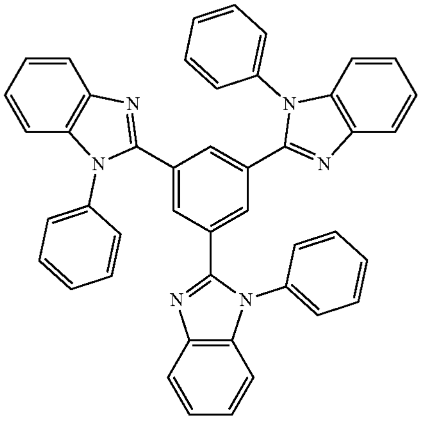

-continued

TBADN

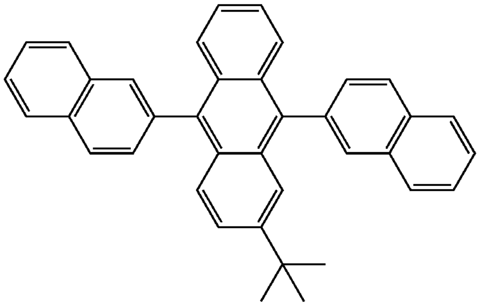

ADN

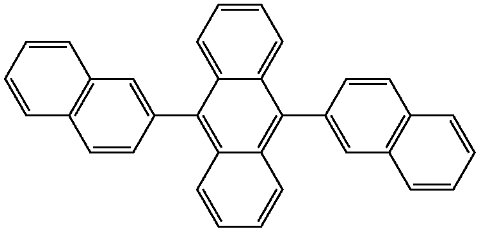

CBP

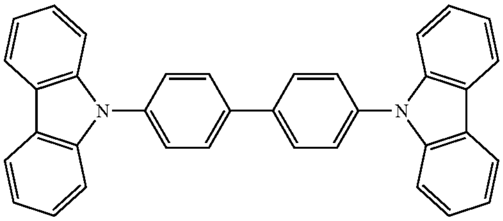

CDBP

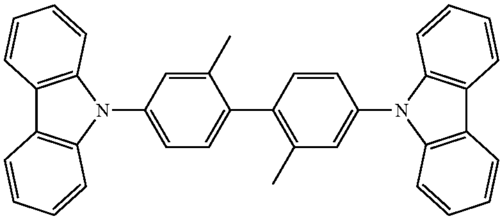

TCP

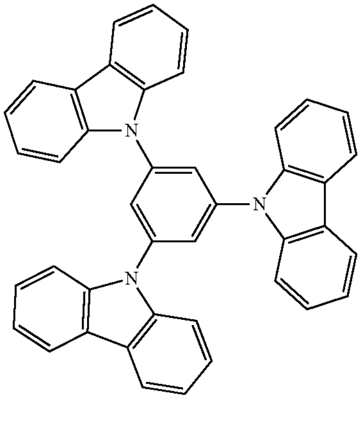

-continued mCP

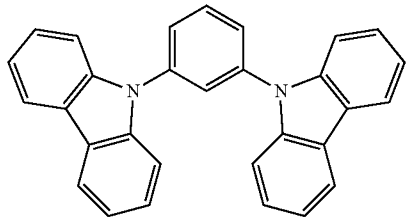

H50

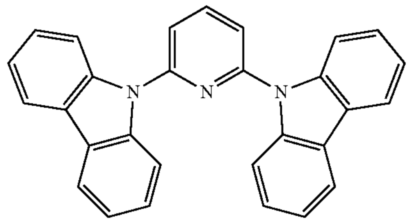

H51

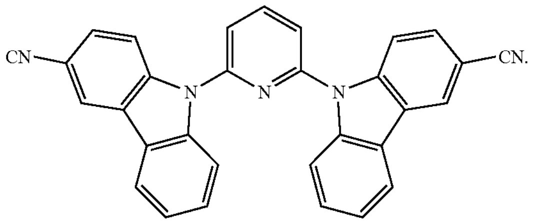

In one or more embodiments, the host may further include a compound represented by Formula 301:

Formula 301

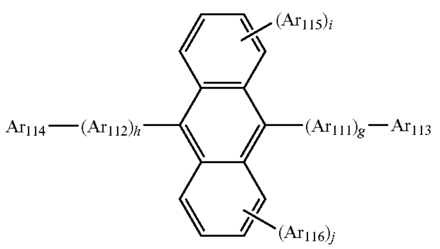

wherein, in Formula 301, $Ar_{111}$ and $Ar_{112}$ may each independently be:

a phenylene group, a naphthylene group, a phenanthrenylene group, or a pyrenylene group; or a phenylene group, a naphthylene group, a phenanthrenylene group, or a pyrenylene group, each substituted with a phenyl group, a naphthyl group, an anthracenyl group, or any combination thereof.

In Formula 301, $Ar_{113}$ to $Ar_{116}$ may each independently be:

a $C_1$-$C_{10}$ alkyl group, a phenyl group, a naphthyl group, a phenanthrenyl group, or a pyrenyl group; or a phenyl group, a naphthyl group, a phenanthrenyl group, or a pyrenyl group, each substituted with a phenyl group, a naphthyl group, an anthracenyl group, or any combination thereof.

In Formula 301, g, h, i, and j may each independently be an integer from 0 to 4, and for example, 0, 1, or 2.

In Formula 301, $Ar_{113}$ to $Ar_{116}$ may each independently be:

a $C_1$-$C_{10}$ alkyl group substituted with a phenyl group, a naphthyl group, an anthracenyl group, or any combination thereof;

a phenyl group, a naphthyl group, an anthracenyl group, a pyrenyl, a phenanthrenyl group, or a fluorenyl group;

a phenyl group, a naphthyl group, an anthracenyl group, a pyrenyl group, a phenanthrenyl group, or a fluorenyl group, each substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a phenyl group, a naphthyl group, an anthracenyl group, a pyrenyl group, a phenanthrenyl group, a fluorenyl group, or any combination thereof; or

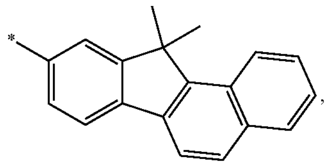 [SMILES: *c1ccc2c(c1)C(C)(C)c1c-2ccc2ccccc12]

but embodiments of the present disclosure are not limited thereto.

In one or more embodiments, the host may include a compound represented by Formula 302:

Formula 302

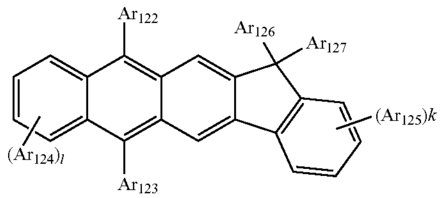

wherein, in Formula 302, $Ar_{122}$ to $Ar_{125}$ may each be the same as described in connection with $Ar_{113}$ in Formula 301.

In Formula 302, $Ar_{126}$ and $Ar_{127}$ may each independently be a $C_1$-$C_{10}$ alkyl group (for example, a methyl group, an ethyl group, or a propyl group).

In Formula 302, k and l may each independently be an integer from 0 to 4. For example, k and l may be 0, 1, or 2.

In one or more embodiments, when the organic light-emitting device is a full-color organic light-emitting device, the emission layer may be patterned into a red emission layer, a green emission layer, and a blue emission layer. In one or more embodiments, due to a stacked structure including a red emission layer, a green emission layer, and/or a blue emission layer, the emission layer may emit white light.

When the emission layer includes a host and a dopant, an amount of the dopant may be in a range of about 0.01 parts by weight to about 15 parts by weight based on 100 parts by weight of the host, but embodiments of the present disclosure are not limited thereto.

In one or more embodiments, the organic layer of the organic light-emitting device may further include a fluorescent dopant in addition to the organometallic compound represented by Formula 1.

For example, the fluorescent dopant may be a condensation polycyclic compound, a styryl compound, or any combination thereof.

In one or more embodiments, the fluorescent dopant may include a naphthalene-containing core, a fluorene-containing core, a spiro-bifluorene-containing core, a benzofluorene-containing core, a dibenzofluorene-containing core, a phenanthrene-containing core, an anthracene-containing core, a fluoranthene-containing core, a triphenylene-containing core, a pyrene-containing core, a chrysene-containing core, a naphthacene-containing core, a picene-containing core, a perylene-containing core, a pentaphene-containing core, an indenoanthracene-containing core, a tetracene-containing core, a bisanthracene-containing core, or one of cores represented by Formulae 501-1 to 501-18, but embodiments of the present disclosure are not limited thereto:

501-1

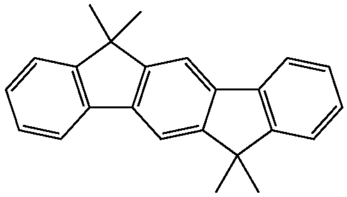

501-2

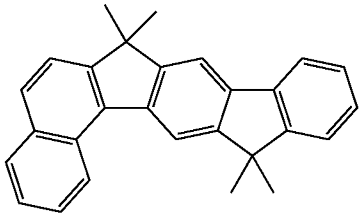

501-3

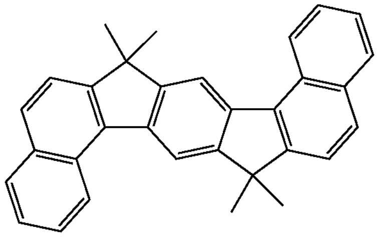

501-4

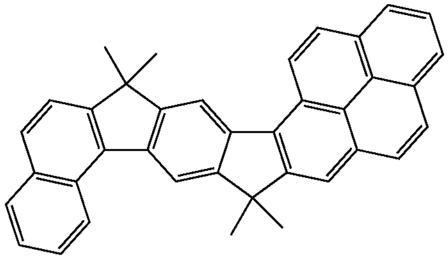

501-5

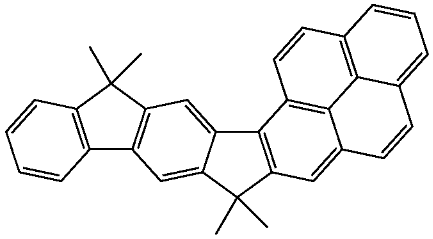

-continued 501-6

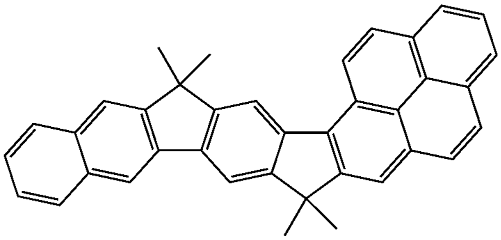

501-7

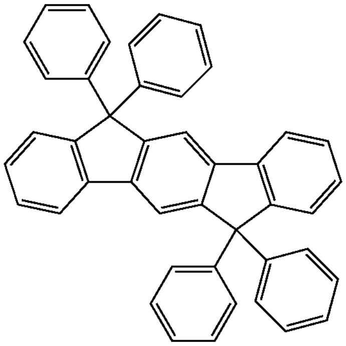

501-8

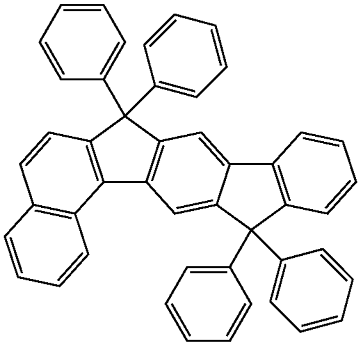

501-9

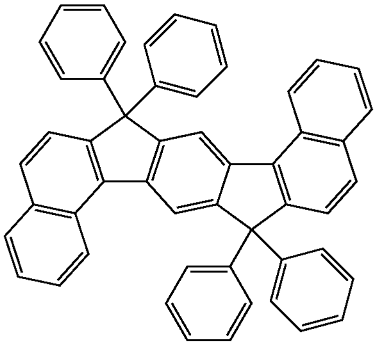

-continued 501-10

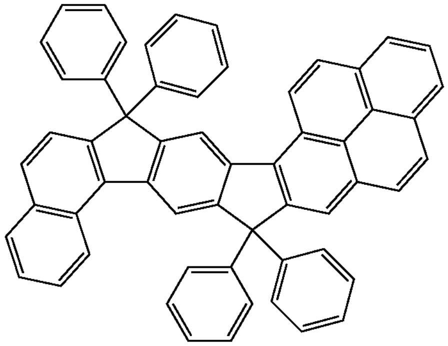

501-11

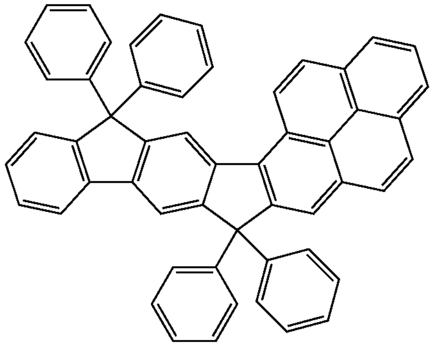

501-12

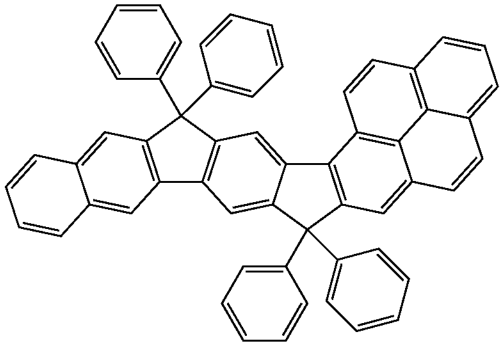

501-13

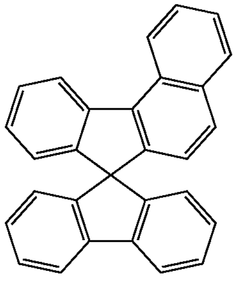

501-14

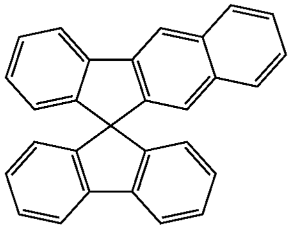

-continued 501-15

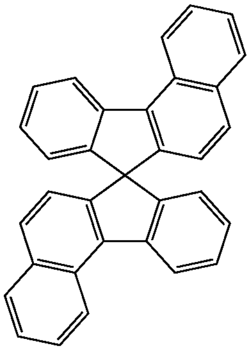

501-16

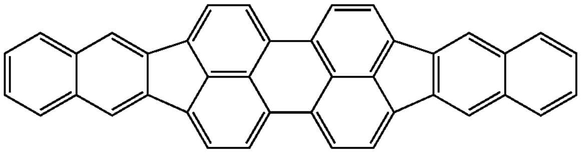

501-17

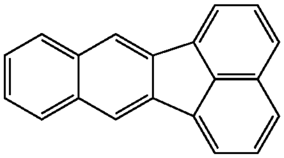

501-18

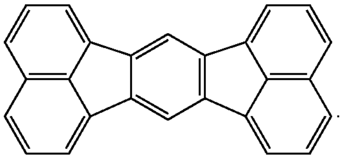

.

In one or more embodiments, the fluorescent dopant may be a styryl-amine-based compound, a styryl-carbazole-based compound, or any combination thereof, but embodiments of the present disclosure are not limited thereto.

In one or more embodiments, the fluorescent dopant may be a compound represented by Formula 501:

Formula 501

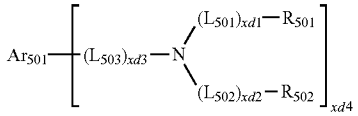

wherein, in Formula 501, $Ar_{501}$ may be:

a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, a naphthacene group, a picene group, a perylene group, a pentaphene group, an indenoanthracene group, a tetracene group, a bisanthracene group, or a group represented by one of Formulae 501-1 to 501-18; or a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, a naphthacene group, a picene group, a perylene group, a pentaphene group, an indenoanthracene group, a tetracene group, a bisanthracene group, or a group represented by one of Formulae 501-1 to 501-18, each substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{501}$)($Q_{502}$)($Q_{503}$) (wherein $Q_{501}$ to $Q_{503}$ may each independently be hydrogen, a $C_1$-$C_{60}$ alkyl group, a $C_1$-$C_{60}$ alkoxy group, a $C_6$-$C_{60}$ aryl group, a $C_1$-$C_{60}$ heteroaryl group, a monovalent non-aromatic condensed polycyclic group, or a monovalent non-aromatic condensed heteropolycyclic group), or any combination thereof, $L_{501}$ to $L_{503}$ may each independently be a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, or a substituted or unsubstituted divalent non-aromatic condensed heteropolycyclic group, $R_{501}$ and $R_{502}$ may each independently be:

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazole group, a triazinyl group, a dibenzofuranyl group, or a dibenzothiophenyl group; or a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, or a dibenzothiophenyl group, each substituted with deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, a dibenzothiophenyl group, or any combination thereof, xd1 to xd3 may each independently be 0, 1, 2, or 3, and xd4 may be 0, 1, 2, 3, 4, 5, or 6.

For example, in Formula 501, $Ar_{501}$ may be:

a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, a naphthacene group, a picene group, a perylene group, a pentaphene group, an indenoanthracene group, a tetracene group, a bisanthracene group, or a group represented by one of Formulae 501-1 to 501-18; or a naphthalene group, a fluorene group, a spiro-bifluorene group, a benzofluorene group, a dibenzofluorene group, a phenanthrene group, an anthracene group, a fluoranthene group, a triphenylene group, a pyrene group, a chrysene group, a naphthacene group, a picene group, a perylene group, a pentaphene group, an indenoanthracene group, a tetracene group, a bisanthracene group, or a group represented by one of Formula 501-1 to 501-18, each substituted with deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a dibenzofuranyl group, a dibenzothiophenyl group, a carbazolyl group, a pyridinyl group, a pyrimidinyl group, a triazinyl group, a quinolinyl group, an isoquinolinyl group, —Si($Q_{501}$)($Q_{502}$)($Q_{503}$) ($Q_{501}$ to $Q_{503}$ may each independently be hydrogen, a $C_1$-$C_{20}$ alkyl group, a $C_1$-$C_{20}$ alkoxy group, a phenyl group, a biphenyl group, a terphenyl group, or a naphthyl group), or any combination thereof, $L_{501}$ to $L_{503}$ may each be the same as described in connection with $L_{21}$, xd1 to xd3 may each independently be 0, 1, or 2, and xd4 may b 0, 1, 2, or 3, but embodiments of the present disclosure are not limited thereto.

In one or more embodiments, the fluorescent dopant may include a compound represented by one of Formulae 502-1 to 502-5:

Formula 502-1

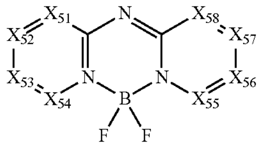

-continued

Formula 502-2

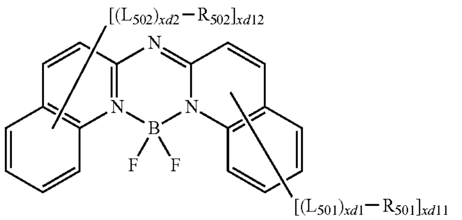

Formula 502-3

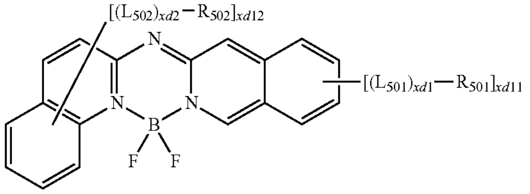

Formula 502-4

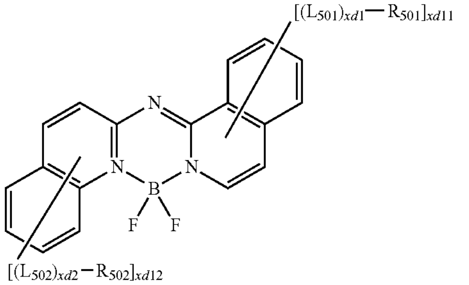

Formula 502-5

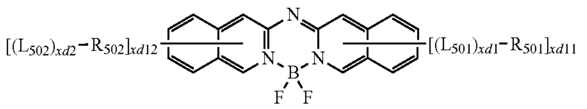

wherein, in Formulae 502-1 to 502-5, $X_{51}$ may be N or C-[$(L_{501})_{xd1}$-$R_{501}$], $X_{52}$ may be N or C-[$(L_{502})_{xd2}$-$R_{502}$], $X_{53}$ may be N or C-[$(L_{503})_{xd3}$-$R_{503}$], $X_{54}$ may be N or C-[$(L_{504})_{xd4}$-$R_{504}$], $X_{55}$ may be N or C-[$(L_{505})_{xd5}$-$R_{505}$], $X_{56}$ may be N or C-[$(L_{506})_{xd6}$-$R_{506}$], $X_{57}$ may be N or C-[$(L_{507})_{xd7}$-$R_{507}$], and $X_{58}$ may be N or C-[$(L_{508})_{xd8}$-$R_{508}$], $L_{501}$ to $L_{508}$ may each be the same as described in connection with $L_{501}$ in Formula 501, xd1 to xd8 may each be the same as described in connection with xd1 in Formula 501, $R_{501}$ to $R_{508}$ may each independently be:

hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, or a $C_1$-$C_{20}$ alkoxy group;

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazole group, a triazinyl group, a dibenzofuranyl group, or a dibenzothiophenyl group; or a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, or a dibenzothiophenyl group, each substituted with deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, a dibenzothiophenyl group, or any combination thereof, xd11 and xd12 may each independently be 0, 1, 2, 3, 4, or 5, two of $R_{501}$ to $R_{504}$ may optionally be linked together to form a saturated or unsaturated ring, and two of $R_{505}$ to $R_{508}$ may optionally be linked together to form a saturated or unsaturated ring.

In one or more embodiments, the fluorescent dopant may be a delayed fluorescence dopant emitting delayed fluorescence by a delayed fluorescence emission mechanism.

For example, the delayed fluorescence dopant may be (i) a compound having a D-A structure (wherein D is an electron-donating group, and A is an electron-accepting group) or (ii) a condensed cyclic compound including boron (B).

The delayed fluorescence dopant may include a compound represented by Formula 503-1 or 503-2:

Formula 503-1

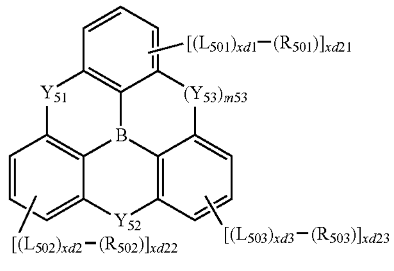

Formula 503-2

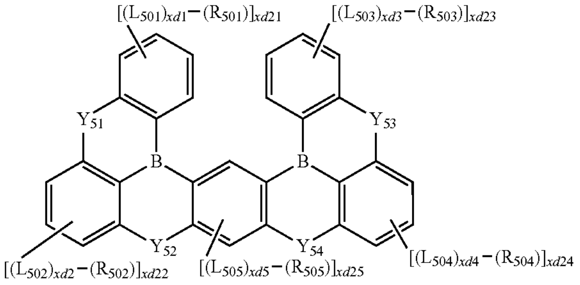

wherein, in Formulae 503-1 and 503-2, $Y_{51}$ to $Y_{54}$ may each independently be a single bond, O, S, $N[(L_{506})_{xd6}-R_{506}]$, $C[(L_{506})_{xd6}-R_{506}][(L_{507})_{xd7}-R_{507}]$, or $Si[(L_{506})_{xd6}-R_{506}][(L_{507})_{xd7}-R_{507}]$, m53 may be 0 or 1, $L_{501}$ to $L_{507}$ may each be the same as described in connection with $L_{501}$ in Formula 501, xd1 to xd7 may each be the same as described in connection with xd1 in Formula 501, $R_{501}$ to $R_{507}$ may each independently be:

hydrogen, deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, or a $C_1$-$C_{20}$ alkoxy group;

a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazole group, a triazinyl group, a dibenzofuranyl group, or a dibenzothiophenyl group; or a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, or a dibenzothiophenyl group, each substituted with deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a biphenyl group, a terphenyl group, a naphthyl group, a fluorenyl group, a spiro-bifluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, a dibenzothiophenyl group, or any combination thereof, xd21 and xd23 may each independently be 0, 1, 2, 3, or 4, xd22 and xd24 may each independently be 0, 1, 2, or 3, xd25 may be 0, 1, or 2, and two of $R_{501}$ to $R_{507}$ may optionally be linked together to form a saturated or unsaturated ring.

The fluorescent dopant may include, for example, one of Compounds FD(1) to FD(16), one of Compounds FD1 to FD14, or any combination thereof:

FD(1)

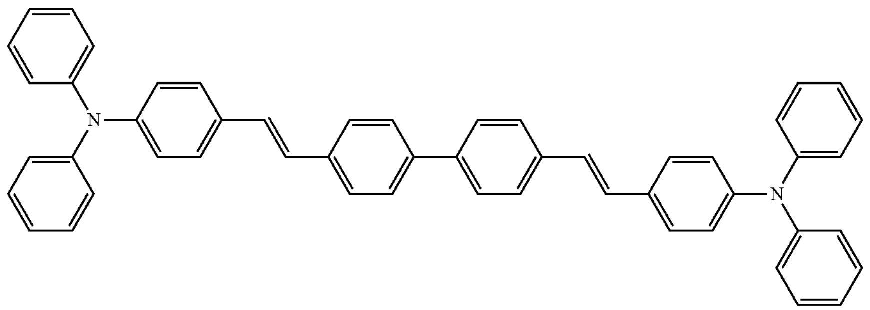

(FD(2)

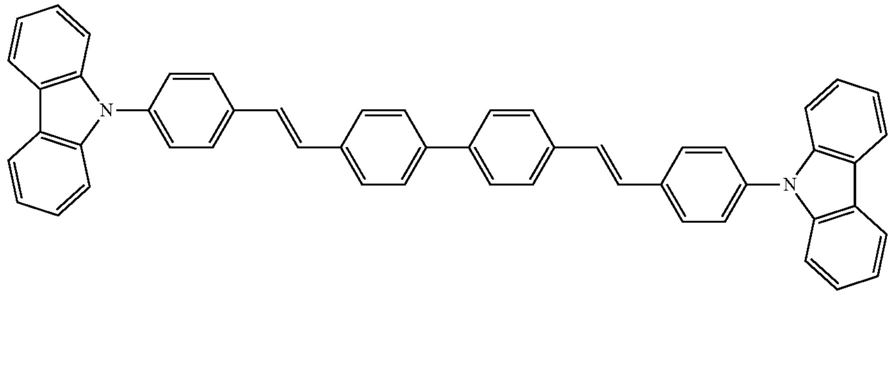

-continued
FD(3)
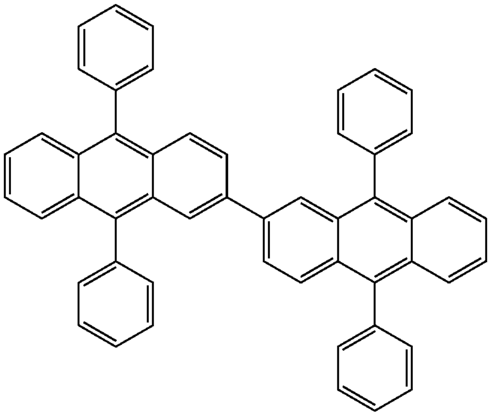
FD(4)
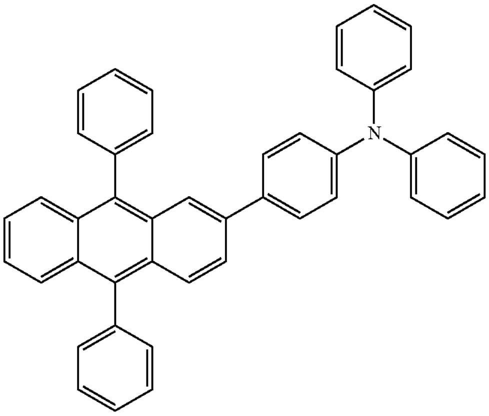
FD(5)
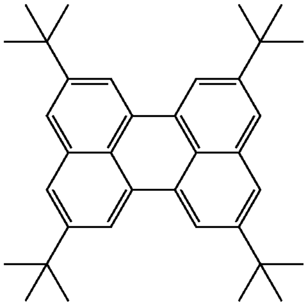
FD(6)
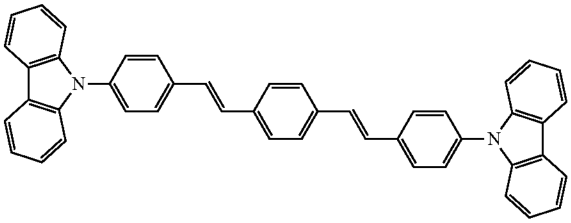
FD(7)
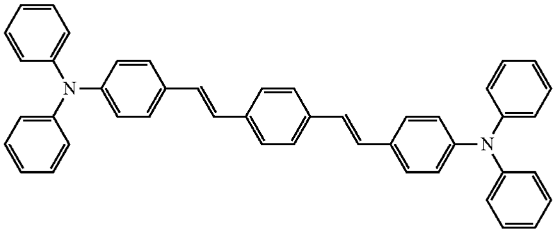
FD(8)
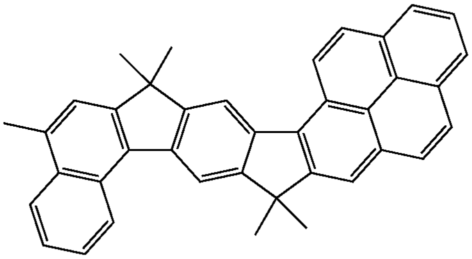
FD(9)
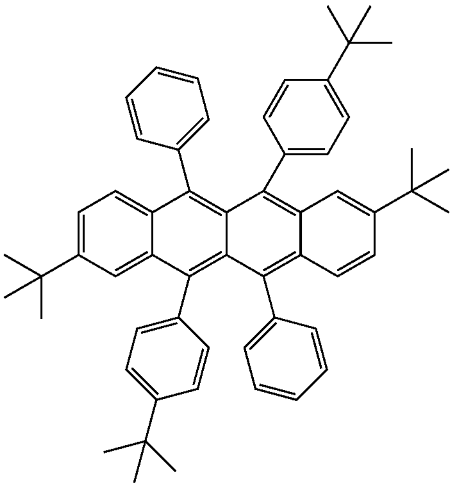
FD(10)
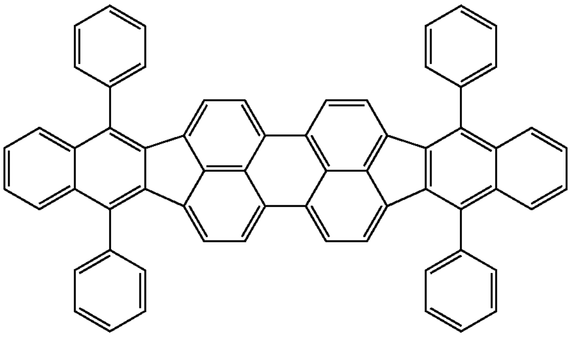

-continued
FD(11)
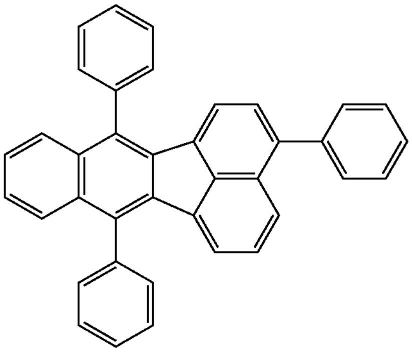
FD(12)
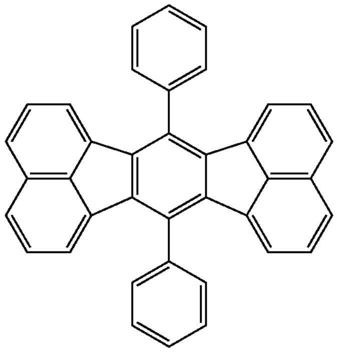
FD(13)
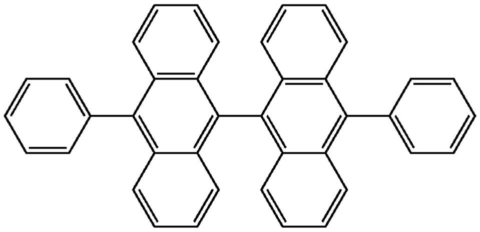
FD(14)
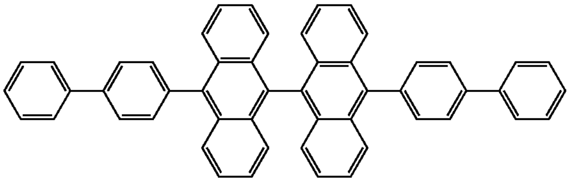
FD(15)
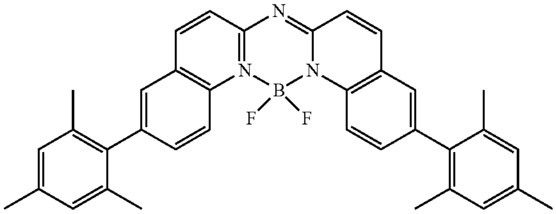
FD(16)
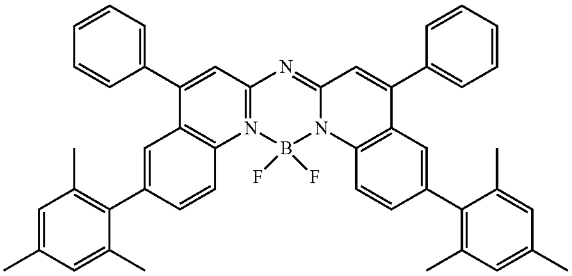
FD1
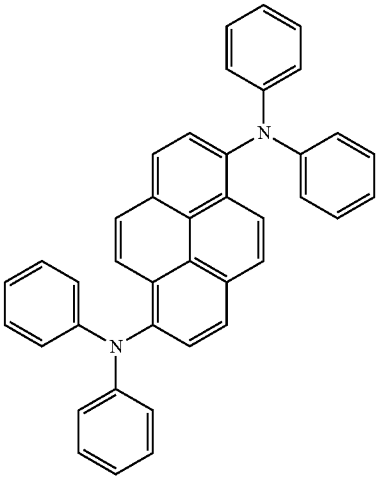
FD2
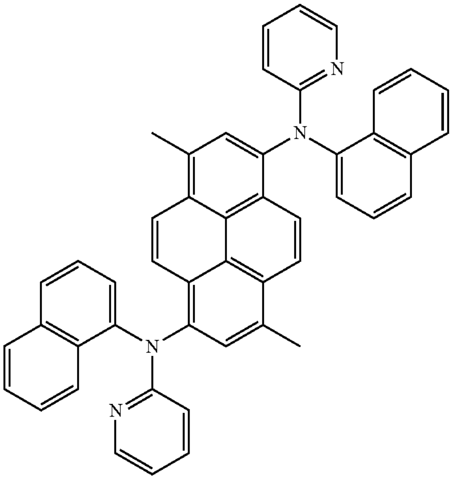

-continued
FD3
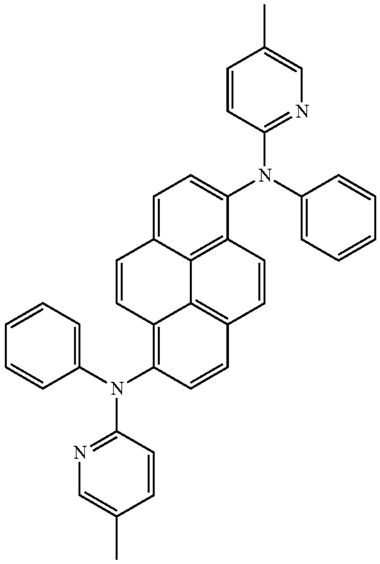
FD4
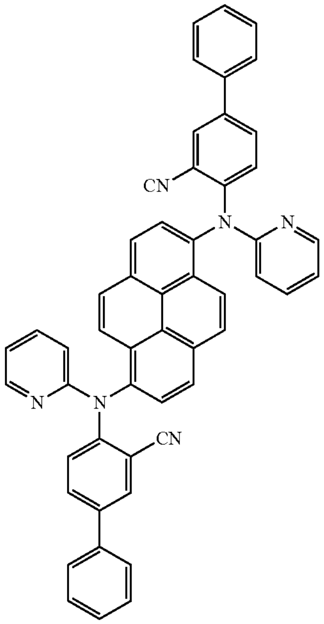
FD5
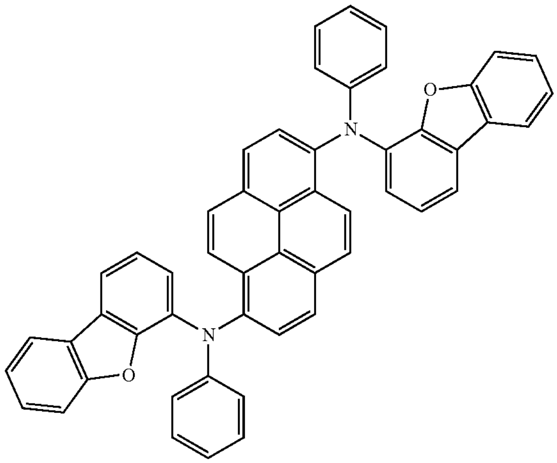
FD6
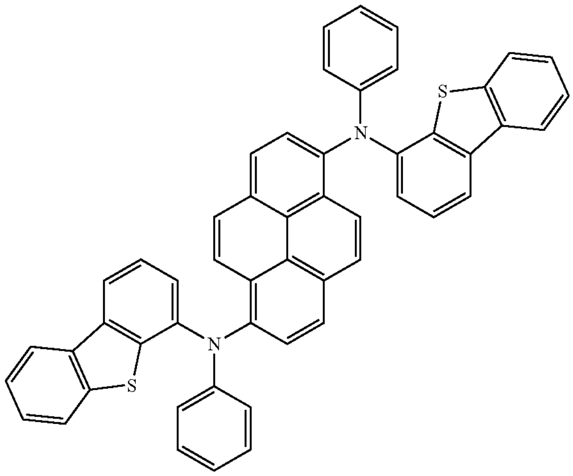
FD7
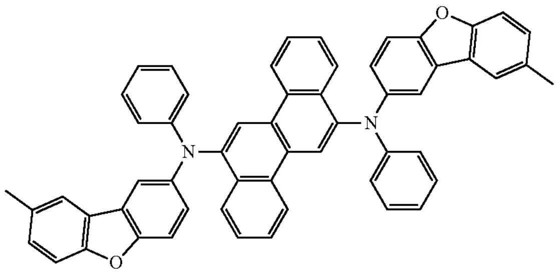
FD8
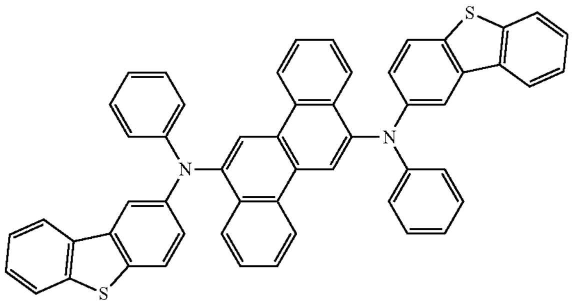

-continued

FD9

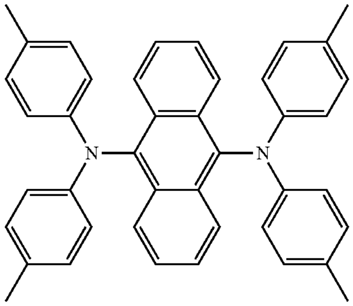

FD10

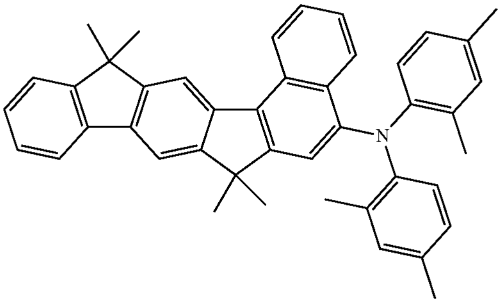

FD11

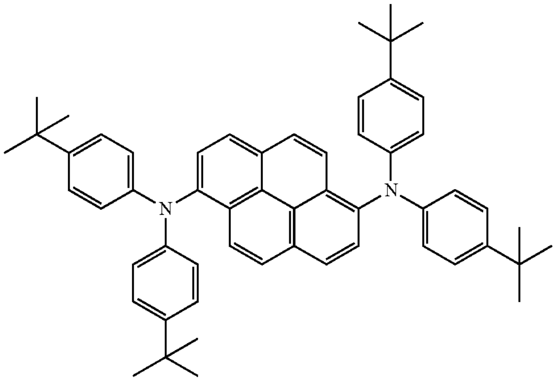

FD12

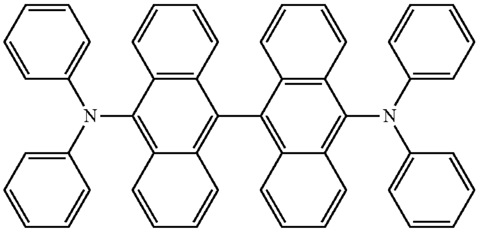

FD13

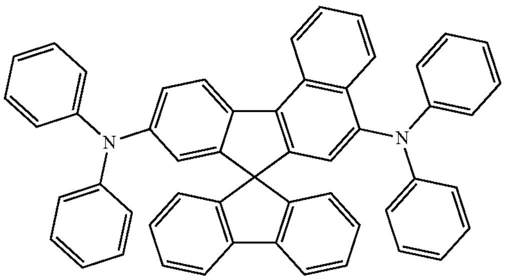

FD14

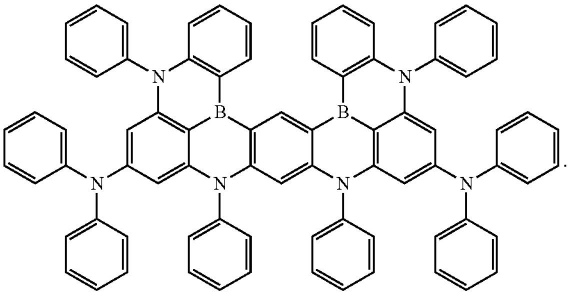

A thickness of the emission layer may be in a range of about 100 Å to about 1,000 Å, for example, about 200 Å to about 600 Å. When the thickness of the emission layer is with these ranges, excellent luminescence characteristics may be exhibited without a substantial increase in driving voltage.

Then, an electron transport region is arranged on the emission layer.

The electron transport region may include a hole blocking layer, an electron transport layer, an electron injection layer, or any combination thereof.

For example, the electron transport region may have a hole blocking layer/electron transport layer/electron injection layer structure or an electron transport layer/electron injection layer structure, but embodiments of the present disclosure are not limited thereto. The electron transport layer may have a single-layered structure or a multi-layered structure including two or more different materials.

Conditions for forming a hole blocking layer, an electron transport layer, and an electron injection layer which constitute the electron transport region may be understood by referring to the conditions for forming the hole injection layer.

When the electron transport region includes a hole blocking layer, the hole blocking layer may include, for example, BCP, Bphen, BAlq, or any combination thereof, but embodiments of the present disclosure are not limited thereto:

BCP

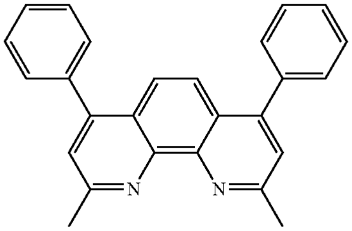

-continued

Bphen

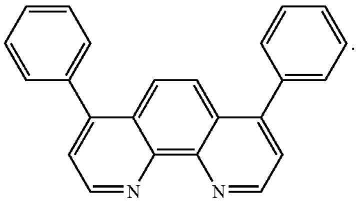

A thickness of the hole blocking layer may be in a range of about 20 Å to about 1,000 Å, for example, about 30 Å to about 300 Å. When the thickness of the hole blocking layer is within these ranges, excellent hole blocking characteristics may be obtained without a substantial increase in driving voltage.

The electron transport layer may further include BCP, Bphen, $Alq_3$, BAlq, TAZ, NTAZ, or any combination thereof:

$Alq_3$

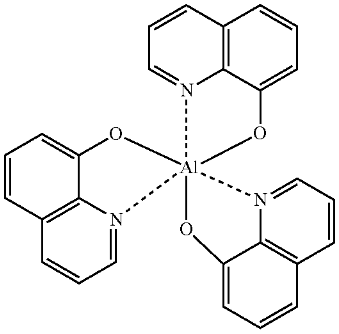

BAlq

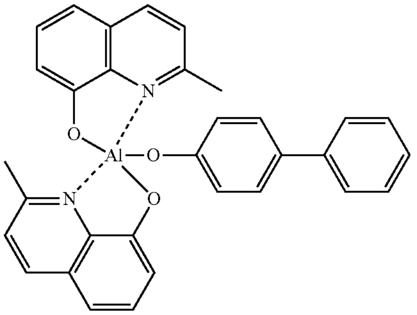

TAZ

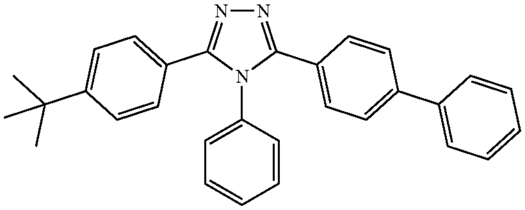

-continued

NTAZ

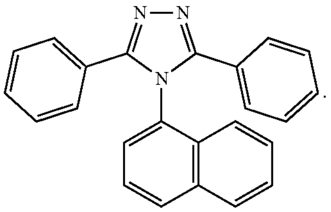

For example, the electron transport layer may include at least one of Compounds ET1 to ET25, but embodiments of the present disclosure are not limited thereto:

ET1

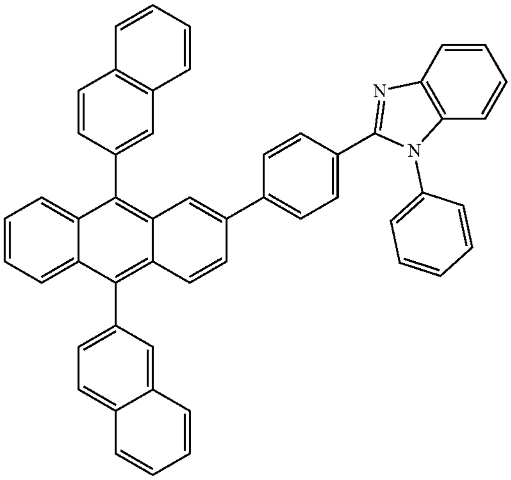

ET2

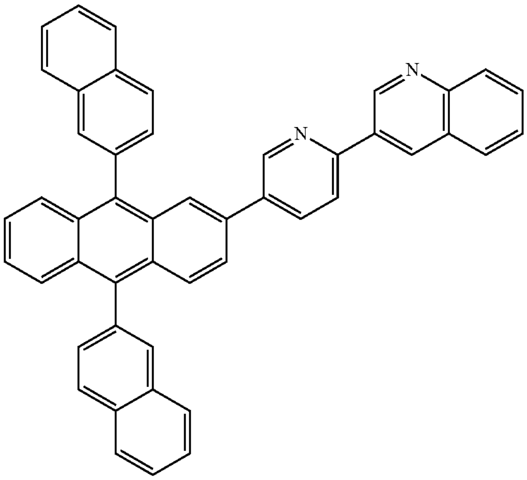

-continued
ET3
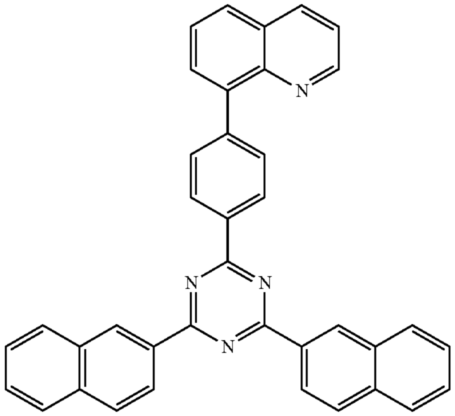
ET4
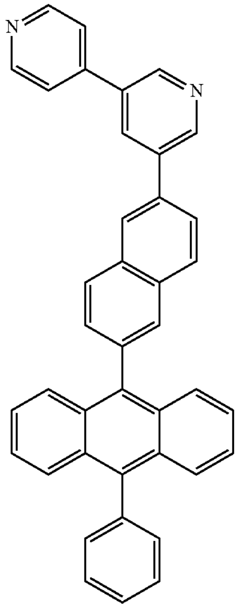
ET5
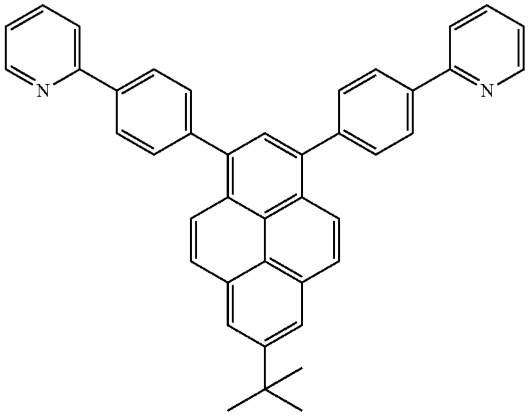
-continued
ET6
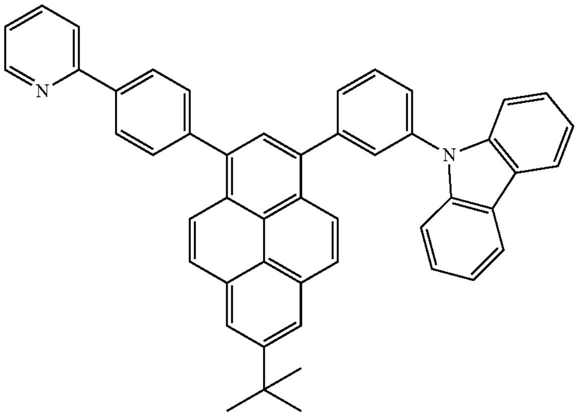
ET7
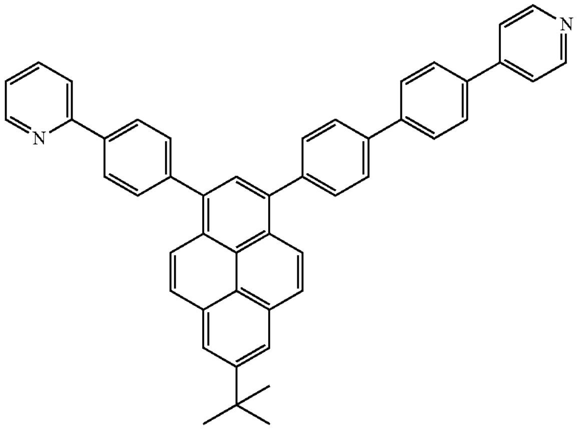
ET8
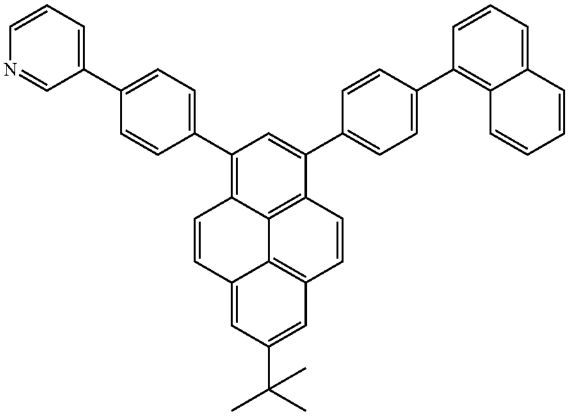

-continued
ET9
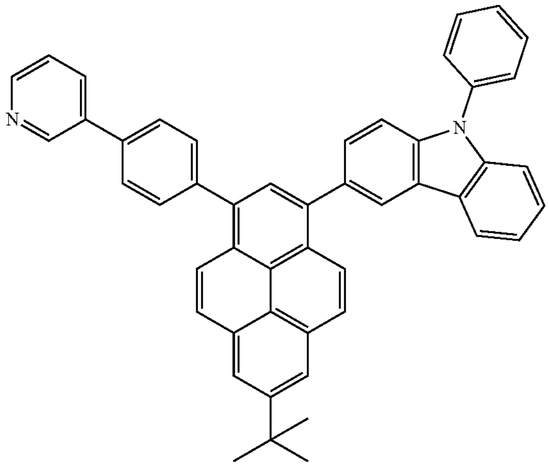
ET10
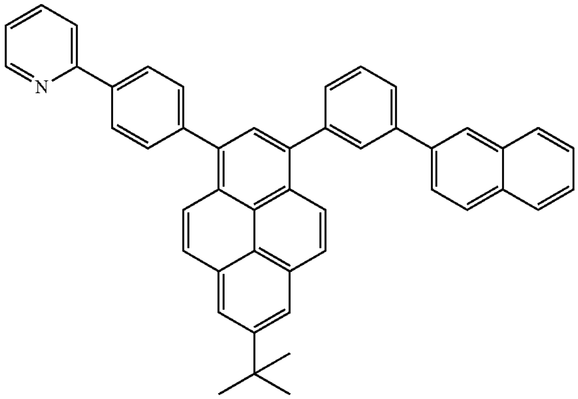
ET11
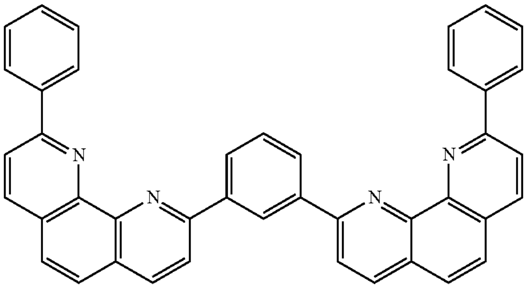
ET12
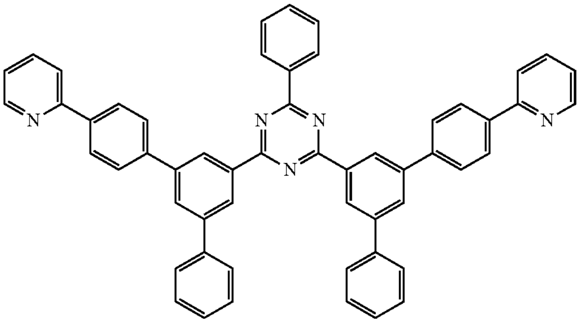
-continued
ET13
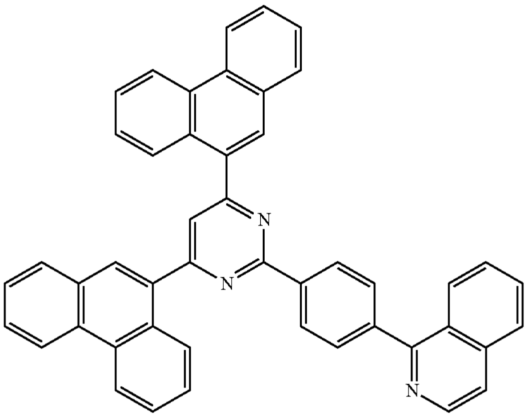
ET14
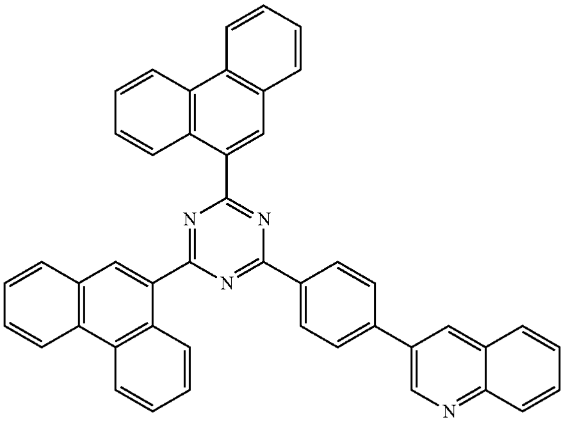
ET15
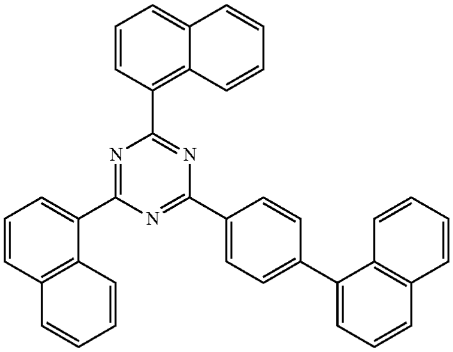

-continued
ET16
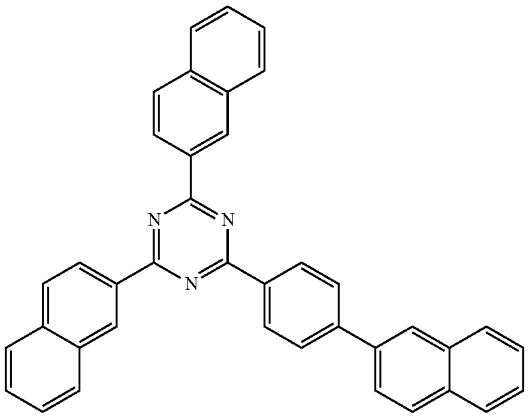
ET17
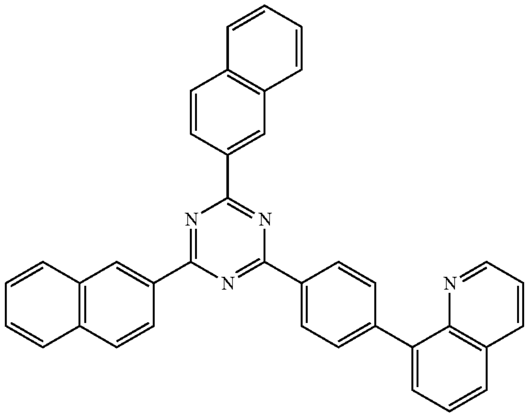
ET18
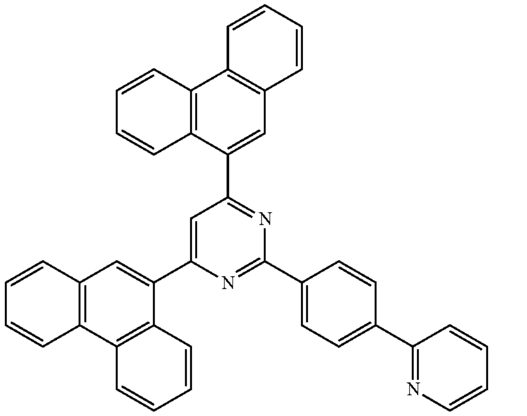
-continued
ET19
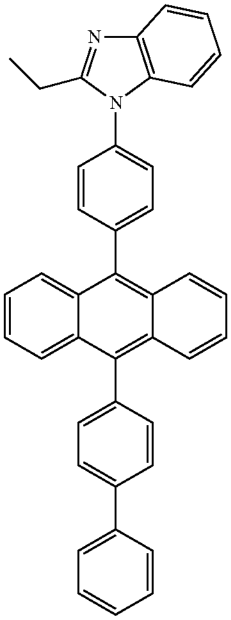
ET20
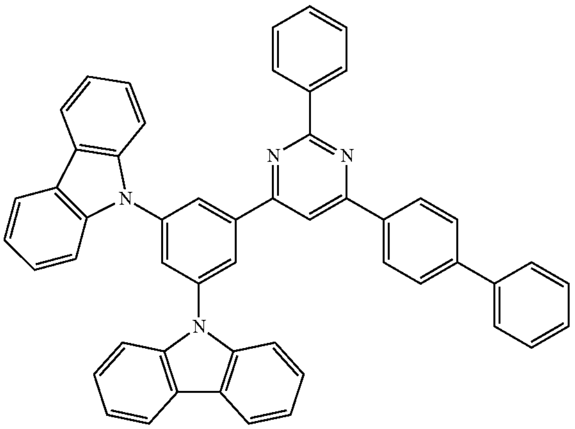
ET21
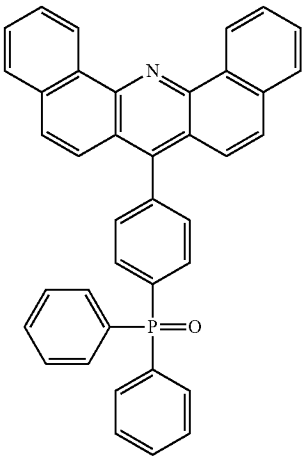

-continued

ET22

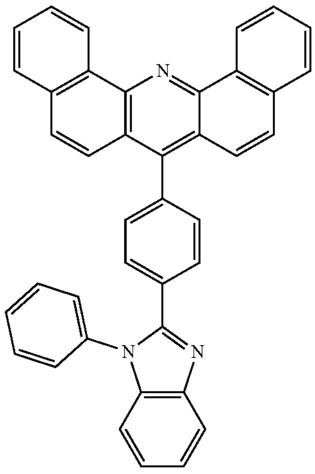

ET23

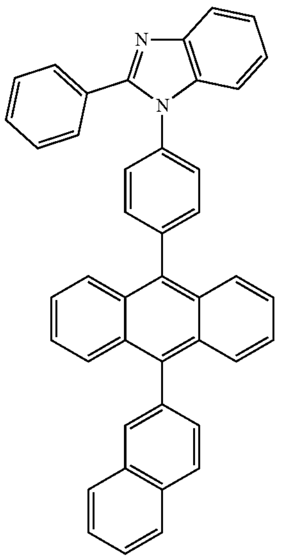

ET24

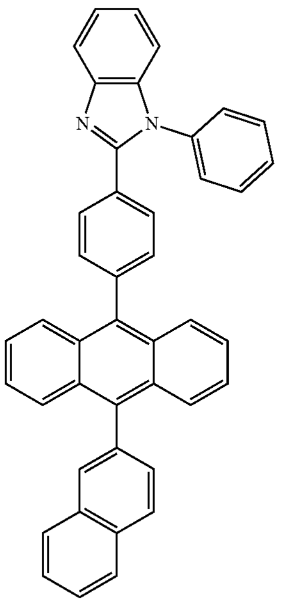

-continued

ET25

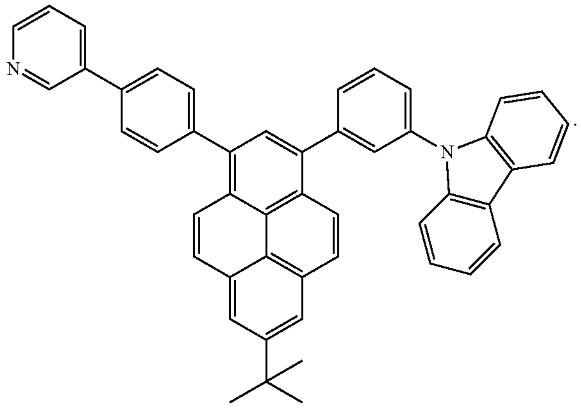

A thickness of the electron transport layer may be in a range of about 100 Å to about 1,000 Å, for example, about 150 Å to about 500 Å. When the thickness of the electron transport layer is within these ranges, satisfactory electron transport characteristics may be obtained without a substantial increase in driving voltage.

The electron transport layer may further include, in addition to the materials described above, a metal-containing material.

The metal-containing material may include a $L_1$ complex. The $L_1$ complex may include, for example, Compound ET-D1 (lithium quinolate, LiQ) or ET-D2:

ET-D1

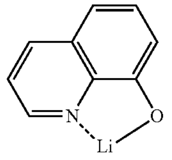

ET-D2

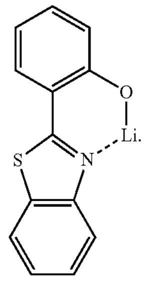

In addition, the electron transport region may include an electron injection layer that promotes the flow of electrons from the second electrode 19 thereinto.

The electron injection layer may include LiF, NaCl, CsF, $Li_2O$, BaO, or any combination thereof.

A thickness of the electron injection layer may be in a range of about 1 Å to about 100 Å, for example, about 3 Å to about 90 Å. When the thickness of the electron injection layer is within these ranges, satisfactory electron injection characteristics may be obtained without a substantial increase in driving voltage.

The second electrode 19 is arranged on the organic layer 15. The second electrode 19 may be a cathode. A material for forming the second electrode 19 may be metal, an alloy, an electrically conductive compound, or a combination thereof, which have a relatively low work function. For example, the material for forming the second electrode 19 may be lithium ($L_1$), magnesium (Mg), aluminum (Al), aluminum-lithium (Al—Li), calcium (Ca), magnesium-indium (Mg—In), or magnesium-silver (Mg—Ag). To manufacture a top-emission type light-emitting device, a transmissive electrode formed using ITO or IZO may be used as the material for forming the second electrode 19.

Hereinbefore, the organic light-emitting device has been described with reference to the FIGURE, but embodiments of the present disclosure are not limited thereto.

Another aspect of the present disclosure provides a diagnostic composition including at least one organometallic compound represented by Formula 1.

The organometallic compound represented by Formula 1 provides high luminescent efficiency. Accordingly, the diagnostic composition including the organometallic compound may have high diagnostic efficiency.

The diagnostic composition may be used in various applications including a diagnosis kit, a diagnosis reagent, a biosensor, and a biomarker.

The term "$C_1$-$C_{60}$ alkyl group" as used herein refers to a linear or branched saturated aliphatic hydrocarbon monovalent group having 1 to 60 carbon atoms, and non-limiting examples thereof include a methyl group, an ethyl group, a propyl group, an isobutyl group, a sec-butyl group, a tert-butyl group, a pentyl group, an isoamyl group, and a hexyl group. The term "$C_1$-$C_{60}$ alkylene group" as used herein refers to a divalent group having the same structure as the $C_1$-$C_{60}$ alkyl group.

The term "$C_1$-$C_{60}$ alkoxy group" as used herein refers to a monovalent group represented by —$OA_{101}$ (wherein $A_{101}$ is the $C_1$-$C_{60}$ alkyl group), and examples thereof include a methoxy group, an ethoxy group, and an isopropoxy group.

The term "$C_2$-$C_{60}$ alkenyl group" as used herein refers to a hydrocarbon group formed by substituting at least one carbon-carbon double bond in the middle or at the terminus of the $C_2$-$C_{60}$ alkyl group, and examples thereof include an ethenyl group, a propenyl group, and a butenyl group. The term "$C_2$-$C_{60}$ alkenylene group" as used herein refers to a divalent group having the same structure as the $C_2$-$C_{60}$ alkenyl group.

The term "$C_2$-$C_{60}$ alkynyl group" as used herein refers to a hydrocarbon group formed by substituting at least one carbon-carbon triple bond in the middle or at the terminus of the $C_2$-$C_{60}$ alkyl group, and examples thereof include an ethynyl group and a propynyl group. The term "$C_2$-$C_{60}$ alkynylene group" as used herein refers to a divalent group having the same structure as the $C_2$-$C_{60}$ alkynyl group.

The term "$C_3$-$C_{10}$ cycloalkyl group" as used herein refers to a monovalent saturated hydrocarbon monocyclic group having 3 to 10 carbon atoms, and examples thereof include a cyclopropyl group, a cyclobutyl group, a cyclopentyl group, a cyclohexyl group, and a cycloheptyl group. The term "$C_3$-$C_{10}$ cycloalkylene group" as used herein refers to a divalent group having the same structure as the $C_3$-$C_{10}$ cycloalkyl group.

The term "$C_1$-$C_{10}$ heterocycloalkyl group" as used herein refers to a monovalent saturated monocyclic group having at least one heteroatom of N, O, P, Si, B, Se, Te, Ge, S, or any combination thereof as a ring-forming atom and 1 to 10 carbon atoms, and non-limiting examples thereof include a tetrahydrofuranyl group and a tetrahydrothiophenyl group. The term "$C_1$-$C_{10}$ heterocycloalkylene group as used herein refers to a divalent group having the same structure as the $C_1$-$C_{10}$ heterocycloalkyl group.

The term "$C_3$-$C_{10}$ cycloalkenyl group" as used herein refers to a monovalent monocyclic group that has 3 to 10 carbon atoms and at least one carbon-carbon double bond in the ring thereof and no aromaticity, and examples thereof include a cyclopentenyl group, a cyclohexenyl group, and a cycloheptenyl group. The term "$C_3$-$C_{10}$ cycloalkenylene group" as used herein refers to a divalent group having the same structure as the $C_3$-$C_{10}$ cycloalkenyl group.

The term "$C_1$-$C_{10}$ heterocycloalkenyl group" as used herein refers to a monovalent monocyclic group that has at least one heteroatom selected from N, O, P, Si, B, Se, Te, Ge, S, or any combination thereof as a ring-forming atom, 1 to 10 carbon atoms, and at least one carbon-carbon double bond in its ring. Examples of the $C_1$-$C_{10}$ heterocycloalkenyl group include a 2,3-dihydrofuranyl group and a 2,3-dihydrothiophenyl group. The term "$C_1$-$C_{10}$ heterocycloalkenylene group" as used herein refers to a divalent group having the same structure as the $C_1$-$C_{10}$ heterocycloalkenyl group.

The term "$C_6$-$C_{60}$ aryl group" as used herein refers to a monovalent group having a carbocyclic aromatic system having 6 to 60 carbon atoms, and the term "$C_6$-$C_{60}$ arylene group" as used herein refers to a divalent group having a carbocyclic aromatic system having 6 to 60 carbon atoms. Examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the two or more rings may be fused to each other. The term "$C_7$-$C_{60}$ alkylaryl group" as used herein refers to a $C_6$-$C_{60}$ aryl group substituted with at least one $C_1$-$C_{60}$ alkyl group.

The term "$C_1$-$C_{60}$ heteroaryl group" as used herein refers to a monovalent group having a carbocyclic aromatic system that has at least one heteroatom selected from N, O, P, Si, B, Se, Te, Ge, S, or any combination thereof as a ring-forming atom, and 1 to 60 carbon atoms. The term "$C_1$-$C_{60}$ heteroarylene group" as used herein refers to a divalent group having a carbocyclic aromatic system that has at least one heteroatom selected from N, O, P, B, Se, Te, Ge, S, or any combination thereof as a ring-forming atom, and 1 to 60 carbon atoms. Examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_6$-$C_{60}$ heteroaryl group and the $C_6$-$C_{60}$ heteroarylene group each include two or more rings, the two or more rings may be fused to each other. The term "$C_2$-$C_{60}$ alkylheteroaryl group" as used herein refers to a $C_1$-$C_{60}$ heteroaryl group substituted with at least one $C_1$-$C_{60}$ alkyl group.

The term "$C_6$-$C_{60}$ aryloxy group" as used herein indicates —$OA_{102}$ (wherein $A_{102}$ is the $C_6$-$C_{60}$ aryl group), and the term "$C_6$-$C_{60}$ arylthio group" as used herein indicates —$SA_{103}$ (wherein $A_{103}$ is the $C_6$-$C_{60}$ aryl group).

The term "$C_1$-$C_{60}$ heteroaryloxy group" as used herein indicates —$OA_{104}$ (wherein $A_{104}$ is the $C_1$-$C_{60}$ heteroaryl group), and the term "$C_1$-$C_{60}$ heteroarylthio group" as used herein indicates —$SA_{105}$ (wherein $A_{105}$ is the $C_1$-$C_{60}$ heteroaryl group).

The term "monovalent non-aromatic condensed polycyclic group" as used herein refers to a monovalent group (for example, having 8 to 60 carbon atoms) having two or more rings condensed to each other, only carbon atoms as ring-forming atoms, and no aromaticity in its entire molecular structure. An example of the monovalent non-aromatic condensed polycyclic group includes a fluorenyl group. The term "divalent non-aromatic condensed polycyclic group"

as used herein refers to a divalent group having the same structure as the monovalent non-aromatic condensed polycyclic group.

The term "monovalent non-aromatic condensed heteropolycyclic group" as used herein refers to a monovalent group (for example, having 2 to 60 carbon atoms) having two or more rings condensed to each other, a heteroatom selected from N, O, P, Si, B, Se, Te, Ge, S, or any combination thereof, other than carbon atoms, as a ring-forming atom, and no aromaticity in its entire molecular structure. An example of the monovalent non-aromatic condensed heteropolycyclic group includes a carbazolyl group. The term "divalent non-aromatic condensed heteropolycyclic group" as used herein refers to a divalent group having the same structure as the monovalent non-aromatic condensed heteropolycyclic group.

The term "$C_5$-$C_{30}$ carbocyclic group" as used herein refers to a saturated or unsaturated cyclic group having, as a ring-forming atom, 5 to 30 carbon atoms only. The $C_5$-$C_{30}$ carbocyclic group may be a monocyclic group or a polycyclic group.

The term "$C_1$-$C_{30}$ heterocyclic group" as used herein refers to a saturated or unsaturated cyclic group having, as a ring-forming atom, at least one heteroatom selected from N, O, Si, P, B, Se, Te, Ge, S, or any combination thereof other than 1 to 30 carbon atoms. The $C_1$-$C_{30}$ heterocyclic group may be a monocyclic group or a polycyclic group.

At least one substituent of the substituted $C_5$-$C_{60}$ carbocyclic group, the substituted $C_1$-$C_{60}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted $C_1$-$C_{60}$ hetero aryloxy group, the substituted $C_1$-$C_{60}$ hetero arylthio group, the substituted monovalent non-aromatic condensed polycyclic group, and the substituted monovalent non-aromatic condensed heteropolycyclic group may be:

deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, or a $C_1$-$C_{60}$ alkoxy group;

a $C_1$-$C_{60}$ alkyl group, a $C_2$-$C_{60}$ alkenyl group, a $C_2$-$C_{60}$ alkynyl group, or a $C_1$-$C_{60}$ alkoxy group, each substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, $—N(Q_{11})(Q_{12})$, $—Si(Q_{13})(Q_{14})(Q_{15})$, $—B(Q_{16})(Q_{17})$, $—P(═O)(Q_{18})(Q_{19})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group, each substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—N(Q_{21})(Q_{22})$, $—Si(Q_{23})(Q_{24})(Q_{25})$, $—B(Q_{26})(Q_{27})$, $—P(═O)(Q_{28})(Q_{29})$, or any combination thereof; or $—N(Q_{31})(Q_{32})$, $—Si(Q_{33})(Q_{34})(Q_{35})$, $—B(Q_{36})(Q_{37})$, or $—P(═O)(Q_{38})(Q_{39})$, wherein $Q_1$ to $Q_9$, $Q_{11}$ to $Q_{19}$, $Q_{21}$ to $Q_{29}$, and $Q_{31}$ to $Q_{39}$ may each independently be hydrogen, deuterium, —F, —Cl, —Br, —I, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted a $C_1$-$C_{60}$ alkyl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group.

As used herein, the number of carbons in each group that is substituted (e.g., $C_1$-$C_{60}$) excludes the number of carbons in the substituent. For example, a $C_1$-$C_{60}$ alkyl group can be substituted with a $C_1$-$C_{60}$ alkyl group. The total number of carbons included in the $C_1$-$C_{60}$ alkyl group substituted with the $C_1$-$C_{60}$ alkyl group is not limited to 60 carbons. In addition, more than one $C_1$-$C_{60}$ alkyl substituent may be present on the $C_1$-$C_{60}$ alkyl group. This definition is not limited to the $C_1$-$C_{60}$ alkyl group and applies to all substituted groups that recite a carbon range.

Hereinafter, a compound and an organic light-emitting device according to embodiments are described in detail with reference to Synthesis Example and Examples. However, the organic light-emitting device is not limited thereto. The wording "'B' was used instead of 'A'" as used in describing Synthesis Examples means that an amount of 'A' used was identical to an amount of 'B' used, in terms of a molar equivalent.

EXAMPLES

Synthesis Example 1: Synthesis of Compound 1

(1) Synthesis of Intermediate 1(1)

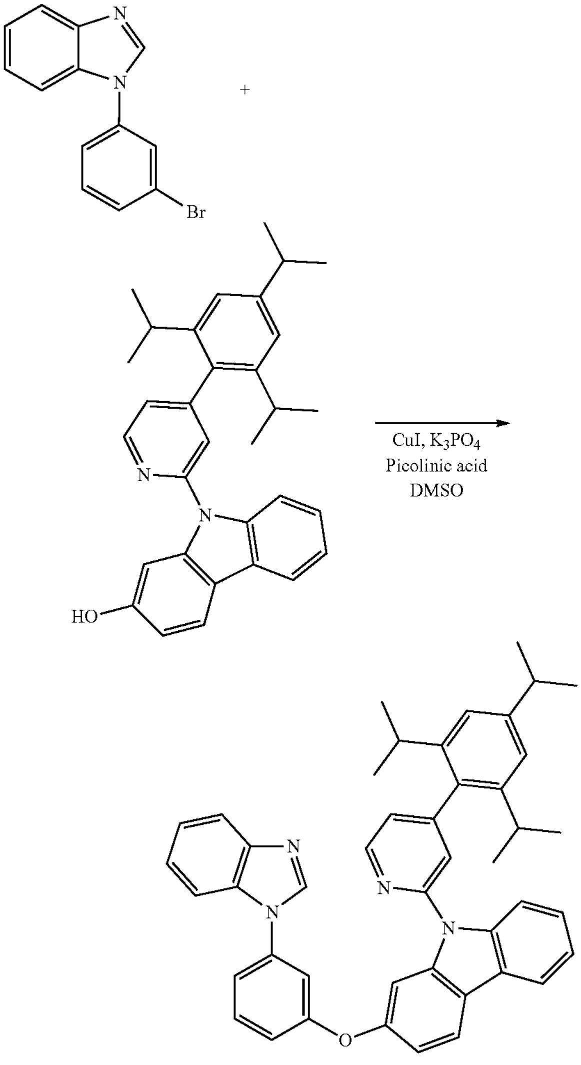

1(1)

18.3 mmol (5 g) of 1-(3-bromophenyl)-1H-benzo[d]imidazole and 22.0 mmol (10.2 g) of 9-(4-(2,4,6-triisopropylphenyl)pyridin-2-yl)-9H-carbazol-2-ol were dissolved in 180 ml of dimethyl sulfoxide (DMSO), and then, 5.5 mmol (1.1 g) of CuI, 73.2 mmol (15.6 g) of $K_3PO_4$, and 27.5 mmol (3.3 g) of picolinic acid were added thereto. The resultant mixture was refluxed at a temperature of 100° C. for 12 hours. After completion of the reaction, the mixture was cooled to room temperature, ethyl acetate and water were added, the organic layer was washed three times with water and dried using magnesium sulfate, and then, the solvent was removed therefrom under reduced pressure, thereby obtaining a crude product. The crude product was subjected to silica gel column chromatography (eluent: ethyl acetate: hexane) to obtain Intermediate 1(1) (yield of 63%).

MALDI-TOF (m/z): 654.33 $[M]^+$ (2) Synthesis of Intermediate 1(2)

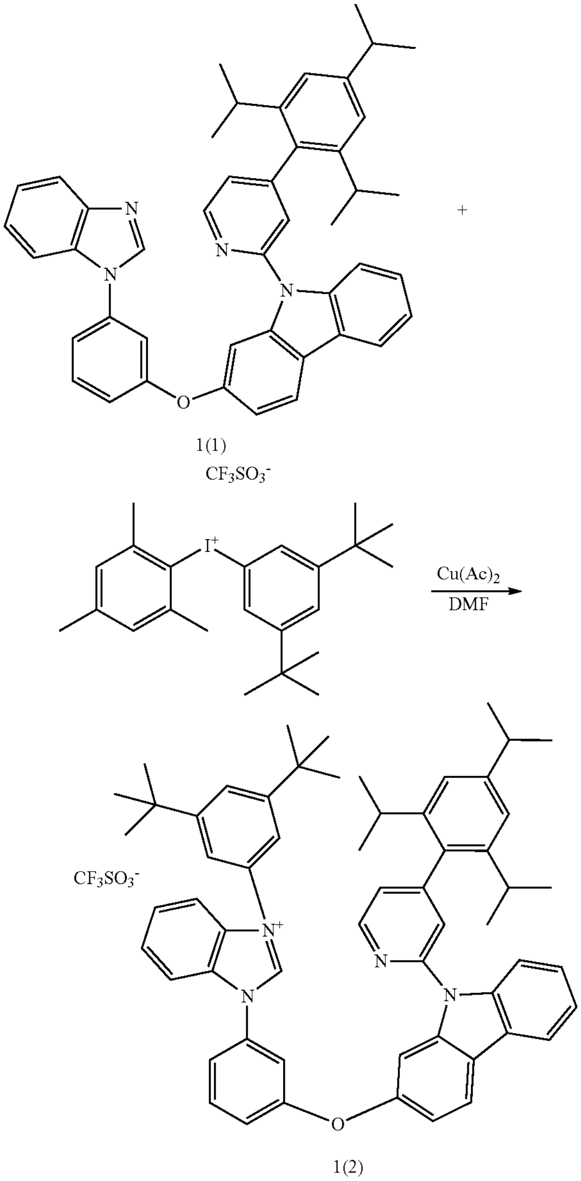

1(2)

11.6 mmol (7.6 g) of Intermediate 1(1), 15.1 mmol (8.8 g) of (3,5-di-t-butylphenyl)(mesityl) iodonium trifluoromethanesulfonate, and 1.16 mmol (0.21 g) of copper acetate ($Cu(OAc)_2$) were added to 60 mL of dimethylformamide (DMF), and the resultant mixture was refluxed at a temperature of 130° C. for 12 hours. A crude product obtained by removing a solvent therefrom under reduced pressure was subjected to silica gel column chromatography (eluent: dichloromethane: acetone) to obtain Intermediate 1(2) (yield of 87%).

MALDI-TOF (m/z): 843.50 $[M]^+$ (3) Synthesis of Compound 1

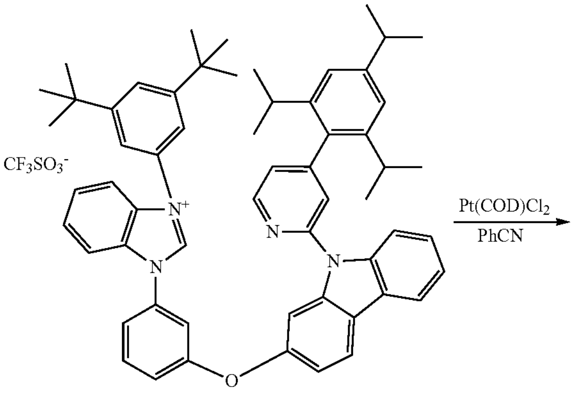

1(2)

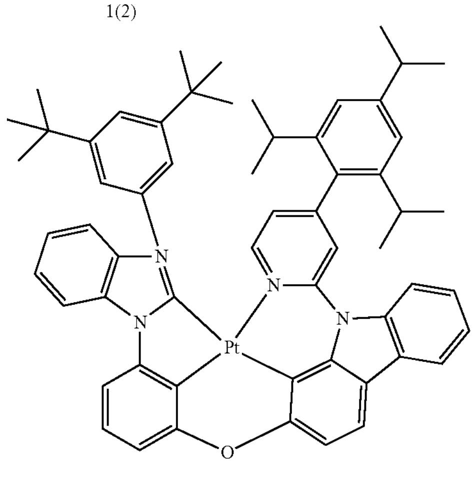

1

10.1 mmol (3.8 g) of Pt(COD)$Cl_2$, 10.1 mmol (10.0 g) of Intermediate 1(2), and 30.3 mmol (2.5 g) sodium acetate (NaOAc) were added to 170 mL of benzonitrile (PhCN), and then, the resultant mixture was refluxed at a temperature of 180° C. for 12 hours. After completion of the reaction, the mixture was cooled to room temperature and a solvent was removed therefrom under reduced pressure, thereby obtaining a crude product. The crude product was subjected to silica gel column chromatography (eluent: dichloromethane and hexane) to obtain Compound 1 (yield of 45%).

MALDI-TOF (m/z): 1035.42 $[M]^+$

Synthesis Example 2: Synthesis of Compound 2

(1) Synthesis of Intermediate 2(1)

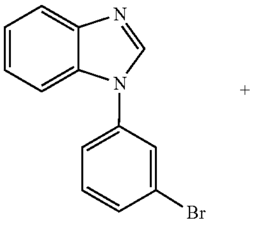

-continued

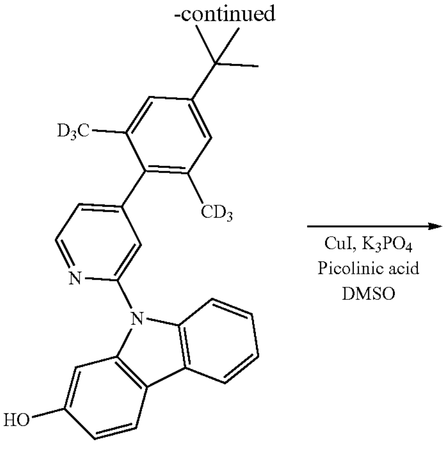

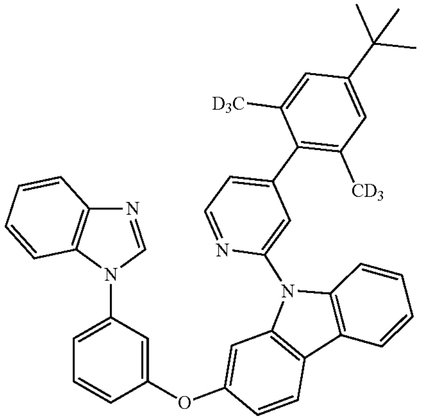

2(1)

18.3 mmol (5 g) of 1-(3-bromophenyl)-1H-benzo[d]imidazole and 22.0 mmol (9.4 g) of 9-(4-(4-(tert-butyl)-2,6-bis(methyl-d3)phenyl)pyridin-2-yl)-9H-carbazol-2-ol were dissolved in 180 ml of DMSO, and then, 5.5 mmol (1.1 g) of CuI, 73.2 mmol (15.6 g) of $K_3PO_4$, and 27.5 mmol (3.3 g) of picolinic acid were added thereto. The resultant mixture was refluxed at a temperature of 100° C. for 12 hours. After completion of the reaction, the mixture was cooled to room temperature, ethyl acetate and water were added, the organic layer was extracted using a mixture of ethyl acetate and water was washed three times with water and dried using magnesium sulfate, and then, the solvent was removed therefrom under reduced pressure, thereby obtaining a crude product. The crude product was subjected to silica gel column chromatography (eluent: ethyl acetate: hexane) to obtain Intermediate 2(1) (yield of 64%).

MALDI-TOF (m/z): 618.32 $[M]^+$ (2) Synthesis of Intermediate 2(2)

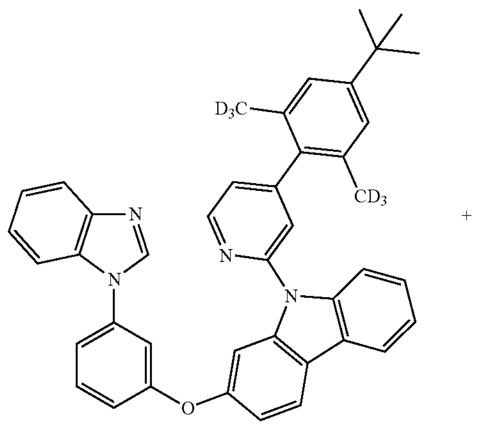

2(1)

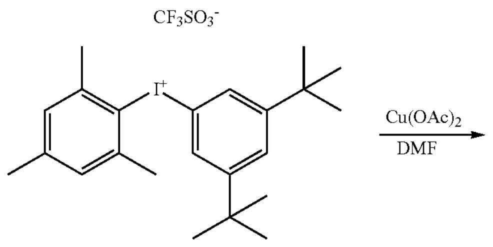

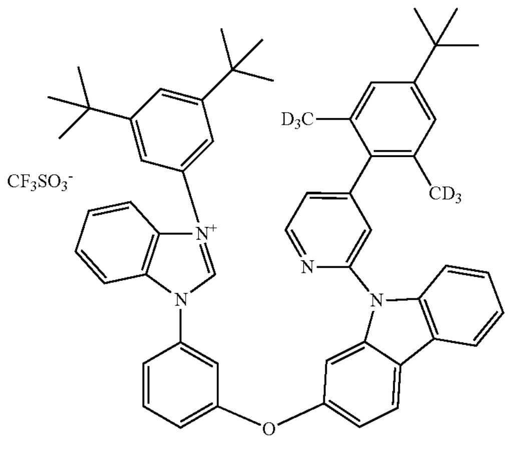

2(2)

11.6 mmol (7.2 g) of Intermediate 2(1), 15.1 mmol (8.8 g) of (3,5-di-t-butylphenyl)(mesityl) iodonium trifluoromethanesulfonate, and 1.16 mmol (0.21 g) of $Cu(OAc)_2$ were added to 60 mL of DMF, and the resultant mixture was refluxed at a temperature of 130° C. for 12 hours. A crude product obtained by removing a solvent therefrom under reduced pressure was subjected to silica gel column chromatography (eluent: dichloromethane: acetone) to obtain Intermediate 2(2) (yield of 81%).

MALDI-TOF (m/z): 807.49 $[M]^+$ (3) Synthesis of Compound 2

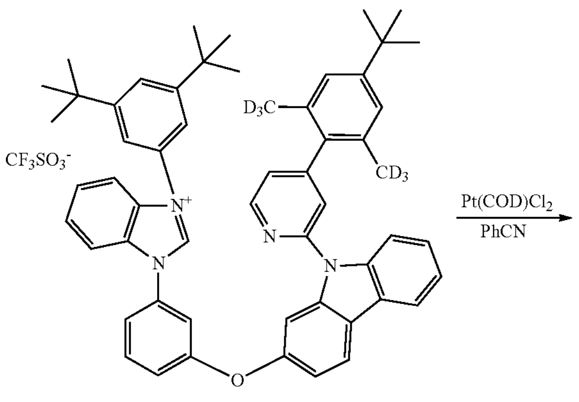

2(2)

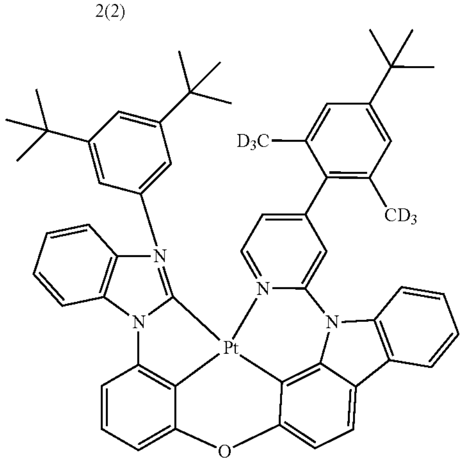

2

9.4 mmol (3.5 g) of $Pt(COD)Cl_2$, 9.4 mmol (9.0 g) of Intermediate 2(2), and 28.2 mmol (2.3 g) of NaOAc were added to 160 mL of PhCN, and then, the resultant mixture was refluxed at a temperature of 180° C. for 12 hours. After completion of the reaction, the mixture was cooled to room temperature and a solvent was removed therefrom under reduced pressure, thereby obtaining a crude product. The crude product was subjected to silica gel column chromatography (eluent: dichloromethane and hexane) to obtain Compound 2 (yield of 48%).

MALDI-TOF (m/z): 999.40 $[M]^+$

Synthesis Example 3: Synthesis of Compound 3

(1) Synthesis of Intermediate 3(1)

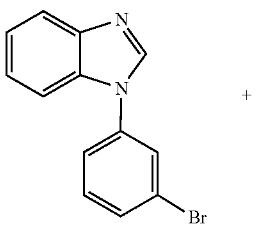

-continued

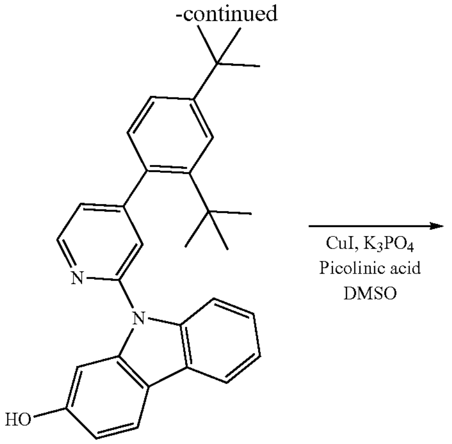

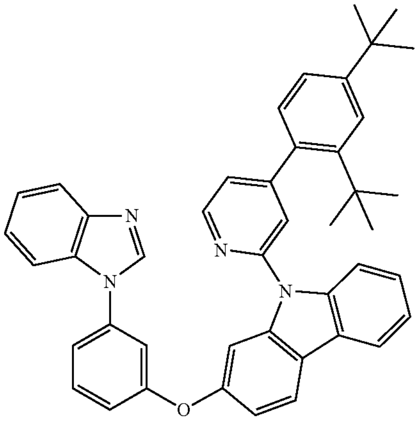

3(1)

16.6 mmol (4.5 g) of 1-(3-bromophenyl)-1H-benzo[d]imidazole and 13.8 mmol (6.2 g) of 9-(4-(2,4-di-tert-butylphenyl)pyridin-2-yl)-9H-carbazol-2-ol were dissolved in 140 ml of DMSO, and then, 4.1 mmol (0.8 g) of CuI, 55.3 mmol (11.7 g) of $K_3PO_4$, and 20.7 mmol (2.6 g) of picolinic acid were added thereto. The resultant mixture was refluxed at a temperature of 100° C. for 12 hours. After completion of the reaction, the mixture was cooled to room temperature, an organic layer extracted using a mixture of ethyl acetate and water was washed three times with water and dried using magnesium sulfate, and then, a solvent was removed therefrom under reduced pressure, thereby obtaining a crude product. The crude product was subjected to silica gel column chromatography (eluent: ethyl acetate: hexane) to obtain Intermediate 3(1) (yield of 86%).

MALDI-TOF (m/z): 640.28 $[M]^+$ (2) Synthesis of Intermediate 3(2)

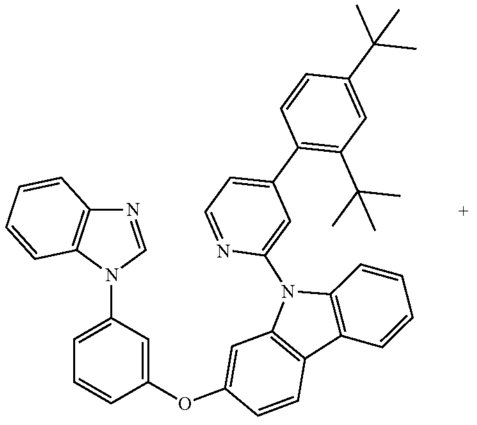

3(1)

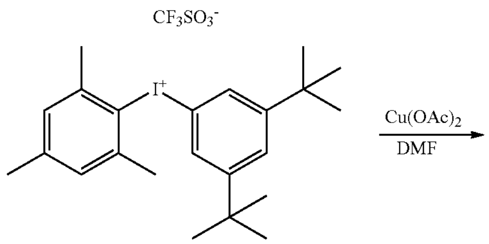

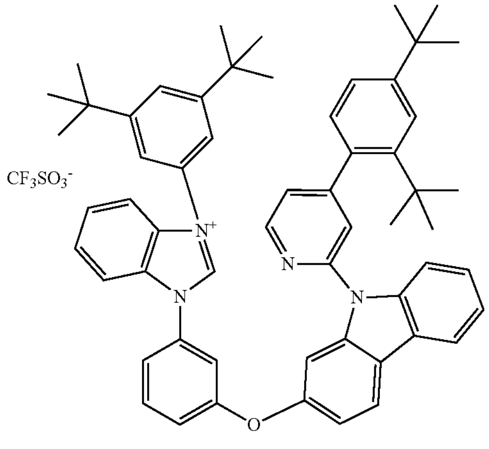

3(2)

11.9 mmol (7.7 g) of Intermediate 3(1), 15.5 mmol (9.1 g) of (3,5-di-t-butylphenyl)(mesityl) iodonium trifluoromethanesulfonate, and 1.2 mmol (0.22 g) of $Cu(OAc)_2$ were added to 60 mL of DMF, and the resultant mixture was refluxed at a temperature of 130° C. for 12 hours. A crude product obtained by removing a solvent therefrom under reduced pressure was subjected to silica gel column chromatography (eluent: dichloromethane: acetone) to obtain Intermediate 3(2) (yield of 85%).

MALDI-TOF (m/z): 829.54 $[M]^+$ (3) Synthesis of Compound 3

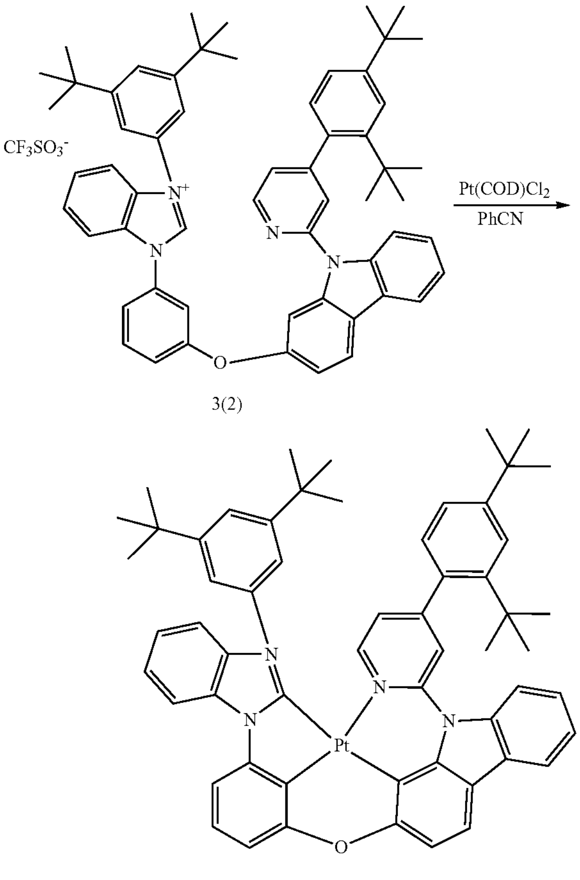

3(2)

3

10.2 mmol (3.8 g) of $Pt(COD)Cl_2$, 10.2 mmol (10.0 g) of Intermediate 3(2), and 30.6 mmol (2.5 g) NaOAc were added to 170 mL of PhCN, and then, the resultant mixture was refluxed at a temperature of 180° C. for 12 hours. After completion of the reaction, the mixture was cooled to room temperature and a solvent was removed therefrom under reduced pressure, thereby obtaining a crude product. The crude product was subjected to silica gel column chromatography (eluent: dichloromethane and hexane) to obtain Compound 3 (yield of 45%).

MALDI-TOF (m/z): 1021.51 $[M]^+$

Synthesis Example 4: Synthesis of Compound 4

(1) Synthesis of Intermediate 4(1)

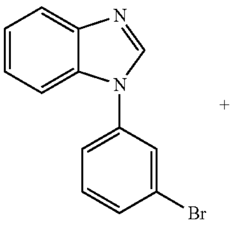

-continued

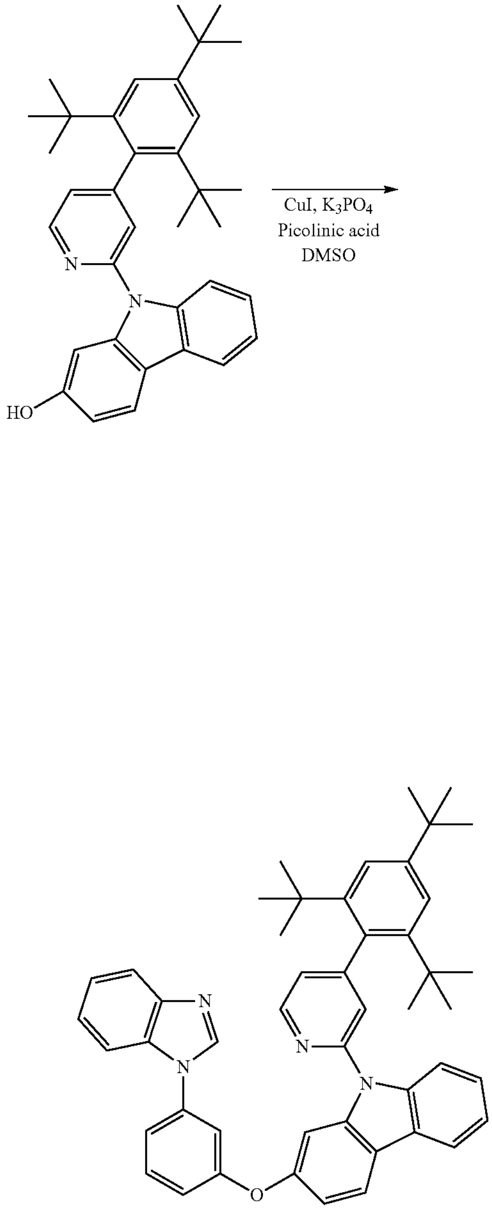

4(1)

18.3 mmol (5 g) of 1-(3-bromophenyl)-1H-benzo[d]imidazole and 22.0 mmol (10.2 g) of 9-(4-(2,4,6-tri-tert-butylphenyl)pyridin-2-yl)-9H-carbazol-2-ol were dissolved in 180 ml of DMSO, and then, 5.5 mmol (1.1 g) of CuI, 73.2 mmol (15.6 g) of $K_3PO_4$, and 27.5 mmol (3.3 g) of picolinic acid were added thereto. The resultant mixture was refluxed at a temperature of 100° C. for 12 hours. After completion of the reaction, the mixture was cooled to room temperature, an organic layer extracted using a mixture of ethyl acetate and water was washed three times with water and dried using magnesium sulfate, and then, a solvent was removed therefrom under reduced pressure, thereby obtaining a crude product. The crude product was subjected to silica gel column chromatography (eluent: ethyl acetate: hexane) to obtain Intermediate 4(1) (yield of 57%).

MALDI-TOF (m/z): 696.40 $[M]^+$ (2) Synthesis of Intermediate 4(2)

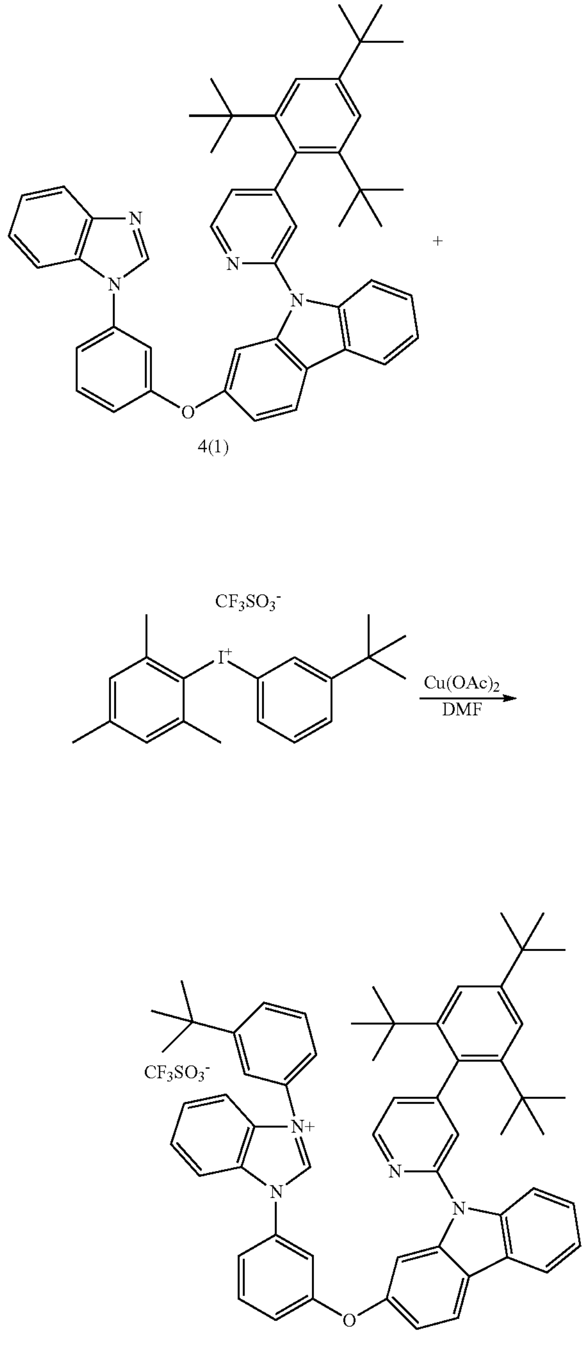

4(1)

4(2)

10.4 mmol (7.2 g) of Intermediate 4(1), 13.5 mmol (7.1 g) of (3-(t-butylphenyl)(mesityl) iodonium trifluoromethanesulfonate, and 1.04 mmol (0.19 g) of $Cu(OAc)_2$ were added to 50 mL of DMF, and the resultant mixture was refluxed at a temperature of 130° C. for 12 hours. A crude product obtained by removing a solvent therefrom under reduced pressure was subjected to silica gel column chromatography (eluent: dichloromethane: acetone) to obtain Intermediate 4(2) (yield of 85%).

MALDI-TOF (m/z): 829.49 $[M]^+$ (3) Synthesis of Compound 4

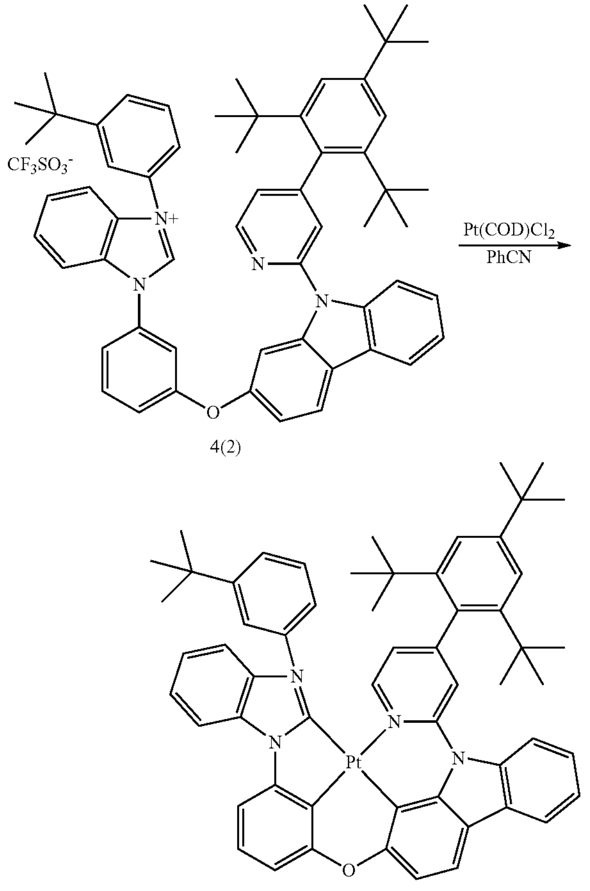

4(2)

4

8.8 mmol (3.3 g) of $Pt(COD)Cl_2$, 8.8 mmol (8.6 g) of Intermediate 4(2), and 26.4 mmol (2.2 g) of NaOAc were added to 150 mL of PhCN, and then, the resultant mixture was refluxed at a temperature of 180° C. for 12 hours. After completion of the reaction, the mixture was cooled to room temperature and a solvent was removed therefrom under reduced pressure, thereby obtaining a crude product. The crude product was subjected to silica gel column chromatography (eluent: dichloromethane and hexane) to obtain Compound 4 (yield of 36%).

MALDI-TOF (m/z): 1021.45 $[M]^+$

Synthesis Example 5: Synthesis of Compound 5

(1) Synthesis of Intermediate 5(1)

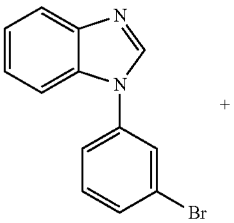

-continued

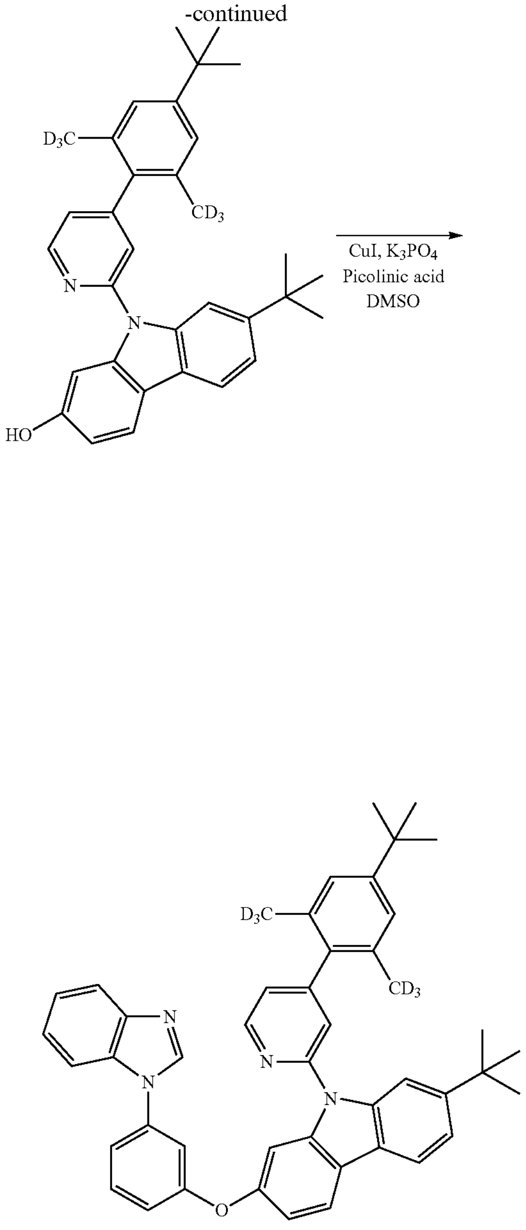

5(1)

18.3 mmol (5 g) of 1-(3-bromophenyl)-1H-benzo[d]imidazole and 22.0 mmol (10.6 g) of 7-(tert-butyl)-9-(4-(4-(tert-butyl)-2,6-bis(methyl-d3)phenyl)pyridin-2-yl)-9H-carbazol-2-ol were dissolved in 180 ml of DMSO, and then, 5.5 mmol (1.1 g) of CuI, 73.2 mmol (15.6 g) of $K_3PO_4$, and 27.5 mmol (3.3 g) of picolinic acid were added thereto. The resultant mixture was refluxed at a temperature of 100° C. for 12 hours. After completion of the reaction, the mixture was cooled to room temperature, an organic layer extracted using a mixture of ethyl acetate and water was washed three times with water and dried using magnesium sulfate, and then, a solvent was removed therefrom under reduced pressure, thereby obtaining a crude product. The crude product was subjected to silica gel column chromatography (eluent: ethyl acetate: hexane) to obtain Intermediate 5(1) (yield of 68%).

MALDI-TOF (m/z): 674.40 $[M]^+$ (2) Synthesis of Intermediate 5(2)

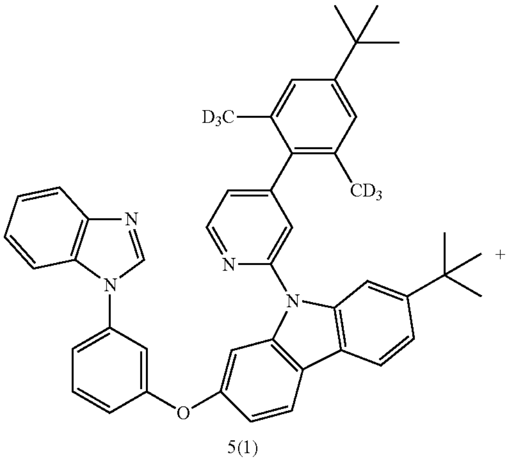

5(1)

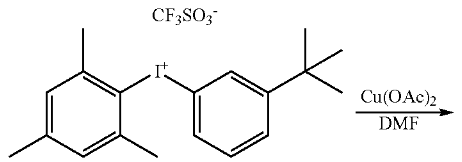

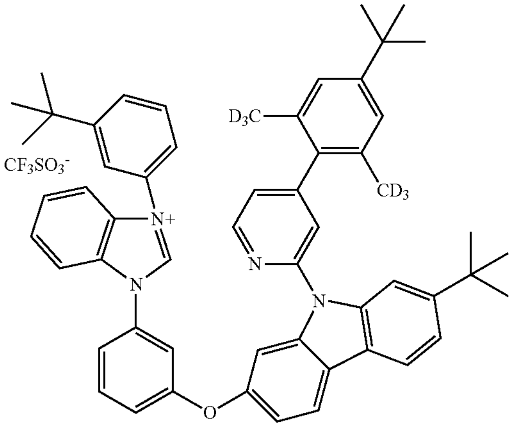

5(2)

12.4 mmol (8.4 g) of Intermediate 5(1), 16.2 mmol (8.6 g) of (3-(t-butylphenyl)(mesityl) iodonium trifluoromethanesulfonate, and 1.24 mmol (0.22 g) of $Cu(OAc)_2$ were added to 60 mL of DMF, and the resultant mixture was refluxed at a temperature of 130° C. for 12 hours. A crude product obtained by removing a solvent therefrom under reduced pressure was subjected to silica gel column chromatography (eluent: dichloromethane: acetone) to obtain Intermediate 5(2) (yield of 83%).

MALDI-TOF (m/z): 807.50 $[M]^+$ (3) Synthesis of Compound 5

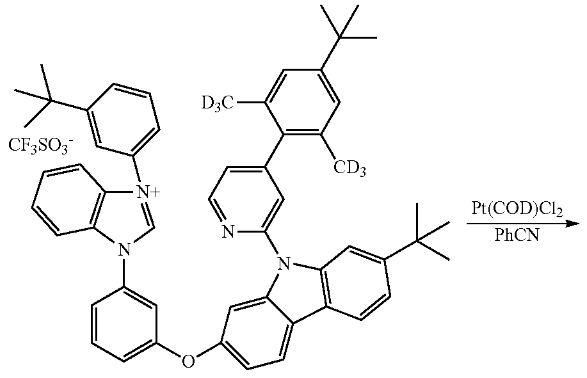

5(2)

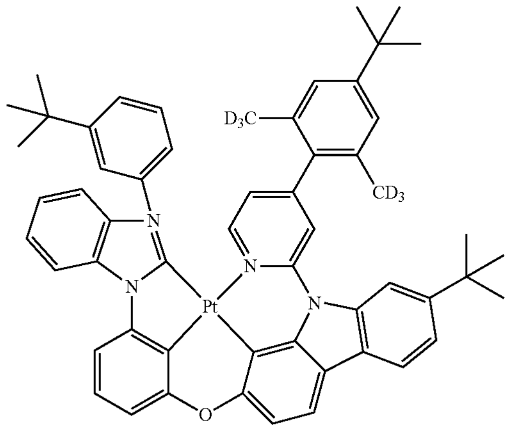

5

10.3 mmol (3.9 g) of $Pt(COD)Cl_2$, 10.3 mmol (9.9 g) of Intermediate 5(2), and 30.9 mmol (2.5 g) of NaOAc were added to 170 mL of PhCN, and then, the resultant mixture was refluxed at a temperature of 180° C. for 12 hours. After completion of the reaction, the mixture was cooled to room temperature and a solvent was removed therefrom under reduced pressure, thereby obtaining a crude product. The crude product was subjected to silica gel column chromatography (eluent: dichloromethane and hexane) to obtain Compound 5 (yield of 41%).

MALDI-TOF (m/z): 999.42 $[M]^+$

Synthesis Example 6: Synthesis of Compound 6

(1) Synthesis of Intermediate 6(1)

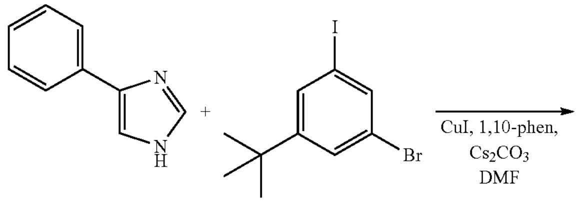

-continued

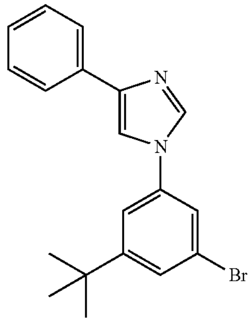

6(1)

69.4 mmol (10 g) of 4-phenyl-1H-imidazole, 83.2 mmol (28.2 g) of 1-bromo-3-(tert-butyl)-5-iodobenzene, 17.4 mmol (3.3 g) of CuI, 20.8 mmol (3.8 g) of 1,10-phenanthroline, and 138.7 mmol (45.2 g) of $Cs_2CO_3$ were added to 140 mL of DMF, and the resultant mixture was refluxed at a temperature of 130° C. for 12 hours. The reaction product obtained therefrom was cooled, ethyl acetate and water were added, the organic layer was washed three times with water and dried using magnesium sulfate, and then, the solvent was removed therefrom under reduced pressure, thereby obtaining a crude product. The crude product was subjected to silica gel column chromatography (eluent: ethyl acetate and hexane) to obtain Intermediate 6(1) (yield of 41%).

MALDI-TOF (m/z): 354.06 $[M]^+$ (2) Synthesis of Intermediate 6(2)

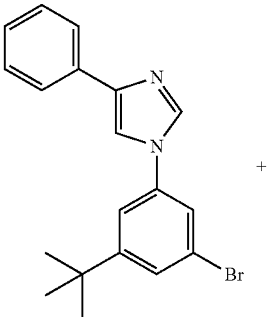

6(1)

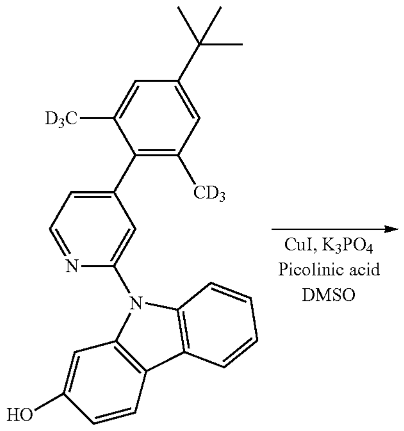

-continued

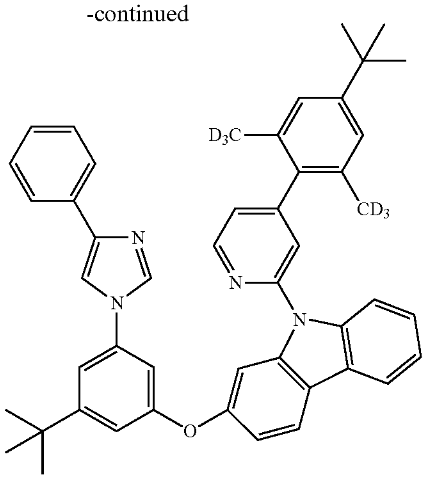

6(2)

17.4 mmol (6.2 g) of Intermediate 6(1) and 14.5 mmol (6.2 g) of 9-(4-(4-(tert-butyl)-2,6-bis(methyl-d3)phenyl) pyridin-2-yl)-9H-carbazol-2-ol were dissolved in 145 ml of DMSO, and then, 4.4 mmol (0.8 g) of CuI, 58.1 mmol (12.3 g) of $K_3PO_4$, and 21.8 mmol (2.6 g) of picolinic acid were added thereto. The resultant mixture was refluxed at a temperature of 100° C. for 12 hours. After completion of the reaction, the mixture was cooled to room temperature, ethyl acetate and water were added, the organic layer was washed three times with water and dried using magnesium sulfate, and then, the solvent was removed therefrom under reduced pressure, thereby obtaining a crude product. The crude product was subjected to silica gel column chromatography (eluent: ethyl acetate: hexane) to obtain Intermediate 6(2) (yield of 77%).

MALDI-TOF (m/z): 700.47 $[M]^+$ (3) Synthesis of Intermediate 6(3)

-continued

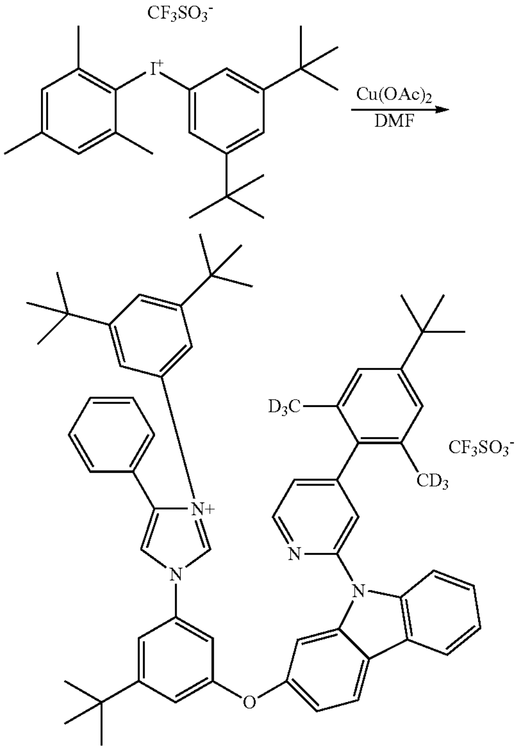

6(3)

11.1 mmol (7.8 g) of Intermediate 6(1), 14.5 mmol (8.5 g) of (3,5-di-t-butylphenyl)(mesityl) iodonium trifluoromethanesulfonate, and 1.1 mmol (0.2 g) of $Cu(OAc)_2$ were added to 60 mL of DMF, and the resultant mixture was refluxed at a temperature of 130° C. for 12 hours. A crude product obtained by removing a solvent therefrom under reduced pressure was subjected to silica gel column chromatography (eluent: dichloromethane: acetone) to obtain Intermediate 6(3) (yield of 85%).

MALDI-TOF (m/z): 889.58 $[M]^+$ (4) Synthesis of Compound 6

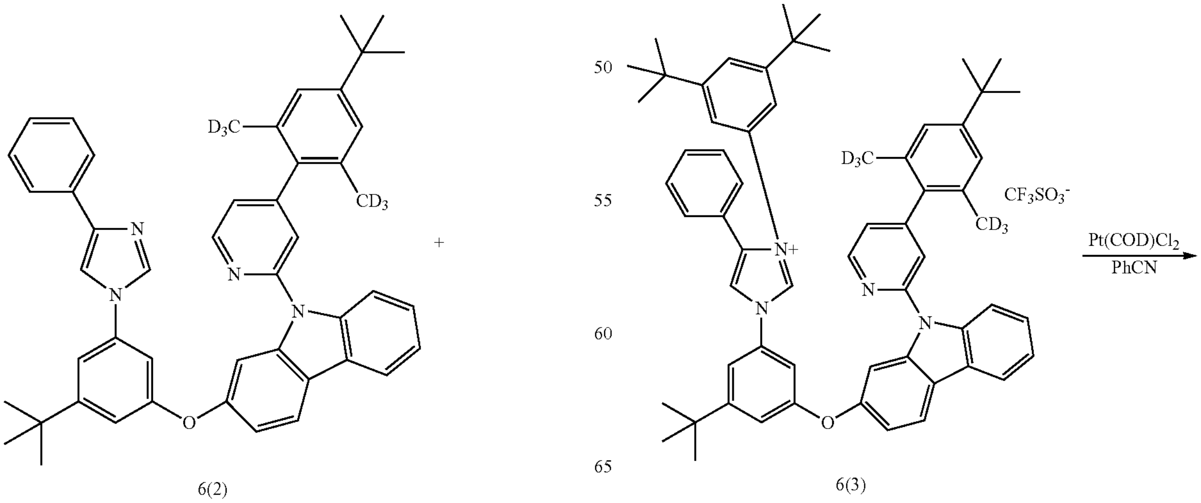

6(2) 6(3)

-continued

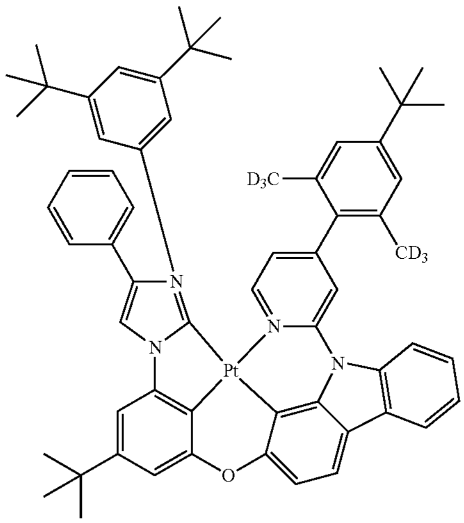

6

9.4 mmol (3.5 g) of Pt(COD)$Cl_2$, 9.4 mmol (9.8 g) of Intermediate 6(3), and 28.3 mmol (2.3 g) of NaOAc were added to 160 mL of PhCN, and then, the resultant mixture was refluxed at a temperature of 180° C. for 12 hours. After completion of the reaction, the mixture was cooled to room temperature and a solvent was removed therefrom under reduced pressure, thereby obtaining a crude product. The crude product was subjected to silica gel column chromatography (eluent: dichloromethane and hexane) to obtain Compound 6 (yield of 78%).

MALDI-TOF (m/z): 1081.60 $[M]^+$

Synthesis Example 7: Synthesis of Compound 7

(1) Synthesis of Intermediate 7(1)

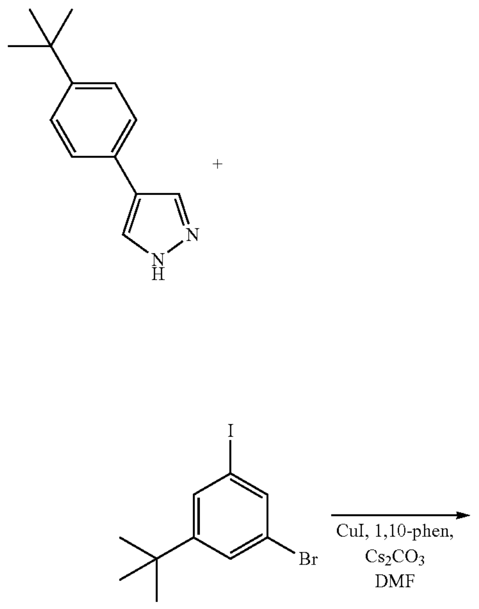

-continued

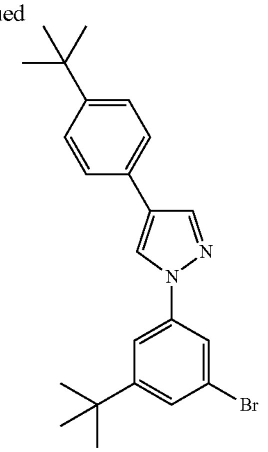

7(1)

25.0 mmol (5 g) of 4-(4-(tert-butyl)phenyl)-1H-pyrazole, 30.0 mmol (10.2 g) of 1-bromo-3-(tert-butyl)-5-iodobenzene, 6.3 mmol (1.2 g) of CuI, 7.5 mmol (1.4 g) of 1,10-phenanthroline, and 50 mmol (16.3 g) of $Cs_2CO_3$ were added to 50 mL of DMF, and the resultant mixture was refluxed at a temperature of 130° C. for 12 hours. The reaction product obtained therefrom was cooled, ethyl acetate and water were added, the organic layer was washed three times with water and dried using magnesium sulfate, and then, the solvent was removed therefrom under reduced pressure, thereby obtaining a crude product. The crude product was subjected to silica gel column chromatography (eluent: ethyl acetate: hexane) to obtain Intermediate 7(1) (yield of 80%).

MALDI-TOF (m/z): 200.15 $[M]^+$ (2) Synthesis of Intermediate 7(2)

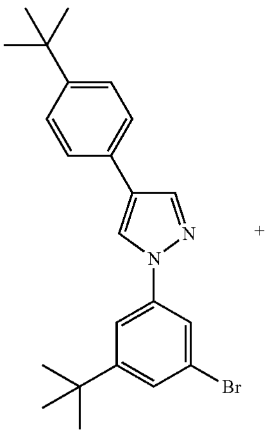

7(1)

-continued

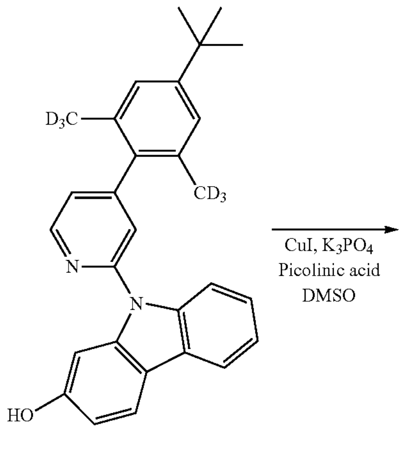

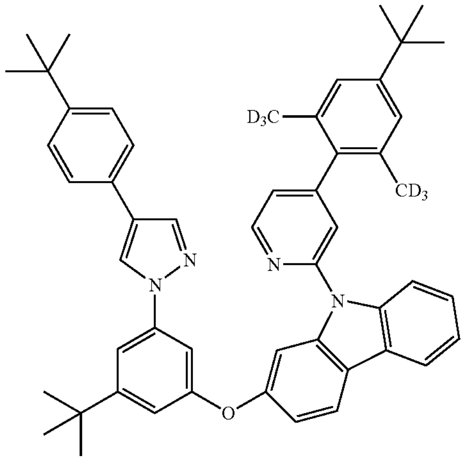

7(2)

16.9 mmol (7.0 g) of Intermediate 7(1) and 14.1 mmol (6.0 g) of 9-(4-(4-(tert-butyl)-2,6-bis(methyl-d3)phenyl)pyridin-2-yl)-9H-carbazol-2-ol were dissolved in 140 ml of DMSO, and then, 4.2 mmol (0.8 g) of CuI, 56.4 mmol (12.0 g) of $K_3PO_4$, and 21.2 mmol (2.6 g) of picolinic acid were added thereto. The resultant mixture was refluxed at a temperature of 100° C. for 12 hours. After completion of the reaction, the mixture was cooled to room temperature, ethyl acetate and water were added, the organic layer was washed three times with water and dried using magnesium sulfate, and then, the solvent was removed therefrom under reduced pressure, thereby obtaining a crude product. The crude product was subjected to silica gel column chromatography (eluent: ethyl acetate: hexane) to obtain Intermediate 7(2) (yield of 75%).

MALDI-TOF (m/z): 756.55 $[M]^+$ (3) Synthesis of Compound 7

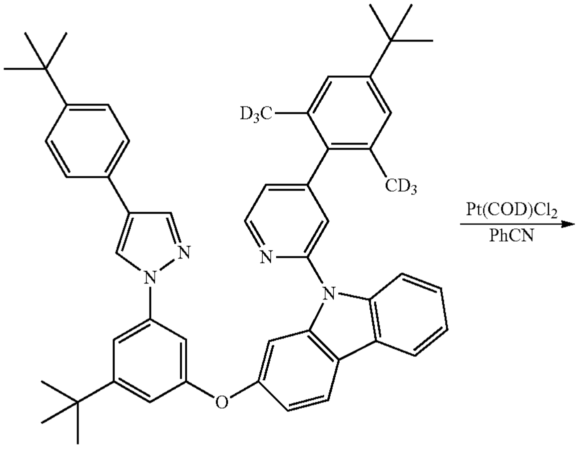

7(2)

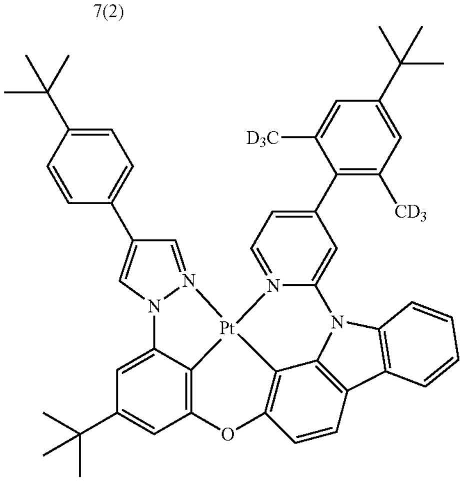

7

10.6 mmol (4.0 g) of $Pt(COD)Cl_2$ and 10.6 mmol (8 g) of Intermediate 7(2) were added to 180 mL of PhCN, and the resultant mixture was refluxed at a temperature of 180° C. for 12 hours. After completion of the reaction, the mixture was cooled to room temperature and a solvent was removed therefrom under reduced pressure, thereby obtaining a crude product. The crude product was subjected to silica gel column chromatography (eluent: dichloromethane and hexane) to obtain Compound 7 (yield of 32%).

MALDI-TOF (m/z): 949.43 $[M]^+$

Synthesis Example 8: Synthesis of Compound 309

(1) Synthesis of Intermediate 309(1)

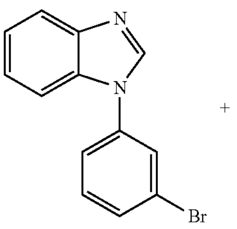

-continued

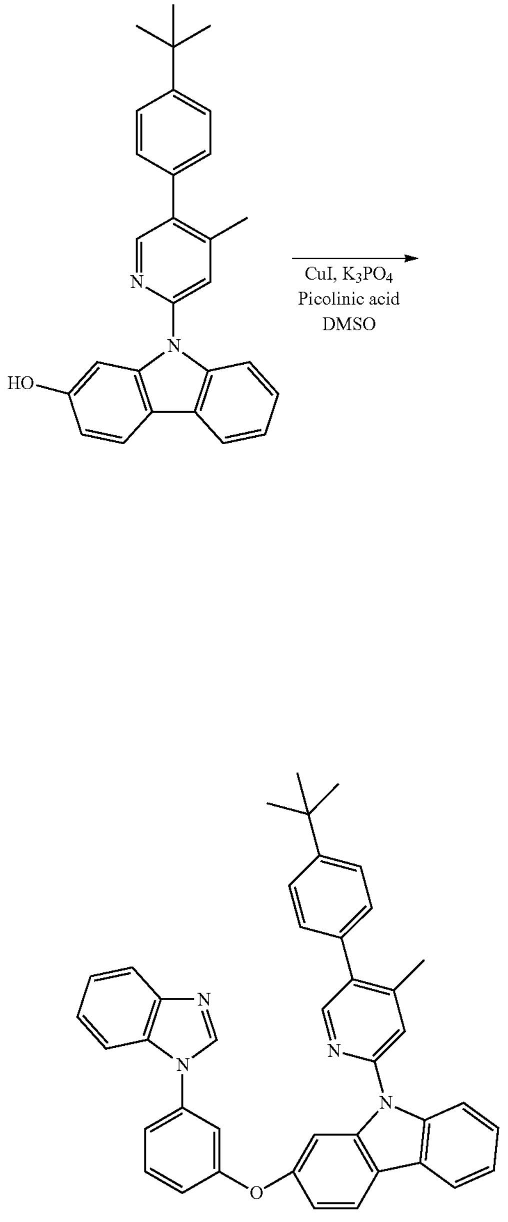

309(1)

18.3 mmol (5 g) of 1-(3-bromophenyl)-1H-benzo[d]imidazole and 22.0 mmol (8.9 g) of 9-(5-(4-(tert-butyl)phenyl)-4-methylpyridin-2-yl)-9H-carbazol-2-ol were dissolved in 180 ml of DMSO, and then, 5.5 mmol (1.1 g) of CuI, 73.2 mmol (15.6 g) of $K_3PO_4$, and 27.5 mmol (3.3 g) of picolinic acid were added thereto. The resultant mixture was refluxed at a temperature of 100° C. for 12 hours. After completion of the reaction, the mixture was cooled to room temperature, an organic layer extracted using a mixture of ethyl acetate and water was washed three times with water and dried using magnesium sulfate, and then, a solvent was removed therefrom under reduced pressure, thereby obtaining a crude product. The crude product was subjected to silica gel column chromatography (eluent: ethyl acetate: hexane) to obtain Intermediate 309(1) (yield of 42%).

MALDI-TOF (m/z): 598.26 $[M]^+$ (2) Synthesis of Intermediate 309(2)

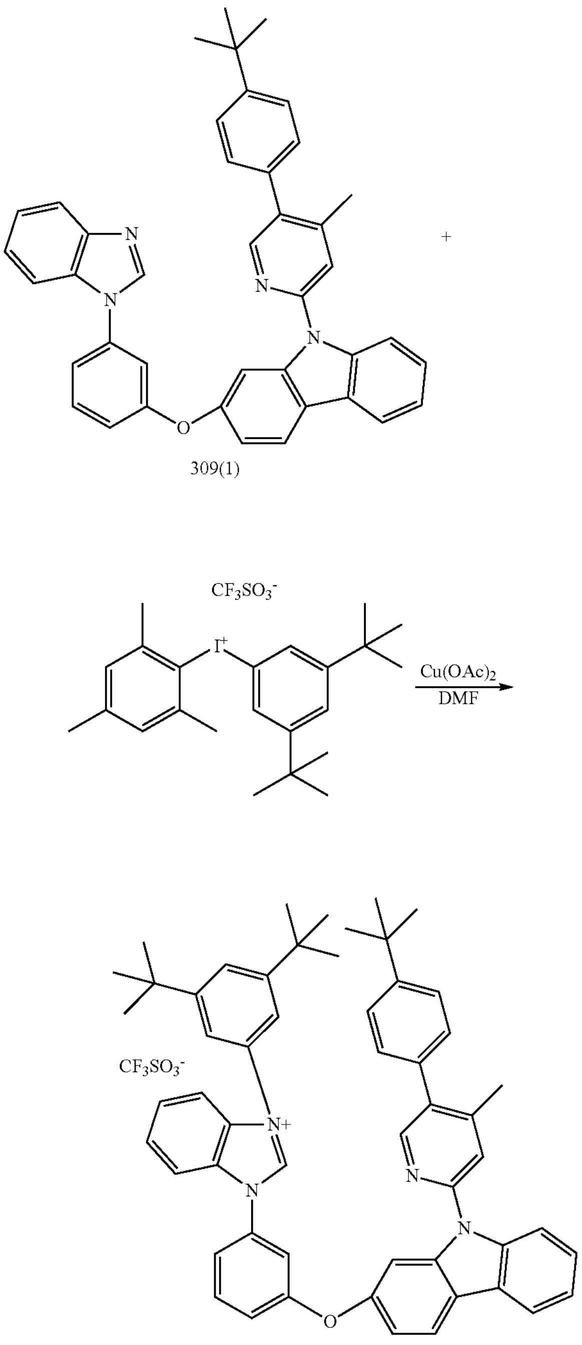

309(1)

309(2)

7.69 mmol (4.6 g) of Intermediate 309(1), 9.99 mmol (4.5 g) of (3,5-di-t-butylphenyl)(mesityl) iodonium trifluoromethanesulfonate, and 0.77 mmol (0.14 g) of $Cu(OAc)_2$ were added to 25 mL of DMF, and the resultant mixture was refluxed at a temperature of 130° C. for 12 hours. A crude product obtained by removing a solvent therefrom under reduced pressure was subjected to silica gel column chromatography (eluent: dichloromethane: acetone) to obtain Intermediate 309(2) (yield of 86%).

MALDI-TOF (m/z): 787.41 $[M]^+$ (3) Synthesis of Compound 309

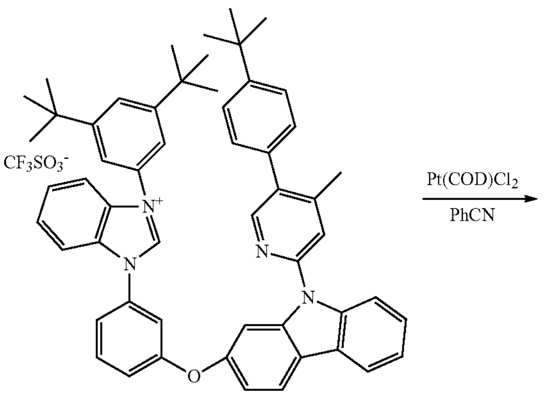

309(2)

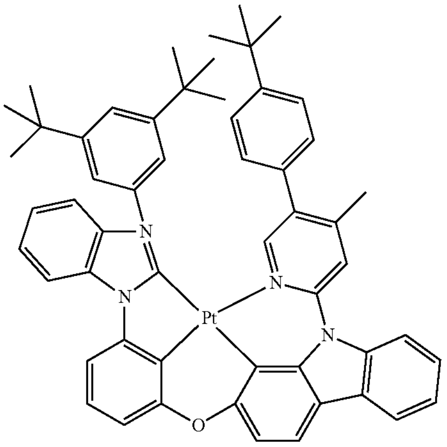

309

6.6 mmol (2.5 g) of $Pt(COD)Cl_2$, 6.6 mmol (6.2 g) of Intermediate 309(2), and 19.8 mmol (1.6 g) of NaOAc were added to 11-mL of PhCN, and then, the resultant mixture was refluxed at a temperature of 180° C. for 12 hours. After completion of the reaction, the mixture was cooled to room temperature and a solvent was removed therefrom under reduced pressure, thereby obtaining a crude product. The crude product was subjected to silica gel column chromatography (eluent: dichloromethane and hexane) to obtain Compound 309 (yield of 36%).

MALDI-TOF (m/z): 979.35 $[M]^+$

Synthesis Example 9: Synthesis of Compound 310

(1) Synthesis of Intermediate 310(1)

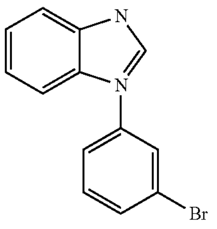

+

-continued

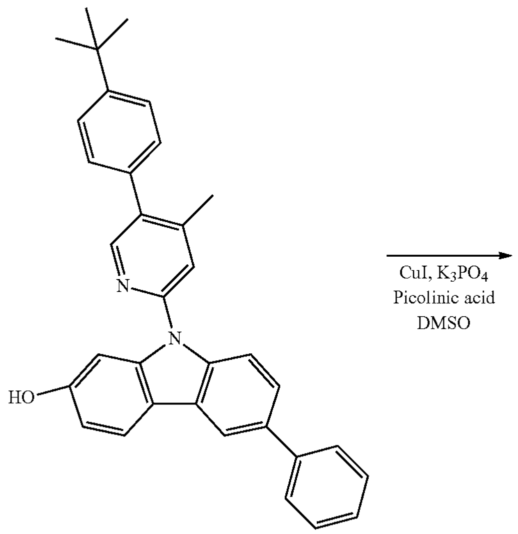

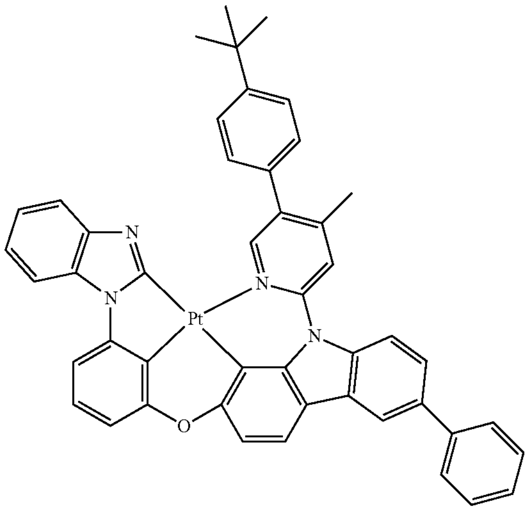

310(1)

8.3 mmol (2.3 g) of 1-(3-bromophenyl)-1H-benzo[d]imidazole and 10.8 mmol (5.2 g) of 9-(5-(4-(tert-butyl)phenyl)-4-methylpyridin-2-nyl)-6-phenyl-9H-carbazol-2-ol were dissolved in 80 ml of DMSO, and then, 2.5 mmol (0.5 g) of CuI, 33.2 mmol (7.0 g) of $K_3PO_4$, and 12.4 mmol (1.5 g) of picolinic acid were added thereto. The resultant mixture was refluxed at a temperature of 100° C. for 12 hours. After completion of the reaction, the mixture was cooled to room temperature, an organic layer extracted using a mixture of ethyl acetate and water was washed three times with water and dried using magnesium sulfate, and then, a solvent was removed therefrom under reduced pressure, thereby obtaining a crude product. The crude product was subjected to silica gel column chromatography (eluent: ethyl acetate: hexane) to obtain Intermediate 310(1) (yield of 77%).

MALDI-TOF (m/z): 674.28 $[M]^+$ (2) Synthesis of Intermediate 310(2)

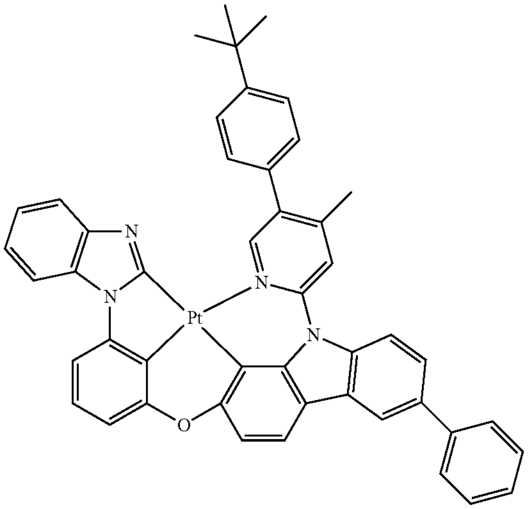

310(1)

+

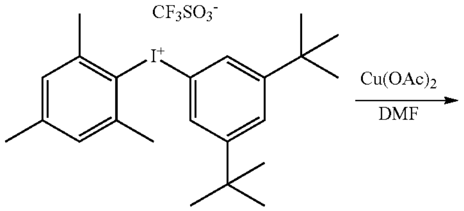

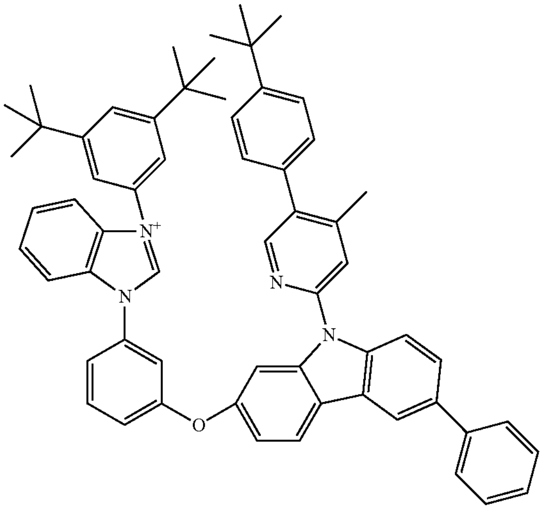

310(2)

6.37 mmol (4.3 g) of Intermediate 310(1), 8.28 mmol (4.8 g) of (3,5-di-t-butylphenyl)(mesityl) iodonium trifluoromethanesulfonate, and 0.64 mmol (0.12 g) of $Cu(OAc)_2$ were added to 30 mL of DMF, and the resultant mixture was refluxed at a temperature of 130° C. for 12 hours. A crude product obtained by removing a solvent therefrom under reduced pressure was subjected to silica gel column chromatography (eluent: dichloromethane: acetone) to obtain Intermediate 310(2) (yield of 77%).

MALDI-TOF (m/z): 863.42 $[M]^+$ (3) Synthesis of Compound 310

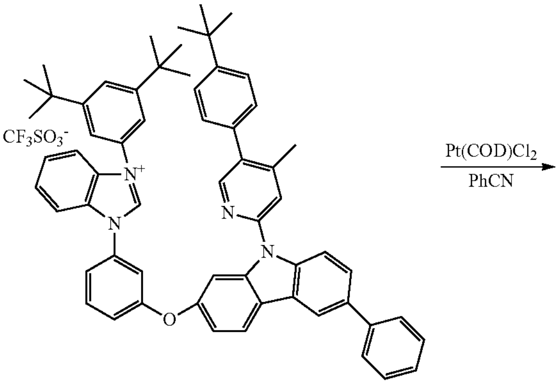

310(2)

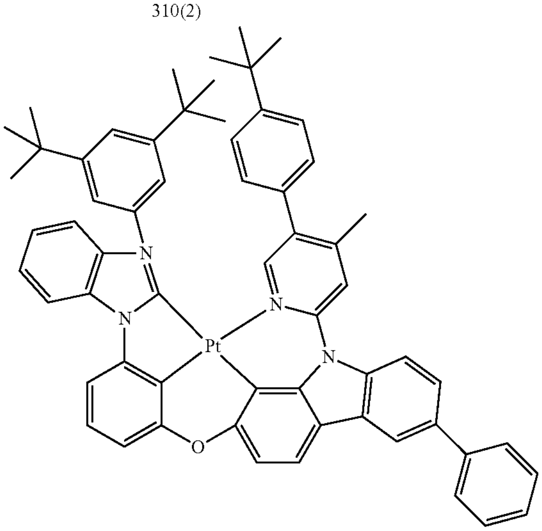

310

4.9 mmol (1.8 g) of $Pt(COD)Cl_2$, 4.9 mmol (5.0 g) of Intermediate 310(2), and 14.8 mmol (1.2 g) of NaOAc were added to 80 mL of PhCN, and then, the resultant mixture was refluxed at a temperature of 180° C. for 12 hours. After completion of the reaction, the mixture was cooled to room temperature and a solvent was removed therefrom under reduced pressure, thereby obtaining a crude product. The crude product was subjected to silica gel column chromatography (eluent: dichloromethane and hexane) to obtain Compound 310 (yield of 33%).

MALDI-TOF (m/z): 1055.37 $[M]^+$

Synthesis Example 10: Synthesis of Compound 311

(1) Synthesis of Intermediate 311(1)

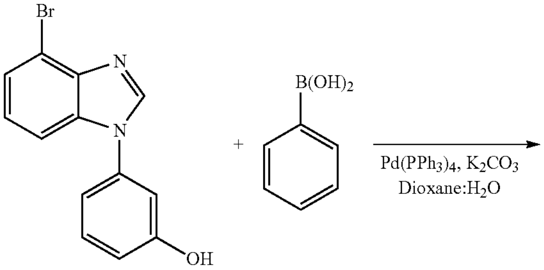

-continued

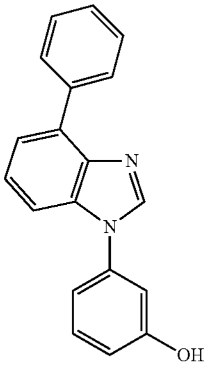

311(1)

17.3 mmol (5.0 g) of 3-(4-bromo-1H-benzo[d]imidazole-1-yl)phenol and 20.75 mmol (2.5 g) of phenylboronic acid were dissolved in a mixed solution containing 1,4-dioxane/$H_2O$ (85 ml/30 ml), and then, 1.7 mmol (2.0 g) of $Pd(PPh_3)_4$ and 51.9 mmol (7.2 g) of $K_2CO_3$ were added thereto. The resultant mixture was refluxed at a temperature of 110° C. for 12 hours. After completion of the reaction, the mixture was cooled to room temperature, an organic layer extracted using a mixture of ethyl acetate and water was washed three times with water and dried using magnesium sulfate, and then, a solvent was removed therefrom under reduced pressure, thereby obtaining a crude product. The crude product was subjected to silica gel column chromatography (eluent: ethyl acetate: hexane) to obtain Intermediate 311(1) (yield of 76%).

MALDI-TOF (m/z): 286.10 $[M]^+$ (2) Synthesis of Intermediate 311(2)

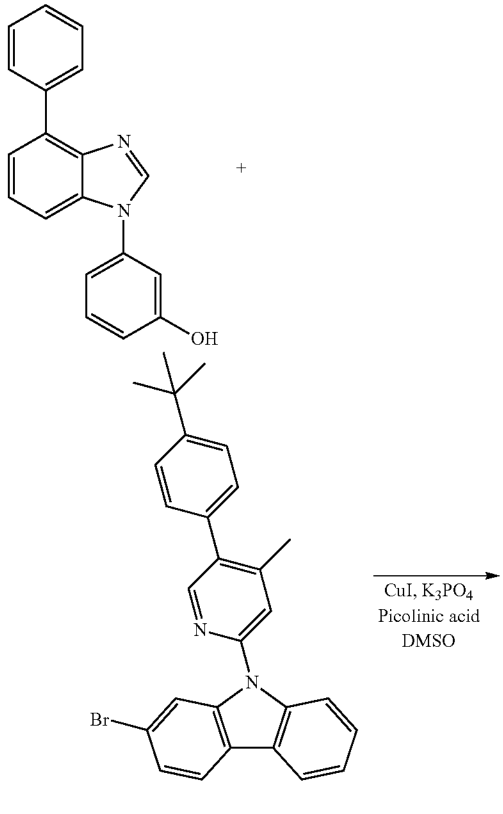

-continued

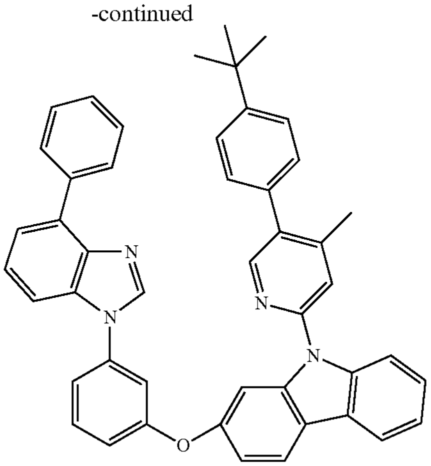

311(2)

12.9 mmol (3.7 g) of 3-(4-phenyl-1H-benzo[d]imidazole-1-nyl)phenol and 16.77 mmol (7.9 g) of 2-bromo-9-(5-(4-(tert-butyl)phenyl)-4-methyl pyridin-2-nyl)-9H-carbazol were dissolved in 130 ml of DMSO, and then, 3.9 mmol (0.7 g) of CuI, 51.6 mmol (11.0 g) of $K_3PO_4$, and 19.4 mmol (2.4 g) of picolinic acid were added thereto. The resultant mixture was refluxed at a temperature of 100° C. for 12 hours. After completion of the reaction, the mixture was cooled to room temperature, an organic layer extracted using a mixture of ethyl acetate and water was washed three times with water and dried using magnesium sulfate, and then, a solvent was removed therefrom under reduced pressure, thereby obtaining a crude product. The crude product was subjected to silica gel column chromatography (eluent: ethyl acetate: hexane) to obtain Intermediate 311(2) (yield of 68%).

MALDI-TOF (m/z): 674.28 $[M]^+$ (3) Synthesis of Intermediate 311(3)

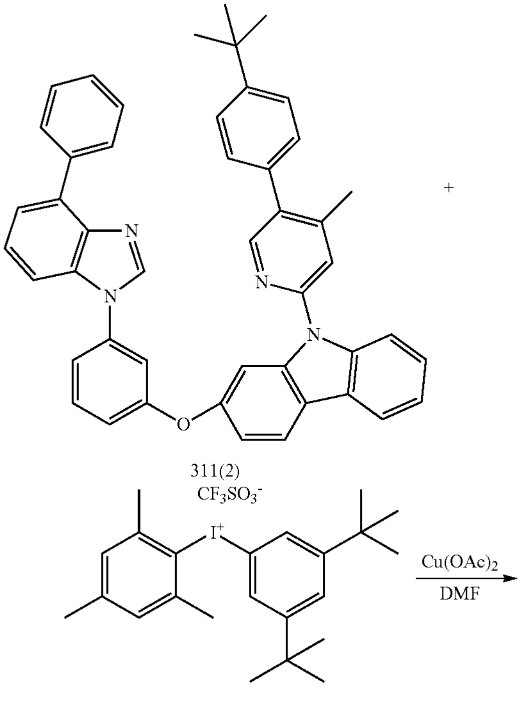

-continued

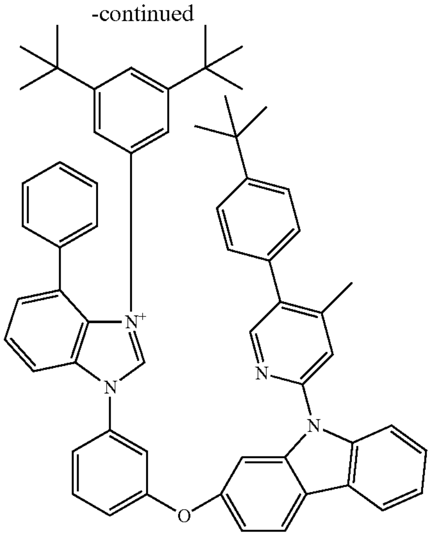

311(3)

8.44 mmol (5.7 g) of Intermediate 311(2), 12.67 mmol (7.4 g) of (3,5-di-t-butylphenyl)(mesityl) iodonium trifluoromethanesulfonate, and 0.84 mmol (0.15 g) of $Cu(OAc)_2$ were added to 40 mL of DMF, and the resultant mixture was refluxed at a temperature of 130° C. for 12 hours. A crude product obtained by removing a solvent therefrom under reduced pressure was subjected to silica gel column chromatography (eluent: dichloromethane: acetone) to obtain Intermediate 311(3) (yield of 47%).

MALDI-TOF (m/z): 863.43 $[M]^+$ (4) Synthesis of Compound 311

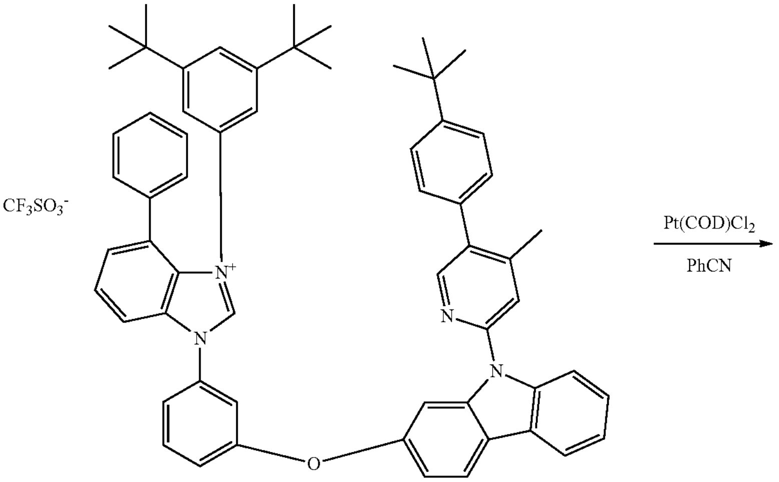

311(3)

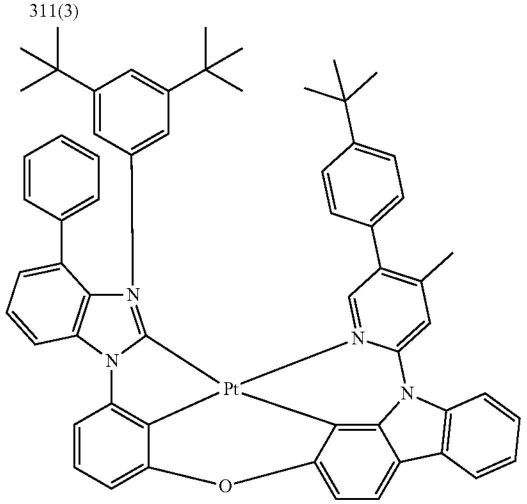

311

3.9 mmol (1.5 g) of $Pt(COD)Cl_2$, 3.9 mmol (4.0 g) of Intermediate 311(3), and 11.8 mmol (1.0 g) of NaOAc were added to 65 mL of PhCN, and then, the resultant mixture was refluxed at a temperature of 180° C. for 12 hours. After completion of the reaction, the mixture was cooled to room temperature and a solvent was removed therefrom under reduced pressure, thereby obtaining a crude product. The crude product was subjected to silica gel column chromatography (eluent: dichloromethane and hexane) to obtain Compound 311 (yield of 37%).

MALDI-TOF (m/z): 1055.37 $[M]^+$

Synthesis Example 11: Synthesis of Compound 312

(1) Synthesis of Intermediate 312(1)

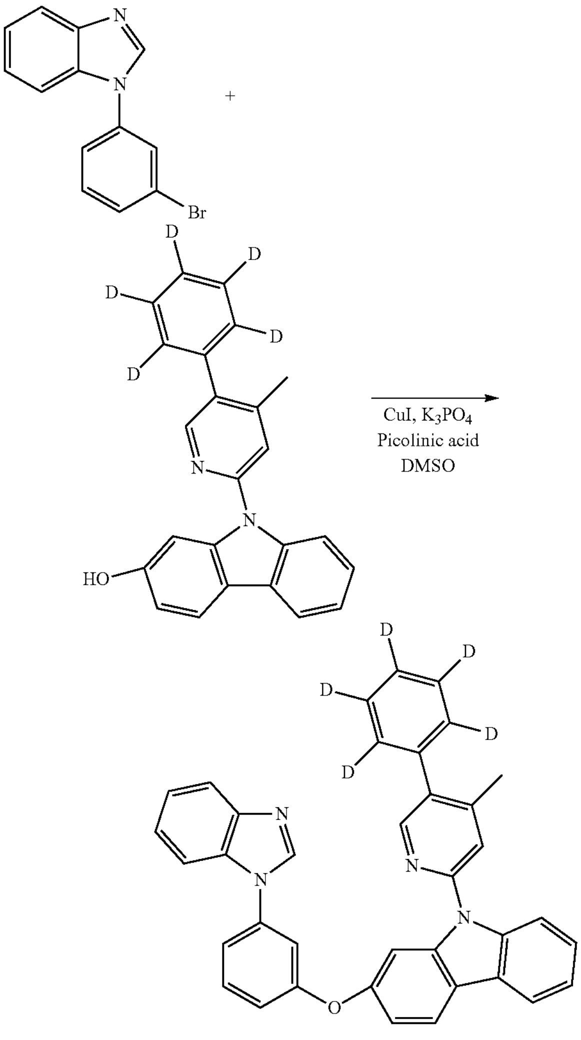

312(1)

12.8 mmol (3.5 g) of 1-(3-bromophenyl)-1H-benzo[d]imidazole and 15.4 mmol (5.5 g) of 9-(4-methyl-5-(phenyl-d5)pyridin-2-nyl)-9H-carbazol-2-ol were dissolved in 130 ml of DMSO, and then, 3.8 mmol (0.7 g) of CuI, 51.2 mmol (10.7 g) of $K_3PO_4$, and 19.2 mmol (2.4 g) of picolinic acid were added thereto. The resultant mixture was refluxed at a temperature of 100° C. for 12 hours. After completion of the reaction, the mixture was cooled to room temperature, an organic layer extracted using a mixture of ethyl acetate and water was washed three times with water and dried using magnesium sulfate, and then, a solvent was removed therefrom under reduced pressure, thereby obtaining a crude product. The crude product was subjected to silica gel column chromatography (eluent: ethyl acetate: hexane) to obtain Intermediate 312(1) (yield of 44%).

MALDI-TOF (m/z): 547.23 $[M]^+$ (2) Synthesis of Intermediate 312(2)

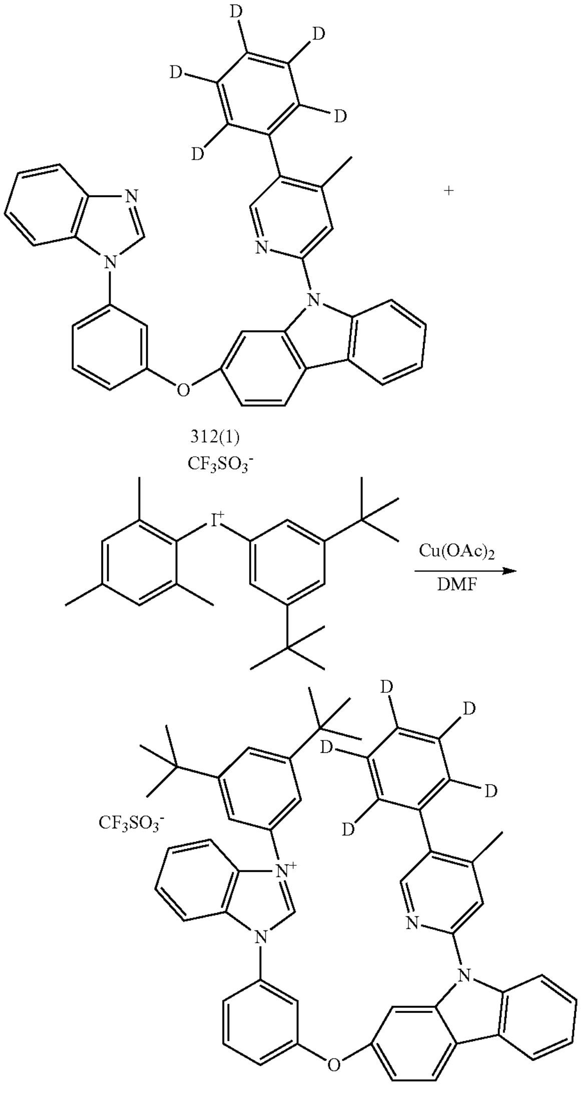

312(1)

312(2)

5.66 mmol (3.1 g) of Intermediate 312(1), 7.36 mmol (4.3 g) of (3,5-di-t-butylphenyl)(mesityl) iodonium trifluoromethanesulfonate, and 0.57 mmol (0.10 g) of $Cu(OAc)_2$ were added to 30 mL of DMF, and the resultant mixture was refluxed at a temperature of 130° C. for 12 hours. A crude product obtained by removing a solvent therefrom under reduced pressure was subjected to silica gel column chromatography (eluent: dichloromethane: acetone) to obtain Intermediate 312(2) (yield of 86%).

MALDI-TOF (m/z): 736.98 $[M]^+$ (3) Synthesis of Compound 312

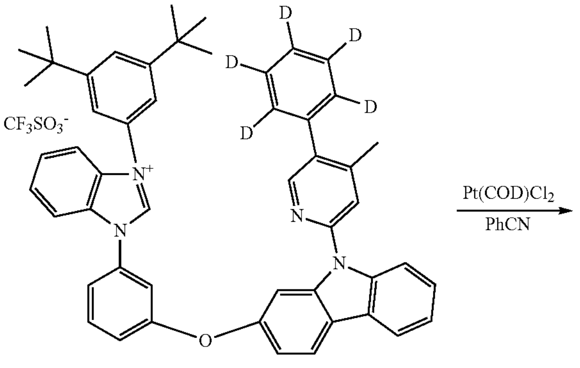

312(2)

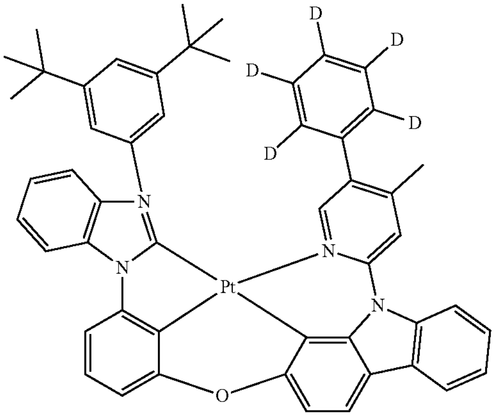

312

5.1 mmol (1.9 g) of $Pt(COD)Cl_2$, 5.1 mmol (4.5 g) of Intermediate 312(2), and 15.3 mmol (1.3 g) of NaOAc were added to 85 mL of PhCN, and then, the resultant mixture was refluxed at a temperature of 180° C. for 12 hours. After completion of the reaction, the mixture was cooled to room temperature and a solvent was removed therefrom under reduced pressure, thereby obtaining a crude product. The crude product was subjected to silica gel column chromatography (eluent: dichloromethane and hexane) to obtain Compound 312 (yield of 34%).

MALDI-TOF (m/z): 928.31 $[M]^+$

Synthesis Example 10: Synthesis of Compound 313

(1) Synthesis of Intermediate 313(1)

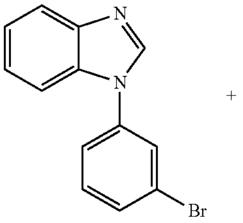

-continued

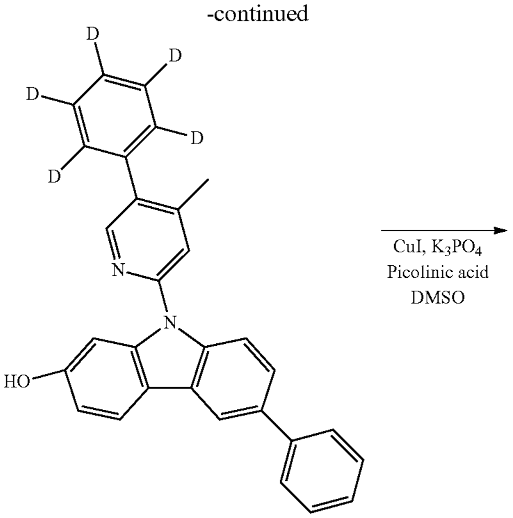

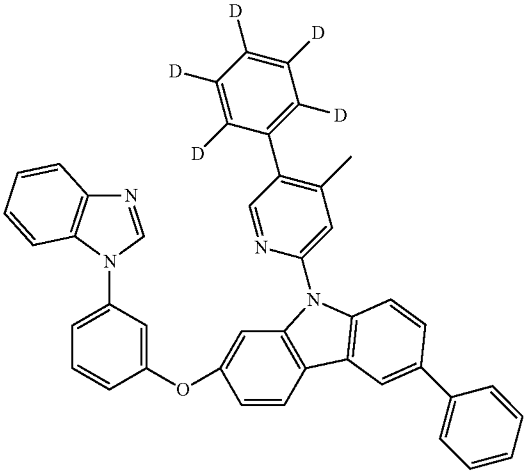

313(1)

5.5 mmol (1.5 g) of 1-(3-bromophenyl)-1H-benzo[d]imidazole and 6.0 mmol (2.6 g) of 9-(4-methyl-5-(phenyl-d5)pyridin-2-nyl)-6-phenyl-9H-carbazol-2-ol were dissolved in 55 ml of DMSO, and then, 1.7 mmol (0.3 g) of CuI, 22.0 mmol (4.7 g) of $K_3PO_4$, and 8.3 mmol (1.0 g) of picolinic acid were added thereto. The resultant mixture was refluxed at a temperature of 100° C. for 12 hours. After completion of the reaction, the mixture was cooled to room temperature, an organic layer extracted using a mixture of ethyl acetate and water was washed three times with water and dried using magnesium sulfate, and then, a solvent was removed therefrom under reduced pressure, thereby obtaining a crude product. The crude product was subjected to silica gel column chromatography (eluent: ethyl acetate: hexane) to obtain Intermediate Intermediate 313(1) (yield of 67%).

MALDI-TOF (m/z): 623.28 $[M]^+$ (2) Synthesis of Intermediate 313(2)

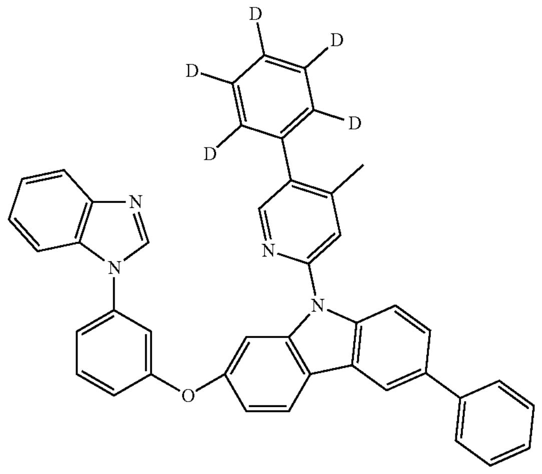

313(1)

+

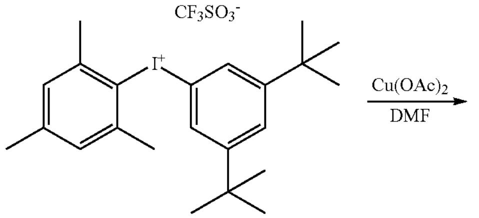

-continued

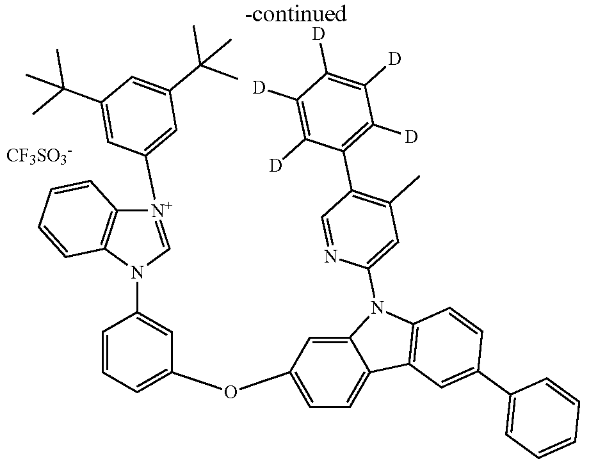

313(2)

3.69 mmol (2.3 g) of Intermediate 313(1), 4.79 mmol (2.8 g) of (3,5-di-t-butylphenyl)(mesityl) iodonium trifluoromethanesulfonate, and 0.37 mmol (0.07 g) of $Cu(OAc)_2$ were added to 20 mL of DMF, and the resultant mixture was refluxed at a temperature of 130° C. for 12 hours. A crude product obtained by removing a solvent therefrom under reduced pressure was subjected to silica gel column chromatography (eluent: dichloromethane: acetone) to obtain Intermediate 313(2) (yield of 73%).

MALDI-TOF (m/z): 812.43 $[M]^+$ (3) Synthesis of Compound 313

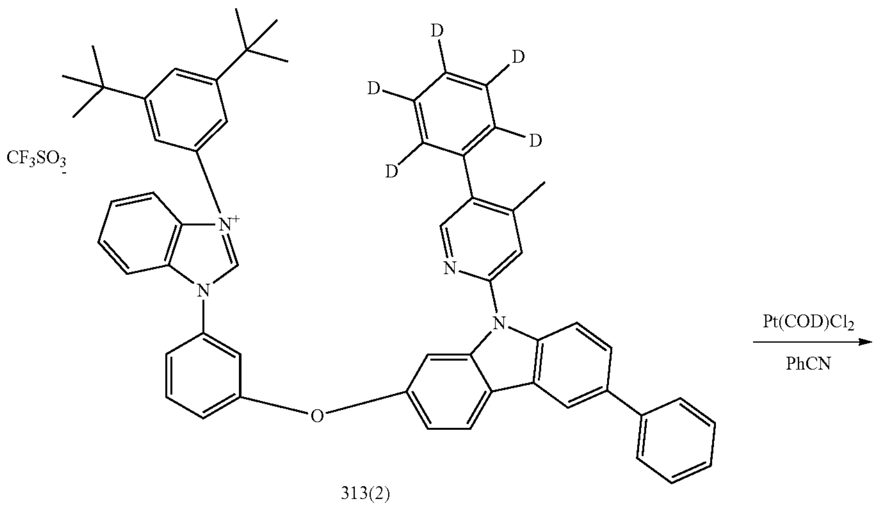

313(2)

-continued

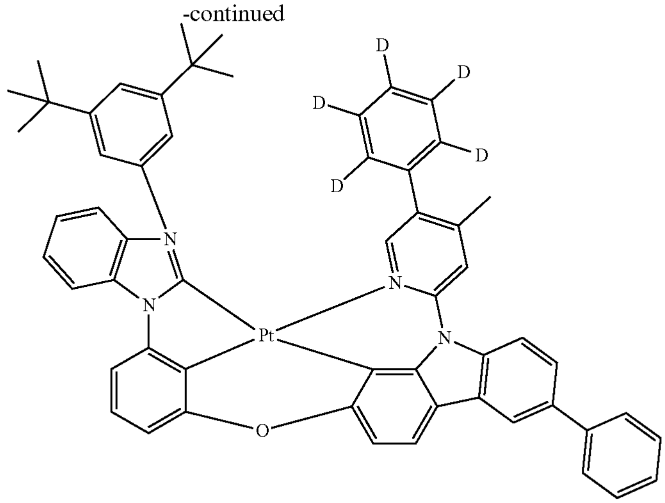

313

2.7 mmol (1.0 g) of $Pt(COD)Cl_2$, 2.7 mmol (2.6 g) of Intermediate 313(2), and 8.1 mmol (0.7 g) of NaOAc were added to 45 mL of PhCN, and then, the resultant mixture was refluxed at a temperature of 180° C. for 12 hours. After completion of the reaction, the mixture was cooled to room temperature and a solvent was removed therefrom under reduced pressure, thereby obtaining a crude product. The crude product was subjected to silica gel column chromatography (eluent: dichloromethane and hexane) to obtain Compound 313 (yield of 39%).

MALDI-TOF (m/z): 1004.38 $[M]^+$

Example 1

An ITO glass substrate was cut to a size of 50 mm×50 mm×0.5 mm and then, sonicated in acetone isopropyl alcohol and pure water, each for 15 minutes, and then, washed by exposure to UV ozone for 30 minutes.

Then, m-MTDATA was deposited on an ITO electrode (anode) of the glass substrate at a deposition rate of 1 Å/sec to form a hole injection layer having a thickness of 600 Å, and then, a-NPD was deposited on the hole injection layer at a deposition speed of 1 Å/sec to form a hole transport layer having a thickness of 250 Å.

Compound 1 (dopant) and CBP (host) were co-deposited on the hole transport layer at a deposition speed of 0.1 Å/sec and a deposition speed of 1 Å/sec, respectively, to form an emission layer having a thickness of 400 Å.

BAlq was deposited on the emission layer at a deposition speed of 1 Å/sec to form a hole blocking layer having a thickness of 50 Å, and $Alq_3$ was deposited on the hole blocking layer to form an electron transport layer having a thickness of 300 Å, and then, LiF was deposited on the electron transport layer to form an electron injection layer having a thickness of 10 Å, and then, Al was vacuum deposited on the electron injection layer to form a second electrode (cathode) having a thickness of 1,200 Å, thereby completing manufacturing of an organic light-emitting device having a structure of ITO/m-MTDATA (600 Å)/α-NPD (250 Å)/CBP+Compound 1 (10 wt %) (400 Å)/BAlq (50 Å)/$Alq_3$(300 Å)/LiF (10 Å)/Al(1,200 Å).

m-MTDATA

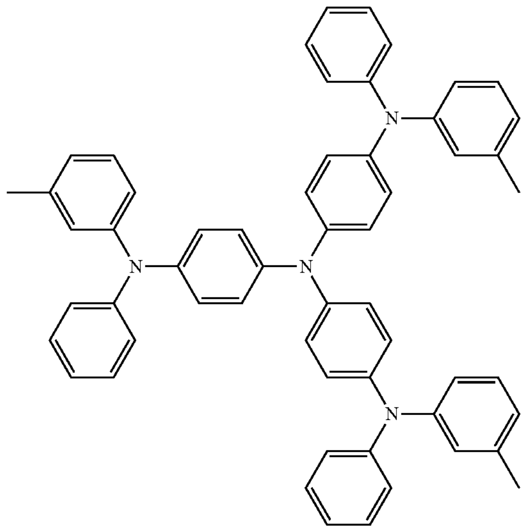

α-NPD

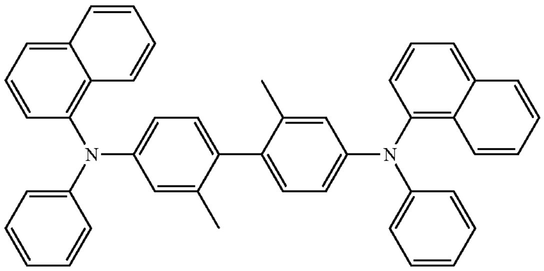

-continued

CBP

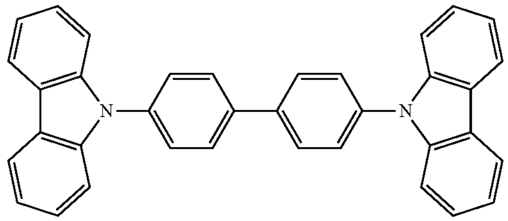

BAlq

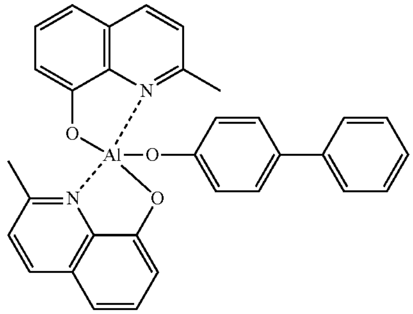

$Alq_3$

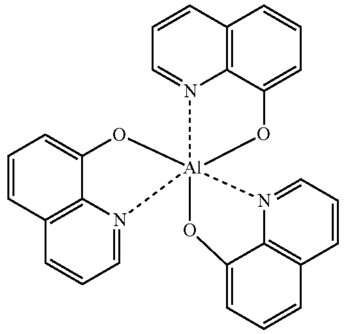

Examples 2 to 11 and Comparative Examples 1 to 4

Organic light-emitting devices were manufactured in the same manner as in Example 1, except that Compounds shown in Table 2 were each used instead of Compound 1 as a dopant in forming an emission layer.

Evaluation Example 1: Characterization of Organic Light-Emitting Device

For each of the organic light-emitting devices manufactured according to Examples 1 to 11 and Comparative Examples 1 to 4, the driving voltage, current efficiency, luminescence quantum efficiency (PLQY), external quantum efficiency (EQE), and maximum emission wavelength were evaluated as relative values. The results are shown in Table 2. As evaluation apparatuses, a current-voltage meter (Keithley 2400) and a luminance meter (Minolta Cs-1000A) were used.

TABLE 2

| No. | Dopant compound | Driving voltage (relative value) | PLQY (relative value) | Current efficiency (relative value) | EQE (relative value) | Maximum emission wavelength (nm) |
|---|---|---|---|---|---|---|
| Example 1 | Compound 1 | 91 | 105 | 115 | 132 | 464 |
| Example 2 | Compound 2 | 90 | 102 | 112 | 126 | 463 |
| Example 3 | Compound 3 | 92 | 100 | 114 | 123 | 463 |
| Example 4 | Compound 4 | 95 | 99 | 101 | 117 | 462 |
| Example 5 | Compound 5 | 94 | 101 | 100 | 120 | 462 |
| Example 6 | Compound 6 | 99 | 100 | 117 | 114 | 461 |
| Example 7 | Compound 7 | 91 | 93 | 146 | 114 | 461 |
| Example 8 | Compound 309 | 89 | 107 | 108 | 109 | 461 |
| Example 9 | Compound 310 | 89 | 121 | 99 | 117 | 462 |
| Example 10 | Compound 311 | 90 | 105 | 100 | 108 | 459 |
| Example 11 | Compound 312 | 88 | 107 | 114 | 108 | 461 |
| Comparative Example 1 | Compound A | 81 | 69 | 118 | 88 | 463 |
| Comparative Example 2 | Compound B | 90 | 89 | 194 | 103 | 510 |
| Comparative Example 3 | Compound C | 100 | 100 | 100 | 100 | 465 |
| Comparative Example 4 | Compound D | 95 | 83 | 95 | 110 | 461 |

1

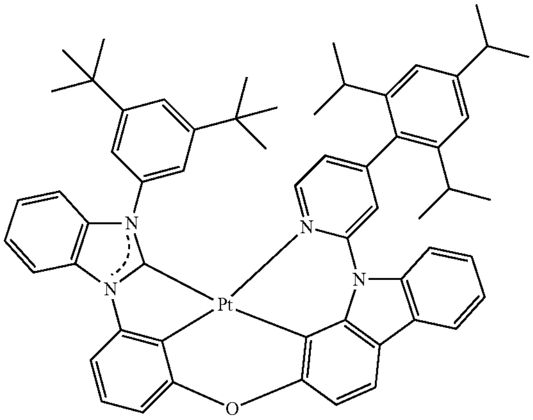

2

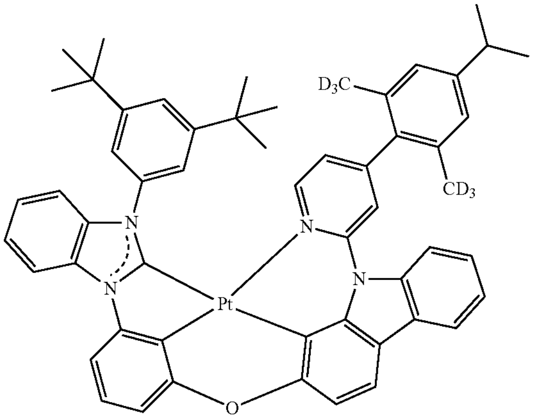

3
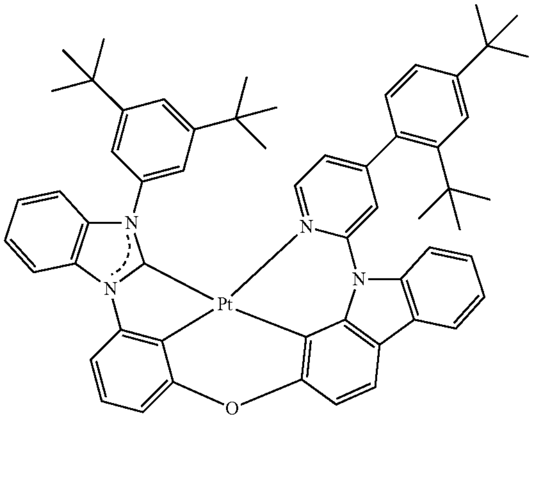
4
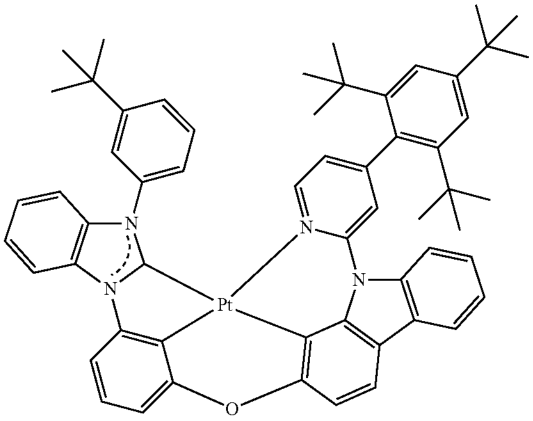
5
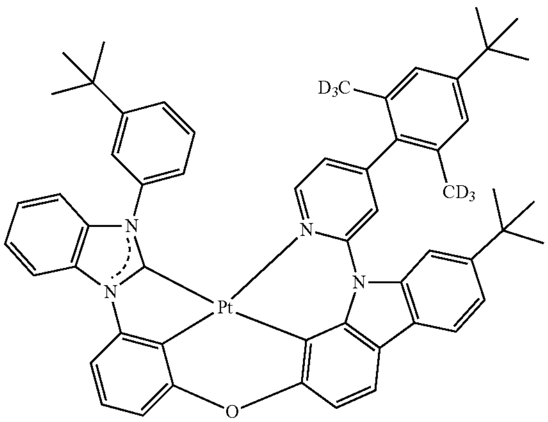
6
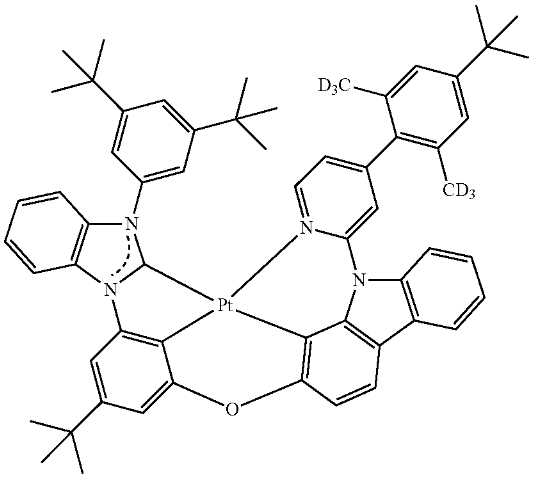
7
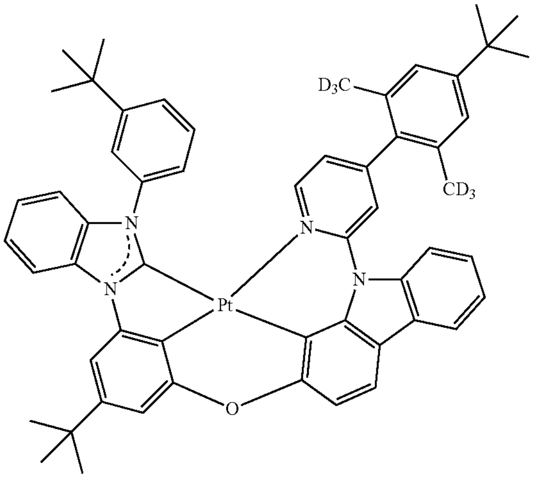
309
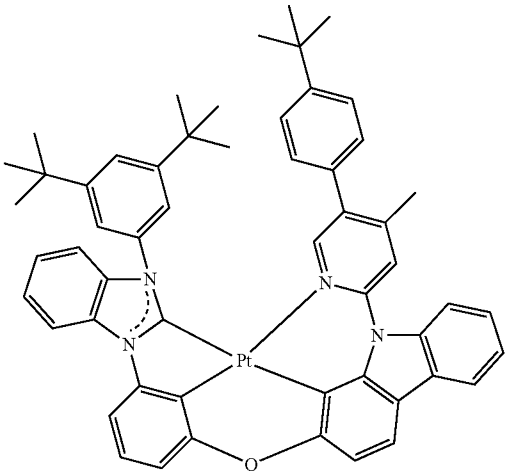

-continued
310
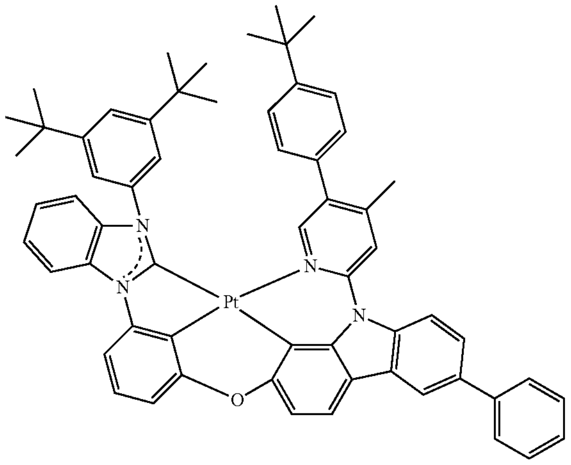
311
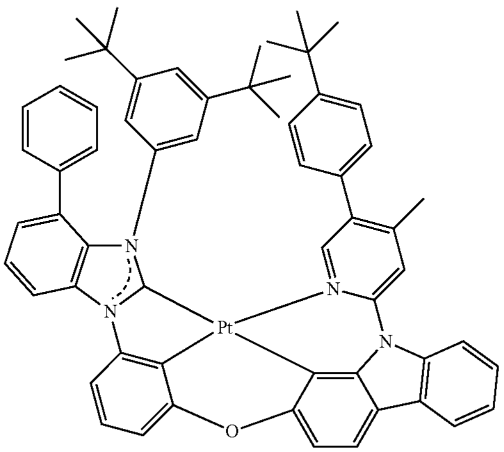
312
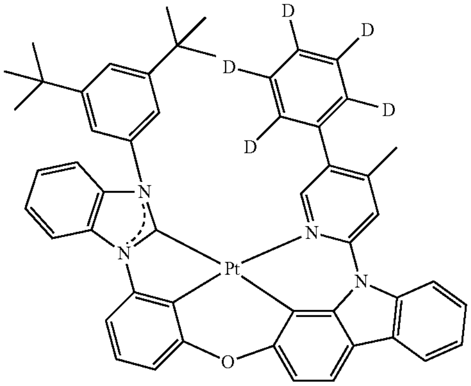
-continued
A
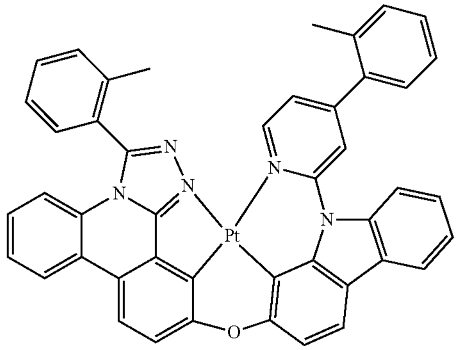
B
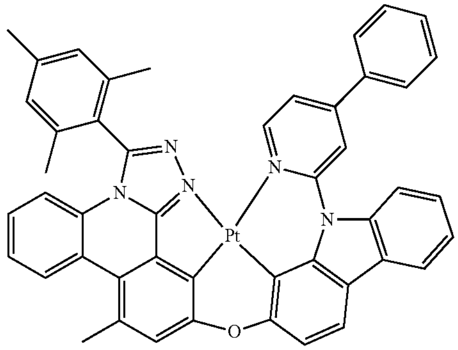
C
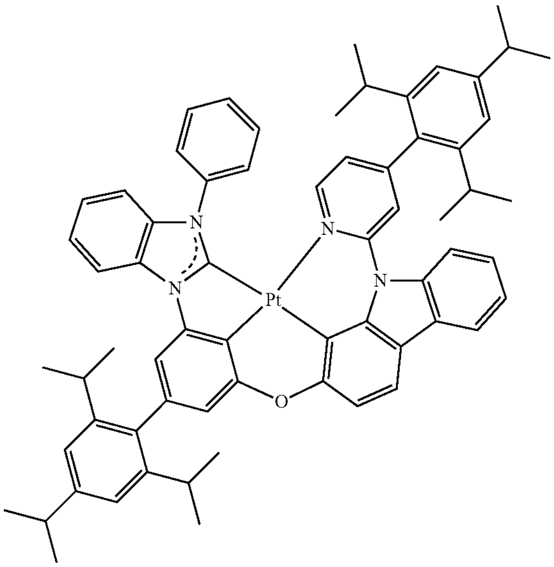

-continued

D

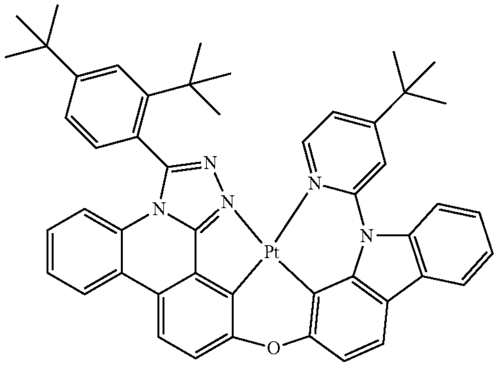

Referring to Table 2, it was confirmed that the organic light-emitting devices of Examples 1 to 11 had a low driving voltage and excellent luminescence quantum efficiency, current efficiency, and EQE, and were suitable for luminescence of deep blue light. In particular, the organic light-emitting devices of Examples 1 to 11 had significantly excellent luminescence quantum efficiency and EQE compared to the organic light-emitting devices of Comparative Examples 1, 3, and 4. It was also confirmed that the organic light-emitting device of Comparative Example 2 was not suitable for luminescence of blue light having a deep maximum emission wavelength.

Example 12

An organic light-emitting device was manufactured in the same manner as in Example 1, except that, in forming an emission layer, the weight ratio of Compound CBP, which was used as a host, was 88.5%, and the weight ratio of Compound 1 and Compound FD14, which were used as dopants, was 10%:1.5%.

Comparative Example 5

Organic light-emitting devices were manufactured in the same manner as in Example 1, except that, in forming an emission layer, for use as a dopant, Compound FD14 were used instead of Compound 1.

Evaluation of Example 2: Characterization of Organic Light-Emitting Device

The driving voltage, EQE, maximum emission wavelength, and lifespan ($T_{95}$) of each of the organic light-emitting devices manufactured according to Example 12 and Comparative Example 5 were evaluated and results thereof are shown in Table 3. A current-voltage meter (Keithley 2400) and a luminescence meter (Minolta Cs-1,000A) were used as an apparatus for evaluation, and the lifespan ($T_{95}$) (at 1200 nit) was evaluated by measuring the amount of time that elapsed until luminance was reduced to 95% of the initial brightness of 100%.

TABLE 3

| No. | Dopant compound | Driving voltage (relative value) | EQE (relative value) | Lifespan ($LT_{95}$) (relative value) | Maximum emission wavelength (nm) |
|---|---|---|---|---|---|
| Example 12 | Compound 1 + Compound FD14 | 100 | 124 | 513 | 472 |
| Comparative Example 5 | Compound FD14 | 100 | 100 | 100 | 472 |

FD14

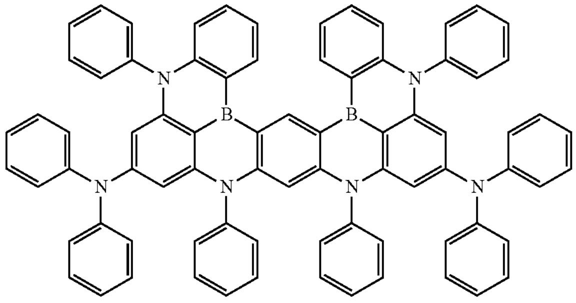

Referring to Table 3, it was confirmed that the organic light-emitting device of Example 12 had a low driving voltage and significantly improved EQE and lifespan characteristics compared to the organic light-emitting device of Comparative Example 5.

According to the one or more embodiments, an organometallic compound has excellent photochemically stability, and an organic light-emitting device using the organometallic compound may have improved efficiency and lifespan. In addition, such an organometallic compound has excellent phosphorescent luminescent characteristics. Thus, when used, a diagnostic composition having high diagnostic efficiency may be provided.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. An organometallic compound represented by Formula 1:

$$M_1(L_{11})_{n11}(L_{12})_{n12} \quad \text{Formula 1}$$

wherein, in Formula 1, $M_1$ is a first-row transition metal of the Periodic Table of Elements, a second-row transition metal of the Periodic Table of Elements, or a third-row transition metal of the Periodic Table of Elements, $L_{11}$ is a ligand represented by Formula 1-1, $L_{12}$ is a monodentate ligand or a bidentate ligand, n11 is 1, n12 is 0, 1, or 2, Formula 1-1

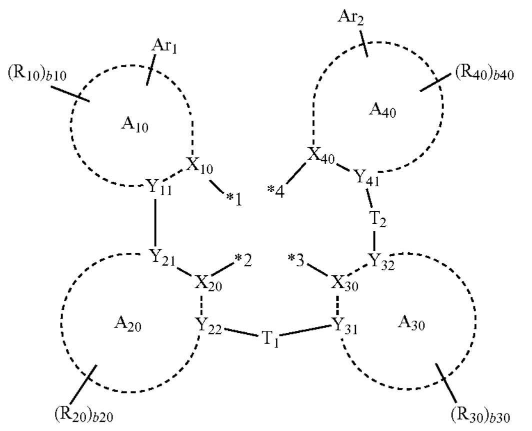

wherein, in Formula 1-1,

*1 to *4 each indicate a binding site to $M_1$, $A_{10}$ is (i) a 5-membered N-containing $C_1$-$C_{30}$ heterocyclic group or (ii) a bi- or multi-cyclic $C_1$-$C_{30}$ heterocyclic group comprising a 5-membered N-containing $C_1$-$C_{30}$ heterocyclic group, $A_{20}$ and $A_{30}$ are each independently a $C_5$-$C_{30}$ carbocyclic group or a $C_1$-$C_{30}$ heterocyclic group, $A_{40}$ is (i) a 6-membered carbocyclic group or a 6-membered heterocyclic group or (ii) a bi- or multi-cyclic $C_5$-$C_{30}$ carbocyclic group or a bi- or multi-cyclic $C_1$-$C_{30}$ heterocyclic group, wherein the bi- or multi-cyclic $C_5$-$C_{30}$ carbocyclic group and the bi- or multi-cyclic $C_1$-$C_{30}$ heterocyclic group each comprise at least one of a 6-membered carbocyclic group and a 6-membered heterocyclic group, $T_1$ is a single bond, *—N[$(L_1)_{a1}$-$(R_1)_{b1}$]—*', *—B($R_1$)—*', *—P($R_1$)—*', *—C($R_1$)($R_2$)—*', *—Si($R_1$)($R_2$)—*', *-Ge($R_1$)($R_2$)—*', *—S—*', *—Se—*', *—O—*', *—C(=O)—*', *—S(=O)—*', *—S(=O)$_2$—*', *—C($R_1$)=C($R_2$)—*', *—C(=S)—*', or *—C≡C—*', $T_2$ is a single bond, *—N[$(L_2)_{a2}$-$(R_3)_{b3}$]—*', *—B($R_3$)—*', *—P($R_3$)—*', *—C($R_3$)($R_4$)—*', *—Si($R_3$)($R_4$)—*', *-Ge($R_3$)($R_4$)—*', *—S—*', *—Se—*', *—O—*', *—C(=O)—*', *—S(=O)—*', *—S(=O)$_2$—*', *—C($R_3$)=C($R_4$)—*', *—C(=S)—*', or *—C≡C—*', $L_1$ and $L_2$ are each independently a single bond, a substituted or unsubstituted $C_5$-$C_{30}$ carbocyclic group, or a substituted or unsubstituted $C_1$-$C_{30}$ heterocyclic group, a1 is 1, 2, or 3, wherein, when a1 is 2 or more, two or more of $L_1$(s) are identical to or different from each other, and when a2 is 2 or more, two or more $L_2$(s) are identical to or different from each other, $X_{10}$ is C or N, $X_{20}$ is C or N, $X_{30}$ is or N, and $X_{40}$ is C or N, $Y_{11}$ is C or N, $Y_{21}$ is Cor N, $Y_{22}$ is C or N, $Y_{31}$ is C or N, $Y_{32}$ is C or N, and $Y_{41}$ is C or N, $Ar_1$ is a phenyl group substituted with at least one $E_1$, provided that $Ar_1$ is not substituted with two phenyl groups or a heteroaryl group, $Ar_2$ is a phenyl group substituted with at least one $E_2$, $E_1$ and $E_2$ are each independently deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —N($Q_1$)($Q_2$), —Si($Q_3$)($Q_4$)($Q_5$), —B($Q_6$)($Q_7$), or —P(=O)($Q_8$)($Q_9$), at least one of $E_1$ or $E_2$ is independently:

an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a methoxy group, an ethoxy group, an n-propoxy group, an isopropoxy group, an n-butoxy group, an isobutoxy group, a sec-butoxy group, a tert-butoxy group, an n-pentoxy group, an isopentoxy group, a sec-pentoxy group, a tert-pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a furanyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, a phenoxy group, —N($Q_1$)($Q_2$), or —Si($Q_3$)($Q_4$)($Q_5$); or an n-butyl group, an isobutyl group, a sec-butyl group, a tert-butyl group, an n-pentyl group, an isopentyl group, a sec-pentyl group, a tert-pentyl group, an n-hexyl group, an isohexyl group, a sec-hexyl group, a tert-hexyl group, an n-heptyl group, an isoheptyl group, a sec-heptyl group, a tert-heptyl group, an n-octyl group, an isooctyl group, a sec-octyl group, a tert-octyl group, an n-nonyl group, an isononyl group, a sec-nonyl group, a tert-nonyl group, an n-decyl group, an isodecyl group, a sec-decyl group, a tert-decyl group, a methoxy group, an ethoxy group, an n-propoxy group, an isopropoxy group, an n-butoxy group, an isobutoxy group, a sec-butoxy group, a tert-butoxy group, an n-pentoxy group, an isopentoxy group, a sec-pentoxy group, a tert-pentoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, a phenoxy group, —$N(Q_1)(Q_2)$, or —$Si(Q_3)(Q_4)(Q_5)$, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, a $C_1$-$C_{10}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, or any combination thereof, $R_1$ to $R_4$, $R_{20}$, $R_{30}$, and $R_{40}$ are each independently hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, or —$P(=O)(Q_8)(Q_9)$, $R_{10}$ is each independently hydrogen, deuterium, —F, —Cl, —Br, —I, —$SF_5$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, an unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryloxy group, a substituted or unsubstituted $C_1$-$C_{60}$ heteroarylthio group, a substituted or unsubstituted monovalent non-aromatic condensed polycyclic group, a substituted or unsubstituted monovalent non-aromatic condensed heteropolycyclic group, —$N(Q_1)(Q_2)$, —$Si(Q_3)(Q_4)(Q_5)$, —$B(Q_6)(Q_7)$, or —$P(=O)(Q_8)(Q_9)$, at least two neighboring groups among $R_1$ to $R_4$, $R_{10}$, $R_{20}$, $R_{30}$, and $R_{40}$ are optionally linked together to form a substituted or unsubstituted $C_5$-$C_{30}$ carbocyclic group or a substituted or unsubstituted $C_1$-$C_{30}$ heterocyclic group, wherein $R_{10}$ and $R_{20}$ are not linked to each other to form a ring, b1 and b3 are each independently 1, 2, 3, 4, or 5, wherein, when b1 is 2 or more, two or more of $R_1$(s) are identical to or different from each other, and when b3 is 2 or more, two or more of $R_3$(s) are identical to or different from each other, b10, b20, b30, and b40 are each independently 1, 2, 3, 4, 5, 6, 7, 8, 9, or 10, wherein, when b10 is 2 or more, two or more of $R_{10}$(s) are identical to or different from each other, when b20 is 2 or more, two or more of $R_{20}$(s) are identical to or different from each other, when b30 is 2 or more, two or more of $R_{30}$(s) are identical to or different from each other, and when b40 is 2 or more, two or more of $R_{40}$(s) are identical to or different from each other, at least one substituent of the substituted $C_5$-$C_{60}$ carbocyclic group, the substituted $C_1$-$C_{60}$ heterocyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted $C_1$-$C_{60}$ hetero aryloxy group, the substituted $C_1$-$C_{60}$ hetero arylthio group, the substituted monovalent non-aromatic condensed polycyclic group, and the substituted monovalent non-aromatic condensed heteropolycyclic group is:

deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, or any combination thereof;

a $C_1$-$C_{60}$ alkyl group, a $C_2$-$C_{60}$ alkenyl group, a $C_2$-$C_{60}$ alkynyl group, a $C_1$-$C_{60}$ alkoxy group, or any combination thereof, each substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, $—N(Q_{11})(Q_{12})$, $—Si(Q_{13})(Q_{14})(Q_{15})$, $—B(Q_{16})(Q_{17})$, $—P(=O)(Q_{18})(Q_{19})$, or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, or any combination thereof;

a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, a monovalent non-aromatic condensed heteropolycyclic group, or any combination thereof, each substituted with deuterium, —F, —Cl, —Br, —I, $—CD_3$, $—CD_2H$, $—CDH_2$, $—CF_3$, $—CF_2H$, $—CFH_2$, a hydroxyl group, a cyano group, a nitro group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, $—N(Q_{21})(Q_{22})$, $—Si(Q_{23})(Q_{24})(Q_{25})$, $—B(Q_{26})(Q_{27})$, $—P(=O)(Q_{28})(Q_{29})$, or any combination thereof; or $—N(Q_{31})(Q_{32})$, $—Si(Q_{33})(Q_{34})(Q_{35})$, $—B(Q_{36})(Q_{37})$, or $—P(=O)(Q_{38})(Q_{39})$, $Q_1$ to $Q_9$, $Q_{11}$ to $Q_{19}$, $Q_{21}$ to $Q_{29}$, and $Q_{31}$ to $Q_{39}$ are each independently hydrogen, deuterium, —F, —Cl, —Br, —I, a hydroxyl group, a cyano group, a nitro group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryl group substituted a $C_1$-$C_{60}$ alkyl group, a $C_6$-$C_{60}$ aryloxy group, a $C_6$-$C_{60}$ arylthio group, a $C_1$-$C_{60}$ heteroaryl group, a $C_1$-$C_{60}$ heteroaryloxy group, a $C_1$-$C_{60}$ heteroarylthio group, a monovalent non-aromatic condensed polycyclic group, or a monovalent non-aromatic condensed heteropolycyclic group.

2. The organometallic compound of claim 1, wherein $M_1$ is Pt, Pd, or Au.

3. The organometallic compound of claim 1, wherein $A_{10}$ is represented by one of Formulae A10-1 to A10-48:

A10-1

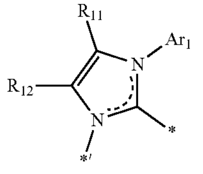

A10-2

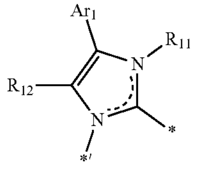

A10-3

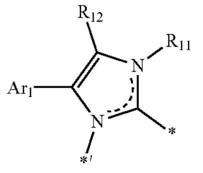

A10-4
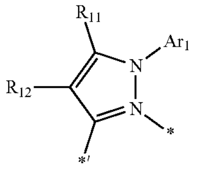
A10-5
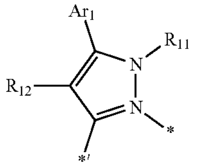
A10-6
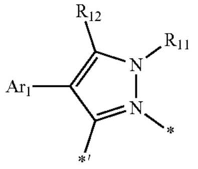
A10-7
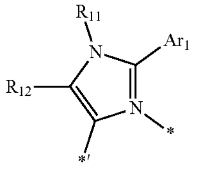
A10-8
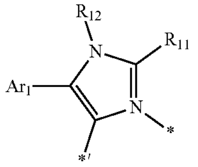
A10-9
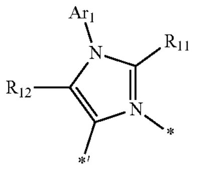
A10-10
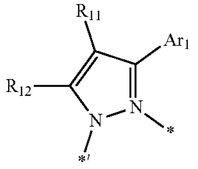
A10-11
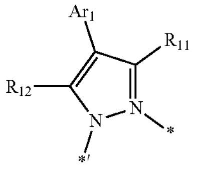
A10-12
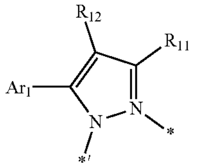
A10-13
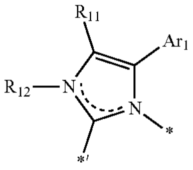
A10-14
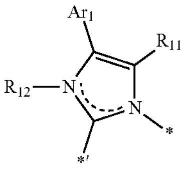
A10-15
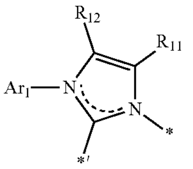
A10-16
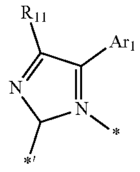
A10-17
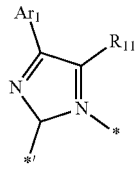
A10-18
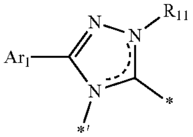
A10-19
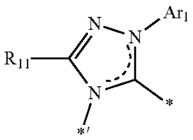
A10-20
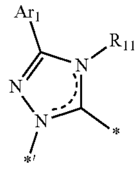
A10-21
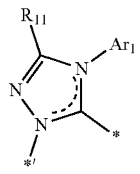

-continued
A10-22
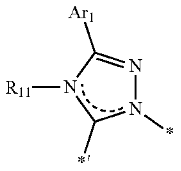
A10-23
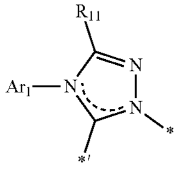
A10-24
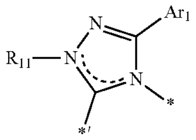
A10-25
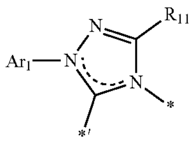
A10-26
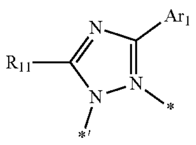
A10-27
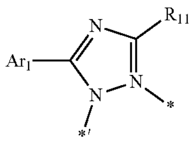
A10-28
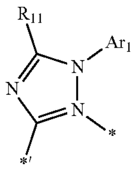
A10-29
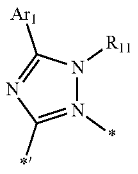
A10-30
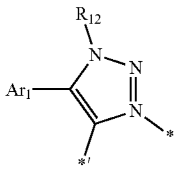
-continued
A10-31
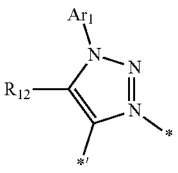
A10-32
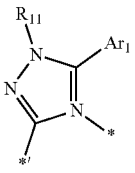
A10-33
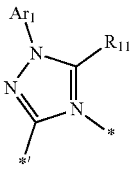
A10-34
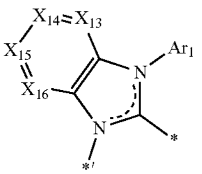
A10-35
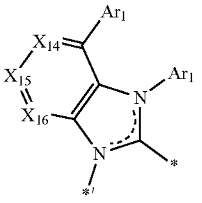
A10-36
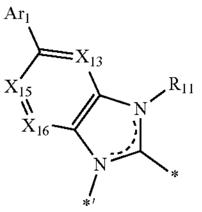
A10-37
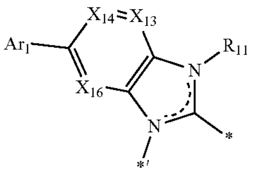
A10-38
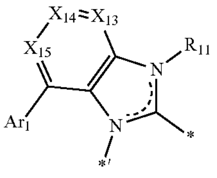

-continued

A10-39

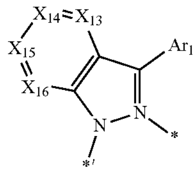

A10-40

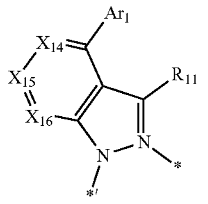

A10-41

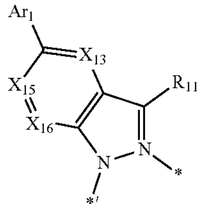

A10-42

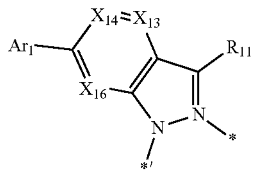

A10-43

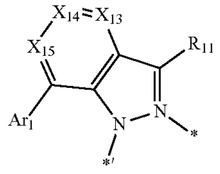

A10-44

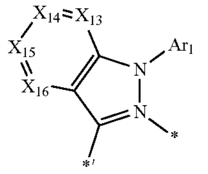

A10-45

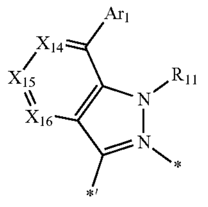

A10-46

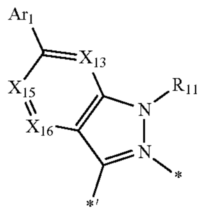

-continued

A10-47

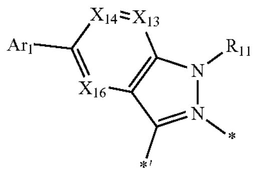

A10-48

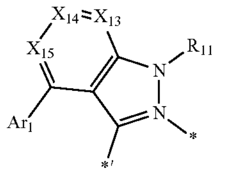

wherein, in Formulae A10-1 to A10-48, $Ar_1$ is the same as described in claim 1, $X_{13}$ is $C(R_{13})$ or N, $X_{14}$ is $C(R_{14})$ or N, $X_{15}$ is $C(R_{15})$ or N, and $X_{16}$ is $C(R_{16})$ or N, $R_{11}$ to $R_{16}$ are each the same as described in connection with Rio in claim 1, and

* and *' each indicate a binding site to a neighboring atom.

4. The organometallic compound of claim 1, wherein $A_{20}$ and $A_{30}$ are each independently a benzene group, a naphthalene group, an anthracene group, a phenanthrene group, a triphenylene group, a pyrene group, a chrysene group, a cyclopentadiene group, a 1,2,3,4-tetrahydronaphthalene group, a furan group, a thiophene group, a silole group, an indene group, a fluorene group, an indole group, a carbazole group, a benzofuran group, a dibenzofuran group, a benzothiophene group, a dibenzothiophene group, a benzosilole group, a dibenzosilole group, an azafluorene group, an azacarbazole group, an azadibenzofuran group, an azadibenzothiophene group, an azadibenzosilole group, a pyridine group, a pyrimidine group, a pyrazine group, a pyridazine group, a triazine group, a quinoline group, an isoquinoline group, a quinoxaline group, a quinazoline group, a phenanthroline group, a pyrrole group, a pyrazole group, an imidazole group, a triazole group, a tetrazole group, an oxazole group, an isooxazole group, a thiazole group, an isothiazole group, an oxadiazole group, a thiadiazole group, a benzopyrazole group, a benzimidazole group, an indazole group, a benzoxazole group, a benzothiazole group, a benzoxadiazole group, a benzothiadiazole group, a benzotriazole group, a diazaindene group, a triazaindene group, a 5,6,7,8-tetrahydroisoquinoline group, or a 5,6,7,8-tetrahydroquinoline group.

5. The organometallic compound of claim 1, wherein $A_{40}$ is represented by one of Formulae A40-1 to A40-4:

A40-1

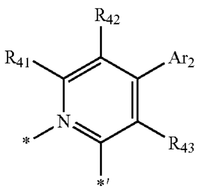

-continued

A40-2

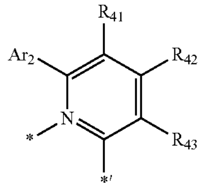

A40-3

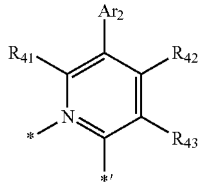

A40-4

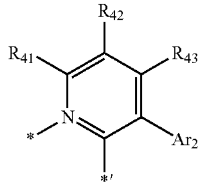

wherein, in Formulae A40-1 to A40-4, $Ar_2$ is the same as described in claim 1, $R_{41}$ to $R_{43}$ are the same as described in connection with $R_{40}$ in claim 1, and

* and *' each indicate a binding site to a neighboring atom.

6. The organometallic compound of claim 1, wherein $E_1$ and $E_2$ are each independently:

deuterium, —F, —Cl, —Br, or —I;

a $C_1$-$C_{30}$ alkyl group or a $C_1$-$C_{30}$ alkoxy group;

a $C_1$-$C_{30}$ alkyl group or a $C_1$-$C_{30}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a $C_1$-$C_{10}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, or a $C_1$-$C_{30}$ aryloxy group;

a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, or a $C_1$-$C_{30}$ aryloxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{10}$ alkyl group, a $C_1$-$C_{10}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, or any combination thereof; or —$N(Q_1)(Q_2)$ or —$Si(Q_3)(Q_4)(Q_5)$.

7. The organometallic compound of claim 1, wherein $Ar_1$ is a group represented by one of Formulae Ar1-1 to Ar1-18:

Ar1-1

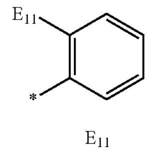

Ar1-2

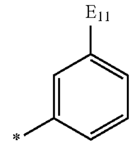

Ar1-3

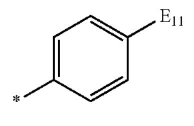

-continued
Ar1-4
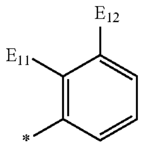
Ar1-5
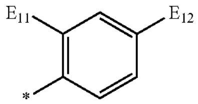
Ar1-6
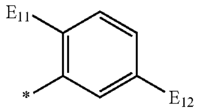
Ar1-7
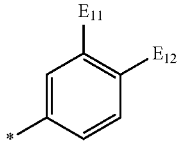
Ar1-8
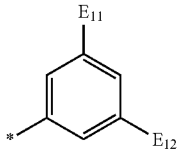
Ar1-9
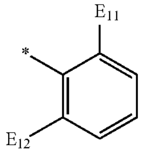
Ar1-10
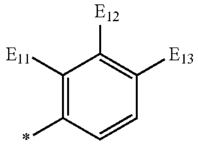
Ar1-11
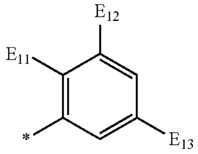
Ar1-12
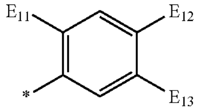
Ar1-13
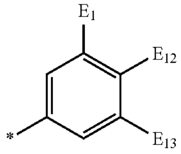
-continued
Ar1-14
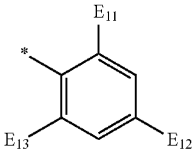
Ar1-15
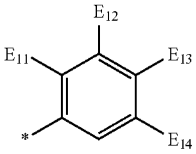
Ar1-16
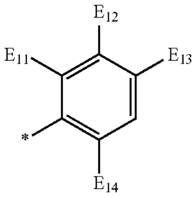
Ar1-17
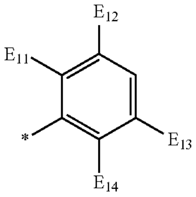
Ar1-18
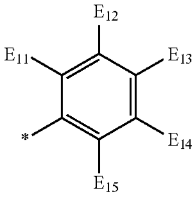
wherein, in Formulae Ar1-1 to Ar1-18,
$E_{11}$ to $E_{15}$ are each the same as described in connection with $E_1$ in claim 1, and
* indicates a binding site to a neighboring atom.
8. The organometallic compound of claim 1, wherein
$Ar_2$ is a group represented by one of Formulae Ar2-1 to Ar2-18:
Ar2-1
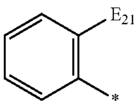
Ar2-2
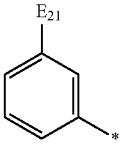
Ar2-3
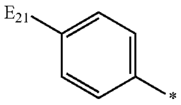

-continued

Ar2-4

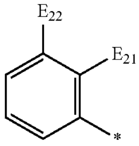

Ar2-5

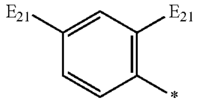

Ar2-6

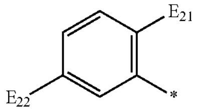

Ar2-7

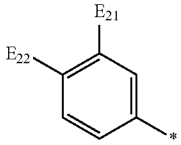

Ar2-8

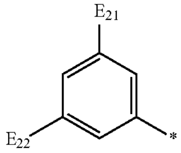

Ar2-9

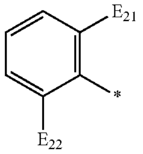

Ar2-10

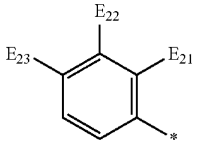

Ar2-11

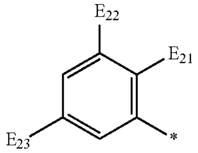

Ar2-12

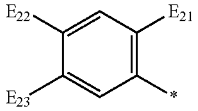

Ar2-13

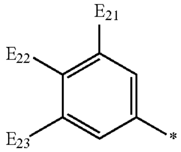

-continued

Ar2-14

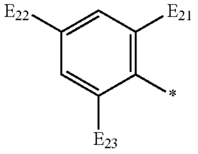

Ar2-15

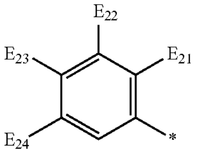

Ar2-16

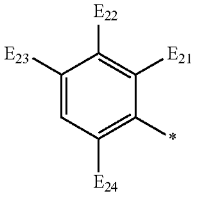

Ar2-17

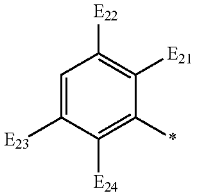

Ar2-18

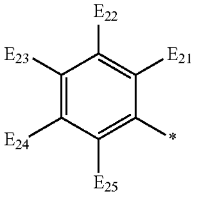

wherein, in Formulae Ar2-1 to Ar2-18, $E_{21}$ to $E_{25}$ are each the same as described in connection with $E_2$ in claim 1, and

* indicates a binding site to a neighboring atom.

9. The organometallic compound of claim 1, wherein the organometallic compound is electrically neutral.

10. The organometallic compound of claim 1, wherein $L_1$ and $L_2$ are each independently: a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group; or a phenylene group, a pentalenylene group, an indenylene group, a naphthylene group, an azulenylene group, a heptalenylene group, an acenaphthylene group, a fluorenylene group, a phenalenylene group, a phenanthrenylene group, an anthracenylene group, a fluoranthenylene group, a triphenylenylene group, a pyrenylene group, a chrysenylenylene group, a naphthacenylene group, a picenylene group, a perylenylene group, or a pentacenylene group, each substituted with deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_3$-$C_{10}$ cycloalkenyl group, a $C_1$-$C_{10}$ heterocycloalkyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, or any combination thereof.

11. The organometallic compound of claim 1, wherein $R_1$ to $R_4$, $R_{20}$, $R_{30}$, and $R_{40}$ are each independently:

hydrogen, deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, —$SF_5$, a $C_1$-$C_{20}$ alkyl group, or a $C_1$-$C_{20}$ alkoxy group;

a $C_1$-$C_{20}$ alkyl group or a $C_1$-$C_{20}$ alkoxy group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{10}$ alkyl group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a pyridinyl group, a pyrimidinyl group, or any combination thereof;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group;

a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, or an imidazopyrimidinyl group, each substituted with deuterium, —F, —Cl, —Br, —I, —$CD_3$, —$CD_2H$, —$CDH_2$, —$CF_3$, —$CF_2H$, —$CFH_2$, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{20}$ alkyl group, a $C_1$-$C_{20}$ alkoxy group, a cyclopentyl group, a cyclohexyl group, a cycloheptyl group, a cyclooctyl group, an adamantanyl group, a norbornanyl group, a norbornenyl group, a cyclopentenyl group, a cyclohexenyl group, a cycloheptenyl group, a phenyl group, a naphthyl group, a fluorenyl group, a phenanthrenyl group, an anthracenyl group, a fluoranthenyl group, a triphenylenyl group, a pyrenyl group, a chrysenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a quinoxalinyl group, a quinazolinyl group, a cinnolinyl group, a carbazolyl group, a phenanthrolinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, an imidazopyridinyl group, an imidazopyrimidinyl group, or an adamantanyl group; or —$N(Q_1)(Q_2)$, —$Si(Q_3)(Q_4)(Q_5)$, —$B(Q_6)(Q_7)$, or —$P(=O)(Q_8)(Q_9)$, and $Q_1$ to $Q_9$ are each independently:

—$CH_3$, —$CD_3$, —$CD_2H$, —$CDH_2$, —$CH_2CH_3$, —$CH_2CD_3$, —$CH_2CD_2H$, —$CH_2CDH_2$, —$CHDCH_3$, —$CHDCD_2H$, —$CHDCDH_2$, —$CHDCD_3$, —$CD_2CD_3$, —$CD_2CD_2H$, or —$CD_2CDH_2$;

an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, or a naphthyl group; or an n-propyl group, an isopropyl group, an n-butyl group, an isobutyl group, a sec-butyl group, a tert-butyl group, an n-pentyl group, an isopentyl group, a sec-pentyl group, a tert-pentyl group, a phenyl group, or a naphthyl group, each substituted with deuterium, a $C_1$-$C_{10}$ alkyl group, a phenyl group, or any combination thereof.
12. The organometallic compound of claim 1, wherein the organometallic compound represented by Formula 1 is represented by one of Formulae 11-1 to 11-38:
11-1
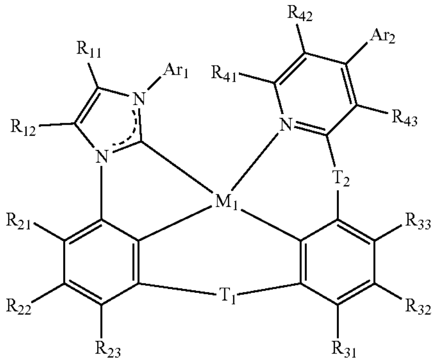
11-2
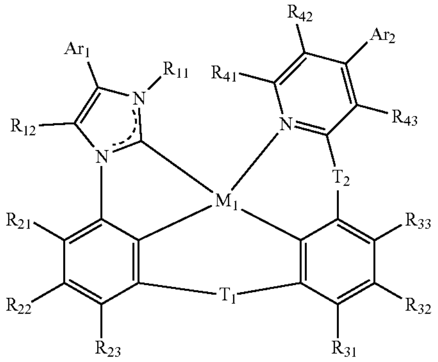
11-3
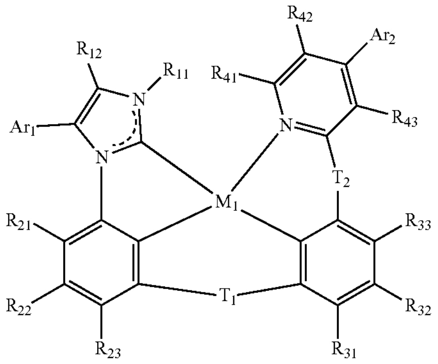
-continued
11-4
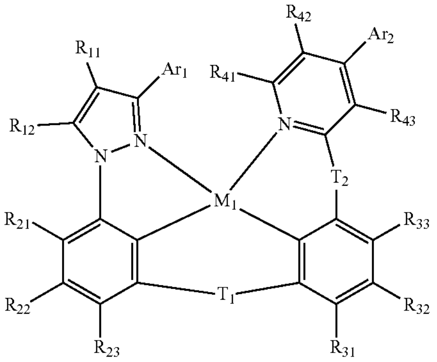
11-5
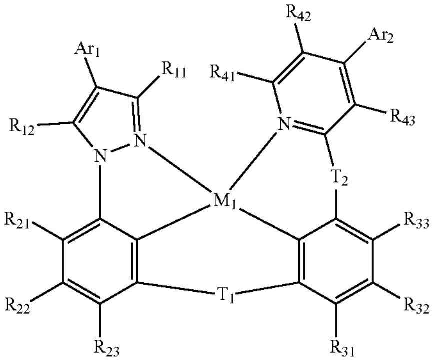
11-6
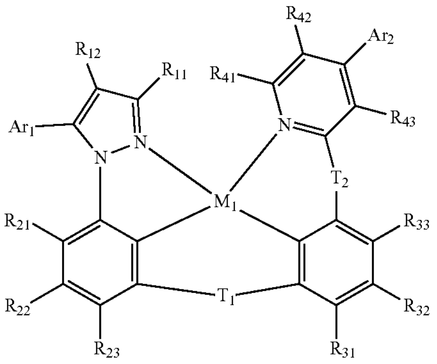
11-7
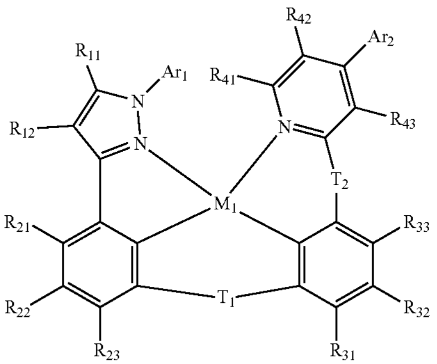

-continued
11-8
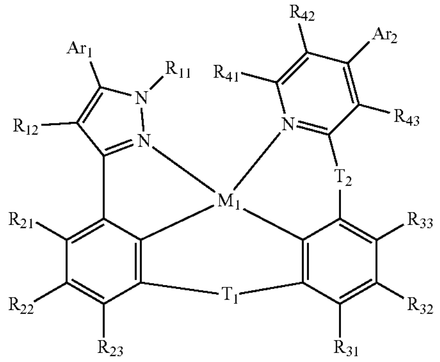
11-9
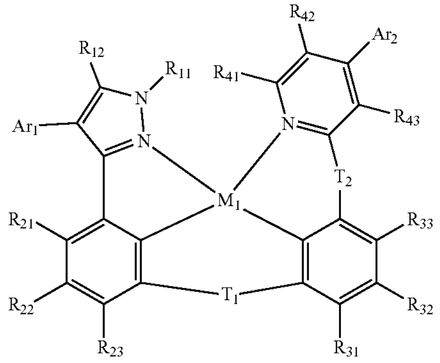
11-10
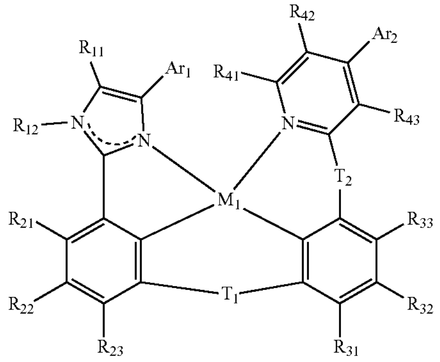
11-11
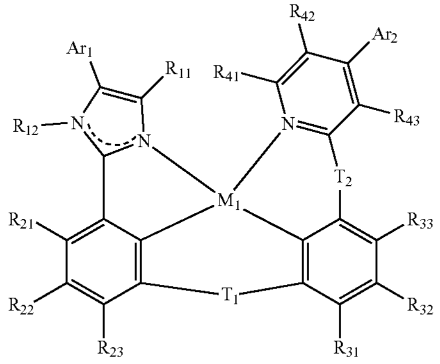
-continued
11-12
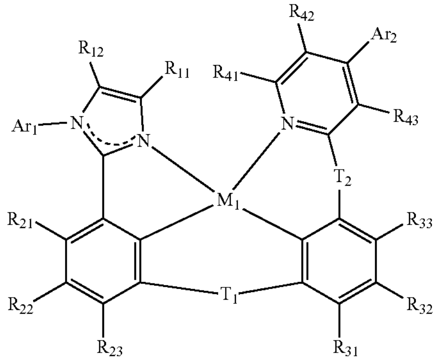
11-13
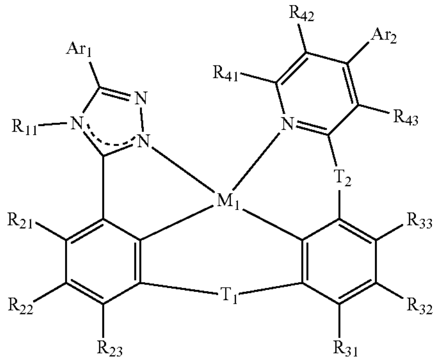
11-14
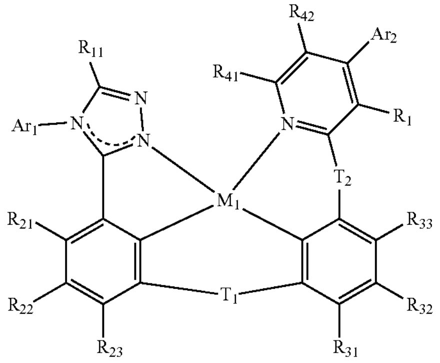
11-15
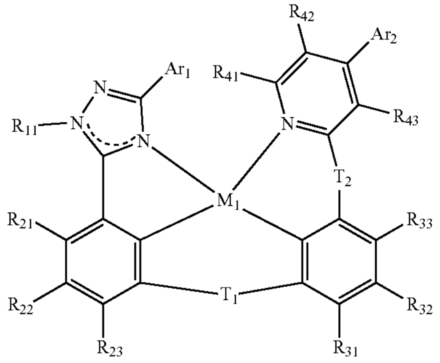

-continued
11-16
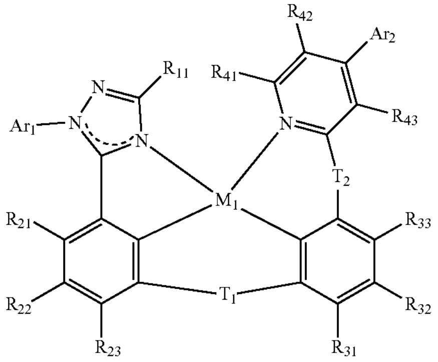
11-17
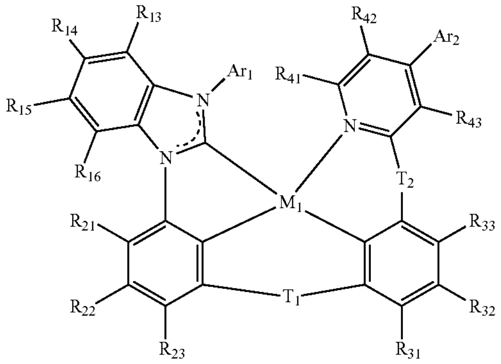
11-18
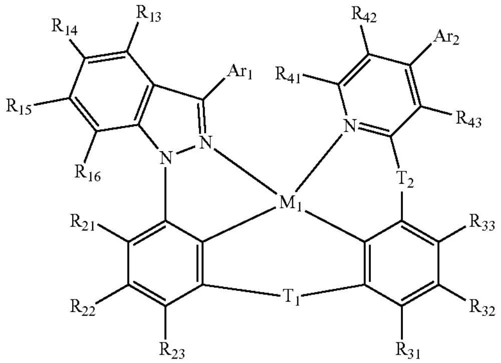
11-19
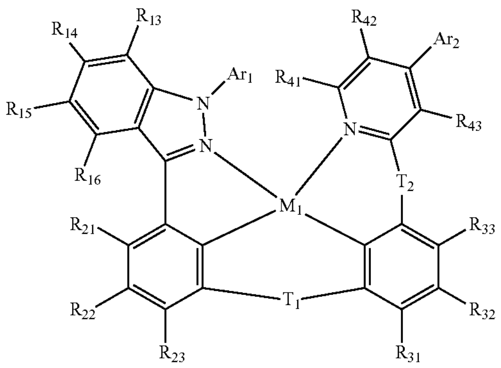
-continued
11-20
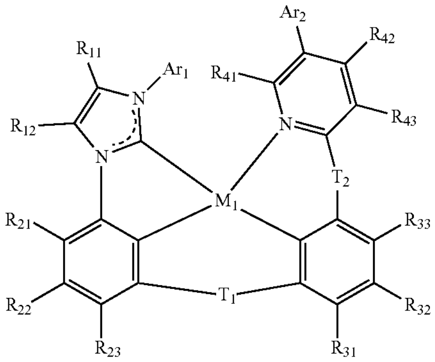
11-21
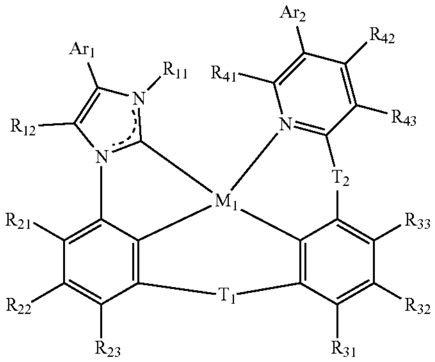
11-22
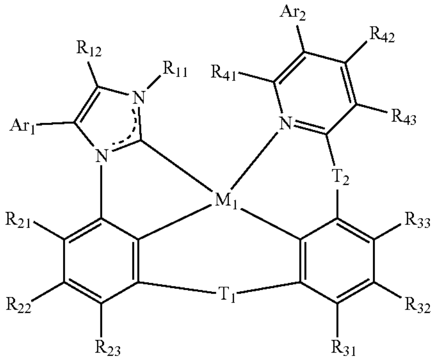
11-23
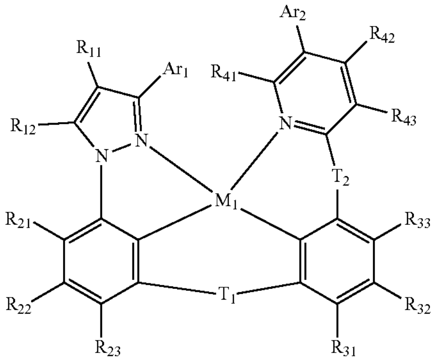

-continued
11-24
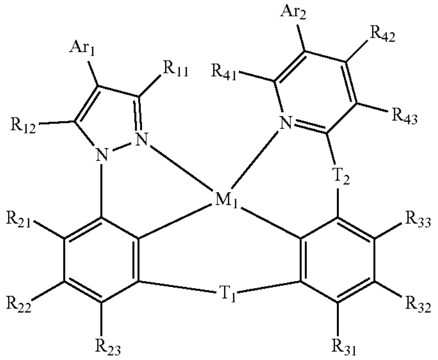
11-25
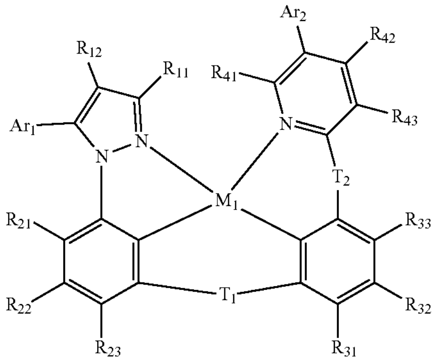
11-26
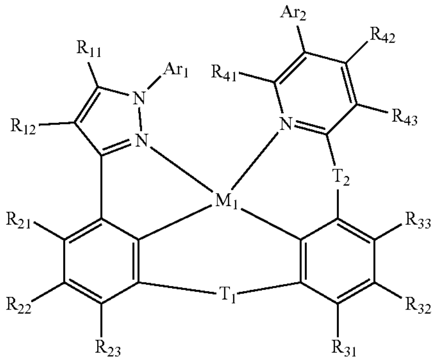
11-27
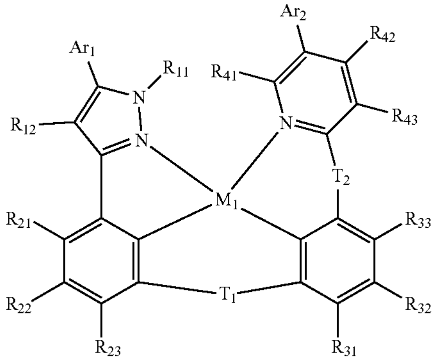
-continued
11-28
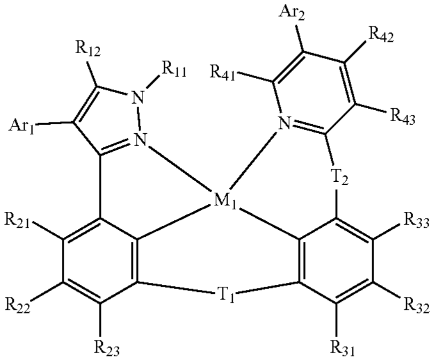
11-29
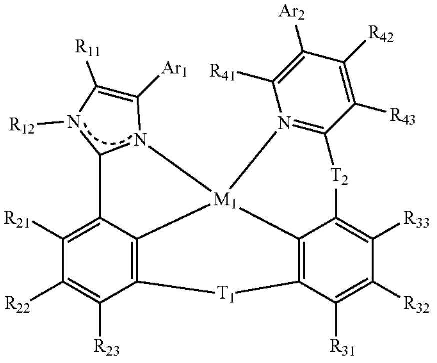
11-30
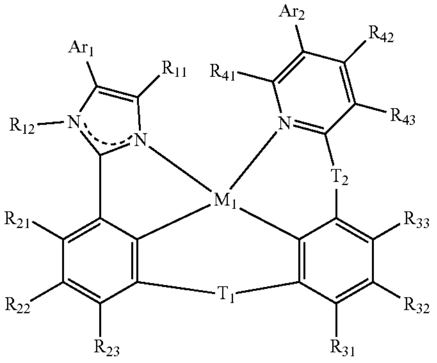
11-31
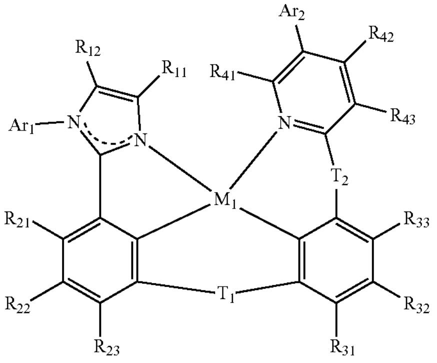

-continued 11-32

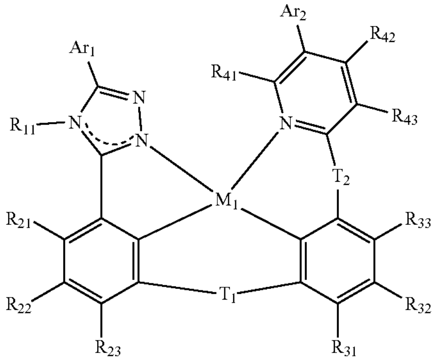

11-33

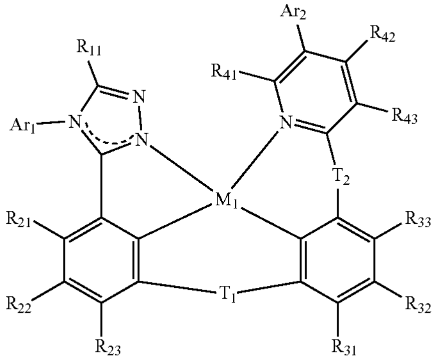

11-34

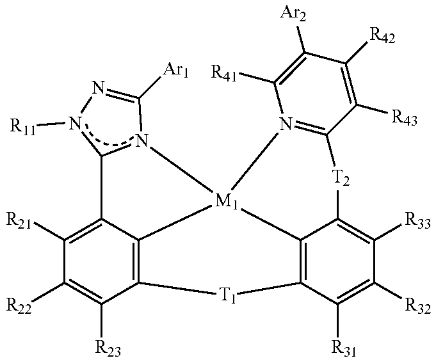

11-35

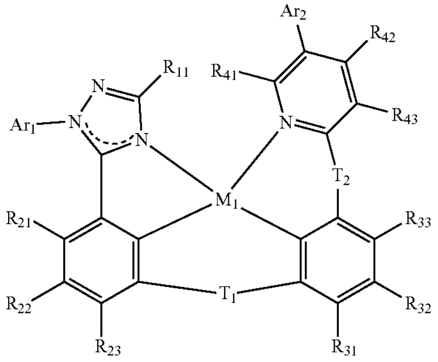

-continued 11-36

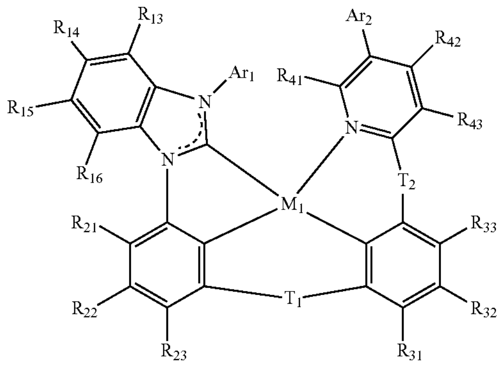

11-37

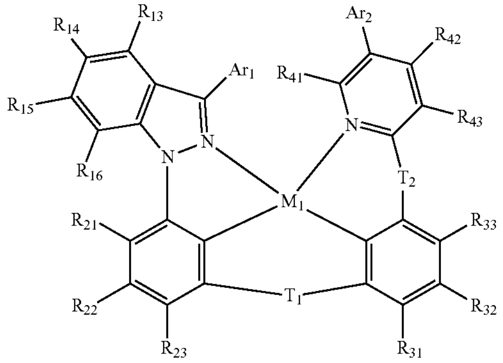

11-38

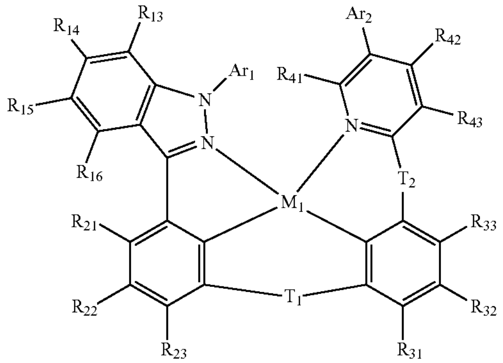

wherein, in Formulae 11-1 to 11-38, $M_1$, $Ar_1$, $Ar_2$, $T_1$, and $T_2$ are each the same as described in claim 1, $R_{11}$ to $R_{16}$ are each independently the same as described in connection with $R_{10}$ in claim 1, $R_{21}$ to $R_{23}$ are each independently the same as described in connection with $R_{20}$ in claim 1, $R_{31}$ to $R_{33}$ are each independently the same as described in connection with $R_{30}$ in claim 1, and $R_{41}$ to $R_{43}$ are the same as described in connection with $R_{40}$ in claim 1.

13. The organometallic compound of claim 1, wherein the organometallic compound is one of the following Compounds:

-continued
1
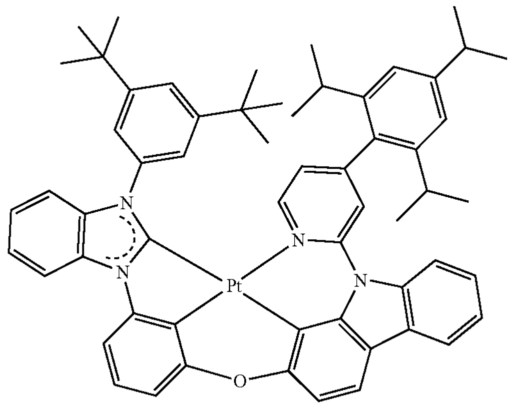
2
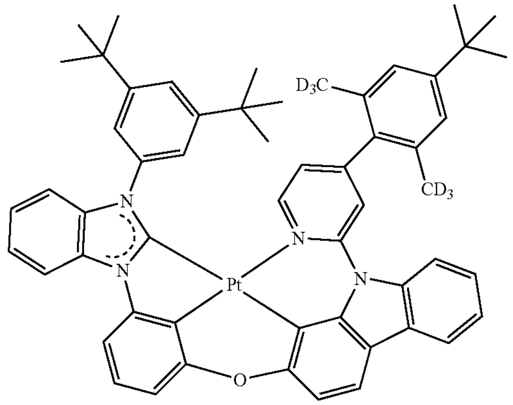
3
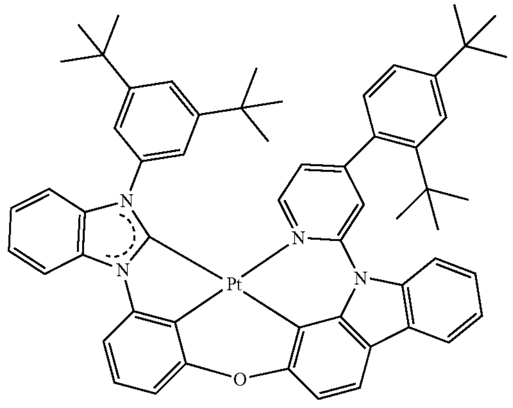
4
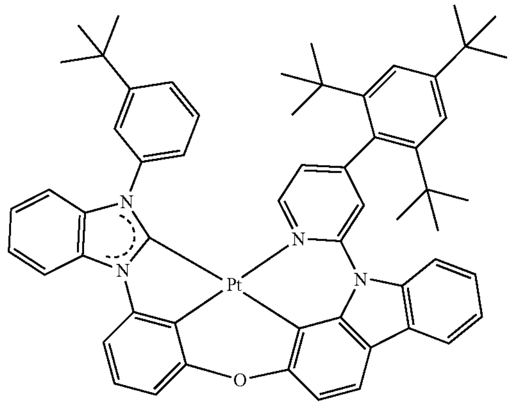
5
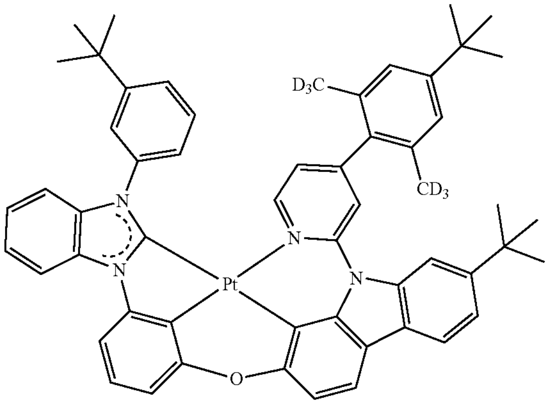
6
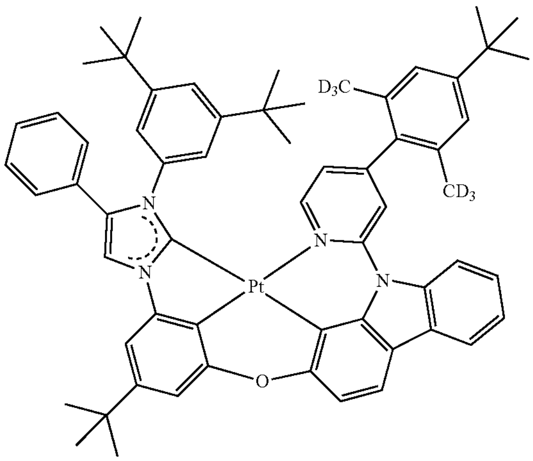
7
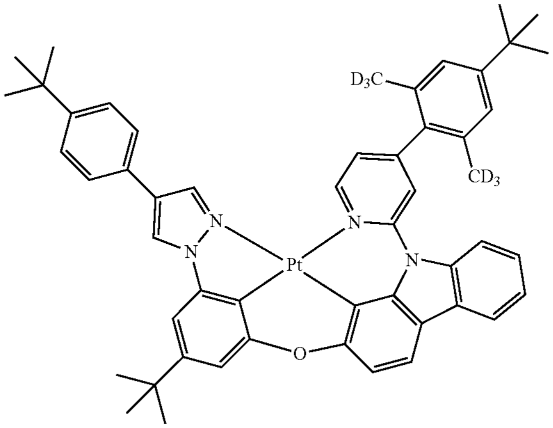

-continued
8
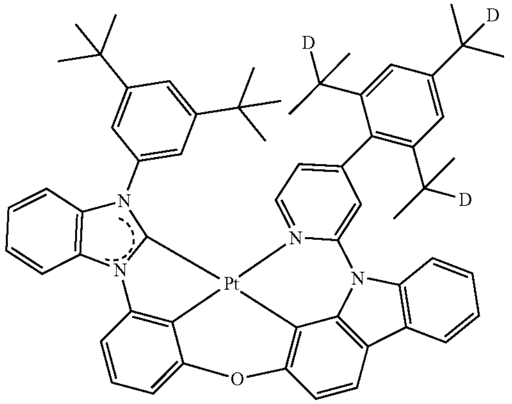
9
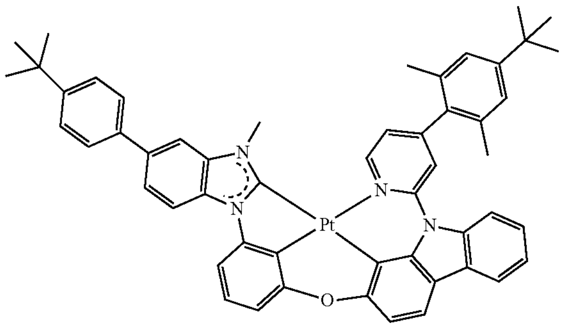
10
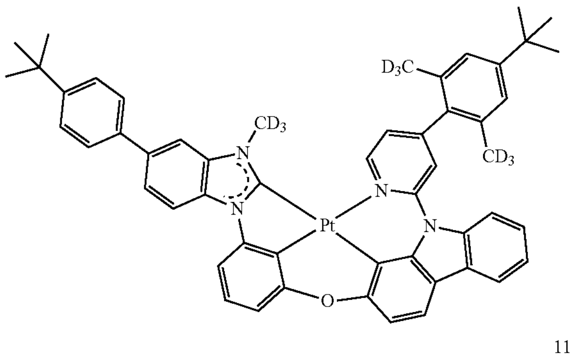
11
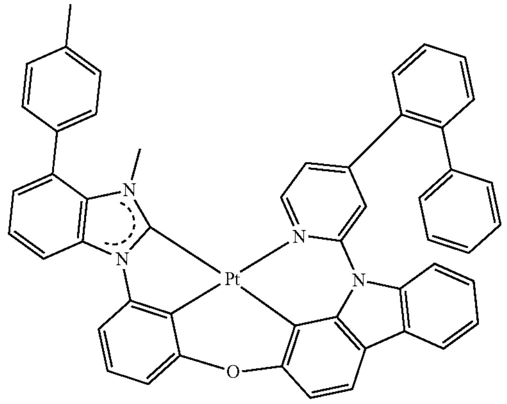
-continued
12
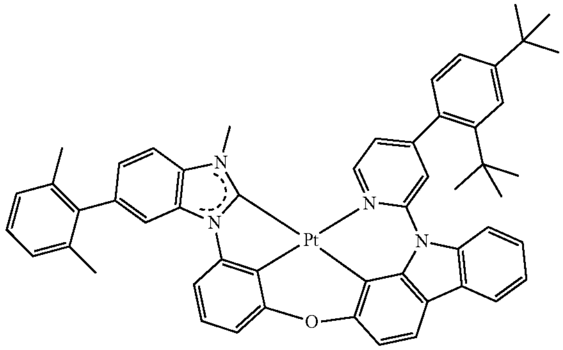
13
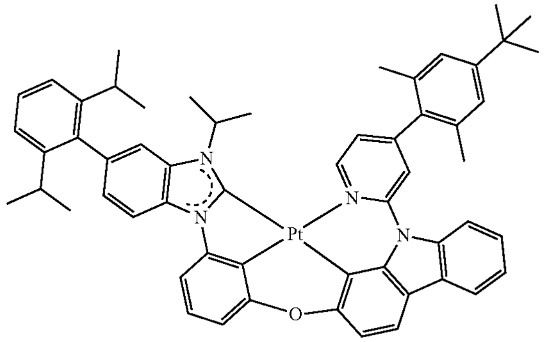
14
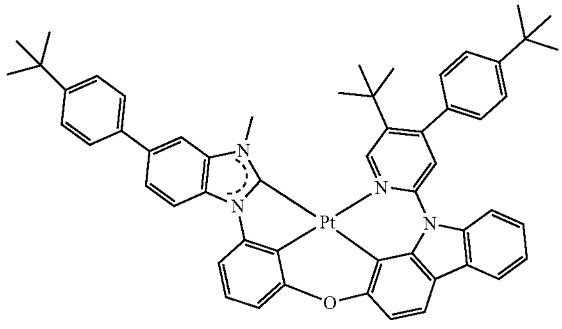
16
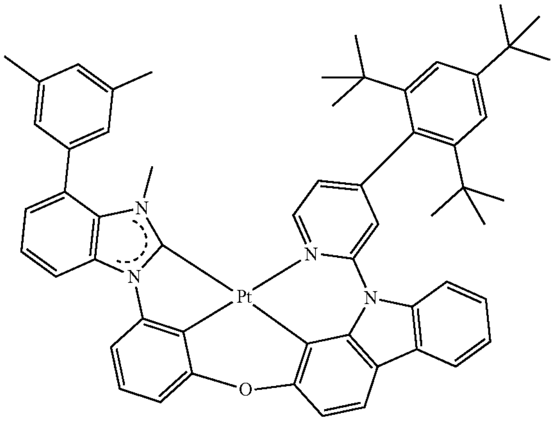

-continued
17
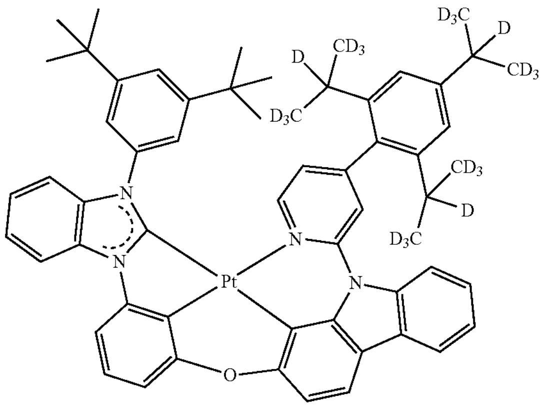
18
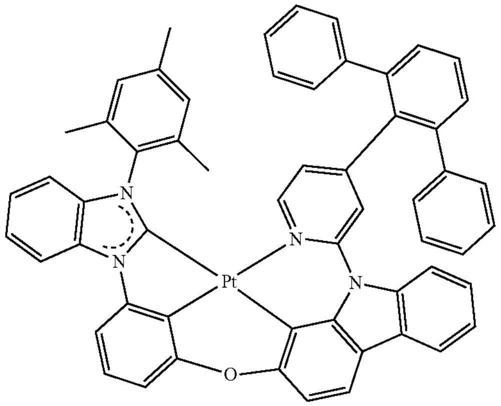
20
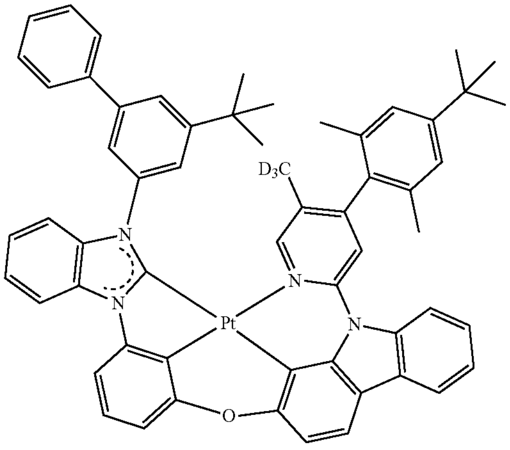
-continued
21
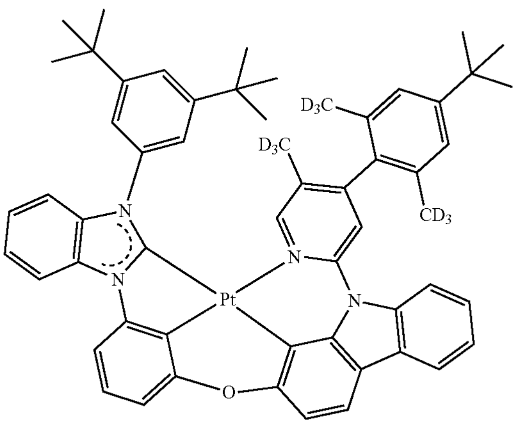
22
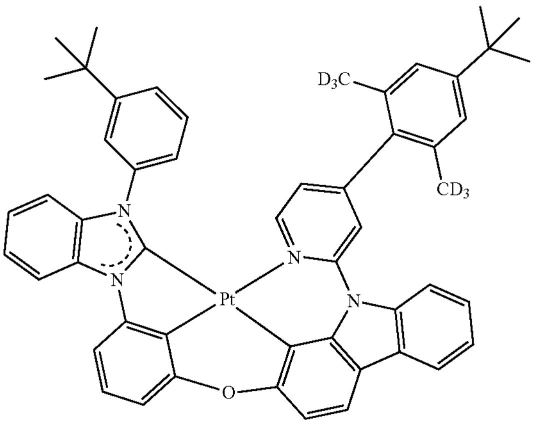
23
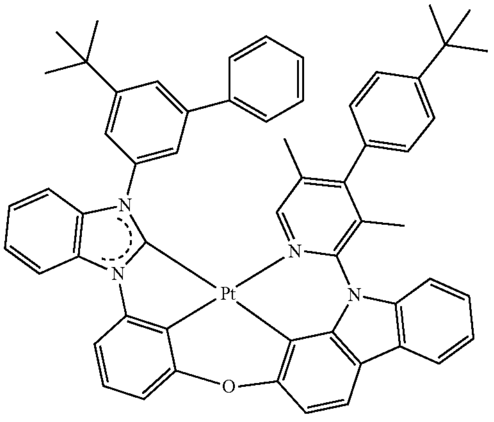

-continued
24
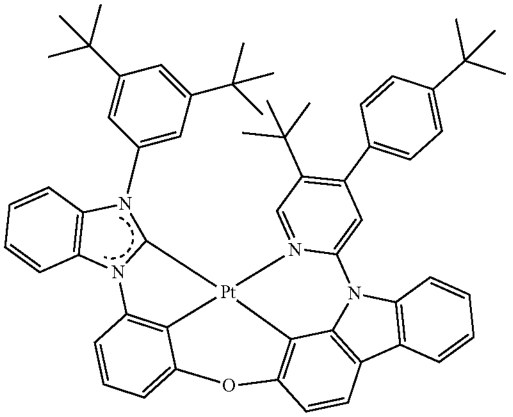
25
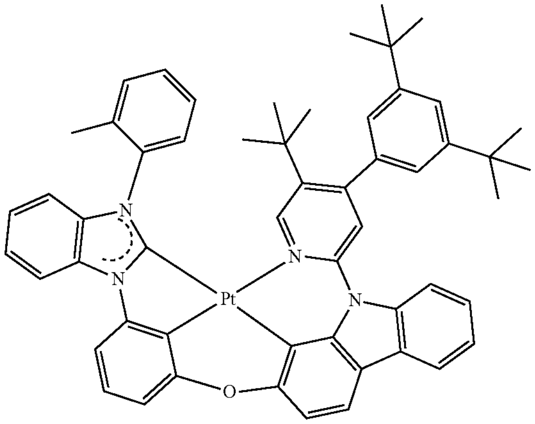
26
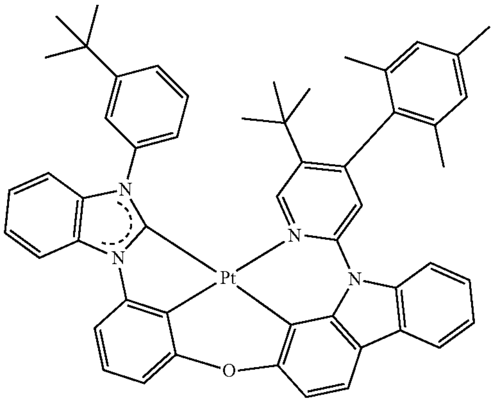
-continued
27
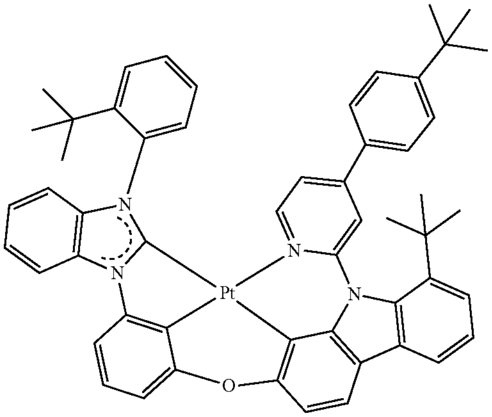
28
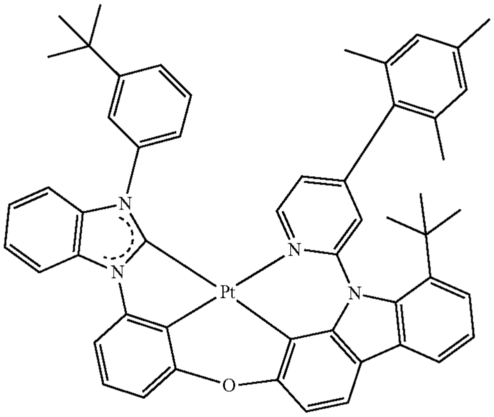
30
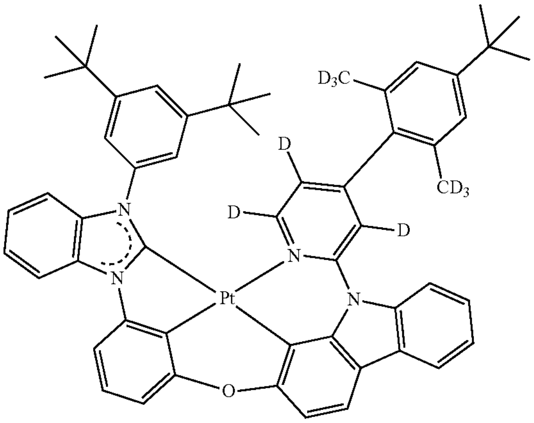

-continued
31
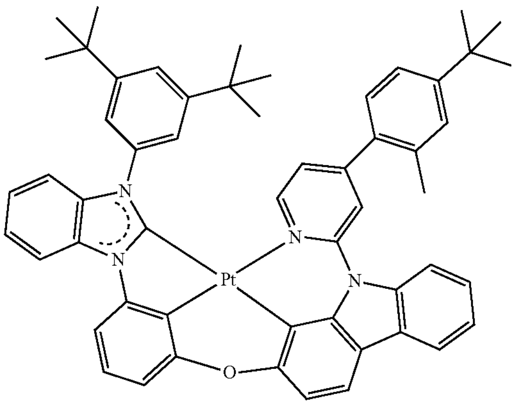
32
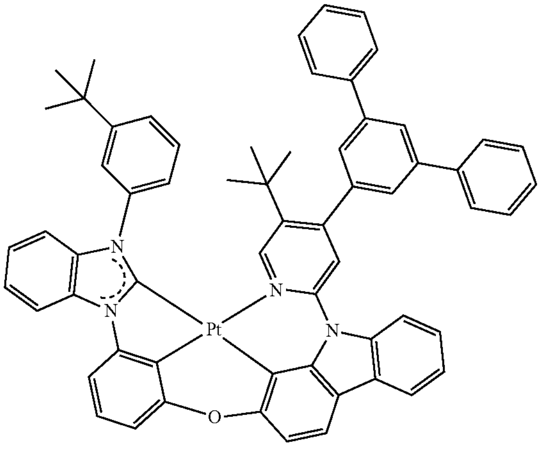
33
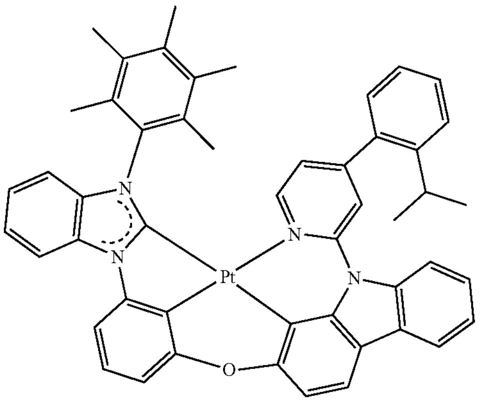
-continued
34
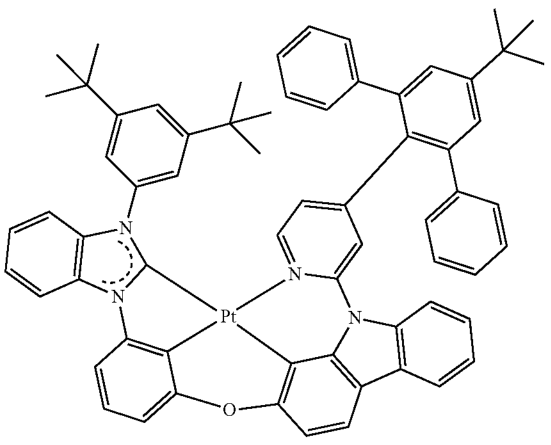
35
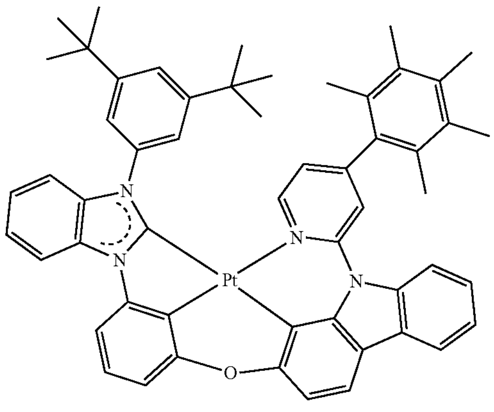
36
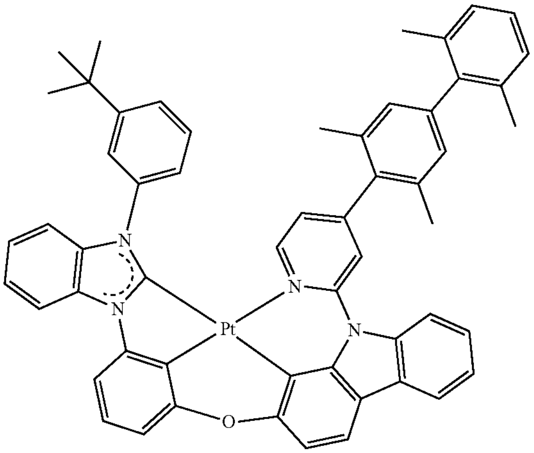

-continued
37
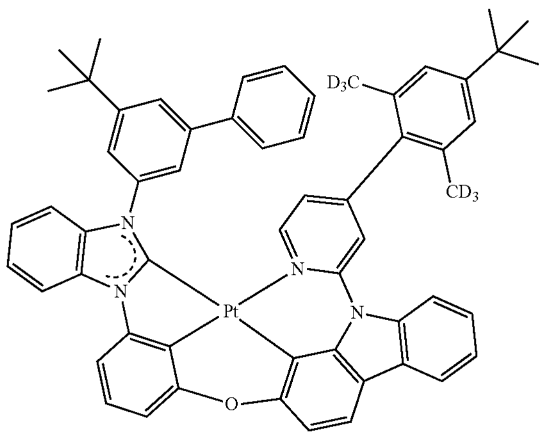
38
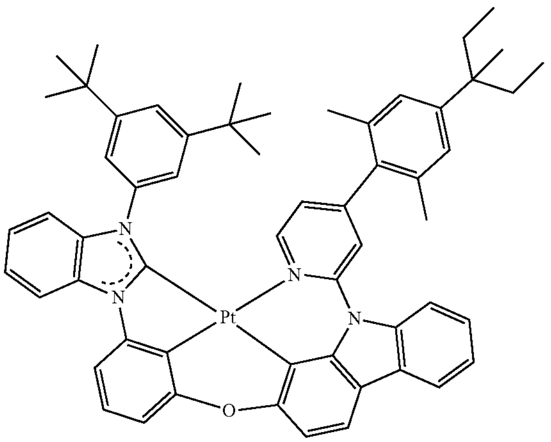
39
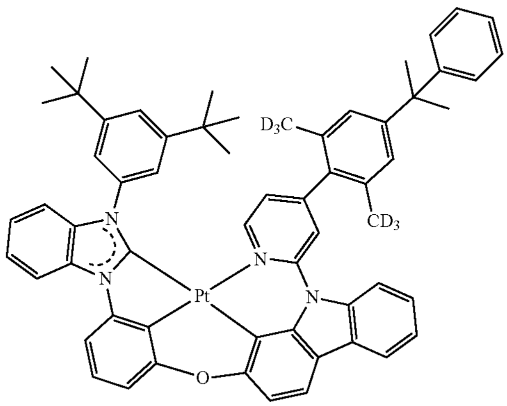
-continued
40
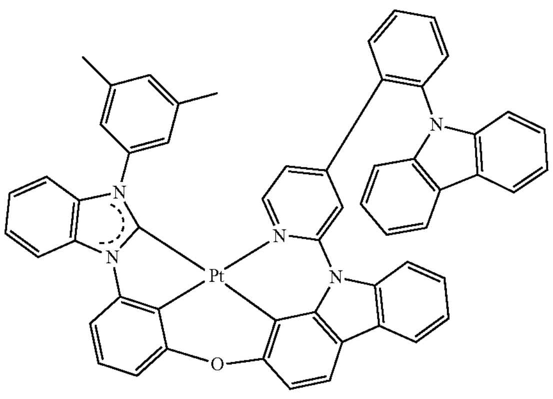
41
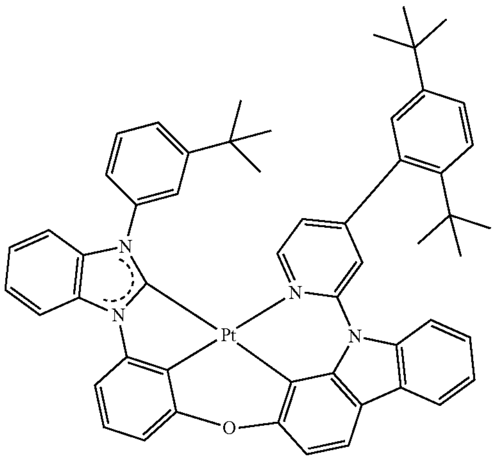
42
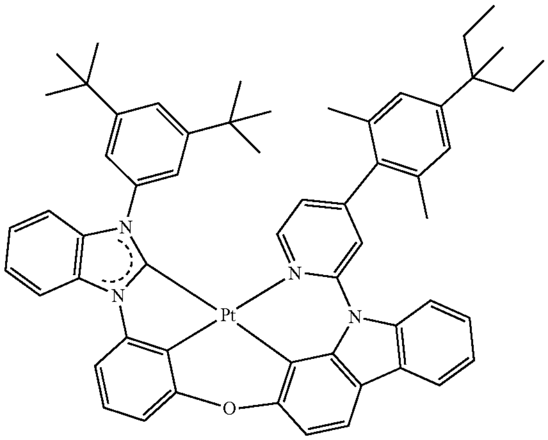

-continued
43
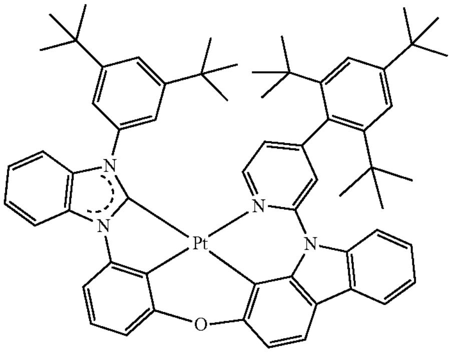
44
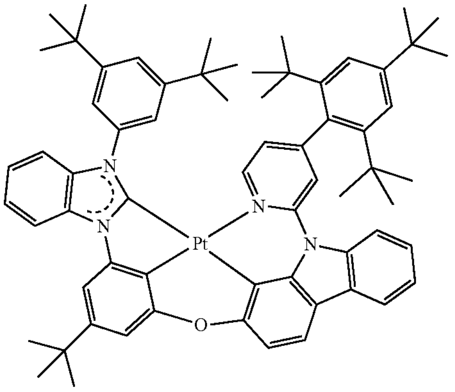
45
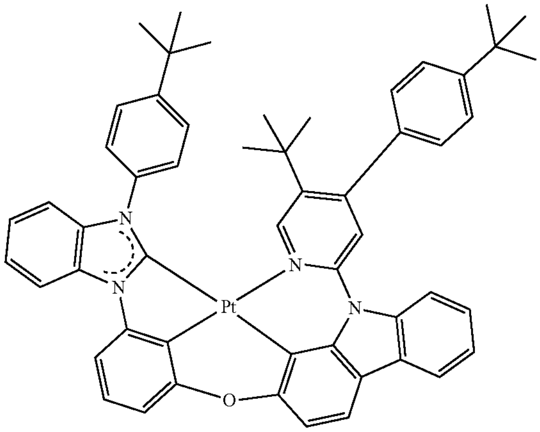
46
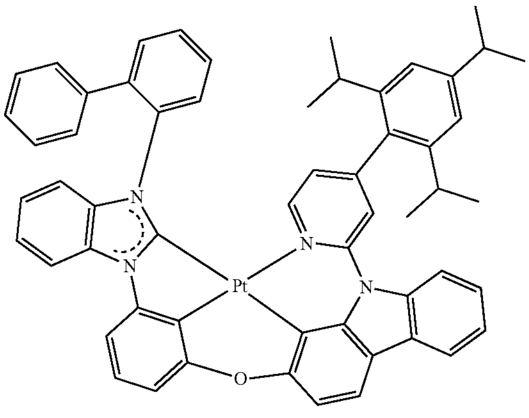
-continued
47
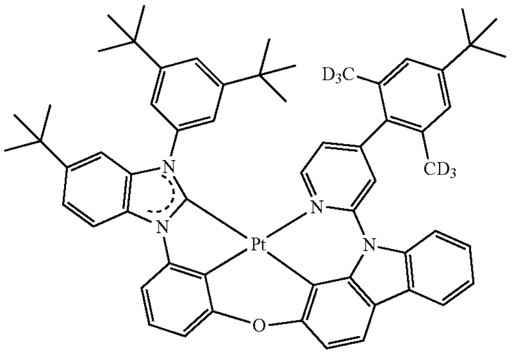
48
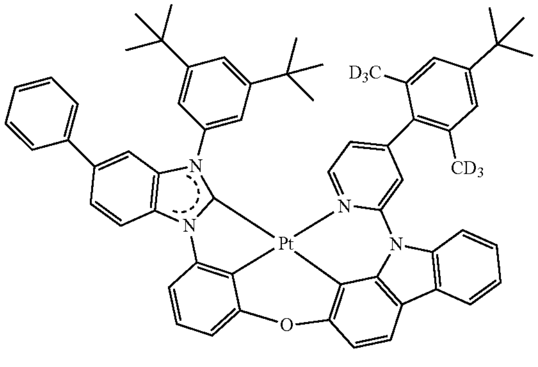
49
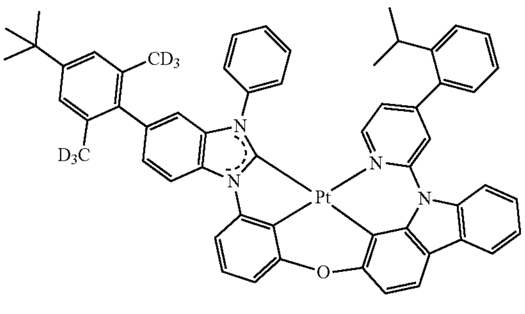
50
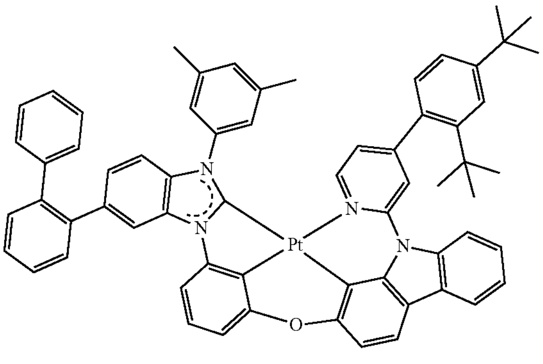

-continued
52
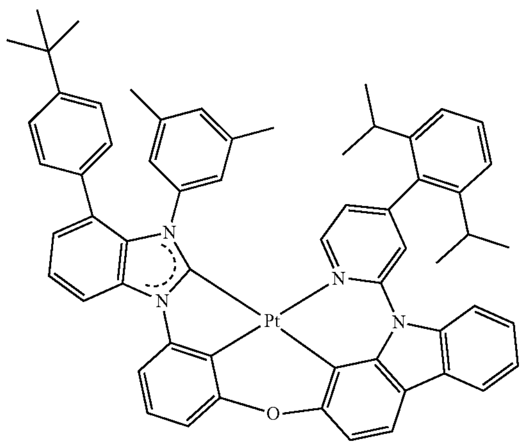
53
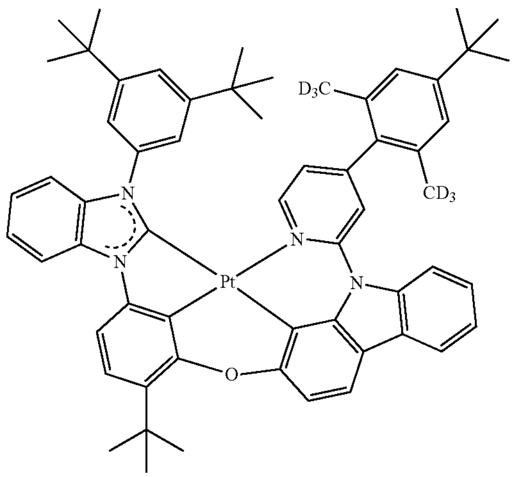
54
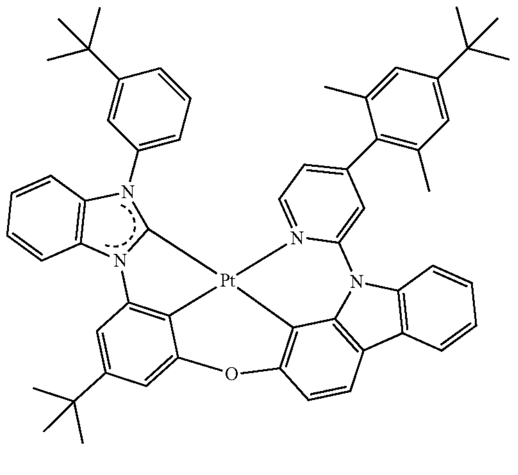
-continued
55
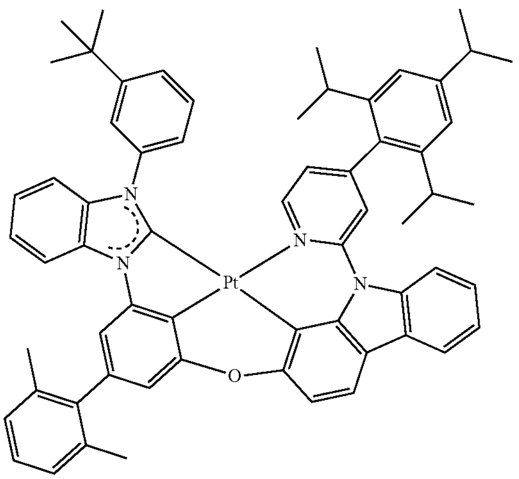
56
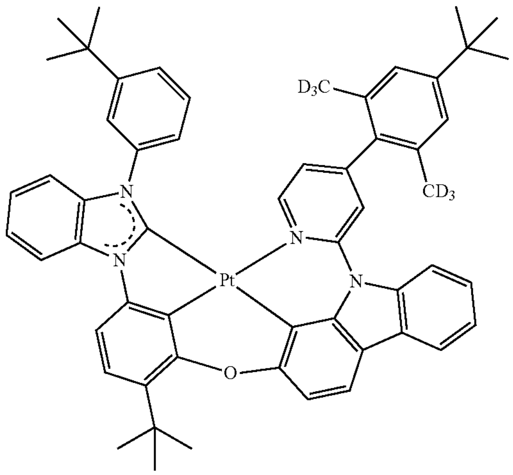
57
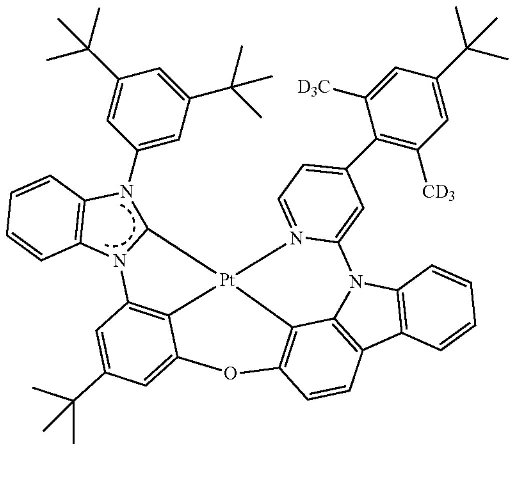

-continued
58
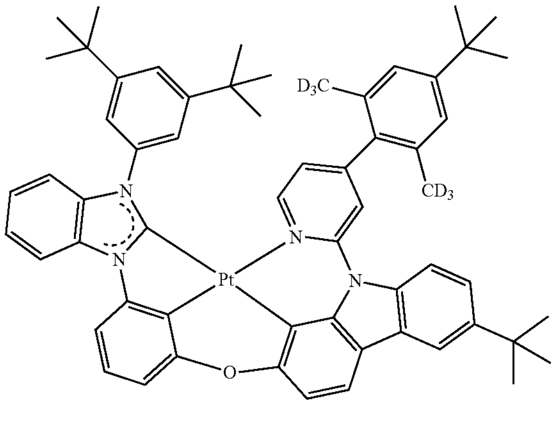
59
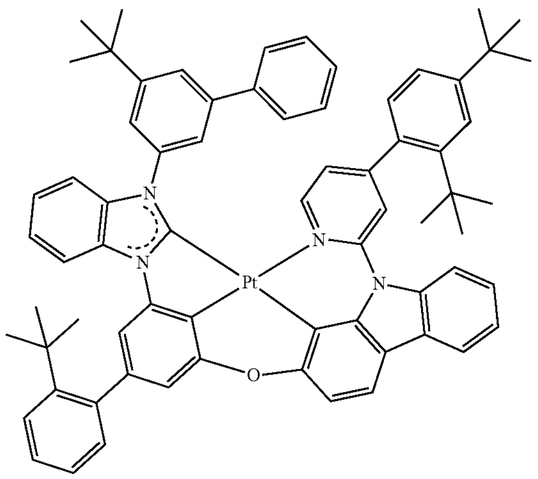
60
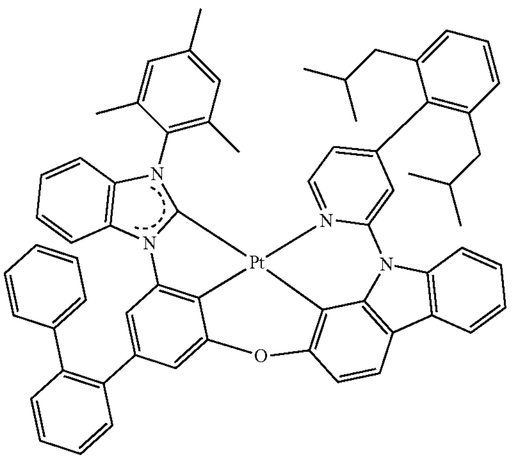
-continued
61
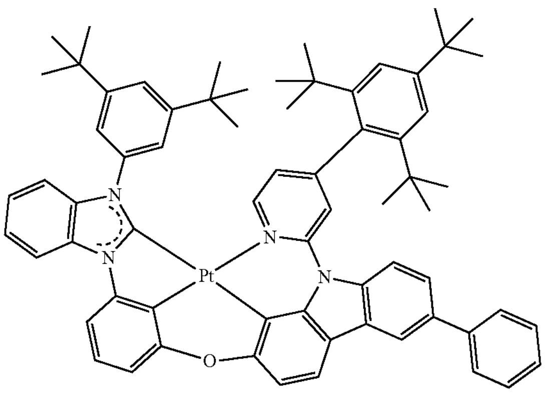
62
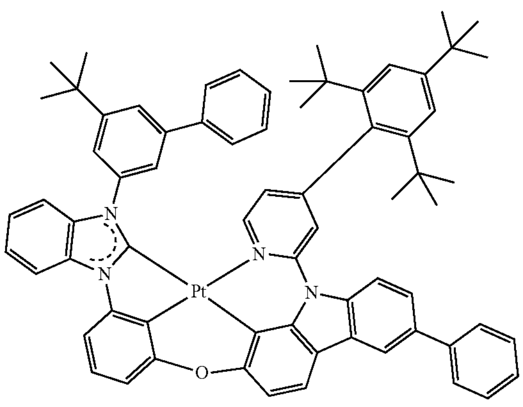
63
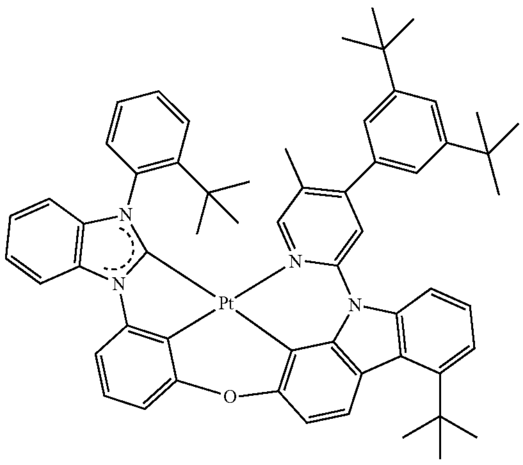

-continued
64
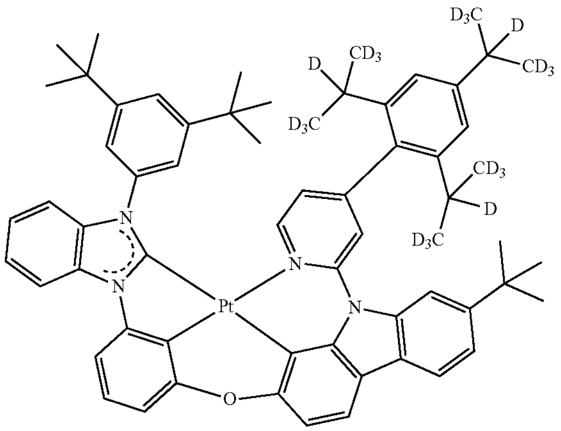
65
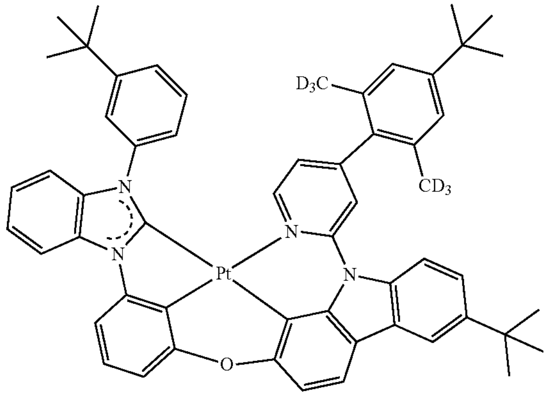
66
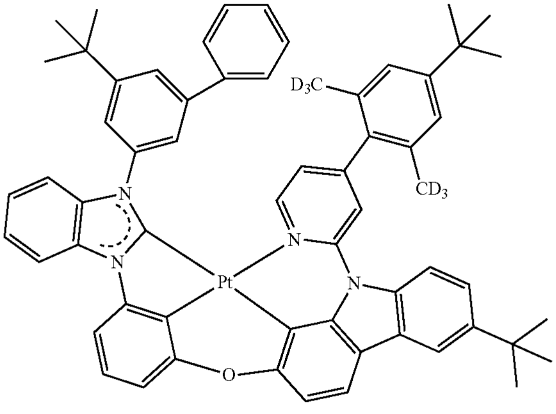
-continued
67
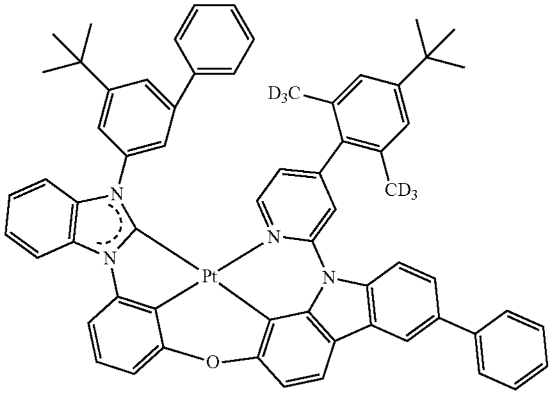
68
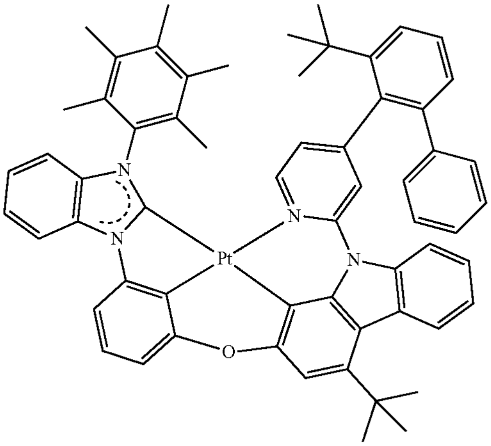
69
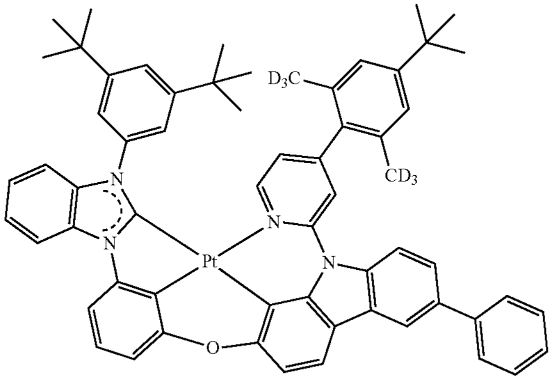

-continued
70
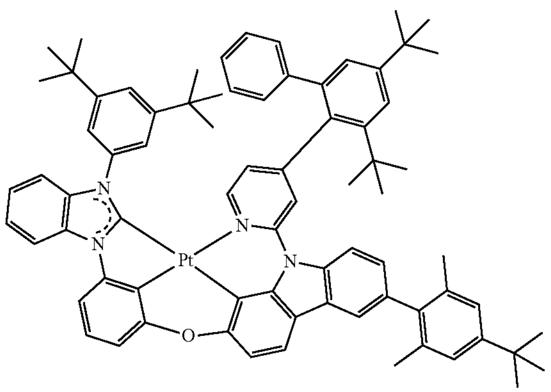
71
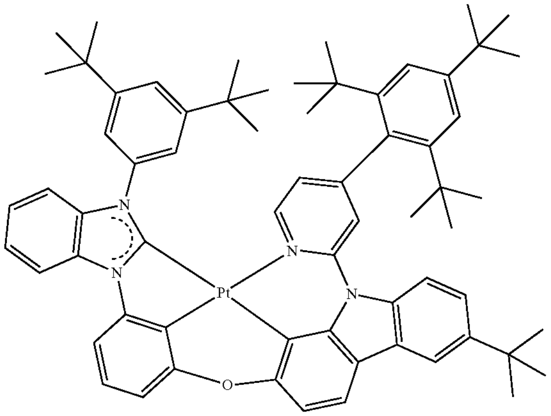
72
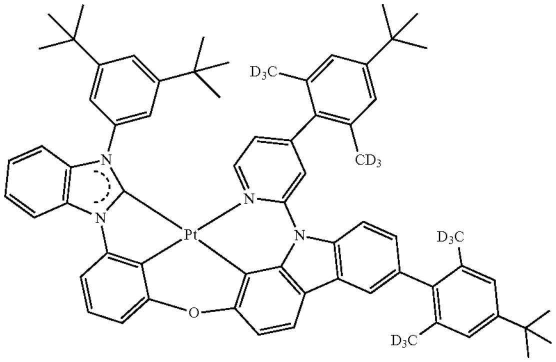
-continued
73
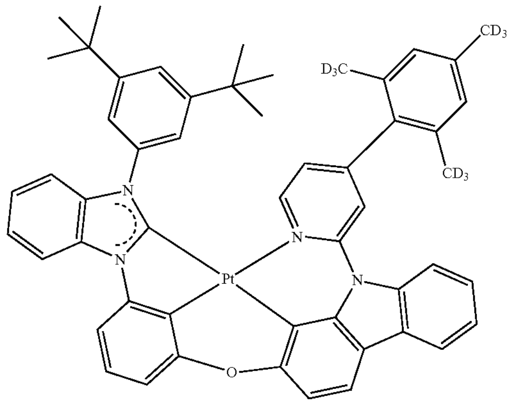
74
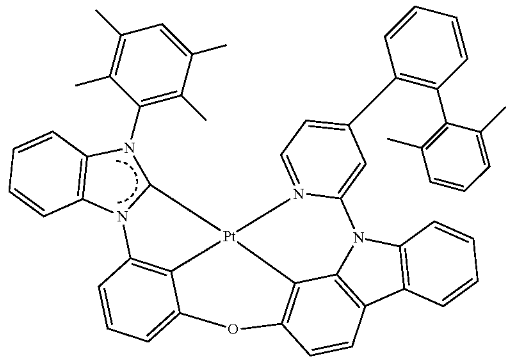
75
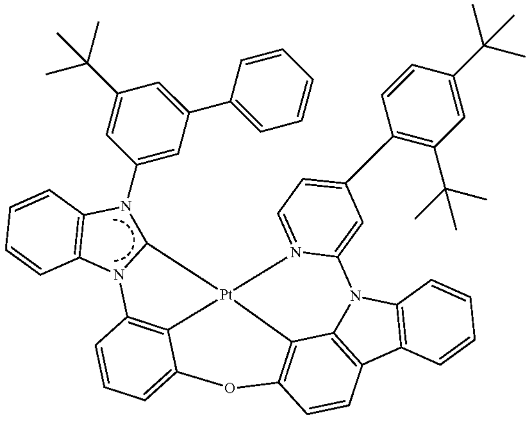
76
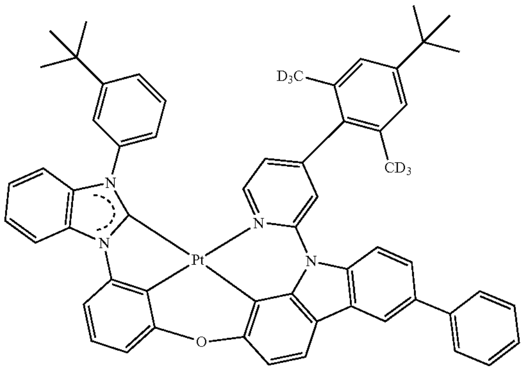

-continued
77
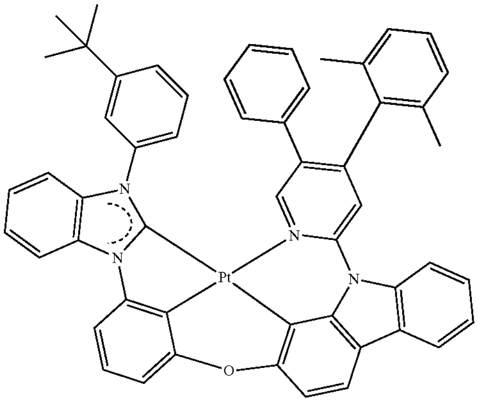
78
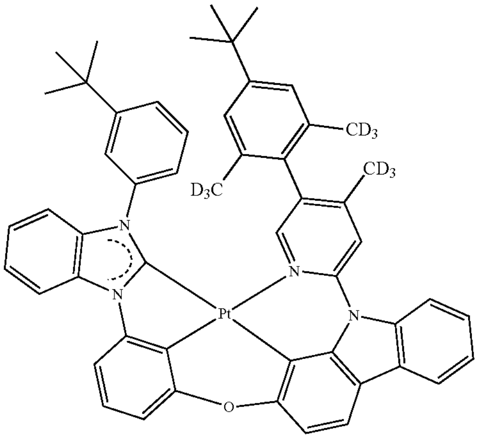
79
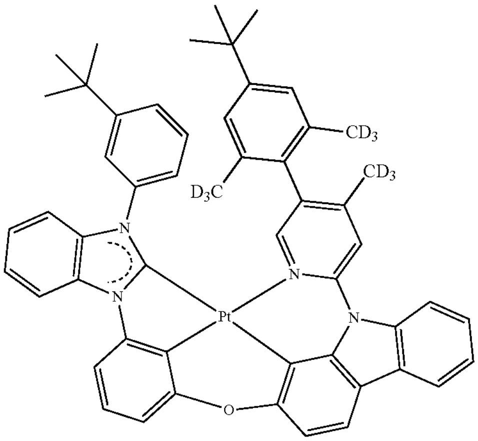
-continued
80
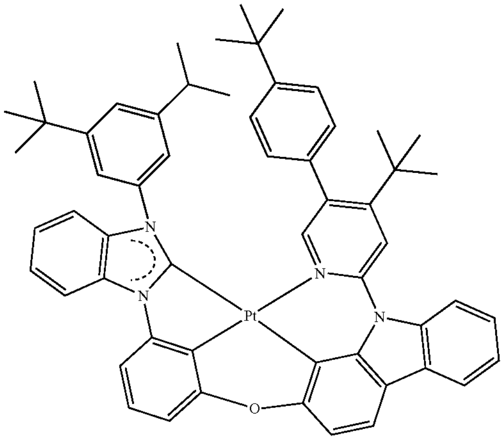
81
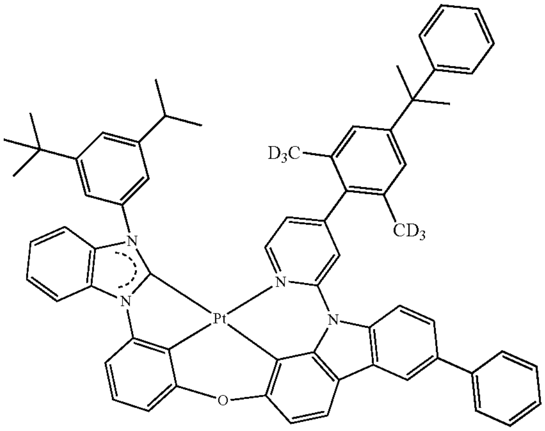
82
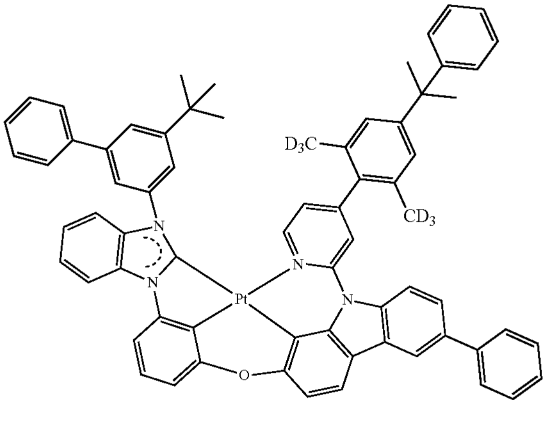

-continued
83
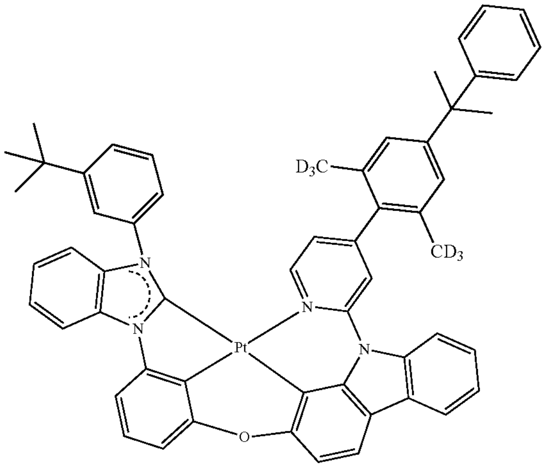
84
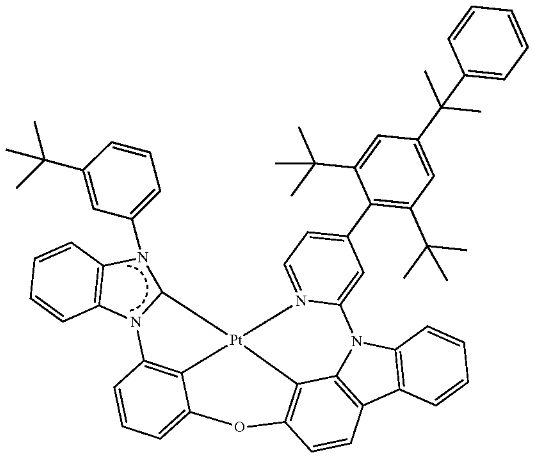
85
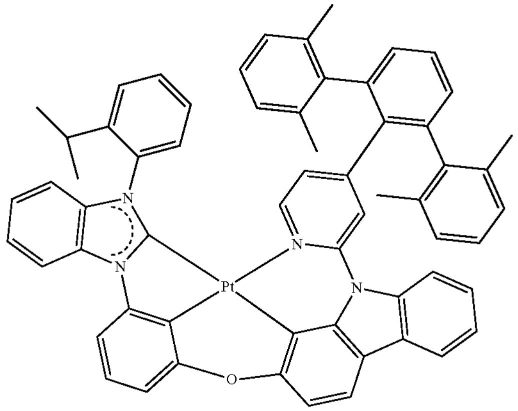
-continued
86
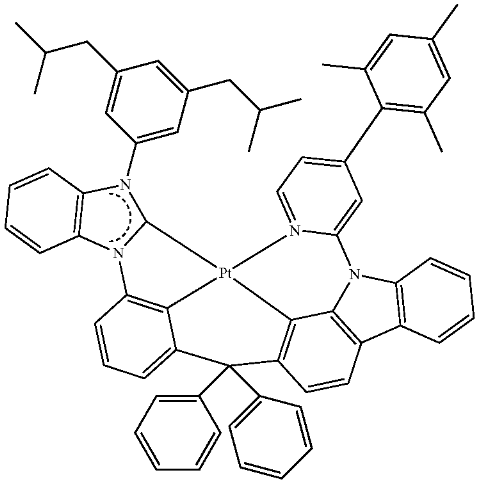
88
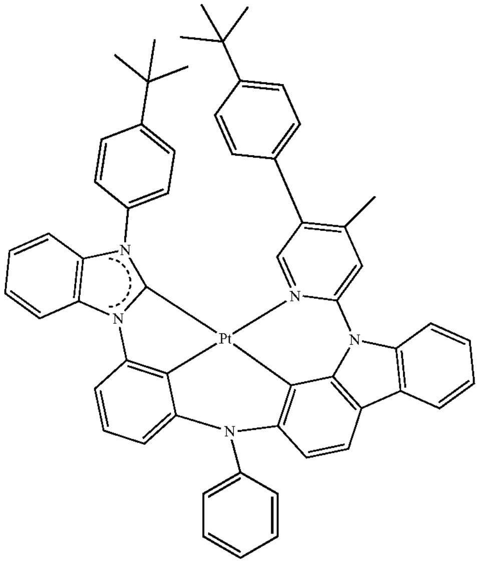
89
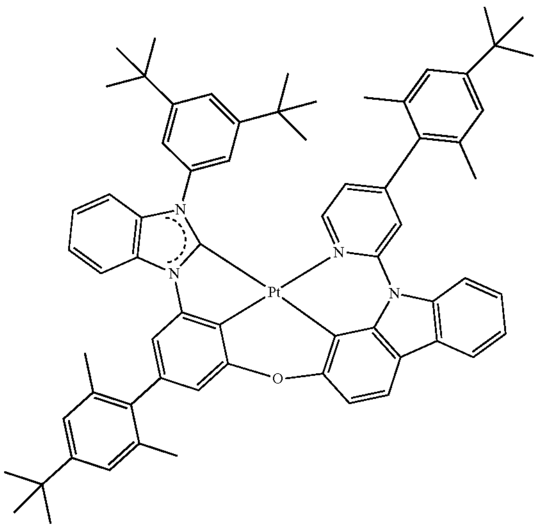

-continued
90
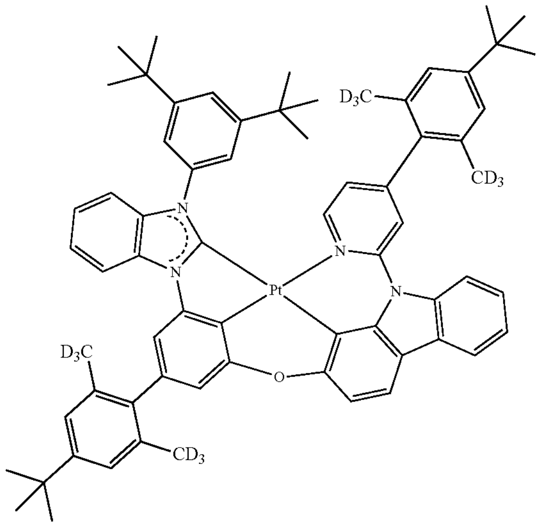
91
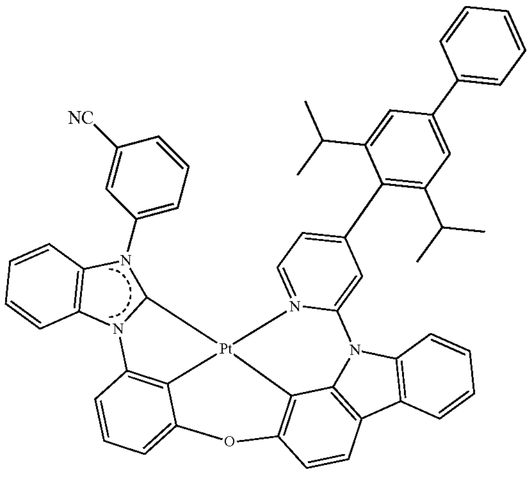
92
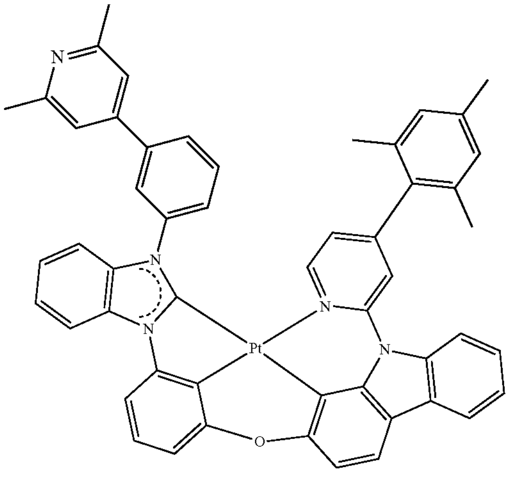
-continued
93
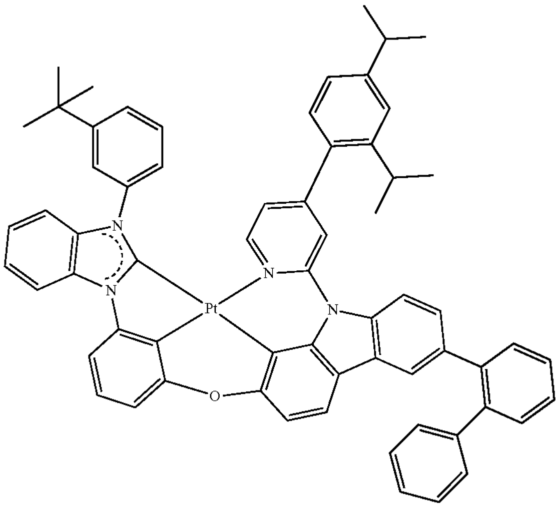
94
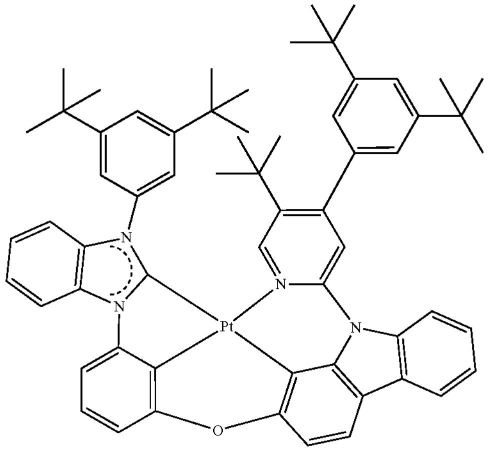
95
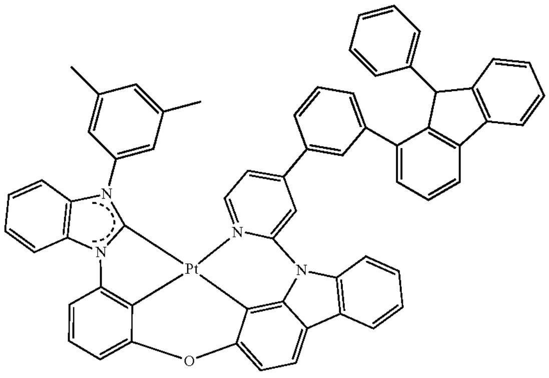

-continued
97
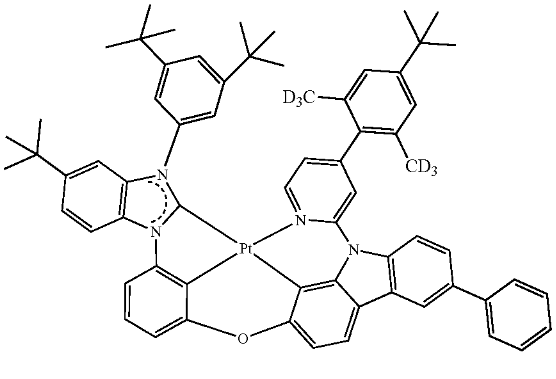
98
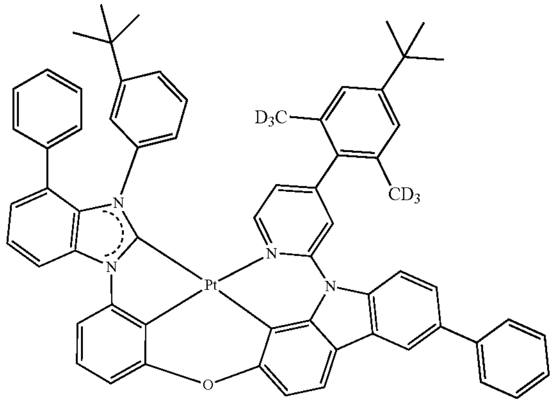
99
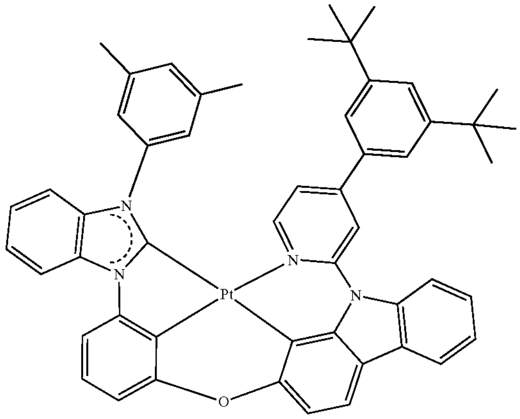
-continued
100
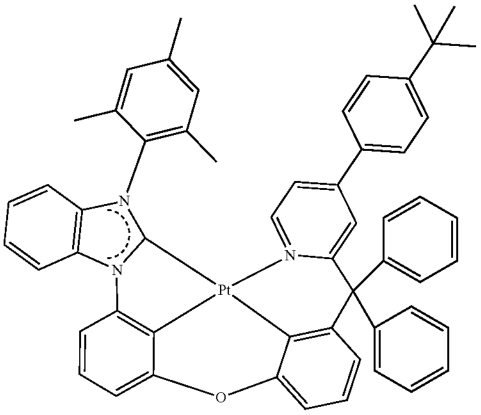
101
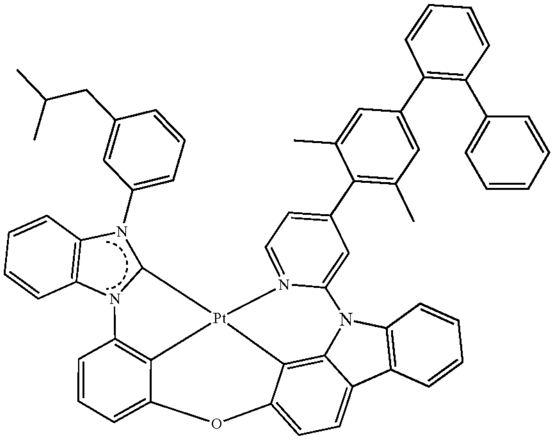
102
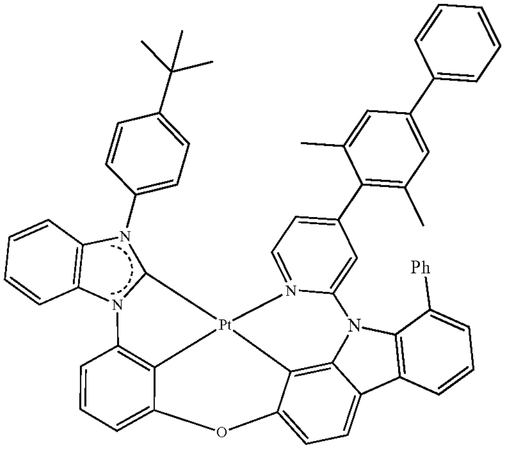

-continued
103
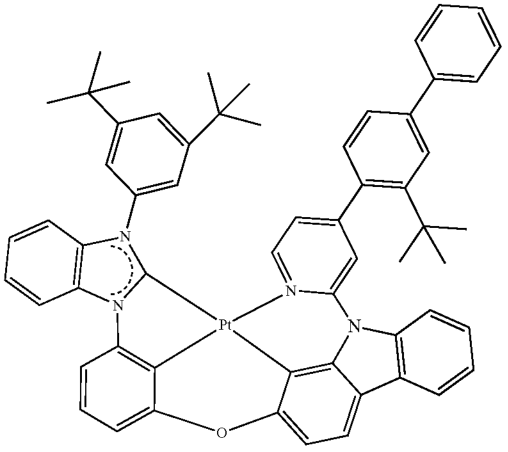
104
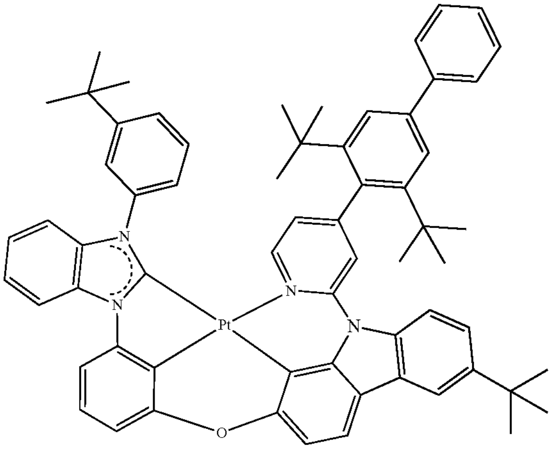
105
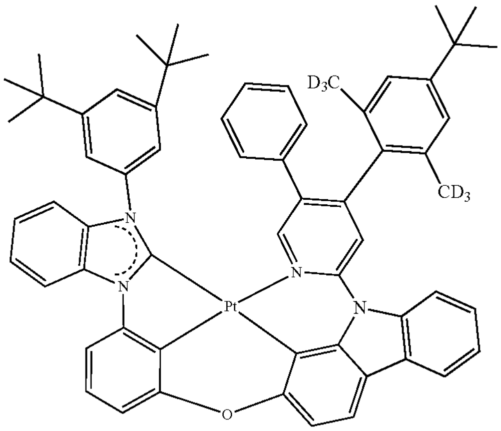
-continued
106
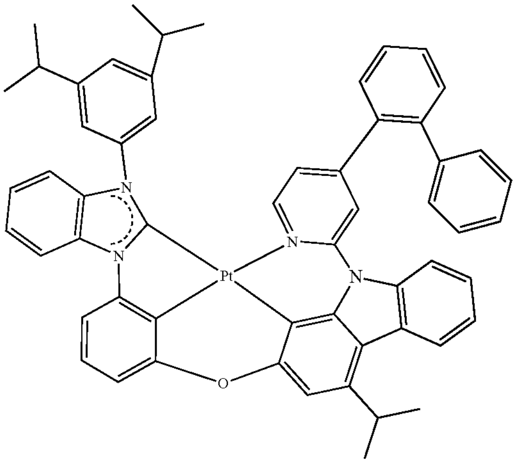
107
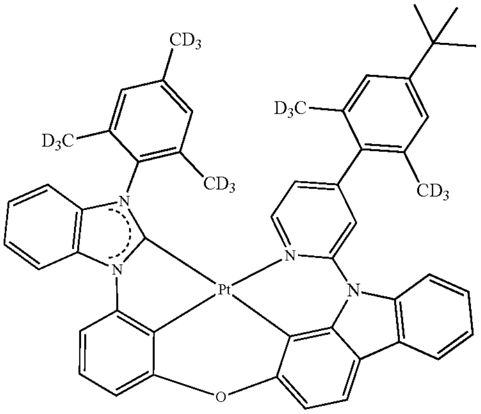
108
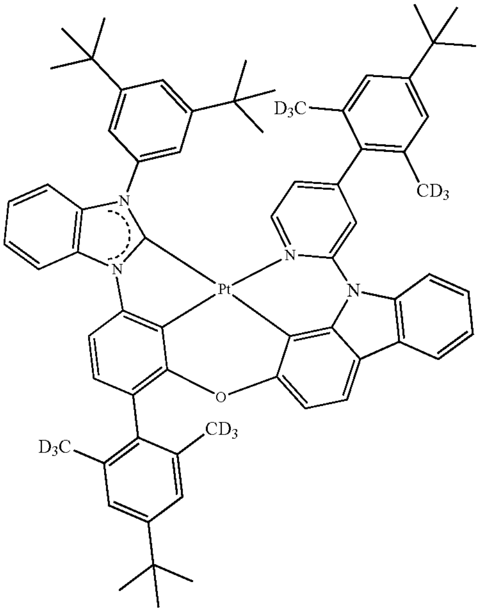

-continued
109
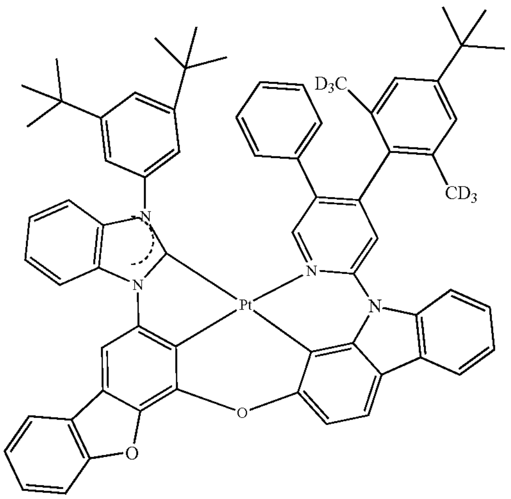
110
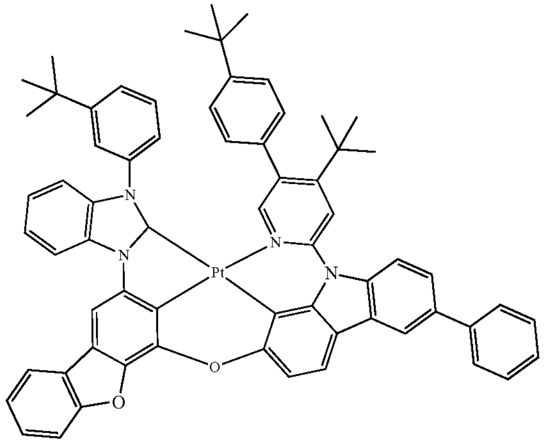
111
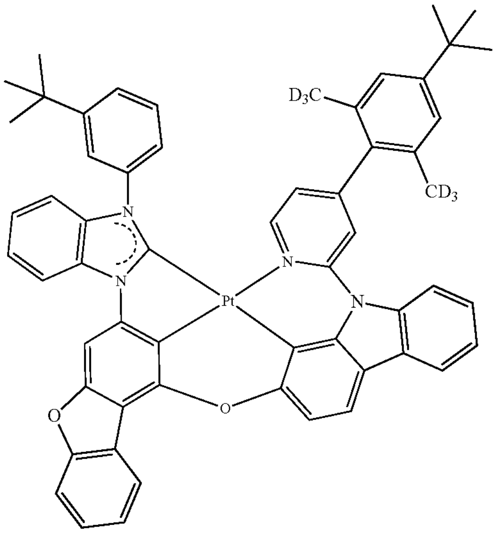
-continued
112
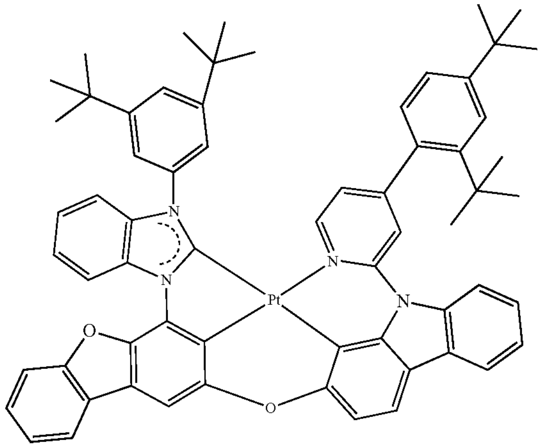
113
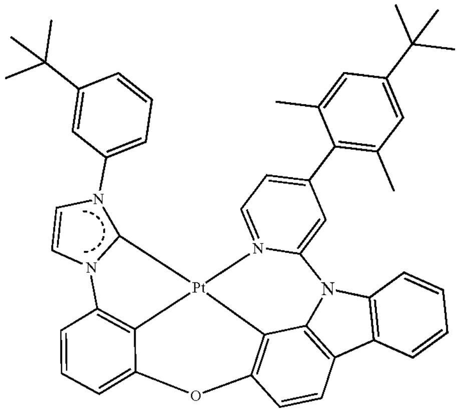
115
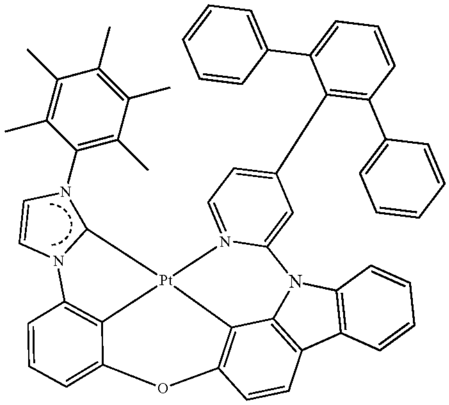

-continued
116
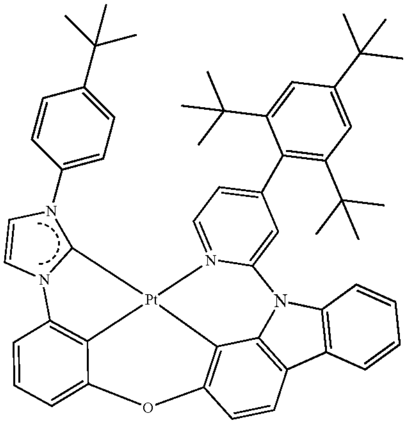
117
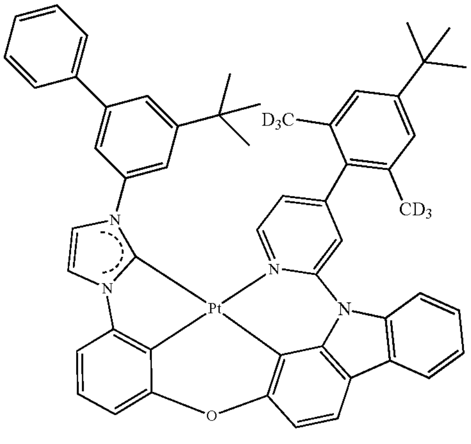
118
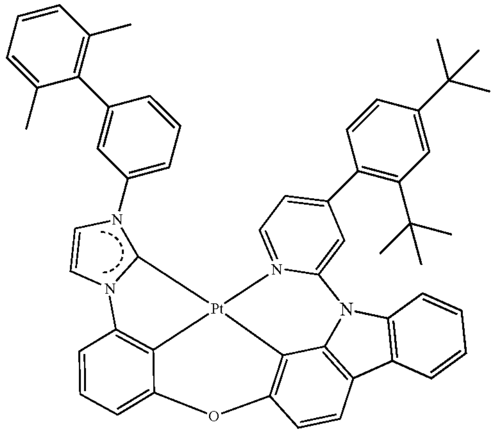
-continued
119
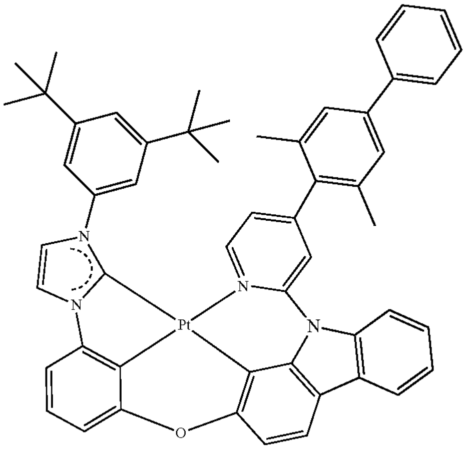
120
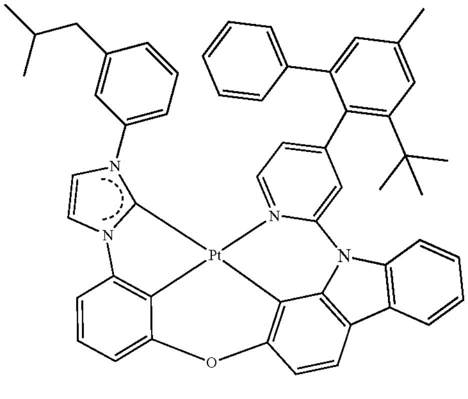

121
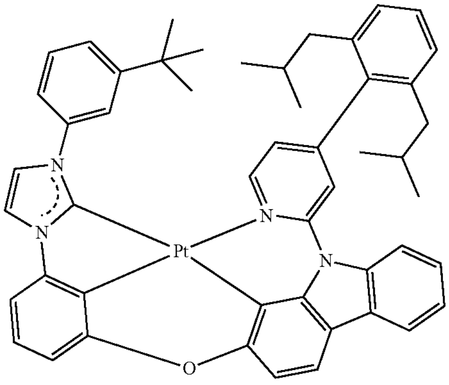
122
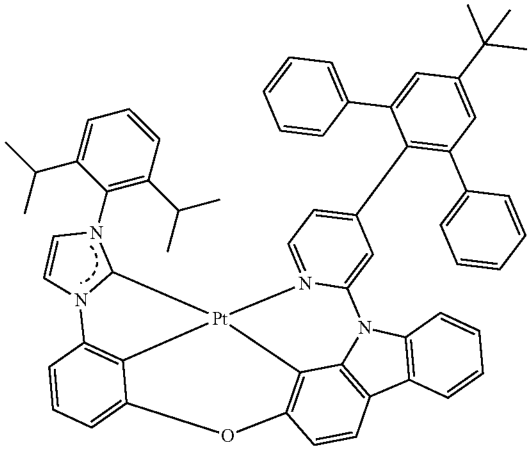
124
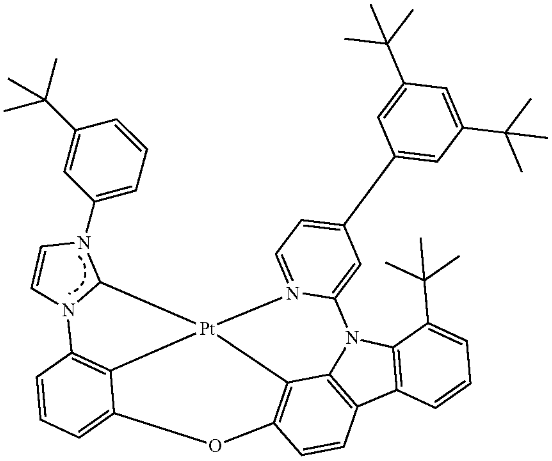
125
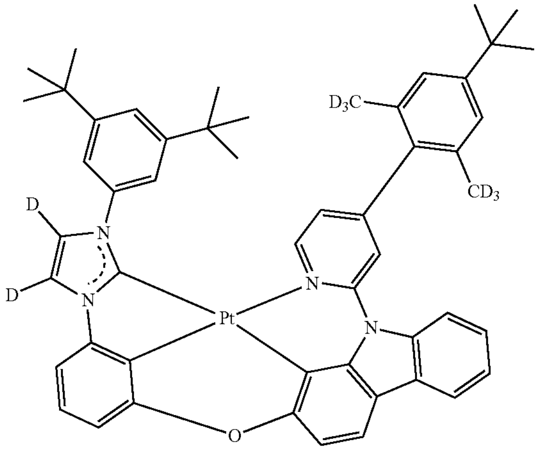
127
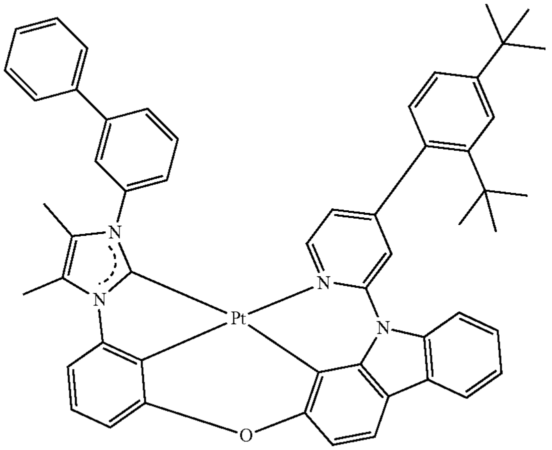
128
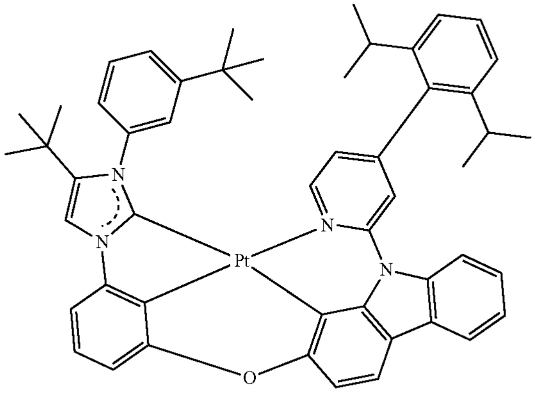

-continued
129
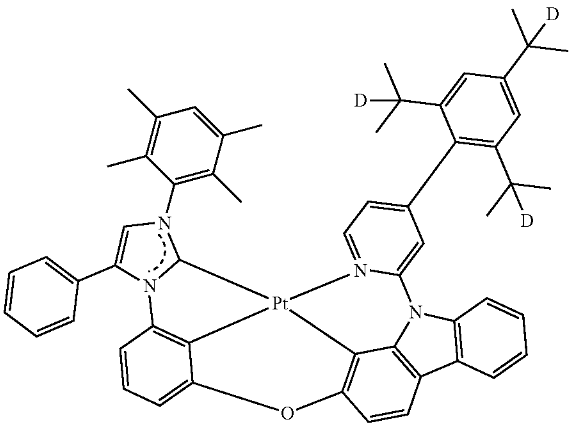
131
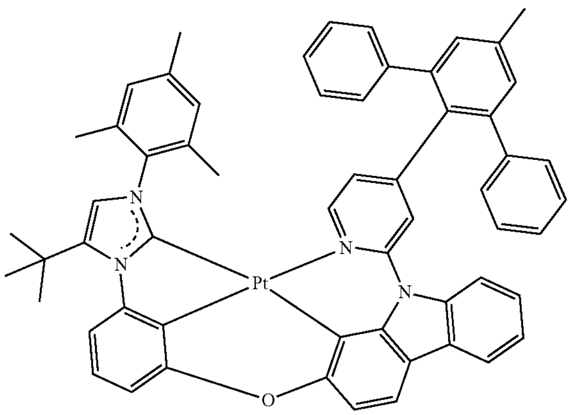
132
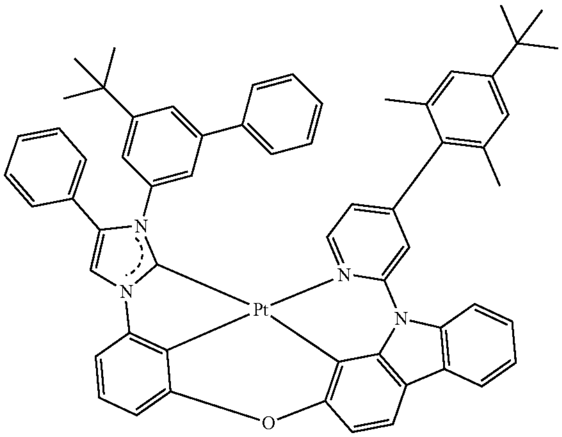
133
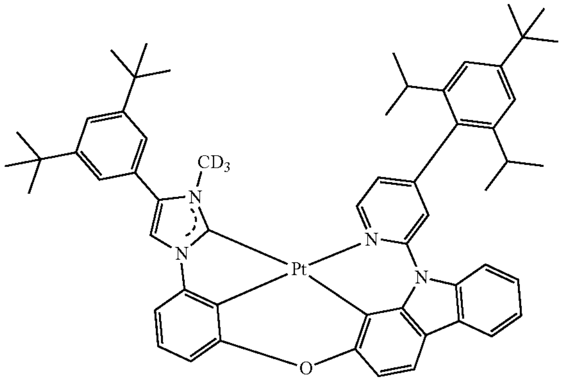
134
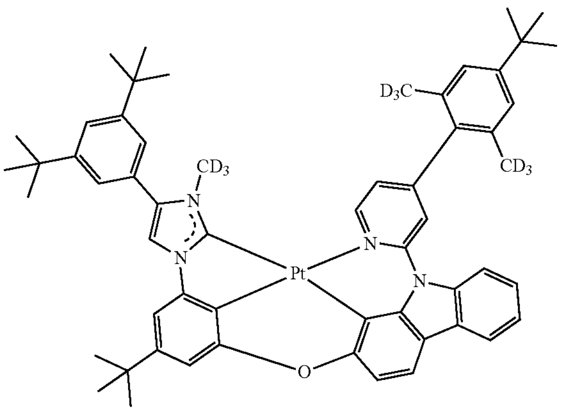
136
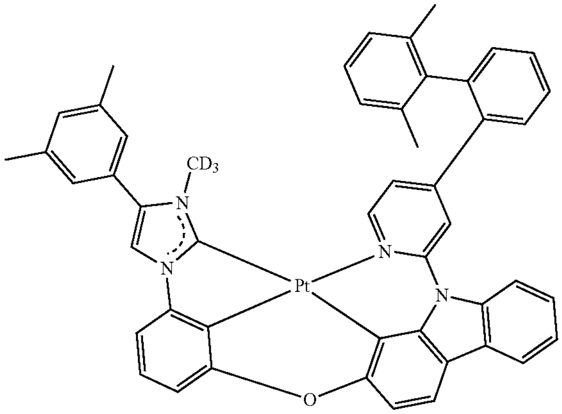

-continued
137
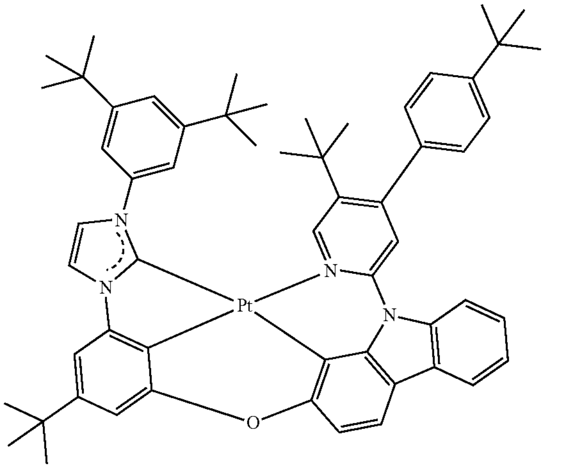
138
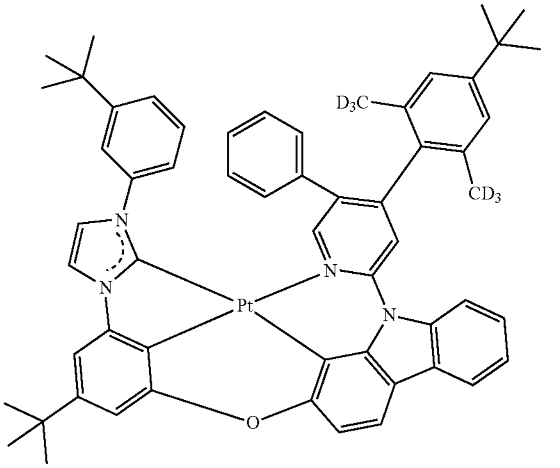
139
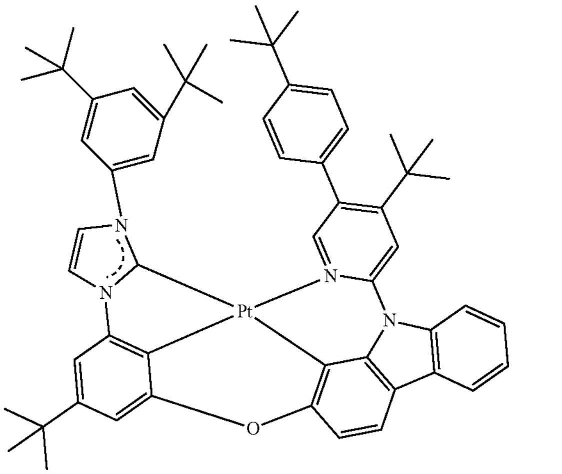
140
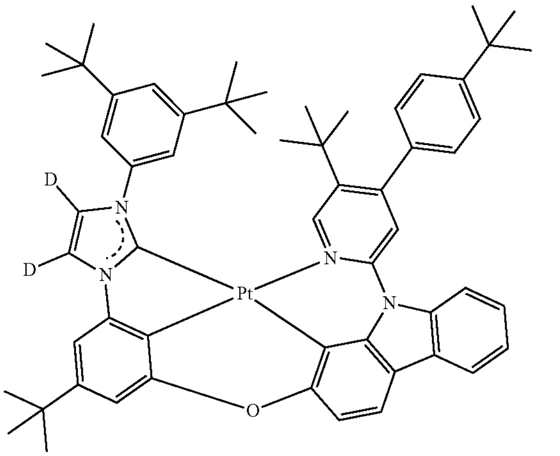
141
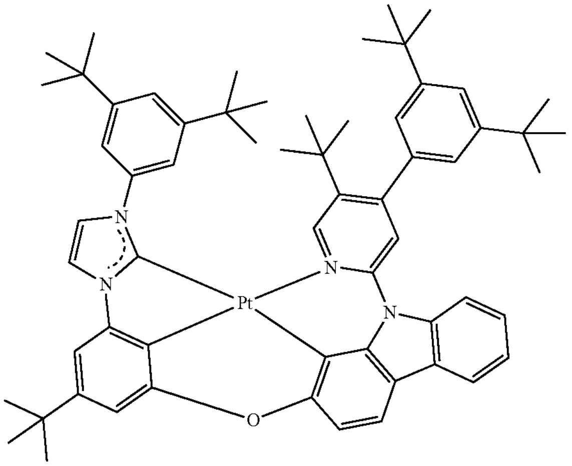
142
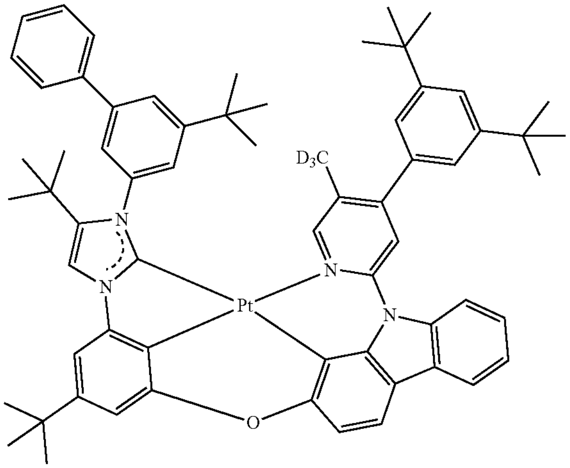

-continued
143
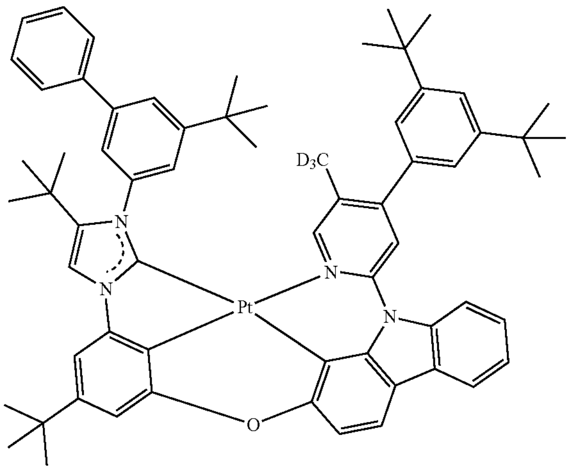
144
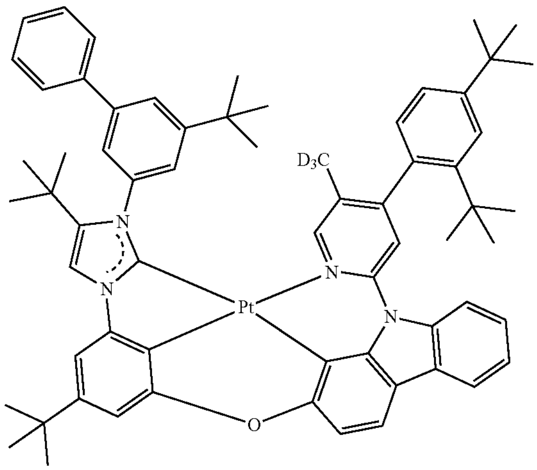
145
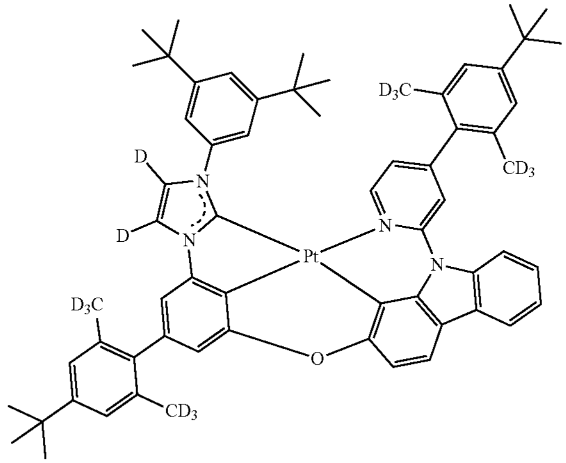
146
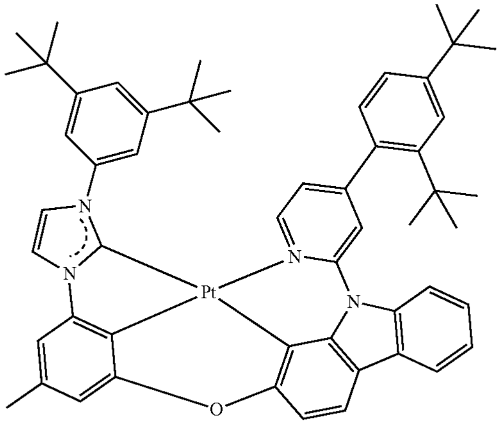
147
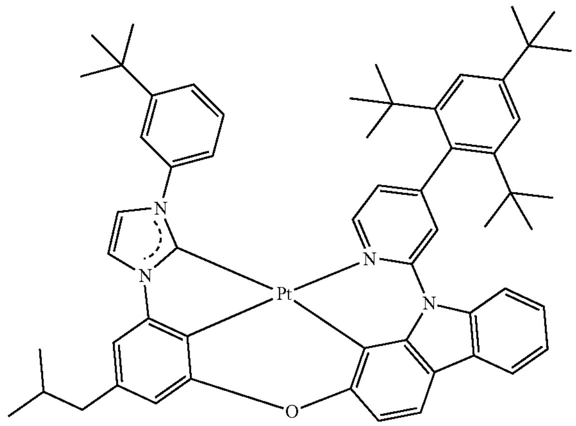
148
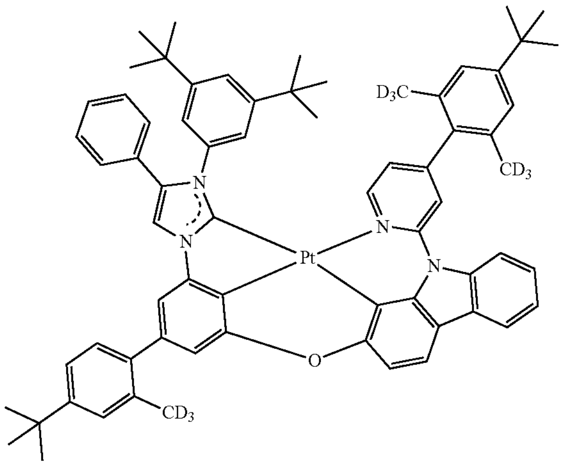

-continued
150
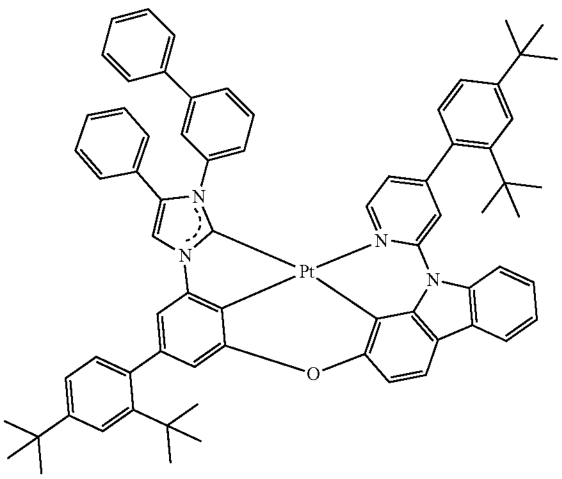
151
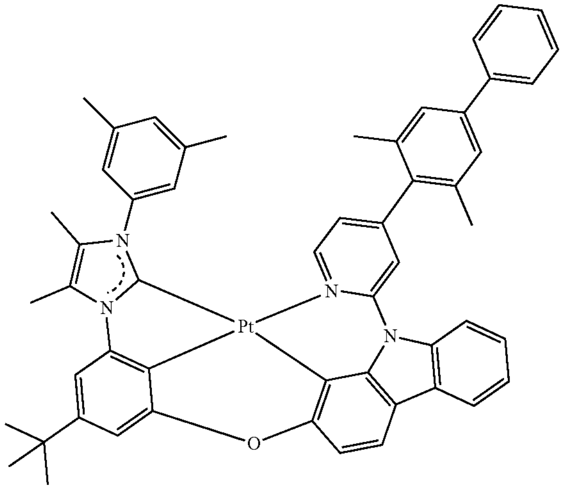
152
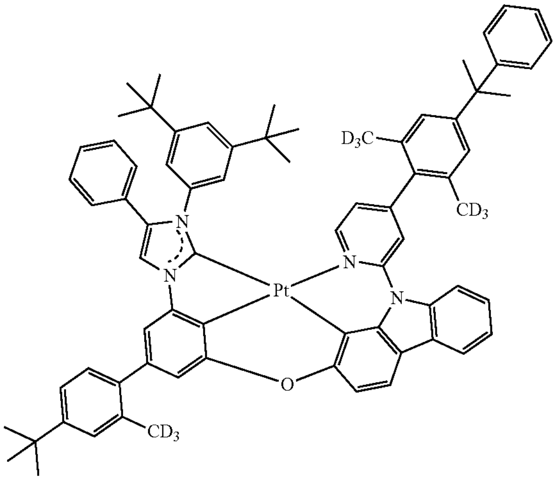
155
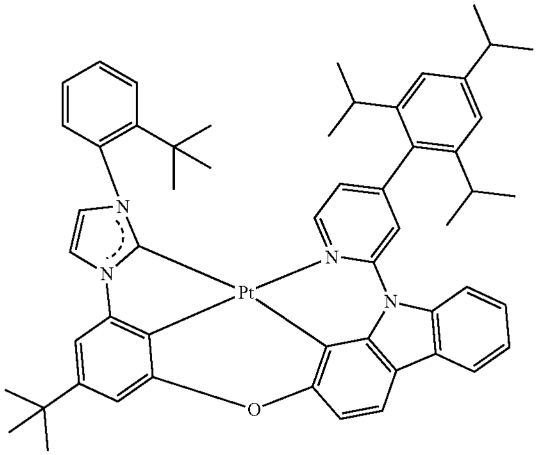
157
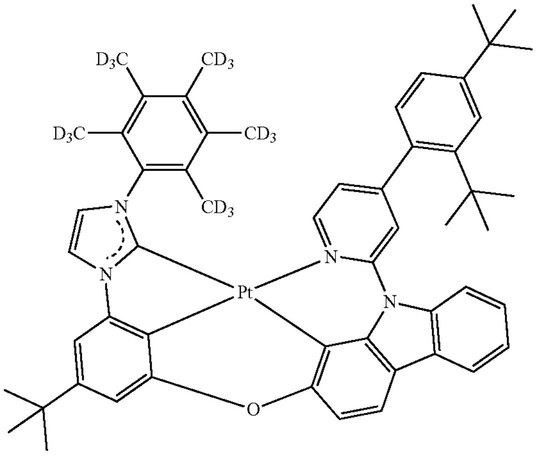
158
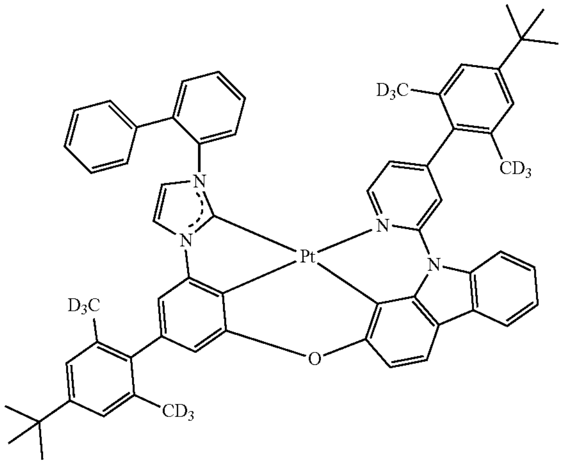

-continued
159
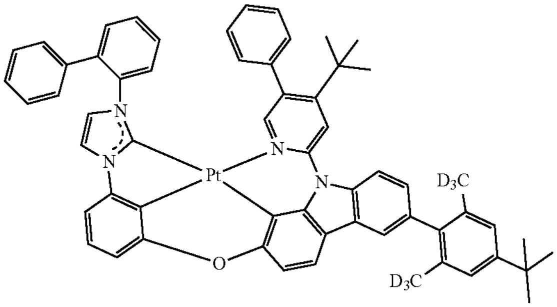
160
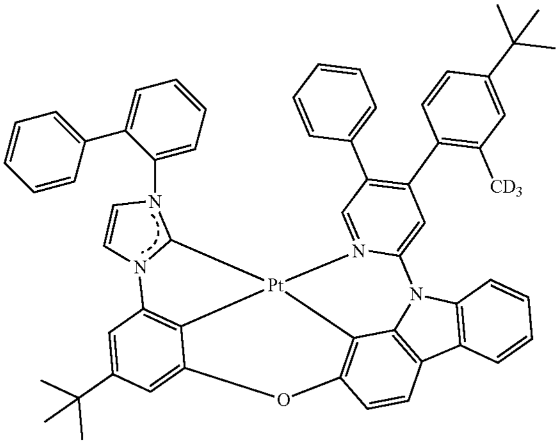
161
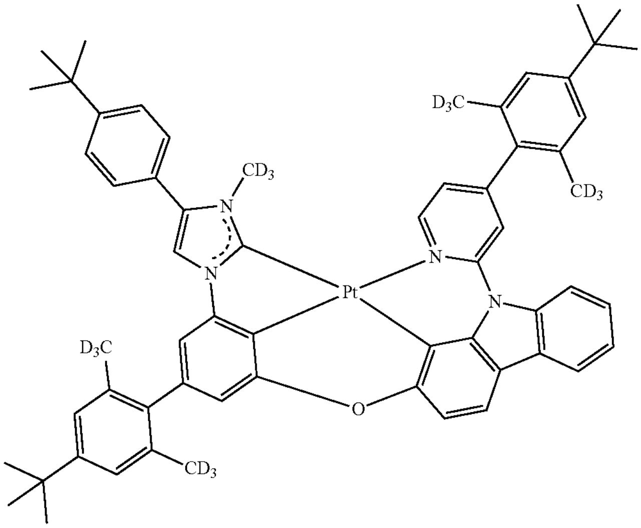
162
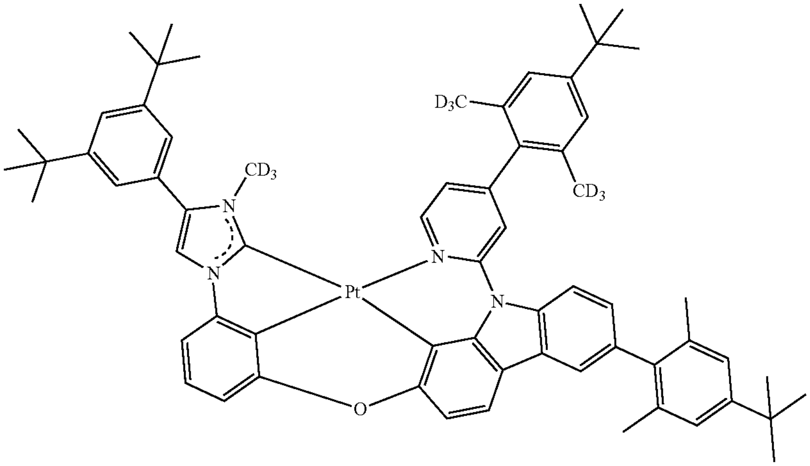

-continued
163
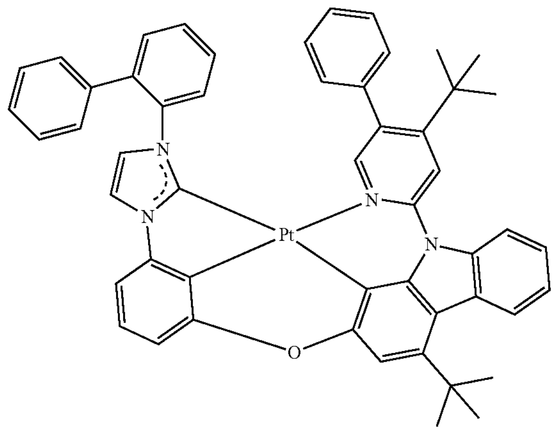
164
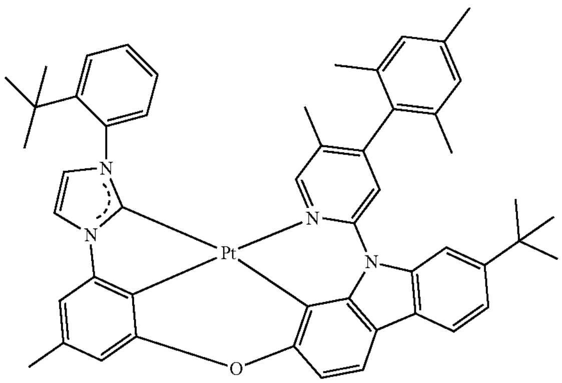
165
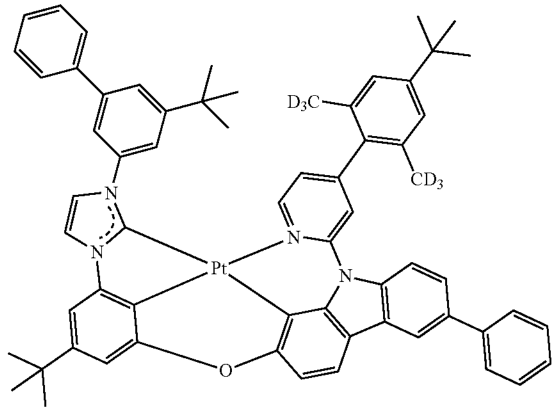
166
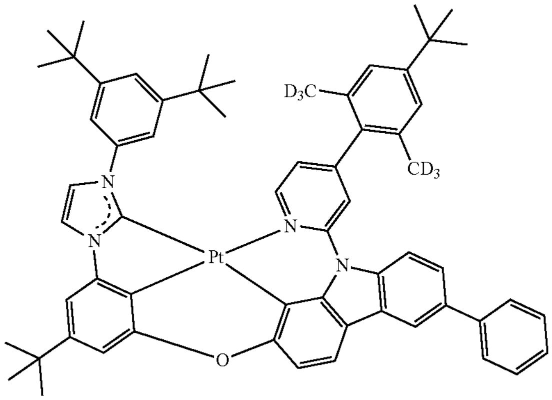
167
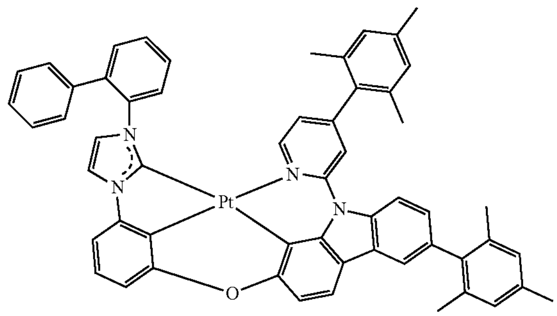
168
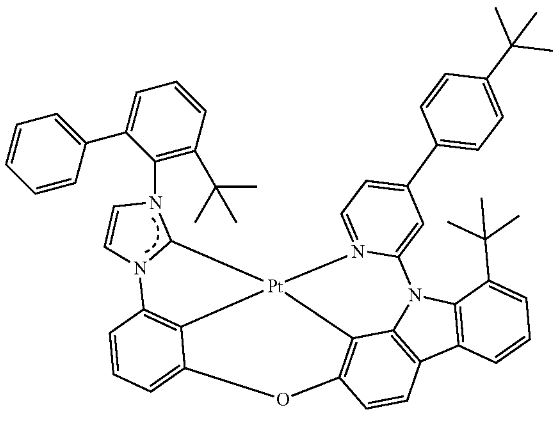

-continued
169
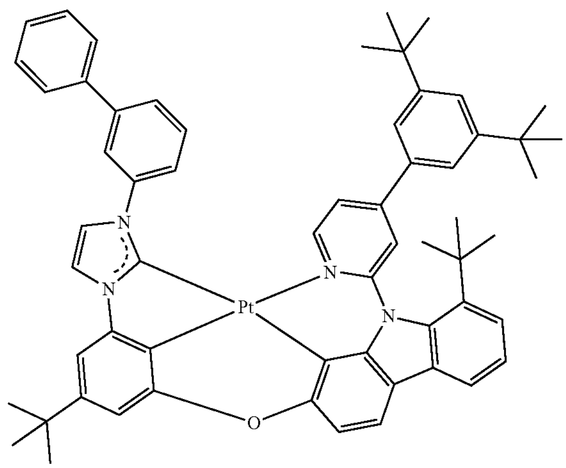
170
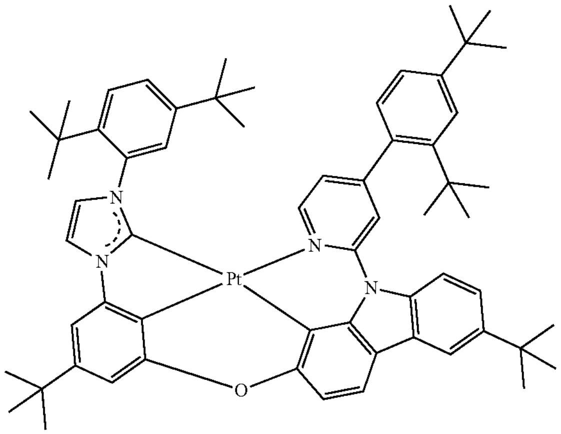
172
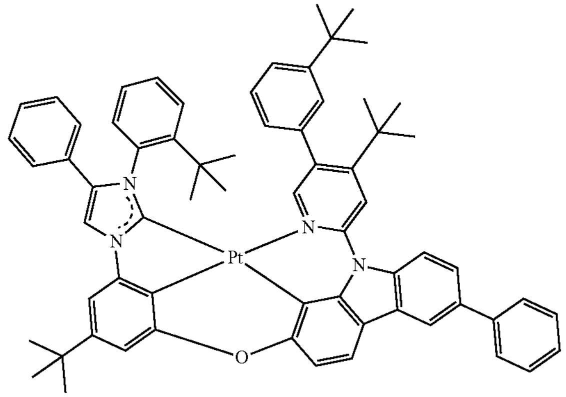
173
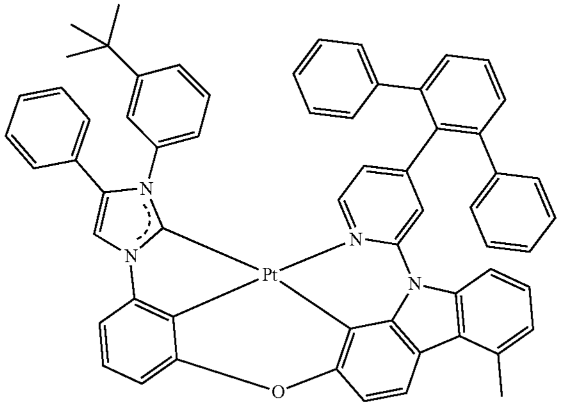
174
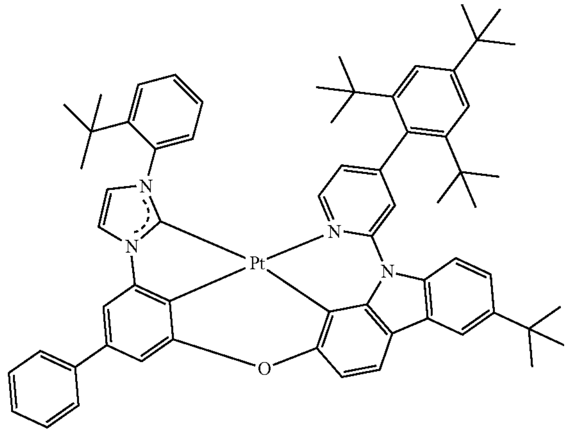
176
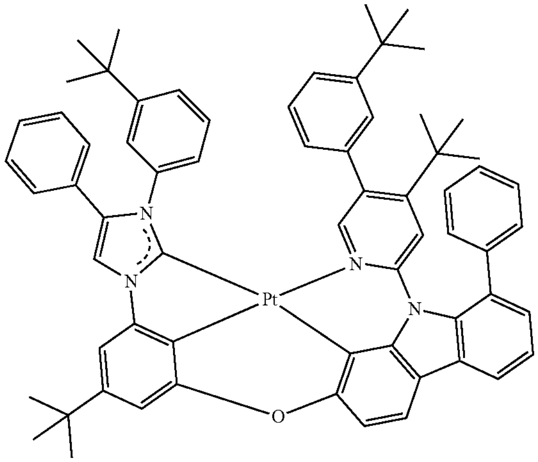

-continued
177
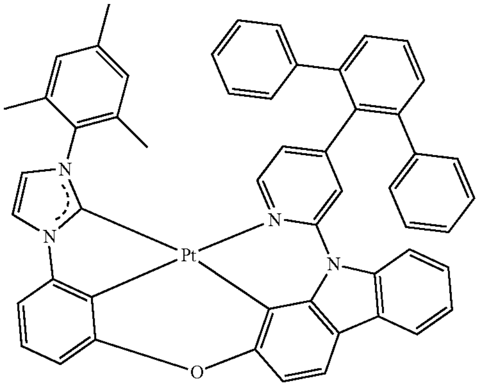
178
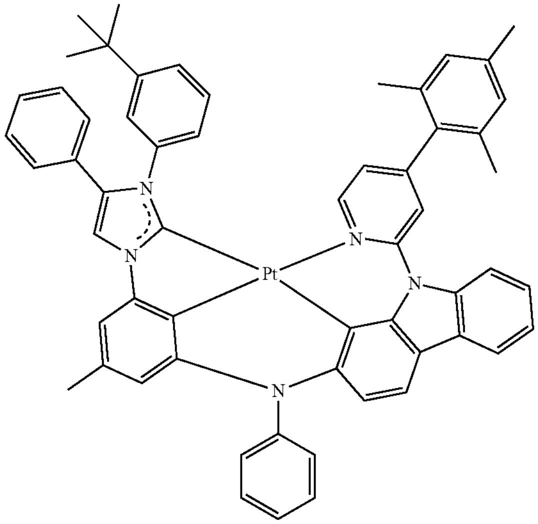
179
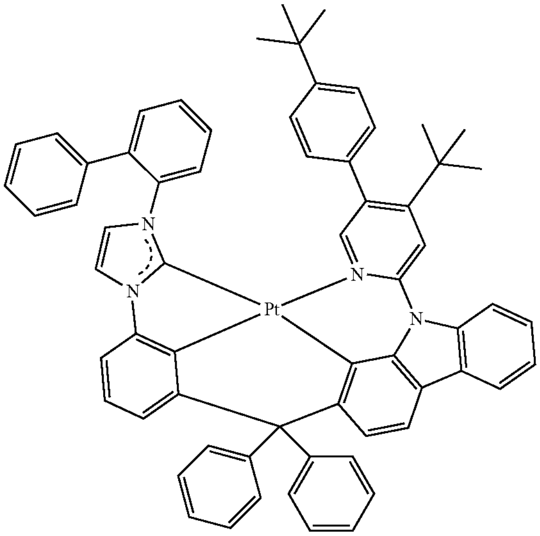
180
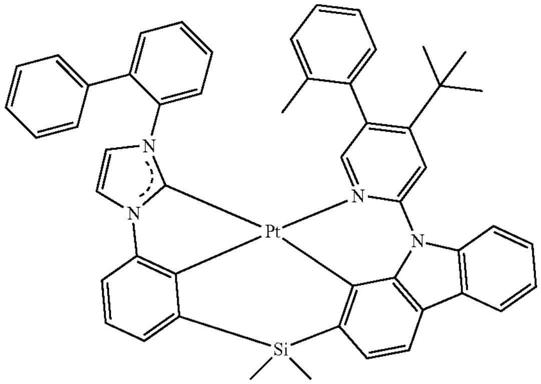
181
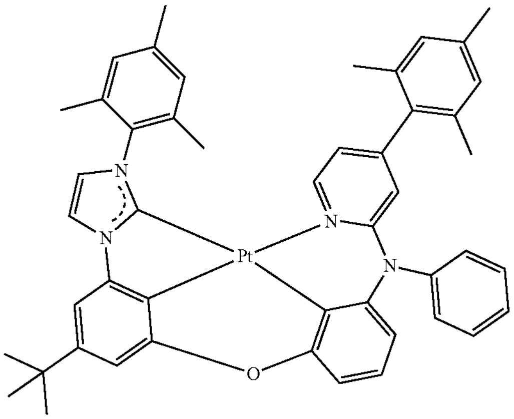
182
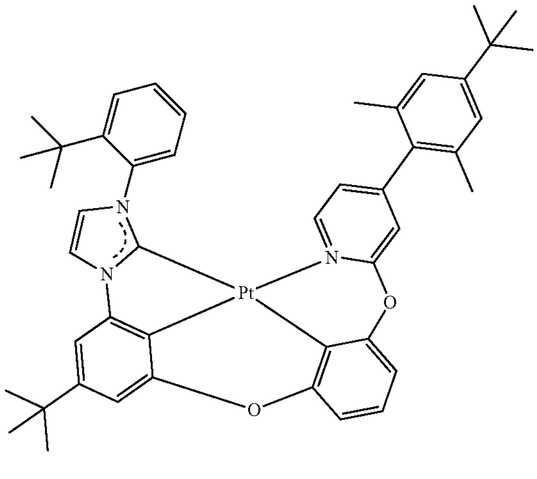

-continued
184
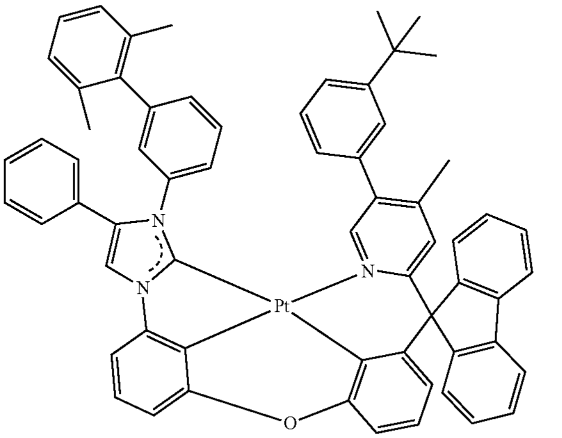
185
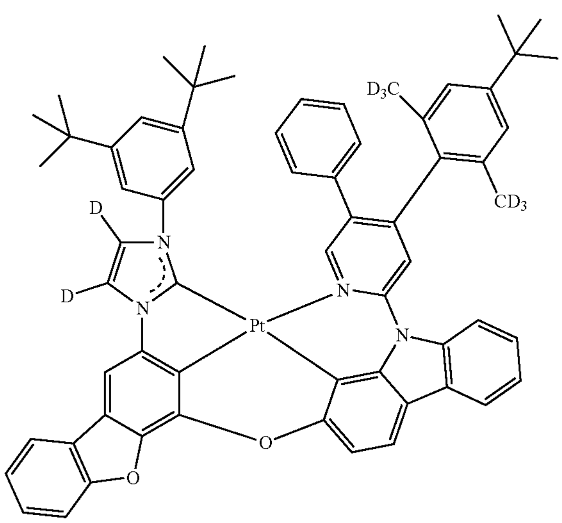
186
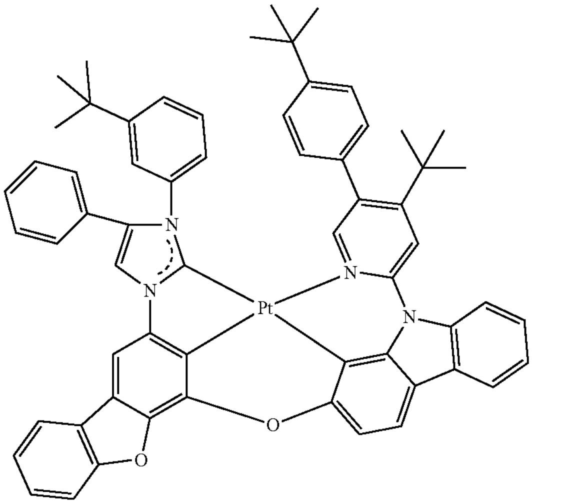
187
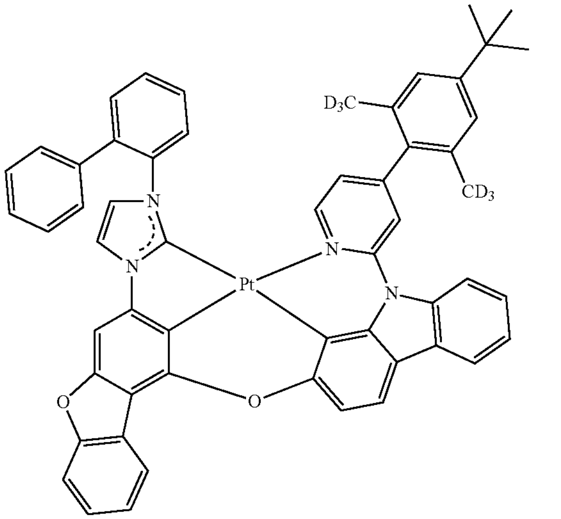
188
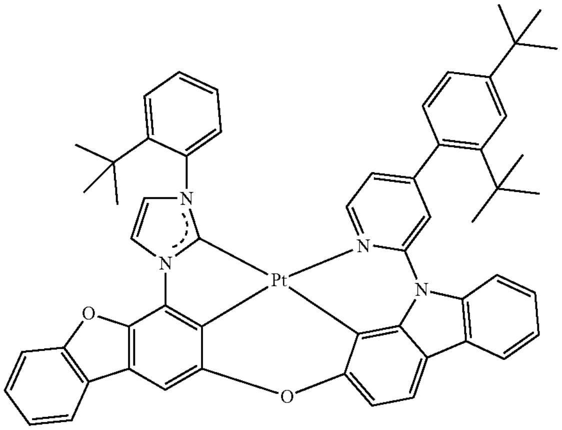
189
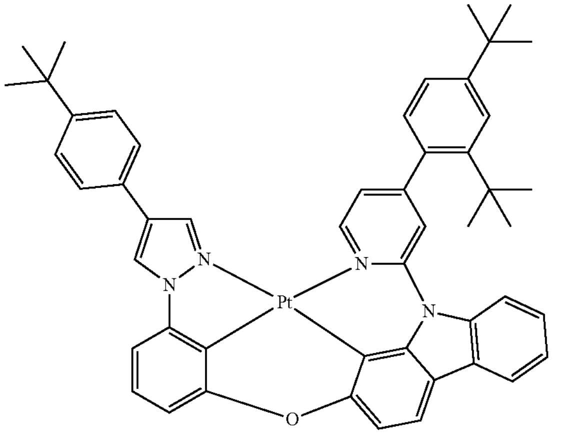

-continued
192
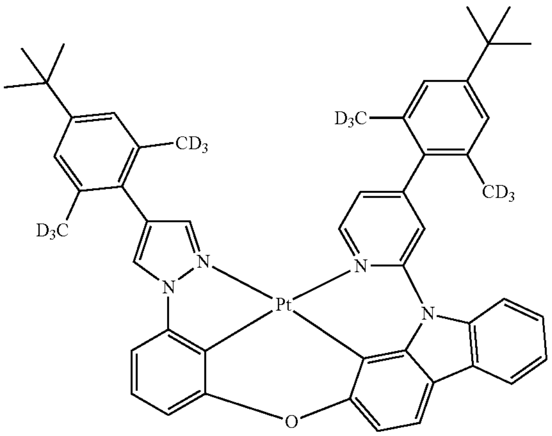
193
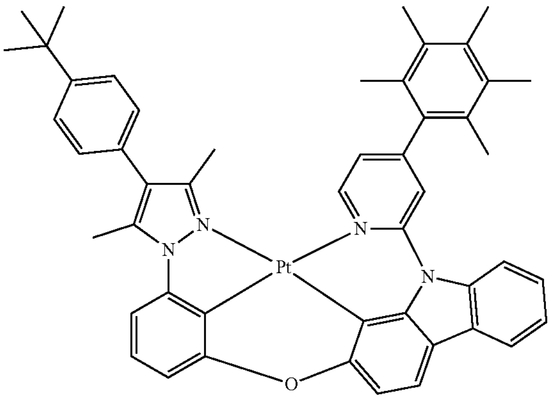
194
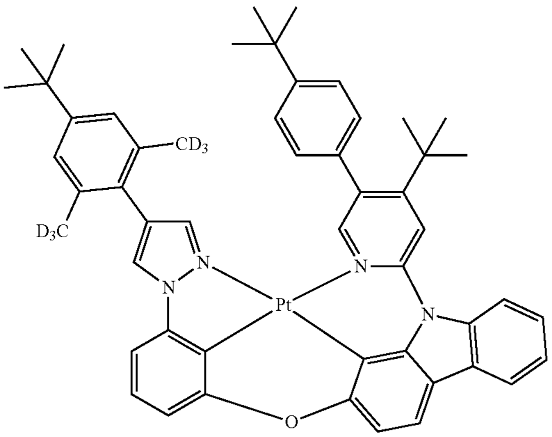
195
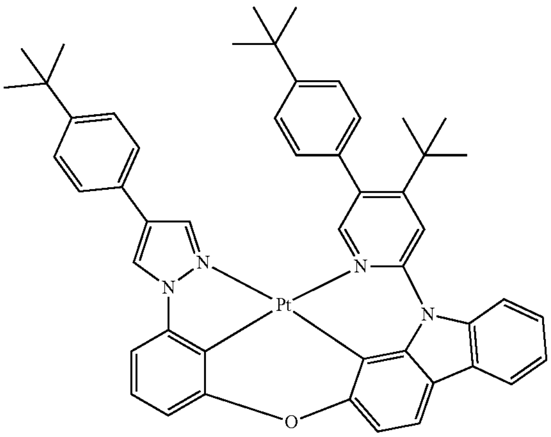
196
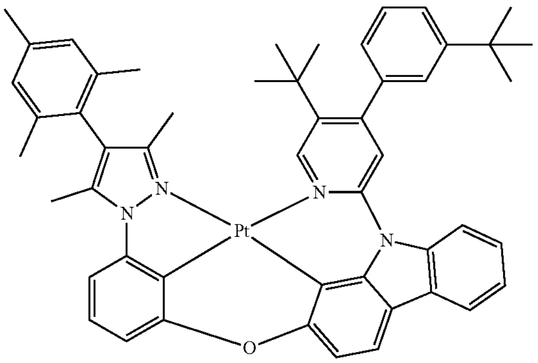
197
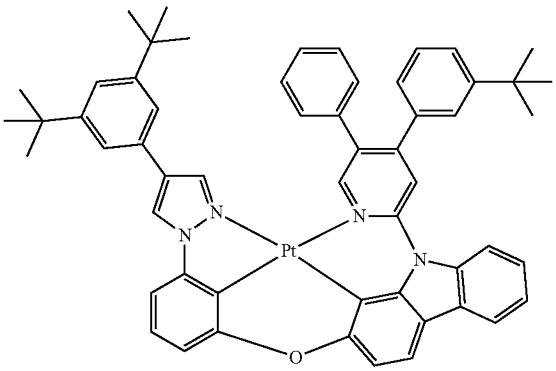

-continued
198
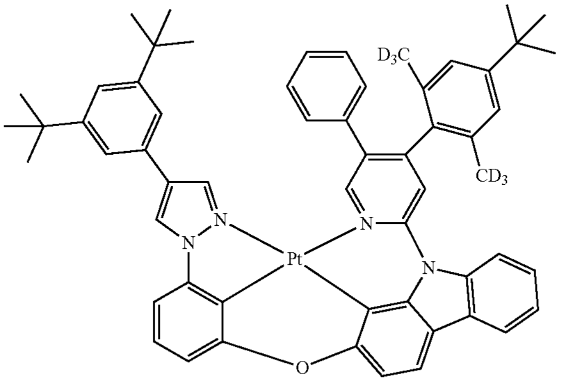
199
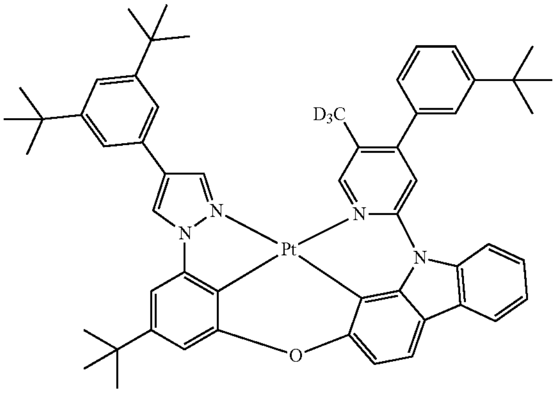
200
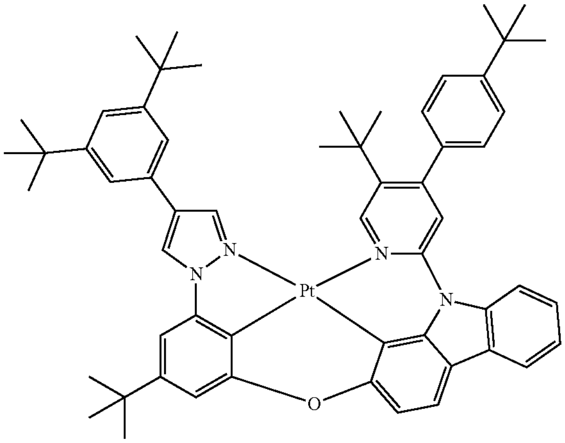
203
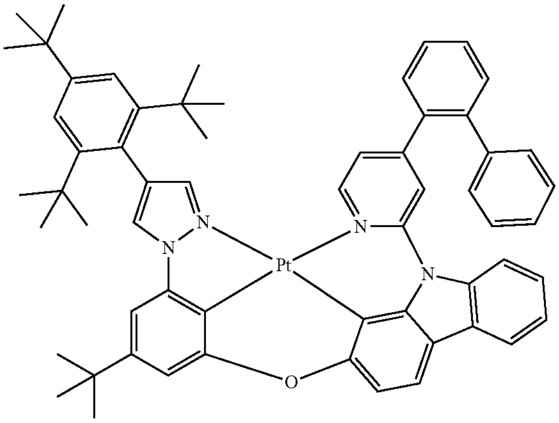
204
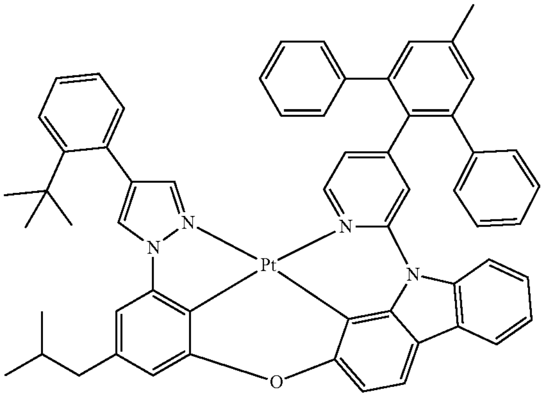
205
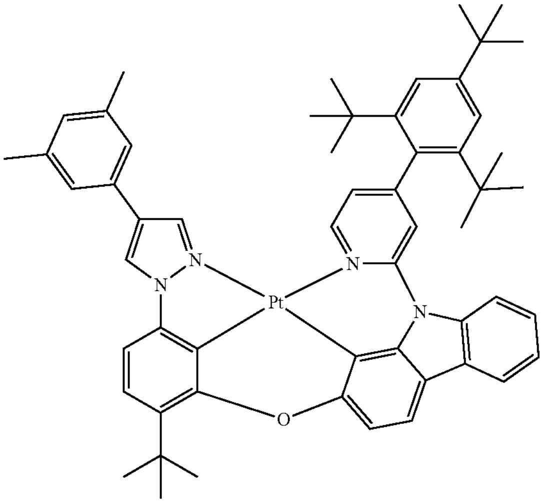

-continued
206
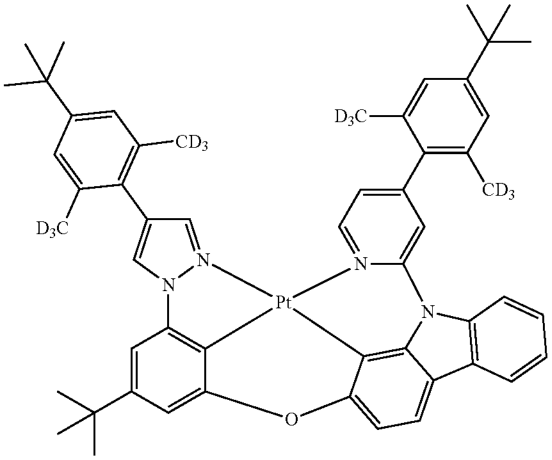
207
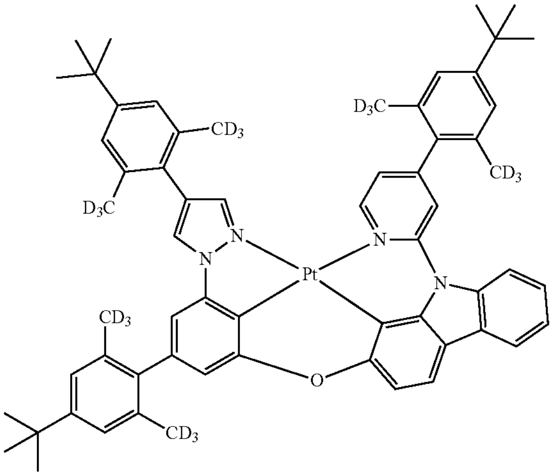
208
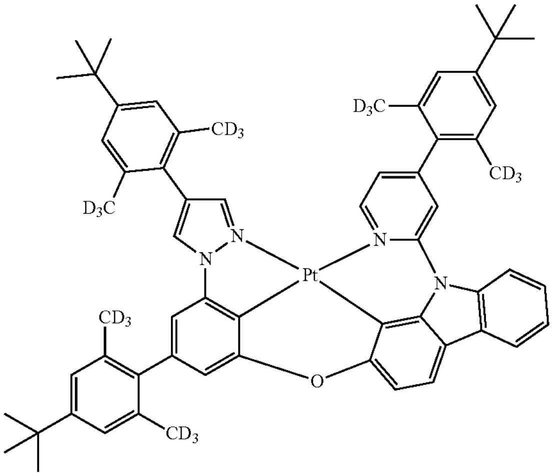
209
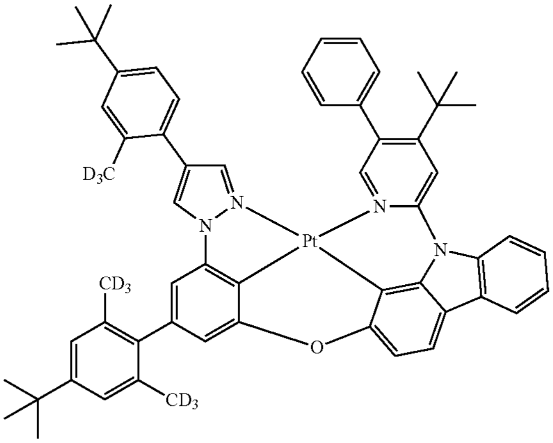
210
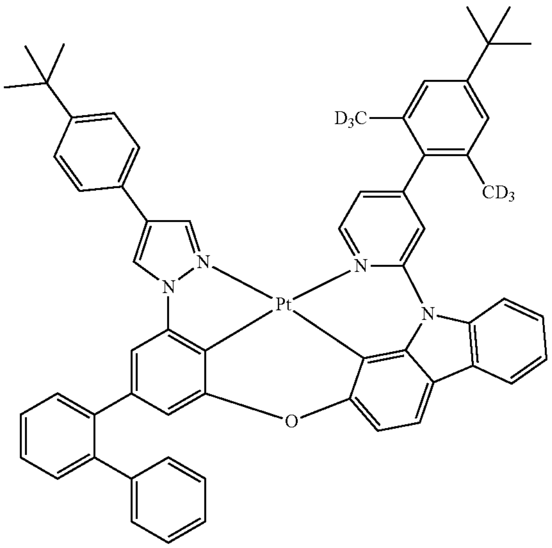
211
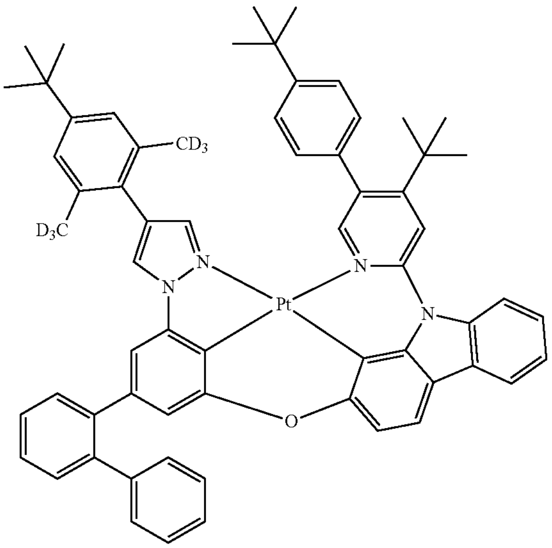

-continued
212
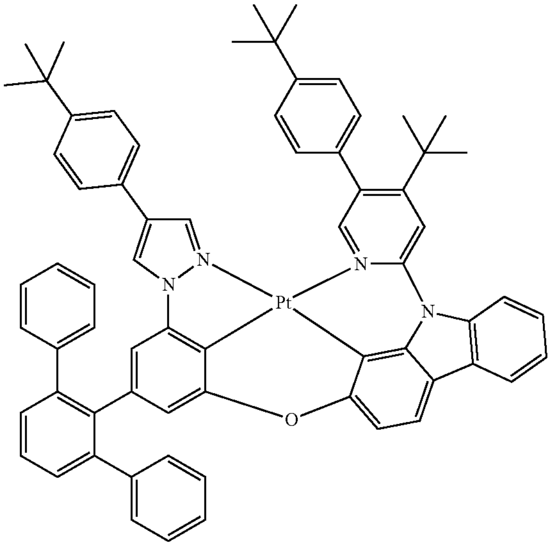
213
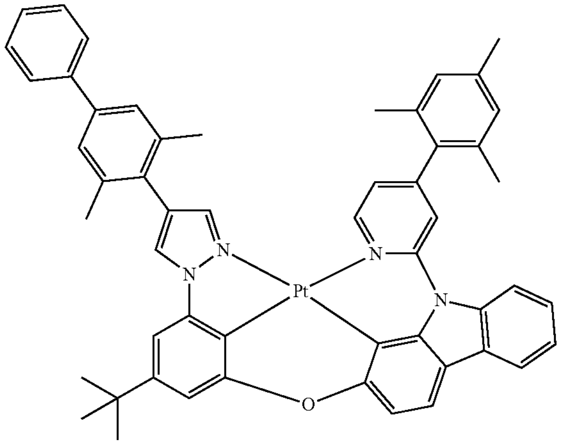
214
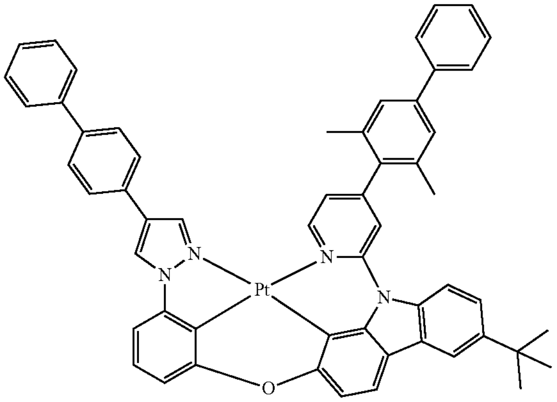
215
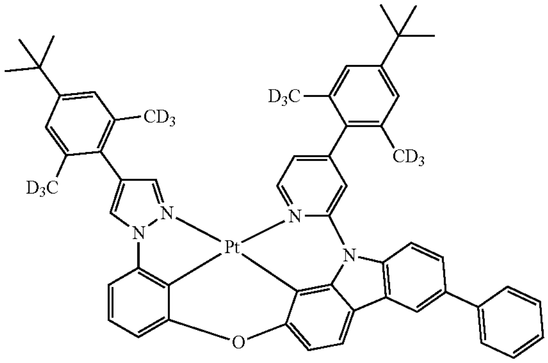
216
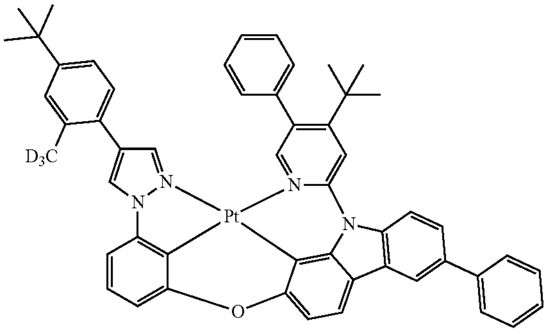
217
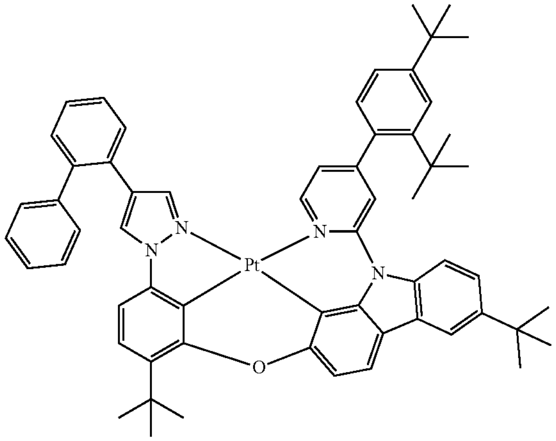

-continued
218
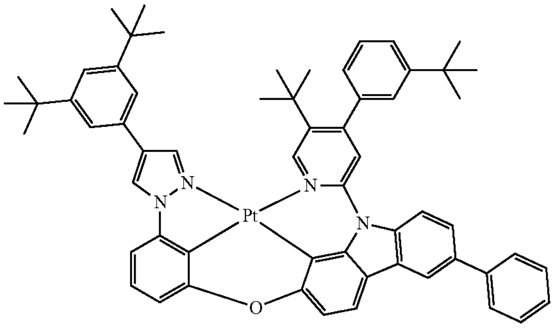
219
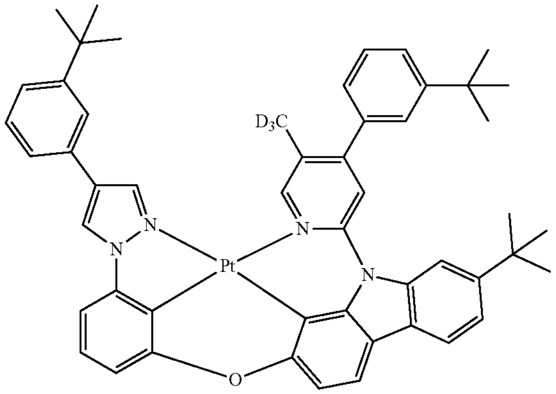
220
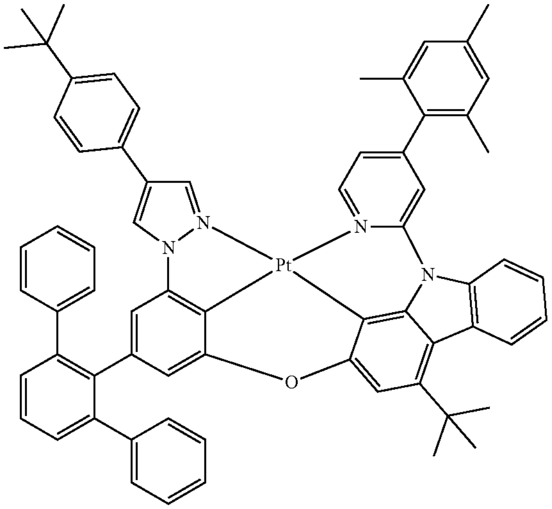
221
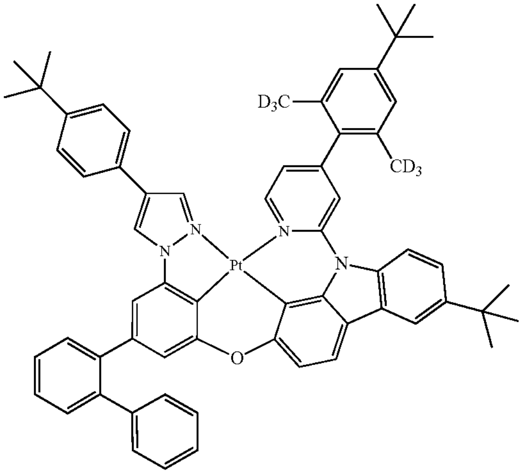
222
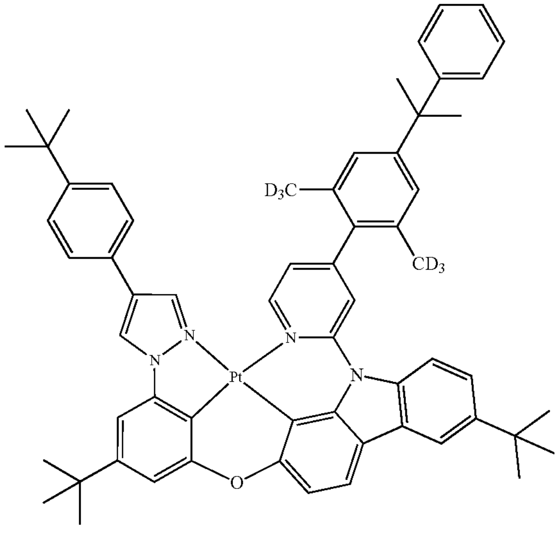

-continued
223
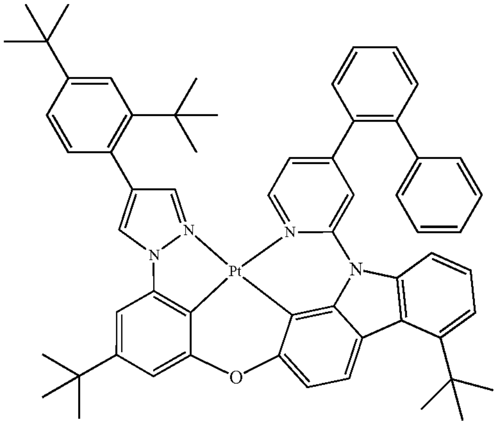
224
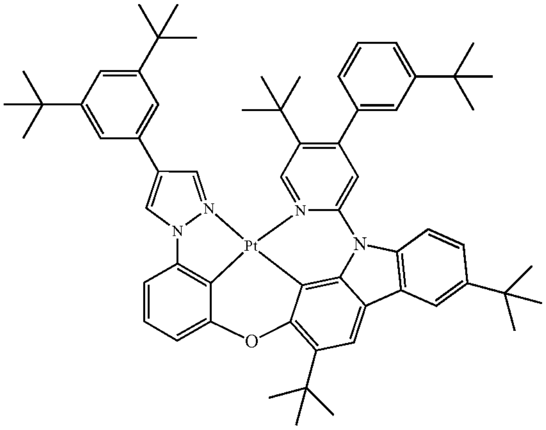
225
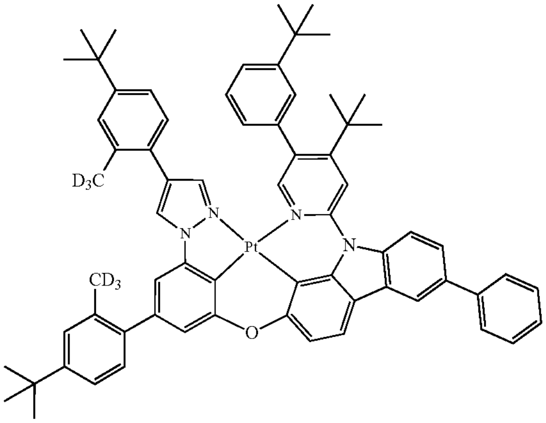
226
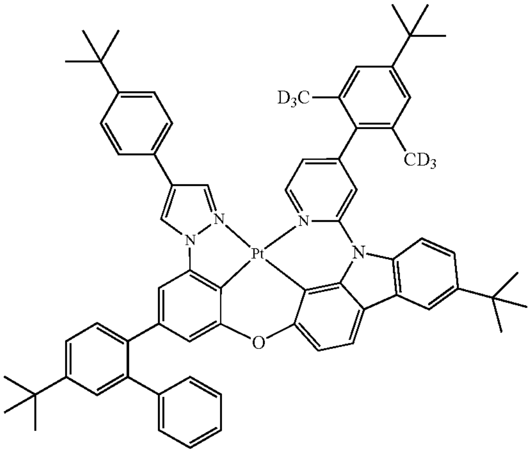
227
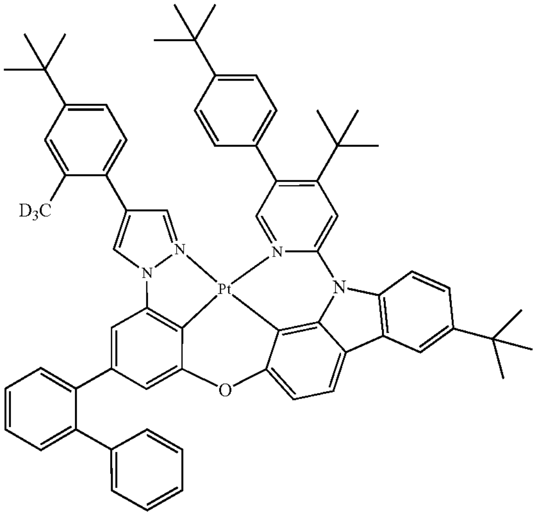
228
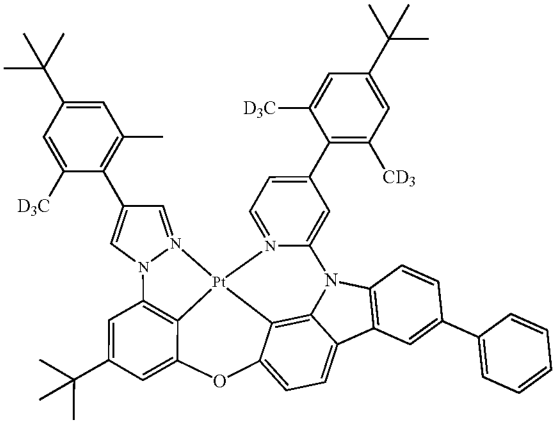

-continued
229
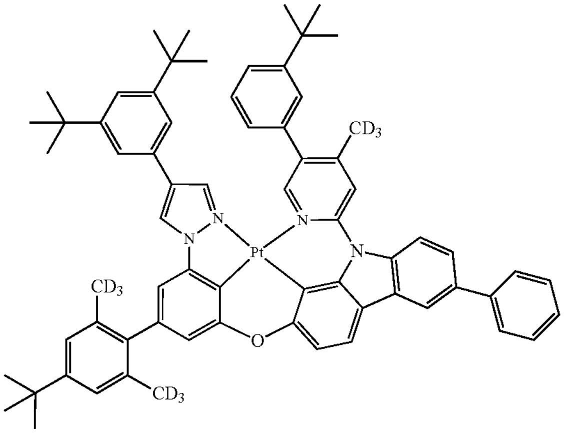
230
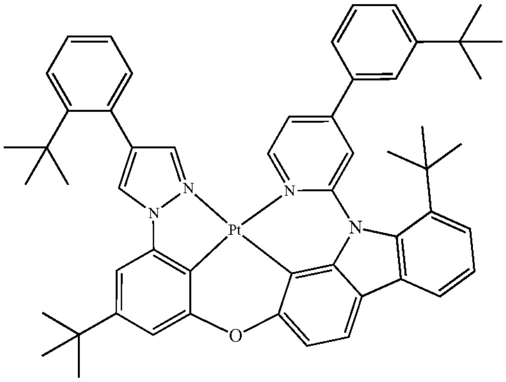
231
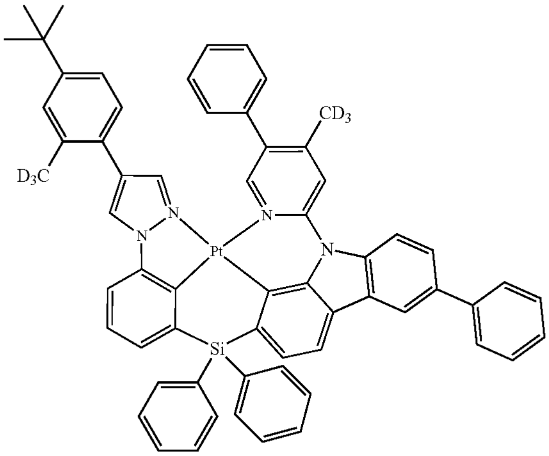
232
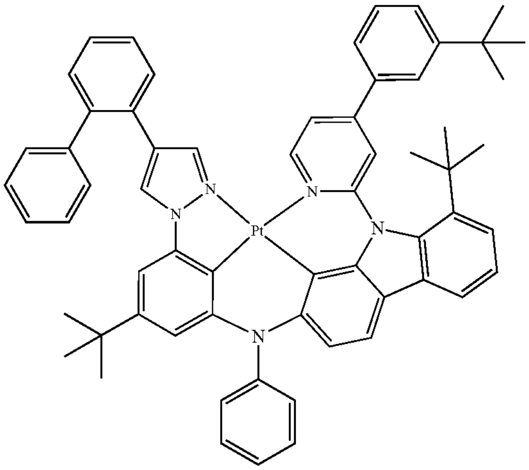
233
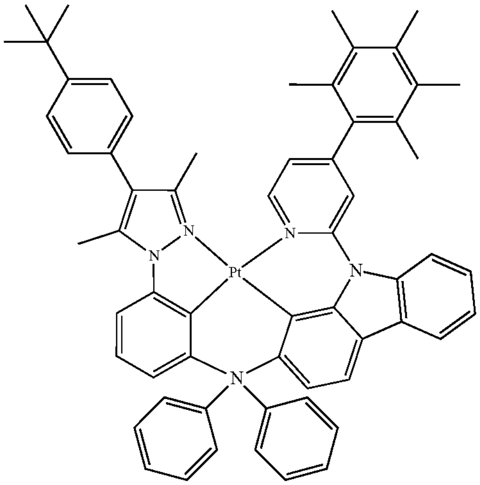
234
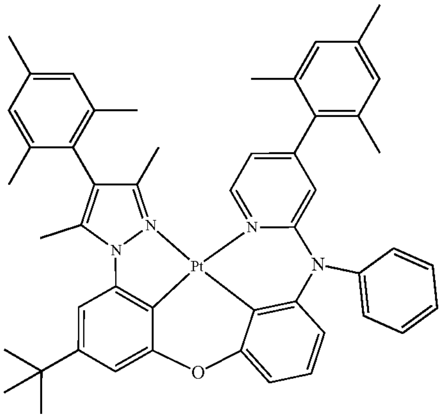

-continued
235
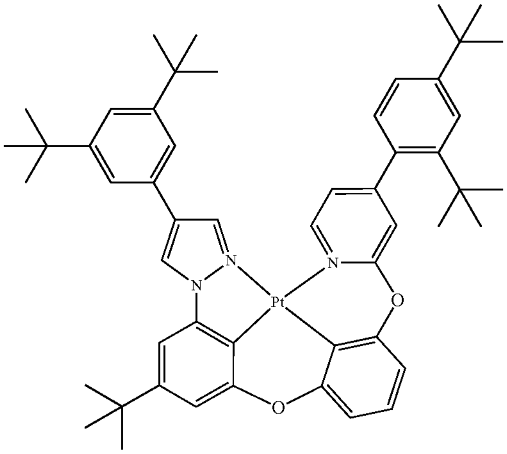
236
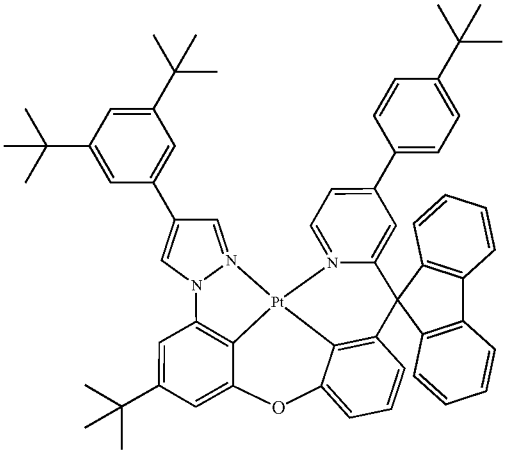
237
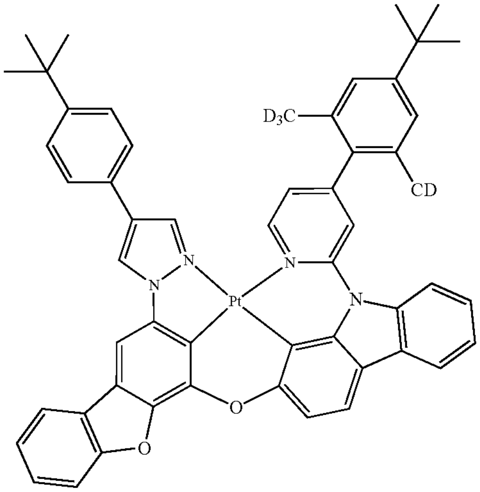
238
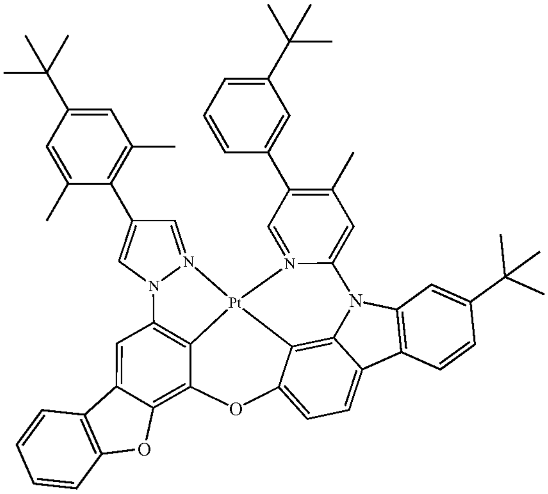
240
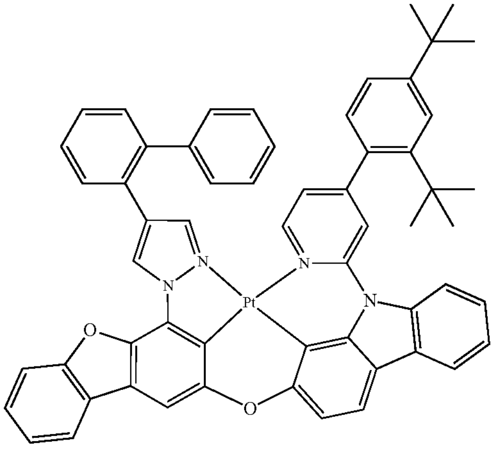

-continued
241
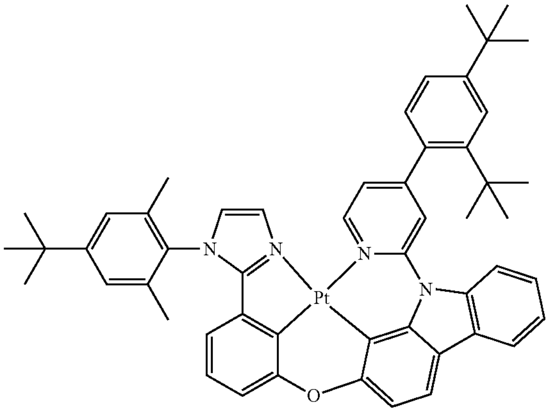
242
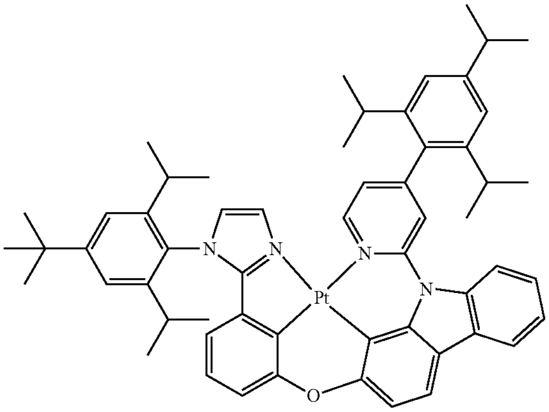
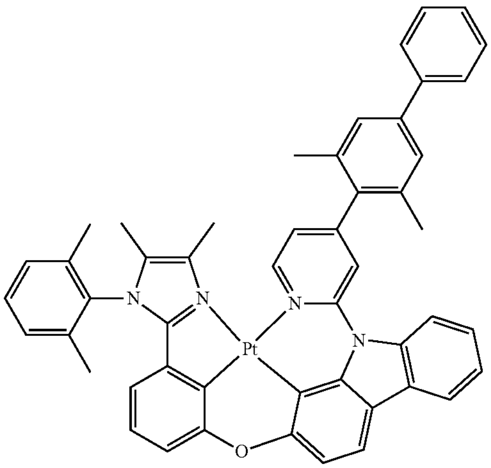
244
245
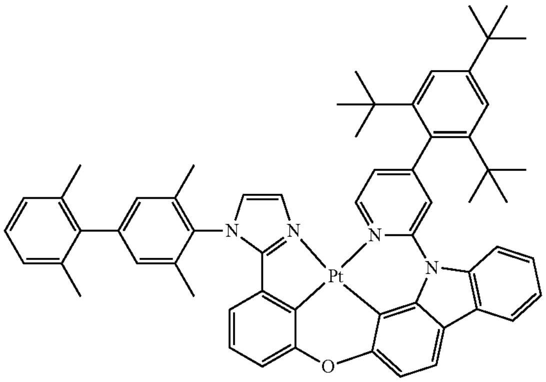
246
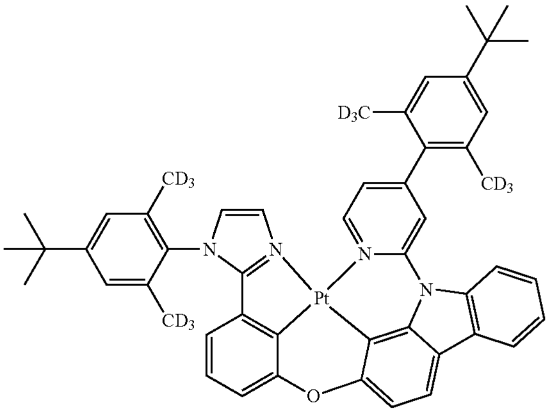

-continued
247
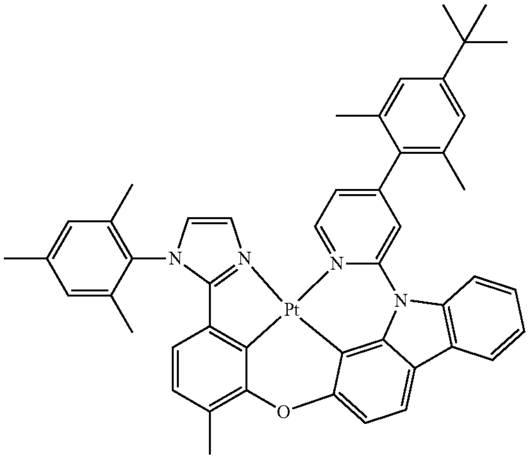
248
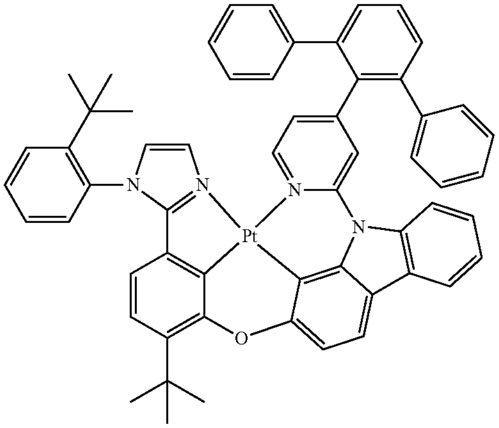
249
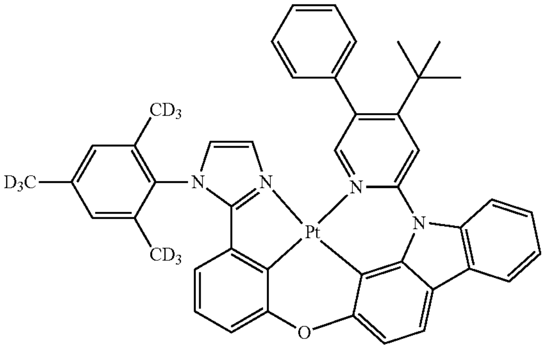
253
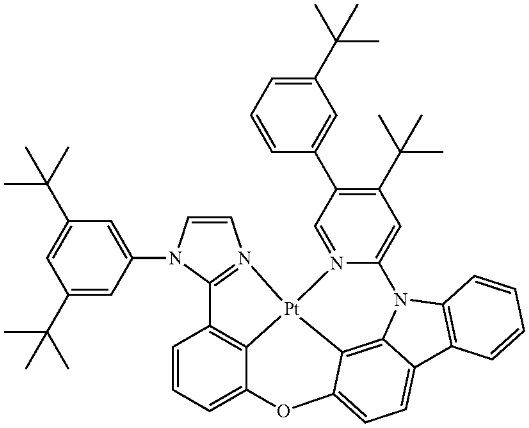
254
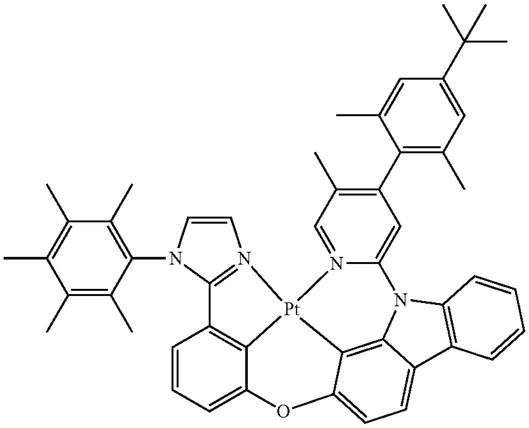

-continued
255
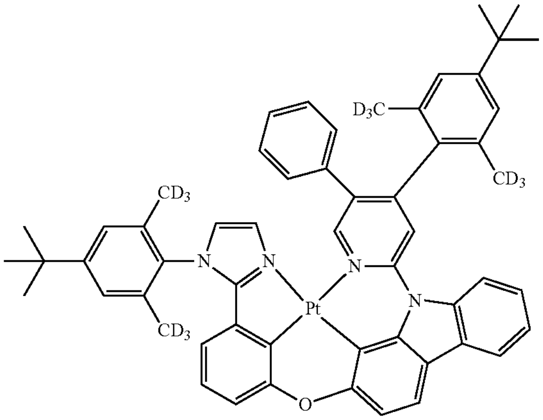
256
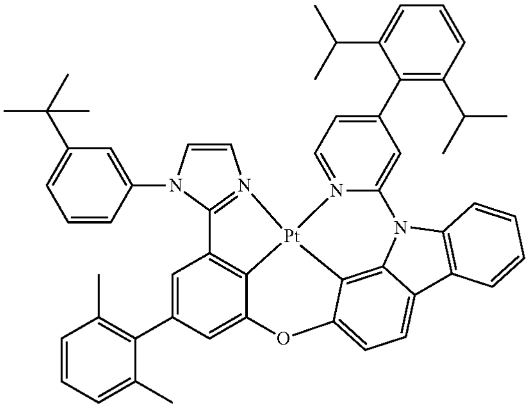
257
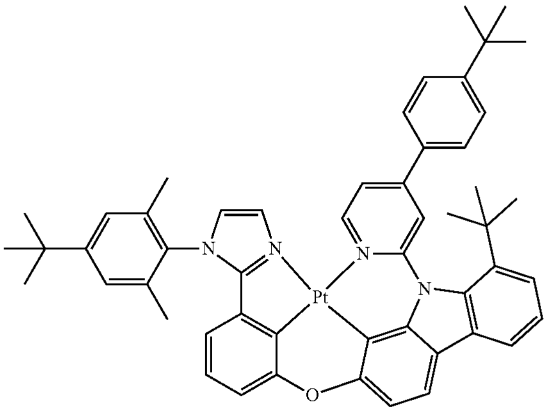
258
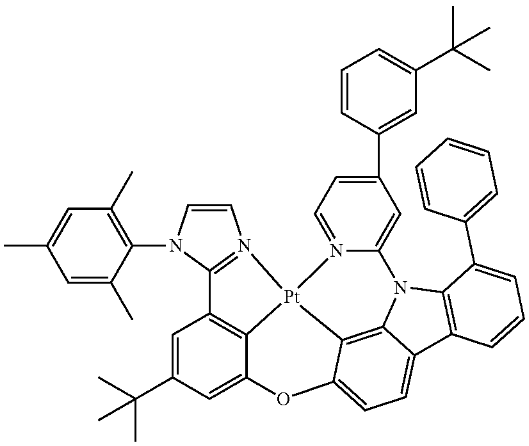
259
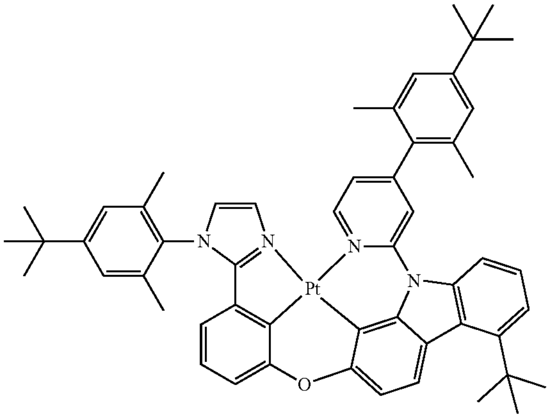
260
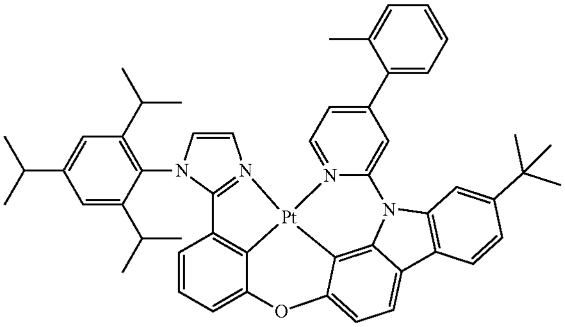

-continued
261
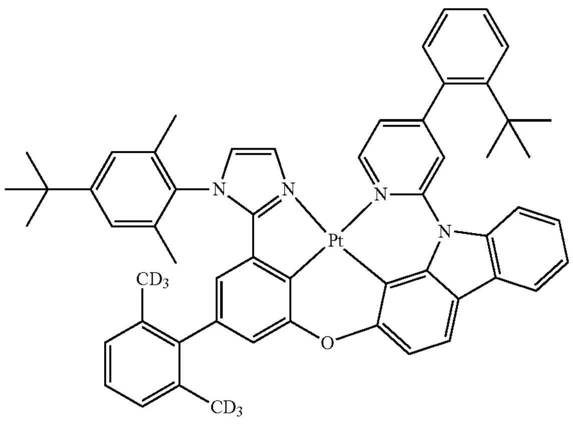
263
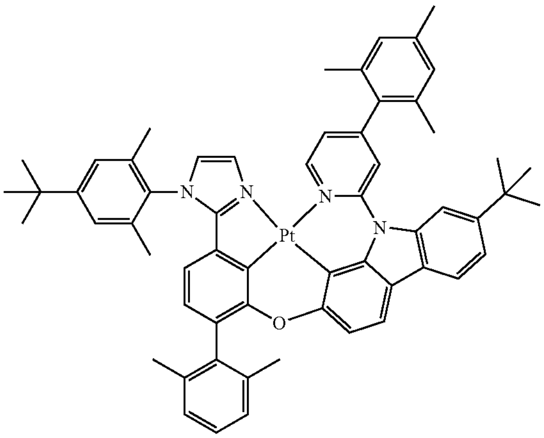
264
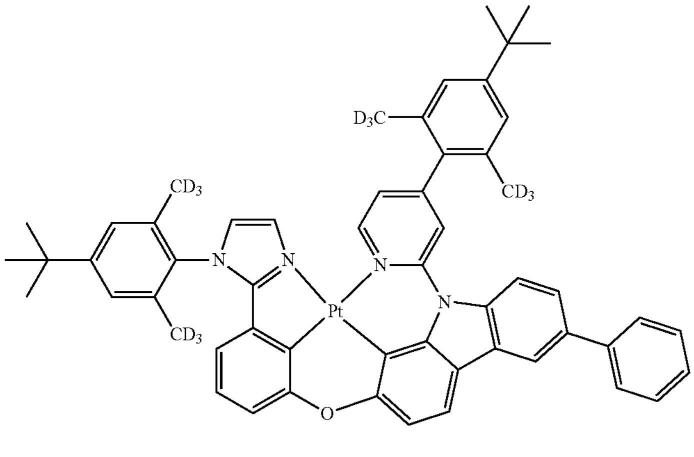
265
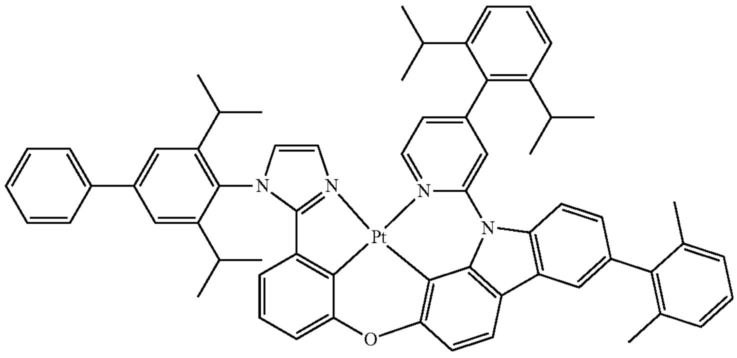

-continued
266
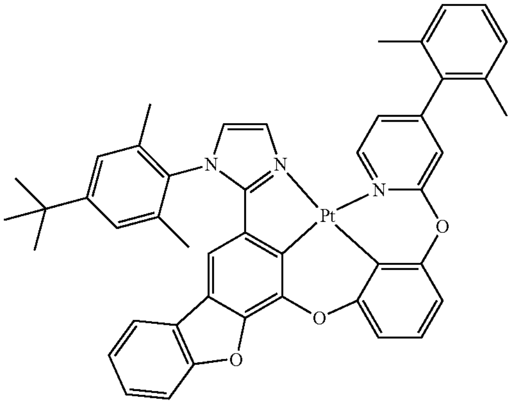
267
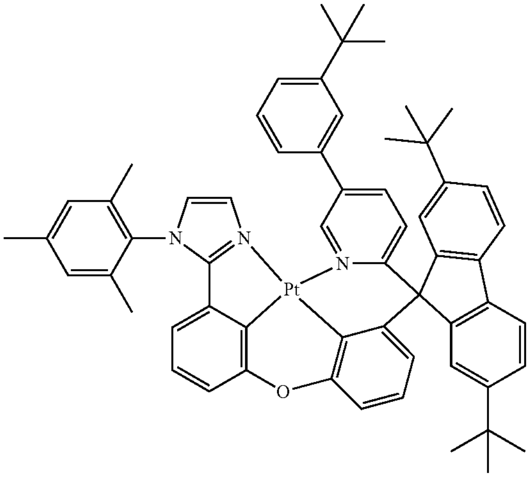
268
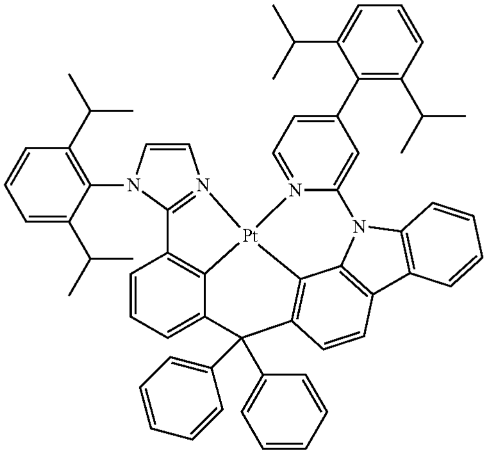
270
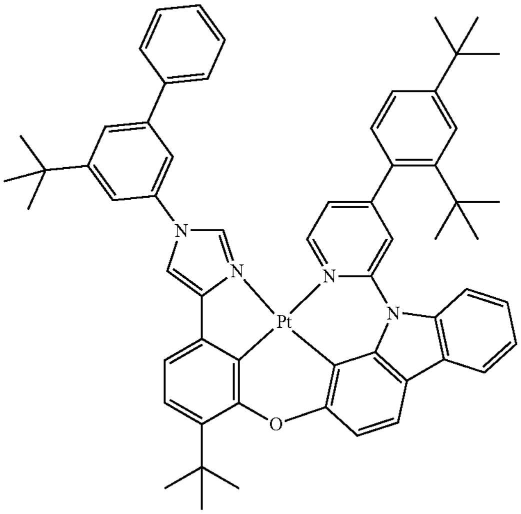
271
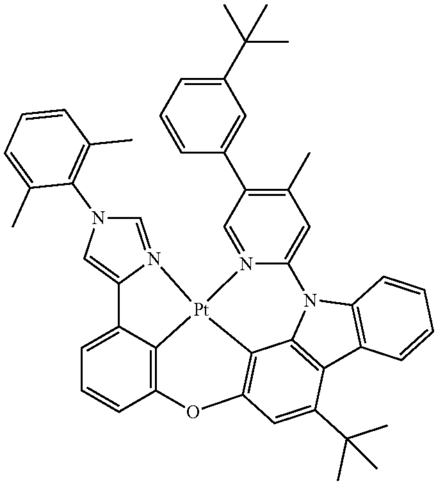
272
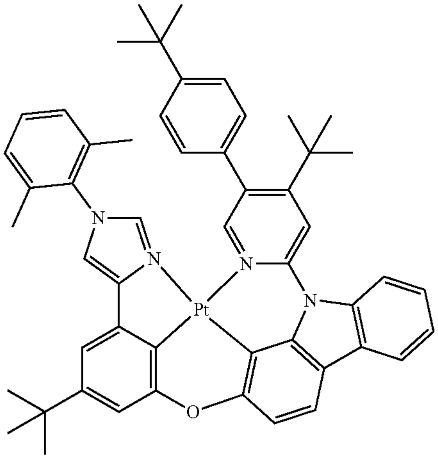

-continued
273
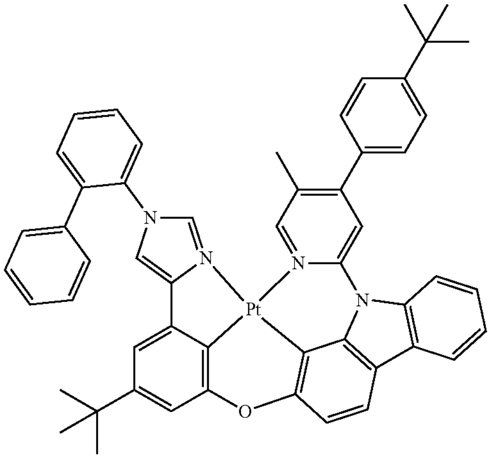
274
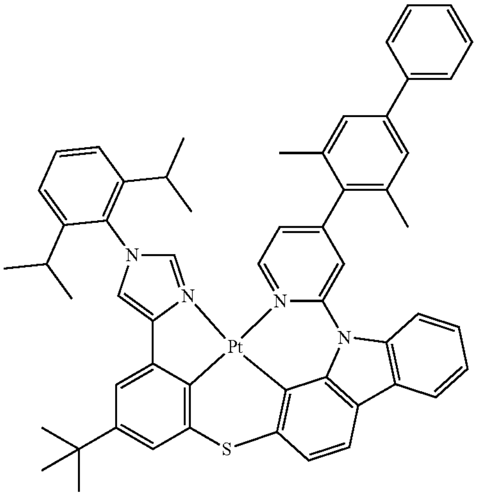
276
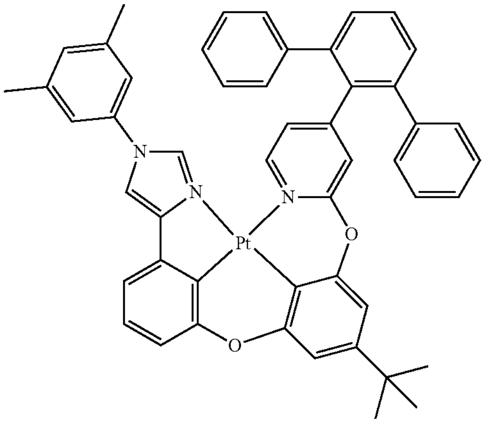
279
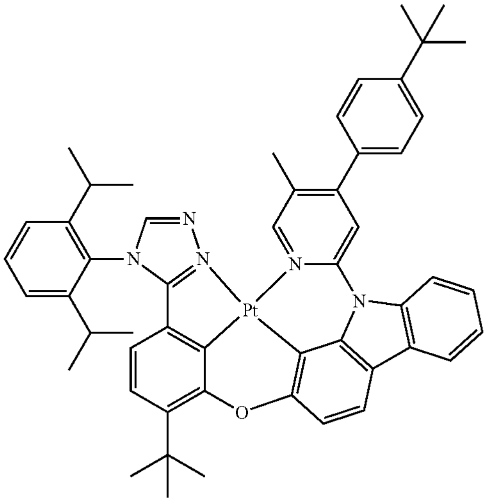
282
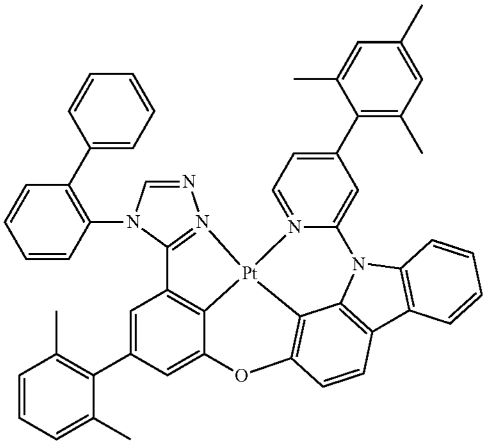

-continued
283
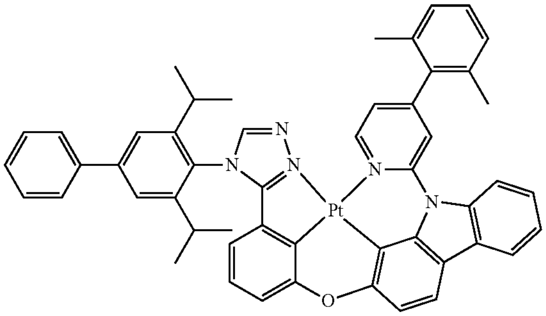
284
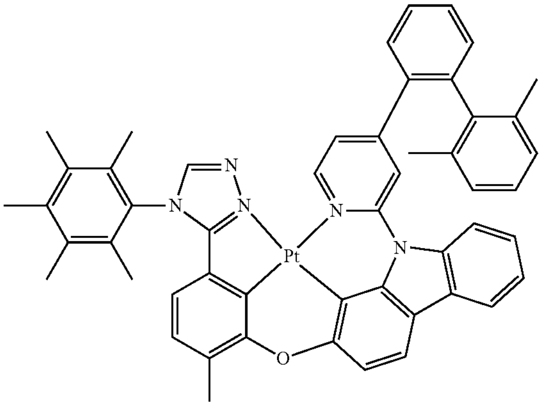
285
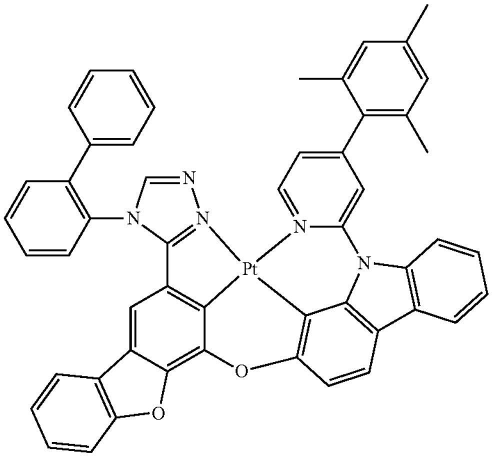
286
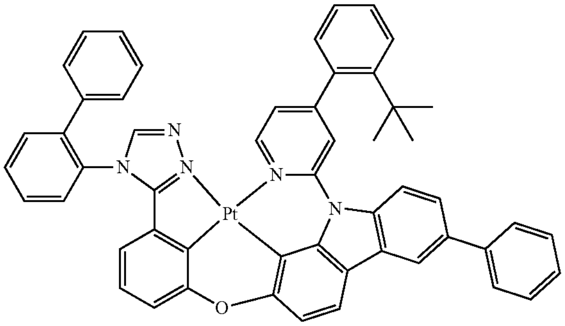
288
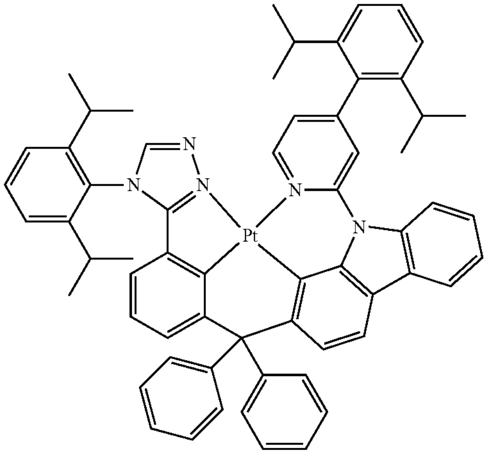
290
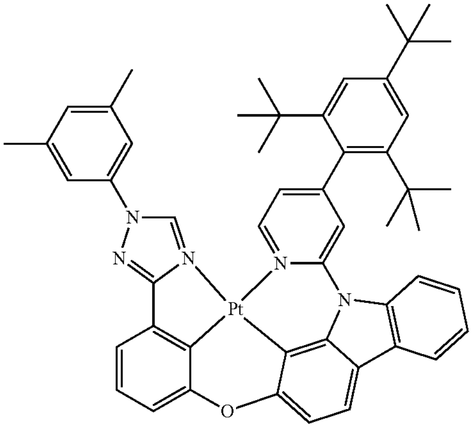

-continued
291
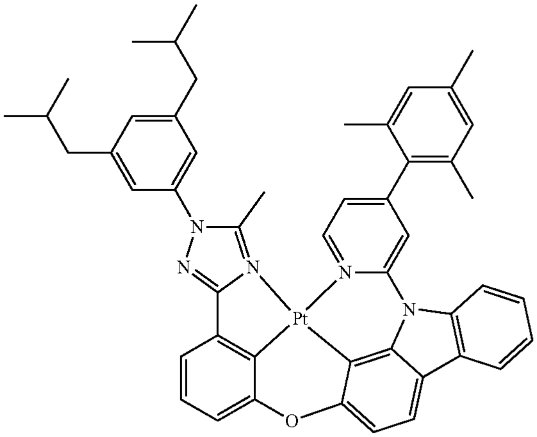
296
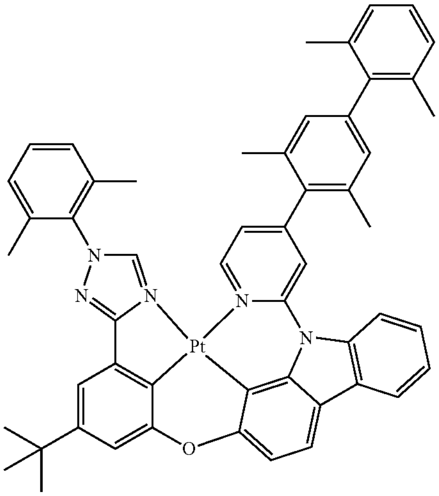
297
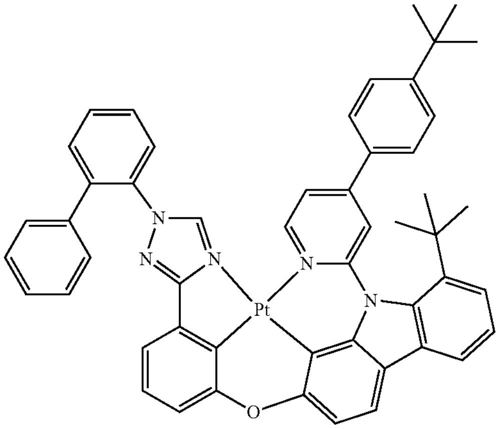
299
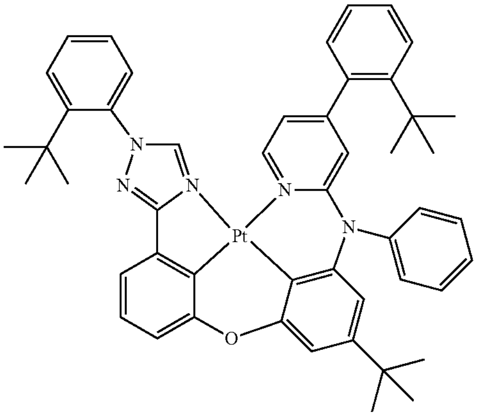
300
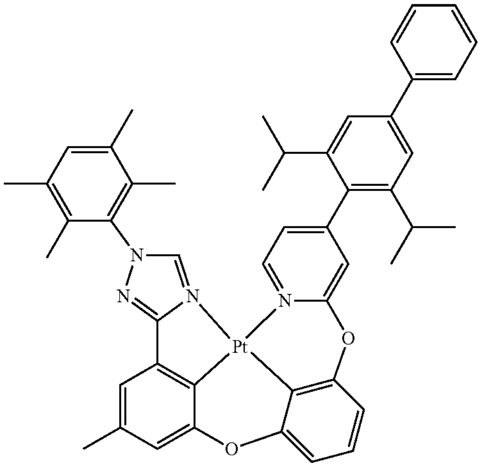

-continued
301
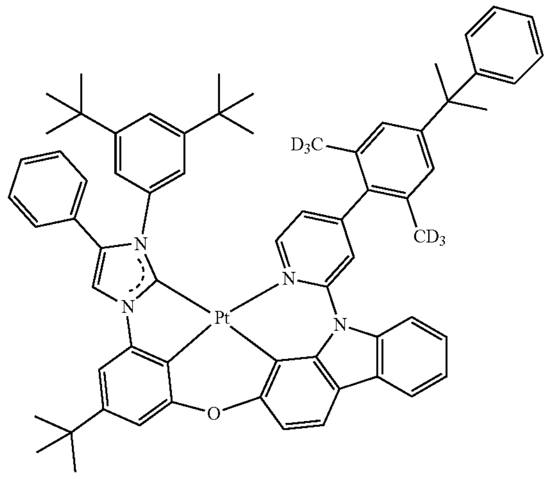
302
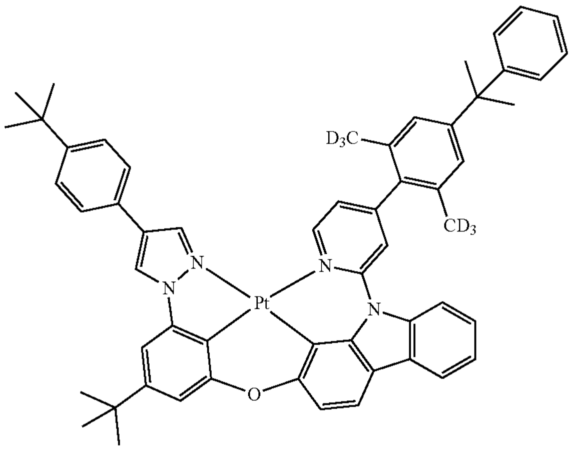
303
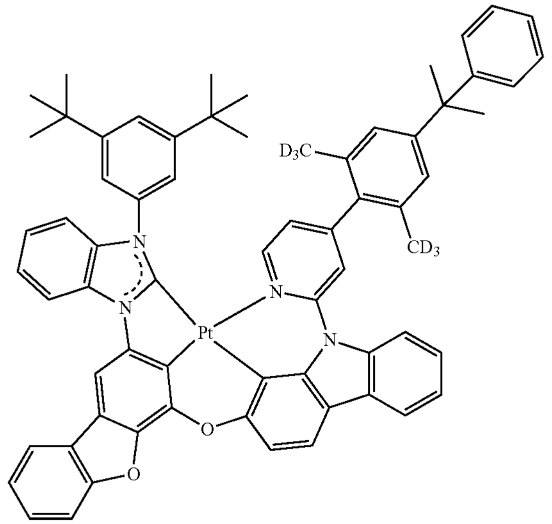
304
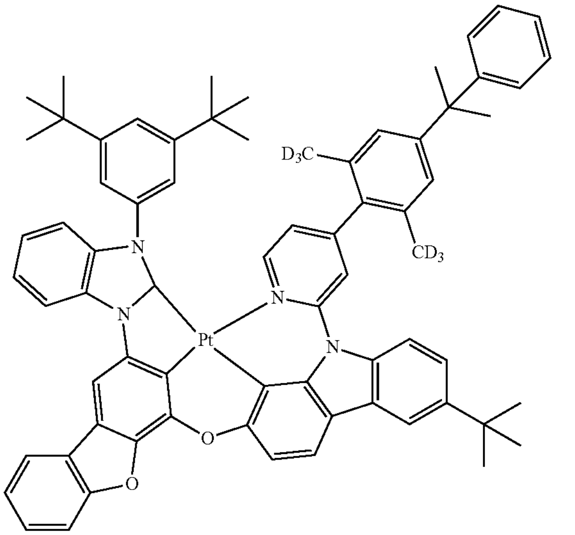
305
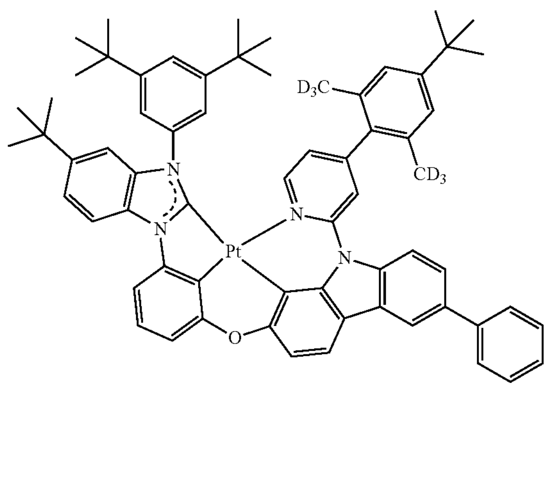
306
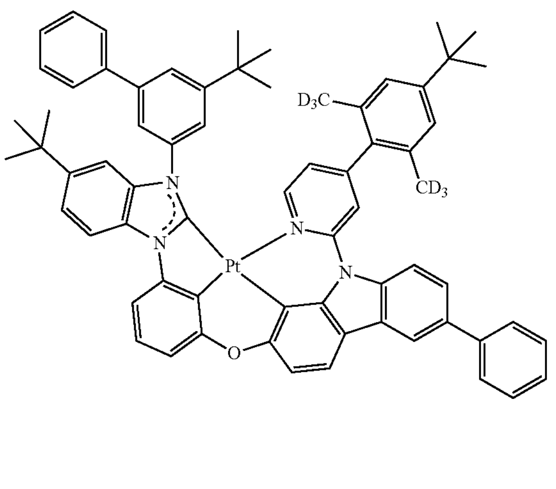

-continued

307

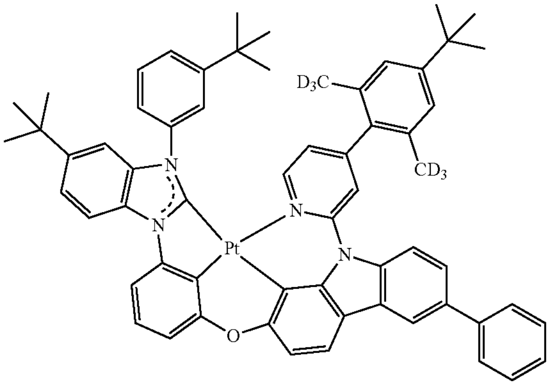

308

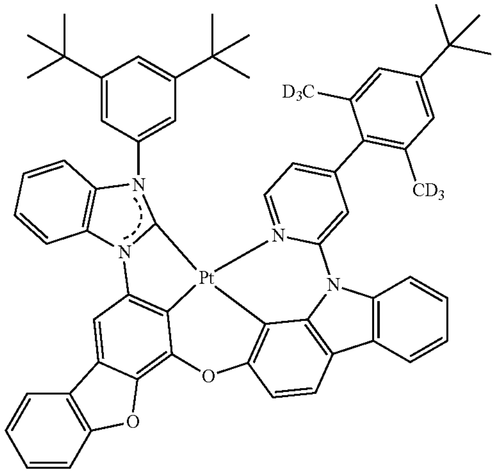

14. An organic light-emitting device comprising:

a first electrode;

a second electrode; and an organic layer arranged between the first electrode and the second electrode and comprising an emission layer, wherein the organic layer comprises at least one organometallic compound of claim 1.

15. The organic light-emitting device of claim 14, wherein the first electrode is an anode, the second electrode is a cathode, the organic layer further comprises a hole transport region arranged between the first electrode and the emission layer and an electron transport region arranged between the emission layer and the second electrode, the hole transport region comprises a hole injection layer, a hole transport layer, an electron blocking layer, or any combination thereof, and the electron transport region comprises a hole blocking layer, an electron transport layer, an electron injection layer, or any combination thereof.

16. The organic light-emitting device of claim 14, wherein the at least one organometallic compound is included in the emission layer.

17. The organic light-emitting device of claim 16, wherein the emission layer further comprises a host, and an amount of the host is greater than that of the at least one organometallic compound.

18. The organic light-emitting device of claim 16, wherein the emission layer further comprises a fluorescent dopant.

19. The organic light-emitting device of claim 16, wherein the emission layer emits blue light having a maximum emission wavelength of about 410 nm to about 490 nm.

20. A diagnostic composition comprising at least one organometallic compound of claim 1.

* * * * *